US011720085B2

(12) United States Patent
Roy et al.

(10) Patent No.: US 11,720,085 B2
(45) Date of Patent: Aug. 8, 2023

(54) SYSTEMS AND METHODS FOR PROVIDING NETWORK CONNECTIVITY AND REMOTE MONITORING, OPTIMIZATION, AND CONTROL OF POOL/SPA EQUIPMENT

(71) Applicant: Hayward Industries, Inc., Berkeley Heights, NJ (US)

(72) Inventors: William Roy, Thompson's Station, TN (US); Vance Willis, Nunnelly, TN (US); Benjamin Corn, Nashville, TN (US); James Murdock, Wakefield, RI (US)

(73) Assignee: Hayward Industries, Inc., Berkeley Heights, NJ (US)

( * ) Notice: Subject to any disclaimer, the term of this patent is extended or adjusted under 35 U.S.C. 154(b) by 0 days.

(21) Appl. No.: 16/905,661

(22) Filed: Jun. 18, 2020

(65) Prior Publication Data

US 2020/0319621 A1 Oct. 8, 2020

Related U.S. Application Data

(63) Continuation-in-part of application No. 15/957,482, filed on Apr. 19, 2018, which is a continuation-in-part (Continued)

(51) Int. Cl.

*G05B 19/416* (2006.01)
*G01R 19/165* (2006.01)

(Continued)

(52) U.S. Cl.

CPC ............. *G05B 19/416* (2013.01); *G01F 1/06* (2013.01); *G01F 15/061* (2013.01); *G01K 3/005* (2013.01);

(Continued)

(58) Field of Classification Search

CPC .. G01R 19/16571; G01K 3/005; G01L 13/00; G01L 19/086; G01F 1/06; G01F 15/061;

(Continued)

(56) References Cited

U.S. PATENT DOCUMENTS

| | | | |
|---|---|---|---|
| 1,874,513 | A | 8/1932 | Hall |
| 1,991,775 | A | 2/1935 | Spencer |

(Continued)

FOREIGN PATENT DOCUMENTS

| | | | |
|---|---|---|---|
| AU | 2002356357 | B2 | 5/2007 |
| AU | 2013100126 | B4 | 6/2013 |

(Continued)

OTHER PUBLICATIONS

Office Action dated Sep. 21, 2021, issued in connection with U.S. Appl. No. 15/957,482 (32 pages).

(Continued)

*Primary Examiner* — Chad G Erdman

(74) *Attorney, Agent, or Firm* — McCarter & English, LLP

(57) ABSTRACT

Systems and methods for providing network connectivity and remote monitoring, optimization, and control of pool/spa equipment are provided. "Internet-of-Things" (IoT) functionality is provided for pool and spa equipment in a flexible and cost-effective manner. Network connectivity and remote monitoring/control of pool and spa equipment is provided by various components such as a network communication and local control subsystem installed in pool/spa equipment, and other components. Also disclosed are various control processes ("pool logic") which can be embodied as software code installed in any of the various embodiments of the present disclosure.

29 Claims, 268 Drawing Sheets

Related U.S. Application Data of application No. 15/886,576, filed on Feb. 1, 2018, now abandoned, which is a continuation-in-part of application No. 15/886,171, filed on Feb. 1, 2018, now abandoned, which is a continuation-in-part of application No. 15/413,199, filed on Jan. 23, 2017.

(60) Provisional application No. 62/862,982, filed on Jun. 18, 2019, provisional application No. 62/286,272, filed on Jan. 22, 2016, provisional application No. 62/310,510, filed on Mar. 18, 2016, provisional application No. 62/381,903, filed on Aug. 31, 2016, provisional application No. 62/412,504, filed on Oct. 25, 2016, provisional application No. 62/414,545, filed on Oct. 28, 2016.

(51) Int. Cl.

| | |
|---|---|
| ***G01K 3/00*** | (2006.01) |
| ***G01L 13/00*** | (2006.01) |
| ***G01F 1/06*** | (2006.01) |
| ***G01F 15/061*** | (2022.01) |
| ***G01L 19/08*** | (2006.01) |

(52) U.S. Cl.
CPC ............ *G01L 13/00* (2013.01); *G01L 19/086* (2013.01); *G01R 19/16571* (2013.01); *G05B 2219/37371* (2013.01); *G05B 2219/50333* (2013.01)

(58) Field of Classification Search
CPC ........ G05B 19/416; G05B 2219/37371; G05B 2219/50333; G05B 15/02; G05B 2219/25168; A61H 33/00; A61H 2201/5012; A61H 2201/5087; A61H 2201/5082; A61H 2201/5097; A61H 2201/5043; A61H 2201/5071; A61H 2201/5035; A61H 2201/0221; E04H 4/1654; E04H 4/129; E04H 4/12; G08C 17/02
See application file for complete search history.

(56) References Cited

U.S. PATENT DOCUMENTS

| | | | | |
|---|---|---|---|---|
| 2,057,186 | A | | 10/1936 | Freeberg |
| 2,096,595 | A | | 10/1937 | Sanford |
| 2,250,021 | A | | 7/1941 | Hofer |
| 2,323,793 | A | | 7/1943 | Clark |
| 2,355,607 | A | | 8/1944 | Shepherd |
| 2,498,818 | A | | 2/1950 | Nogle |
| 2,509,031 | A | | 5/1950 | Bockmeyer |
| 2,572,263 | A | | 10/1951 | Hofer |
| 2,603,234 | A | | 7/1952 | Hofer |
| 2,644,400 | A | | 7/1953 | Hofer |
| 2,680,168 | A | | 6/1954 | Murphy |
| 2,767,277 | A | | 10/1956 | Wirth |
| 2,881,409 | A | | 4/1959 | Cook |
| 2,889,779 | A | | 6/1959 | Hofer |
| 2,903,674 | A | | 9/1959 | Schwab |
| 3,020,522 | A | | 2/1962 | Lesher |
| 3,086,715 | A | | 4/1963 | Mineau et al. |
| 3,114,127 | A | | 12/1963 | Ramsey |
| 3,145,724 | A | | 8/1964 | Pelzer |
| 3,195,556 | A | | 7/1965 | Norstrud et al. |
| 3,213,377 | A | | 10/1965 | Neale |
| 3,252,479 | A | | 5/1966 | Klock, Jr. |
| 3,255,433 | A | | 6/1966 | Lesher |
| 3,257,641 | A | | 6/1966 | Campana et al. |
| 3,271,734 | A | | 9/1966 | Cabe et al. |
| 3,320,160 | A | | 5/1967 | Welles, Jr. et al. |
| 3,416,729 | A | | 12/1968 | Ravitts et al. |
| 3,424,090 | A | | 1/1969 | Hyde |
| 3,435,213 | A | | 3/1969 | Colbow et al. |
| 3,497,185 | A | | 2/1970 | Dively |
| 3,515,375 | A | | 6/1970 | Roos |
| 3,524,629 | A | | 8/1970 | Culwell |
| 3,528,548 | A | | 9/1970 | Sheckler |
| 3,572,658 | A | | 3/1971 | Ravitts |
| 3,584,261 | A | | 6/1971 | Anderson, Jr. |
| 3,594,720 | A | | 7/1971 | Cane |
| 3,735,926 | A | | 5/1973 | Ravitts |
| 3,739,986 | A | | 6/1973 | Ravitts |
| 3,771,724 | A | | 11/1973 | Rose et al. |
| 3,781,925 | A | | 1/1974 | Curtis et al. |
| 3,804,049 | A | | 4/1974 | Greer |
| 3,809,116 | A | | 5/1974 | Sanner |
| 3,823,767 | A | | 7/1974 | McLaughlin |
| 3,837,016 | A | | 9/1974 | Schindler et al. |
| 3,926,008 | A | | 12/1975 | Webber |
| 3,949,782 | A | | 4/1976 | Athey et al. |
| 3,953,551 | A | | 4/1976 | Dorall |
| 3,957,395 | A | | 5/1976 | Ensign |
| 3,966,358 | A | | 6/1976 | Heimes et al. |
| 3,970,069 | A | | 7/1976 | Pickett |
| 4,053,758 | A | | 10/1977 | Shaw |
| 4,107,492 | A | | 8/1978 | Moon, Jr. et al. |
| 4,115,878 | A | | 9/1978 | Johnson et al. |
| 4,116,577 | A | | 9/1978 | Lauck |
| 4,135,144 | A | | 1/1979 | Elmasian |
| 4,153,955 | A | | 5/1979 | Hinterberger |
| 4,180,374 | A | | 12/1979 | Bristow |
| 4,189,791 | A | | 2/1980 | Dundas |
| 4,226,815 | A | | 10/1980 | Cockman |
| 4,233,694 | A | | 11/1980 | Janosko et al. |
| 4,278,403 | A | | 7/1981 | Shafer |
| 4,286,303 | A | | 8/1981 | Genheimer et al. |
| 4,298,868 | A | | 11/1981 | Spurgeon |
| 4,322,297 | A | | 3/1982 | Bajka |
| 4,329,120 | A | | 5/1982 | Walters |
| 4,350,589 | A | | 9/1982 | Stog |
| 4,368,549 | A | | 1/1983 | Ramey |
| 4,381,031 | A | | 4/1983 | Whitaker et al. |
| 4,385,724 | A | | 5/1983 | Ramsauer et al. |
| 4,392,187 | A | | 7/1983 | Bornhorst |
| 4,393,527 | A | | 7/1983 | Ramey |
| 4,402,094 | A | | 9/1983 | Sanders |
| 4,404,697 | A | | 9/1983 | Hatcher |
| 4,409,694 | A | | 10/1983 | Barrett, Sr. et al. |
| 4,421,643 | A | | 12/1983 | Frederick |
| 4,424,438 | A | | 1/1984 | Antelman et al. |
| 4,444,546 | A | | 4/1984 | Pazemenas |
| 4,456,432 | A | | 6/1984 | Mannino |
| 4,467,183 | A | | 8/1984 | Ishima |
| 4,505,643 | A | | 3/1985 | Millis et al. |
| 4,525,125 | A | | 6/1985 | Matsumoto et al. |
| 4,541,029 | A | | 9/1985 | Ohyama |
| 4,541,413 | A | | 9/1985 | Cannaux et al. |
| 4,556,807 | A | | 12/1985 | Kamada et al. |
| 4,558,238 | A | | 12/1985 | Kamada et al. |
| 4,563,780 | A | | 1/1986 | Pollack |
| 4,564,141 | A | | 1/1986 | Montgomery et al. |
| 4,593,177 | A | | 6/1986 | Trostler |
| 4,602,391 | A | | 7/1986 | Shepherd |
| 4,616,215 | A | | 10/1986 | Maddalena |
| 4,620,835 | A | | 11/1986 | Bell |
| 4,621,613 | A | | 11/1986 | Krumhansl |
| 4,636,036 | A | | 1/1987 | Pasquali |
| 4,647,825 | A | | 3/1987 | Profio et al. |
| 4,659,235 | A | | 4/1987 | Gilmore, Jr. et al. |
| 4,663,613 | A | | 5/1987 | Raleigh et al. |
| 4,676,914 | A | | 6/1987 | Mills et al. |
| 4,686,439 | A | | 8/1987 | Cunningham et al. |
| 4,703,387 | A | | 10/1987 | Miller |
| 4,724,074 | A | | 2/1988 | Schaupp |
| 4,732,712 | A | * | 3/1988 | Burnham e ............... F28C 3/08 137/896 |
| 4,742,456 | A | | 5/1988 | Kamena |
| 4,749,377 | A | | 6/1988 | Mendizabal et al. |
| 4,780,917 | A | | 11/1988 | Hancock |
| 4,781,536 | A | | 11/1988 | Hicks |
| 4,797,958 | A | | 1/1989 | Guzzini |

(56) References Cited

U.S. PATENT DOCUMENTS

| | | | |
|---|---|---|---|
| 4,799,048 | A | 1/1989 | Goshima et al. |
| 4,814,800 | A | 3/1989 | Lavinsky et al. |
| 4,861,231 | A | 8/1989 | Howard |
| 4,867,645 | A | 9/1989 | Foster |
| 4,890,208 | A | 12/1989 | Izenour |
| 4,913,625 | A | 4/1990 | Gerlowski |
| 4,920,465 | A | 4/1990 | Sargent |
| 4,930,229 | A | 6/1990 | Moser |
| 4,936,506 | A | 6/1990 | Ryan |
| 4,974,133 | A | 11/1990 | Fujiki |
| 5,006,044 | A | 4/1991 | Walker, Sr. et al. |
| 5,045,983 | A | 9/1991 | Shields |
| 5,064,347 | A | 11/1991 | LaValley, Sr. |
| 5,076,761 | A | 12/1991 | Krohn et al. |
| 5,076,763 | A | 12/1991 | Anastos et al. |
| 5,086,385 | A | 2/1992 | Launey et al. |
| 5,120,198 | A | 6/1992 | Clark |
| 5,146,943 | A | 9/1992 | Bert |
| 5,158,436 | A | 10/1992 | Jensen et al. |
| 5,167,041 | A | 12/1992 | Burkitt, III |
| 5,184,472 | A | 2/1993 | Guilbault et al. |
| 5,190,442 | A | 3/1993 | Jorritsma |
| 5,220,464 | A | 6/1993 | Lin |
| 5,221,189 | A | 6/1993 | Henningsen |
| 5,240,379 | A | 8/1993 | Takashi et al. |
| 5,244,351 | A | 9/1993 | Arnette |
| 5,245,221 | A | 9/1993 | Schmidt et al. |
| 5,256,948 | A | 10/1993 | Boldin et al. |
| 5,259,733 | A | 11/1993 | Gigliotti et al. |
| 5,278,455 | A | 1/1994 | Hamos |
| 5,347,664 | A | 9/1994 | Hamza et al. |
| 5,361,215 | A | 11/1994 | Tompkins et al. |
| 5,365,964 | A | 11/1994 | Sorensen |
| 5,408,222 | A | 4/1995 | Yaffe et al. |
| 5,410,150 | A | 4/1995 | Teron et al. |
| 5,415,221 | A | 5/1995 | Zakryk |
| 5,422,014 | A | 6/1995 | Allen et al. |
| 5,435,031 | A | 7/1995 | Minami et al. |
| 5,450,334 | A | 9/1995 | Pulizzi et al. |
| 5,464,327 | A | 11/1995 | Horwitz |
| 5,475,619 | A | 12/1995 | Sugano et al. |
| 5,477,111 | A | 12/1995 | Steely et al. |
| 5,499,406 | A | 3/1996 | Chalberg et al. |
| 5,526,538 | A | 6/1996 | Rainwater |
| 5,540,555 | A | 7/1996 | Corso et al. |
| 5,545,012 | A | 8/1996 | Anastos et al. |
| 5,550,753 | A | 8/1996 | Tompkins et al. |
| 5,559,720 | A | 9/1996 | Tompkins et al. |
| 5,560,210 | A | 10/1996 | Bronicki |
| 5,570,481 | A | 11/1996 | Mathis et al. |
| 5,572,438 | A | 11/1996 | Ehlers et al. |
| 5,580,221 | A | 12/1996 | Triezenberg |
| 5,582,509 | A | 12/1996 | Quilty et al. |
| 5,585,025 | A | 12/1996 | Idland |
| 5,589,068 | A | 12/1996 | Nielsen |
| 5,601,413 | A | 2/1997 | Langley et al. |
| 5,602,670 | A | 2/1997 | Keegan |
| 5,616,239 | A | 4/1997 | Wendell et al. |
| 5,624,237 | A | 4/1997 | Prescott et al. |
| 5,649,242 | A | 7/1997 | O'Brien et al. |
| 5,658,131 | A | 8/1997 | Aoki et al. |
| 5,672,049 | A | 9/1997 | Ciurlo |
| 5,672,050 | A | 9/1997 | Webber et al. |
| 5,682,624 | A | 11/1997 | Ciochetti |
| 5,682,684 | A | 11/1997 | Wentzlaff et al. |
| 5,690,476 | A | 11/1997 | Miller |
| 5,706,191 | A | 1/1998 | Bassett et al. |
| 5,706,539 | A | 1/1998 | Fukuda |
| 5,707,211 | A | 1/1998 | Kochan, Sr. |
| 5,708,548 | A | 1/1998 | Greeve et al. |
| 5,725,359 | A | 3/1998 | Dongo et al. |
| 5,730,861 | A | 3/1998 | Sterghos et al. |
| 5,759,414 | A | 6/1998 | Wilkes et al. |
| 5,772,403 | A | 6/1998 | Allison et al. |
| 5,787,519 | A | 8/1998 | Smith |
| 5,795,328 | A | 8/1998 | Barnitz et al. |
| 5,796,184 | A | 8/1998 | Kuhnl et al. |
| 5,809,796 | A | 9/1998 | Zakryk |
| 5,822,807 | A | 10/1998 | Gallagher et al. |
| 5,828,200 | A | 10/1998 | Ligman et al. |
| 5,842,771 | A | 12/1998 | Thrasher et al. |
| 5,846,056 | A | 12/1998 | Dhindsa et al. |
| 5,865,601 | A | 2/1999 | Miller |
| 5,889,684 | A | 3/1999 | Ben-David et al. |
| 5,893,626 | A | 4/1999 | Poling |
| 5,894,609 | A | 4/1999 | Barnett |
| 5,895,565 | A | 4/1999 | Steininger et al. |
| 5,898,958 | A | 5/1999 | Hall |
| 5,932,127 | A | 8/1999 | Maddox |
| 5,947,689 | A | 9/1999 | Schick |
| 5,947,700 | A | 9/1999 | McKain et al. |
| 5,971,712 | A | 10/1999 | Kann |
| 5,984,513 | A | 11/1999 | Baldwin |
| 5,985,155 | A | 11/1999 | Maitland |
| 5,988,516 | A | 11/1999 | Gilmour |
| 5,991,939 | A | 11/1999 | Mulvey |
| 5,996,977 | A | 12/1999 | Burgess |
| 6,002,216 | A | 12/1999 | Mateescu |
| 6,003,164 | A | 12/1999 | Leaders |
| 6,003,165 | A | 12/1999 | Loyd |
| 6,016,038 | A | 1/2000 | Mueller et al. |
| 6,038,712 | A | 3/2000 | Chalberg et al. |
| 6,039,543 | A | 3/2000 | Littleton |
| 6,041,801 | A | 3/2000 | Gray et al. |
| 6,044,901 | A | 4/2000 | Basala |
| 6,045,331 | A | 4/2000 | Gehm et al. |
| 6,053,193 | A | 4/2000 | Baker, Jr. |
| 6,059,536 | A | 5/2000 | Stingl |
| 6,065,941 | A | 5/2000 | Gray et al. |
| 6,079,950 | A | 6/2000 | Seneff |
| 6,080,927 | A | 6/2000 | Johnson |
| 6,081,191 | A | 6/2000 | Green et al. |
| RE36,790 | E | 7/2000 | Jincks et al. |
| 6,081,944 | A | 7/2000 | Edwards |
| 6,084,218 | A | 7/2000 | McDonough |
| 6,090,484 | A | 7/2000 | Bergerson |
| 6,098,648 | A | 8/2000 | Bertoia |
| 6,098,654 | A | 8/2000 | Cohen et al. |
| 6,099,264 | A | 8/2000 | Du |
| 6,100,791 | A | 8/2000 | Bader et al. |
| 6,109,050 | A | 8/2000 | Zakryk |
| 6,116,040 | A | 9/2000 | Stark |
| 6,123,510 | A | 9/2000 | Greer et al. |
| 6,125,481 | A | 10/2000 | Sicilano |
| 6,137,776 | A | 10/2000 | Bauerschmidt et al. |
| 6,140,987 | A | 10/2000 | Stein et al. |
| 6,145,139 | A | 11/2000 | Bonn |
| 6,152,577 | A | 11/2000 | Rizkin et al. |
| 6,157,093 | A | 12/2000 | Giannopoulos et al. |
| 6,166,496 | A | 12/2000 | Lys et al. |
| 6,171,073 | B1 | 1/2001 | McKain et al. |
| 6,175,354 | B1 | 1/2001 | Blissett et al. |
| 6,184,628 | B1 | 2/2001 | Ruthenberg |
| 6,186,167 | B1 | 2/2001 | Grumstrup et al. |
| 6,190,544 | B1 | 2/2001 | Edwards |
| 6,192,282 | B1 | 2/2001 | Smith et al. |
| 6,196,471 | B1 | 3/2001 | Ruthenberg |
| 6,197,219 | B1 * | 3/2001 | Foulger .................... C08K 3/04 174/102 R |
| 6,211,626 | B1 | 4/2001 | Lys et al. |
| 6,227,808 | B1 | 5/2001 | McDonough |
| 6,241,361 | B1 | 6/2001 | Thrasher et al. |
| 6,241,362 | B1 | 6/2001 | Morrison |
| 6,249,435 | B1 | 6/2001 | Vicente et al. |
| 6,251,285 | B1 | 6/2001 | Ciochetti |
| 6,253,121 | B1 | 6/2001 | Cline et al. |
| 6,253,227 | B1 | 6/2001 | Tompkins et al. |
| 6,253,391 | B1 | 7/2001 | Watanabe et al. |
| 6,259,978 | B1 | 7/2001 | Feely |
| 6,260,004 | B1 | 7/2001 | Hays et al. |
| 6,261,065 | B1 | 7/2001 | Nayak et al. |
| 6,269,493 | B2 | 8/2001 | Sorensen |
| 6,273,686 | B1 | 8/2001 | Kroell et al. |
| 6,282,370 | B1 | 8/2001 | Cline et al. |

(56) References Cited

U.S. PATENT DOCUMENTS

| | | | |
|---|---|---|---|
| 6,285,140 | B1 | 9/2001 | Ruxton |
| 6,292,901 | B1 | 9/2001 | Lys et al. |
| 6,295,661 | B1 | 10/2001 | Bromley |
| 6,295,662 | B1 | 10/2001 | Idland et al. |
| 6,330,525 | B1 | 12/2001 | Hays et al. |
| 6,332,110 | B1 | 12/2001 | Wolfe |
| 6,341,387 | B1 | 1/2002 | Zars |
| 6,342,841 | B1 | 1/2002 | Stingl |
| 6,348,766 | B1 | 2/2002 | Ohishi et al. |
| 6,351,079 | B1 | 2/2002 | Willis |
| 6,354,573 | B1 | 3/2002 | Morando |
| 6,357,889 | B1 | 3/2002 | Duggal et al. |
| 6,367,541 | B2 | 4/2002 | McCullough |
| 6,374,854 | B1 | 4/2002 | Acosta |
| 6,379,025 | B1 | 4/2002 | Mateescu et al. |
| 6,390,781 | B1 | 5/2002 | McDonough |
| 6,407,469 | B1 | 6/2002 | Cline et al. |
| 6,435,691 | B1 | 8/2002 | Macey et al. |
| 6,441,558 | B1 | 8/2002 | Muthu et al. |
| 6,444,129 | B1 | 9/2002 | Collins |
| 6,459,919 | B1 | 10/2002 | Lys et al. |
| 6,461,113 | B1 | 10/2002 | Gaudet et al. |
| 6,464,464 | B2 | 10/2002 | Sabini et al. |
| 6,468,052 | B2 | 10/2002 | McKain et al. |
| 6,481,973 | B1 | 11/2002 | Struthers |
| 6,487,073 | B2 | 11/2002 | McCullough et al. |
| 6,488,408 | B1 | 12/2002 | Laflamme et al. |
| 6,497,554 | B2 | 12/2002 | Yang et al. |
| 6,528,954 | B1 | 3/2003 | Lys et al. |
| 6,547,529 | B2 | 4/2003 | Gross |
| 6,548,967 | B1 | 4/2003 | Dowling et al. |
| 6,549,855 | B2 | 4/2003 | Babel et al. |
| 6,554,454 | B1 | 4/2003 | Kitano |
| 6,560,543 | B2 | 5/2003 | Wolfe et al. |
| 6,568,416 | B2 | 5/2003 | Tucker et al. |
| 6,570,493 | B1 | 5/2003 | Rotem |
| 6,574,581 | B1 | 6/2003 | Bohrer et al. |
| 6,577,080 | B2 | 6/2003 | Lys et al. |
| 6,585,399 | B2 | 7/2003 | Kreutzer et al. |
| 6,590,188 | B2 | 7/2003 | Cline et al. |
| 6,591,863 | B2 | 7/2003 | Ruschell et al. |
| 6,592,752 | B2 | 7/2003 | Mathews |
| 6,603,488 | B2 | 8/2003 | Humpleman et al. |
| 6,608,453 | B2 | 8/2003 | Morgan et al. |
| 6,615,594 | B2 | 9/2003 | Jayanth et al. |
| 6,616,291 | B1 | 9/2003 | Love |
| 6,622,053 | B1 | 9/2003 | Hewlett et al. |
| 6,622,115 | B1 | 9/2003 | Brown et al. |
| 6,623,245 | B2 | 9/2003 | Meza et al. |
| 6,624,597 | B2 | 9/2003 | Dowling et al. |
| 6,627,858 | B2 | 9/2003 | Nomura et al. |
| 6,629,021 | B2 | 9/2003 | Cline et al. |
| 6,636,808 | B1 | 10/2003 | Brown et al. |
| 6,643,108 | B2 | 11/2003 | Cline et al. |
| 6,657,546 | B2 | 12/2003 | Navarro et al. |
| 6,659,980 | B2 | 12/2003 | Moberg et al. |
| 6,663,349 | B1 | 12/2003 | Discenzo et al. |
| 6,670,584 | B1 | 12/2003 | Azizeh |
| 6,672,386 | B2 | 1/2004 | Krueger et al. |
| 6,676,382 | B2 | 1/2004 | Leighton et al. |
| 6,676,831 | B2 | 1/2004 | Wolfe |
| 6,687,923 | B2 | 2/2004 | Dick et al. |
| 6,709,241 | B2 | 3/2004 | Sabini et al. |
| 6,717,376 | B2 | 4/2004 | Lys et al. |
| 6,718,213 | B1 | 4/2004 | Enberg |
| 6,720,745 | B2 | 4/2004 | Lys et al. |
| 6,744,223 | B2 | 6/2004 | Laflamme et al. |
| 6,747,367 | B2 | 6/2004 | Cline et al. |
| 6,774,584 | B2 | 8/2004 | Lys et al. |
| 6,777,891 | B2 | 8/2004 | Lys et al. |
| 6,779,205 | B2 | 8/2004 | Mulvey et al. |
| 6,781,329 | B2 | 8/2004 | Mueller et al. |
| 6,782,294 | B2 | 8/2004 | Reich et al. |
| 6,782,309 | B2 | 8/2004 | Laflamme et al. |
| 6,783,328 | B2 | 8/2004 | Lucke et al. |
| 6,788,011 | B2 | 9/2004 | Mueller et al. |
| 6,796,776 | B2 | 9/2004 | Jolley et al. |
| 6,799,950 | B2 | 10/2004 | Meier et al. |
| 6,801,003 | B2 | 10/2004 | Schanberger et al. |
| 6,810,915 | B2 | 11/2004 | Umetsu et al. |
| 6,811,286 | B2 | 11/2004 | Mateescu et al. |
| 6,827,464 | B2 | 12/2004 | Koren et al. |
| 6,831,679 | B1 | 12/2004 | Olsson et al. |
| 6,837,688 | B2 | 1/2005 | Kimberlin et al. |
| 6,853,867 | B1 | 2/2005 | Klindt et al. |
| 6,868,295 | B2 | 3/2005 | Huang |
| 6,869,204 | B2 | 3/2005 | Morgan et al. |
| 6,875,961 | B1 | 4/2005 | Collins |
| 6,883,929 | B2 | 4/2005 | Dowling |
| 6,886,625 | B1 | 5/2005 | Sagal et al. |
| 6,888,322 | B2 | 5/2005 | Dowling et al. |
| 6,895,307 | B2 | 5/2005 | Gardner, Jr. |
| 6,896,045 | B2 | 5/2005 | Panek |
| 6,896,204 | B1 | 5/2005 | Greene et al. |
| 6,897,624 | B2 | 5/2005 | Lys et al. |
| 6,900,742 | B2 | 5/2005 | Chesney, II |
| 6,902,378 | B2 | 6/2005 | Gaudet et al. |
| 6,918,692 | B2 | 7/2005 | Yang |
| 6,936,978 | B2 | 8/2005 | Morgan et al. |
| 6,939,109 | B2 | 9/2005 | Takahashi et al. |
| 6,943,325 | B2 | 9/2005 | Pittman et al. |
| 6,943,654 | B2 | 9/2005 | Zhou et al. |
| 6,949,894 | B1 | 9/2005 | Sullivan et al. |
| 6,950,725 | B2 | 9/2005 | von Kannewurff et al. |
| 6,954,701 | B2 | 10/2005 | Wolfe |
| 6,957,742 | B1 | 10/2005 | Pillart |
| 6,965,205 | B2 | 11/2005 | Piepgras et al. |
| 6,965,815 | B1 | 11/2005 | Tompkins et al. |
| 6,967,448 | B2 | 11/2005 | Morgan et al. |
| 6,969,954 | B2 | 11/2005 | Lys |
| 6,971,760 | B2 | 12/2005 | Archer et al. |
| 6,975,079 | B2 | 12/2005 | Lys et al. |
| 6,976,052 | B2 | 12/2005 | Tompkins et al. |
| 6,981,805 | B2 | 1/2006 | Miller et al. |
| 6,993,415 | B2 | 1/2006 | Bauer et al. |
| 7,010,363 | B2 | 3/2006 | Donnelly et al. |
| 7,023,147 | B2 | 4/2006 | Colby et al. |
| 7,030,343 | B2 | 4/2006 | Tran |
| 7,030,565 | B2 | 4/2006 | Hollaway |
| 7,031,920 | B2 | 4/2006 | Dowling et al. |
| 7,038,398 | B1 | 5/2006 | Lys et al. |
| 7,038,399 | B2 | 5/2006 | Lys et al. |
| 7,055,988 | B2 | 6/2006 | Mateescu et al. |
| 7,057,140 | B2 | 6/2006 | Pittman |
| 7,064,498 | B2 | 6/2006 | Dowling et al. |
| 7,076,813 | B2 | 7/2006 | Stetson |
| 7,097,329 | B2 | 8/2006 | Mateescu et al. |
| 7,110,832 | B2 | 9/2006 | Ghent |
| 7,112,768 | B2 | 9/2006 | Brochu et al. |
| 7,113,541 | B1 | 9/2006 | Lys et al. |
| 7,114,581 | B2 | 10/2006 | Aronstam et al. |
| 7,124,819 | B2 | 10/2006 | Ciglenec et al. |
| 7,128,440 | B2 | 10/2006 | Mateescu et al. |
| 7,132,635 | B2 | 11/2006 | Dowling |
| 7,132,785 | B2 | 11/2006 | Ducharme |
| 7,132,954 | B2 | 11/2006 | Shebek et al. |
| 7,135,824 | B2 | 11/2006 | Lys et al. |
| 7,139,617 | B1 | 11/2006 | Morgan et al. |
| 7,142,128 | B2 | 11/2006 | Kobayashi |
| 7,146,408 | B1 | 12/2006 | Crater et al. |
| 7,158,909 | B2 | 1/2007 | Tarpo et al. |
| 7,161,311 | B2 | 1/2007 | Mueller et al. |
| 7,161,556 | B2 | 1/2007 | Morgan et al. |
| 7,167,087 | B2 | 1/2007 | Corrington et al. |
| 7,178,392 | B2 | 2/2007 | Dhruva et al. |
| 7,178,941 | B2 | 2/2007 | Roberge et al. |
| 7,180,252 | B2 | 2/2007 | Lys et al. |
| 7,186,003 | B2 | 3/2007 | Dowling et al. |
| 7,202,613 | B2 | 4/2007 | Morgan et al. |
| 7,204,602 | B2 | 4/2007 | Archer |
| 7,204,622 | B2 | 4/2007 | Dowling et al. |
| 7,216,188 | B2 | 5/2007 | Reid et al. |
| 7,225,058 | B1 | 5/2007 | Porter |
| 7,228,190 | B2 | 6/2007 | Dowling et al. |

(56) References Cited

U.S. PATENT DOCUMENTS 7,231,060 B2 6/2007 Dowling et al.
7,233,115 B2 6/2007 Lys
7,233,831 B2 6/2007 Blackwell
7,234,521 B2 6/2007 Shammai et al.
7,236,692 B2 6/2007 Tran
7,242,152 B2 7/2007 Dowling et al.
7,248,239 B2 7/2007 Dowling et al.
7,253,566 B2 8/2007 Lys et al.
7,255,457 B2 8/2007 Ducharme et al.
7,256,554 B2 8/2007 Lys
7,258,463 B2 8/2007 Sloan et al.
7,266,983 B2 9/2007 Krueger et al.
7,278,762 B2 10/2007 Schottland et al.
7,289,343 B2 10/2007 Rodriguez et al.
7,292,898 B2 11/2007 Clark et al.
7,300,192 B2 11/2007 Mueller et al.
7,303,300 B2 12/2007 Dowling et al.
7,303,301 B2 12/2007 Koren et al.
7,309,216 B1 12/2007 Spadola, Jr. et al.
7,309,965 B2 12/2007 Dowling et al.
7,317,264 B2 1/2008 Kinsella et al.
7,332,093 B2 2/2008 Rosen et al.
7,352,339 B2 4/2008 Morgan et al.
7,353,071 B2 4/2008 Blackwell et al.
7,356,011 B1 4/2008 Waters et al.
7,357,525 B2 4/2008 Doyle
7,358,679 B2 4/2008 Lys et al.
7,358,706 B2 4/2008 Lys
7,358,929 B2 4/2008 Mueller et al.
7,358,961 B2 4/2008 Zwanenburg
7,364,488 B2 4/2008 Mueller et al.
7,393,450 B2 7/2008 Silveri
7,396,139 B2 7/2008 Savage
7,397,360 B2 7/2008 Corrington et al.
7,398,138 B2 7/2008 Emery et al.
7,410,268 B2 8/2008 Koren et al.
7,417,834 B2 8/2008 Cline et al.
7,419,406 B2 9/2008 Brochu et al.
7,427,840 B2 9/2008 Morgan et al.
7,427,923 B2 9/2008 Durand
7,440,820 B2 10/2008 Gougerot et al.
7,440,864 B2 10/2008 Otto
7,449,847 B2 11/2008 Schanberger et al.
7,482,764 B2 1/2009 Morgan et al.
7,484,938 B2 2/2009 Allen
7,488,084 B2 2/2009 Potucek et al.
7,489,986 B1 2/2009 Laflamme et al.
7,497,595 B2 3/2009 Mateescu et al.
7,514,884 B2 4/2009 Potucek et al.
7,520,628 B1 4/2009 Sloan et al.
7,521,872 B2 4/2009 Bruning
7,542,251 B2 6/2009 Ivankovic
7,550,935 B2 6/2009 Lys et al.
7,553,040 B2 6/2009 Boothe et al.
7,569,150 B2 8/2009 Kilawee et al.
7,584,897 B2 9/2009 Schultz et al.
7,598,681 B2 10/2009 Lys et al.
7,606,639 B2 10/2009 Miyaji
7,619,181 B2 11/2009 Authier
7,626,789 B2 12/2009 Cline et al.
7,628,512 B2 12/2009 Netzel, Sr. et al.
7,632,402 B2 12/2009 King et al.
7,636,615 B2 12/2009 Pfingsten et al.
7,643,823 B2 1/2010 Shamoon et al.
7,652,395 B2 1/2010 Von Arx et al.
7,653,443 B2 1/2010 Flohr
7,686,587 B2 3/2010 Koehl
7,686,589 B2 3/2010 Stiles, Jr. et al.
7,705,240 B2 4/2010 Armstrong et al.
7,722,216 B2 5/2010 Amor et al.
7,723,868 B2 5/2010 Yoshimura
7,726,869 B2 6/2010 Chien
7,744,237 B2 6/2010 Potucek et al.
7,745,959 B2 6/2010 King, Jr. et al.
7,756,556 B2 7/2010 Patel et al.
7,781,910 B2 8/2010 Donnell et al.
7,815,420 B2 10/2010 Koehl
7,838,803 B1 11/2010 Rosen
7,843,357 B2 11/2010 Brochu et al.
7,845,823 B2 12/2010 Mueller et al.
7,845,913 B2 12/2010 Stiles, Jr. et al.
7,847,486 B2 12/2010 Ng
7,854,597 B2 12/2010 Stiles, Jr. et al.
7,874,808 B2 1/2011 Stiles
7,895,532 B2 2/2011 Scott et al.
7,931,447 B2 4/2011 Levin et al.
7,949,615 B2 5/2011 Ehlers et al.
7,953,518 B2 5/2011 Kansal et al.
7,982,625 B2 7/2011 Brochu et al.
7,991,513 B2 8/2011 Pitt
8,014,902 B2 9/2011 Kates
8,019,479 B2 9/2011 Stiles et al.
8,043,070 B2 10/2011 Stiles, Jr. et al.
8,112,164 B2 2/2012 Hollaway
8,121,737 B2 2/2012 West et al.
8,143,811 B2 3/2012 Shloush et al.
8,145,357 B2 3/2012 Nibler et al.
8,148,357 B2 4/2012 Okumura
8,160,752 B2 4/2012 Weaver et al.
8,178,997 B2 5/2012 Talkin et al.
8,200,373 B2 6/2012 Stiles, Jr. et al.
8,209,794 B1 7/2012 Harrison
8,239,073 B2 8/2012 Fausak et al.
8,246,189 B2 8/2012 Muller et al.
8,255,090 B2 8/2012 Frader-Thompson et al.
8,259,456 B2 9/2012 Rosenau et al.
8,280,535 B2 10/2012 Hsieh
8,295,990 B2 10/2012 Venkatakrishnan et al.
8,332,055 B2 12/2012 Veillette
8,335,842 B2 12/2012 Raji et al.
8,367,007 B2 2/2013 Otero et al.
8,467,908 B2 6/2013 Broniak et al.
8,468,165 B2 6/2013 Walker
8,600,566 B1 12/2013 Longo et al.
8,649,908 B2 2/2014 Nibler et al.
8,649,909 B1 2/2014 Phillips
8,682,458 B2 3/2014 Hollaway
8,688,280 B2 4/2014 Macey
8,699,462 B2 4/2014 Spinelli et al.
8,725,202 B2 5/2014 Wasily
8,736,193 B2 5/2014 Gallo
8,746,583 B2 6/2014 Simon et al.
8,818,530 B2 8/2014 Netzel, Sr. et al.
8,838,280 B2 9/2014 Macey
8,953,117 B2 2/2015 Rosenau et al.
9,007,186 B1 4/2015 Krummey et al.
9,031,702 B2 5/2015 Pruchniewski et al.
9,058,027 B2 6/2015 Macey
9,069,201 B2 6/2015 Pipitone et al.
9,084,314 B2 7/2015 Conover et al.
9,285,790 B2 3/2016 Pruchniewski et al.
9,501,072 B2 11/2016 Potucek et al.
9,655,810 B2 5/2017 Macey
9,834,451 B2 12/2017 Miller et al.
9,858,792 B2 1/2018 Fernandes et al.
9,971,348 B1 5/2018 Canavor et al.
10,037,675 B2 7/2018 Uy
10,102,585 B1 10/2018 Bryant et al.
10,127,362 B2 11/2018 Bennett et al.
10,159,624 B2 12/2018 Laflamme et al.
10,255,784 B2 4/2019 Uy
10,375,543 B2 8/2019 McQueen et al.
10,394,933 B2 8/2019 Putrevu et al.
10,560,820 B2 2/2020 McQueen et al.
10,618,136 B2 4/2020 Bauckman et al.
10,621,848 B2 4/2020 Uy
10,624,812 B2 4/2020 Laflamme et al.
10,638,292 B2 4/2020 Karp et al.
10,737,951 B2 8/2020 Miller et al.
10,764,235 B2 9/2020 Chu et al.
10,909,834 B2 2/2021 Uy
10,931,472 B2 2/2021 Khalid et al.
10,951,433 B2 3/2021 Khalid et al.
10,996,702 B2 5/2021 Imes et al.

(56) References Cited

U.S. PATENT DOCUMENTS 11,025,448 B2 6/2021 Khalid et al.
11,082,251 B2 8/2021 Khalid et al.
11,096,024 B2 8/2021 McQueen et al.
11,097,958 B2 8/2021 Miller et al.
11,108,585 B2 8/2021 Khalid et al.
11,121,887 B2 9/2021 Khalid et al.
11,136,773 B2 10/2021 Gamboa et al.
11,139,997 B2 10/2021 Khalid et al.
11,153,113 B2 10/2021 Khalid et al.
11,208,822 B2 12/2021 Doan et al.
11,213,455 B2 1/2022 Laflamme et al.
11,215,175 B2 1/2022 Doan et al.
11,256,272 B2 2/2022 Ravid
11,307,600 B2 4/2022 Doan et al.
2001/0028227 A1 10/2001 Lys et al.
2001/0041139 A1 11/2001 Sabini et al.
2001/0047539 A1 12/2001 Lynn
2002/0035403 A1 3/2002 Clark et al.
2002/0043938 A1 4/2002 Lys
2002/0065583 A1 5/2002 Okada et al.
2002/0069460 A1 6/2002 Huffington et al.
2002/0070611 A1* 6/2002 Cline .................. A61H 33/005 307/149
2002/0074559 A1 6/2002 Dowling et al.
2002/0082727 A1 6/2002 Laflamme et al.
2002/0108913 A1 8/2002 Collins
2002/0113555 A1 8/2002 Lys et al.
2002/0120369 A1 8/2002 Boies et al.
2002/0135476 A1 9/2002 McKinney et al.
2002/0149933 A1 10/2002 Archer et al.
2002/0150476 A1 10/2002 Lucke et al.
2002/0152045 A1 10/2002 Dowling et al.
2002/0163316 A1 11/2002 Lys et al.
2002/0171365 A1 11/2002 Morgan et al.
2002/0176259 A1 11/2002 Ducharme
2003/0006891 A1 1/2003 Wild et al.
2003/0034284 A1 2/2003 Wolfe
2003/0040813 A1 2/2003 Gonzales et al.
2003/0057884 A1 3/2003 Dowling et al.
2003/0061004 A1 3/2003 Discenzo
2003/0063900 A1 4/2003 Wang et al.
2003/0085183 A1 5/2003 Mathews
2003/0106147 A1 6/2003 Cohen et al.
2003/0133292 A1 7/2003 Mueller et al.
2003/0150394 A1 8/2003 Wolfe
2003/0168516 A1 9/2003 Cline
2003/0171111 A1 9/2003 Clark
2003/0196942 A1 10/2003 Jones
2003/0222782 A1 12/2003 Gaudreau
2003/0226663 A1 12/2003 Krueger et al.
2004/0016241 A1 1/2004 Street et al.
2004/0017158 A1 1/2004 Ang et al.
2004/0020485 A1* 2/2004 Roesler ................ F26B 25/009 126/80
2004/0047145 A1 3/2004 Koren
2004/0052076 A1 3/2004 Mueller et al.
2004/0105261 A1 6/2004 Ducharme et al.
2004/0117330 A1 6/2004 Ehlers et al.
2004/0133314 A1 7/2004 Ehlers et al.
2004/0141321 A1 7/2004 Dowling et al.
2004/0206548 A1 10/2004 Aronstam et al.
2004/0219025 A1 11/2004 Garcia-Ortiz
2004/0230344 A1 11/2004 Gallupe et al.
2004/0231842 A1 11/2004 Shammai et al.
2004/0260427 A1 12/2004 Wimsatt
2005/0038529 A1 2/2005 Perez et al.
2005/0039527 A1 2/2005 Dhruva et al.
2005/0040774 A1 2/2005 Mueller et al.
2005/0041161 A1 2/2005 Dowling et al.
2005/0047772 A1 3/2005 Hayami et al.
2005/0063123 A1 3/2005 Cline et al.
2005/0066433 A1 3/2005 Phillips
2005/0066434 A1 3/2005 Phillips
2005/0072850 A1 4/2005 Cornwall et al.
2005/0088434 A1 4/2005 Potucek
2005/0099824 A1 5/2005 Dowling et al.
2005/0115716 A1 6/2005 Ciglenec et al.
2005/0123408 A1 6/2005 Koehl
2005/0125718 A1 6/2005 Van Doorn
2005/0128751 A1 6/2005 Roberge et al.
2005/0168902 A1 8/2005 Laflamme et al.
2005/0174473 A1 8/2005 Morgan et al.
2005/0184681 A1 8/2005 Gordin et al.
2005/0191184 A1 9/2005 Vinson
2005/0193485 A1 9/2005 Wolfe
2005/0198063 A1 9/2005 Thomas et al.
2005/0213352 A1 9/2005 Lys
2005/0213353 A1 9/2005 Lys
2005/0218870 A1 10/2005 Lys
2005/0226731 A1 10/2005 Mehlhorn et al.
2005/0236594 A1 10/2005 Lilly et al.
2005/0248299 A1 11/2005 Chemel et al.
2005/0288821 A1 12/2005 Laflamme et al.
2006/0009861 A1 1/2006 Bonasia et al.
2006/0012987 A9 1/2006 Ducharme et al.
2006/0022214 A1 2/2006 Morgan et al.
2006/0023454 A1 2/2006 Koren
2006/0038661 A1 2/2006 Reinhold et al.
2006/0045751 A1 3/2006 Beckman et al.
2006/0059922 A1 3/2006 Anderson et al.
2006/0076908 A1 4/2006 Morgan et al.
2006/0090255 A1 5/2006 Cohen
2006/0112480 A1 6/2006 Sisk
2006/0127227 A1 6/2006 Mehlhorn et al.
2006/0168611 A1 7/2006 Fima
2006/0176693 A1 8/2006 Walter et al.
2006/0198128 A1 9/2006 Piepgras et al.
2006/0204367 A1 9/2006 Meza et al.
2006/0238130 A1 10/2006 Hosoya
2007/0027564 A1 2/2007 Walters
2007/0093920 A1 4/2007 Tarpo et al.
2007/0094784 A1 5/2007 Tran
2007/0096134 A1 5/2007 Kim et al.
2007/0106403 A1 5/2007 Emery et al.
2007/0114162 A1 5/2007 Stiles et al.
2007/0154321 A1 7/2007 Stiles et al.
2007/0154322 A1 7/2007 Stiles et al.
2007/0163929 A1 7/2007 Stiles et al.
2007/0183902 A1 8/2007 Stiles et al.
2007/0216318 A1 9/2007 Altonen et al.
2007/0222295 A1 9/2007 Wareham et al.
2007/0233420 A1 10/2007 Potucek et al.
2007/0233509 A1 10/2007 Buchman et al.
2007/0251461 A1 11/2007 Reichard et al.
2007/0263378 A1 11/2007 Koren
2007/0294443 A1 12/2007 Berenbaum et al.
2007/0299562 A1 12/2007 Kates
2008/0021685 A1 1/2008 Emery et al.
2008/0039977 A1 2/2008 Clark et al.
2008/0041839 A1 2/2008 Tran
2008/0082661 A1 4/2008 Huber
2008/0095638 A1 4/2008 Branecky
2008/0095639 A1 4/2008 Bartos et al.
2008/0106422 A1 5/2008 Sparks et al.
2008/0144678 A1 6/2008 Lu et al.
2008/0165527 A1 7/2008 VanderSchuit
2008/0167756 A1 7/2008 Golden et al.
2008/0167931 A1 7/2008 Gerstemeier et al.
2008/0168599 A1 7/2008 Caudill et al.
2008/0186202 A1 8/2008 Vaswani et al.
2008/0197788 A1 8/2008 Conover et al.
2008/0218002 A1 9/2008 Straka
2008/0221737 A1 9/2008 Josephson et al.
2008/0237148 A1 10/2008 Dennis et al.
2008/0250581 A1 10/2008 Henkin et al.
2008/0251602 A1 10/2008 Leggett et al.
2008/0288115 A1 11/2008 Rusnak et al.
2008/0297068 A1 12/2008 Koren et al.
2008/0311898 A1 12/2008 Benco et al.
2009/0013570 A1 1/2009 Grajcar
2009/0016901 A1 1/2009 Morris, III
2009/0038696 A1 2/2009 Levin et al.
2009/0055029 A1 2/2009 Roberson et al.
2009/0057425 A1 3/2009 Sullivan et al.

(56) References Cited

U.S. PATENT DOCUMENTS

2009/0094173 A1 4/2009 Smith et al.
2009/0109617 A1 4/2009 Grajcar
2009/0132066 A1 5/2009 Hollaway
2009/0138099 A1 5/2009 Veillette
2009/0138131 A1 5/2009 Uy
2009/0143917 A1 6/2009 Uy et al.
2009/0151801 A1 6/2009 Gorman et al.
2009/0164049 A1 6/2009 Nibler et al.
2009/0180281 A1 7/2009 Ahland, III et al.
2009/0180290 A1 7/2009 Grajcar
2009/0185350 A1 7/2009 Grajcar
2009/0185373 A1 7/2009 Grajcar
2009/0185914 A1 7/2009 Elnar
2009/0195349 A1 8/2009 Frader-Thompson et al.
2009/0200245 A1 8/2009 Steinbrueck et al.
2009/0202250 A1 8/2009 Dizechi et al.
2009/0204239 A1 8/2009 Netzel, Sr. et al.
2009/0204263 A1 8/2009 Love
2009/0206769 A1 8/2009 Biery et al.
2009/0210081 A1 8/2009 Sustaeta et al.
2009/0211986 A1 8/2009 Kates
2009/0261045 A1 10/2009 Kilawee et al.
2009/0271042 A1 10/2009 Voysey
2009/0278479 A1 11/2009 Platner et al.
2009/0282627 A1 11/2009 Porat
2009/0290989 A1 11/2009 Mehlhorn et al.
2009/0301522 A1 12/2009 Abehasera et al.
2009/0322346 A1 12/2009 Cao
2009/0327931 A1 12/2009 Bonuso et al.
2010/0004764 A1 1/2010 Ebrom et al.
2010/0017954 A1 1/2010 Peterson et al.
2010/0018930 A1 1/2010 King et al.
2010/0025483 A1 2/2010 Hoeynck et al.
2010/0026102 A1 2/2010 Landgraf et al.
2010/0033277 A1 2/2010 Davis
2010/0039043 A1 2/2010 Wacknov et al.
2010/0046133 A1 2/2010 Suzuki
2010/0066260 A1 3/2010 Newman, Jr. et al.
2010/0068073 A1 3/2010 Branecky
2010/0070059 A1 3/2010 LaFlamme et al.
2010/0082174 A1 4/2010 Weaver
2010/0092308 A1 4/2010 Stiles, Jr. et al.
2010/0100253 A1 4/2010 Fausak et al.
2010/0118511 A1 5/2010 Wegat
2010/0138007 A1 6/2010 Clark et al.
2010/0157599 A1 6/2010 Carter et al.
2010/0179704 A1 7/2010 Ozog
2010/0185972 A1 7/2010 Sherwood, II
2010/0200074 A1 8/2010 Weatherbee et al.
2010/0211509 A1 8/2010 Jacobs
2010/0214317 A1 8/2010 Miura et al.
2010/0219962 A1 9/2010 Brochu et al.
2010/0222934 A1 9/2010 Iino et al.
2010/0232981 A1 9/2010 Branecky et al.
2010/0254825 A1 10/2010 Stiles, Jr. et al.
2010/0262313 A1 10/2010 Chambers et al.
2010/0294751 A1 11/2010 Chandler et al.
2010/0299401 A1 11/2010 Lloyd
2010/0300548 A1 12/2010 DeVerse
2010/0310382 A1 12/2010 Kidd et al.
2010/0313169 A1 12/2010 Huang et al.
2010/0314942 A1 12/2010 Talkin et al.
2010/0321201 A1 12/2010 Huang et al.
2010/0328314 A1 12/2010 Ellingham et al.
2011/0001436 A1 1/2011 Chemel et al.
2011/0002261 A1 1/2011 Mocanu et al.
2011/0002792 A1 1/2011 Bartos et al.
2011/0015797 A1 1/2011 Gilstrap
2011/0040415 A1 2/2011 Nickerson et al.
2011/0046796 A1 2/2011 Brochu et al.
2011/0046806 A1 2/2011 Nagel et al.
2011/0082599 A1 4/2011 Shinde et al.
2011/0091329 A1 4/2011 Stiles, Jr. et al.
2011/0093099 A1 4/2011 Tran et al.
2011/0101868 A1 5/2011 Weiss
2011/0106276 A1 5/2011 Donnell et al.
2011/0178650 A1 7/2011 Picco
2011/0195664 A1 8/2011 Keirstead et al.
2011/0196990 A1 8/2011 Govindaraju et al.
2011/0197977 A1 8/2011 Henderson
2011/0202189 A1 8/2011 Venkatakrishnan et al.
2011/0202190 A1 8/2011 Venkatakrishnan et al.
2011/0202194 A1 8/2011 Kobraei et al.
2011/0202195 A1 8/2011 Finch et al.
2011/0202196 A1 8/2011 Venkatakrishnan et al.
2011/0202198 A1 8/2011 Venkatakrishnan et al.
2011/0202910 A1 8/2011 Venkatakrishnan et al.
2011/0231028 A1 9/2011 Ozog
2011/0253638 A1 10/2011 Easland et al.
2011/0267834 A1 11/2011 Potucek et al.
2011/0286859 A1 11/2011 Ortiz et al.
2011/0290707 A1 12/2011 Porat
2011/0299068 A1 12/2011 Glandt et al.
2012/0006730 A1 1/2012 Tesauro et al.
2012/0020810 A1 1/2012 Stiles, Jr. et al.
2012/0029705 A1 2/2012 Broniak et al.
2012/0053737 A1 3/2012 Valluri et al.
2012/0063921 A1 3/2012 Stiles, Jr. et al.
2012/0065798 A1 3/2012 Finch et al.
2012/0078426 A1 3/2012 Macey
2012/0089269 A1 4/2012 Weaver et al.
2012/0093508 A1 4/2012 Baykal et al.
2012/0100010 A1 4/2012 Stiles, Jr. et al.
2012/0101647 A1 4/2012 LaFlamme et al.
2012/0106149 A1 5/2012 Boa
2012/0117724 A1 5/2012 Caudill et al.
2012/0130550 A1 5/2012 Brochu et al.
2012/0158336 A1 6/2012 Duchamp et al.
2012/0185571 A1 7/2012 Uy
2012/0209444 A1 8/2012 Seo et al.
2012/0215370 A1 8/2012 Seo et al.
2012/0219428 A1 8/2012 Cantolino et al.
2012/0221162 A1 8/2012 Forbes, Jr.
2012/0221746 A1 8/2012 Grinberg
2012/0222997 A1 9/2012 Potucek et al.
2012/0226383 A1 9/2012 Hollaway
2012/0239206 A1 9/2012 Sauer et al.
2012/0295456 A1 11/2012 Severac
2012/0296447 A1 11/2012 Diller et al.
2012/0316808 A1 12/2012 Frader-Thompson et al.
2012/0323385 A1 12/2012 Thiruvengada et al.
2013/0010018 A1 1/2013 Economy
2013/0024306 A1 1/2013 Shah et al.
2013/0026947 A1 1/2013 Economy et al.
2013/0027176 A1 1/2013 Stocker
2013/0030589 A1 1/2013 Pessina et al.
2013/0030729 A1 1/2013 Tu et al.
2013/0068631 A1 3/2013 Brochu et al.
2013/0071029 A1 3/2013 Terwilliger et al.
2013/0075311 A1 3/2013 Steinbrueck et al.
2013/0085620 A1 4/2013 Lu et al.
2013/0088152 A1 4/2013 Hagen
2013/0096726 A1 4/2013 Lyren et al.
2013/0098849 A1 4/2013 Doyle et al.
2013/0124763 A1 5/2013 Kessler
2013/0129536 A1 5/2013 Robol et al.
2013/0166965 A1 6/2013 Brochu et al.
2013/0197827 A1* 8/2013 Besore .................. G01K 17/08
702/45
2013/0201316 A1 8/2013 Binder et al.
2013/0251542 A1 9/2013 Stiles, Jr. et al.
2013/0319535 A1 12/2013 Boger et al.
2013/0320858 A1 12/2013 Deery et al.
2013/0331087 A1 12/2013 Shoemaker et al.
2014/0001977 A1* 1/2014 Zacharchuk ............. H04B 7/04
315/291
2014/0034562 A1 2/2014 Wallace
2014/0058567 A1 2/2014 Matsuoka et al.
2014/0064139 A1 3/2014 Mcqueen et al.
2014/0091923 A1 4/2014 Heninwolf
2014/0107848 A1 4/2014 Macey
2014/0119077 A1 5/2014 Walters et al.
2014/0130878 A1 5/2014 Marinez
2014/0145644 A1 5/2014 Netzel, Sr. et al.

(56) References Cited

U.S. PATENT DOCUMENTS

2014/0175875 A1 6/2014 Newman, Jr. et al.
2014/0177469 A1 6/2014 Neyhart
2014/0180487 A1 6/2014 Bull
2014/0210373 A1 7/2014 Baret
2014/0224350 A1 8/2014 Patel
2014/0225511 A1 8/2014 Pickard et al.
2014/0229023 A1 8/2014 Bomholt et al.
2014/0259612 A1 9/2014 Bauckman et al.
2014/0262998 A1 9/2014 Wagner et al.
2014/0264111 A1 9/2014 Porter et al.
2014/0265842 A1 9/2014 Potucek et al.
2014/0265875 A1 9/2014 Nelson et al.
2014/0266755 A1 9/2014 Arensmeier et al.
2014/0266788 A1 9/2014 Bauckman et al.
2014/0268678 A1 9/2014 Potucek et al.
2014/0277777 A1 9/2014 Potucek
2014/0292204 A1 10/2014 Potucek et al.
2014/0303757 A1 10/2014 Pruchniewski et al.
2014/0303781 A1 10/2014 Potucek et al.
2014/0303782 A1 10/2014 Pruchniewski et al.
2014/0314062 A1 10/2014 Loebs
2014/0322030 A1 10/2014 Stiles, Jr. et al.
2014/0336821 A1 11/2014 Blaine et al.
2014/0343734 A1 11/2014 Meyer
2014/0358458 A1* 12/2014 Shahi ...................... B60L 50/51
702/61
2014/0379146 A1 12/2014 Macey
2015/0030463 A1 1/2015 Stiles, Jr. et al.
2015/0040307 A1 2/2015 Deloche et al.
2015/0042276 A1 2/2015 Biedrzycki
2015/0049750 A1 2/2015 Uy et al.
2015/0112492 A1 4/2015 Panther et al.
2015/0156031 A1 6/2015 Fadell et al.
2015/0161870 A1 6/2015 Podlisker
2015/0204334 A1 7/2015 Stiles, Jr. et al.
2015/0211531 A1 7/2015 Stiles, Jr. et al.
2015/0238384 A1 8/2015 Macey
2015/0243154 A1 8/2015 Uy
2015/0335525 A1 11/2015 Breau et al.
2015/0362925 A1 12/2015 Uy et al.
2015/0381795 A1 12/2015 Brochu et al.
2016/0002942 A1 1/2016 Orlando
2016/0069048 A1 3/2016 Colbert et al.
2016/0077530 A1 3/2016 Moran et al.
2016/0143115 A1 5/2016 Zhang
2016/0153456 A1 6/2016 Stiles, Jr. et al.
2016/0227981 A1 8/2016 Francisco
2016/0238668 A1 8/2016 Cordray et al.
2016/0244988 A1 8/2016 Barcelos et al.
2016/0249287 A1 8/2016 Xie et al.
2016/0269194 A1 9/2016 Clark
2016/0275633 A1 9/2016 Gitt et al.
2016/0281719 A1 9/2016 Wung et al.
2016/0284206 A1 9/2016 Boettcher et al.
2016/0286633 A1 9/2016 Juslen
2016/0319559 A1 11/2016 Durvasula et al.
2016/0335272 A1 11/2016 Drogobetski et al.
2016/0340205 A1 11/2016 Murdock
2017/0017315 A1 1/2017 LaFlamme et al.
2017/0027410 A1 2/2017 Stoyanov et al.
2017/0038123 A1 2/2017 Strickland et al.
2017/0053360 A1 2/2017 Loeb et al.
2017/0092096 A1 3/2017 Fernandes et al.
2017/0134171 A1 5/2017 Woxland et al.
2017/0138612 A1* 5/2017 Kaiser ...................... F24H 3/06
2017/0142249 A1 5/2017 Shinar
2017/0146964 A1* 5/2017 Beals .................... G05B 15/02
2017/0160710 A1 6/2017 Kang et al.
2017/0160732 A1 6/2017 Kang et al.
2017/0161463 A1 6/2017 Kang et al.
2017/0164452 A1 6/2017 Lyons, Sr. et al.
2017/0170979 A1 6/2017 Khalid et al.
2017/0175746 A1 6/2017 Mayleben
2017/0206615 A1 7/2017 Sloop et al.
2017/0209338 A1 7/2017 Potucek et al.
2017/0209339 A1 7/2017 Potucek et al.
2017/0209340 A1 7/2017 Potucek et al.
2017/0209341 A1 7/2017 Potucek et al.
2017/0211285 A1 7/2017 Potucek et al.
2017/0212484 A1 7/2017 Potucek et al.
2017/0212489 A1 7/2017 Potucek et al.
2017/0212530 A1 7/2017 Potucek et al.
2017/0212532 A1 7/2017 Potucek et al.
2017/0212536 A1 7/2017 Potucek et al.
2017/0213451 A1 7/2017 Potucek et al.
2017/0215261 A1 7/2017 Potucek et al.
2017/0249285 A1 8/2017 Stewart et al.
2017/0346688 A1 11/2017 Reddy et al.
2017/0363312 A1* 12/2017 Crimins ............... G05B 19/042
2018/0012478 A1 1/2018 Uy
2018/0089763 A1 3/2018 Okazaki
2018/0148912 A1 5/2018 Park
2018/0174207 A1 6/2018 Potucek et al.
2018/0224822 A1 8/2018 Potucek et al.
2018/0240322 A1 8/2018 Potucek et al.
2018/0254949 A1 9/2018 Reddy et al.
2018/0254950 A1 9/2018 Reddy et al.
2018/0373304 A1 12/2018 Davis et al.
2019/0032353 A1 1/2019 Gimenez Pallar et al.
2019/0087548 A1 3/2019 Bennett et al.
2019/0158306 A1 5/2019 Khalid et al.
2019/0180595 A1 6/2019 Uy
2019/0206048 A1 7/2019 Crabtree
2019/0212022 A1* 7/2019 Aeberhard ......... G05B 19/0428
2019/0314243 A1 10/2019 MacCallum et al.
2020/0096238 A1* 3/2020 Hikone ................... F25B 13/00
2020/0137534 A1 4/2020 McQueen et al.
2020/0150633 A1 5/2020 Goldman et al.
2020/0198068 A1 6/2020 Bauckman et al.
2020/0202698 A1 6/2020 Uy
2020/0207237 A1* 7/2020 Zuo .................... H01M 10/625
2020/0255301 A1 8/2020 Budampati et al.
2020/0271312 A1* 8/2020 Litka ...................... F22B 37/42
2021/0010989 A1 1/2021 Yizhack et al.
2021/0110694 A1 4/2021 Uy
2021/0298557 A1 9/2021 Budampati et al.
2021/0300804 A1 9/2021 Broga et al.
2021/0301985 A1 9/2021 Brown et al.
2021/0309539 A1 10/2021 Budampati et al.
2021/0367806 A1 11/2021 Khalid et al.
2021/0388627 A1 12/2021 Brown et al.

FOREIGN PATENT DOCUMENTS

AU 2008319307 B2 7/2013
AU 2010274095 B2 9/2013
AU 2013200894 A1 9/2013
AU 2010302872 B2 10/2014
AU 2014200963 A1 12/2014
AU 2014203608 A1 3/2015
AU 2015100298 A4 4/2015
AU 2013270529 B2 5/2015
AU 2010235166 B2 8/2015
AU 2014228186 A1 10/2015
AU 2012244365 B2 11/2015
AU 2014248819 A1 11/2015
AU 2010101532 A4 1/2016
AU 2011296098 B2 7/2016
AU 2014380388 A1 8/2016
AU 2012328263 B2 11/2016
AU 2016202400 A1 11/2016
AU 2013206751 B2 12/2016
AU 2015275057 A1 2/2017
AU 2014251158 B2 6/2017
AU 2016269466 A1 6/2017
AU 2017203145 A1 6/2017
CA 2 486 045 A1 4/2005
CA 2670557 C 10/2016
CN 2634785 Y 8/2004
CN 1829404 A 9/2006
CN 202954952 U 5/2013
CN 103292421 A 9/2013
CN 103292421 A * 9/2013
CN 108870529 A * 11/2018

(56) References Cited

FOREIGN PATENT DOCUMENTS

| | | | | |
|---|---|---|---|---|
| EP | 0847008 | A2 | | 6/1998 |
| EP | 0863278 | A2 | | 9/1998 |
| EP | 1016062 | A1 | | 7/2000 |
| GB | 2 239 306 | A | | 6/1991 |
| JP | H0886433 | A | | 4/1996 |
| JP | H08886433 | A | * | 4/1996 |
| KR | 20070062669 | A | | 6/2007 |
| WO | 92/13195 | A1 | | 8/1992 |
| WO | 97/11448 | A1 | | 3/1997 |
| WO | 98/36339 | A1 | | 8/1998 |
| WO | 98/59174 | A1 | | 12/1998 |
| WO | 99/31560 | A2 | | 6/1999 |
| WO | 00/01067 | A2 | | 1/2000 |
| WO | 01/05195 | A1 | | 1/2001 |
| WO | 01/24584 | A1 | | 4/2001 |
| WO | 01/36864 | A2 | | 5/2001 |
| WO | 01/82657 | A1 | | 11/2001 |
| WO | 01/99475 | A1 | | 12/2001 |
| WO | 02/10847 | A2 | | 2/2002 |
| WO | 02/11497 | A1 | | 2/2002 |
| WO | 02/12127 | A2 | | 2/2002 |
| WO | 02/13490 | A2 | | 2/2002 |
| WO | 02/18913 | A2 | | 3/2002 |
| WO | 02/25842 | A2 | | 3/2002 |
| WO | 02/040921 | A2 | | 5/2002 |
| WO | 02/045467 | A2 | | 6/2002 |
| WO | 02/061330 | A2 | | 8/2002 |
| WO | 02/069306 | A2 | | 9/2002 |
| WO | 02/091805 | A2 | | 11/2002 |
| WO | 02/098182 | A2 | | 12/2002 |
| WO | 02/098183 | A1 | | 12/2002 |
| WO | 02/099780 | A2 | | 12/2002 |
| WO | 02/101702 | A2 | | 12/2002 |
| WO | 03/024269 | A1 | | 3/2003 |
| WO | 03/026358 | A1 | | 3/2003 |
| WO | 03/055273 | A2 | | 7/2003 |
| WO | 03/067934 | A2 | | 8/2003 |
| WO | 03/096761 | A1 | | 11/2003 |
| WO | 03/099705 | A2 | | 12/2003 |
| WO | 2004/021747 | A2 | | 3/2004 |
| WO | 2004/023034 | A1 | | 3/2004 |
| WO | 2004/023850 | A2 | | 3/2004 |
| WO | 2004/032572 | A2 | | 4/2004 |
| WO | 2004/094896 | A2 | | 11/2004 |
| WO | 2004/100624 | A2 | | 11/2004 |
| WO | 2005/012997 | A2 | | 2/2005 |
| WO | 2005/024898 | A2 | | 3/2005 |
| WO | 2005/060309 | A2 | | 6/2005 |
| WO | 2005/084339 | A2 | | 9/2005 |
| WO | 2005/089293 | A2 | | 9/2005 |
| WO | 2005/089309 | A2 | | 9/2005 |
| WO | 2006/023149 | A2 | | 3/2006 |
| WO | 2006/031753 | A2 | | 3/2006 |
| WO | 2006/031810 | A2 | | 3/2006 |
| WO | 2006/093889 | A2 | | 9/2006 |
| WO | 2007/092619 | A2 | | 8/2007 |
| WO | 2007/095087 | A2 | | 8/2007 |
| WO | 2008/067402 | A2 | | 6/2008 |
| WO | 2010/030332 | A1 | | 3/2010 |
| WO | 2011/106557 | A1 | | 9/2011 |
| WO | 2011/143736 | A1 | | 11/2011 |
| WO | 2014/143779 | A2 | | 9/2014 |
| WO | 2014/144445 | A1 | | 9/2014 |
| WO | 2014/150919 | A1 | | 9/2014 |
| WO | 2014/151520 | A1 | | 9/2014 |
| WO | 2014/164721 | A1 | | 10/2014 |
| WO | 2015/048412 | A1 | | 4/2015 |
| WO | 2015/116035 | A1 | | 8/2015 |
| WO | 2016/074749 | A1 | | 5/2016 |
| WO | 2016/102021 | A1 | | 6/2016 |
| WO | 2016/102022 | A1 | | 6/2016 |
| WO | 2016/107658 | A1 | | 7/2016 |
| WO | 2017/127802 | A1 | | 7/2017 |

OTHER PUBLICATIONS

Extended European Search Report dated Oct. 1, 2021, issued in connection with European Patent Appln. No. 19747383.8 (10 pages).
European Office Action dated Oct. 28, 2021, issued in connection with European Patent Appln. No. 17742102.1 (7 pages).
Office Action dated Mar. 16, 2022, issued in connection with U.S. Appl. No. 16/208,458 (19 pages).
Office Action dated May 3, 2022, issued in connection with U.S. Appl. No. 15/957,482 (32 pages).
Examiner's Answer to Appeal Brief, dated Jun. 13, 2022, in connection with U.S. Appl. No. 15/413,199 (38 pages).
Australian Office Action dated Jun. 29, 2022, issued in connection with Australian Patent Appln. No. 2017210106 (4 pages).
Office Action dated Feb. 13, 2019, issued in connection with U.S. Appl. No. 16/208,458 (18 pages).
Office Action dated Feb. 25, 2019, issued in connection with U.S. Appl. No. 15/413,145 (17 pages).
Restriction Requirement dated Mar. 18, 2019, issued in connection with U.S. Appl. No. 15/413,111 (11 pages).
Notice of Allowance dated Mar. 21, 2019, issued in connection with U.S. Appl. No. 15/413,117 (9 pages).
Restriction Requirement dated Apr. 17, 2019, issued in connection with U.S. Appl. No. 15/413,199 (6 pages).
Notice of Allowance dated Apr. 26, 2019, issued in connection with U.S. Appl. No. 15/413,141 (14 pages).
Notice of Allowance dated Apr. 30, 2019, issued in connection with U.S. Appl. No. 15/413,224 (10 pages).
PCT Invitation to Pay Additional Fees dated Jun. 19, 2019, issued in connection with International Application No. PCT/US2019/016078 (2 pages).
Office Action dated Jul. 8, 2019, issued in connection with U.S. Appl. No. 15/886,576 (29 pages).
Office Action dated Jul. 26, 2019, issued in connection with U.S. Appl. No. 15/886,171 (22 pages).
Notice of Allowance dated Aug. 12, 2019, issued in connection with U.S. Appl. No. 15/413,224 (11 pages).
International Search Report of the International Searching Authority dated Aug. 27, 2019, issued in connection with International Application No. PCT/US2019/16078 (5 pages).
Written Opinion of the International Searching Authority dated Aug. 27, 2019, issued in connection with International Application No. PCT/US2019/16078 (7 pages).
Office Action dated Aug. 30, 2019, issued in connection with U.S. Appl. No. 15/413,199 (23 pages).
Office Action dated Sep. 5,2019, issued in connection with U.S. Appl. No. 16/239,048 (9 pages).
Office Action dated Sep. 13, 2019, issued in connection with U.S. Appl. No. 15/413,145 (11 pages).
Partial Supplementary European Search Report and Provisional Opinion dated Sep. 16, 2019, issued in connection with European Patent Appln. No. 17742102.1 (13 pages).
Notice of Allowance dated Sep. 23, 2019, issued in connection with U.S. Appl. No. 15/413,141 (8 pages).
Office Action dated Oct. 18, 2019, issued in connection with U.S. Appl. No. 15/413,128 (27 pages).
Notice of Allowance dated Oct. 28, 2019, issued in connection with U.S. Appl. No. 15/413,224 (11 pages).
Office Action dated Oct. 28, 2019, issued in connection with U.S. Appl. No. 15/957,482 (24 pages).
Office Action dated Nov. 4, 2019, issued in connection with U.S. Appl. No. 15/413,111 (14 pages).
Notice of Allowance dated Nov. 18, 2019, issued in connection with U.S. Appl. No. 15/413,141 (8 pages).
Office Action dated Nov. 26, 2019, issued in connection with U.S. Appl. No. 16/208,458 (18 pages).
Extended European Search Report dated Jan. 3, 2020, issued in connection with European Patent Appln. No. 17742102.1 (10 pages).
Notice of Allowance dated Feb. 7, 2020, issued in connection with U.S. Appl. No. 15/413,141 (8 pages).
Notice of Allowance dated Feb. 12, 2020, issued in connection with U.S. Appl. No. 15/413,224 (11 pages).

(56) References Cited

OTHER PUBLICATIONS

Notice of Allowance dated Mar. 30, 2020, issued in connection with U.S. Appl. No. 15/413,145 (6 pages).
Office Action dated Apr. 9, 2020, issued in connection with U.S. Appl. No. 15/886,576 (35 pages).
Office Action dated Apr. 21, 2020, issued in connection with U.S. Appl. No. 15/886,171 (27 pages).
Office Action dated May 5, 2020, issued in connection with U.S. Appl. No. 16/208,458 (20 pages).
Office Action dated May 12, 2020, issued in connection with U.S. Appl. No. 15/413,128 (29 pages).
Notice of Allowance dated Jun. 2, 2020, issued in connection with U.S. Appl. No. 15/413,141 (8 pages).
Notice of Allowance dated Jun. 5, 2020, issued in connection with U.S. Appl. No. 15/413,224 (10 pages).
Office Action dated Jun. 11, 2020, issued in connection with U.S. Appl. No. 15/413,199 (40 pages).
Office Action dated Jul. 28, 2020, issued in connection with U.S. Appl. No. 15/957,482 (27 pages).
Notice of Allowance dated Aug. 11, 2020, issued in connection with U.S. Appl. No. 15/413,141 (8 pages).
Notice of Allowance dated Aug. 19, 2020, issued in connection with U.S. Appl. No. 15/413,224 (10 pages).
Notice Allowance dated Sep. 8, 2020, issued in connection with U.S. Appl. No. 15/413,145 (5 pages).
Office Action dated Nov. 17, 2020, issued in connection with U.S. Appl. No. 16/208,458 (21 pages).
Notice of Allowance dated Dec. 11, 2020, issued in connection with U.S. Appl. No. 15/413,224 (10 pages).
Office Action dated Jan. 29, 2021, issued in connection with U.S. Appl. No. 15/413,199 (39 pages).
Office Action dated Apr. 5, 2021, issued in connection with U.S. Appl. No. 15/957,482 (28 pages).
Notice of Allowance dated Apr. 26, 2021, issued in connection with U.S. Appl. No. 15/413,145 (6 pages).
Notice of Allowance dated Apr. 30, 2021, issued in connection with U.S. Appl. No. 15/413,141 (8 pages).
Office Action dated Jun. 21, 2021, issued in connection with U.S. Appl. No. 16/208,458 (15 pages).
Notice of Allowance dated Jul. 1, 2021, issued in connection with U.S. Appl. No. 15/413,141 (8 pages).
Notice of Allowance dated Jul. 19, 2021, issued in connection with U.S. Appl. No. 15/413,145 (5 pages).
Notice of Allowance dated Jul. 20, 2021, issued in connection with U.S. Appl. No. 15/413,128 (11 pages).
Australian Office Action dated Sep. 13, 2021, issued in connection with Australian Patent Appln. No. 2017210106 (7 pages).
Aqua Logic Automation and Chlorination Operation Manual for Models AQ-LOGIC-PS-4, AQ-LOGIC-P-4, Goldline Controls, Inc., known about at least as early as Mar. 15, 2012 (28 pages).
Aqua Logic Automation and Chlorination Installation Manual for Models AQ-LOGIC-PS-4, AQ-LOGIC-PS-8, Goldline Controls, Inc., known about at least as early as Mar. 15, 2012 (32 pages).
Aqua Logic Automation and Chlorination Operation Manual for Models AQ-LOGIC-PS-4, AQ-LOGIC-PS-8, Goldline Controls, Inc., known about at least as early as Mar. 15, 2012 (36 pages).
Pro Logic Automation and Chlorination Installation Manual for Model PL-P-4, Goldline Controls, Inc. (2008) (36 pages).
Pro Logic Automation and Chlorination Operation Manual for Model PL-P-4, Goldline Controls, Inc. (2008) (40 pages).
Pro Logic Automation and Chlorination Installation Manual for Models PL-PS-4, PL-PS-8, PL-PS-16, PL-PS-8-V, PL-PS-16-V, Goldline Controls, Inc. (2008) (48 pages).
Pro Logic Automation and Chlorination Operation Manual for Models PL-PS-4, PL-PS-8, PL-PS-16, PL-PS-8-V, PL-PS-16-V, Goldline Controls, Inc. (2007) (52 pages).
Compool (Pentair) Cp3800 Pool-Spa Control System Installation and Operating Instructions (Nov. 7, 1997) (43 pages).
Pentair RS-485 Pool Controller Adapter Published Advertisement from Pool and Spa News (Mar. 22, 2002) (2 pages).
Pentair IntelliTouch Owner's Manual—Set-Up and Programming (May 22, 2003) (60 pages).
Pentair IntelliComm Communication Center Installation Guide, Rev. B, Sep. 2008 (16 pages).
Pentair EasyTouch and IntelliTouch Pool and Spa Control System Load Center Installation Guide (2011) (60 pages).
Pentair IntelliTouch Pool and Spa Control System User's Guide and Instructions (2011) (126 pages).
Pentair IntelliFlo Variable Speed Programmable Pump Installation and User's Guide, Rev. C, Apr. 2012 (44 pages).
Pentair IntelliFlo 4×160 High Performance Pump brochure (4 pages) and "IntelliFlo vs. IntelliFlo 4×160 Pump Comparison" printed from Internet website http://www.pentairpool.com/intelliflo_comparison.htm on Jun. 7, 2006 (1 page).
Pentair IntelliChem Water Chemistry Controller Installation and User's Guide (2014) (64 pages).
Brochure by Fluidra entitled "Fluidra Connect Internet of Pools" and distributed at tradeshow in Barcelona, Spain, Oct. 2015 (4 pages).
Fluidra Connect—Internet of Pools, archived website on Aug. 6, 2015, https://web.archive.org/web/20150806194325/http://www.fluidraconnect.com:80/ (English translation) (8 pages).
Jandy, "AquaLink RS All Button and OneTouch Control Systems Installation Manual," 2007, Jandy Pool Products, Version 6594N (48 pages).
Zodiac, "iAquaLink 2.0 Web Connect Device Installation Manual," 2013, Zodiac Pool Systems, Version H0435500 Rev B (16 pages).
International Search Report of the International Searching Authority dated Jun. 6, 2017, issued in connection with International Application No. PCT/US2017/014560 (4 pages).
Written Opinion of the International Searching Authority dated Jun. 6, 2017, issued in connection with International Application No. PCT/US2017/014560 (11 pages).
Office Action dated Jun. 20, 2017, issued in connection with U.S. Appl. No. 15/413,074 (45 pages).
Office Action dated Jul. 6, 2017, issued in connection with U.S. Appl. No. 15/413,117 (11 pages).
Office Action dated Aug. 3, 2017, issued in connection with U.S. Appl. No. 15/413,095 (12 pages).
Office Action dated Aug. 4, 2017, issued in connection with U.S. Appl. No. 15/413,128 (29 pages).
Office Action dated Aug. 17, 2017, issued in connection with U.S. Appl. No. 15/413,224 (33 pages).
Office Action dated Dec. 4, 2017, issued in connection with U.S. Appl. No. 15/413,128 (28 pages).
Office Action dated Jan. 25, 2018, issued in connection with U.S. Appl. No. 15/413,074 (52 pages).
Office Action dated May 24, 2018, issued in connection with U.S. Appl. No. 15/413,117 (5 pages).
Notice of Allowance dated Jun. 4, 2018, issued in connection with U.S. Appl. No. 15/413,224 (10 pages).
Office Action dated Jun. 8, 2018, issued in connection with U.S. Appl. No. 15/413,020 (16 pages).
Office Action dated Jun. 12, 2018, issued in connection with U.S. Appl. No. 15/413,095 (5 pages).
Office Action dated Jun. 15, 2018, issued in connection with U.S. Appl. No. 15/413,174 (15 pages).
Office Action dated Jun. 15, 2018, issued in connection with U.S. Appl. No. 15/413,145 (15 pages).
Office Action dated Jun. 28, 2018, issued in connection with U.S. Appl. No. 15/413,128 (29 pages).
Interview Summary dated Jul. 13, 2018, issued in connection with U.S. Appl. No. 15/413,074 (3 pages).
Restriction Requirement dated Aug. 13, 2018, issued in connection with U.S. Appl. No. 15/413,141 (15 pages).
Notice of Allowance dated Aug. 27, 2018, issued in connection with U.S. Appl. No. 15/413,074 (12 pages).
Notice of Allowance dated Aug. 29, 2018, issued in connection with U.S. Appl. No. 15/413,117 (9 pages).
Office Action dated Aug. 31, 2018, issued in connection with U.S. Appl. No. 15/413,224 (31 pages).
Notice of Allowance dated Oct. 4, 2018, issued in connection U.S. Appl. No. 15/413,095 (10 pages).

(56) References Cited

OTHER PUBLICATIONS

Interview Summary dated Oct. 16, 2018, issued in connection with U.S. Appl. No. 15/413,128 (3 pages).
Notice of Allowance dated Nov. 30, 2018, issued in connection with U.S. Appl. No. 15/413,074 (10 pages).
Restriction Requirement dated Nov. 30, 2018, issued in connection with U.S. Appl. No. 15/413,217 (7 pages).
Interview Summary dated Dec. 12, 2018, issued in connection with U.S. Appl. No. 15/413,141 (3 pages).
Office Action dated Dec. 13, 2018, issued in connection with U.S. Appl. No. 15/413,174 (23 pages).
Office Action dated Jan. 9, 2019, issued in connection with U.S. Appl. No. 15/413,141 (34 pages).
Office Action dated Jan. 23, 2019, issued in connection with U.S. Appl. No. 15/413,020 (22 pages).
Office Action dated Jan. 29, 2019, issued in connection with U.S. Appl. No. 15/413,128 (28 pages).
U.S. Appl. No. 60/515,090 entitled "Color Changing Image with Backlighting and Combination Localized Gray-Scale and Color Image" filed Oct. 28, 2003, Inventors: Kevin Potucek and Kevin Murphy (coversheet and 12 pages).
U.S. Appl. No. 60/071,281 entitled "Digitally Controlled Light Emitting Diode Systems and Methods" filed Dec. 17, 1997, Inventors: George G. Mueller and Ihor A. Lys (coversheet and 23 pages).
U.S. Appl. No. 60/243,250 entitled "Illumination of Liquids" filed Oct. 25, 2000, Inventors: Frederick Morgan, Timothy Holmes, Chris Cantone, Ihor Lys and George Mueller (coversheet and 23 pages).
U.S. Appl. No. 60/297,828 entitled "Systems and Methods for Controlling Lighting Systems" filed Jun. 13, 2001, Inventors: George Mueller, Frederick Morgan, Ihor Lys and Kevin Dowling (coversheet and 12 pages).
U.S. Appl. No. 60/296,377 entitled "Systems and Methods for Controlling Lighting Systems" filed Jun. 6, 2001, Inventors: Mike Blackwell (coversheet and 10 pages).
U.S. Appl. No. 60/290,101 entitled "Systems and Methods for Synchronizing Illumination Systems" filed May 10, 2001, Inventors: Kevin Dowling and Eric K. Schanberger (coversheet and 26 pages).
U.S. Appl. No. 60/090,920 entitled "Method for Software Driven Generation of Multiple Simultaneous High Speed Pulse Width Modulated Signals" filed Jun. 26, 1998, Inventors: Ihor Lys (coversheet and 7 pages).
U.S. Appl. No. 60/078,861 entitled "Digital Lighting Systems" filed Mar. 20, 1998, Inventors: Ihor Lys (coversheet and 1 page).
U.S. Appl. No. 60/079,285 entitled "Systems and Methods for Controlled Illumination" filed Mar. 25, 1998, Inventors George G. Mueller and Ihor Lys (coversheet and 33 pages).
U.S. Appl. No. 60/068,792 entitled "Multi-Color Intelligent Lighting" filed Dec. 24, 1997, Inventors: George G. Mueller and Ihor Lys (coversheet and 1 page).
U.S. Appl. No. 60/199,333 entitled "Autonomous Color Changing Accessory" filed Apr. 24, 2000, Inventors: Al Ducharme, Ihor Lys and Kevin Dowling (coversheet and 18 pages).
International Search Report of the International Searching Authority dated Jun. 12, 2008, issued in connection with International Patent Appl. No. PCT/US07/85793 (3 pages).
Written Opinion of the International Searching Authority dated Jun. 12, 2008, issued in connection with International Patent Appl. No PCT/US07/85793 (5 pages).
Supplementary European Search Report dated Jan. 27, 2014, issued in connection with European Patent Appln. No. 07871628 (7 pages).
Sta-Rite Large Underwater Light Niche Owner's Manual (2004) (8 pages).
Hayward Underwater ColorLogic LED Lighting Fixtures for Swimming Pools and Spas (Generation 2.5), SP0524(S) / SP0525(S) / SP0532(S) / SP0533(S) Owner's Guide (2004) (12 pages).
Hayward Underwater ColorLogic LED Lighting Fixtures for Swimming Pools and Spas, SP0522(S) / SP0523(S) /SP0530(S) / SP0531(S) Owner's Guide (2004) (12 pages).
Hayward Underwater ColorLogic LED Lighting Fixtures for Swimming Pools and Spas, SP0524(S) / SP0525(S) / SP0527(S) / SP0532(S) / SP0533(S) / SP0535(S) Owner's Guide (2004) (12 pages).
Pentair IntelliBrite Underwater Color-Changing Lights, product description (2006) (4 pages).
American/Pentair Niche w/¾ in. Side Hub, Concrete (78210400), printed from Internet website http://www.poolplaza.com/P-PEN-78210400-2282.html (Oct. 19, 2010) (1 page).
American/Pentair Niche w/1.0 in. Hub, Vinyl/Fbgls (10 Hole) (78232500), printed from Internet website http://www.poolplaza.com/P-PEN-78210400-2282.html (Oct. 19, 2010) (1 page).
Pentair 620004 AmerLite Quick Niche, printed from Internet website http://www.aqua-man.com/row.sub.—num.asp?lc=1892 (Oct. 19, 2010) (2 pages).
Pentair 79206700 AmerLite Large Plastic Niche, printed from Internet website http://www.aqua-man.com/row.sub.—num.asp?lc=1895 (Oct. 19, 2010) (2 pages).
Pentair QuickNiche Vinyl Pool Lighting Niche, product description (2006) (2 pages).
Jandy ProNiche Pool & Spa Light Niches, product description (2007) (2 pages).
Jandy Installation Manual "Jandy Housing for Wet Niche Fixtures" (2007) (8 pages).
Product Specifications for Jandy ProNiche Pool and Spa Light Niches, printed from Internet website http://www.jandy.com/html/products/lights/proniche/specs.php (Oct. 19, 2010) (2 pages).
Sanderfoot, Alan E., "Too Late, But Not Too Little", Aqua—The Business Magazine for Spa & Pool Professionals, Jul. 1996, vol. 21, No. 7, p. 8. (1 page).
Pollock, Elissa Sard, "Unrecognized Peril? The Industry Responds to Spa and Pool Drain-Related Drownings", Aqua—The Business Magazine for Spa & Pool Professionals, Jul. 1996, pp. 63-64 (2 pages).
"Important Points to Know About CalSpas", brochure, date unkown (10 pages).
Yu, et al., "AC Induction Motor Control Using Constant V/Hz Principle and Space Vector PWM Technique with TMS320C240," Texas Instruments (Apr. 1998) (131 pages).
Control Techniques, Dinverter 2B User Guide, "Variable Speed Drive for three-phase induction motors 0.75kW to 4.0kW, 1.0 HP to 5.3 HP", Nov. 1998 (94 pages).
Control Techniques, Commander SE Advanced User Guide, "Variable speed drive for 3 phase induction motors from 0.25kW to 37kW", Nov. 2002 (194 pages).
Baldor Motors and Drives, Series 10 Inverter Control Installation and Operating Instructions (Feb. 2000) (74 pages).
Danfoss VLT 6000 Series Adjustable Frequency Drive Installation, Operation, and Maintenance Manual, Rev. G (Mar. 2000) (118 pages).
Danfoss VLT 8000 AQUA Instruction Manual (Apr. 16, 2004) (210 pages).
"New AC Drive Series Targets Water, Wastewater Applications," Product Focus, WaterWorld Magazine, vol. 8, No. 7 (Jul. 2002) (5 pages).
A.O. Smith eMod Motors brochure (2 pages) and eMod Load Sensing Module Specification and Instruction Guide (13 pages), both dated 2006.
Robert S. Carrow, Electrician's Technical Reference—Variable Frequency Drives (published by Delmar) (2001) (187 pages).
Bergquist Bond-Ply 100/400/660B Thermally Conductive Pressure Sensitive Adhesive Tape, datasheets retrieved from http://www.bergquistcompany.com, publicly available prior to Dec. 24, 2008 (3 pages).
Cool Polymers CoolPoly D5108 Thermally Conductive Polyphenylene Sulfide (PPS), Product Data Sheet dated Aug. 8, 2007 (2 pages).
Levin, Alan P, P.E., "Design and Development of a Safety Vacuum Release System", Proceedings of the 2007 ASME International Mechanical Engineering Congress and Exposition, Nov. 11-15, 2007, Seattle, Washington (8 pages).
Teel Vacuum Switch Operating Instructions and Parts Manual, 1995, W.W. Granger, Inc. (4 pages).

(56) References Cited

OTHER PUBLICATIONS

Teel "Rotary Gear Pumps and Vacuum-On Switch" brochure, date unknown (1 page).
Owner's Guide, Hayward Pro-Series High-Rate Sand Filter (Oct. 2002) (4 pages).
Aqua Rite Electronic Chlorine Generator Manual, Goldline Controls, Inc. (2005) (20 pages).
Aqua Rite Electronic Chlorine Generator Manual, Goldline Controls, Inc., undated, known about at least as early as Mar. 15, 2012 (20 pages).
Aqua Logic Automation and Chlorination Installation Manual for Model AQL-P-4, Goldline Controls, Inc. (2004) (33 pages).
Aqua Logic Automation and Chlorination Operation Manual for Models AQL-PS-4, AQL-PS-8, AQL-PS-16, Goldline Controls, Inc. (2004) (40 pages).
Aqua Logic Automation and Chlorination Installation Manual for Models AQ-LOGIC-P-4, AQ-LOGIC-PS-4, Goldline Controls, Inc., known about at least as early as Mar. 15, 2012 (30 pages).
Office Action dated Nov. 28, 2022, issued in connection with U.S. Appl. No. 16/208,458 (17 pages).
Examiner's Answer to Appeal Brief, dated Apr. 4, 2023 in connection with U.S. Appl. No. 15/957,482 (9 pages).
EPO Summons to Attend Oral Proceedings, dated Mar. 24, 2023, in connection with European Patent Appln. No. 17742102.1 (8 pages).
Canadian Office Action dated Mar. 7, 2023, issued in connection with Canadian Patent Appln. No. 3,012,183 (4 pages).
Decision on Appeal dated May 31, 2023, issued in connection with U.S. Appl. No. 15/413,199.

* cited by examiner 6204h 6204i 6204j 6204k 6204l

| Energy Savings/month | Energy Savings/year | Rebates | Comments | Timing |
|---|---|---|---|---|
| | | | | Now |
| $80 | $960 | | | |
| $80 | $960 | | | |
| | | | | Next |
| | | | Additional energy savings possible dependent on user prefered pump speed. | |
| | | | If additional spa performance is desired, for additional $150, upgrade to TriStar VS 950. | |
| | | | Water fall pump. | |
| | | | Water fall pump. Additional energy savings possible dependent on user prefered pump seed. | |
| | | | If increased waterfall performance in desired, for additional $150, upgrade to triStar VS 950 | |
| $4 | $52 | | Savings ~$52/yr | |
| $80.00 | $960.00 | $0.00 | | |

| Profile | Information | |
|---|---|---|
| Owner Name | | |
| Street Address | | |
| email | | |
| Zip Code | | |
| Total Gallons | | gals. |
| Mos. Operating | | mos. |
| Pool only | | Y/N |
| Pool/Spa | | Y/N |
| Pool Control | | |
| Biggest cust. pains: | | |

6208a 6204 6210a

| Pumps | Existing | Qty | Replacement Model | $ (ea) | Est'd Labor [ea] | Consumer Benefits |
|---|---|---|---|---|---|---|
| Circ.Pump #1 | 2hp WisperFlo #1 | | TriStar | | | |
| Upgrade 1 | | 1 | TriStar VS 900 | $1,208 | $96 | • Variable speed - significant reduction in energy consumption at low speeds; increased flow when required (cleaner, heater, spa jets)<br>• Exceptionally quiet compared to single speed pumps |
| Upgrade 2 | | | TriStar VS 950 | $1,458 | | If additional spa performance is desired Energy savings same. |
| Pump #2 Spa or water feature | 2hp WisperFlo #2(Spa Booster) | 1 | TriStar | | | |
| Upgrade 1 | | | TriStar VS 900 | $1,208 | $96 | • Variable speed allows for adjustment of flow through spa jets effecting jet strength<br>• Exceptionally quiet compared to single speed pumps |
| Upgrade 2 | | | TriStar VS 950 | $1,458 | | increased flow capability for spa jets |
| Spa or water feature pump 2 | 2hp WisperFlo #3 (waterfall) | 1 | TriStar | | | • Variable speed allows for adjustment of flow through water fall-effecting both look and sound of water feature<br>• Exceptionally quiet compared to single speed pumps |
| Upgrade 1 | | 1 | TriStar VS 900 | $1,208 | $96 | • Variable speed allows for adjustment of flow through water fall-effecting both look and sound of water feature<br>• Exceptionally quiet compared to single speed pumps |
| Upgrade 2 | | | TriStar VS 950 | $1,458 | | |
| Cleaner Booster | Polaris Booster | 1 | Expert Booster | $366 | $96 | • Industries highest energy efficiency<br>• TEFC motor extends pump life |
| Total | | | | $2,416.40 | $192.00 | |

6208b 6208c

| Lights | | Heat | Cleaners | Controls | Chemical Automation |
|---|---|---|---|---|---|

| Energy Savings/month | Energy Savings/year | Rebates | Comments | Timing |
|---|---|---|---|---|
| | | | | |
| $80 | $960 | | | Now |
| $80 | $960 | | | |
| | | | | |
| | | | Additional energy savings possible dependent on user prefered pump speed. | |
| | | | If additional spa performance is desired, for additional $150, upgrade to TriStar VS 950. | |
| | | | Water fall pump. | Next |
| | | | Water fall pump. Additional energy savings possible dependent on user prefered pump seed. | |
| | | | If increased waterfall performance in desired, for additional $150, upgrade to triStar VS 950 | |
| $4 | $52 | | Savings ~$52/yr | |
| $80.00 | $960.00 | $0.00 | | |

Profile — Information

| Profile | Information | |
|---|---|---|
| Owner Name | | |
| Street Address | | |
| email | | |
| Zip Code | | |
| Total Gallons | | |
| Mos. Operating | | gals. |
| Pool only | | mos. |
| Pool/Spa | | Y/N |
| Pool Control | | Y/N |
| Biggest cust. pains: | | |

6212a 6212b 6212c 6212d

| | | Existing | Qty | Replacement Model | Replacement P/N | VPL (ea) | Est'd Labor [ea] | VPL (ext'd) | Est'd Labor (ext'd) |
|---|---|---|---|---|---|---|---|---|---|
| Filter | Filter | 520DE | 1 | ProGrid | DE4820 | | | | |
| | | | 1 | HEB Valve | SP0425 | | | | |
| | Upgrade 1 | | | | DE6020 | | | | |
| | Upgrade 2 | | | | DE7220 | | | | |
| Pumps | Circ.Pump #1 | 2hp WisperFlo #1 | | | | | | | |
| | Upgrade 1 | | 1 | TriStar VS 900 | SP32900VSP | $725 | $96 | $725 | $96 |
| | Upgrade 2 | | | TriStar VS 950 | | $875 | | | |
| | Pump #2 Spa or water feature | 2hp WisperFlo #2(Spa Booster) | 1 | TriStar VS 900 | | | | | |
| | Upgrade 1 | | | TriStar VS 901 | SP32900VSP | $725 | $96 | $0 | $0 |
| | Upgrade 2 | | | TriStar VS 950 | | $875 | | | |
| | Spa or water feature pump 2 | 2hp WisperFlo #3 (waterfall) | 1 | TriStar VS 900 | | | | $0 | $0 |
| | Upgrade 1 | | 1 | TriStar VS 900 | SP32900VSP | $725 | $96 | $725 | $96 |
| | Upgrade 2 | | | TriStar VS 950 | | $875 | | | |
| | Cleaner Booster | Booster | 1 | Expert Booster | HSP30060 | $220 | $96 | $220 | $96 |
| Automatic Cleaner | Automatic Pool Cleaner | | | | | | | | |
| | Upgrade 1 | | | | | | | | |
| | Upgrade 2 | | | | | | | | |

| Consumer Benefits | Energy Savings/month | Energy Savings/year | Utility Rebate | Comments/ Questions | Timing |
|---|---|---|---|---|---|
| | | | | | |
| | | | | | |
| | | | | | |
| | | | | | |
| | | | | | |
| • Variable speed - significant reduction in energy consumption at low speeds, increased flow when required (cleaner, heater, spa jets)<br>• Exceptionally quiet compared to single speed pumps | $80 | $960 | | | |
| | | | | | |
| | | | | | |
| • Variable speed allows for adjustment of flow through spa jets effecting jet strength<br>• Exceptionally quiet compared to single speed pumps | $80 | $960 | | | |
| | | | | | |
| • Variable speed allows for adjustment of flow through water fall-effecting both look and sound of water feature<br>• Exceptionally quiet compared to single speed pumps | | | | | |
| • Variable speed allows for adjustment of flow through water fall-effecting both look and sound of water feature<br>• Exceptionally quiet compared to single speed pumps | | | | | |
| | | | | | |
| •Industries highest energy efficiency<br>•TEFC motor extends pump life | | | | | |
| | | | | | |
| | $10 | $120 | | | |
| | $20 | $240 | | | |

| DETERMINED INFORMATION | | | | | |
|---|---|---|---|---|---|
| PUMP<br>-Shaft Seals<br>-Drive Failure<br>-Communication Failure<br>-Seal Failure<br>-Motor Failure<br>-Bearing Failure/Noise<br>-Basket (low med high)<br>-Skimmer (low med high)<br>-Filter (Pressure increasing, time to backwash)<br>-Blocked Air inlet<br>-Fan Blade Broken<br>-Impeller Broken or Damaged<br>-Pump Running Dry<br>-Pool Turnover<br>-Pump Run Time and Energy Calculation<br>-Pump Run Time and Turnover Calculation and Energy Suggestions<br>-Inefficiencies in energy usage because of a problem | HEATER<br>-Board failure<br>-Communication Failure<br>-Ignition Failure<br>-Igniter Cycling<br>-Heater Power Loss<br>-Calling for heat, but not heating<br>-Blower Fan Failed<br>-Gas Leak<br>-Kinked Line<br>-Combustion Failure<br>-Flood sensor (to identify heat exchanger leaking)<br>-Outlet Temp Sensor (insulated wrap on)<br>-Low Gas Pressure<br>-No Gas Available<br>-Water Leak<br>-Heat Run Time and Energy Calculation<br>-Heating expense away from the customers heating norms | LIGHTS<br>-Bulb is about to burn out<br>-Bulb is burnt out<br>-LEDs have failed<br>-LED lights are leaking<br>-Low Voltage (voltage drop)<br>-LEDs are dimming from hours of operation<br>-Lights have been on too long | FILTER<br>-Time to backwash or clean elements<br>-DE or Sand is low<br>-Leak in filter<br>-Plug is not plugged in<br>-Gasket seal is not correct<br>-Belly band not tight enough<br>-Leak in air valve<br>-Crack in shell | CHEMICAL AUTOMATION<br>-Salt Level (needs salt or too much)<br>-Board Damage<br>-Cell is dirty<br>-Cell has calcification<br>-Probe is dirty, broken<br>-Probe is out of calibration<br>-Time to Replace Cell<br>-Time to Replace Flow Switch<br>-Pool Needs Chlorine<br>-Pool Needs Acid<br>-UV Lamp Brightness Decreased<br>-UV Lamp is damaged<br>-UV Lamp needs to be replaced<br>-Feed tank levels for Acid or Liquid Chlorine<br>-Using too much Acid or Chlorine based on norm<br>-Identification of Phosphates<br>-Pool water is out of chemical balance-what is needed and how much | CLEANER<br>-Time to empty debris<br>-Identify debris in Pool<br>-In or Out of pool<br>-Drive is failing<br>-Bearings need to be repaired |

PRODUCT PAGE

7160

7160

SYSTEMS AND METHODS FOR PROVIDING NETWORK CONNECTIVITY AND REMOTE MONITORING, OPTIMIZATION, AND CONTROL OF POOL/SPA EQUIPMENT

RELATED APPLICATIONS

This application claims the benefit of U.S. Provisional Application Ser. No. 62/862,982 filed on Jun. 18, 2019 and is a continuation-in-part of U.S. patent application Ser. No. 15/957,482 filed on Apr. 19, 2018, which is a continuation-in-part of U.S. patent application Ser. No. 15/886,576 filed on Feb. 1, 2018, which is a continuation-in-part of U.S. patent application Ser. No. 15/886,171 filed on Feb. 1, 2018, which is a continuation-in-part of U.S. Non-Provisional application Ser. No. 15/413,199 filed on Jan. 23, 2017, which claims priority to U.S. Provisional Patent Application No. 62/286,272 filed on Jan. 22, 2016, U.S. Provisional Patent Application No. 62/310,510 filed on Mar. 18, 2016, U.S. Provisional Patent Application No. 62/381,903 filed on Aug. 31, 2016, United States Provisional Patent Application No. 62/412,504 filed on Oct. 25, 2016, and U.S. Provisional Patent Application No. 62/414,545 filed on Oct. 28, 2016, the entire disclosures of which applications are all hereby expressly incorporated by reference.

BACKGROUND OF THE INVENTION

Field of the Invention

The present disclosure relates to systems and methods for providing network connectivity and remote monitoring, optimization and control of pool/spa equipment.

Related Art

Swimming pool equipment is conventionally controlled by an electronic pool controller at an equipment pad. Power is supplied from the controller and electrical subpanel to the pool equipment through an electrical conduit (e.g., hard-wire). Alternatively, swimming pool equipment can be controlled by electrical circuit breakers in a subpanel at an equipment pad. Power is supplied from the subpanel to the pool equipment through an electrical conduit (e.g., hard-wire). Without an electronic pool controller, any time-based control is typically an electro-mechanical clock wired in series between the subpanel and the pool equipment, thereby breaking one or both legs of the power supply to the pool equipment. To monitor or maintain conditions of pool equipment, the pool, pool water, or the pool environment, sensors or other data collection means typically reside at the equipment pad or the pool.

Remote control of the pool and related equipment typically requires hard-wired communication between the pool controller (at the pad) and pool equipment, as well as wired or wireless communication between the pool controller and user interface. More recent remote control systems feature communication between the controller at the pad and a cloud server (e.g., via a home router), as well as communication between the user interface and the cloud server by cell or WiFi router.

Adding control features to an existing pool and equipment pad is typically costly because of the required electrical competence necessary to install new conduits to provide power from the subpanel to the controller, and from the controller to the pool equipment. Further, pool monitoring and maintenance can be confusing and time consuming for pool owners, which often leads to the employment of pool servicers. The lack of connectivity and subsequent lack of understanding of the status and condition of the pool and pool equipment requires costly and sometimes unnecessary visits by pool professionals.

In the pool and spa field, heating systems are commonly used to control water temperature. Such systems generally have one or more inlet pipes for receiving water to be heated, and one or more outlet pipes for delivering heated water from the heating system back to the pool/spa. While heating systems are commonly installed and used in pool and spa environments, there are a variety of problems that can arise in connection with the installation and operation of such devices.

For example, in some instances, the piping to and from the heating system can be incorrectly installed (e.g., in a reverse fashion). This causes the water flowing from the pump to incorrectly enter the heating system's "outlet." As a result, a variety of problems can occur, such as the inlet water temperature sensor reading the temperature of the water after being heated, and incorrectly concluding that the water has reached the desired temperature. This leads to the heating system repeatedly experiencing a short cycle. Backward water flow also renders other safety sensors and pressure-activated bypass loops ineffective. Further, such an improper installation scenario can be difficult to diagnose in the field.

It is also important to ensure that proper flow rates are maintained by pool and spa heating systems during operation. Heating systems commonly use pressure switches to measure water pressure and detect if the filter pump is running. This is a way of protecting the heating system from damage due to heating when the water flow is too low. However, pressure switches do not measure water flow rate directly, and can incorrectly indicate water flow. This can lead to damaged or destroyed heating systems.

Still further, pool and spa heating systems that utilize heat pumps can also be susceptible to a variety of malfunctions. As the outdoor air flows across the heat exchanger, heat is transferred from the air into the refrigerant flowing inside the heat exchanger. This results in the air being cooled as it passes through the heat exchanger. As the air is cooled below its dew point, water separates from the air, and moisture accumulates on the heat exchanger. This water typically drains off of the heat exchanger without harm to the heat exchanger. However, if the heat exchanger surface temperature is below the freezing point of water, the moisture can freeze. This is a common issue with heat pumps of all types, not just pool heating systems.

Another potential malfunction of heat exchangers relates to frost conditions. Typically, heat pumps are equipped with a control system that detects the frosting conditions in the heat exchanger and automatically executes a defrost cycle. Defrost cycles typically involve either deactivating the heat pump and allowing the heat exchanger to thaw out due to ambient air temperatures, or engaging a refrigerant reversing valve to heat the heat exchanger surface to thaw out the heat exchanger. A temperature sensor is usually attached to a refrigerant tube near the heat exchanger. The temperature sensor is used to measure the refrigerant temperature and identify if a defrost cycle is necessary. The duration of the defrost cycle might be a fixed time period, can continue until the measured refrigerant temperature is above a preset threshold, or a combination of both.

The aforementioned approach presents a problem because refrigerant temperatures can drop and cause frosting due to malfunctions of the pool heater. Some of these malfunctions include a low refrigerant pressure, a low air flow across the heat exchanger, and a reduced heat transfer caused by buildup of dirt or other debris on the heat exchanger. These malfunctions can cause the low temperature condition, and be incorrectly treated as a "normal" amount of frost that can be remedied by executing a defrost cycle. In addition, refrigerant reversing valves in pool heating systems can be used to allow the user to either heat or cool the swimming pool, and they can be actuated in response to an automatically-executed defrosting routine. These reversing valves are actuated by a solenoid, and can sometimes be stuck in one position or the other.

Accordingly, what is needed is a system and method to provide pool owners and pool servicers with enhanced control of, and connectivity between, pool equipment devices, which detects and diagnoses improper installation and malfunction conditions in the equipment devices, and which reduces hardware and/or installation costs.

SUMMARY OF THE INVENTION

The present disclosure relates to systems and methods for providing network connectivity and remote monitoring, optimization, and control of pool/spa equipment. "Internet-of-Things" functionality is provided for pool and spa equipment in a flexible and cost-effective manner, in various embodiments. For example, in one embodiment, network connectivity and remote monitoring/control of pool and spa equipment is provided by a network communication and local control subsystem installed in pool/spa equipment. In another embodiment, network connectivity and remote monitoring/control of pool and spa equipment is provided by a pool/spa system controller interconnected with pool/spa equipment operating in conjunction with local and/or remote pool/spa control logic. In another embodiment, network connectivity and remote monitoring and control of pool and spa equipment is provided by way of a pool "hub" interconnected with pool/spa equipment operating in conjunction with remote pool/spa control logic. In yet another embodiment, network connectivity and remote monitoring and control of pool and spa equipment is provided by way of a pool "translator" interconnected with pool/spa equipment operating in conjunction with local and/or remote pool/spa control logic. In still another embodiment, network connectivity and remote monitoring and control of pool and spa equipment is provided by way of a plurality of pool connectivity modules that communicate with pool/spa equipment, operating in conjunction with remote pool/spa control logic. In a further embodiment, network connectivity and remote monitoring and control of pool and spa equipment is provided by way of wireless communications provided directly in the pool/spa equipment and operating in conjunction with remote pool/spa control logic. In yet another embodiment, network connectivity and remote monitoring and control of pool and spa equipment is provided by way of a reduced-size "hub" interconnected with pool/spa equipment operating in conjunction with remote pool/spa control logic. In still another embodiment, network connectivity and remote monitoring and control of pool and spa equipment is provided by way of pool/spa chlorination system and controller that is interconnected with pool/spa equipment operating in conjunction with remote pool/spa control logic. Also disclosed are various control processes ("pool logic") which can be embodied as software code installed in any of the various embodiments of the present disclosure.

Communication between devices, the controller, the router, the cloud, and/or the user interfaces can use a number of technologies, where each technology could provide an advantage in cost or reliability for each communication segment. Data for managing the pool and pool equipment (e.g., relating to wind, time, temperature, humidity to manage heating, water features, skimmer operation, approaching storms, sunrise, sunset, etc.) could be gathered from the cloud, in addition to or instead of data gathered through sensors and datacom cables at the pool or pad. Sensors dedicated to specific pool equipment (e.g., pressure sensors, flow sensors or temp sensors in the heater used to manage pump speed, control valve positions, etc.) could share data with the controller to manage other pool equipment (e.g., to optimize performance), rather than requiring dedicated sensors for each device. Smart switches could be installed between an existing conduit and the subpanel or device by a user (e.g., pool owner or pool professional), because installation of a new hard conduit is unnecessary (reducing the need for an electrician), or smart switches could be integrated into pool or spa equipment. For example, a heater with an integrated smart switch could act as a hub for connectivity to the home router.

In still further embodiments, the system of the present disclosure provides a modular relay, a wiring hub, and/or a control module that can be conveniently installed near pool/spa equipment, and which provides Internet-enabled remote control and connectivity of pool/spa components without requiring installation of complete (e.g., pad-mounted) pool/spa system controller. Conveniently, the modular relay, wiring hub, and/or control module allow owners of existing pool/spa equipment who do not currently own a pool/spa control system to enjoy the benefits of such a control system without requiring the installation, equipment, and expense associated with conventional pool/spa control systems.

In still further embodiments, the system of the present disclosure provides advanced heating and cooling functionality and enhanced diagnostics for pool/spa equipment via a plurality of sensors that can be conveniently installed near or within pool/spa equipment, and which provides Internet-enabled remote control and connectivity of pool/spa components.

In other embodiments of the present disclosure, systems and methods are provided for detecting and diagnosing improper installation and malfunction conditions in pool and spa heating systems. In one embodiment, the system includes a first temperature sensor which measures a first temperature of water entering the heating system and a second temperature sensor which measures a second temperature of water exiting the heating system. The system further includes a control subsystem in communication with the first and second sensors, capable of determining whether the first temperature is greater than the second temperature. When the first temperature is greater than the second temperature, the control subsystem generates a diagnostic report that indicates that the heating system has been improperly installed.

In another embodiment, the systems and methods of the present disclosure detect low water flow rates through a heating system based on measurements of inlet and outlet water temperatures. The system includes a first temperature sensor which measures a first temperature of water entering the heating system and a second temperature sensor measuring a second temperature of water exiting the heating system. The system also includes a control subsystem in communication with the first and seconds temperature sensors, capable of determining a temperature rise by measuring a difference between the first temperature and the second temperature. The control subsystem further determines a maximum allowed temperature rise value for the heating system and whether the temperature rise is greater than the maximum allowed temperature rise. When the temperature rise is greater than the maximum allowed temperature rise, the system generates a diagnostic report indicating that the heating system has a low water flow rate.

In still another embodiment, the systems and methods of the present disclosure can detect and diagnose a stuck reversing valve in a refrigeration system of pool and spa heating systems. The system includes a first temperature sensor measuring an ambient air temperature and a second temperature sensor measuring a refrigerant temperature. The system further includes a control subsystem in communication with the heating system. The control subsystem is capable of determining when the refrigerant temperature is less than a refrigerant threshold and whether the ambient temperature is less than or greater than an ambient threshold. When the ambient temperature is greater than the ambient threshold, the control subsystem transmits a diagnostic report and deactivates the heating system. When the ambient temperature is less than the ambient threshold, the control subsystem executes a defrost cycle.

In yet another embodiment, the systems and methods of the present disclosure can detect and correct a stuck reversing valve in a refrigeration system of a heating system. The system includes a first temperature sensor measuring a first temperature of water entering a heater and a second temperature sensor measuring a second temperature of water exiting the heater. The system further includes a control subsystem in communication with the heating system. The control subsystem is capable of determining whether the heating system is in a heating mode or a cooling mode and determining when a reversing value is stuck. The reversing valve is stuck in the heating mode when the second water temperature is lower than the first water temperature and the reversing valve is stuck in the cooling mode when the second water temperature is greater than the first water temperature. The control subsystem is further capable of cycling the reversing valve to unstick and enable the reversing valve to function properly.

BRIEF DESCRIPTION OF THE DRAWINGS

The foregoing features of the disclosure will be apparent from the following Detailed Description of the Invention, taken in connection with the accompanying drawings, in which:

FIGS. 45-48 are user interface screens for generated by the recommendation system of FIG. 43.

DETAILED DESCRIPTION OF THE INVENTION

The present disclosure relates to systems and methods for providing network connectivity and remote monitoring, optimization and control of pool/spa equipment, as discussed in detail below in connection with FIGS. 1-91.

Figure 1:
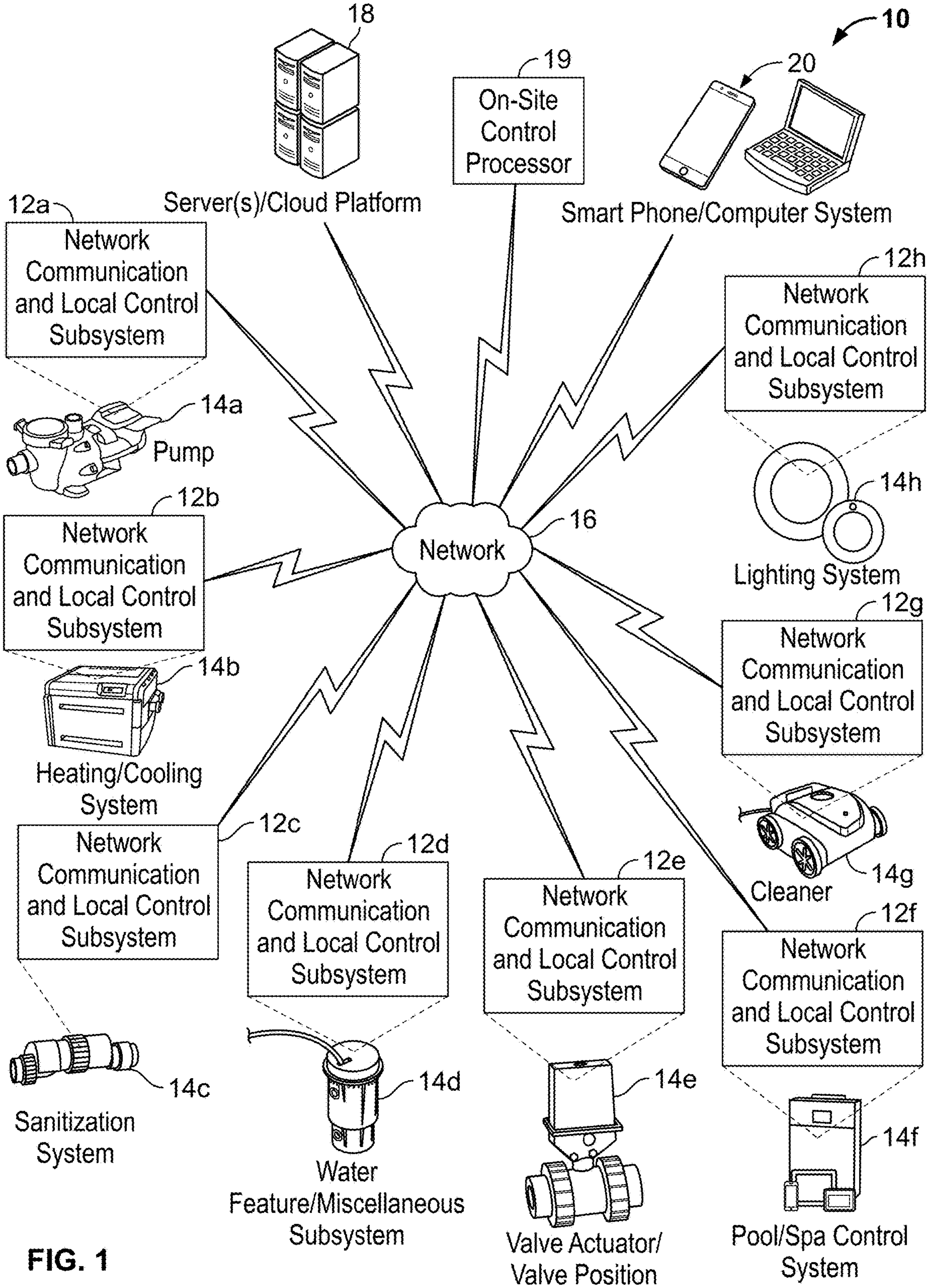
FIG. 1 is a diagram illustrating the system of the present disclosure.

FIG. 1 is a diagram illustrating the system 10 of the present disclosure. The system 10 includes, but is not limited to, a plurality of network communication and local control subsystems 12$a$-12$h$ which could be installed in or connected to a plurality of pool and spa equipment 14$a$-14$h$, so as to provide network connectivity and remote monitoring and control of the pool and spa equipment 14$a$-14$h$. The subsystems 12$a$-12$h$ could communicate with each other over a network 16, which could include, but is not limited to, the Internet. Importantly, the subsystems 12$a$-12$h$ provide "Internet-of-Things" functionality for the plurality of pool and spa equipment 14$a$-14$h$. It is noted that subsystems 12$a$-12$h$ could further include a "big data" subsystem, subsystems for receiving input from manufacturers/factories, subsystems for receiving external data/input (e.g., data from the Internet), and subsystems for receiving input from customers. As will be discussed in greater detail below, the subsystems 12$a$-12$h$ could include control logic for allowing each of the devices 14$a$-14$h$ to interact with each other (e.g., to exchange data and commands for controlling each other), as well as to be remotely controlled by another system such as a remote server, a "cloud" based control system, a remote computer system, a smart device (e.g., smart phone, smart speaker, smart chip embedded in the body), etc., and combinations thereof as will be discussed in greater detail below.

As can be seen, the pool and spa equipment 14$a$-14$h$ could include various types of pool and spa equipment, such as a pump 14$a$, a heating/cooling system 14$b$, a sanitization system 14$c$, a water feature or miscellaneous subsystem 14$d$, a valve actuator 14$e$, a pool/spa control system 14$f$, a pool cleaner 14$g$, and/or a lighting system 14$h$. It is noted that, as described herein, the heating/cooling system 14$b$ may also describe, or be described as, a heating system, heater, cooling system, cooler, or any combination thereof. Additionally, as can be seen in FIG. 1, the subsystems 12$a$-12$h$ could also communicate with one or more servers 18, and/or with one or more smart devices 20 (e.g., phone, tablet, computer systems, etc.), via the network 16. Still further, an on-site control processor 19 could be in communication with the various systems shown in FIG. 1. The on-site control processor 19 could be a pool/spa control system installed at the location of a pool or spa, a reduced-functionality pool/spa control system, or another type of control system. Examples of such systems will be described in detail below.

Figure 2:
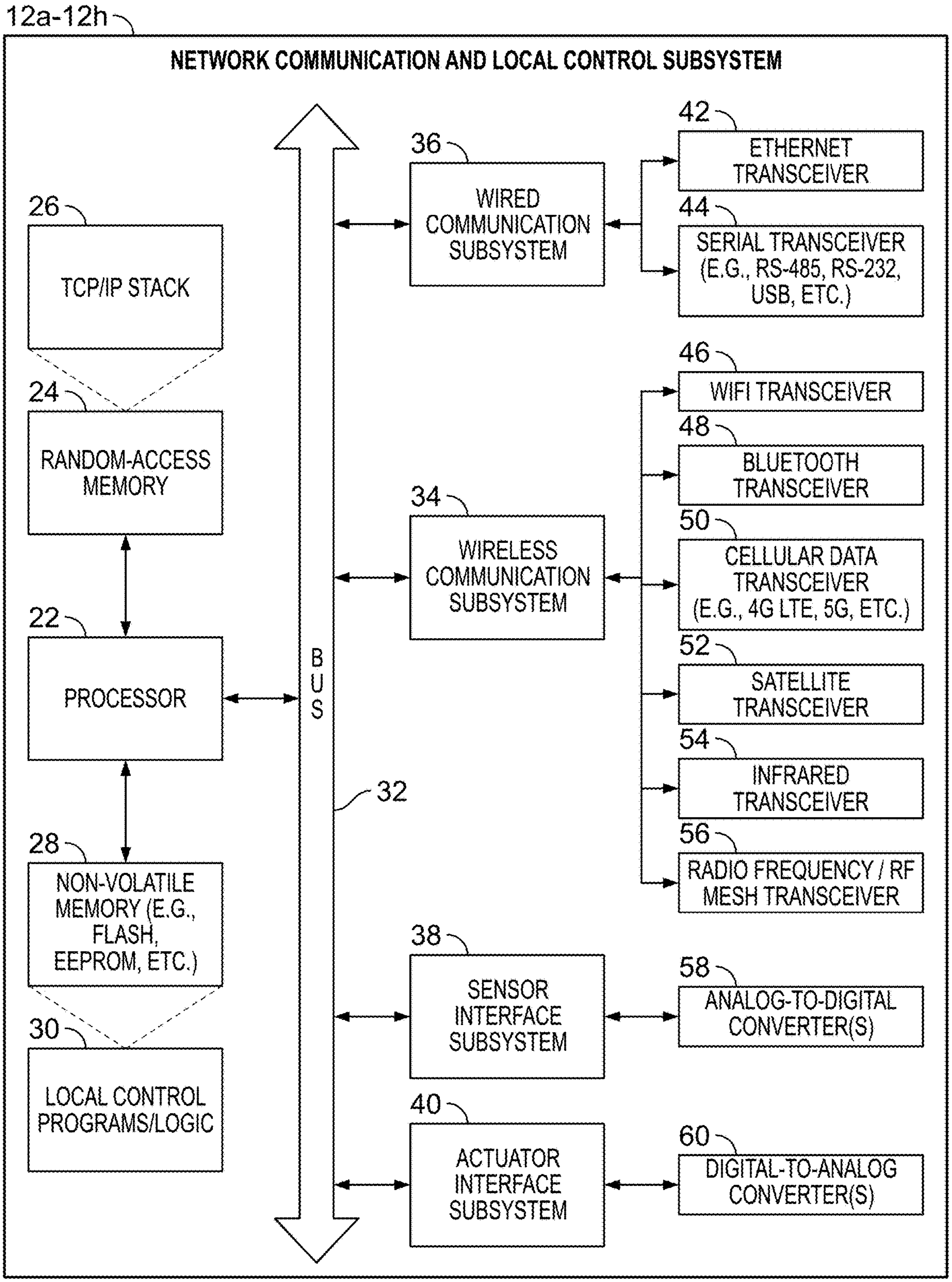
FIG. 2 is a block diagram illustrating components of the subsystems of FIG. 1.

FIG. 2 is a block diagram illustrating components of the subsystems 12$a$-12$h$ in greater detail. As can be seen, a variety of subsystem components could be provided for providing network connectivity for pool and spa equipment via a multitude of wired and wireless means. As noted above, the subsystems 12$a$-12$h$ could be installed in pool/spa equipment (e.g., within the physical housings of the equipment 14$a$-14$h$), or connected thereto, to provide network connectivity to each device. Advantageously, the subsystems 12$a$-12$h$ can be provided as "after-market" components that provide network connectivity and remote monitoring and control for pool/spa equipment that does not ordinarily include such connectivity. Importantly, the subsystems 12$a$-12$h$ allow for a wide variety of wired and wireless connections to the pool/spa equipment. For example, a smart telephone could directly connect with pool or spa equipment via a Bluetooth, WiFi, RF mesh (e.g., ZWave, Zigbee, Thread, Weave, etc.), or satellite connection, via the subsystems 12a-12h. Moreover, a home computer could connect to pool/spa equipment using a home WiFi network, via the subsystems 12a-12h or by way of a wired Ethernet connection to the pool/spa equipment. Still further, a remote server or "cloud" platform could connect to the pool/spa equipment via the subsystems 12a-12h, to allow for remote and/or web-based control.

A processor 22 provides local processing capability for each of the subsystems 12a-12h. The processor 22 is in communication with a random access memory 24, and one or more non-volatile memories 28. The non-volatile memory 28 could store one or more local control programs 30 for providing local control of the pool or spa equipment in which the subsystem is installed. A TCP/IP stack 26 is provided for allowing each of the subsystems to obtain an Internet protocol address, and to provide Internet connectivity for each of the subsystems. The processor 22 could communicate with a wired communication subsystem 36, a wireless communication subsystem 34, a sensor interface subsystem 38, and an actuator interface subsystem 40 via a bus 32. The wired communication subsystem 36 could include an Ethernet transceiver 42, and a serial transceiver 44. The serial transceiver could support one or more suitable serial communication protocols, such as RS-485, RS-232, USB, etc. The wireless communication subsystem 34 could include a WiFi transceiver 46, a Bluetooth (or Bluetooth LE) transceiver 48, a cellular data transceiver 50, a satellite transceiver 52, and infrared transceiver 54, and a radiofrequency/RF mesh transceiver 56. The cellular data transceiver 50 could support one or more cellular data communications protocols, such as 4G, LTE, 5G, etc. The radiofrequency/RF mesh transceiver 56 could support one or more RF mesh network protocols, such as ZWave, Zigbee, Thread, Weave, etc. The sensor interface subsystem 38 could include analog connection interfaces, digital connection interfaces, and one or more analog-to-digital converters 58. The actuator interface subsystem 40 could include analog connection interfaces, digital connection interfaces, and one or more digital-to-analog converters 60. The sensor interface subsystem allows the network communication and local control subsystem to obtain information from a wide variety of sensors associated with pool/spa equipment, as well as other types of sensors. The actuator interface subsystem 40 allows the network communication and local control subsystem to control one or more pieces of pool/spa equipment connected to the subsystem. The wired and wireless communication subsystems 34, 36 allow the network communication and local control subsystem to connect via various wired and wireless communication means to the Internet. This allows a piece of pool or spa equipment to transmit operational and status information to one or more remote devices, as well as to be remotely controlled by such devices.

Figure 3:
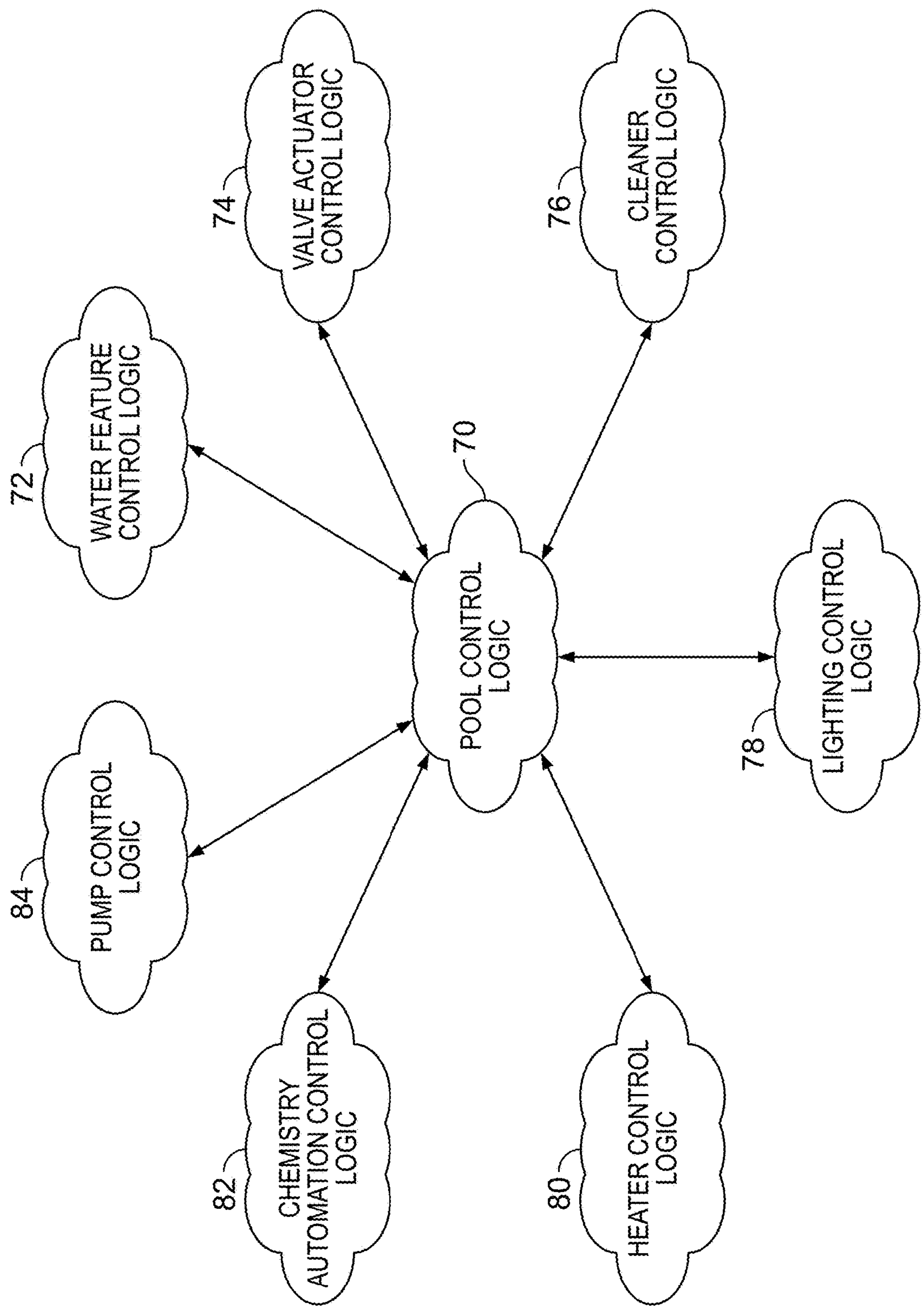
FIG. 3 is a diagram illustrating various types of control logic in accordance with the present disclosure.

FIG. 3 is a diagram illustrating various types of control logic in accordance with the present disclosure, for controlling various types of pool and spa equipment. The control logic, indicated generally as pool control logic 70, could be embodied as programmed instructions (software code) stored on a non-transitory computer-readable medium, and could include water feature control logic 72, valve actuator control logic 74, cleaner control logic 76, lighting control logic 78, heater control logic 80, chemistry automation control logic 82, and pump control logic 84. Such logic could be installed locally (e.g., in one or more of the subsystems 12a-12h), on a remote server or computer system (e.g., in the server 18 or the smart phone/computer system 20), in the "cloud," or in any combination of such systems. The functions provided by the logic 70-84 is described in greater detail below. As will be discussed in greater detail below the various logic operations disclosed herein (including the operational instruction disclosed herein) could be trigged by (e.g., receive and a signal from) various sensors and/or inputs to the system, as needed. Such inputs could be periodically monitored by the pool control logic 70 of the system 10.

Figure 4:
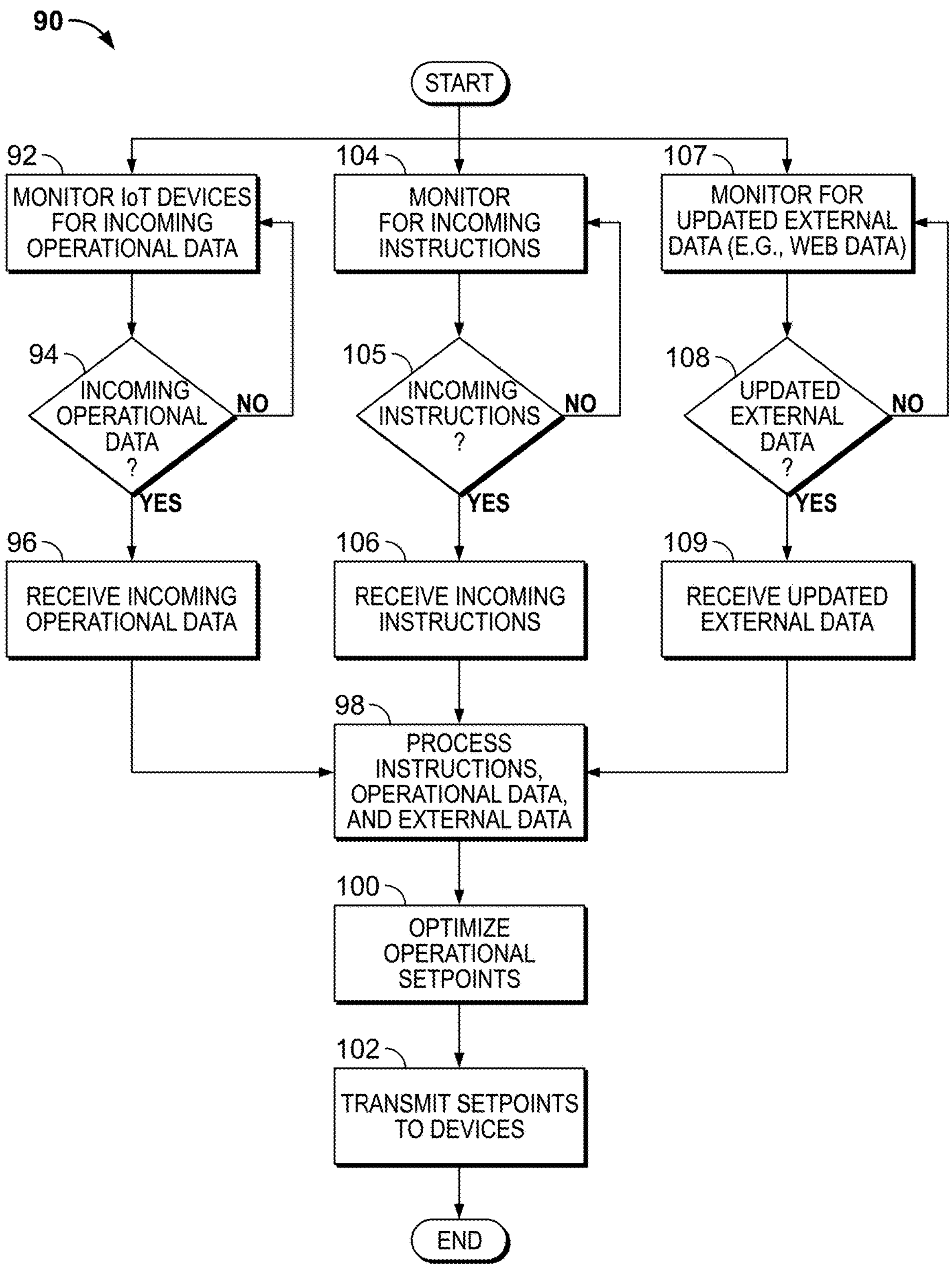
FIG. 4 is a diagram illustrating processing steps carried out by the system of FIGS. 1-2.

FIG. 4 is a diagram illustrating processing steps, indicated generally at 90, carried out by the system of FIGS. 1-2. It is noted that the term "IoT devices" (shown in the drawings) refers to pool/spa equipment having Internet-of-Things functionality provided in accordance with the present disclosure, such as the equipment 14a-14h of FIG. 1. Beginning in step 92, the system monitors IoT devices for incoming operational data. In step 94, a decision is made as to whether incoming operational data has been received. If a negative determination has been made, control returns to step 92. Otherwise, step 96 occurs, wherein the system receives incoming operational data. In step 98, the system processes instructions, operational data, and external data, discussed hereinbelow. Then, in step 100, the system optimizes operational set points. In step 102, the system transmits setpoints to one or more devices (one or more of the pool/spa equipment 14a-14h) for use thereby.

In step 104, the system also monitors for incoming instructions. A determination is made in step 105 as to whether an incoming instruction has been received. If a negative determination has been made, control returns to step 104. Otherwise, in step 106, the system receives one or more incoming instructions. Then, control proceeds to step 98, discussed above. Additionally, in step 107, the system also monitors for updated external data (e.g., web data). In step 108, a decision has been made as to whether updated external data is available. If a negative determination has been made, control returns to step 107. Otherwise, step 109 occurs, wherein the system receives the updated external data. Then, control proceeds to step 98, discussed above.

Figure 5:
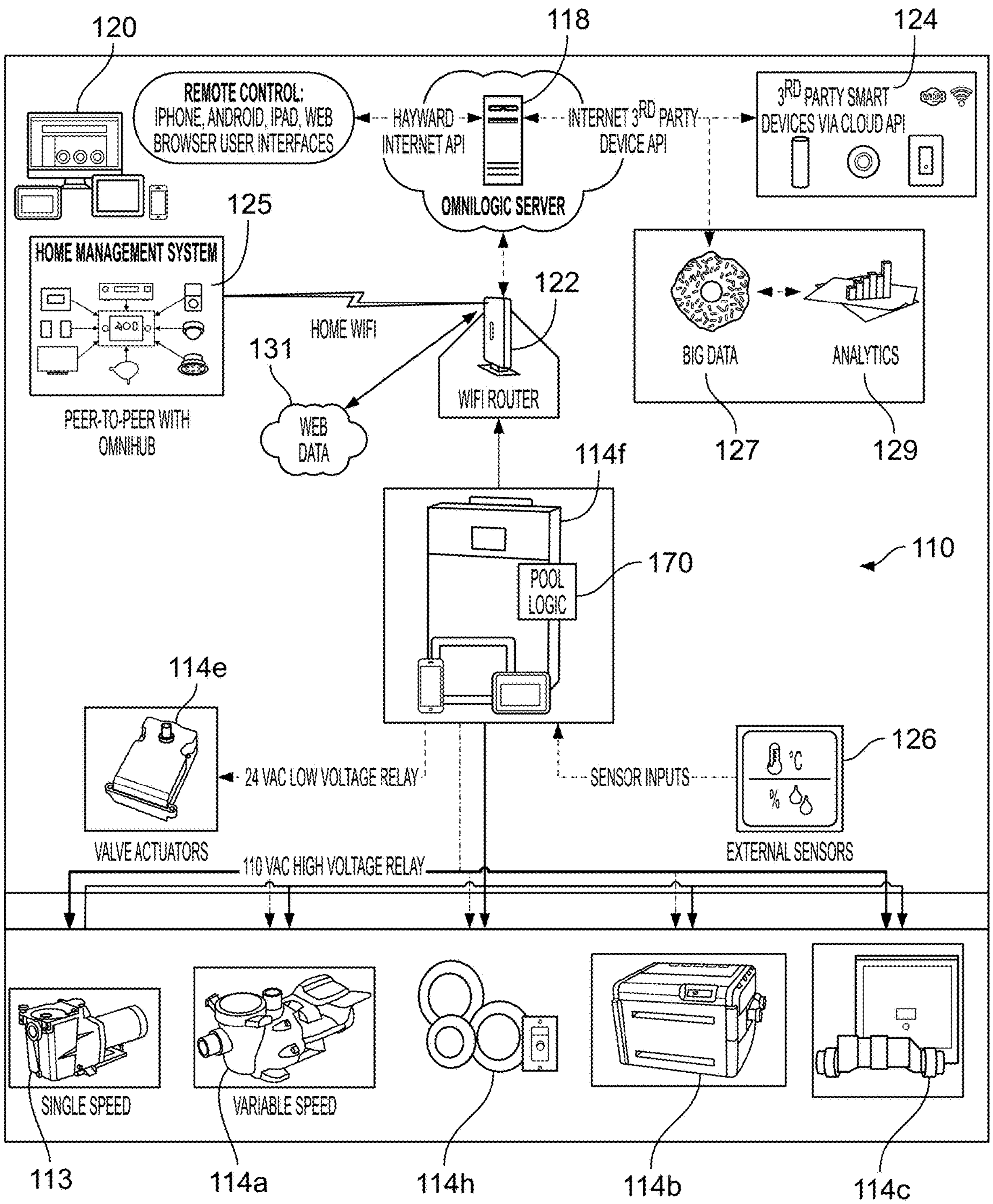
FIG. 5 is a diagram illustrating another embodiment of the present disclosure.

FIG. 5 is a diagram illustrating another embodiment of the present disclosure, indicated generally at 110. In this embodiment, network connectivity and remote monitoring/control of pool and spa components is provided by way of a central pool/spa system controller 114f. The pool/spa system controller 114f could be the OMNILOGIC pool/spa system controller manufactured and sold by Hayward Industries Inc. The pool/spa system controller 114f could communicate with one or more valve actuators 114e, a single speed pump 113, a variable speed pump 114a, pool/spa lighting systems 114h, a pool/spa heating or cooling system 114b, and/or a pool/spa chlorination system 114c, such as a salt chlorinator. Additionally, the pool/spa control system 114f could receive input from one or more external sensors 126 and could provide "personality" by way of remotely provisioned logic for the devices. The pool/spa control system 114f communicates with a remote server, such as the server 118, via a WiFi router 122 and the Internet. The server 118 could communicate with one or more remote control systems 120, such as a smart device (e.g., smart phone, smart speaker, smart TV, embedded device), a computer system, a tablet computer, etc. The control system 114f could also receive external web data 131 via the Internet and WiFi router 122 (e.g., time & date, sunrise/sunset data, regional and local weather forecasts, wind, UV, sunlight) for use by pool control logic 170, described hereinbelow. Additionally, the WiFi router 122 could communicate with a home management system 125 in a peer-to-peer arrangement, if desired. The server 118 could also access big data 127 and perform analytics 129 in connection with various types of information relating to the pool/spa equipment, usage thereof, and status information relating thereto. Further, the server 118 communicate with one or more third-party smart devices 124 via a suitable cloud application programming interface (API). The third-party smart devices 124 could also remotely communicate with and control the pool/spa equipment shown in FIG. 5. Additionally, the pool/spa control system 114*f* could include pool logic 170 stored therein for allowing central control and monitoring of pool/spa equipment at the pool/spa site. The pool logic 170 could include any of the various pool control logic described herein. Additionally, such logic 170 could also be stored in the server 118, or at another location.

Figure 6:
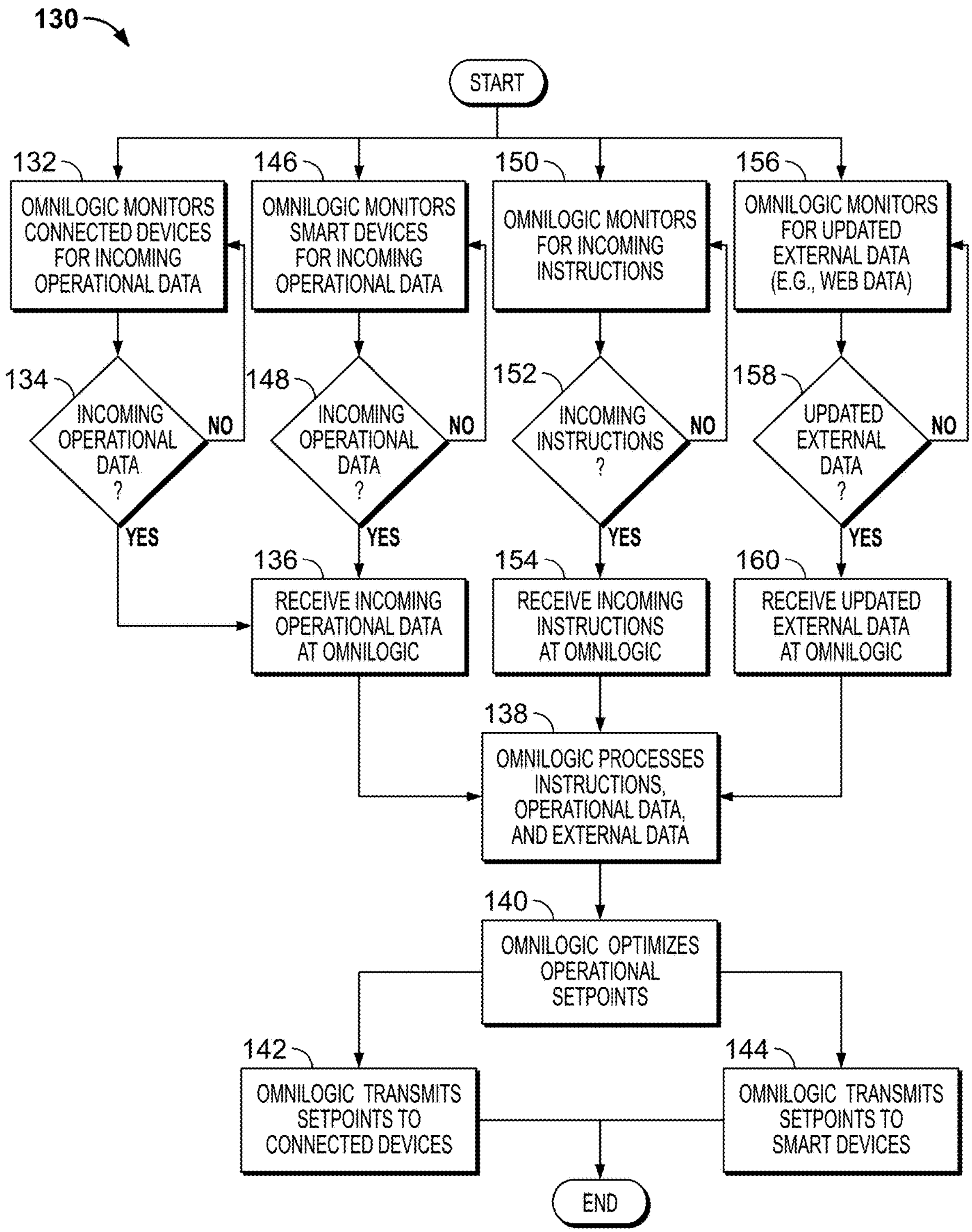
FIG. 6 is a flowchart illustrating processing steps carried out by the system of FIG. 5.

FIG. 6 is a flowchart, indicated generally at 130, illustrating processing steps carried out by the system of FIG. 5. In step 132, the pool/spa system controller 114*f* of FIG. 5 monitors connected devices for incoming operational data. Then, in step 134, a decision is made as to whether incoming operational data has been received. If not, control returns to step 132. Otherwise, step 136 occurs, wherein the pool/spa system controller receives incoming operational data. Then, in step 138, the pool/spa system controller 114*f* processes instructions, operational data, and external data, discussed hereinbelow. Then, in step 140, the pool/spa system controller 114*f* optimizes operational set points. In step 142, the pool/spa system controller transmits set points to the connected devices, such as the pool/spa equipment 113, 114*a*, 114*h*, 114*b*, and 114*c* shown in FIG. 5. In step 144, the pool/spa system controller 114*f* could also transmit such setpoint information to other devices, such as the smart devices 124 illustrated in FIG. 5.

In step 150, the pool/spa system controller monitors for incoming instructions. In step 152, a determination is made as to whether an incoming instruction has been received. If not, control returns to step 150. Otherwise, step 150 occurs, wherein the pool/spa system controller 114*f* receives incoming instructions. Then, processing proceeds to step 138, discussed above. In step 156, the pool/spa system controller 114*f* monitors for updated external data (e.g., web-supplied data, such as weather information and other information from remote data sources). In step 158, the system determines whether updated external data is available. If not, control returns to step 156. Otherwise step 160 occurs, wherein the pool/spa system controller receives the updated external data. Then, control proceeds to step 138, discussed above.

Figure 7:
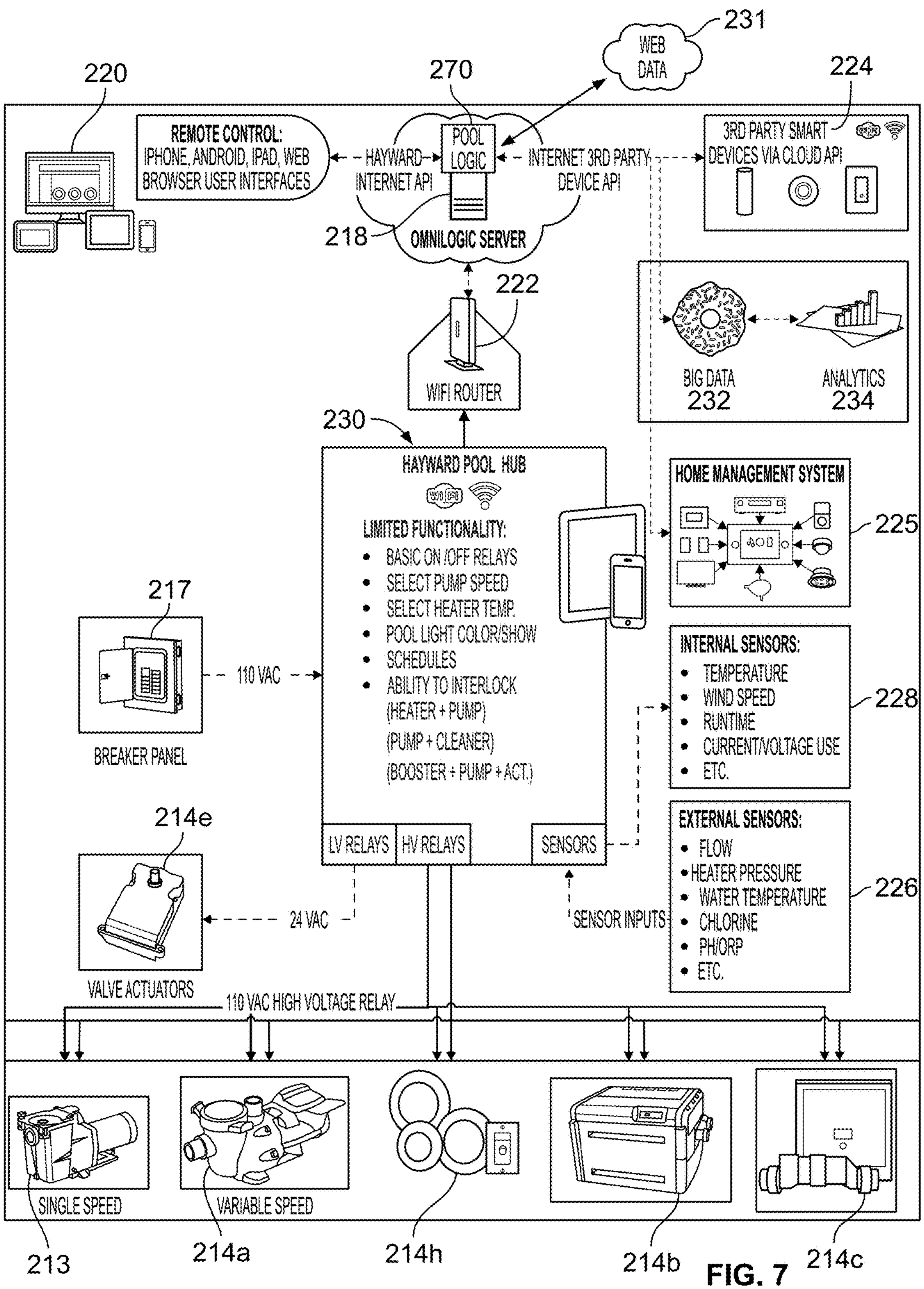
FIG. 7 is a diagram illustrating another embodiment of the system of the present disclosure.

FIG. 7 is a diagram illustrating another embodiment of the system of the present disclosure, wherein remote connectivity is provided by way of a pool "hub" component 230. The pool hub component 230 includes a subset of the functional features of the pool/spa system controller 114*f* of FIG. 5, such as basic on/off control relays, the ability to select a pump speed, the ability to select heater temperature, the ability to control pool light colors and shows, the ability to set equipment schedules, and the ability to interlock one pool/spa component with another pool/spa component. The pool hub communicates with and controls a number of pool/spa components, such as a single speed pump 213, a variable speed pump 214*a*, pool/spa lighting systems 214*h*, a pool/spa heating system 214*b*, and a pool/spa chlorination system 214*c*. Additionally, the pool hub 230 can control a valve actuator 214*e* and can receive various sensor inputs 226 and 228, such as temperature sensors, wind speed sensors, runtime sensors, current/voltage usage sensors, flow sensors, heater pressure sensors, water temperature sensors, chlorine sensors, pH/ORP sensors, etc. Such sensors could be positioned internally within the hub, external thereto, or a combination thereof. Additionally, the pool hub 230 could be powered by electrical current supplied by a breaker panel 217 or by photovoltaic (e.g., solar) cells and/or systems. Breaker panel 217 could also be a smart circuit breaker (e.g., a circuit breaker that can be controlled via wired or wireless communication) used to provide and/or to interrupt power to the devices disclosed herein. The pool hub 230 could communicate with a remote server 218 via a WiFi router 222 and a network connection such as the Internet. The server to 218 could include pool logic 270 which can be used to remotely monitor and control operation of the devices to 213, 214*a*, 214*h*, 214*b*, and 214*c*. The pool logic 270 could include any of the pool logic discussed herein. Additionally, the server 218 could communicate with one or more remote control devices 220, such as a smart cellular telephone, a remote computer, a tablet computer, etc. The server 218 could also receive external web data 231 via the Internet (e.g., time & date, sunrise/sunset data, regional and local weather forecasts, wind, UV, sunlight) for use by pool logic 270. Further, the server 218 could communicate with one or more third-party devices 224 via an appropriate cloud API. Further, the server 218 could process big data 232 and perform analytics 234 on various pool/spa data. Still further, the server 218 could communicate with a home management system 225, if desired.

Figure 8:
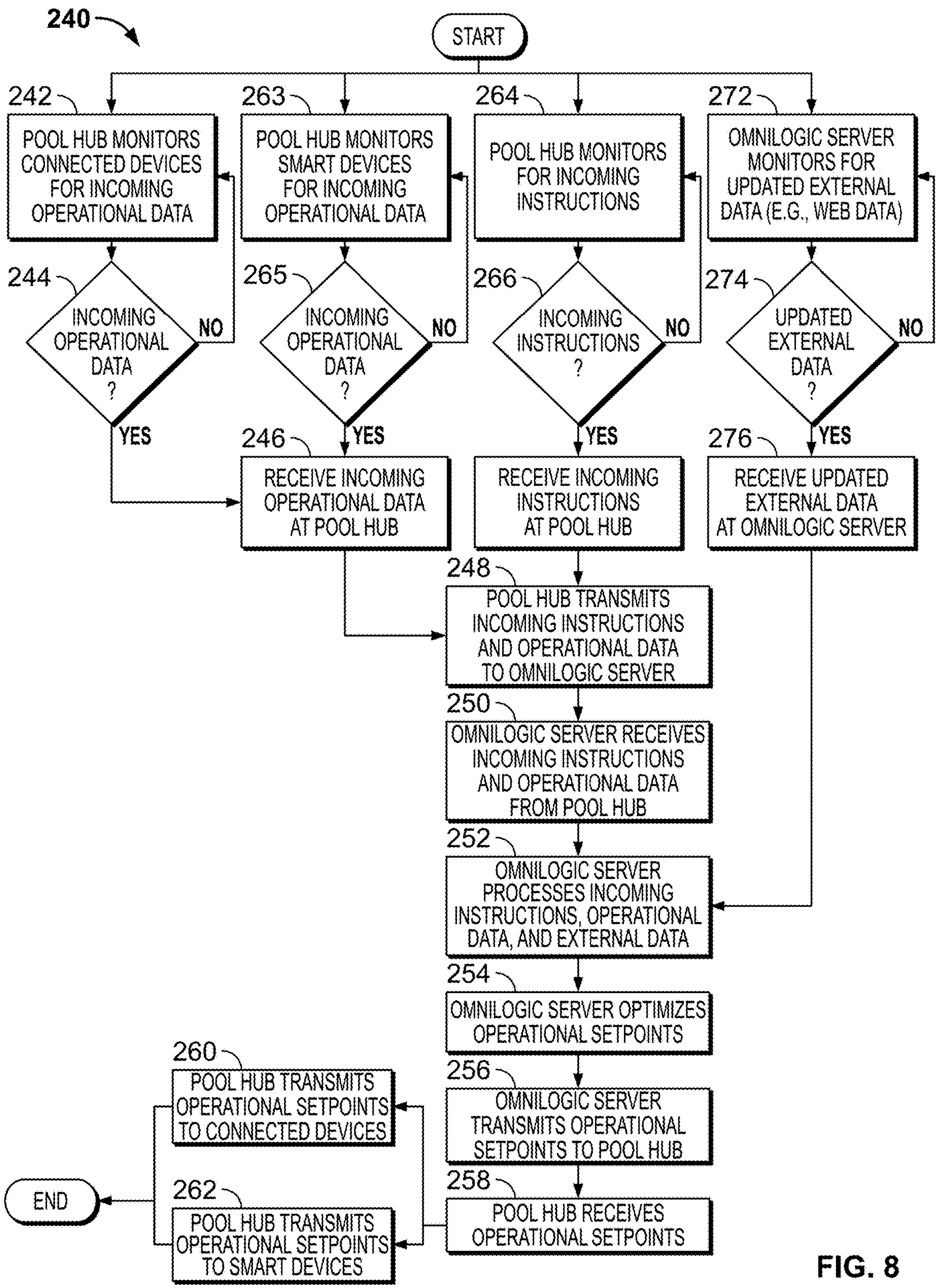
FIG. 8 is a flowchart illustrating processing steps carried out by the system of FIG. 7.

FIG. 8 is a flowchart illustrating processing steps, indicated generally at 240, carried out by the system of FIG. 7. In step 242, the pool hub 230 monitors connected devices for incoming operational data. In step 244, a determination is made as to whether an incoming operational data has been received. If not, control returns to step 242. Otherwise, step 246 occurs, wherein the pool hub 230 receives incoming operational data. Then, in step 248, the pool 230 transmits incoming instructions and operational data to the server 218. Then, in step 250, the server 218 receives the incoming instructions and operational data from the pool hub 230. In step 252, the server 218 processes the incoming instructions, operational data, and external data, discussed hereinbelow. In step 254, the server 218 optimizes operational set points. Then, in step 256, the server 218 transmits operational setpoints to the pool hub 230. In step 258, the pool hub 230 receives the operational set points. Then, in step 260, the pool hub 230 transmits the operational setpoints to the connected devices. In step 262, the pool hub 230 optionally transmits the operational setpoints to one or more smart devices, such as the third-party smart devices 224 of FIG. 7.

In step 263, the pool hub 230 monitors smart devices for incoming operational data. In step 265, a decision is made as to whether incoming operational data has been received. If not, control returns to step 263. Otherwise, step 246 occurs, where in the incoming operational data is received at the pool hub 230. Then, control passes to step 248, discussed above.

In step 264, the pool hub 230 monitors for incoming instructions. Then, in step 266, a determination is made as to whether an incoming instruction has been received. If a negative determination has been made, control returns to step 264. Otherwise, step 268 occurs, wherein the pool hub 230 receives the incoming instructions. Then, control passes to step 248, discussed above.

In step 272, the server 218 monitors for updated external data, such as web-supplied data including weather data and other data. In step 274, a determination is made as to whether updated external data is available. If not, control returns to step 272. Otherwise, step 276 occurs, wherein the updated external data is received at the server 218. Then, control passes to step 252, discussed above.

Figure 9:
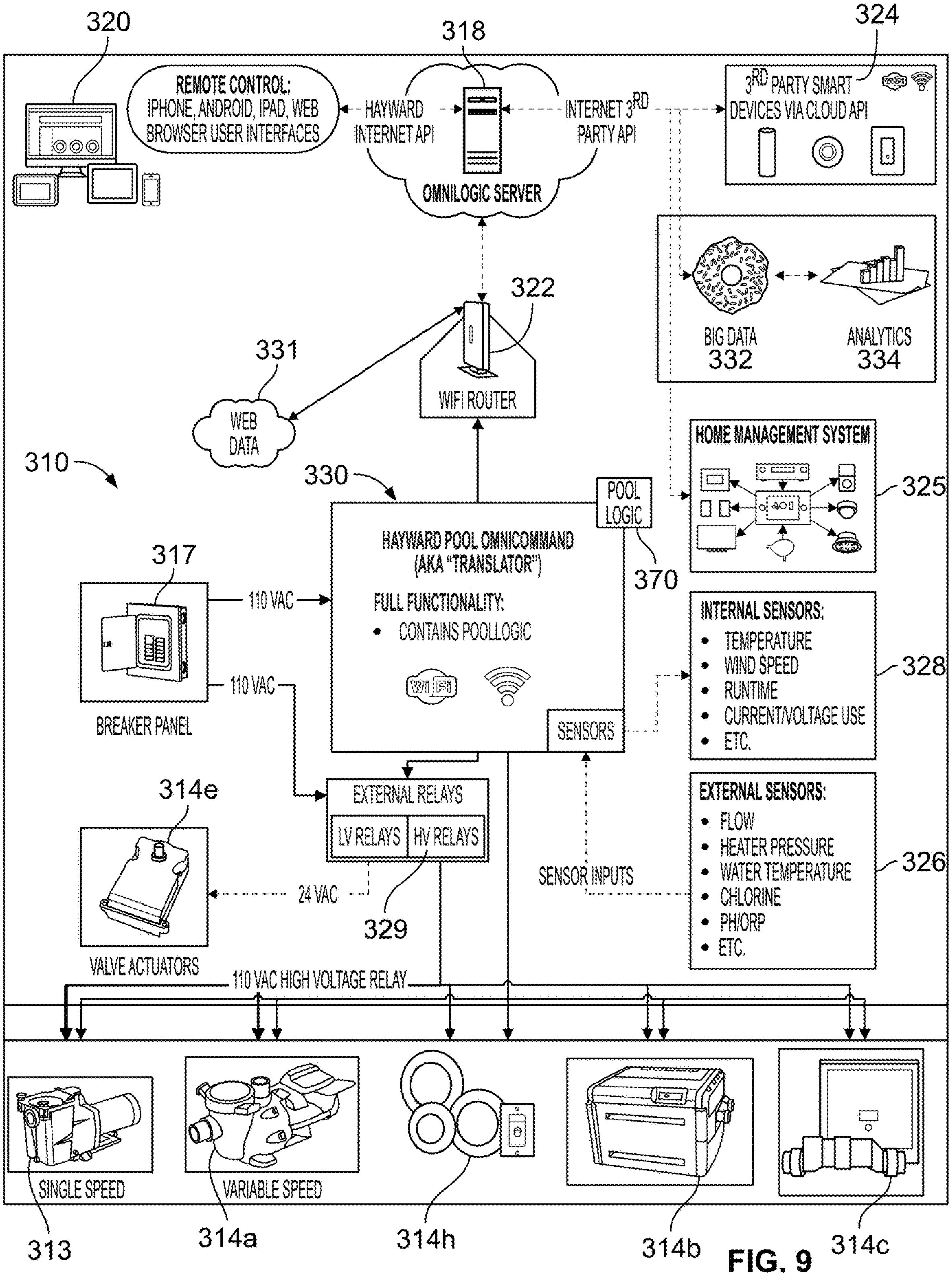
FIG. 9 is a diagram illustrating another embodiment of the system of the present disclosure.

FIG. 9 is a diagram illustrating another embodiment of the system of the present disclosure, indicated generally at 310. In this embodiment, a pool command "translator" module 330 is provided, which includes a complete set of pool logic 370. The pool logic 370 could include any of the pool logic discussed herein. The translator 330 could communicate with one or more external relays 329. Additionally, the translator 330 could communicate with a plurality of pool/spa components, including valve actuators 314*e*, a single speed pump 313, a variable speed pump 314*a*, pool/spa lighting systems 314*h*, a pool/spa heating system 314*b*, and a pool/spa chlorination system 314*c*. The translator 330 could receive electrical power from a breaker panel 317 or from photovoltaic (e.g., solar) cells and/or systems. Breaker panel 317 could also be a smart circuit breaker (e.g., a circuit breaker that can be controlled via wired or wireless communication) used to provide and/or to interrupt power to the devices disclosed herein. Additionally, the translator 330 could receive information from various sensors such as external sensors 326 and internal sensors 328. Such sensors could include, but are not limited to, temperature sensors, wind speed sensors, runtime sensors, current/voltage usage sensors, flow sensors, heat pressure sensors, water temperature sensors, chlorine sensors, PH/ORP sensors, etc. The translator 330 could also receive external web data 331 via the Internet and WiFi router 322 (e.g., time & date, sunrise/sunset data, regional and local weather forecasts, wind, UV, sunlight) for use by pool logic 370.

The translator 330 could communicate with the remote server 318 via a WiFi router 322 and a network connection such as the Internet. The server 318 could communicate with the remote control system 320, such as a smart cellular telephone, a remote computer, a tablet computer, etc. Additionally, the server 318 could process big data 332 and perform analytics 334 on pool/spa data, using a suitable API. Further, the server 318 could communicate with one or more third-party smart devices 324, using a suitable cloud API. Still further, the server 318 could communicate with a home management system 325, if desired.

Figure 10:
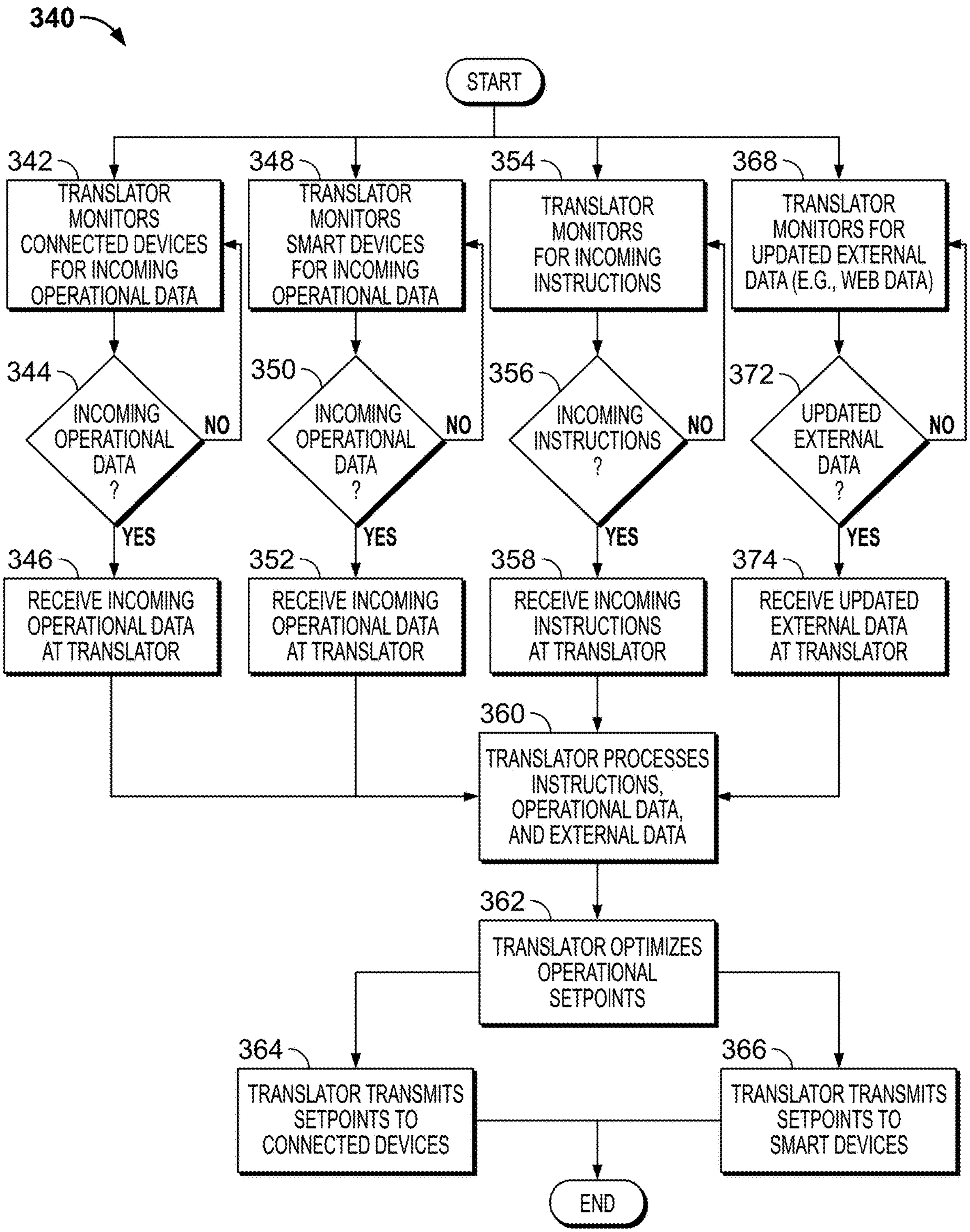
FIG. 10 is a flowchart showing processing steps carried out by the system of FIG. 9.

FIG. 10 is a flowchart showing processing steps, indicated generally at 340, carried out by the system of FIG. 9. In step 342, the translator 330 monitors connected devices for incoming operational data. In step 334, a decision is made as to whether incoming operational data has been received. If not, control returns to step 342. Otherwise, step 346 occurs, wherein the translator 330 receives the incoming operational data. Then, step 360 occurs, wherein the translator processes instructions, operational data, and external data, discussed hereinbelow. In step 362, the translator optimizes operational set points. Then, in step 364, the translator transmits the setpoints to the connect devices (e.g., to the components 313, 314*a*, 314*e*, 314*h*, 314*b*, and 314*c*). Optionally, in step 366, the translator could transmit the setpoints to one or more smart devices, such as the third-party smart devices 324.

In step 348, the translator 330 monitors smart devices for incoming operational data. In step 350, a decision is made as to whether incoming operational data has been received. If not, control returns to step 348. Otherwise, step 352 occurs, wherein the translator 330 receives incoming operational data. Then, control passes to step 360, discussed above.

In step 354, the translator 330 monitors for incoming instructions. In step 356, a decision is made as to whether incoming instructions have been received. If not, control returns to step 354. Otherwise, step 358 occurs, wherein the translator 330 receives incoming instructions. Then, control passes to step 360, discussed above.

In step 368, the translator 330 monitors for updated external data, such as web data. Such data could include, but is not limited to, remote weather data, etc. In step 372, a decision is made as to whether updated external data is available. If not, control returns to step 368. Otherwise, step 374 occurs, wherein the translator 330 receives the updated external data. Then, control passes to step 360, discussed above.

Figure 11:
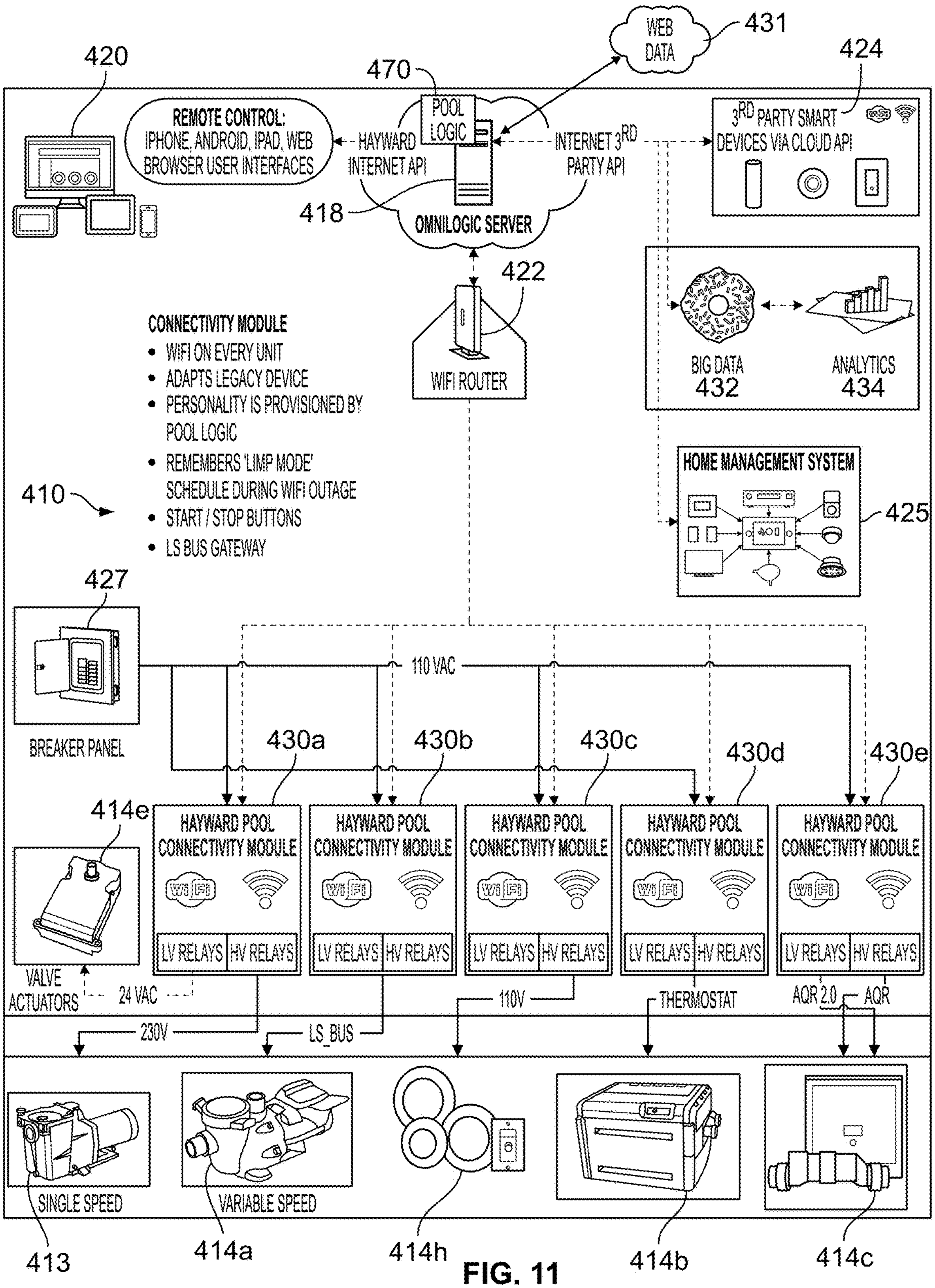
FIG. 11 is a diagram illustrating another embodiment of the system of the present disclosure.

FIG. 11 is a diagram illustrating another embodiment of the system, indicated generally at 410. In this embodiment, remote connectivity is provided by way of a plurality of connectivity modules 430*a*-430*e*. Each of these modules could include a combination of high and/or low voltage relays for connection to various pool and spa equipment, such as valve actuators 414*e*, a single speed pump 413, a variable speed pump 414*a*, pool/spa lighting systems 414*h*, pool/spa heating system 414*b*, and/or pool/spa chlorination system 414C. Connectivity could be provided to the pool/spa equipment additionally using WiFi, Bluetooth, or RF mesh (e.g., ZWave, Zigbee, Thread, Weave, etc.) connectivity. The connectivity modules could provide WiFi for every unit, could adapt for usage with legacy devices, could provide "personality" by way of remotely provisioned logic for the devices, could remember limp mode schedules during a WiFi outage, and could also include start/stop buttons and an LS bus gate way, if desired. The modules could be powered by a breaker panel 427 or by photovoltaic (e.g., solar) cells and/or systems. Breaker panel 427 could also be a smart circuit breaker (e.g., a circuit breaker that can be controlled via wired or wireless communication) used to provide and/or to interrupt power to the devices disclosed herein. Additionally, each of the modules could communicate with a remote server 418 by a WiFi router 422 and a network connection, such as the Internet. The pool/spa control logic 470 could be provided in the server 418 for remotely controlling and monitoring the pool/spa equipment. The pool logic 470 could include any of the pool logic discussed herein. The server 418 could also receive external web data 431 via the Internet (e.g., time & date, sunrise/sunset data, regional and local weather forecasts, wind, UV, sunlight) for use by pool logic 470. Additionally, the server 418 could communicate with one or more remote control devices 420, such as a smart phone, a remote computer, a tablet computer, etc. The server 418 could access big data 432 and perform analytics 434 on pool/spa data, if desired. Additionally, the server 418 could also communicate with one or more third-party smart devices 424, via a suitable cloud API. Still further, the server 418 could communicate with a home management system 425, if desired.

Figure 12:
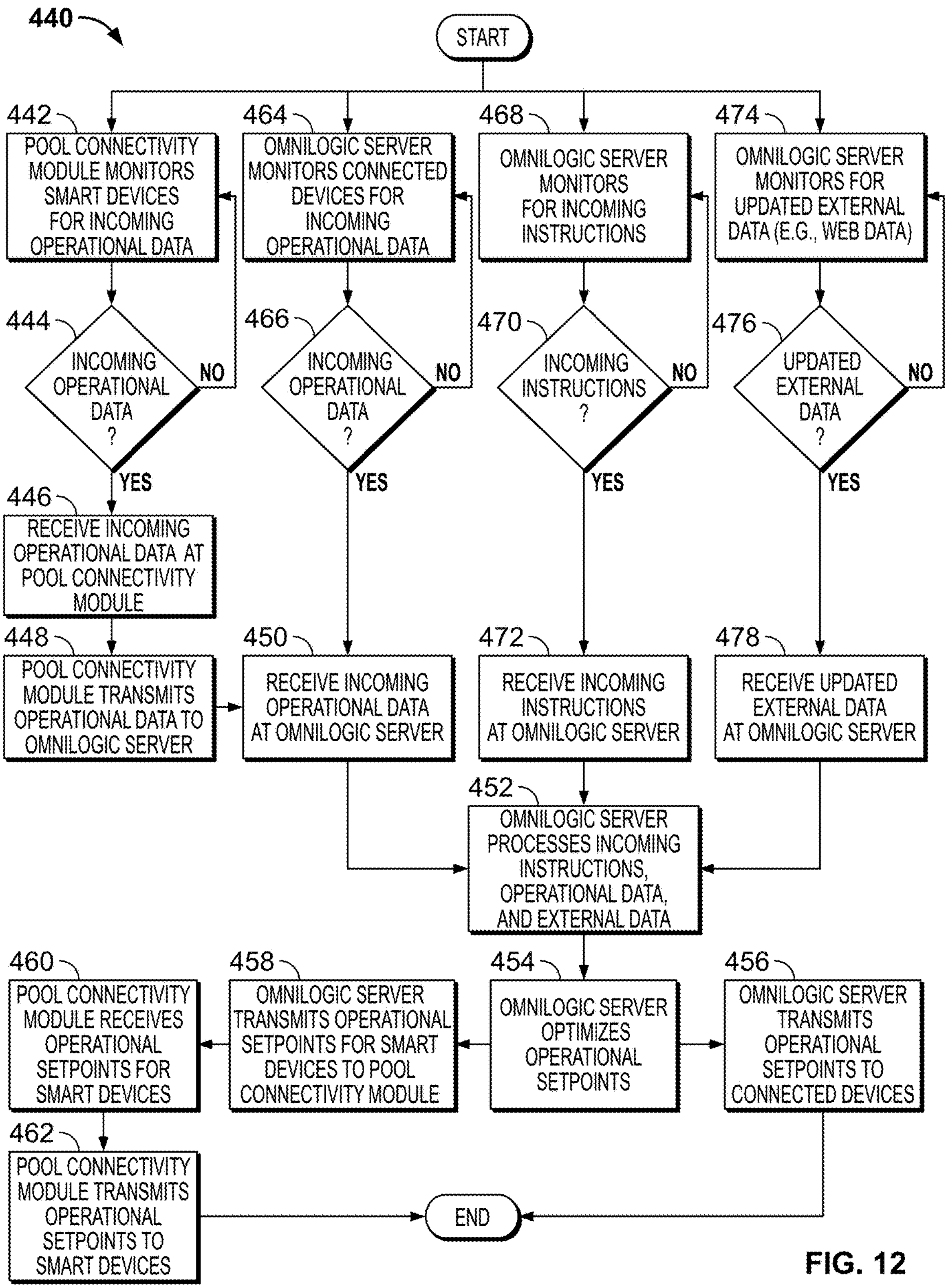
FIG. 12 is a diagram illustrating processing steps carried out by the system of FIG. 11.

FIG. 12 is a diagram illustrating processing steps, indicated generally at 440, carried out by the system of FIG. 11. In step 442, the pool connectivity modules 430*a*-430*e* monitor smart devices for incoming operational data. In step 444, a determination is made as to whether incoming operational data has been received. If not, control returns to step 442. Otherwise, step 446 occurs, wherein the pool connectivity modules each receive the incoming operational data. Then, and step 448, the pool conductivity modules 430*a*-430*e* transmit operational data to the server 418. In step 450, the operational data is received at the server 418. In step 452, the server 418 processes the incoming instructions, operational data, and external data, discussed hereinbelow. Then, in step 454, the server 418 optimizes operational support. In step 456, the server 418 transmits the operational set points to the connected devices (e.g., to the devices 413, 414*a*, 414*e*, 414*h*, 414*b*, and 414*c*). In step 458, the server transmits operational set points for the smart devices to the pool connectivity modules 430*a*-430*e*. In step 460, the pool conductivity modules 430*a*-430*e* receive the operational setpoints for the smart devices. Then, in step 462, the modules transmit the operational set points to the smart devices.

In step 464, the server for 18 monitors connected devices for incoming operational data. In step 466, a determination is made as to whether incoming operational data has been received. If not, control returns to step 464. Otherwise, step 450 occurs, wherein the server 418 receives the operational data. Control then passes to step 452, discussed above.

In step 468, the server 418 monitors for incoming instructions. In step 470, a determination is made as to whether the incoming instructions have been received. If not, control returns to step 468. Otherwise, step 472 occurs, wherein the server 418 receives the incoming instructions. Then, control passes to step 452, discussed above.

In step 474, the server 418 monitors for updated external data, such as web data including, but not limited to, remote weather information, etc. Then, in step 476, a determination is made as to whether updated external data is available. If not, control passes to step 474. Otherwise, step 478 occurs, wherein the updated external data is received at the server 418. Then, control passes to step 452, discussed above.

Figure 13:
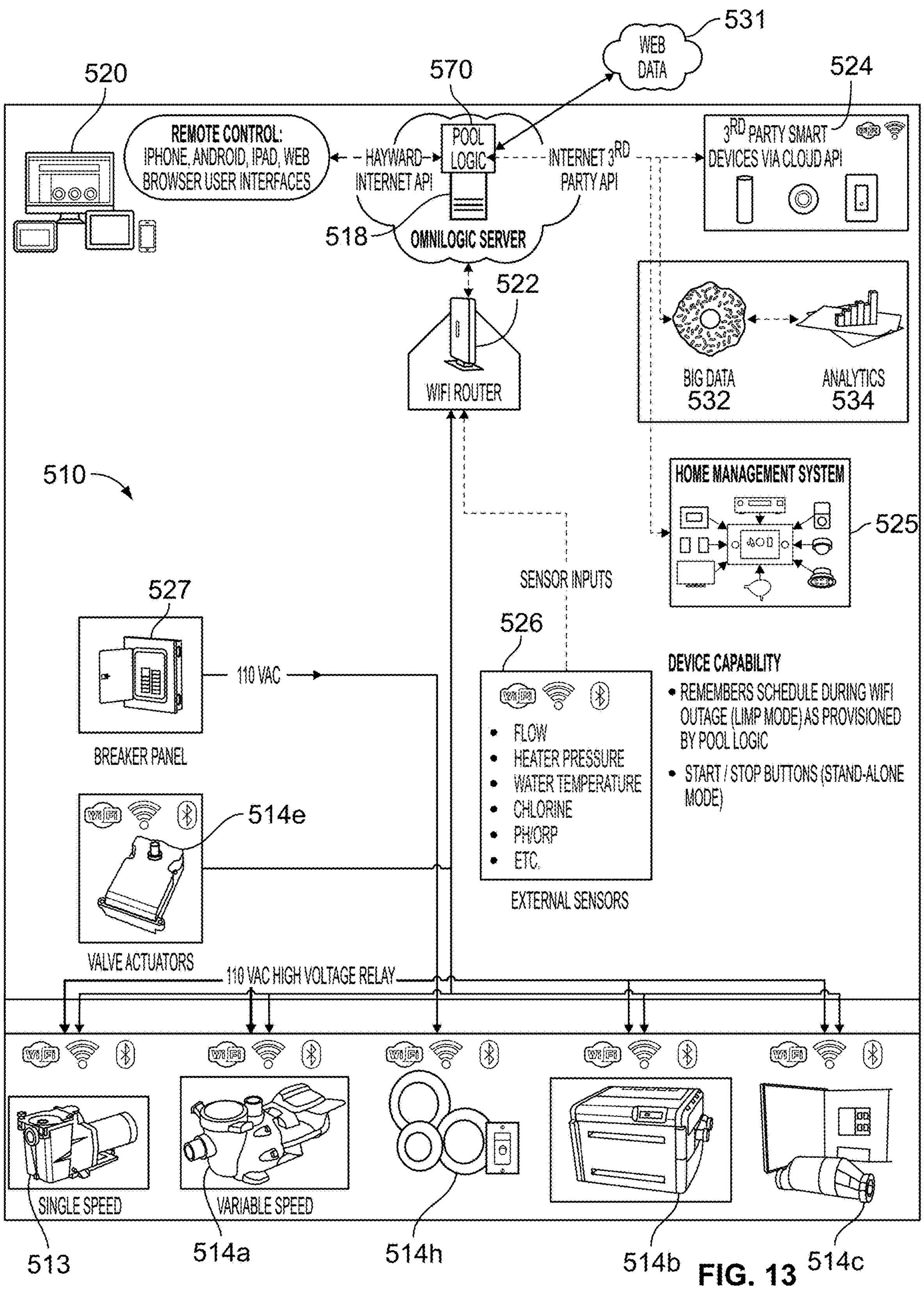
FIG. 13 is a diagram illustrating another embodiment of the system of the present disclosure.

FIG. 13 is a diagram illustrating another embodiment of the system of the present disclosure, indicated generally at 510. In this embodiment, wireless connectivity is provided directly within pool/spa equipment, allowing such equipment to communicate directly to the Internet. As shown, pool spa equipment, such as a single speed pump 513, a variable speed pump 5148, pool/spa lighting system 514*h*, heater 514*b*, and/or chlorinator 514*c*, in addition to valve actuators 514*e*, each have built-in wireless communications subsystems, such as WiFi, Bluetooth, radiofrequency/RF mesh (e.g., ZWave, Zigbee, Thread, Weave, etc.), and or cellular wireless communication subsystems. Each of these devices can communicate directly with the Internet via a WiFi router 522. Additionally, external sensors 526 could also communicate with the WiFi router 522, and could also include built-in wireless communications such as WiFi, Bluetooth, radiofrequency/RF mesh (e.g., ZWave, Zigbee, Thread, Weave, etc.), and cellular communications. The sensors 526 could include, but are not limited to, heater pressure sensors, water temperature sensors, chlorine sensors, pH/aware pressure sensors, etc. It is noted that each of the pool/spa components could include the ability to remember schedules during a WiFi outage (limp mode) as provisioned by remote pool logic. Additionally, each of these devices could include start/stop buttons, if desired, for stand-alone operation. A breaker panel 527 could provide electrical power to each of the pool/spa components. Breaker panel 527 could also be a smart circuit breaker (e.g., a circuit breaker that can be controlled via wired or wireless communication) used to provide and/or to interrupt power to the devices disclosed herein. In some embodiments, photovoltaic (e.g., solar) cells and/or systems could provide electrical power to one or more of the pool/spa components.

Each of the pool/spa components discussed above, including the sensors 526, could communicate with a remote server 518. The server 518 could include pool logic 570 for remotely controlling and/or monitoring the pool/spa equipment. The pool logic 570 could be any of the pool logic discussed herein. The server 518 could receive external web data 531 via the Internet (e.g., time & date, sunrise/sunset data, regional and local weather forecasts, wind, UV, sunlight) for use by pool logic 570. The server 518 could also communicate with one or more remote control devices 520, such as smart telephones, remote computer systems, tablet computers, etc. The server 518 could also access big data 532 and perform analytics 534 on pool/spa data, if desired. Additionally, the server 518 could communicate with one or more third-party smart devices 524, via a suitable cloud API. Still further, the server 518 could communicate with a home management system 525, if desired.

Figure 14:
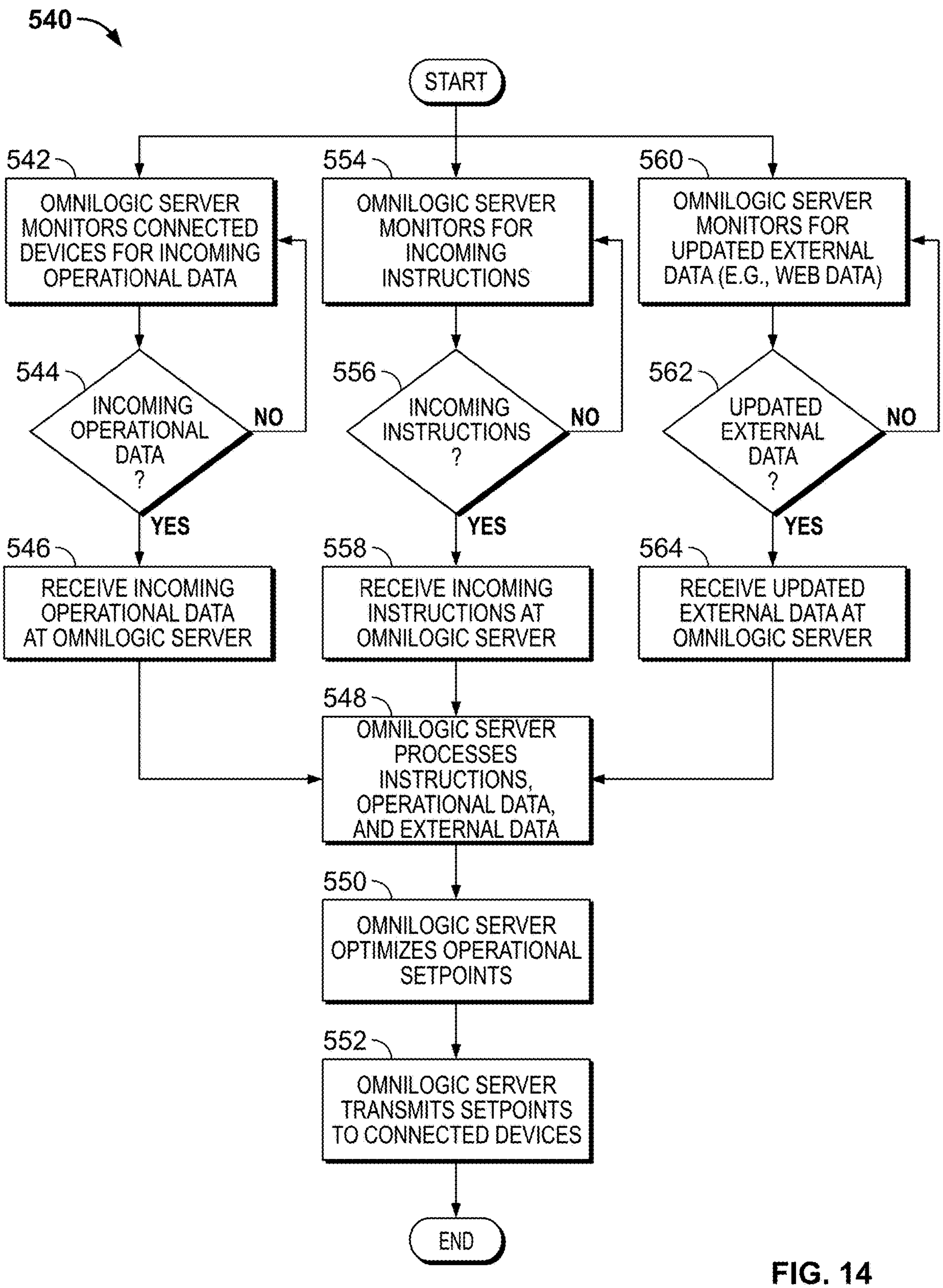
FIG. 14 is a flowchart illustrating processing steps carried out by the system of FIG. 13.

FIG. 14 is a flowchart illustrating processing steps, indicated generally at 540, carried out by the system of FIG. 13. In step 542, the server 518 monitors connected devices for incoming operational data. Then, in step 544, a determination is made as to whether incoming operational data has been received. If not, control returns to step 542. Otherwise, step 546 occurs, wherein the server 518 receives incoming operational data. Then, in step 548, the server 518 processes the instructions, the operational data, and external data, discussed hereinbelow. In step 550, the server 518 optimizes operational set points. Then, in step 552, the server transmits the setpoints to the connected pool/spa devices, such as those devices shown in FIG. 13.

In step 554, the server 518 monitors for incoming instructions. Then, in step 556, a determination is made as to whether incoming instructions have been received. If not, control returns to step 554. Otherwise, step 558 occurs, wherein the server 518 receives incoming instructions. Then, step 548, discussed above, is invoked.

In step 560, the server 518 monitors for updated external data, such as web data including, but not limited to remote weather data, etc. In step 562, a decision is made as to whether updated external data is available. If not, control returns to step 560. Otherwise, step 564 occurs, wherein the server 518 receives the updated external data. Then, control passes to step 548, discussed above.

Figure 15:
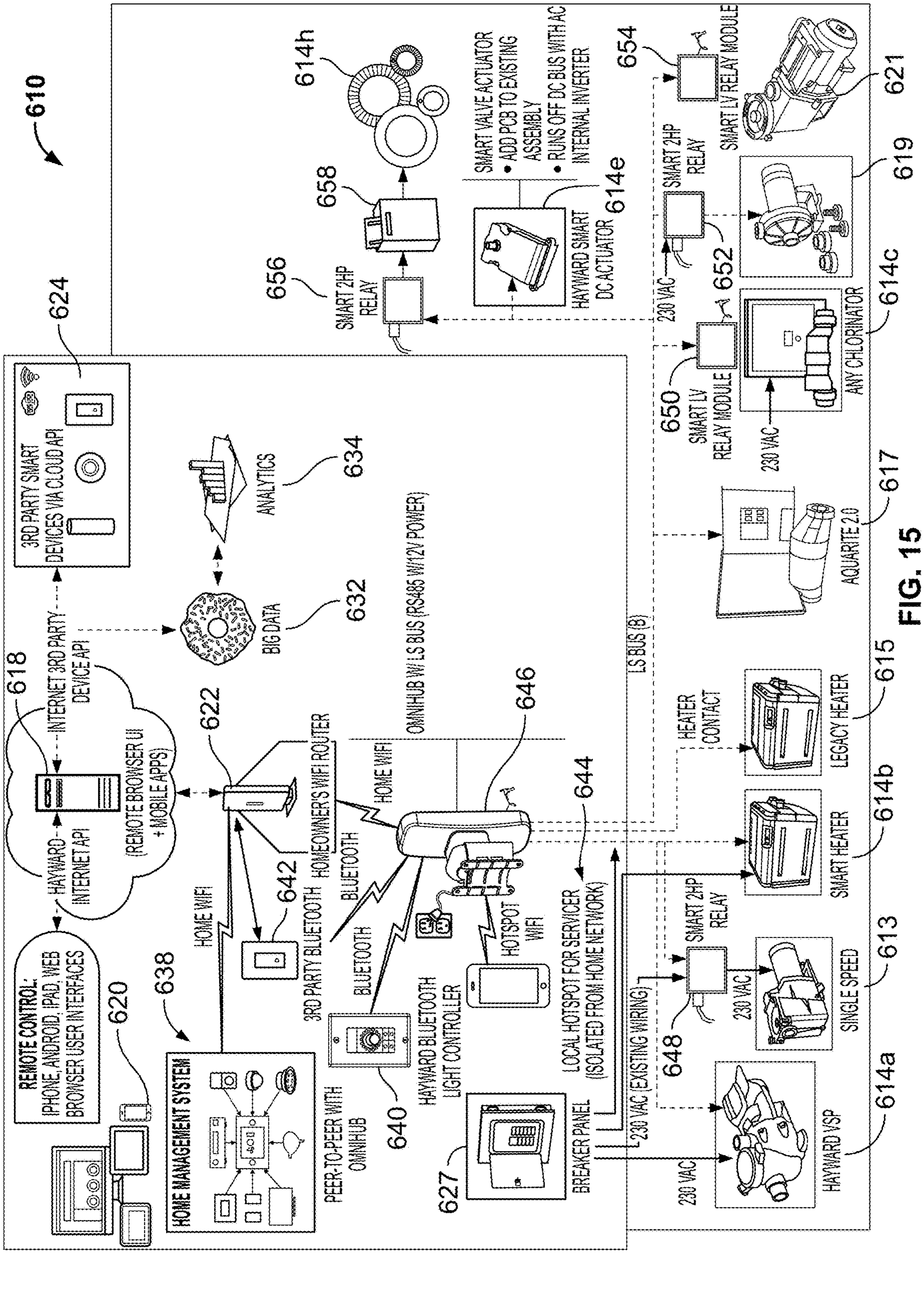
FIG. 15 is a diagram illustrating another embodiment of the system of the present disclosure.

FIG. 15 is a diagram illustrating another embodiment of the system of the present disclosure, indicated generally at 610. In this embodiment, network connectivity and remote monitoring/control is provided by way of a reduced-size hub 646 which can be easily wall-mounted. The hub 646 provides wired and wireless connections for various pool and spa equipment, such as a variable speed pump 614*a*, a single-speed pump 613, a smart heater 614*b*, a legacy heater 615, a chlorination system 617, any other type of chlorinator 614*c*, a booster pump 619, and a third-party pump 621. Various relays 648, 650, 652, and 654 could also be provided for controlling the pumps, if desired. Also, the hub 646 could communicate with and control a smart valve actuator 614*e*, and/or lighting system 614*h*. Optional control relays 656 and power supplies 658 could also be in communication with the hub 646.

As can be seen, the hub 646 could provide a WiFi hotspot for allowing a homeowner's cellular telephone, tablet computer, or personal computer 644 to communicate with the hub 646, and to control the pool/spa equipment shown in FIG. 15. A breaker panel 627 provides electrical power to the various devices shown in FIG. 15. Breaker panel 627 could also be a smart circuit breaker (e.g., a circuit breaker that can be controlled via wired or wireless communication) used to provide and/or to interrupt power to the devices disclosed herein. In some embodiments, photovoltaic (e.g., solar) cells and/or systems could provide electrical power to one or more of the various devices shown in FIG. 15. A wall-mounted light controller 640 could communicate by Bluetooth and/or RF mesh (e.g., ZWave, Zigbee, Thread, Weave, etc.) to the hub 646 for remotely controlling the lights 614*h*. Additionally, a third-party Bluetooth and/or RF mesh-enabled switch 642 could also communicate with the hub 646. The hub 646 could also communicate with the homeowner's WiFi router 622 for providing an Internet connection to the pool/spa components. A remote pool/spa server 618 could communicate with the router 622 via the Internet, to provide remote monitoring and control of the pool/spa equipment, if desired. Additionally, the server 618 could communicate with one or more remote computer systems 620 such as a smart phone, a tablet computer, a remote computer system, etc., if desired. The pool/spa control logic discussed herein could be installed in the server 618, in the remote computer 620, and/or in the smart phone 644 (e.g., by way of a pool control "app"), if desired. Further, the server 618 could communicate with one or more third-party smart devices 624 by a suitable cloud API, and the server 618 could access big data 632 and perform analytics 634 on pool/spa data, if desired. The server 618 could also communicate with a home management system 638, if desired.

Figure 16A:
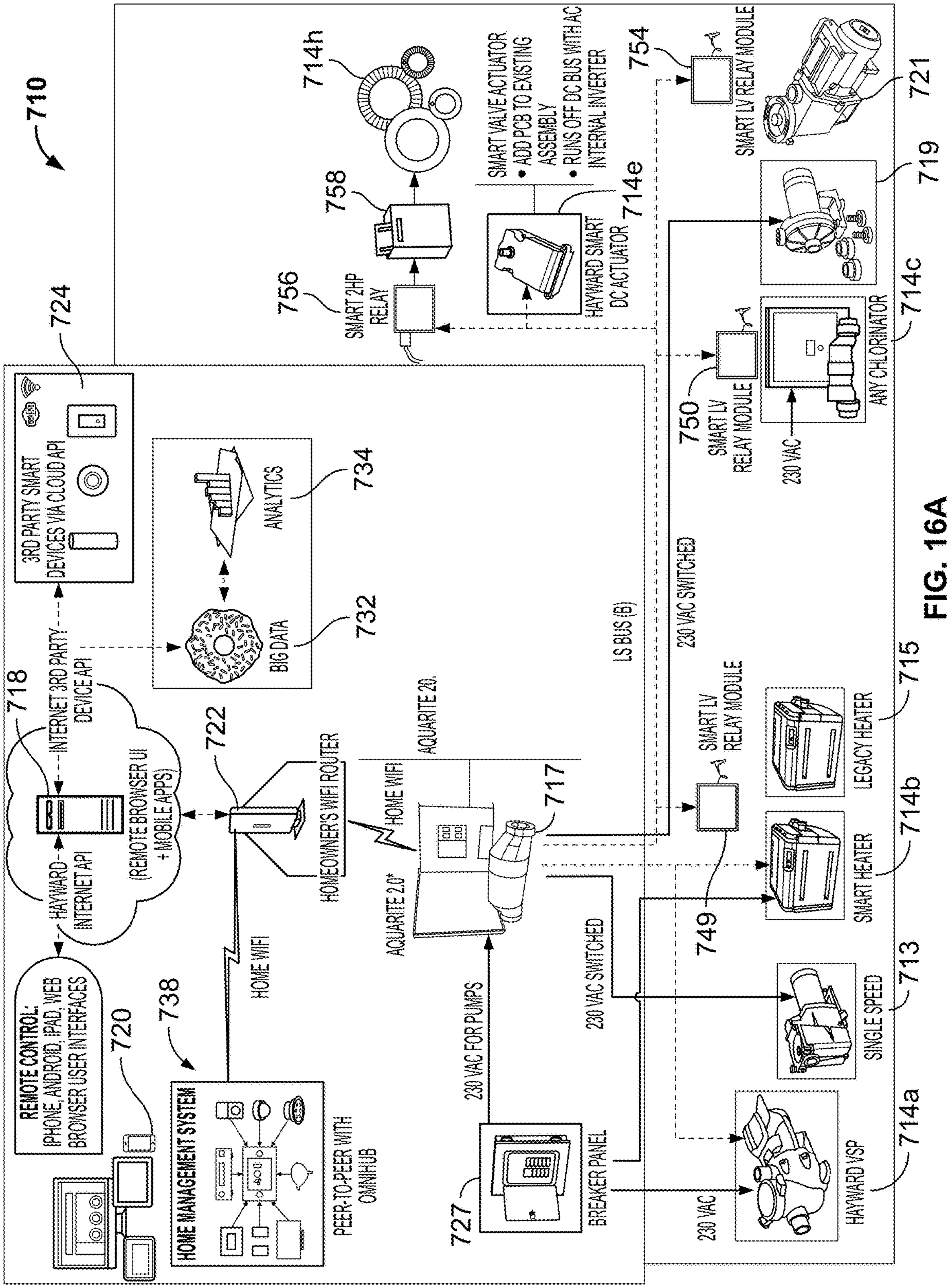
FIGS. 16A-16B are diagram illustrating another embodiment of the system of the present disclosure.

FIG. 16A is a diagram illustrating another embodiment of the system of the present disclosure, indicated generally at 710. In this embodiment, network connectivity and remote monitoring/control is provided by way of a WiFi-enabled pool/spa chlorination system and controller 717. The controller 717 provides connections for various pool and spa equipment, such as a variable speed pump 714*a*, a single-speed pump 713, a smart heater 714*b*, a legacy heater 715, a chlorination system 717*c*, a booster pump 719, and a third-party pump 721. Various relays 749, 750, and 754 could also be provided for controlling the pumps, if desired. Also, the controller 717 could communicate with and control a smart valve actuator 714*e*, and/or lighting system 714*h*. Optional control relays 756 and power supplies 758 could also be in communication with the controller 717.

A breaker panel 727 provides electrical power to the various devices shown in FIG. 16A. Breaker panel 727 could also be a smart circuit breaker (e.g., a circuit breaker that can be controlled via wired or wireless communication) used to provide and/or to interrupt power to the devices disclosed herein. In some embodiments, photovoltaic (e.g., solar) cells and/or systems could provide electrical power to one or more of the various devices shown in FIG. 16A. The controller 717 could also communicate with the homeowner's WiFi router 722 for providing an Internet connection to the pool/spa components. A remote pool/spa server 718 could communicate with the router 722 via the Internet, to provide remote monitoring and control of the pool/spa equipment, if desired. Additionally, the server 718 could communicate with one or more remote computer systems 720 such as a smart phone, a tablet computer, a remote computer system, etc., if desired. The pool/spa control logic discussed herein could be installed in the server 718, in the remote computer 720, or elsewhere, if desired. Further, the server 718 could communicate with one or more third-party smart devices 724 by a suitable cloud API, and the server 718 could access big data 732 and perform analytics 734 on pool/spa data, if desired. Still further, the server 718 could communicate with a home management system 738 if desired.

Figure 16B:
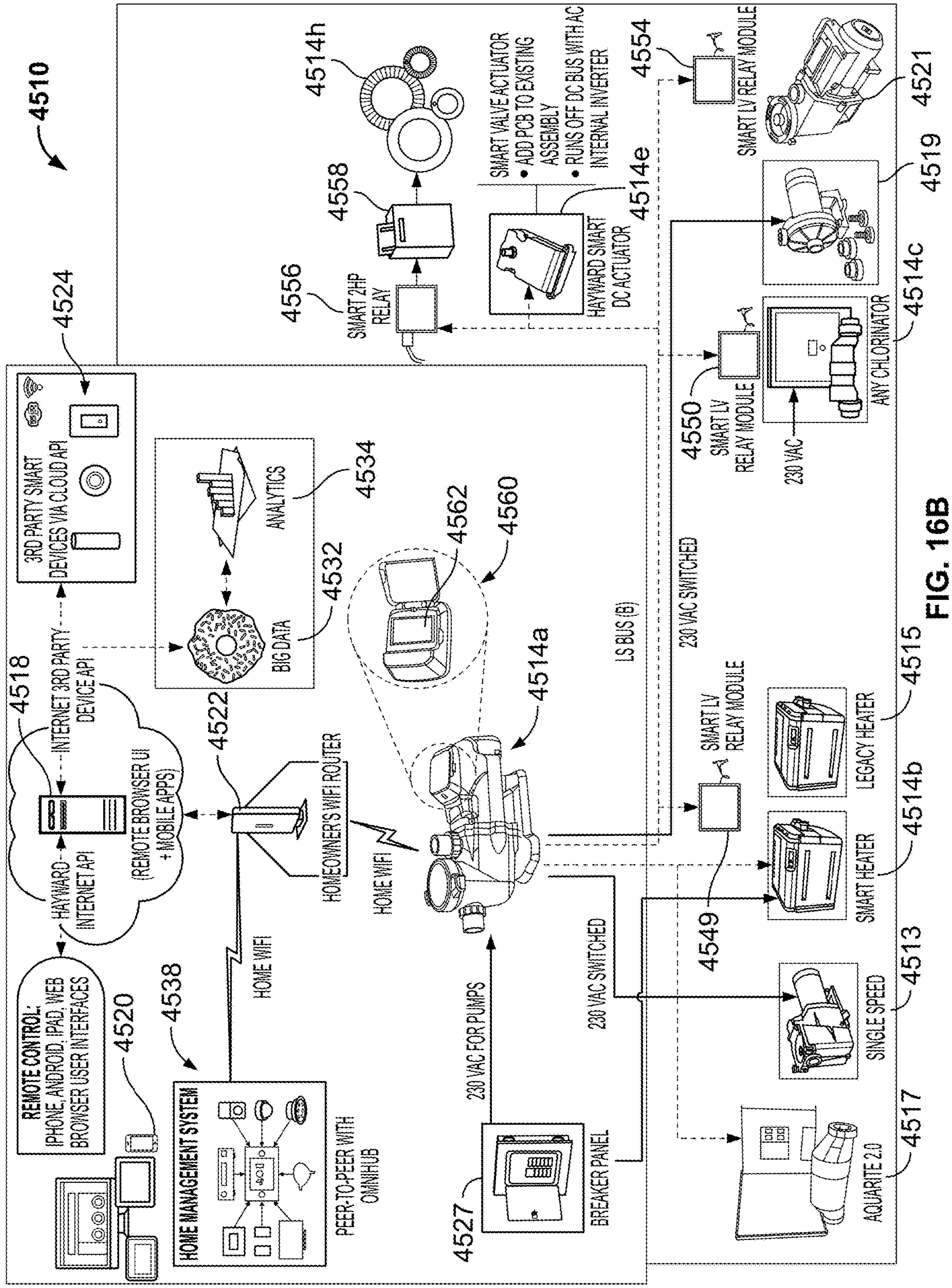

FIG. 16B is a diagram illustrating another embodiment of the system of the present disclosure, indicated generally at 4510. In this embodiment, network connectivity and remote monitoring/control is provided by way of a WiFi-enabled pool/spa variable speed pumping system and controller (also referred to herein in connection with FIG. 16B as "variable speed pumping system," "pumping system," or "controller"), indicated generally at 4514*a*. As referred to herein, a variable speed pumping system can include a variable speed pump, a possessor/controller, memory, communications interface(s), and an input device, so that the variable speed pumping system can communicate with and/or control additional installed pool/spa equipment. Accordingly, pump control logic 84, as described hereinbelow, could be installed/reside in variable speed pumping system 4514*a*. For example, any of the various processes in the embodiments described herein in connection with FIGS. 19A-19AU could be incorporated into pump control logic 84 and installed in variable speed pumping system 4514*a*, either alone or in any combination. Further, any additional processes disclosed herein in connection with pool control logic 70 (e.g., water feature control logic 72, valve actuator control logic 74, cleaner control logic 76, lighting control logic 78, heater control logic 80, chemistry automation control logic 82) could also be incorporated into pump control logic 84 and installed in variable speed pumping system 4514*a*, either alone or in any combination.

The controller 4514*a* provides connections for various pool and spa equipment, such as a pool/spa chlorination system 4517, a single-speed pump 4513, a smart heater 4514*b*, a legacy heater 4515, a chlorination system 4514*c*, a booster pump 4519, and a third-party pump 4521. Various relays 4549, 4550, and 4554 could also be provided for controlling the pumps, if desired. Variable speed pumping system and controller 4514*a* could include on-board or modularly upgradeable pool control components (e.g., communication modules, relays, temperature sensors, pressure sensors, flow sensors, etc.). For example, the variable speed pumping system 4514*a* could control existing heaters (or heat pumps) using on-board or modularly upgradeable relays and temperature sensors. Pump control logic 84, discussed in greater detail hereinbelow, could also utilize multiple sensors for parallel plumbing circuits (e.g., branch plumbing). Also, the controller 4514*a* could communicate with and control a smart valve actuator 4514*e*, and/or lighting system 4514*h*. Optional control relays 4556 and power supplies 4558 could also be in communication with the controller 4514*a*. Accordingly, variable speed pumping system and controller 4514*a* could use the modularly upgradeable smart relays to control a variety of existing installed pool/spa equipment including single speed pumps, pressure cleaner booster pumps, LED and incandescent pool lights, and landscape lights. The modularly upgradeable control components can be used by pump control logic 84 to provide pump or system performance reporting and diagnostic functions (present and historical) including, but not limited to, phase current, torque, speed, horsepower, run time, and ramp rate. Pump control logic 84 could provide the system performance and diagnostic information to the cloud, or to a smart to a smart device via a Bluetooth or any of the other communication protocols disclosed herein.

A breaker panel 4527 provides electrical power to the various devices shown in FIG. 16B. Breaker panel 4527 could include one or more smart circuit breakers (e.g., a circuit breaker that can be controlled via wired or wireless communication) used to provide and/or to interrupt power to the devices disclosed herein, and/or conventional circuit breakers. In some embodiments, photovoltaic (e.g., solar) cells and/or systems could provide electrical power to one or more of the various devices shown in FIG. 16B. The controller 4514*a* could also communicate with the homeowner's WiFi router 4522 for providing an Internet connection to the pool/spa components. A remote pool/spa server 4518 could communicate with the router 4522 via the Internet, to provide remote monitoring and control of the pool/spa equipment, if desired. Additionally, the server 4518 could communicate with one or more remote computer systems 4520 such as a smart phone, a tablet computer, a remote computer system, etc., if desired. The pool/spa control logic discussed herein could be installed in the variable speed pumping system and controller 4514*a*, in the server 4518, in the remote computer 4520, or elsewhere, if desired. Further, the server 4518 could communicate with one or more third-party smart devices 4524 by a suitable cloud API, and the server 4518 could access big data 4532 and perform analytics 4534 on pool/spa data, if desired. Still further, the server 4518 could communicate with a home management system 4538 if desired. It is also further complicated that any of the functions described herein could also be performed by the variable speed pumping system and controller 4514*a*.

As illustrated in FIG. 16B, the pumping system and controller 4514*a* can be provided with a human machine interface or user interface device, indicated generally at 4560. The user interface could include physical keys, a digital display, and/or a touchscreen 4562, as shown in FIG. 16B, any other suitable input technologies, or any combination thereof. It is also contemplated that any of the pool/spa equipment described herein could be provided with a similar user interface device. Providing a user interface device 4562 on pumping system and controller 4514*a* enables the delivery of existing or enhanced features of local pool/spa equipment control and control of remote devices (e.g., beyond the pool area) to the pool owner via the pool pump, while also reducing costs to the pool owner (e.g., reducing hardware costs, installation expenses, etc.). Because every pool/spa must include at least one pump, providing control of and communication with additional equipment, connectivity, and monitoring (e.g., status and condition of pool and equipment) functionality of the pool environment via the pool pump can further reduce pool owner cost and significantly improve usability. By leveraging information obtained at the equipment pad, from remote/external devices, and/or via a connection to the internet, operation of the pumping system 4514*a* and other devices can be further optimized.

Figure 17:
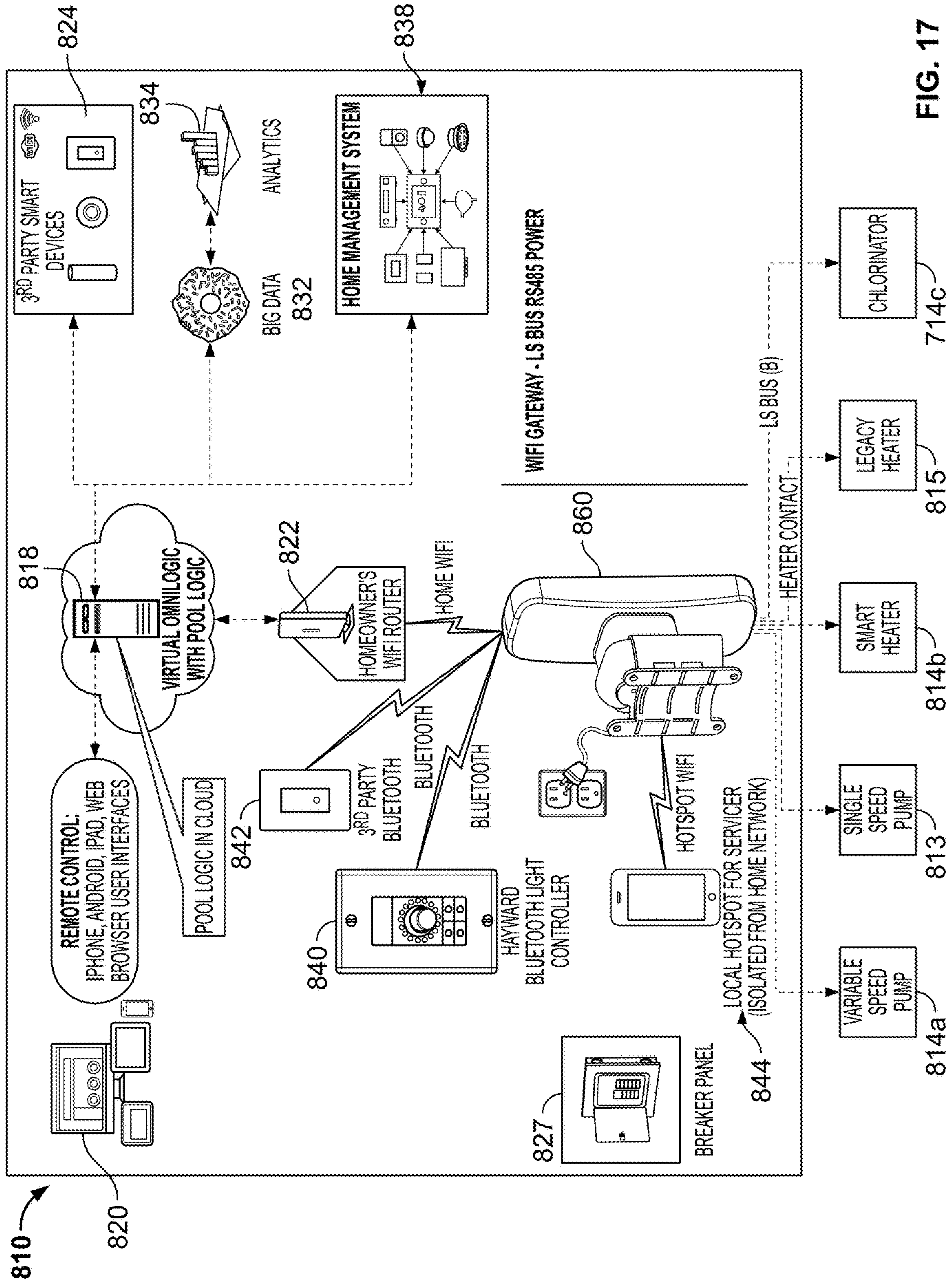
FIG. 17 is a diagram illustrating another embodiment of the system of the present disclosure.

FIG. 17 is a diagram illustrating another embodiment of the system of the present disclosure, indicated generally at 810. In this embodiment, network connectivity and remote monitoring/control is provided by way of a reduced-size hub 860 which can be easily wall-mounted. The hub 860 provides wired and wireless connections for various pool and spa equipment, such as a variable speed pump 814*a*, a single-speed pump 813, a smart heater 814*b*, a legacy heater 815, a chlorination system 817*c*, and other equipment (e.g., lighting equipment).

As can be seen, the hub 860 could provide a WiFi hotspot for allowing a homeowner's cellular telephone, tablet computer, or personal computer 844 to communicate with the hub 846, and to control the pool/spa equipment shown in FIG. 17. A breaker panel 827 provides electrical power to the various devices shown in FIG. 17. Breaker panel 827 could also be a smart circuit breaker (e.g., a circuit breaker that can be controlled via wired or wireless communication) used to provide and/or to interrupt power to the devices disclosed herein. In some embodiments, photovoltaic (e.g., solar) cells and/or systems could provide electrical power to one or more of the various devices shown in FIG. 17. A wall-mounted light controller 840 could communicate by Bluetooth and/or RF mesh (e.g., ZWave, Zigbee, Thread, Weave, etc.) to the hub 860 for remotely controlling lights. Additionally, a third-party Bluetooth and/or RF mesh-enabled switch 842 could also communicate with the hub 860. The hub 860 could also communicate with the homeowner's WiFi router 822 for providing an Internet connection to the pool/spa components. A remote pool/spa server 818 could communicate with the router 822 via the Internet, to provide remote monitoring and control of the pool/spa equipment, if desired. Additionally, the server 818 could communicate with one or more remote computer systems 820 such as a smart phone, a tablet computer, a remote computer system, etc., if desired. In this embodiment, the server 818 is a cloud-based, virtual server, and the pool/spa control logic discussed herein is installed in the server 818. The pool logic could be any of the pool logic discussed herein. Further, the server 818 could communicate with one or more third-party smart devices 824 by a suitable cloud API, and the server 818 could access big data 832 and perform analytics 834 on pool/spa data, if desired. The server 818 could also communicate with a home management system 838, if desired.

Figure 18:
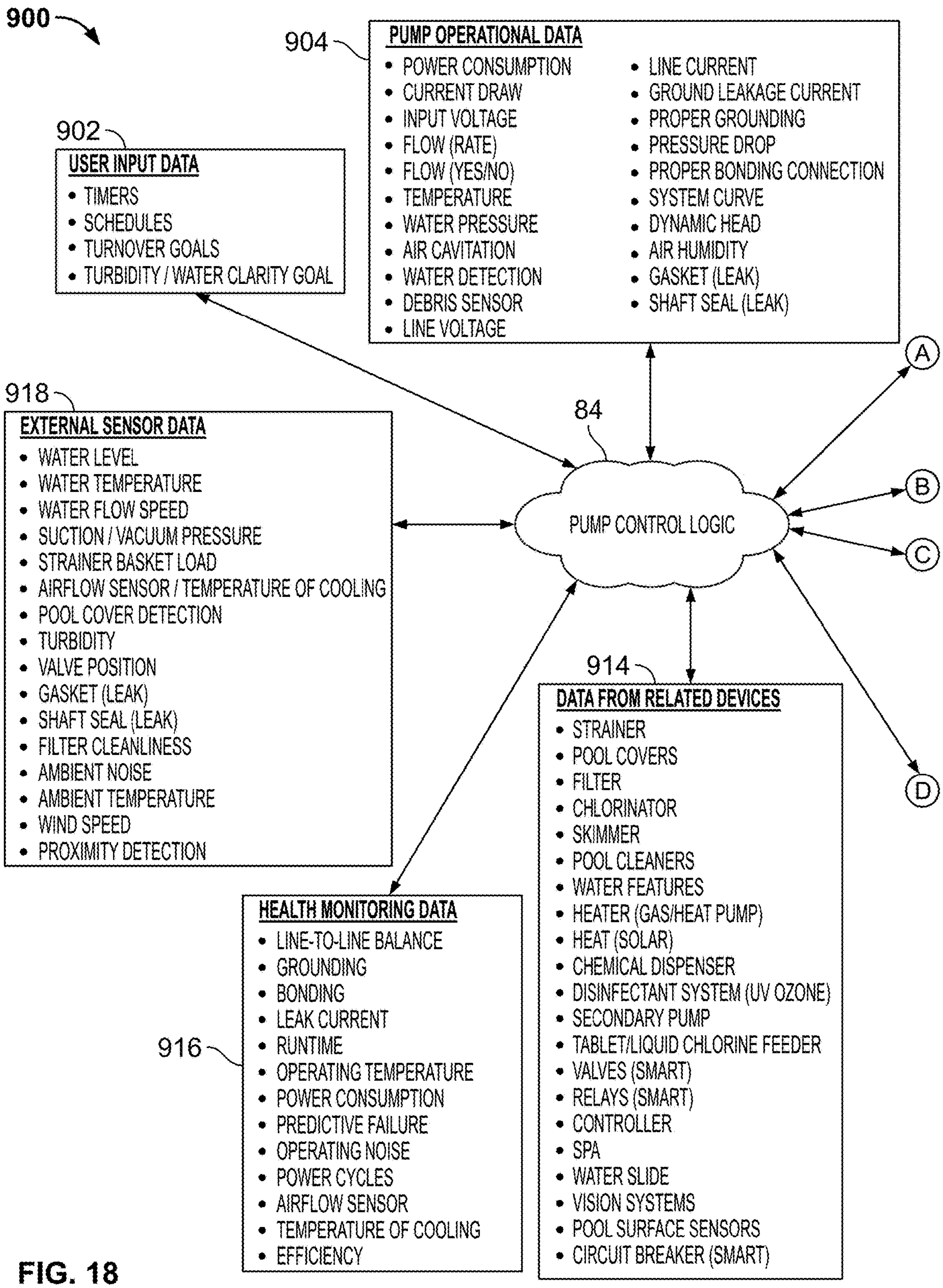
FIG. 18 is a diagram illustrating the pump control logic of FIG. 3.
Figure 18:
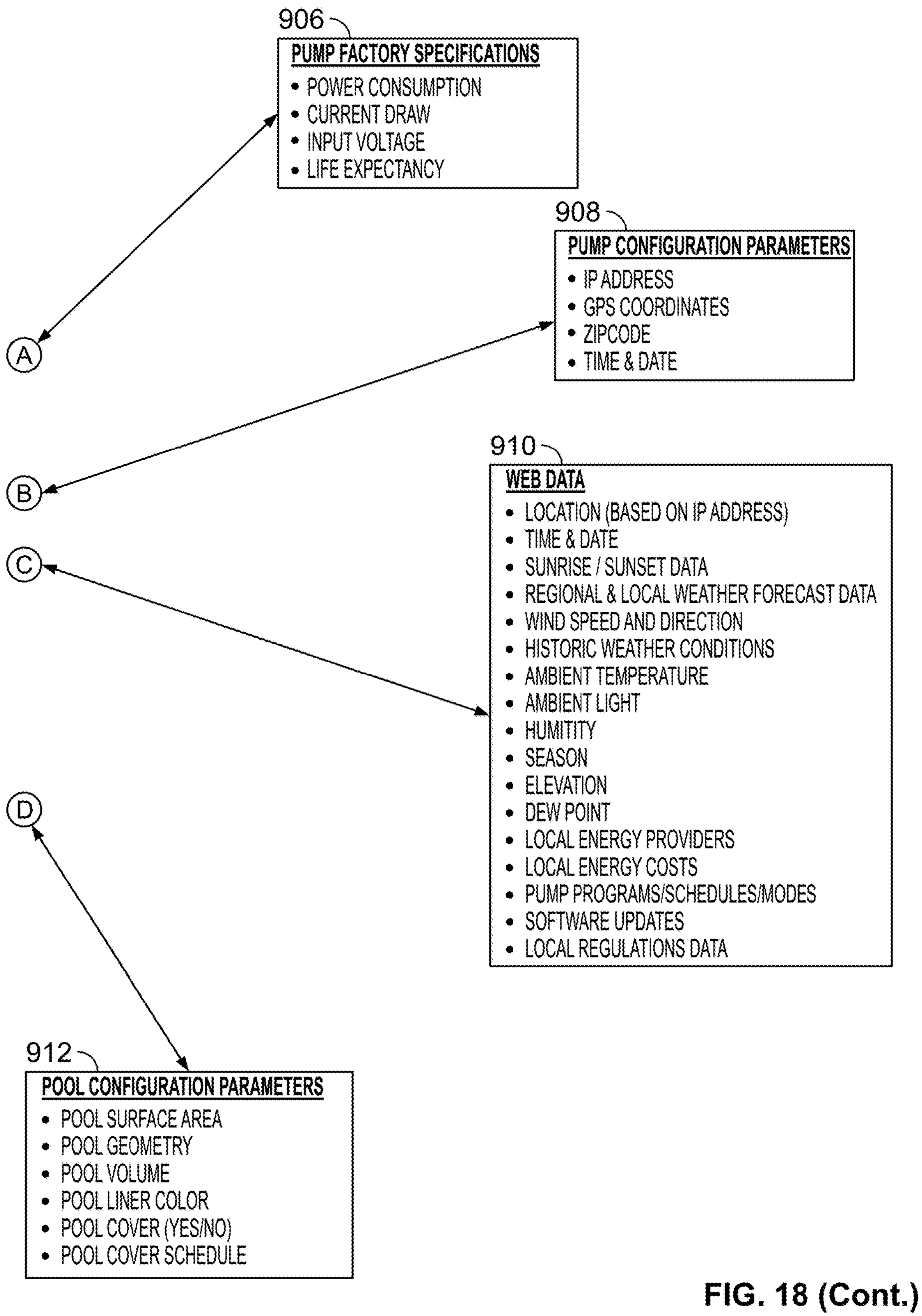

FIG. 18 is a diagram 900 illustrating pump control logic 84. Pump control logic 84 could incorporate and/or be in communication with a variety of types of data and/or data sources. More specifically, pump control logic 84 can communicate with, or receive, user input data 902, pump operational data 904, pump factory specifications 906, pump configuration parameters 908, web data 910, pool configuration parameters 912, data from related devices 914, health monitoring data 916 and/or external sensor data 918.

Pump control logic 84 can control variable speed pumps, designed for residential and commercial pool applications (as well as additional installed pool/spa equipment), providing flow and pressure for water circulation and operation of pool equipment. Variable speed pumps, as described herein, could include a pump wet end, a motor, a variable frequency/speed drive, and a user interface (see FIG. 16B). The variable speed pump is used anytime a pool is in operation, which may be year-round and/or all-day based on a particular application (e.g. residential vs. commercial) or location. The pump control logic 84 can control the variable speed drive to operate in stand-alone mode, relay control mode, or via communication with Hayward automation, described hereinbelow.

In stand-alone mode, the pump operates independently of the pool control logic 70. Stand-alone mode is programmable with respect to functions such as timers and preset speeds. In relay control mode, the pump operates according to inputs received from third party systems and devices using low voltage digital inputs. For example, the digital inputs could be used to select discrete timer speeds set in the pump user interface. When communicating with Hayward automation, the pump is controlled by a variety of Hayward automation systems such as, but not limited to: OmniLogic®, ProLogic®, and OnCommand®. The pump could communicate with Hayward automation systems using RS485 and associated Hayward automation communication protocols, or any other suitable communication protocol disclosed herein.

In addition to operating in the modes described previously, the pump can also serve as a pool control system. The user interface could utilize a color LCD touch screen with resistive and/or capacitive touch capability, or any other suitable input technology. The user interface could provide a user with information such as ambient air and pool water temperatures, providing true freeze protection capability, as well as thermostat control of a pool heater or heat pump. The user interface could also be used to communicate with and to control one or more smart relays and smart actuators, allowing the pump to coordinate operation of other pieces of pool equipment. For example, the user interface can be used for interlock control of other installed pool/spa equipment. The pump could also be provided with a communication module (e.g., WiFi, ethernet, Bluetooth, ZWave, Zigbee, Thread, Weave, etc.) allowing remote application control of the pump and/or pool pad equipment, and to allow remote data collection of site specific information.

Pump control logic 84 can be controlled remotely with a personal computer, smart phone, tablet, or other device via wired or wireless communication, including but not limited to, Bluetooth, WiFi, powerline transmission, etc. Accordingly, the pump can have a full-featured local interface (see FIG. 16B), minimal local user interface, or no local user interface at all. Nevertheless, all aspects of the pump operational data and pump control logic 84 can be available for review and adjustment if necessary. The pump control logic 84 can report multiple pieces of information to a user, the system, or a central server for data collection, storage and analysis. The information can include, but is not limited to, date of installation, warranty registration, warranty possible claims, feedback of problems daily operating conditions, usage statistics, feedback of power supply conditions or quality, detailed profiles of pool pad setups, and information related to other equipment the pump may be controlling. The pump control logic 84 can also automatically register warranties and submit warranty claims should there be an issue with any piece of equipment in the system.

User input data 902 could include timers, schedules (e.g., on/off, speed, duration of operation, how much flow should be provided), turnover goals, turbidity/water clarity goals, etc. Pump operational data 904 could include power consumption, current draw, input voltage, flow (rate), flow (yes/no), temperature, water pressure, air cavitation, water detection, debris sensor, etc. Pump factory specifications 906 could include power consumption current draw, input voltage, life expectancy, etc. Pump configuration parameters 908 could include IP address, GPS coordinates, zip code, time and date, etc. Web data 910 could include location (based on IP address), time and date, sunrise/sunset data, regional and local weather forecast data, ambient temperature, ambient light, humidity, season, elevation, dew point, etc. For example, the pump control logic 84 could shift the pump timers based on weather input. Pool configuration parameters 912 could include pool surface area, pool geometry, pool liner color, pool cover (yes/no), pool volume, etc. Data from related devices 914 could include data relating to at least the following: strainer(s), pool cover(s), filter(s), chlorinator(s), skimmer(s), pool cleaner(s), water features (e.g., laminar, bubbler, sheer fall, deck jet, fountains, scuppers, waterfall, etc.), heater(s) (gas/heat pump), heat (solar), chemical dispenser(s), disinfectant system(s) (ultraviolet ozone), secondary pump(s), tablet/liquid chlorine feeder(s), valves, controller(s), spa(s), water slide(s), etc. For example, the pump control logic 84 could receive input from an external device to identify an operating profile. In another example, the pump control logic 84 could determine the most efficient turn-over rate based on the volume of the body of water. In yet another example the pump control logic could lower the speed of the pump to prevent a water feature from flooding a closed pool cover. Health monitoring data 916 could include line-to-line balance, grounding, bonding, leak current, runtime, operating temperature, power consumption, predictive failure, operating noise, power cycles, airflow sensor, temperature of cooling, efficiency, settings, troubleshooting data, etc. External sensor data 918, could include water level, water temperature, water flow speed, suction/vacuum pressure, strainer basket load, airflow sensor or temperature of cooling, pool cover detection, turbidity, valve position, etc. Additionally, the pump control logic can receive heater and pump data trends, learning data, time and speeds used per month, time and duration that a pool cover is open, and various characteristics of pump use. While it may be desirable for external sensors to monitor/provide data on as many system parameters as possible (thereby providing greater optimization, automation, and user/operator comfort), it is contemplated that some systems need not utilize an external sensor to monitor every system parameter. For example, if a temperature sensor has not been installed in a particular system, the user/operator can provide this information by first determining the temperature (e.g., by checking a thermometer, a thermocouple, a weather forecast, the Internet, etc.) and then entering the temperature into the system via a user interface. Using this data, the pump control logic 84 could optimize the operation of the pump by, for example, running based on whether conditions (e.g., windy conditions produce more leaves and thus a need for more skimming), maximizing energy factor (or best efficiency point), communicating errors to the user/dealer/manufacturer, communicating performance to the manufacturer (e.g., usage stats) to calculate system curve to profile pools, providing feedback (e.g., basket is full, bearings going bad, seal starting to leak, etc.), and responding to needs of other equipment (e.g., pump/pump control logic could control actuators or other devices for pool pads with limited equipment (Low voltage control), lighting system, cleaner, high voltage control for booster pump, and hub through direct control or bridge to cloud for pool pad).

The pump could include a software application (accessible via user interface 4562 or on a remote device having a similar user interface), described in greater detail hereinbelow, that delivers enhanced features to the user. For example, the application could define a pool owner's usage and target modes for the user to select from including but not limited to efficiency mode, spa mode, or party mode. Selecting a mode will automatically adjust pump speed or flow accordingly. The application can also allow for seasonal adjustability which will adjust operation of the pump based on the time of year. The application can also monitor the pump and send a signal or message if the pump has been inoperative for a defined period of time. Sending this message can remind a user to resume operation of a pump if he/she manually stopped it. The application can also report the energy consumption of the pump instantly or in monthly or yearly reports. The application can also provide a single push for pre-loaded programs for the pump. The application can also allow for quick access dynamic language translation. The application can also monitor pump usage, and display a number of "favorite" speeds by the user. The amount of speeds shown can be dependent on the user and does not have to show the maximum number of possible preset speeds. The application can also allow for the quick and easy ability to switch to the last selected program or "last known good" program which is the last program that ran without any errors. The application can send notifications of all activities within the system via WiFi, Bluetooth or similar means. The notifications can include but is not limited to a blocked filter, increase in RPM of the pump, or reporting of loss of prime-protects system. The application can include a page for frequently asked questions for service and troubleshooting of all components in the system 10. The application can further include links to service and troubleshooting videos.

The pumping system or application can also certify that installation is correct and reliable. The application can provide a "certification checklist" and wizard that guides the installer to verify the entire pool pad after configuration. Some items on the checklist can include, but is not limited to, checking whether the correct pump is on the correct relay, verify simulated schedule execution, confirm all equipment is working, confirm user preferences, etc. Once the checklist is completed, the pool is "certified" to be configured and tested and is now ready for use.

Figure 19A:
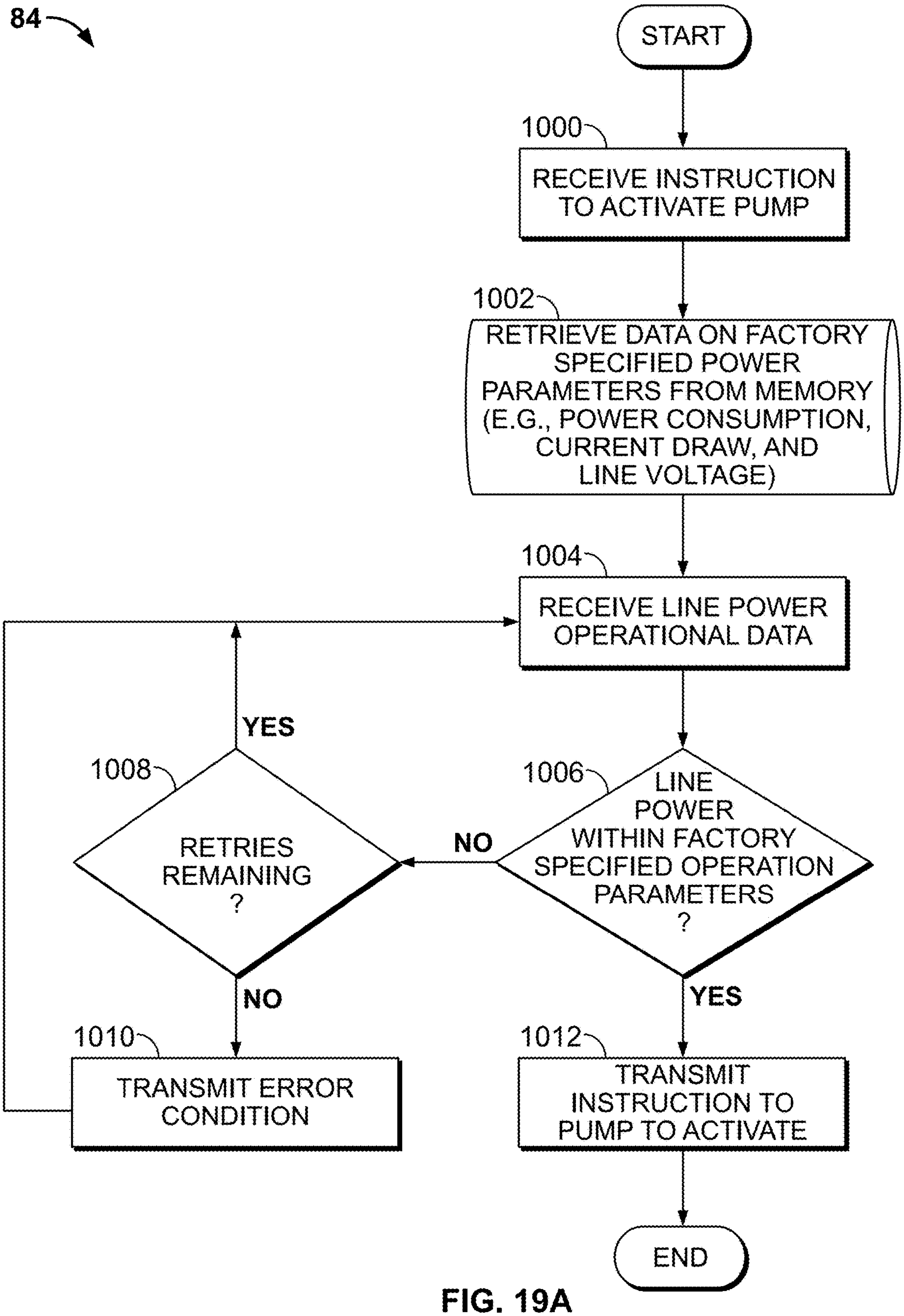
FIGS. 19A-19AU are flowcharts illustrating processing steps of the pump control logic of FIG. 3.

FIGS. 19A-19G are flowcharts illustrating processing steps of the pump control logic 84. FIG. 19A is a flowchart illustrating processing logic of the pump control logic 84 communicating with a pump. In step 1000, the pump control logic 84 receives an instruction to activate the pump. In step 1002, the pump logic 84 retrieves data pertaining to factory specified power parameters from memory, e.g., parameters relating to power consumption, current draw, and line voltage. In step 1004, the pump logic 84 receives line power operational data. In step 1006, the pump logic 84 determines whether the line power operational data is within factory specified operation parameters. If a positive determination is made, the process proceeds to step 1012. If a negative determination is made, the process proceeds to step 1008. In step 1012, the pump control logic 84 transmits an instruction to the pump to activate, and the process ends. As referenced above, if a negative determination is made at step 1006, then the process proceeds to step 1008. In step 1008, the pump control logic 84 determines if there are any retries remaining. If a positive determination is made, then the pump control logic 84 proceeds to step 1004 and continues the process from that step. If a negative determination is made, then the pump control logic 84 proceeds to step 1010 and transmits an error condition signal, and then returns to step 1004 to continue the process from that step. For example, in step 1002, the line voltage can be measured, including but not limited to, L1-L2, L1-GND, L2-GND, and in step 1010, pump control logic 84 can report associated issues to the user. In another example, pump control logic 84 can measure the line current in step 1002, and in step 1010, pump control logic 84 can report associated issues to the user. In yet another example, pump control logic 84 can measure the ground leakage current in step 1002, monitor for proper grounding in steps 1006 and 1008, and report associated issues to the user in step 1010. The pump control logic 84 can also check and verify proper bonding connection (e.g., checking for electrical continuity between the pump and a known good bonding point using a voltage measurement circuit or other known means) in the aforementioned steps.

Figure 19B:
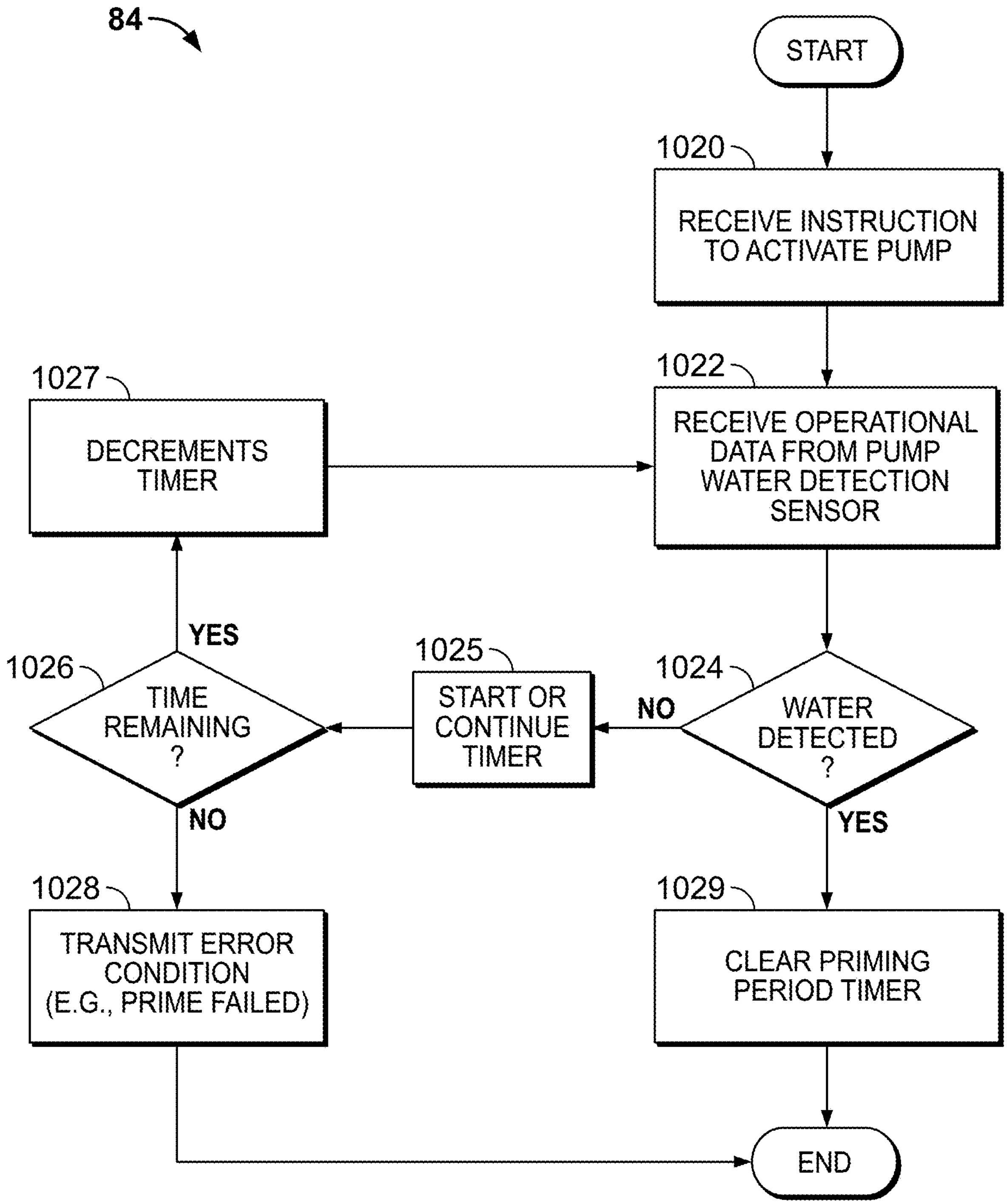

FIG. 19B is another flowchart illustrating processing logic of the pump control logic 84 communicating with a pump in connection with priming. In step 1020, the pump control logic 84 receives an instruction to activate the pump. In step 1022, the pump logic 84 receives operational data from a pump water detection sensor. In step 1024, the pump logic 84 determines whether water is detected. If a positive determination is made, the process proceeds to step 1029. If a negative determination is made, the process proceeds to step 1025. In step 1029, the pump control logic 84 clears the priming period timer, and the process ends. As referenced above, if a negative determination is made at step 1024, then the process proceeds to step 1025. In step 1025, the pump control logic 84 starts or continues the priming period timer and then proceeds to step 1026 where it determines if there is any time remaining. If a positive determination is made, then the pump control logic 84 proceeds to step 1027 where it decrements the priming timer and then continues to step 1022 to continue the process from that step. If a negative determination is made, then the pump control logic 84 proceeds to step 1028 and transmits an error condition signal indicating that prime has failed, and the process ends.

Figure 19C:
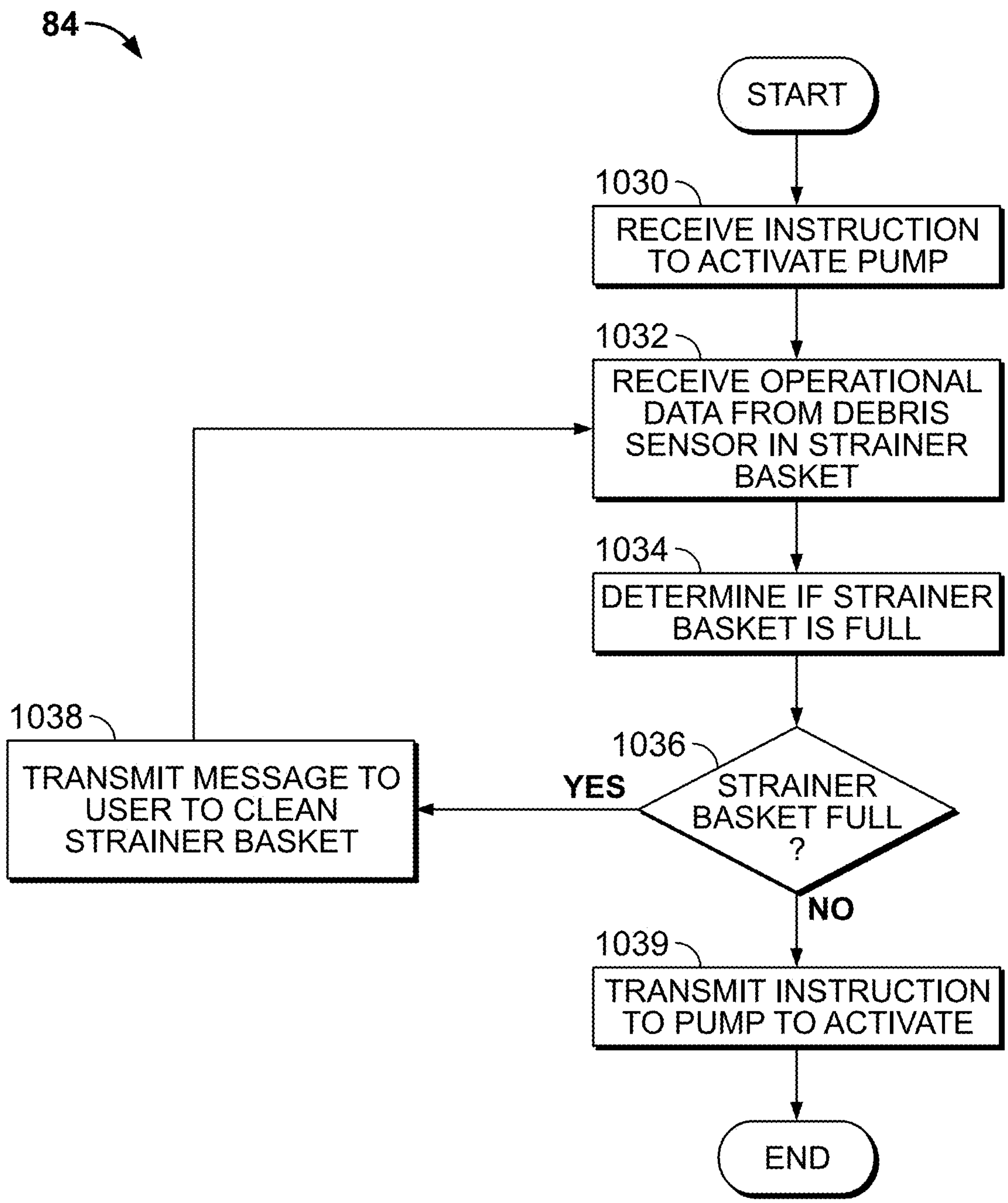

FIG. 19C is another flowchart illustrating processing logic of the pump control logic 84 communicating with a pump. In step 1030, the pump control logic 84 receives an instruction to activate the pump. In step 1032, the pump logic 84 receives operational data from a debris sensor in a strainer basket. In steps 1034 and 1036, the pump logic 84 determines whether the strainer basket is full. If a positive determination is made, the process proceeds to step 1038 where the pump control logic 84 transmits a message to the user to clean the strainer basket and then returns to step 1032. If a negative determination is made in step 1036, then the pump control logic 84 proceeds to step 1039 and transmits an instruction to the pump to activate, and the process ends.

Figure 19D:
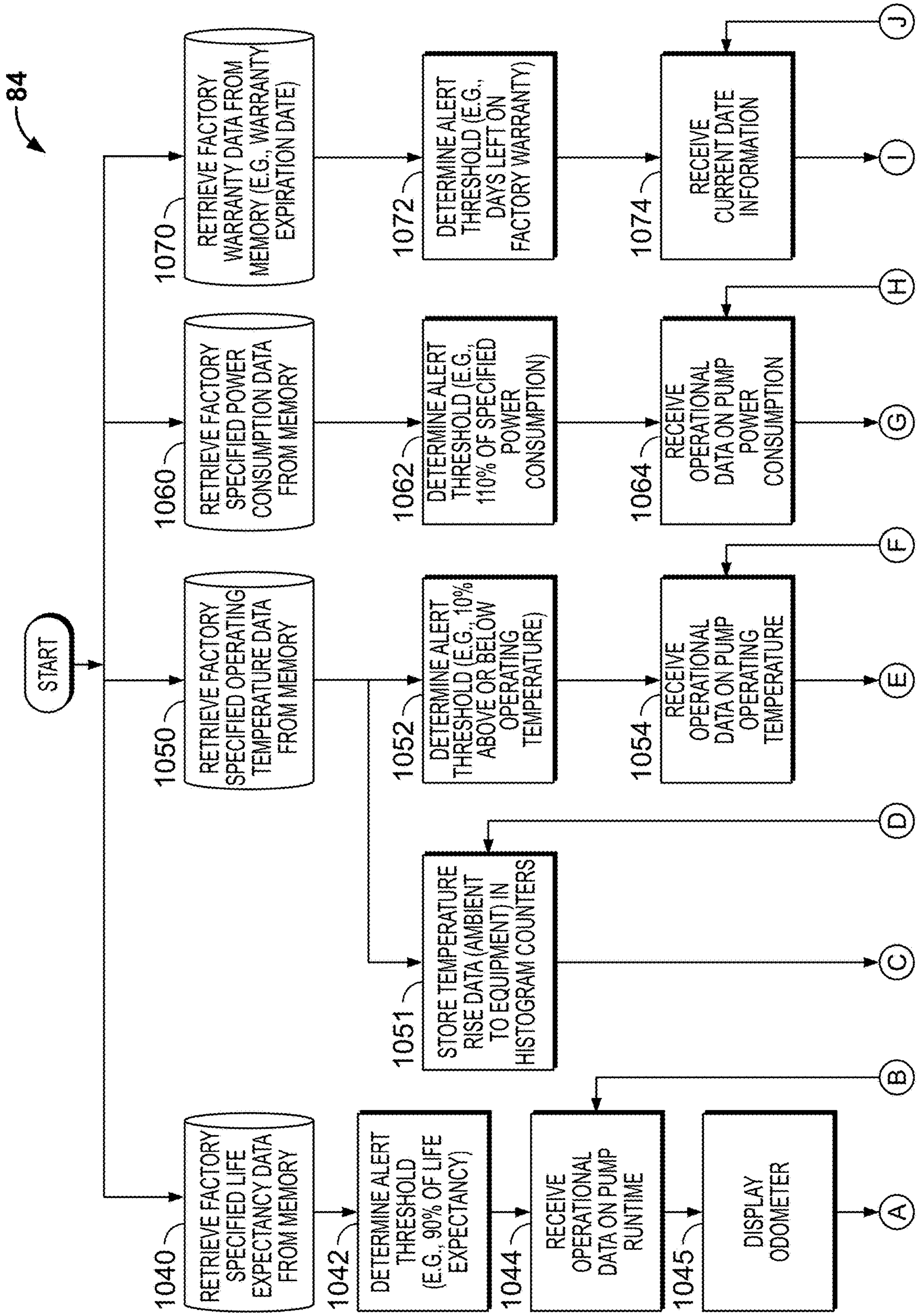
Figure 19D:
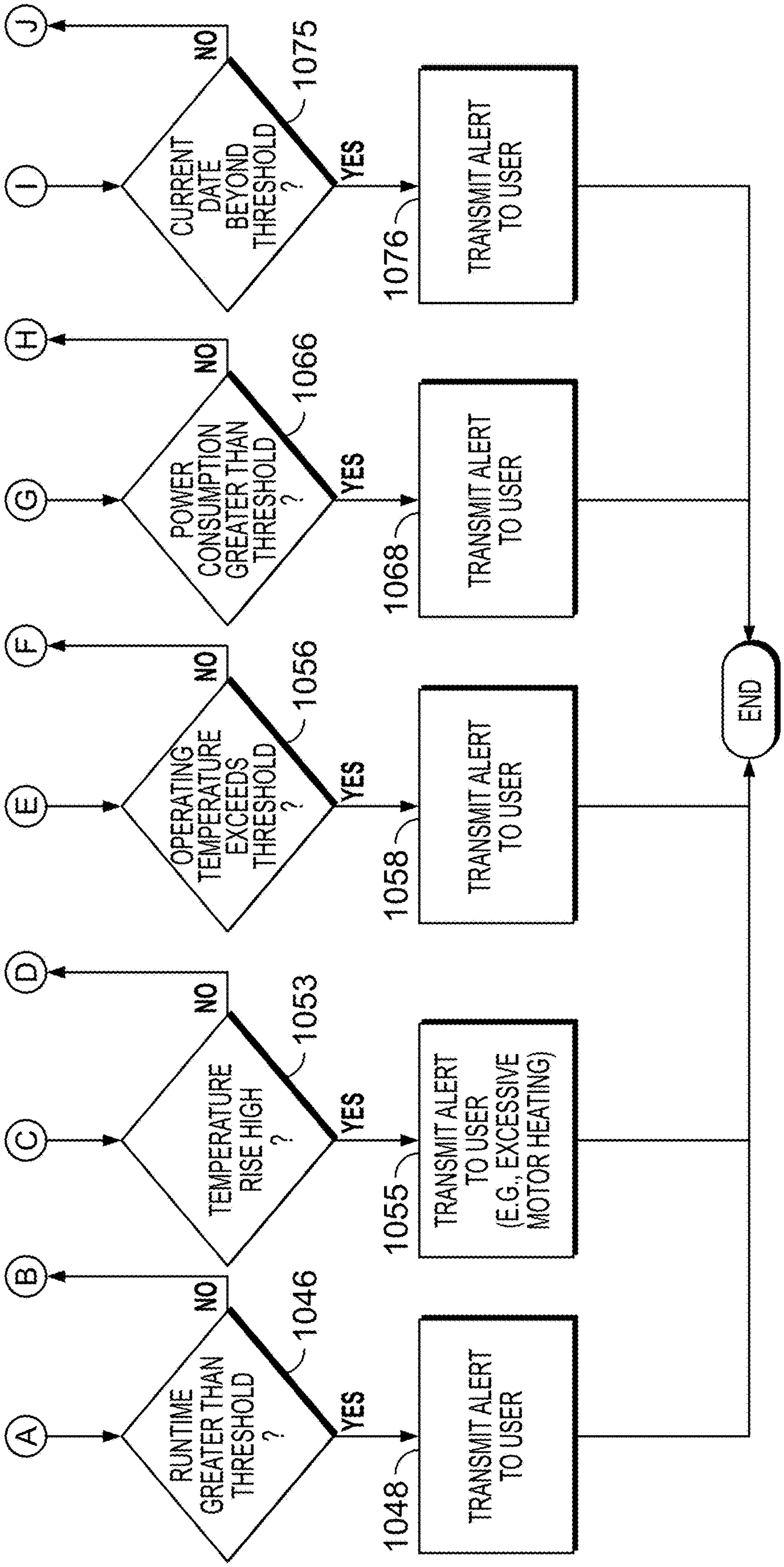

FIG. 19D is a flowchart illustrating processing logic of the pump control logic 84 determining alert conditions of a pump and subsequently notifying a user or pool professional (e.g., service technician, builders, installers, etc.) of the alert condition. The pump control logic 84 proceeds with four parallel routine sequences that respectively begin with steps 1040, 1050, 1060, and 1070. Each routine sequence is discussed sequentially, though it should be understood that the routine loops could operate in parallel, or alternatively, in series with each other. The sequence beginning with step 1040 monitors the health of the pump (as well as other installed pool equipment, discussed hereinbelow) by monitoring the runtime of the pump and comparing the runtime of the pump with life expectancy data. In step 1040 the pump control logic 84 retrieves factory specified life expectancy data from memory. The factory specified life expectancy data could be provided by the manufacturer as a specified number of hour, days, years, etc. for which the entire pump unit is expected to maintain optimal performance. Alternatively, factory specified life expectancy data could be provided for individual components of the pump unit (e.g., motor bearings, other motor components, etc.) in addition to, or in place of, the entire pump unit, thereby providing users and service providers greater granularity and predictability for maintenance protocols. In step 1042, the pump control logic 84 determines an alert threshold, e.g., less than 90% of pump life expectancy remaining or runtime value. Alternatively, the alert threshold could be provided by the user, by a pool professional (e.g., service technician, builders, installers, etc.), or by the manufacturer. In step 1044, the pump control logic 84 receives operational data on pump runtime and proceeds to step 1045 where it displays an odometer indicating pump runtime. It is noted that the odometer could also be configured to display the remaining life expectancy of the pump and/or individual components. In step 1046, the pump control logic 84 determines if the pump runtime is greater than the threshold. If a negative determination is made, then the process returns to step 1044 and continues to receive operational data on pump runtime. If a positive determination is made, then the process proceeds to step 1048 where an alert is transmitted to a user, and the process ends. The alert could be a visual and/or audio notification that could be displayed on a user's smart device (e.g., phone, text, or email based). For example, if a user's smartphone is in communication with pump control logic 84, the alerts could be delivered via pop-up notification, text, etc. In addition to describing the problem, the alerts could also suggest possible remedies (e.g., "Excessive Motor Heating—Reduce Speed").

The second sequence begins in step 1050 where the pump control logic 84 retrieves factory specified operating temperature data from memory. The process then proceeds to step 1051 and step 1052. In step 1051, the pump control logic 84 stores the temperature rise (ambient to equipment) in the histogram counters, and proceeds to step 1053. The histogram counters can be bands that indicate temperature rise values, e.g., a first counter band can be a temperature rise of 0-10 degrees, a second counter band can be a temperature rise of 10-20 degrees, a third counter band can be a temperature rise of 20-30 degrees, and a fourth counter band can be a temperature rise of greater than 30 degrees. In step 1053, the pump control logic 84 determines if the temperature rise is too high. If a negative determination is made, then the process returns to step 1051 and continues to store the temperature rise in the histogram counters. If a positive determination is made, then the process proceeds to step 1055 where an alert indicating "excessive motor heating" is transmitted to a user, and the process ends. In step 1052, the pump control logic 84 determines an alert threshold, e.g., a temperature value that is 10% above or below operating temperature. In step 1054, the pump control logic 84 receives operational data on pump operating temperature. In step 1056, the pump control logic 84 determines if the pump operating temperature exceeds the threshold, or is outside of a threshold range. If a negative determination is made, then the process returns to step 1054 and continues to receive operational data on pump operating temperature. If a positive determination is made, then the process proceeds to step 1058 where an alert is transmitted to a user, and the process ends.

The third sequence begins in step 1060 where the pump control logic 84 retrieves factory specified power consumption data from memory. In step 1062, the pump control logic 84 determines an alert threshold, e.g., a power value that is 110% of specified power consumption. In step 1064, the pump control logic 84 receives operational data on pump power consumption. In step 1066, the pump control logic 84 determines if the pump power consumption is greater than the threshold. If a negative determination is made, then the process returns to step 1064 and continues to receive operational data on pump power consumption. If a positive determination is made, then the process proceeds to step 1068 where an alert is transmitted to a user, and the process ends.

The fourth sequence begins in step 1070 where the pump control logic 84 retrieves factory warranty data from memory, e.g., a warranty expiration date. In step 1072, the pump control logic 84 determines an alert threshold, e.g., days left on factory warranty. In step 1074, the pump control logic 84 receives current date information. In step 1075, the pump control logic 84 determines if the current date is beyond the threshold date or the number of days remaining is below the threshold date. If a negative determination is made, then the process returns to step 1074 and continues to receive current date information. If a positive determination is made, then the process proceeds to step 1076 where an alert is transmitted to a user, and the process ends. In addition to the foregoing, it is contemplated that the pump control logic 84 could also report additional information to the user, pool professional (e.g., service technician, builders, installers, etc.), or manufacturer including runtime, operating temperatures/profile, power consumption, operating noise, number of power cycles, temperature of cooling air (from a pump cooling fan), and degradation of efficiency.

Figure 19E:
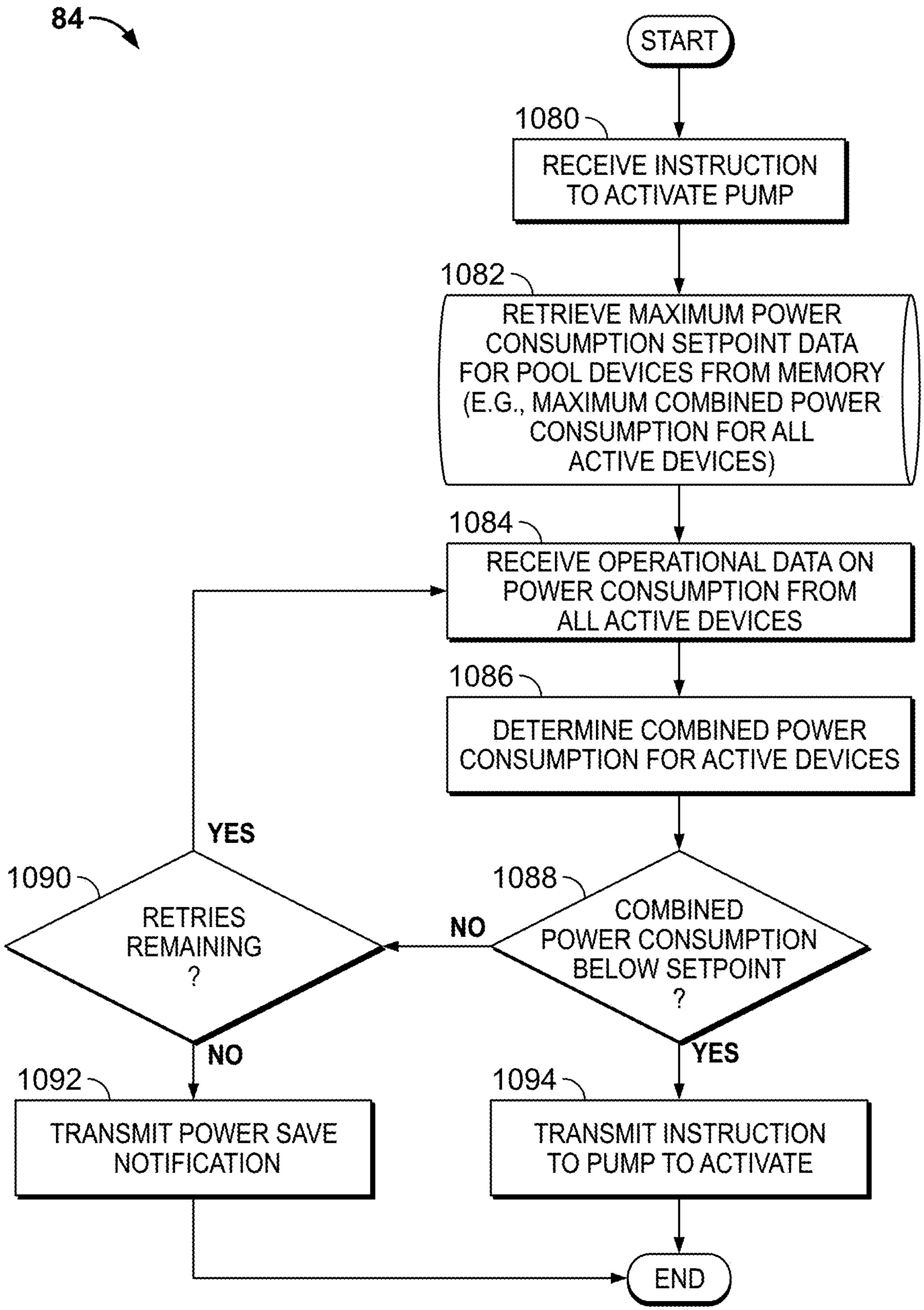

FIG. 19E is another flowchart illustrating processing logic of the pump control logic 84 communicating with a pump. In step 1080, the pump control logic 84 receives an instruction to activate the pump. In step 1082, the pump logic 84 retrieves maximum power consumption setpoint data from pool devices from memory, e.g., maximum combined power consumption for all active devices. In step 1084, the pump logic 84 receives operational data on power consumption from all active devices. In step 1086, the pump logic 84 determines the combined power consumption for active devices. In step 1088, the pump logic 84 determines whether the combined power consumption is below a setpoint. If a positive determination is made, the process proceeds to step 1094. If a negative determination is made, the process proceeds to step 1090. In step 1094, the pump control logic 84 transmits an instruction to the pump to activate, and the process ends. As referenced above, if a negative determination is made at step 1088, then the process proceeds to step 1090. In step 1090, the pump control logic 84 determines if there are any retries remaining. If a positive determination is made, then the pump control logic 84 proceeds to step 1084 and continues the process from that step. If a negative determination is made, then the pump control logic 84 proceeds to step 1092 and transmits a power save notification, and the process ends.

Figure 19F:
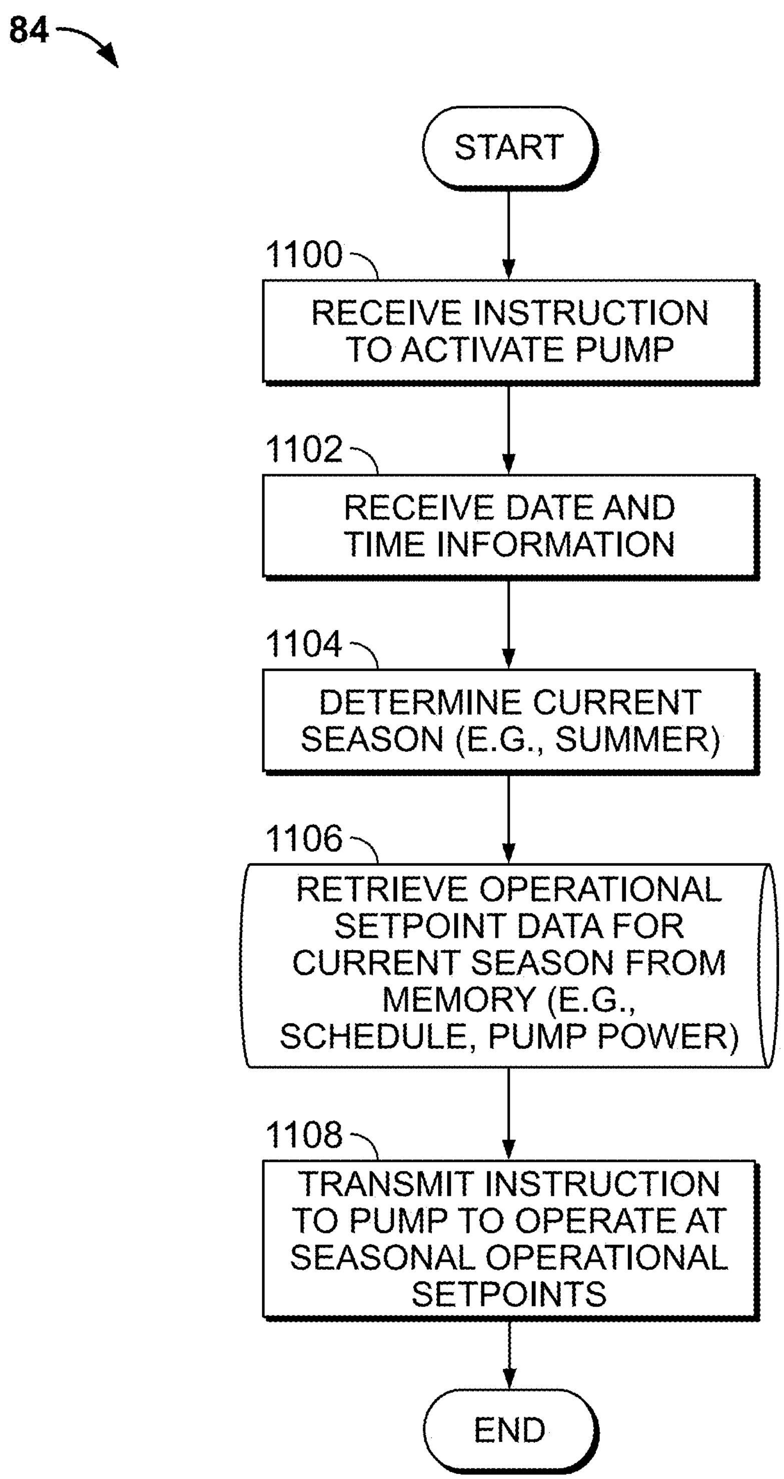

FIG. 19F is another flowchart illustrating processing logic of the pump control logic 84 communicating with a pump. In step 1100, the pump control logic 84 receives an instruction to activate the pump. In step 1102, the pump control logic 84 receives date and time information. In step 1104, the pump control logic 84 determines the current season, e.g., summer. In step 1106, the pump control logic 84 retrieves operational setpoint data for the current season from memory, e.g., schedule, pump power, etc. In step 1108, the pump control logic 84 transmits an instruction to the pump to operate at seasonal operational setpoints.

Figure 19G:
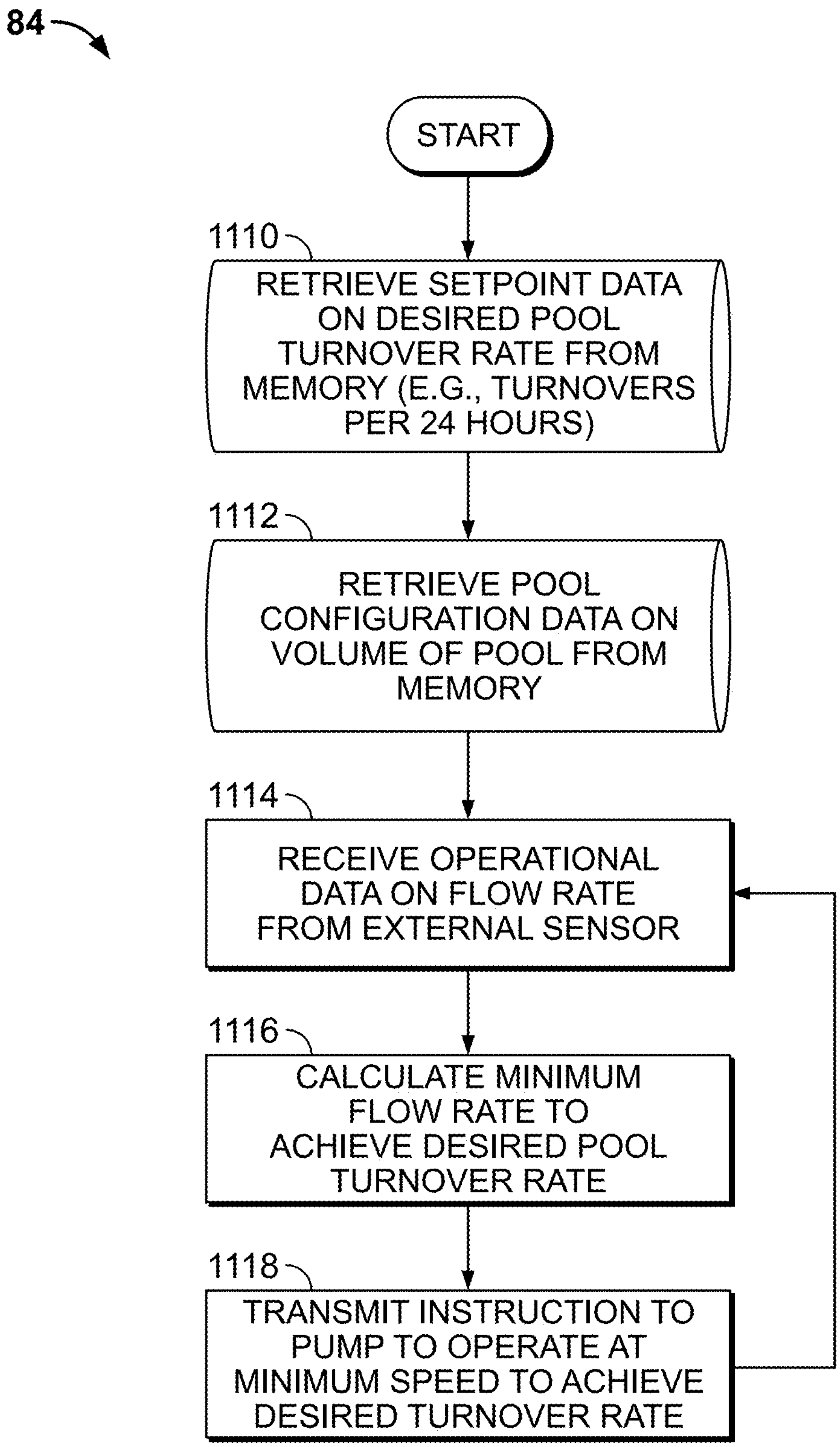

FIG. 19G is another flowchart illustrating processing logic of the pump control logic 84 communicating with the pump. In step 1110, the pump control logic 84 retrieves setpoint data on the desired pool turnover rate from the memory (e.g., the desired turnovers in a twenty-four hour period). While the desired pool turnover rate can be specified by the user and stored in the memory, it is noted that the turnover rate setpoint data it could also be retrieved from the web based on the size, geometry, location of the pool, or any combination thereof. In step 1112, the pump control logic 84 retrieves pool configuration data on the volume of the pool from the memory. The pump control logic 84 then, in step 1114, receives operational data on flow rate from external sensors. In step 1116, the pump control logic 84, using the turnover rate setpoint data, the pool configuration data, and the external sensor data, calculates the minimum flow rate to achieve the desired pool turnover rate. In step 1118, the pump control logic 84 transmits an instruction to the pump to operate at a minimum speed to achieve the desired turnover rate, and the process then returns to step 1114. It is noted that by this process, the pump control logic 84 could continuously adjust the speed of the pump throughout the twenty-four hour period based on repeated minimum flow rate calculations.

Figure 19H:
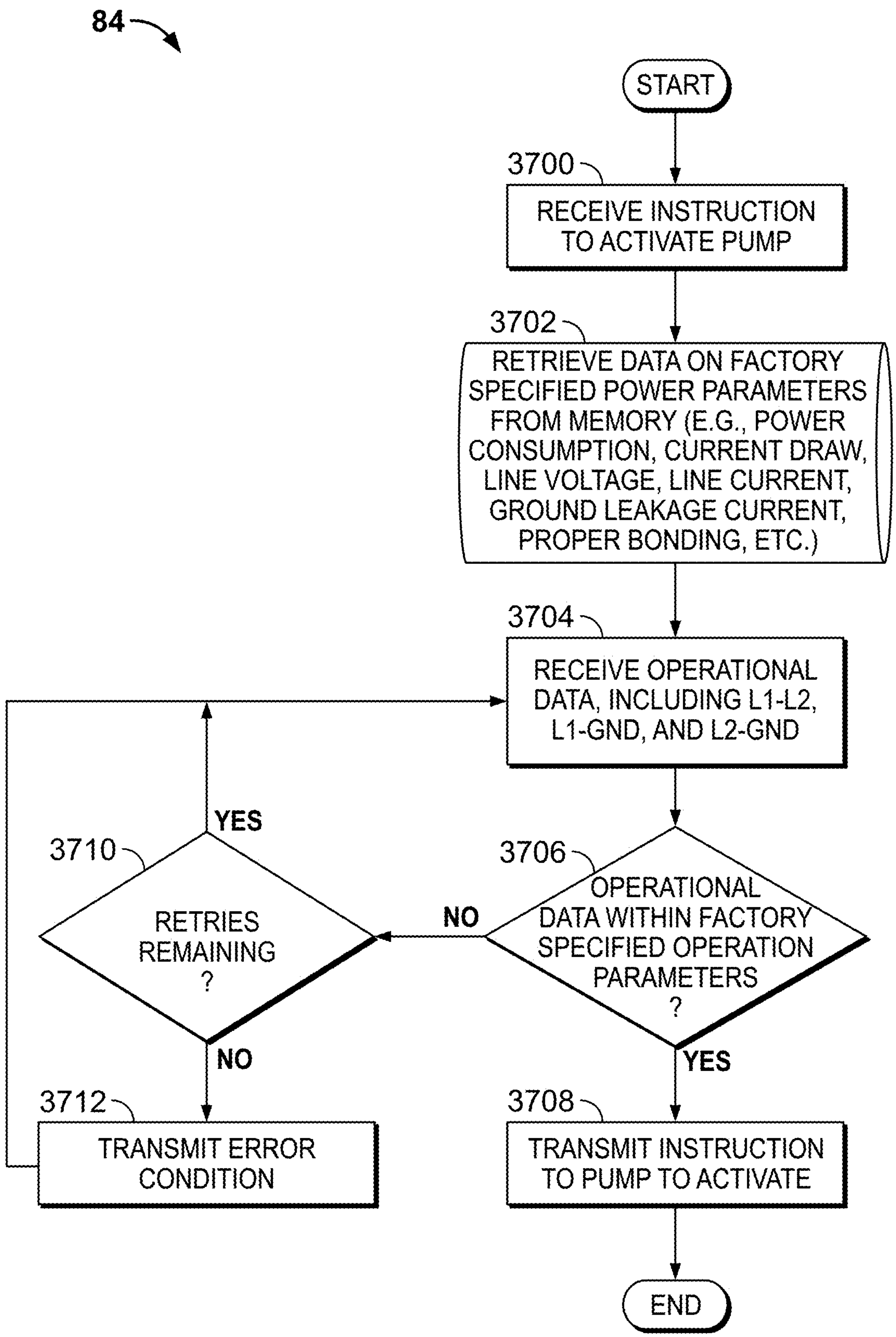

FIG. 19H is another flowchart illustrating processing logic of the pump control logic 84 communicating with the pump. In step 3700, the pump control logic 84 receives an instruction to activate the pump. In step 3702, the pump control logic 84 retrieves data on factory specified power parameters from memory. Some examples of power parameters include, but is not limited to, power consumption, current draw, line voltage, line current, ground leakage current, proper bonding, etc. In step 3704, the pump control logic 84 received operational data of the pump, including but not limited to, L1-L2, L1-GND, and L2-GND. In step 3706, the pump control logic 84 compares whether the operational data is within the specified operating parameters of the pump. If a positive determination is made, the pump control logic 84 proceeds to step 3708 where the pump control logic 84 transmits an instruction to activate the pump and the process ends. If a negative determination is made, the pump control logic 84 proceeds to step 3710 where it decides whether retries are remaining. If a positive determination is made, the pump control logic 84 proceeds back to step 3704 where it receives operational data on the pump. If a negative determination is made, the pump control logic 84 proceeds to step 3712 where an error condition is transmitted and the process proceeds back to step 3704. The above process can measure all parameters related to electrical power of the pump and can indicate any type of issue to the user.

Figure 19I:
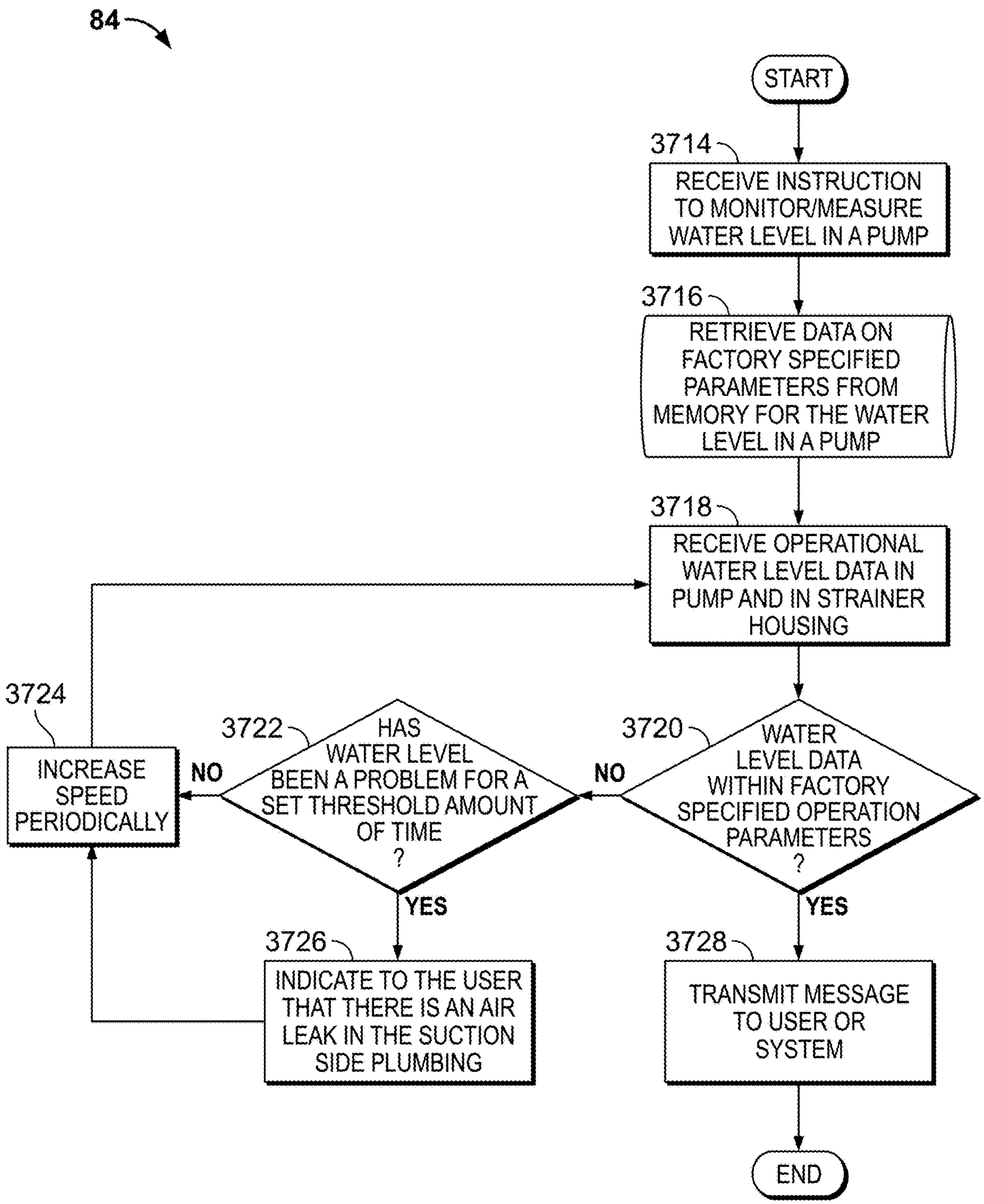

FIG. 19I is another flowchart illustrating processing logic of the pump control logic 84. In step 3714, the pump control logic 84 receives an instruction to monitor or measure the water level in a pump. In step 3716, the pump control logic 84 retrieves data on factory specified parameters from memory for the water level in a pump. In step 3718, the pump control logic 84 receives operational water level data in the pump and in the strainer housing. In step 3720, the pump control logic 84 decides whether the water level data is within the factory specified operating parameters. If a positive determination is made, the pump control logic 84 proceeds to step 3722. If a negative determination is made, the pump control logic 84 proceeds to step 3728. In step 3722, the pump control logic 84 determines whether the water level has been an issue for a set amount of time. If a negative determination is made, the pump control logic 84 will proceed to step 3724 where the speed of the pump is increased periodically. If a positive determination is made, the pump control logic 84 will proceed to step 3726 where it will indicate to the user that there is an air leak in the suction side plumbing. In step 3728, the pump control logic 84 will transmit a message to the user or system that the water level data is within the factory specified parameters.

Figure 19J:
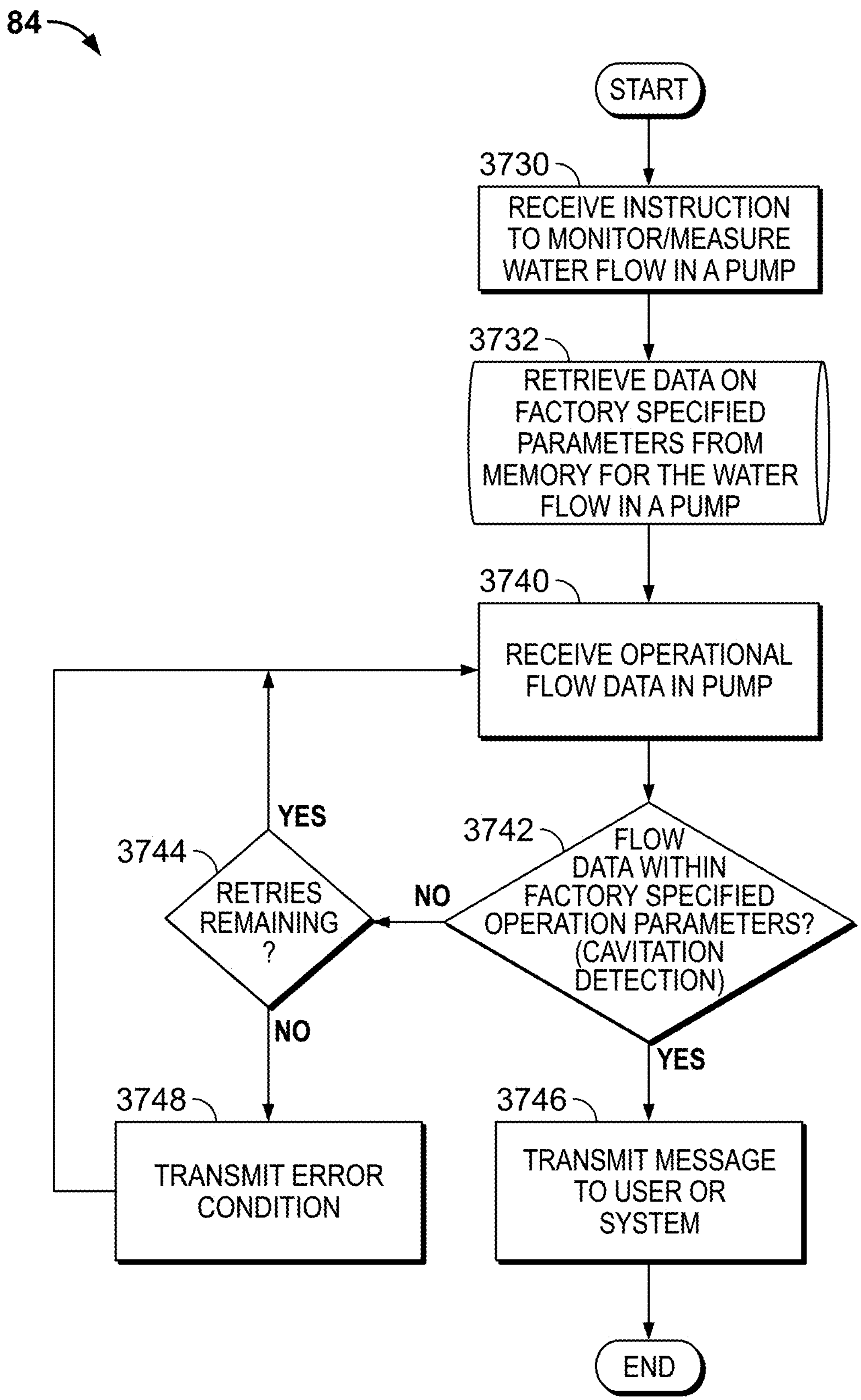

FIG. 19J is another flowchart illustrating processing logic of the pump control logic 84. In step 3730, the pump control logic 84 receives an instruction to monitor or measure water flow in the pump. In step 3732, the pump control logic 84 retrieves data on the factory specified parameters from memory for the water flow in the pump. In step 3740, the pump control logic 84 receives operational flow data in the pump. In step 3742, the pump control logic 84 determines whether the flow data is within the range for the factory specified operational parameters. Step 3742 can further be associated with cavitation detection. If a negative determination is made, the pump control logic 84 proceeds to steps 3744, and if a positive determination is made, the pump control logic 84 proceeds to step 3746. In step 3744, the pump control logic 84 determines whether retries are remaining. If there are no retries remaining, the pump control logic 84 proceeds to step 3748 to transmit an error condition and if there are retries remaining, the pump control logic 84 proceeds back to step 3740. In step 3746, the pump control logic 84 transmits a message to the user or the system that the flow data is within the factory specified parameters.

Figure 19K:
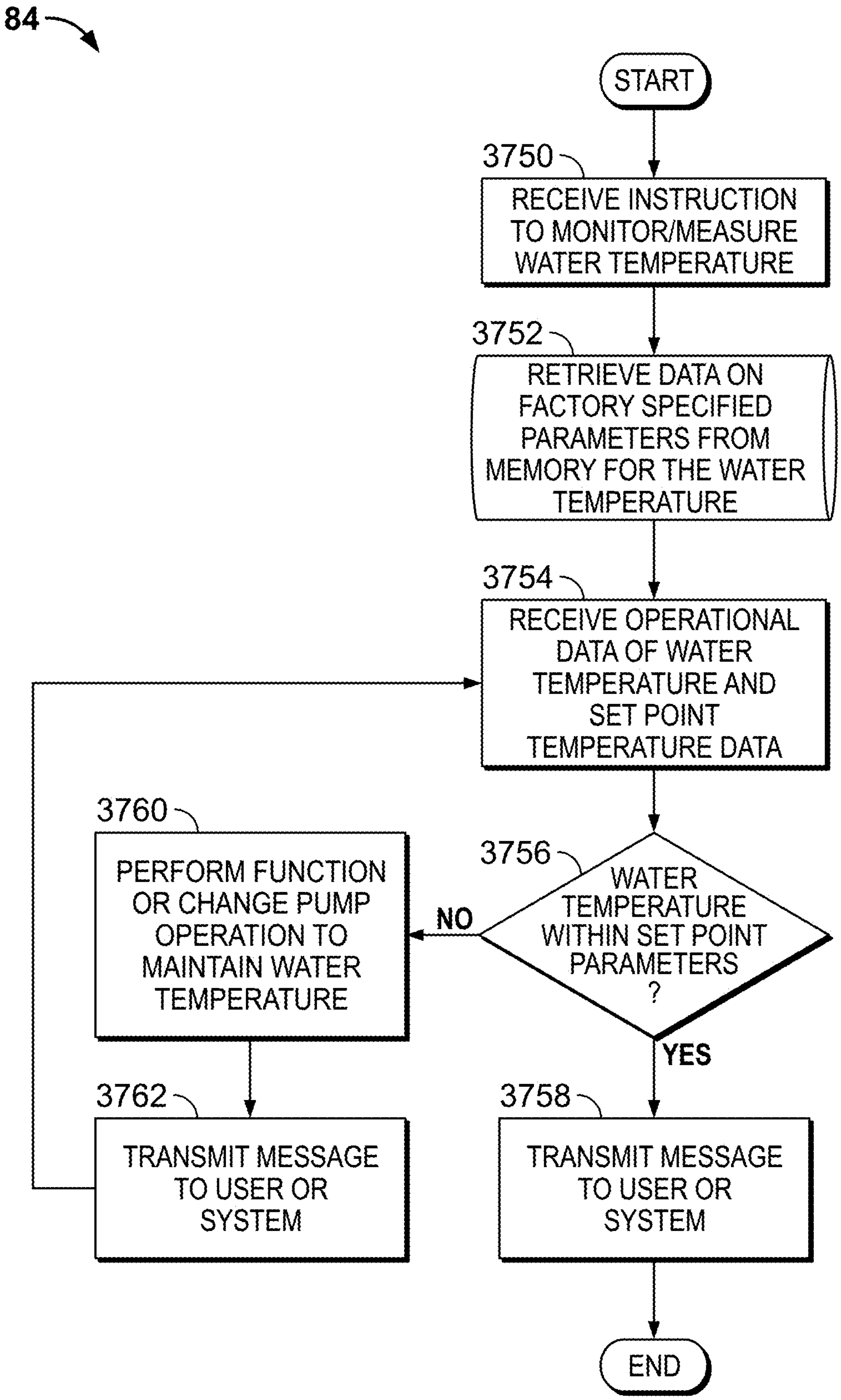

FIG. 19K is another flowchart illustrating processing logic of the pump control logic 84. In step 3750, the pump control logic 84 receives an instruction to monitor or measure the water temperature. In step 3752, the pump control logic 84 retrieves data on the factory specified parameters from memory for the water temperature. In step 3754, the pump control logic 84 receives operational data of water temperature and set point temperature data. In step 3756, the pump control logic 84 determines whether the water temperature is within the set point and/or factory parameters. If a positive determination is made, the pump control logic 84 proceeds to step 3758 where the pump control logic 84 transmits a message to the user that the water temperature is within the factory specified or set point parameters and the process would end thereafter. If a negative determination is made, the pump control logic 84 proceeds to step 3760 where the pump control logic 84 performs a function or changes the pump operation to maintain a factory or set point water temperature. In step 3762, the pump control logic 84 transmits a message to the user or the system that the pump control logic 84 has performed some function or changed the pump operation to maintain a factory or set point water temperature.

Figure 19L:
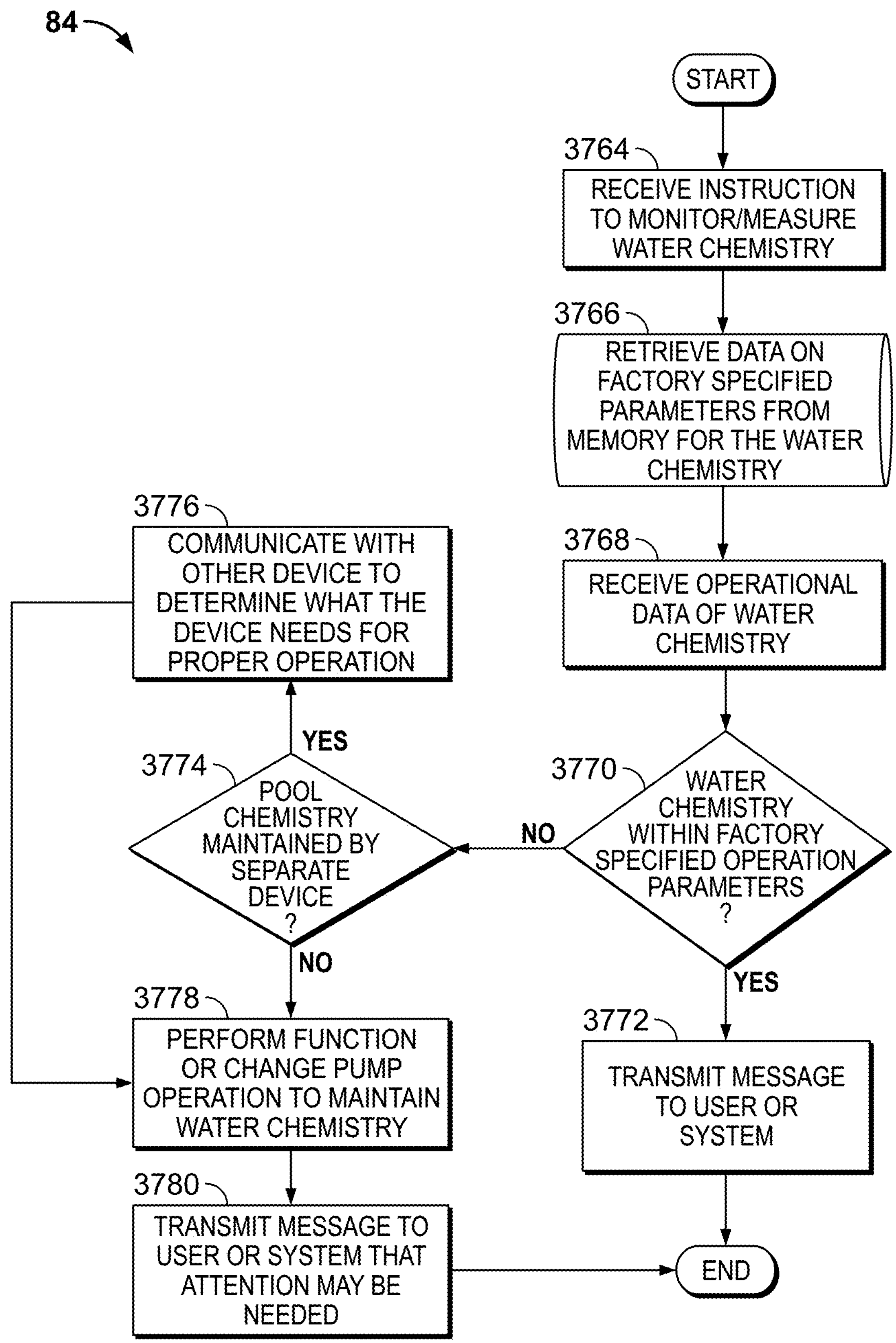

FIG. 19L is another flowchart illustrating the processing logic of the pump control logic 84. In step 3764, the pump control logic 84 receives an instruction to monitor or measure the water chemistry. In step 3766, the pump control logic 84 retrieves data on factory specified parameters from memory for the water chemistry. In step 3768, the pump control logic 84 receives operation data regarding the water chemistry. In step 3770, the pump control logic 84 determines whether the water chemistry is within factory specified operating parameters. If a positive determination is made, the pump control logic 84 proceeds to step 3772 where the pump control logic 84 transmits a message to the user that the water chemistry is within the specified operating parameters. If a negative determination is made, the pump control logic 84 proceeds to step 3774 where the pump control logic 84 determines whether the pool chemistry is maintained by a separate device. If a positive determination is made, the pump control logic 84 proceeds to step 3776 where the pump control logic 84 communicates with the other device to determine what the device needs for proper operation. If a negative determination is made, the pump control logic 84 proceeds to step 3778 directly or after step 3776. In step 3778, the pump control logic 84 performs a function or changes operation of the pump to maintain the proper water chemistry based on the step 3776 or the set point parameters retrieved from memory. In step 3780, the pump control logic 84 transmits a message to the user or the system that attention may be needed regarding the water chemistry.

Figure 19M:
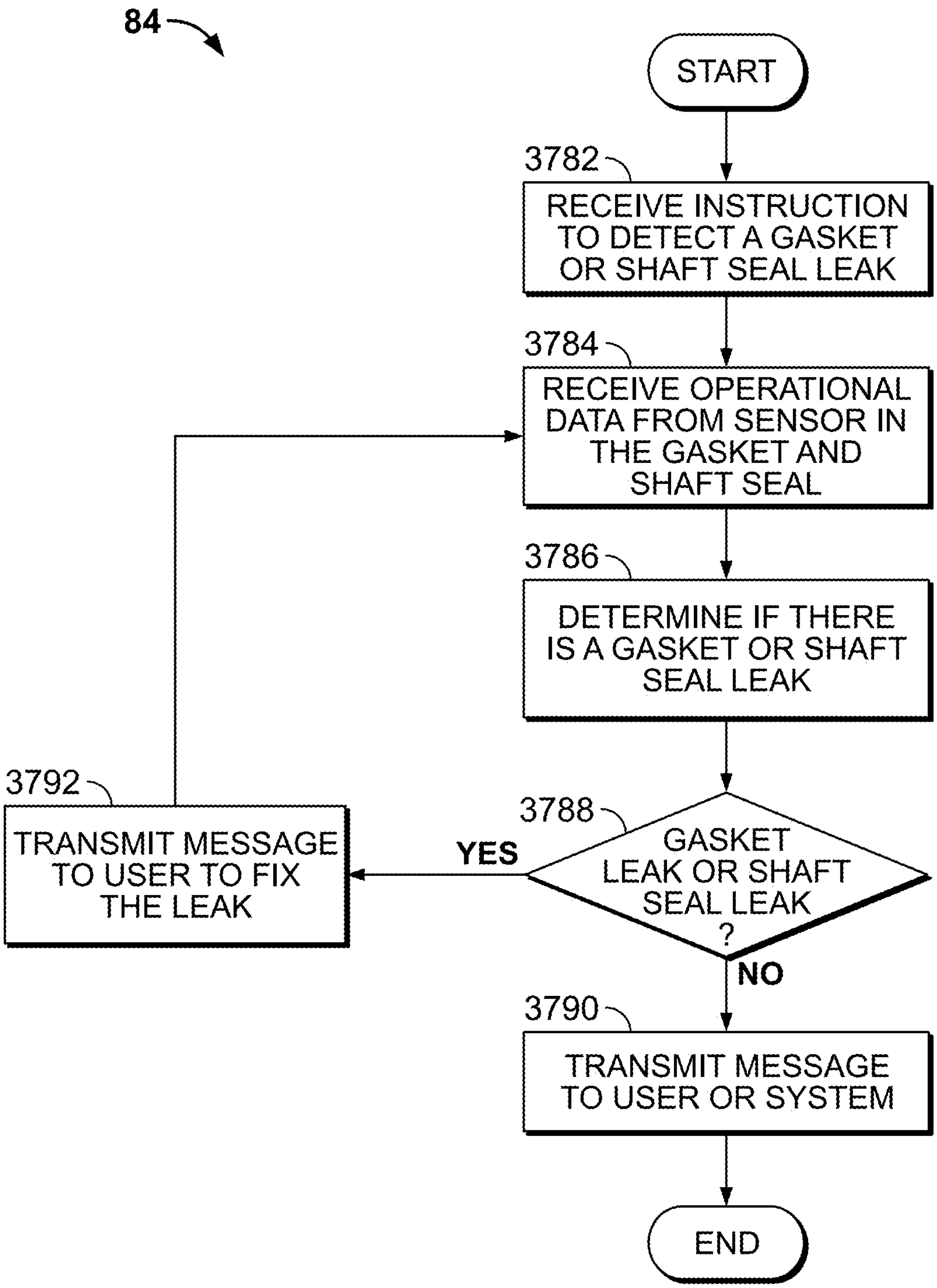

FIG. 19M is another flowchart illustrating the processing logic of the pump control logic 84. In step 3782, the pump control logic 84 receives an instruction to detect a gasket leak or a shaft seal leak. In step 3784, the pump control logic 84 receives operational data from a sensor in the gasket or shaft seal. In step 3786, the pump control logic 84 determines if there is a gasket or shaft seal leak. In step 3788, the determination is made whether there is in fact a gasket or shaft seal leak. If a negative determination is made, the pump control logic 84 proceeds to step 3790 and will transmit a message to the user or system that there is no leak. If a positive determination is made, the pump control logic 84 will transmit a message in step 3792 that the user should fix the leak.

Figure 19N:
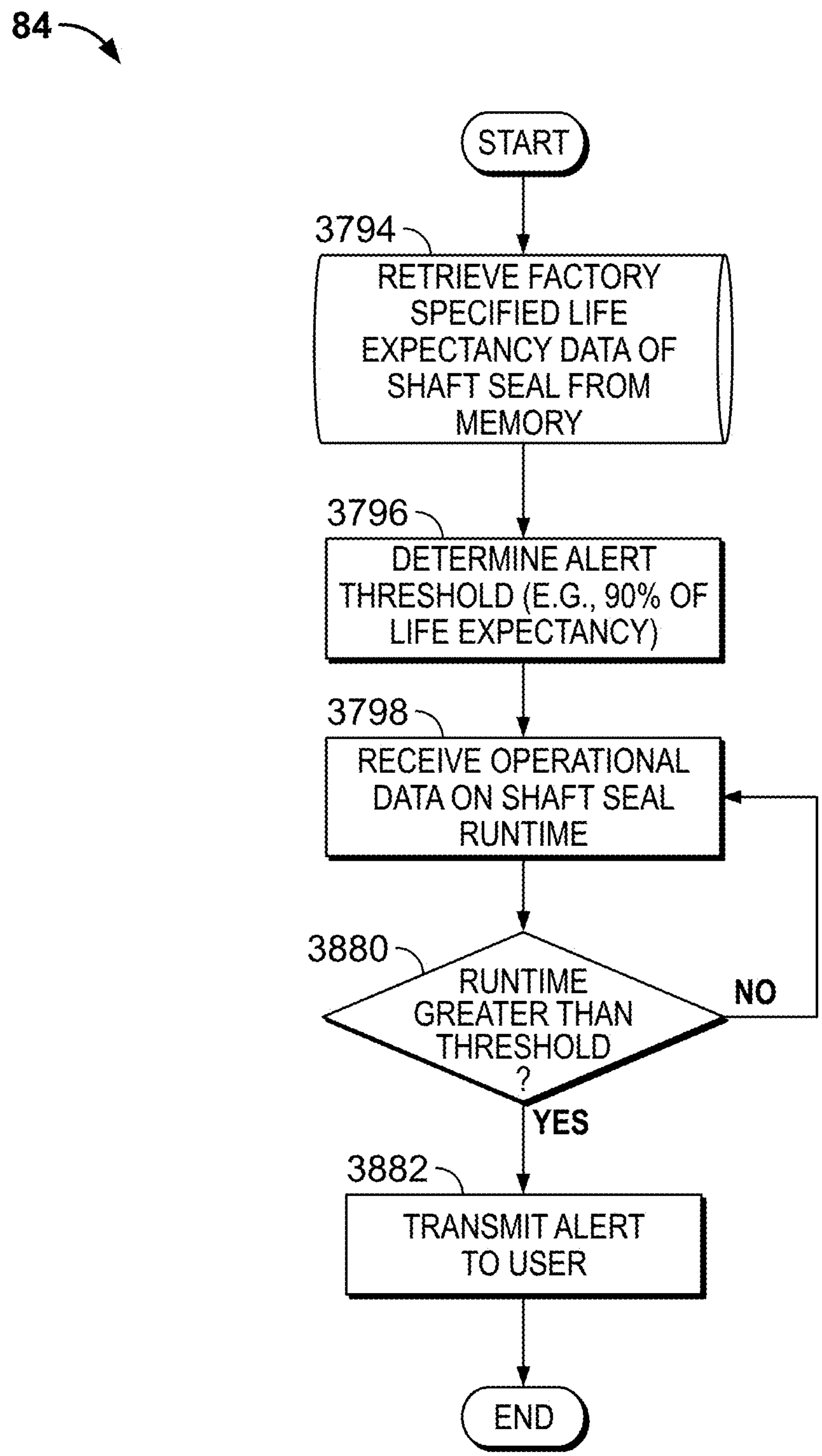

FIG. 19N is another flowchart illustrating the processing logic of the pump control logic 84. In step 3794, the pump control logic 84 retrieves factory specified life expectancy data of the shaft seal from memory. In step 3796, the pump control logic 84 determines the alert threshold for the life expectancy of the shaft seal. For example, a 90% threshold will alert the user when 90% of the life expectancy of the shaft seal is reached. In step 3798, the pump control logic 84 will receive operational data on the shaft seal runtime. In step 3880, the pump control logic 84 will determine whether the runtime is greater than the threshold with regard to the life expectancy data. If a negative determination is made, the pump control logic 84 will go back to step 3798. If a positive determination is made, the pump control logic 84 will proceed to step 3882 and transmit a message to the user regarding the remaining shaft seal shelf life so that the user can proactively address the shaft seal before a leak occurs.

Figure 19O:
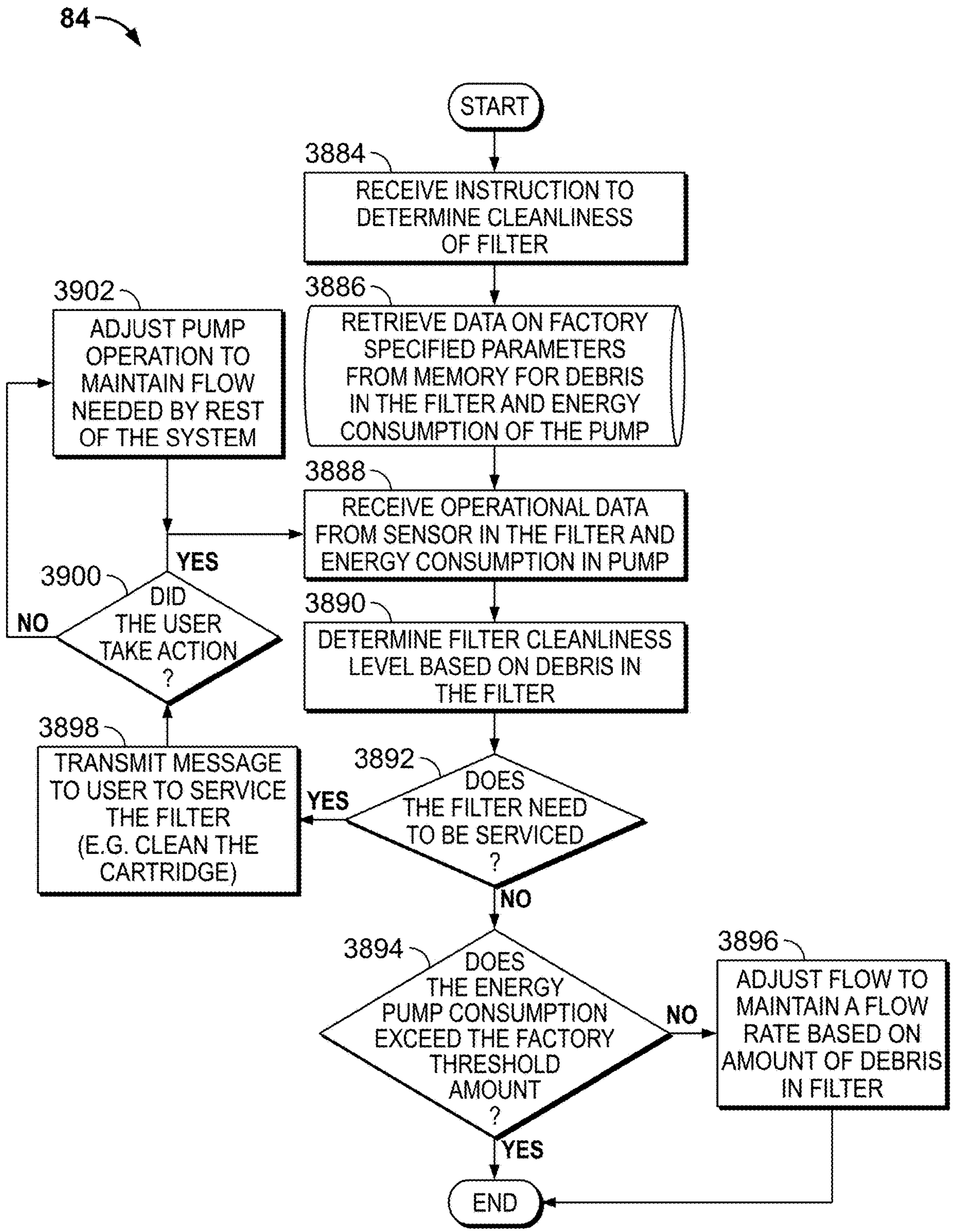

FIG. 19O is another flowchart illustrating the processing logic of the pump control logic 84. In step 3884, the pump control logic 84 receives an instruction to determine the cleanliness of the filter. In step 3886, the pump control logic 84 retrieves data on the factory specified parameters from memory for debris in the filter and energy consumption of the pump. In step 3888, the pump control logic 84 receives operational data from the sensors in the filter and energy consumption in the pump. In step 3890, the pump control logic 84 determines the cleanliness of the filter based on the debris in the filter. In step 3892, the pump control logic 84 makes a determination as to whether the filter needs to be serviced. If a negative determination is made, the pump control logic 84 in step 3894 will determine if the energy consumption of the pump exceeds a factory or user set threshold, and if it does, the process ends and if it does not, then in step 3896, the pump control logic 84 can adjust the flow to maintain a flow rate based on the amount of debris in the filter. If a positive determination is made in step 3892, the pump control logic 84 in step 3898 will transmit a message to the user or system to service the filter (e.g., clean the cartridge). In step 3900, the pump control logic 84 will determine whether the user took action to service the filter. If a negative determination is made, the pump control logic 84 will proceed to step 3902 to adjust the pump operation to maintain a flow rate needed by the rest of the system 10. If a positive determination is made, the pump control logic 84 will skip step 3902 and will proceed directly back to step 3888.

Figure 19P:
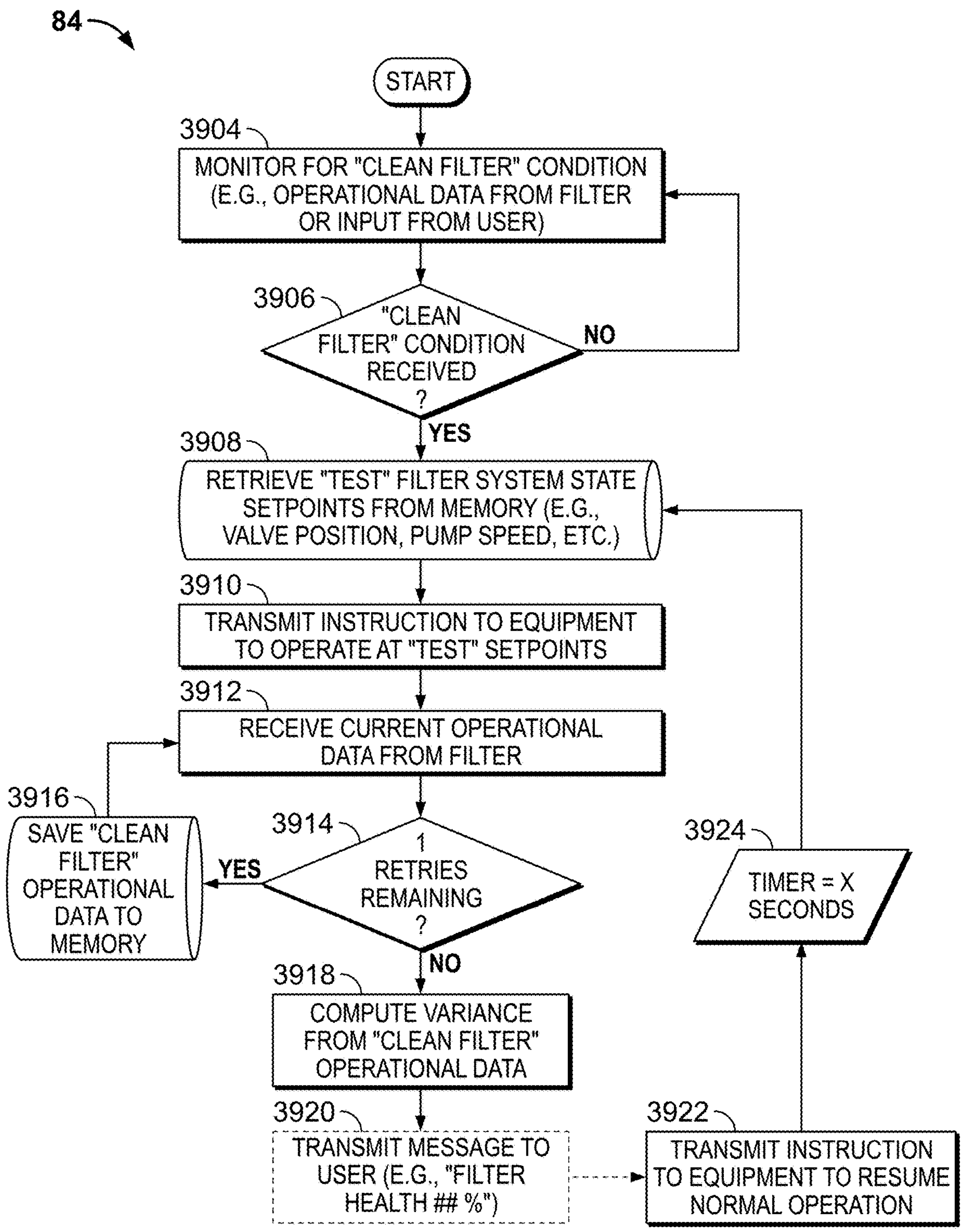

FIG. 19P is a flowchart illustrating processing steps carried out by the pump control logic 84 for periodically testing and advising the user of the variance from a "clean filter" state. For example, pump control logic 84 can periodically enter a "test" filter system state where the pool/spa equipment go to predetermined positions/states/speeds for testing the filter. In step 3904, pump control logic 84 monitors for a "clean filter" condition (e.g., operational data from filter or input from a user, servicer, or installer, etc.). For example, a skimmer could communicate (using and of the data communication protocols disclosed herein) to pump control logic 84 that the filter has been cleaned or replaced, or the user could utilize an input device to indicate to pump control logic 84 that the filter has been cleaned or replaced. In step 3906, pump control logic 84 determines if a "clean filter" condition has been received. If a negative determination is made in step 3906, pump control logic 84 returns to step 3904. If a positive determination is made in step 3906, pump control logic 84 proceeds to step 3908, where pump control logic 84 retrieves "test" filter system state setpoints (e.g., valve position, pump speed, etc.) from the memory. In step 3910, pump control logic 84 transmits an instruction to the installed pool/spa equipment to operate at the "test" setpoints. In step 3912, pump control logic 84 receives current operational date from the filter. In step 3914, pump control logic 84 determines if there are (1) retries remaining. If a positive determination is made in step 3914, pump control logic 84 proceeds to step 3916 and saved the "clean filter" operational data to the memory. Thus, after pump control logic 84 receives a "clean filter" condition, the pool/spa equipment enters a "test" system state and records the current operational data from the filter to the memory as a baseline measurement for future comparison. If a negative determination is made in step 3914, pump control logic 84 proceeds to step 3918, where pump control logic 84 computes the variance from the "clean filter" operational data. Optionally, in step 3920, pump control logic 84 could transmit a message to (e.g., advise) the user (e.g., "Filter Health ## %). In step 3922, pump control logic 84 transmits instructions to the installed pool/spa equipment to resume normal operation. In step 3924, the logic is delayed for X seconds, wherein X is any suitable integer (e.g., 5, 10, 3600, etc.), and the process then reverts to step 3908.

Figure 19Q:
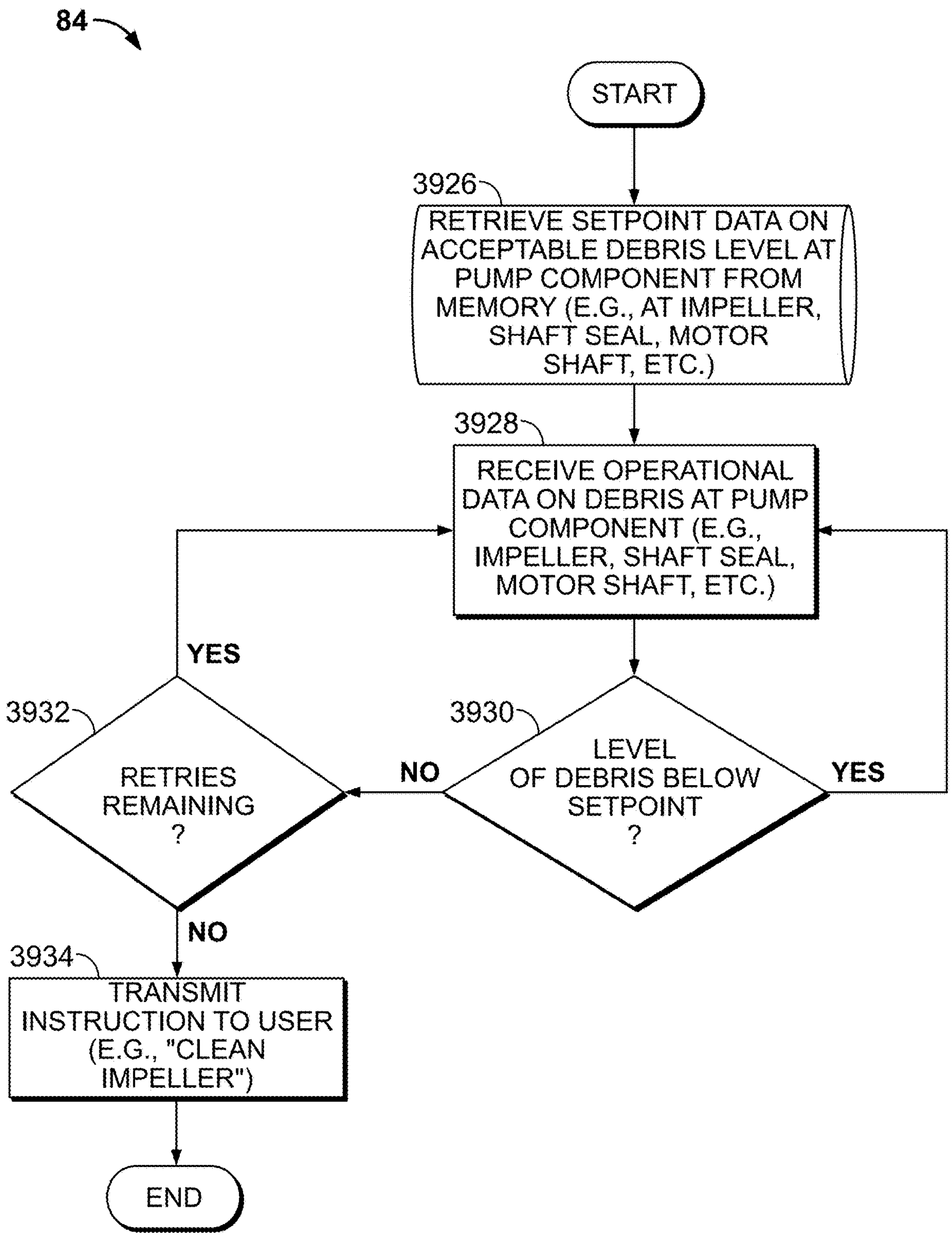

FIG. 19Q is a flowchart illustrating processing steps carried out by the pump control logic 84 for determining if debris is interfering with operation of the pump. For example, in step 3926, pump control logic 84 retrieves setpoint data on the acceptable debris level at a pump component(s) from memory. This setpoint data could be provided by the pump manufacturer, or alternatively, could be set by the user. In step 3928, pump control logic 84 receives operational data on debris at the pump component(s). It is noted that the pump control logic could monitor one or more individual components (e.g., the impeller, shaft seal, and motor shaft) of the pump and could further monitor one or more parameters associated with each component (e.g., the level of debris in the impeller and/or rotational speed of the impeller). For example, pump control logic 84 could determine if there is debris trapped in the impeller by monitoring motor current, motor power consumption, or by using an accelerometer to determine an increase in motor vibration. In step 3930, pump control logic 84 determines if the level of debris at the pump component(s) is below the setpoint. If a positive determination is made in step 3930, pump control logic 84 returns to step 3928. If a negative determination is made in step 3930, pump control logic 84 proceeds to step 3932, where pump control logic 84 determines if there are retries remaining. If a positive determination is made in step 3932, pump control logic 84 returns to step 3928. If a negative determination is made in step 3932, pump control logic 84 proceeds to step 3934, where pump control logic 84 transmits an instruction to the user (e.g., "Clean Impeller"). While the foregoing process has been discussed in terms of monitoring debris, it is also contemplated that pump control logic 84 can monitor additional parameters and alert the user when these parameters have exceeded their respective setpoints using similar processing steps. For example, in addition to monitoring the level of debris trapped in the impeller, discussed above, pump control logic 84 could also monitor rotational speeds of the components, determine whether debris is causing physical interference with the rotation of the impeller, shaft seal, or motor shaft, and then transmit an instruction to the user to address the issue (e.g., "Binding in Impeller—Clear Debris"). For example, pump control logic 84 could monitor motor current, power consumption, and receive operational data from an accelerometer to determine an increase in motor vibration (thereby indicating physical interference/binding of the impeller). Further still, instead of alerting the user when an operational parameter has exceeded its respective operational setpoint, pump control logic 84 could alter the operation of the pump to restore normal operation. For example, in the case of a variable speed drive, pump control logic 84 could monitor the humidity of the air inside the variable speed drive enclosure and adjust its operating condition to minimize humidity, thereby increasing reliability. For example, pump control logic 84 could receive operational data from a humidity sensor located within the variable speed drive enclosure. If pump control logic 84 determines that the humidity within the variable speed drive enclosure is above a maximum setpoint value, pump control logic 84 could transmit an instruction to the variable speed drive to increase the speed of operation, thereby drying out the air within the enclosure (due to increased temperature of certain electrical components within the enclosure precipitated by the increase in operating speed).

Figure 19R:
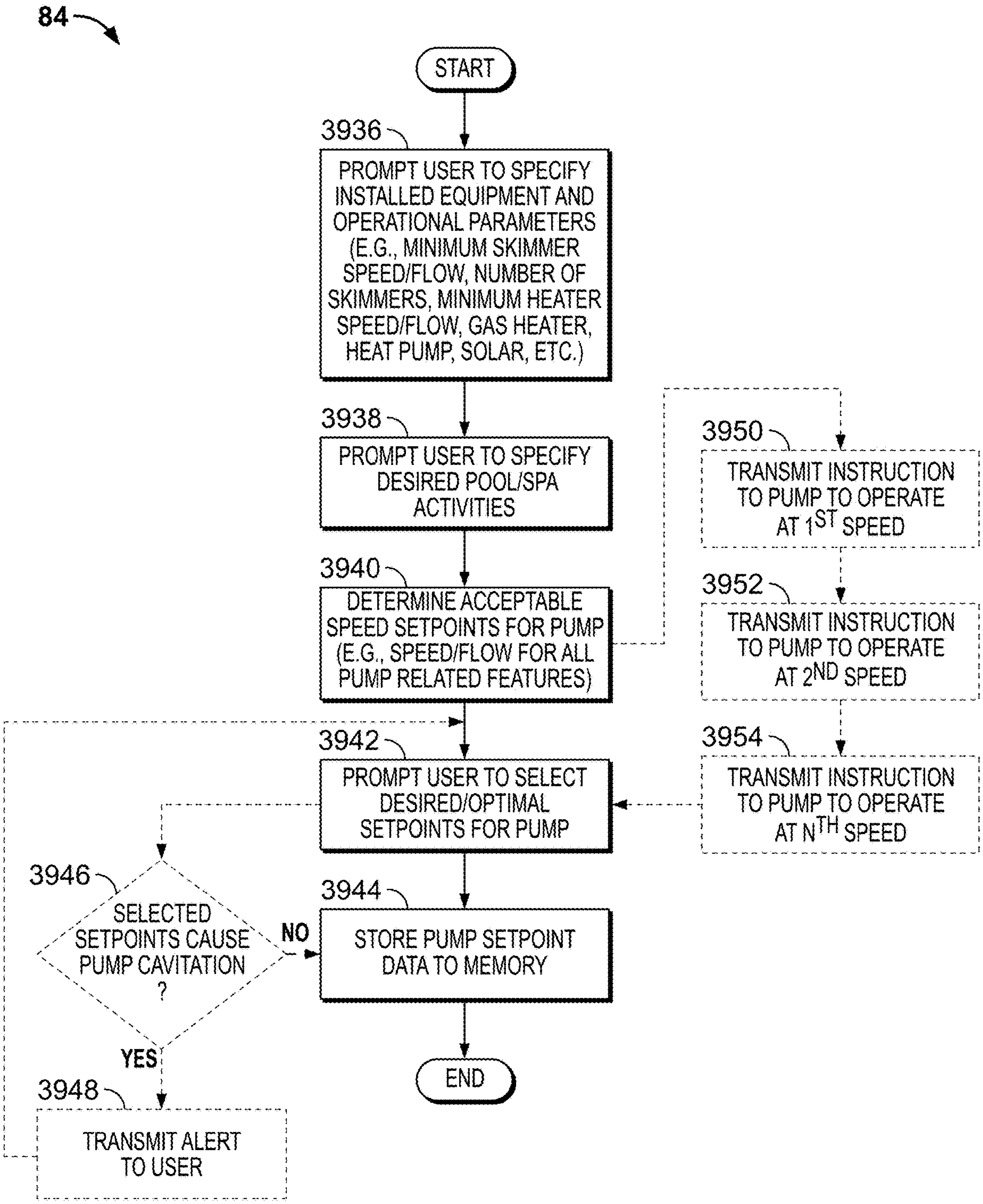
Figure 19S:
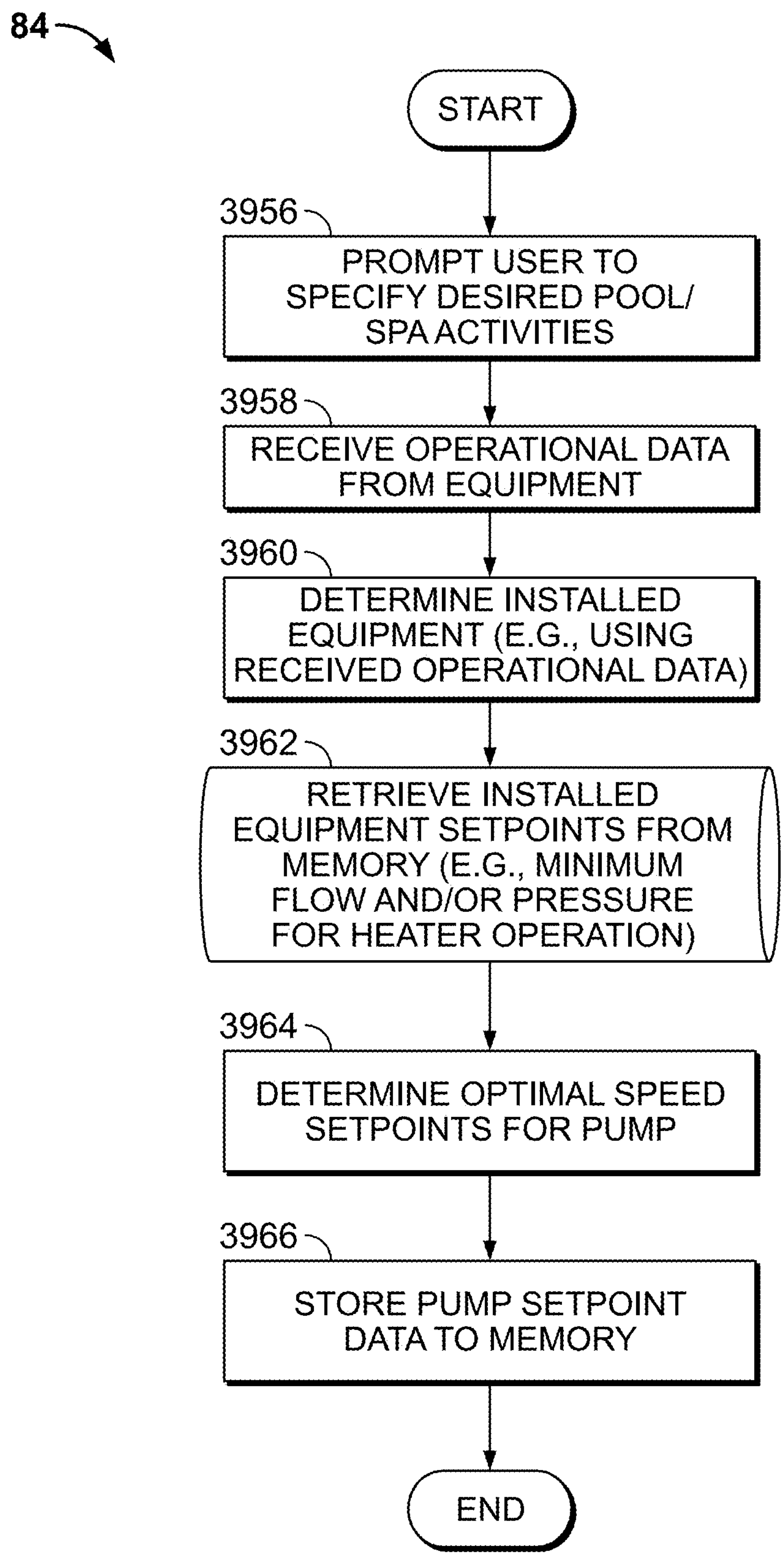

FIGS. 19R and 19S are flowcharts illustrating processing steps carried out by the pump control logic 84 for assisting the user in determining the pump setpoints that should be used based on the user's installed equipment and preferences. It is contemplated that pump control logic 84 could include a wizard-based application that is accessible by the user via a human machine interface installed on the pump, centralized pool/spa control system, smartphone/device, web browser, or any other means for communicating with the system, disclosed herein. For example, in step 3936, pump control logic 84 prompts the user to specify installed pool/spa equipment and operational parameters therefore (e.g., minimum skimmer speed/flow, number of skimmers, minimum heater speed/flow, has heater, heat pump, solar, etc.). Alternatively, the application could utilize widely-known bar scanning technology (e.g., utilizing/in combination with a camera of smart device), enabling the user to simply scan the barcode of each piece of installed equipment thereby avoiding the necessity of manual entry. Pump control logic 84 could then retrieve additional information (e.g., specifications, setpoints, warranty information, etc.) on the scanned equipment from a remote location (e.g., a remote server) using any suitable communication protocol described herein (e.g., accessing the internet vial a home WiFi router). In step 3938, pump control logic 84 prompts the user to specify the desired pool/spa activities (e.g., bathing, swimming, water sports, etc.). For example, pump control logic 84 could present the user with a list of pre-programmed activities from which to choose, the user could search a database of pre-programmed activities, or the user could program custom activities and save the same to memory for later retrieval and use. In step 3940, pump control logic 84 determines an acceptable range of speed setpoints for the pump (e.g., speed/flow for all pump related features). In step 3942, pump control logic 84 presents the acceptable speed presets to the user and then prompts the user to select desired/optimal setpoints for the pump and in step 3944, pump control logic 84 stores the user selected pump setpoints to memory and the process then ends. Optionally, as shown in steps 3950-3954, the wizard could assist the user in selecting the desired/optimal pump setpoints by stepping through multiple actual pump speeds/flows so that the user can "choose" a desired speed/flow while observing the effect of the different speeds/flows on the actual pool/spa environment. For example, after determining the acceptable speed setpoints for the pump in step 3940, pump control logic 84 could then proceed to step 3950, where an instruction is transmitted to the pump to operate at an (acceptable) first ($1^{st}$) speed. In step 3952, pump control logic 84 transmits an instruction to the pump to operate at an (acceptable) second ($2^{nd}$) speed. In step 3954, pump control logic 84 transmits an instruction to operate the pump at another (acceptable) speed. Pump control logic 84 then proceeds to step 3942, described hereinabove. It is noted that any number of acceptable speeds can be presented to the user. Accordingly, because the application could be run, viewed, or accessed on a mobile device (e.g., not tethered to a specific location) the wizard/application enables the user to stand poolside, watching features as speeds/flows are automatically displayed by pump control logic 84 or selected by the user/installer for each prompt. The wizard/application also enables the user/installer to stand at the equipment pad, watching equipment function (e.g., heater ignition) as the pump steps through various speeds/flows. Optionally, as shown in steps 3946 and 3948, pump control logic 84 could sense and/or advise of a maximum speed/flow beyond which the pump cavitates or reaches an undesirable inflection point in energy consumption/efficiency. For example, pump control logic 84 could determine the maximum speed/flow beyond which the pump cavitates using operational data received from an accelerometer, optical sensor, or other means. In step 3946, pump control logic 84 determines if the user selected setpoints are causing pump cavitation. If a negative determination is made in step 3946, pump control logic 84 proceeds to step 3944, discussed hereinabove. If a positive determination is made in step 3946, pump control logic 84 proceeds to step 3948, where an alert is transmitted to the user. Alternatively, the system could determine speeds at which the pump cavitates beforehand and remove the speeds at which the pump cavitates from the acceptable setpoints that are presented to the user in step 3942. Also optionally, pump control logic 84 could suggest to the user alternative modes of operation (e.g., other than that selected by the user) that either improve the reliability of one or more pieces of installed pool/spa equipment, or improve the efficiency of one or more pieces of installed pool/spa equipment, individually, or as a whole system. For example, other pieces of installed pool/spa equipment could communicate with the pump control logic 84 and advise of optimum performance criteria. This logic could reside in other installed pool/spa equipment and be communicated to the pump, or the logic could be contained within the pump itself.

FIG. 19S is a flowchart illustrating processing steps carried out by the pump control logic 84 for automatically determining the pump setpoints that should be used based on the user's installed equipment and preferences. According to this embodiment, pump control logic 84 is able to "auto detect" equipment that is installed and automatically determine how the system should be run based on a variety of optimization choices (e.g., energy consumption, water feature performance, heating preferences, etc.). In step 3956, pump control logic 84 prompts the user to specify desired pool/spa activities (e.g., bathing, swimming, water sports, etc.). As described above, pump control logic 84 could present the user with a list of pre-programmed activities from which to choose, the user could search a database of pre-programmed activities, or the user could program custom activities and save the same to memory for later retrieval and use. In step 3958, pump control logic 84 receives operational data from pool/spa equipment. In step 3960, pump control logic 84 determines what pool/equipment has been installed, using the received operational data therefrom. In step 3962, pump control logic 84 retrieves the installed equipment setpoints (e.g., minimum flow and/or pressure for heater operation) from memory. Using the equipment setpoints, in step 3964, pump control logic 84 then determines the optimal speed setpoints for the pump based on all of the installed equipment. For example, pump control logic 84 could estimate the necessary pump speed. Alternatively, pump control logic 84 could step through various speeds/flows and receive operational data from the installed equipment (e.g., heaters, water features, valves, etc.) when there is sufficient flow and/or pressure for operation. Pump control logic 84 then proceeds to step 3966, where pump control logic 84 stores the pump setpoint data to memory, and then the process ends. It is also contemplated that, in addition to pump speed, pump control logic 84 could capture the correct valve positions for delivering the required flow and/or pressure. Pump control logic 84 could also search for signals from any smart utility, radio frequency, WiFi, cellular, Bluetooth, geo-positioning, etc. that provides data for energy costs, energy discount periods, peak demand, etc. (see FIG. 33T). Pump control logic 84 could then use this data to optimize performance and/or energy costs.

In addition to the foregoing, the application/wizard could walk the user through multiple steps for different installation modes, such as relay control or connection to pool/spa automation controllers (e.g., Hayward automation), and could indicate supported software levels of the pool/spa automation controllers. The application could also access dealer-defined programs/schedules via the cloud and then download the programs/scheduled to the pump for local installation. Although pump control logic 84 could operate according to a dealer-defined or user-defined schedule, pump control logic 84 is capable of determining when pool/spa equipment requires a flow that deviates from the normal schedule (e.g., due to user interaction, weather patterns, addition of pool/spa equipment, etc.) and automatically adjusting the pump flow/speed therefore. The application could further provide the user/installer with answers to frequently asked questions (i.e., FAQs) for the installation process as well as for individual pieces of pool/spa equipment, installation videos (either stored locally or as links accessible through communication protocols discussed herein), and can serve as a dynamic "quick start guide." Pump control logic 84 could also serve as an Automated Engineered pool system solution for areas having regulations, such as in Florida (e.g., reports and/or calculates total dynamic head and/or flow). As described herein, an "Automated Engineered" pool system solution is one that automatically derives Total Dynamic Head ("TDH") by measuring key metrics. For example, it could measure suction head (negative pressure) on the vacuum side of the pump and measure the pressure head on the pressure side of pump, both measurement devices being integral or adjacent to the pump, to derive Total Dynamic Head. Further, an overall System Curve (TDH vs. flow) could be estimated or calculated from a single point or generated when measured at multiple speeds when using a multi-speed pump.

Figure 19T:
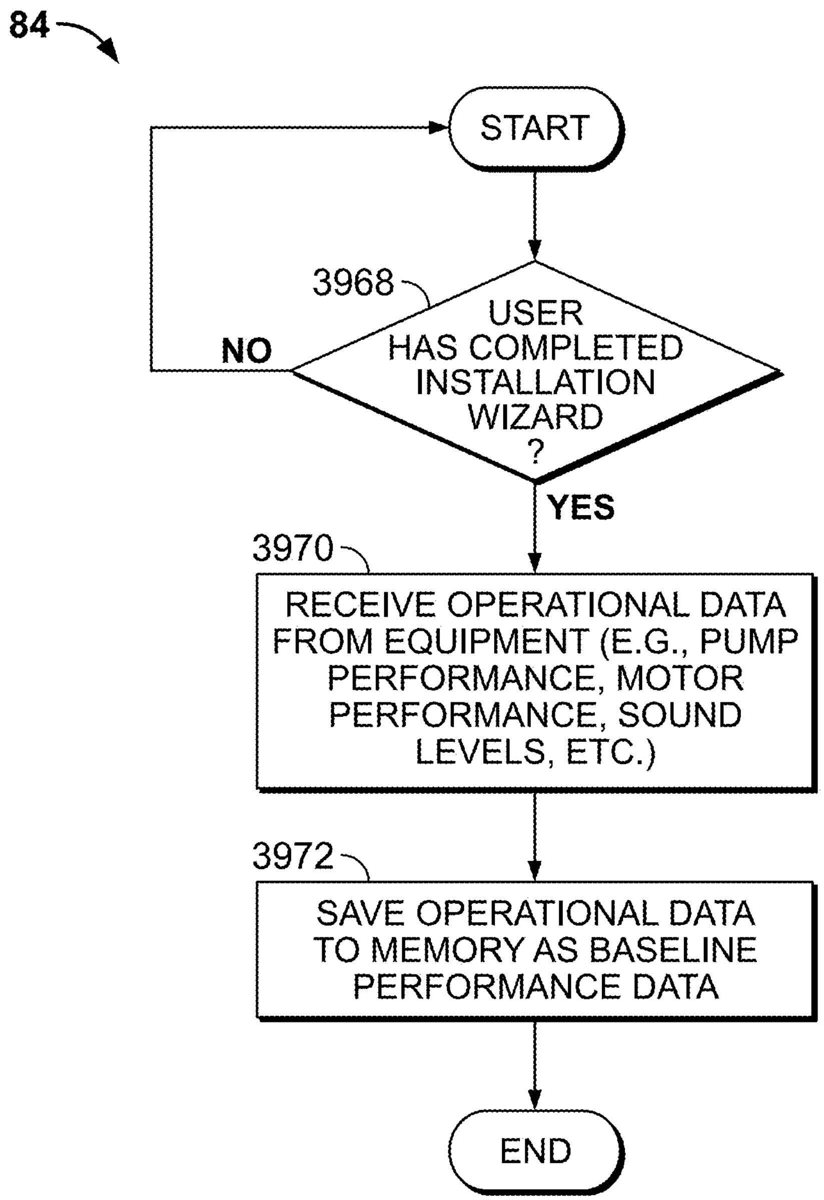

FIG. 19T is a flowchart illustrating processing steps carried out by the pump control logic 84 for recording baseline performance data for future reference. More specifically, once the initial installation of the pool equipment is complete (see FIGS. 19R and 19S), pump control logic 84 can record initial operational data from the installed equipment. For example, in step 3968, pump control logic 84 determines if the user has completed the installation wizard (see FIGS. 19R and 19S). If a negative determination is made in step 3968, pump control logic 84 repeats step 3968. If a positive determination is made in step 3968, pump control logic 84 proceeds to step 3970, where pump control logic 84 receives operational data from installed pool/spa equipment (e.g., pump performance, motor performance, sound levels, etc.). In step 3972, pump control logic 84 saves the operational data to the memory as baseline performance data. This baseline performance data could be used, for example, in combination with the health monitoring pump control logic 84 processing steps shown in FIG. 19D or as illustrated in FIG. 19U, discussed hereinbelow.

Figure 19U:
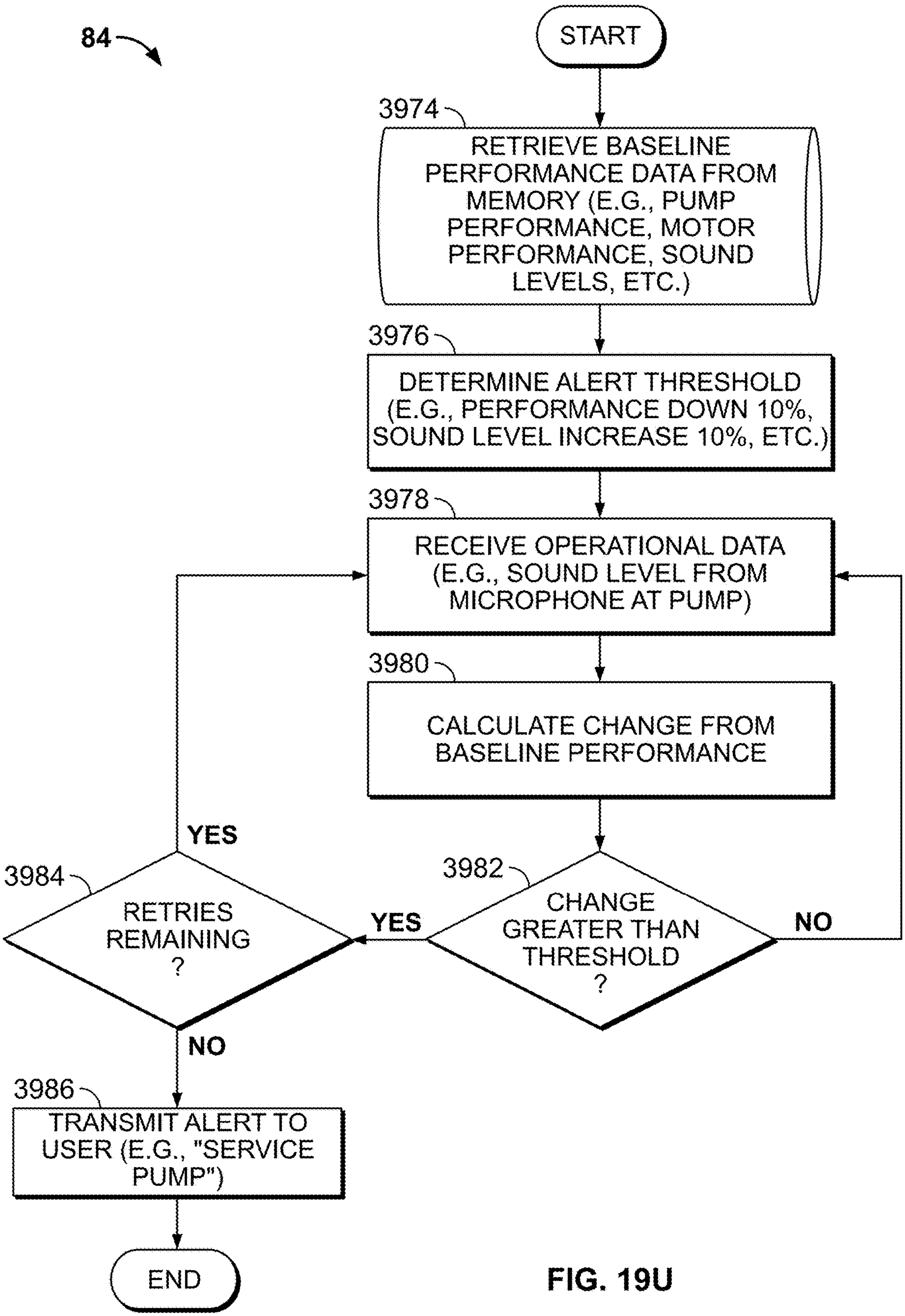

FIG. 19U is a flowchart illustrating processing steps carried out by the pump control logic 84 for determining pump health by comparing baseline performance data and current operational data. In step 3974, pump control logic 84 retrieves baseline performance data (e.g., pump performance, motor performance, sound levels, etc.) from the memory. In step 3976, pump control logic 84 determines an alert threshold (e.g., performance down 10%, sound level increase 10%, etc.). In step 3978, pump control logic 84 receives current operational data from the installed pool/spa equipment and/or other connected devices (e.g., sound level from microphone located at the pump). In step 3980, pump control logic 84 calculates the change (e.g., delta) from the baseline performance data. In step 3982, pump control logic 84 determines if the change from baseline performance is greater than the threshold. If a negative determination is made in step 3982, pump control logic 84 returns to step 3978. If a positive determination is made in step 3982, pump control logic 84 proceeds to step 3984, where pump control logic 84 determines if there are retries remaining. If a positive determination is made in step 3984, pump control logic 84 returns to step 3978. If a negative determination is made in step 3984, pump control logic 84 proceeds to step 3986, where an alert is transmitted to the user (e.g., "Service Pump"). The process then ends.

Figure 19V:
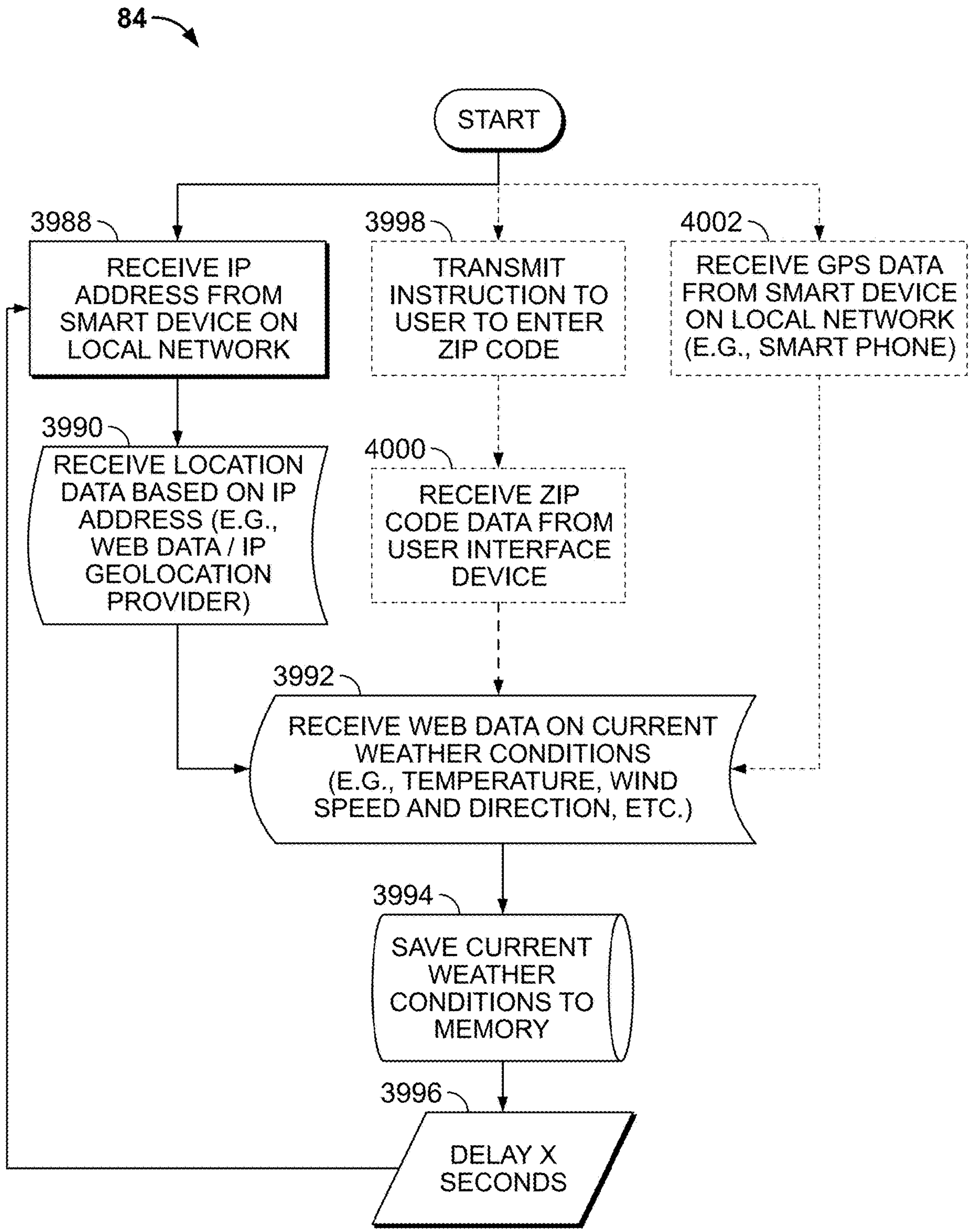

FIG. 19V is a flowchart illustrating processing steps carried out by the pump control logic 84 for determining current weather conditions. In step 3988, pump control logic 84 receives an IP address from a smart device on a local network. In step 3990, pump control logic 84 receives location data based on the IP address (e.g., web data/geolocation provider). In step 3992, pump control logic 84 receives web data on current weather conditions (based on ZIP code, location/address, or GPS coordinates, discussed hereinbelow). It is noted that pump control logic 84 can receive web data through any wired and/or wireless communication protocols disclosed herein. Current weather conditions can include, for example, temperature, precipitation, wind speed, wind direction, etc. Web data on current weather conditions could also include live 3$^{rd}$ party data, for example, live weather maps of precipitation and cloud cover. In step 3994, pool pump control logic 84 saves the current weather conditions to the memory for later retrieval. In step 3996, pump control logic 84 is delayed by X seconds, wherein X is any suitable integer (e.g., 5, 10, 3600, etc.) and then the process returns to step 3988. Optionally, in step 3998, pump control logic 84 could transmit an instruction to the user to enter a ZIP code via a user interface device and in step 4000, pump control logic 84 could receive the ZIP code data from the user interface device. In step 4002, pump control logic 84 could also/alternatively receive GPS data from a smart device on the local network (e.g., smart phone connected to home WiFi). While the foregoing is discussed in connection with pump control logic 84 obtaining current weather information from a remote source (e.g., the internet), it is contemplated that pump control logic 84 could obtain current weather information from local sources as well (e.g., receive operational data from local temperature sensors/thermocouples, wind meters/anemometers, rain gauges/ombrometers, etc.).

Figure 19W:
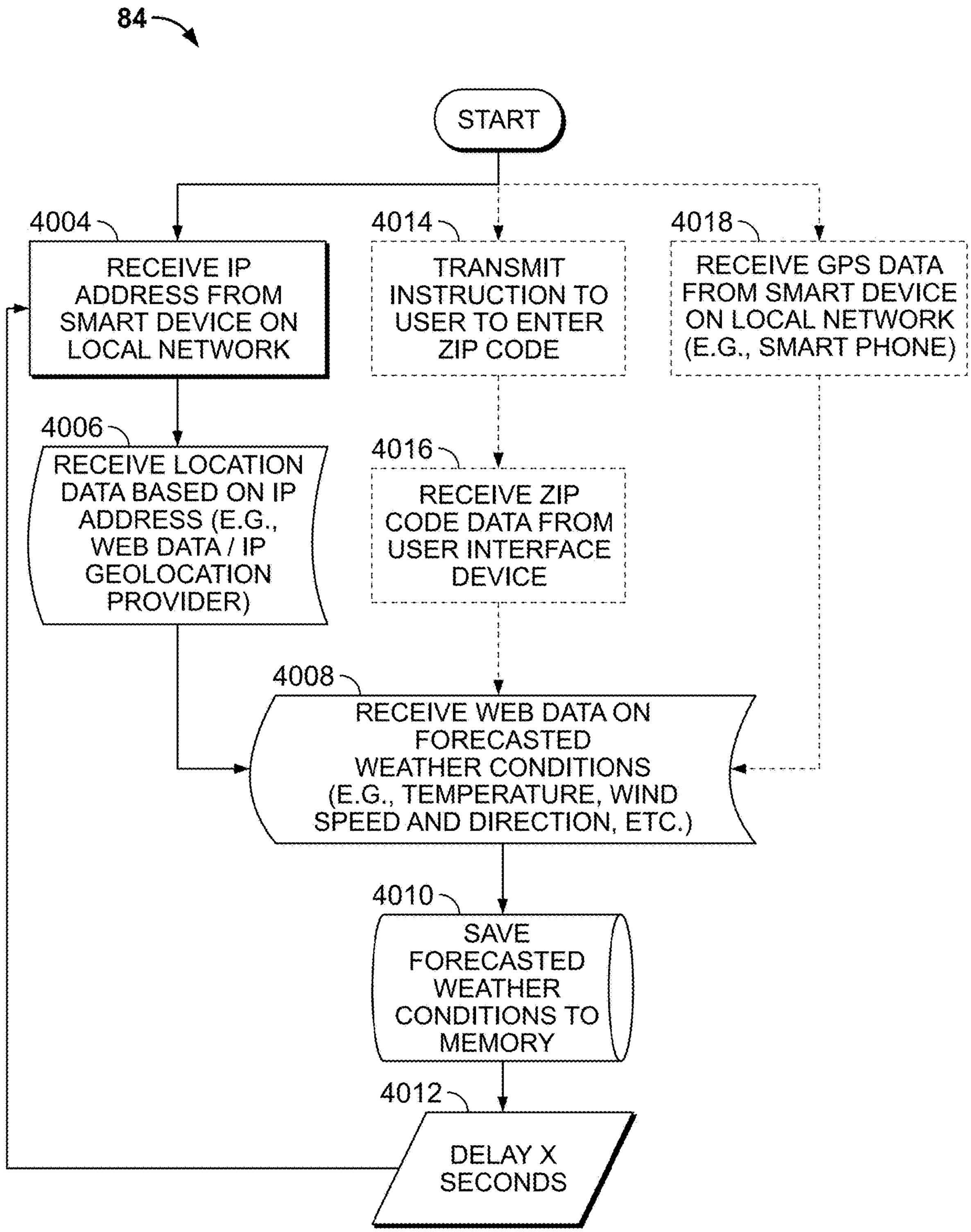

Pump control logic 84 can receive web data on future/forecasted weather conditions (e.g., 7-day forecasts, almanacs, etc.), in addition to current weather forecasts. FIG. 19W is a flowchart illustrating processing steps carried out by the pump control logic 84 for determining forecasted weather conditions. Although the processing steps shown in FIGS. 19V and 19W are discussed sequentially, it should be understood that the processing steps carried out by pump control logic 84 in FIGS. 19V and 19W could operate in parallel, or alternatively, in series with each other. In step 4004, pump control logic 84 receives an IP address from a smart device on a local network. In step 4006, pump control logic 84 receives location data based on the IP address (e.g., web data/geolocation provider). In step 4008, pump control logic 84 receives web data on forecasted weather conditions (based on ZIP code, location/address, or GPS coordinates, discussed hereinbelow). It is noted that pump control logic 84 can access receive web data through any wired and/or wireless communication protocols disclosed herein. Forecasted weather conditions can include, for example, temperature, precipitation, wind speed, wind direction, etc. Web data on forecasted weather conditions could also include live 3$^{rd}$ party data, for example, live weather maps of precipitation and cloud cover. In step 4010, pool pump control logic 84 saves the forecasted weather conditions to the memory for later retrieval. In step 4012, pump control logic 84 is delayed by X seconds, wherein X is any suitable integer (e.g., 5, 10, 3600, etc.) and then the process returns to step 4004. Optionally, in step 4014, pump control logic 84 could transmit an instruction to the user to enter a ZIP code via a user interface device and in step 4016, pump control logic 84 could receive the ZIP code data from the user interface device. In step 4018, pump control logic 84 could also/alternatively receive GPS data from a smart device on the local network (e.g., smart phone connected to home WiFi).

Figure 19X:
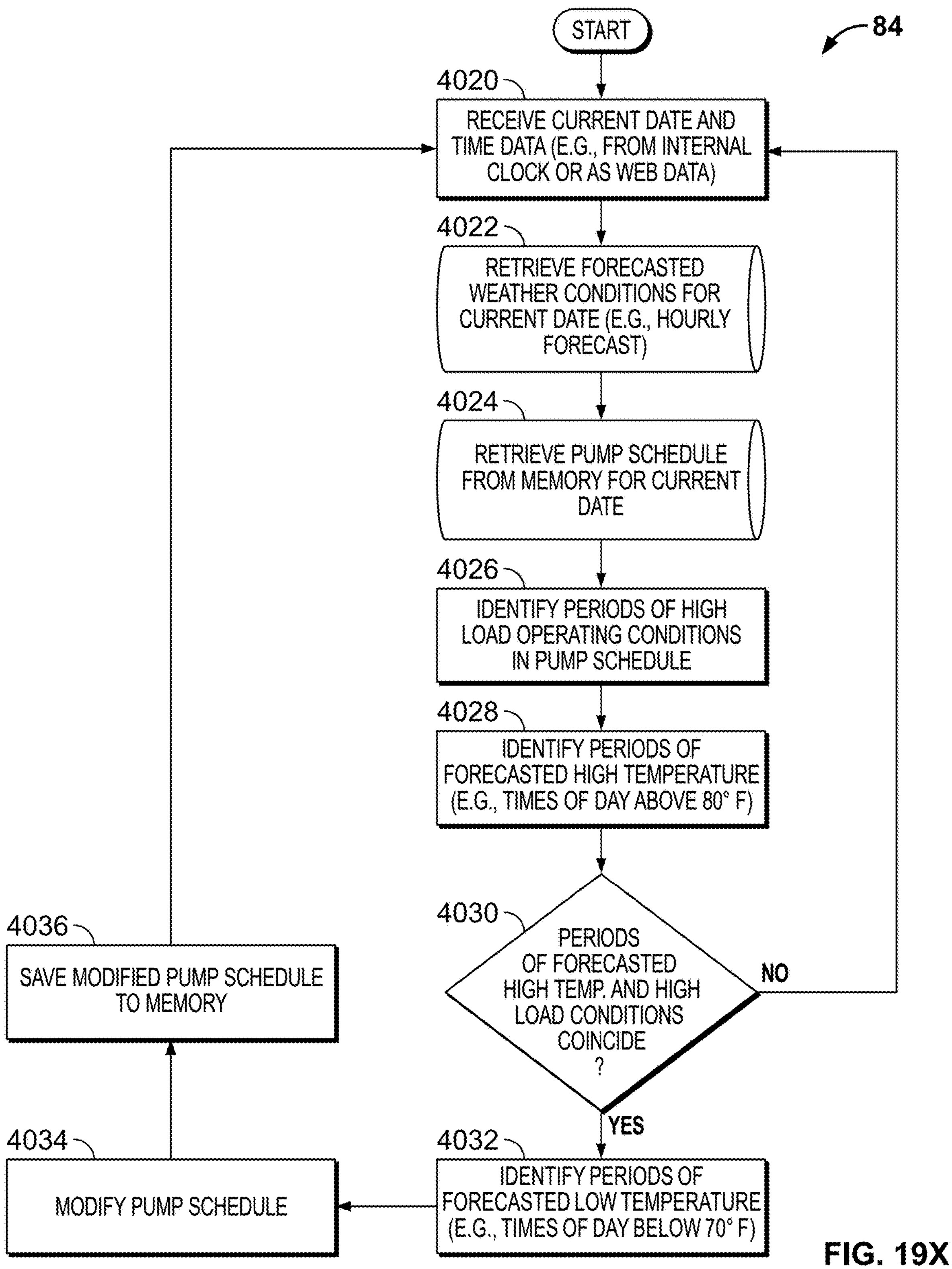

FIG. 19X is a flowchart illustrating processing steps carried out by pump control logic 84 for instructing the pump to run higher load operating modes during cooler times of the day if higher than normal temperatures are expected. In step 4020, pump control logic 84 receives current date and time data (e.g., from internal clock, as web data, etc.). In step 4022, pump control logic 84 retrieves forecasted weather conditions (e.g., hourly forecast) for the current date. The forecasted weather conditions can be obtained by way of the process described herein, in connection with FIG. 19W. In step 4024, pump control logic 84 retrieves the pump schedule for the current date from the memory. In step 4026, pump control logic 84 identifies periods (e.g., times of day) of high load operating conditions in the pump schedule. In step 4028, pump control logic 84 identifies periods of forecasted high temperatures (e.g., times of day above 80° F.). In step 4030, pump control logic 84 determines if the periods of forecasted high temperatures and high load conditions coincide. If a negative determination is made (e.g., the pump will not be running at a high-load during periods of high temperature) in step 4030, pump control logic 84 returns to step 4020. If a positive determination is made (e.g., the pump will be running at a high-load during periods of high temperature) in step 4030, pump control logic 84 proceeds to step 4032, where periods of forecasted low temperatures (e.g., times of day below 70° F.) are identified. Pump control logic 84 then proceeds to step 4034, where the pump schedule is modified so that the higher load operating modes run during periods of forecasted low temperatures. In step 4036, pump control logic 84 saves the modified pump schedule to the memory. Pump control logic 84 then returns to step 4020.

Figure 19Y:
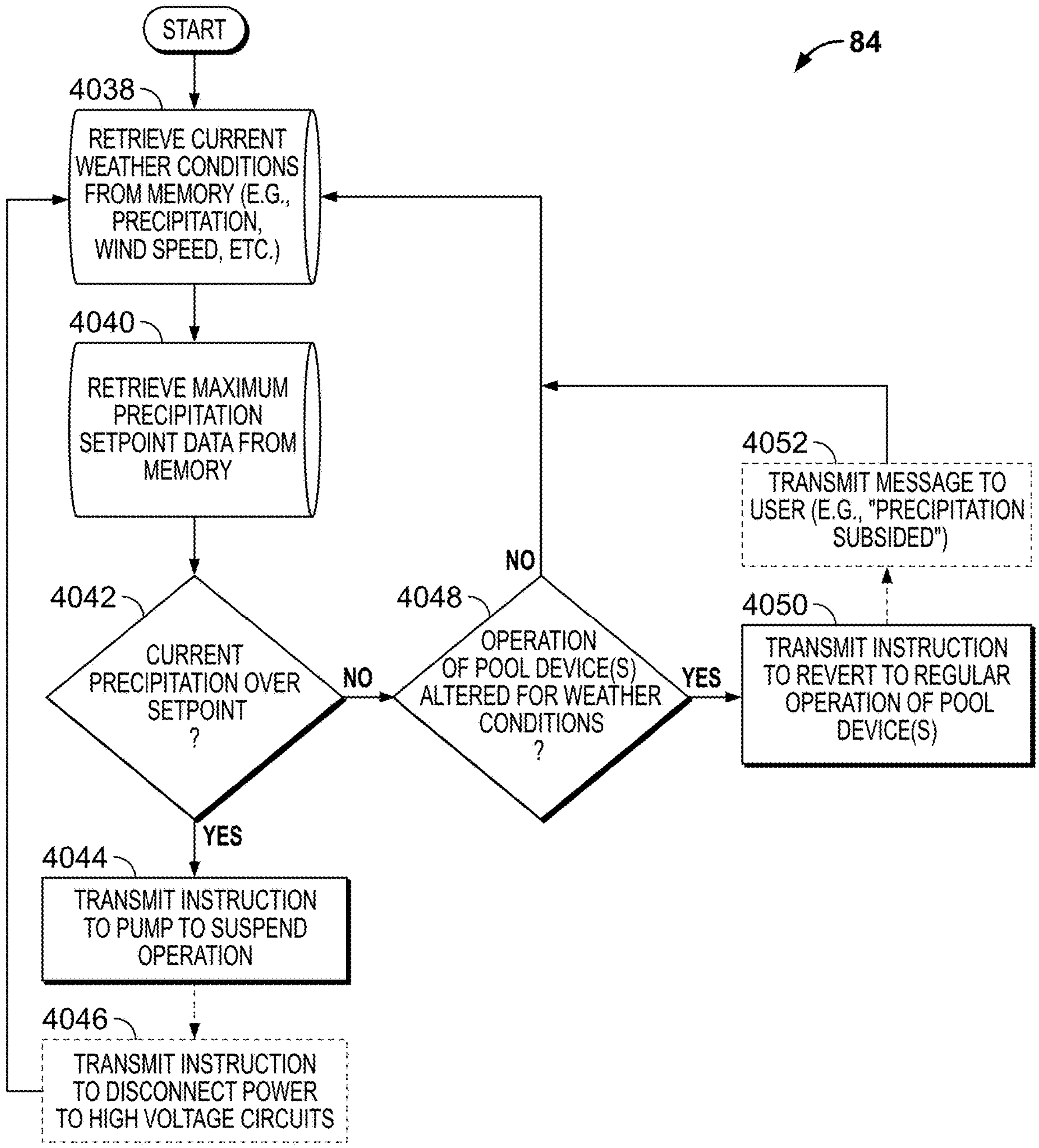

FIG. 19Y is a flowchart illustrating processing steps carried out by pump control logic 84 for automated operation of pool devices based on current weather conditions (e.g., periods of heavy rain). In step 4038, pump control logic 84 retrieves current weather conditions (e.g., precipitation, wind speed, etc.) data from the memory. The current weather conditions can be obtained by way of the process described herein, in connection with FIG. 19V. In step 4040, pump control logic 84 retrieves maximum precipitation setpoint data from memory. In step 4042, pump control logic 84 determines if the current amount of precipitation is above the maximum precipitation setpoint. If a positive determination is made, the process proceeds to step 4044, where pump control logic 84 transmits an instruction to the pump to suspend operation (e.g., preventing damage due to water ingress). Optionally, in step 4046, pump control logic 84 could transmit an instruction to disconnect power to high voltage circuits. The process then reverts to step 4038. If a negative determination is made in step 4042, the process proceeds to step 4048, where pump control logic 84 determines if the operation of any pool devices (e.g., pump, smart relays, smart circuit breaker, etc.) has been altered due to the weather condition (e.g., heavy precipitation). If a negative determination is made, the process reverts to step 4038. If a positive determination is made, the process proceeds to step 4050, where pump control logic 84 transmits an instruction to revert to regular operation of the pool device(s). Optionally, in step 4052, pump control logic 84 could transmit a message to the user (e.g., "precipitation subsided"). The process then reverts to step 4038. In addition to the foregoing, it is also contemplated that pump control logic 84 could suspend operation in advance of periods of heavy precipitation by monitoring the forecasted weather conditions and suspending operation before the precipitation begins.

Figure 19Z:
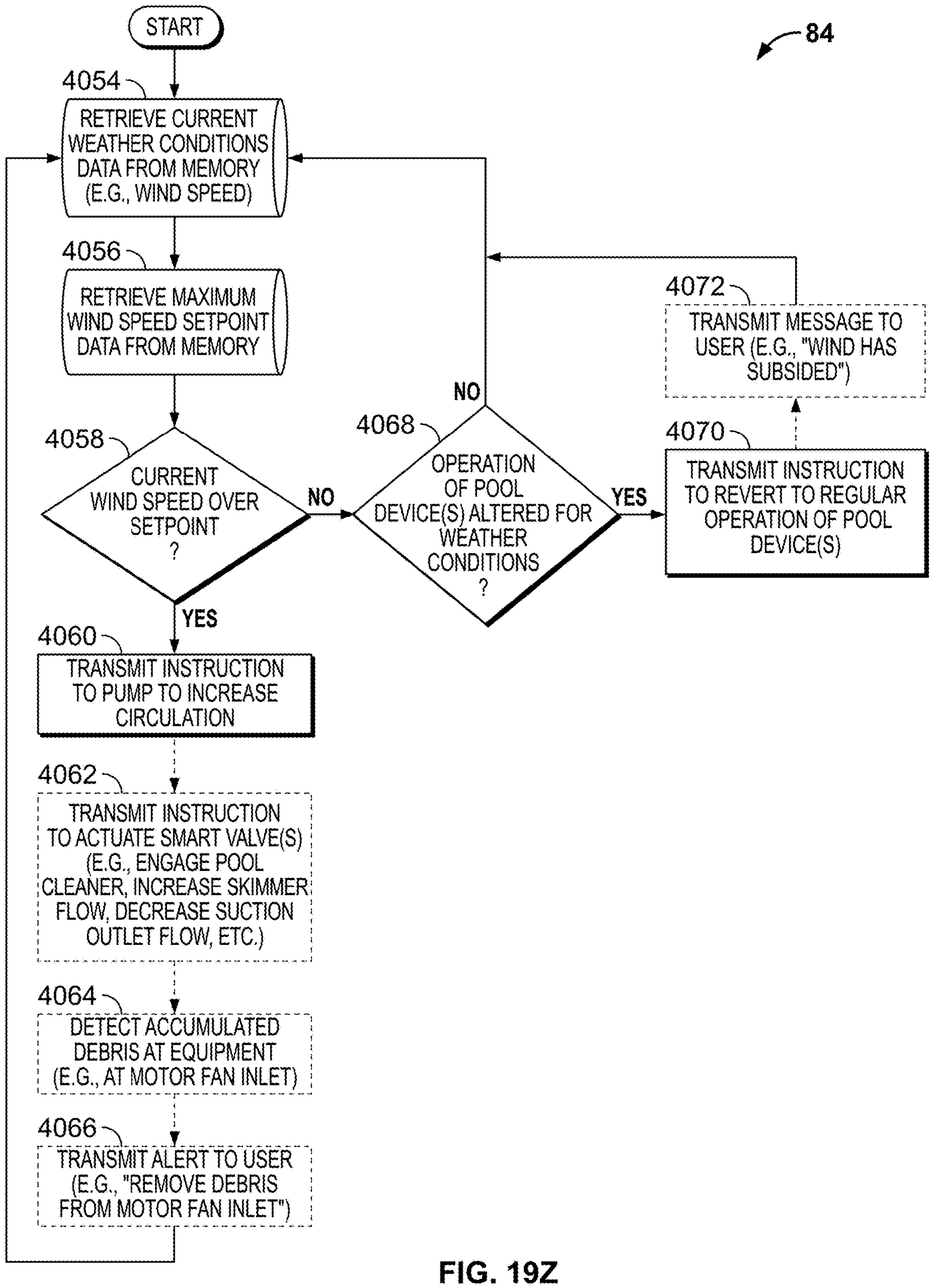
Figure 19A:
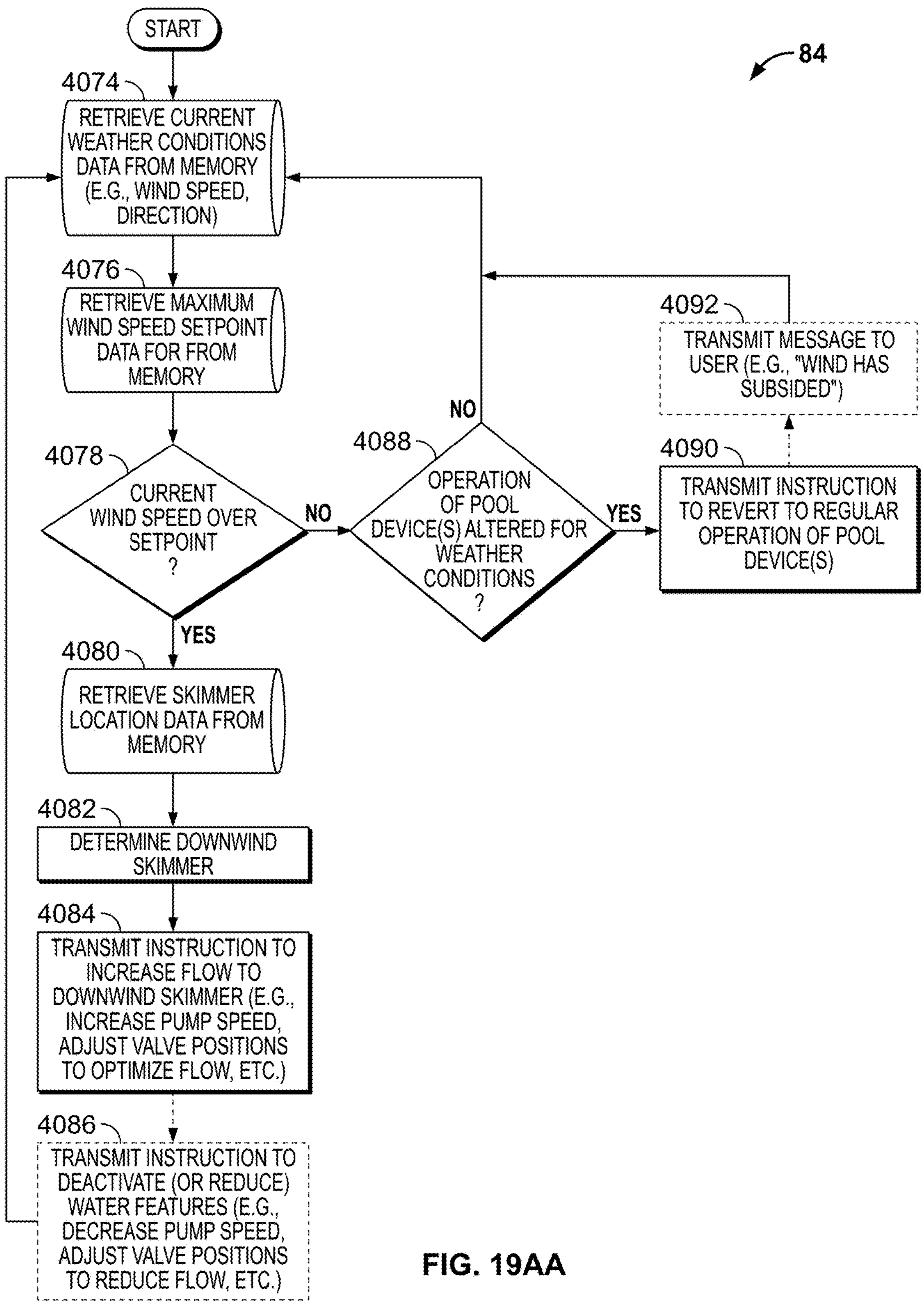
Figure 19A:
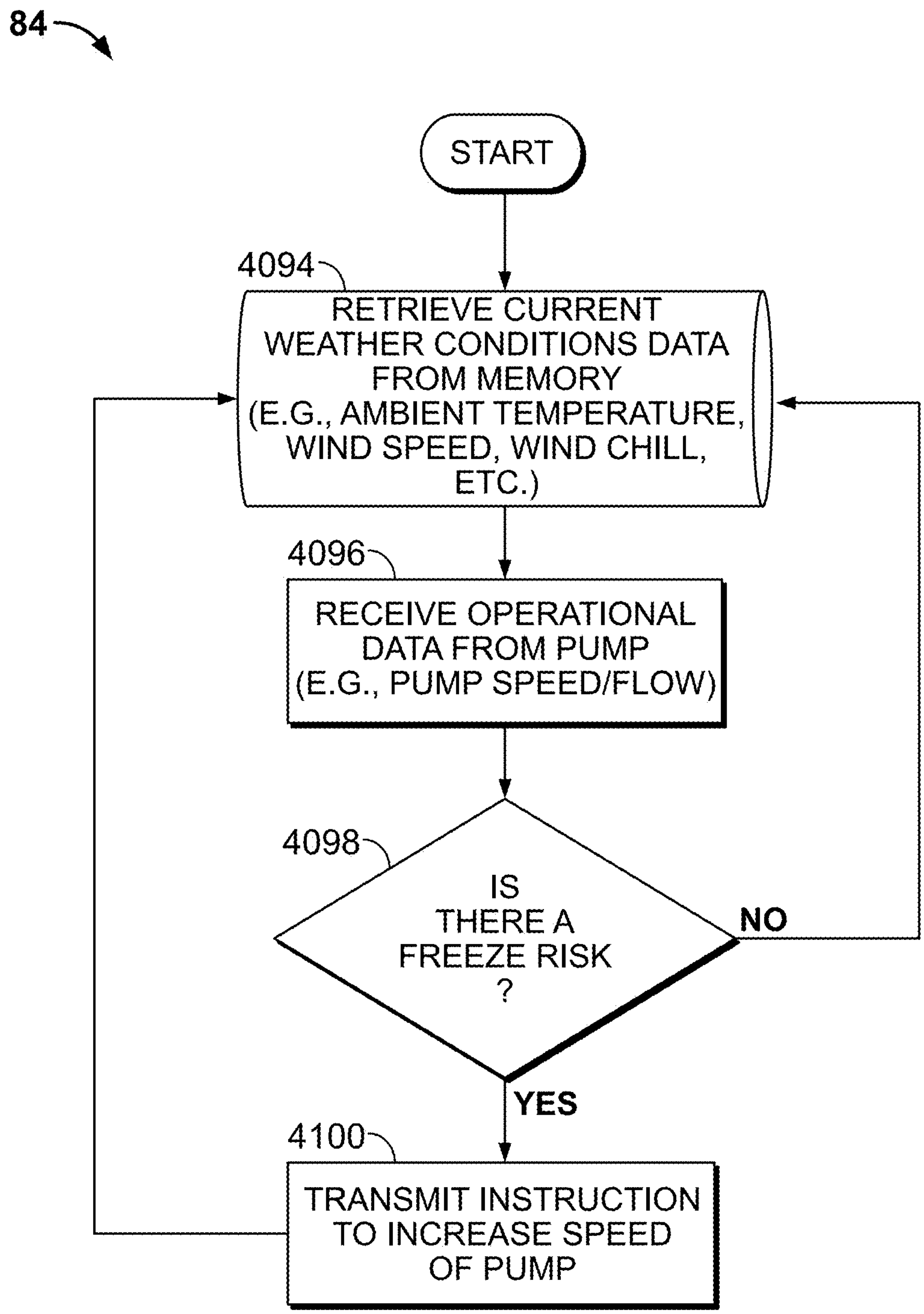
Figure 19A:
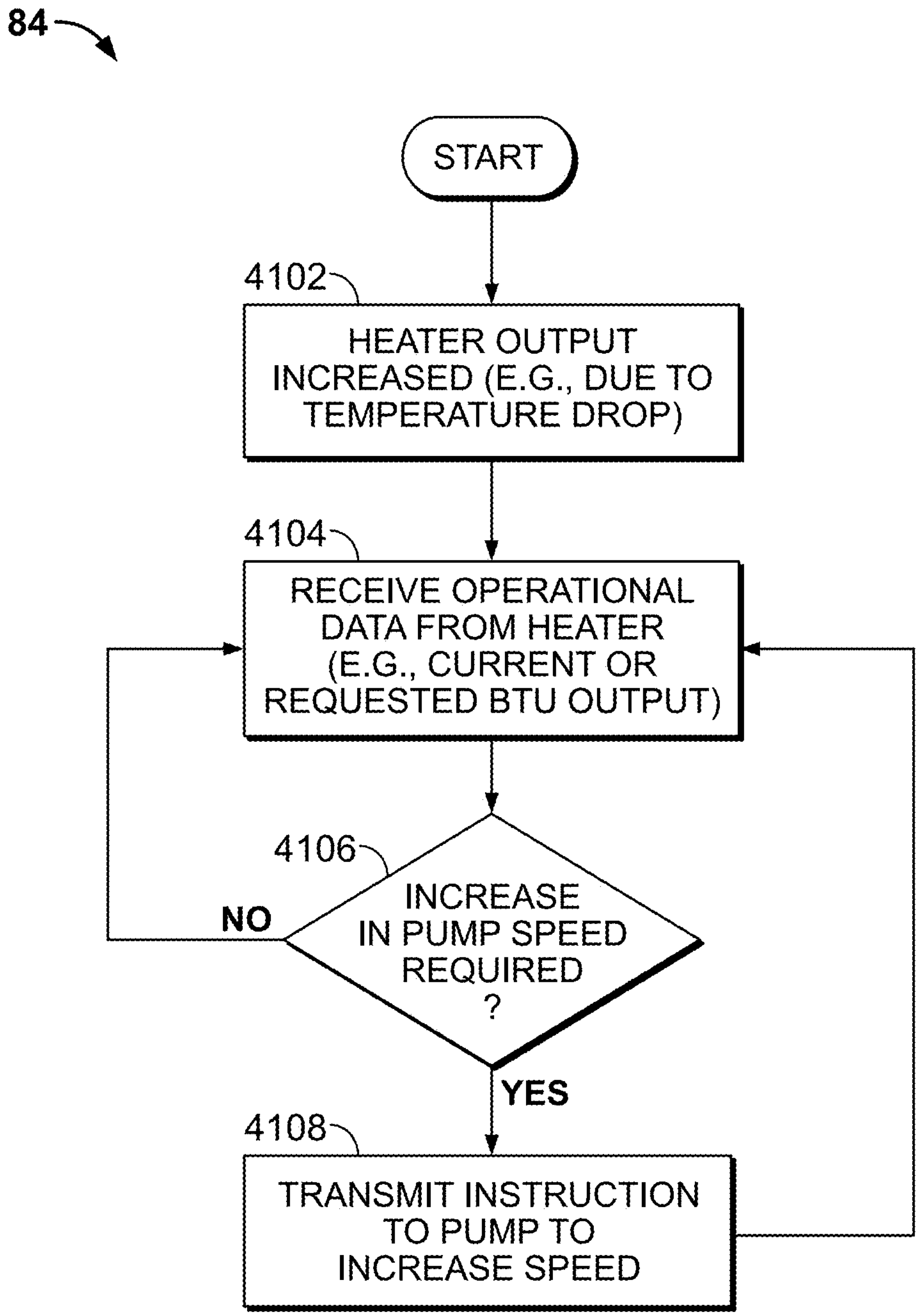
Figure 19A:
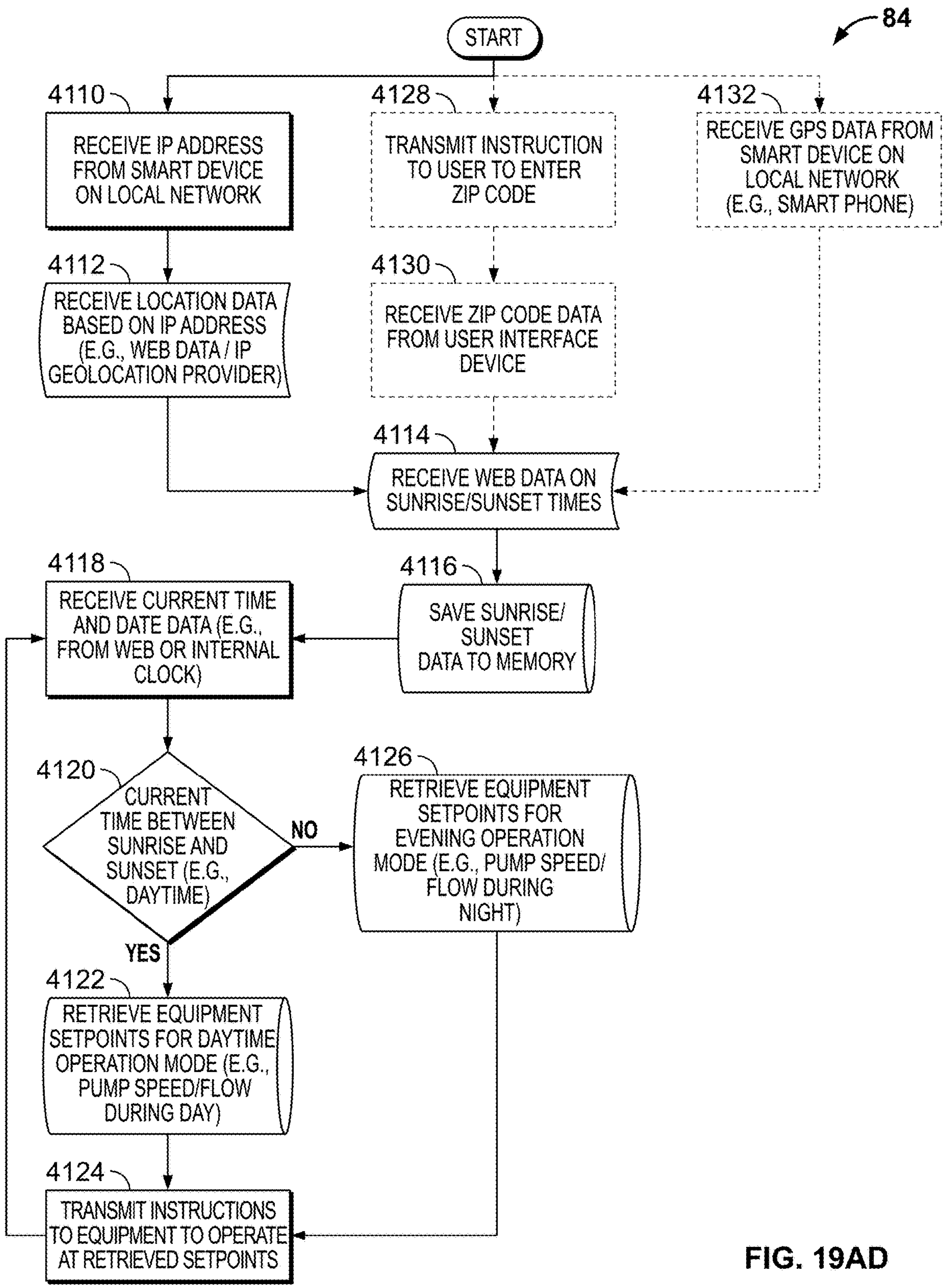
Figure 19A:
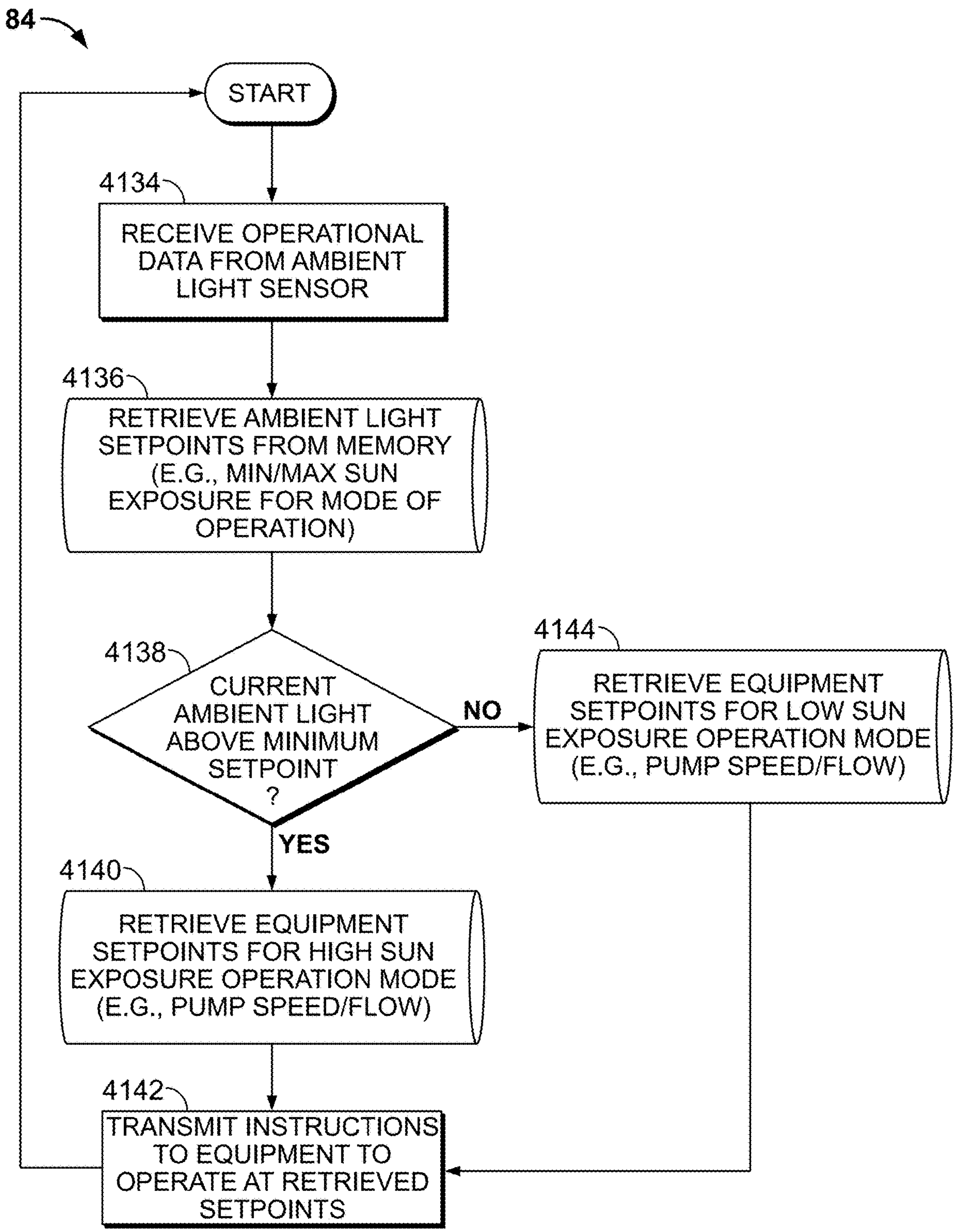
Figure 19A:
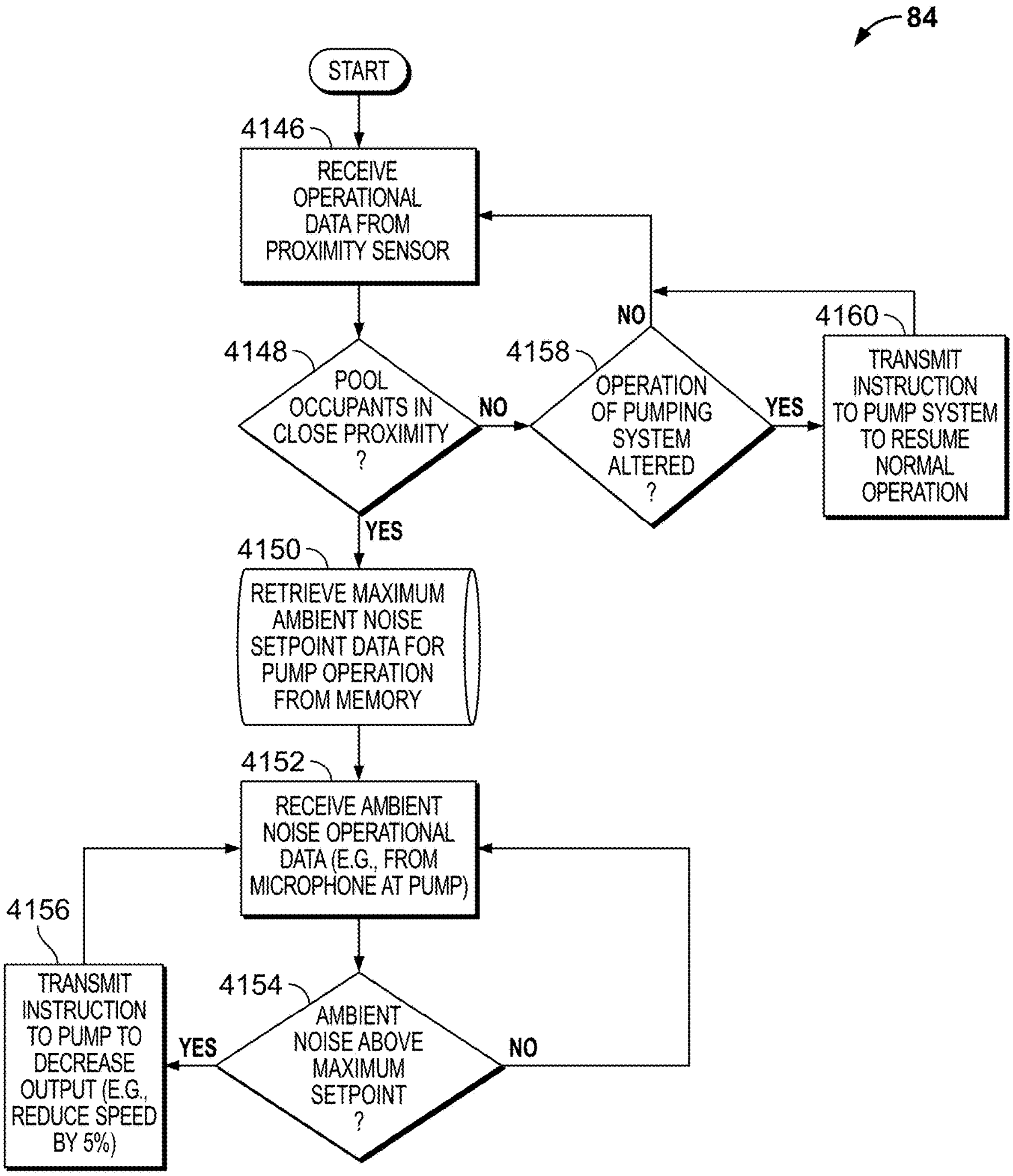
Figure 19A:
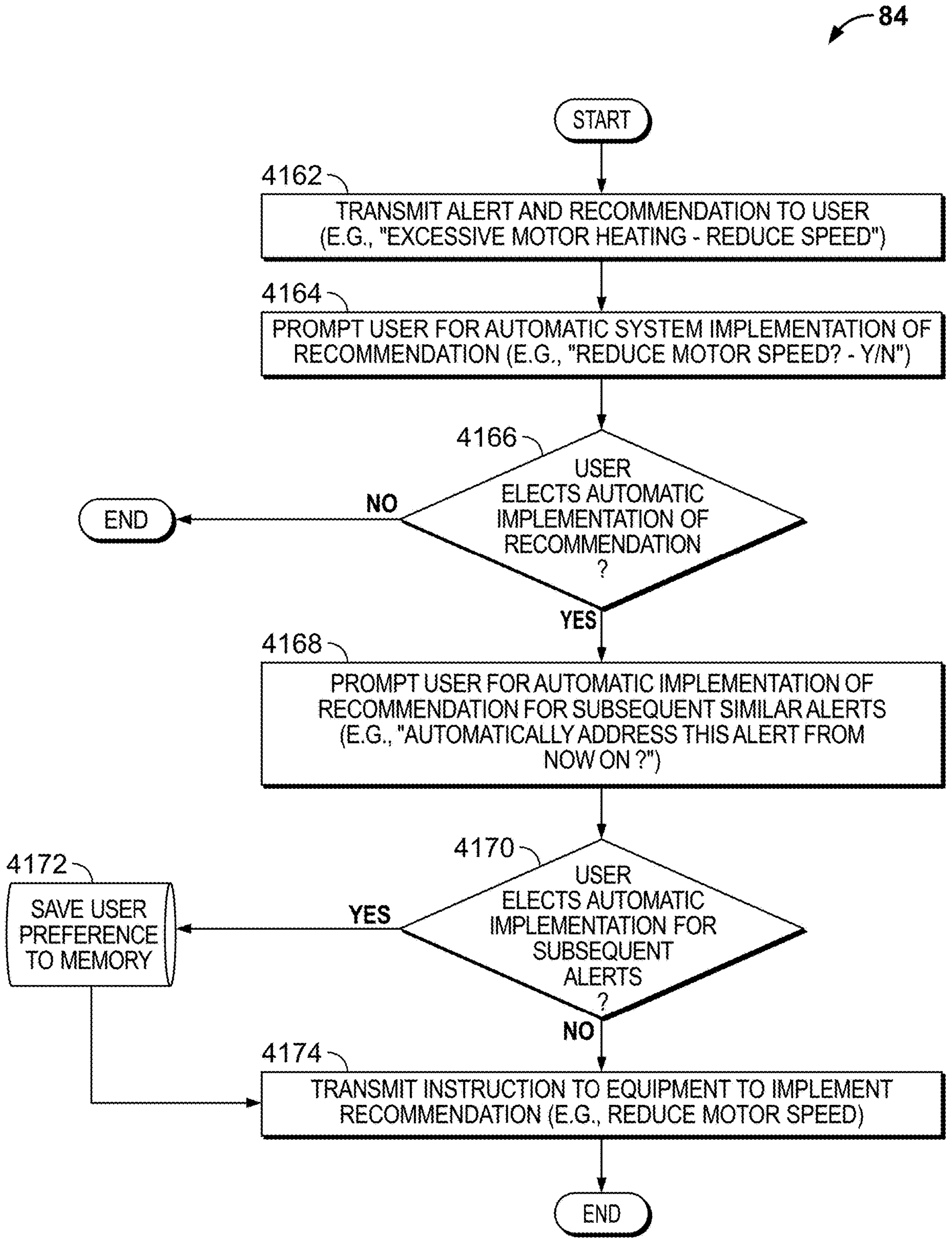
Figure 19A:
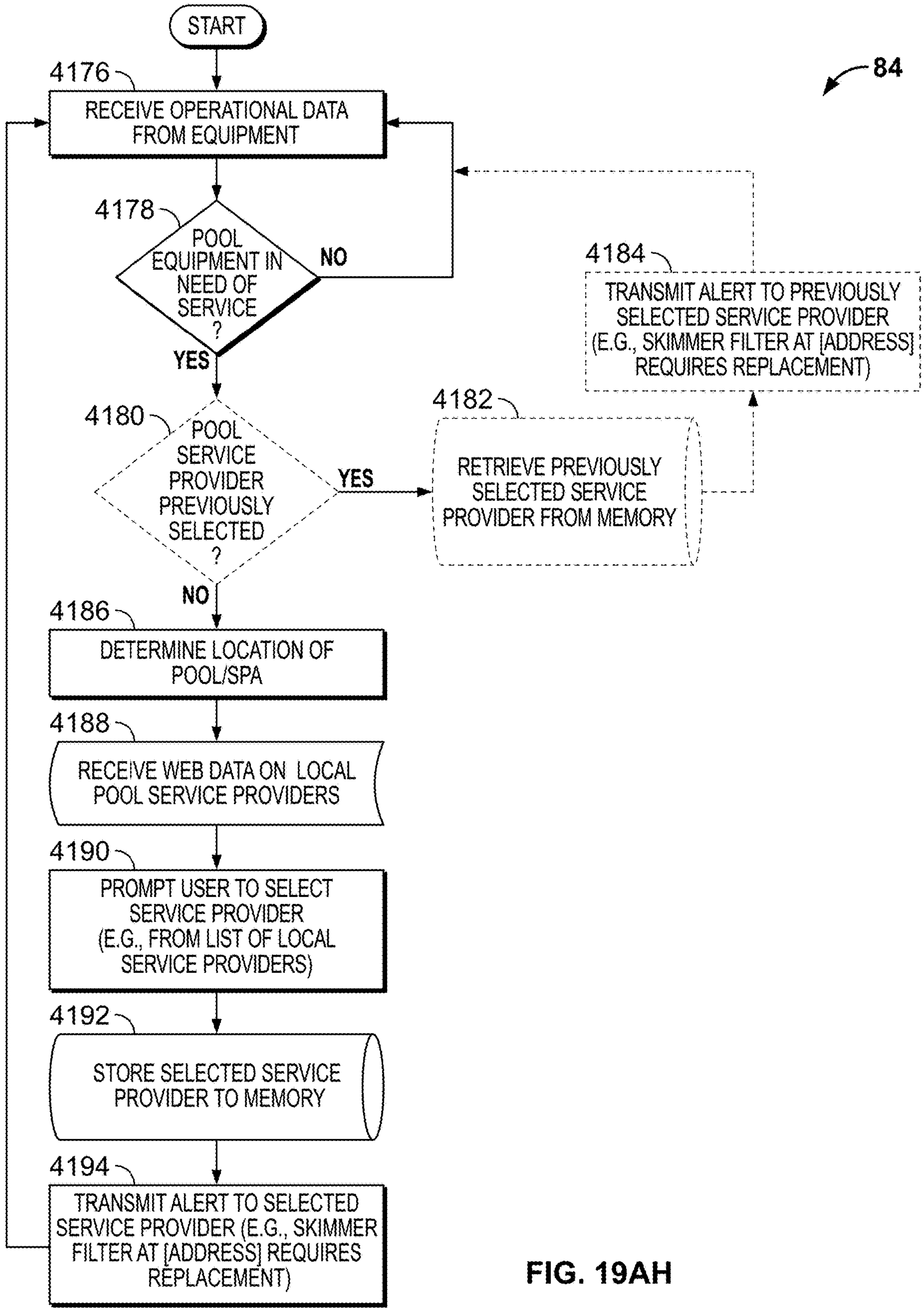
Figure 19A:
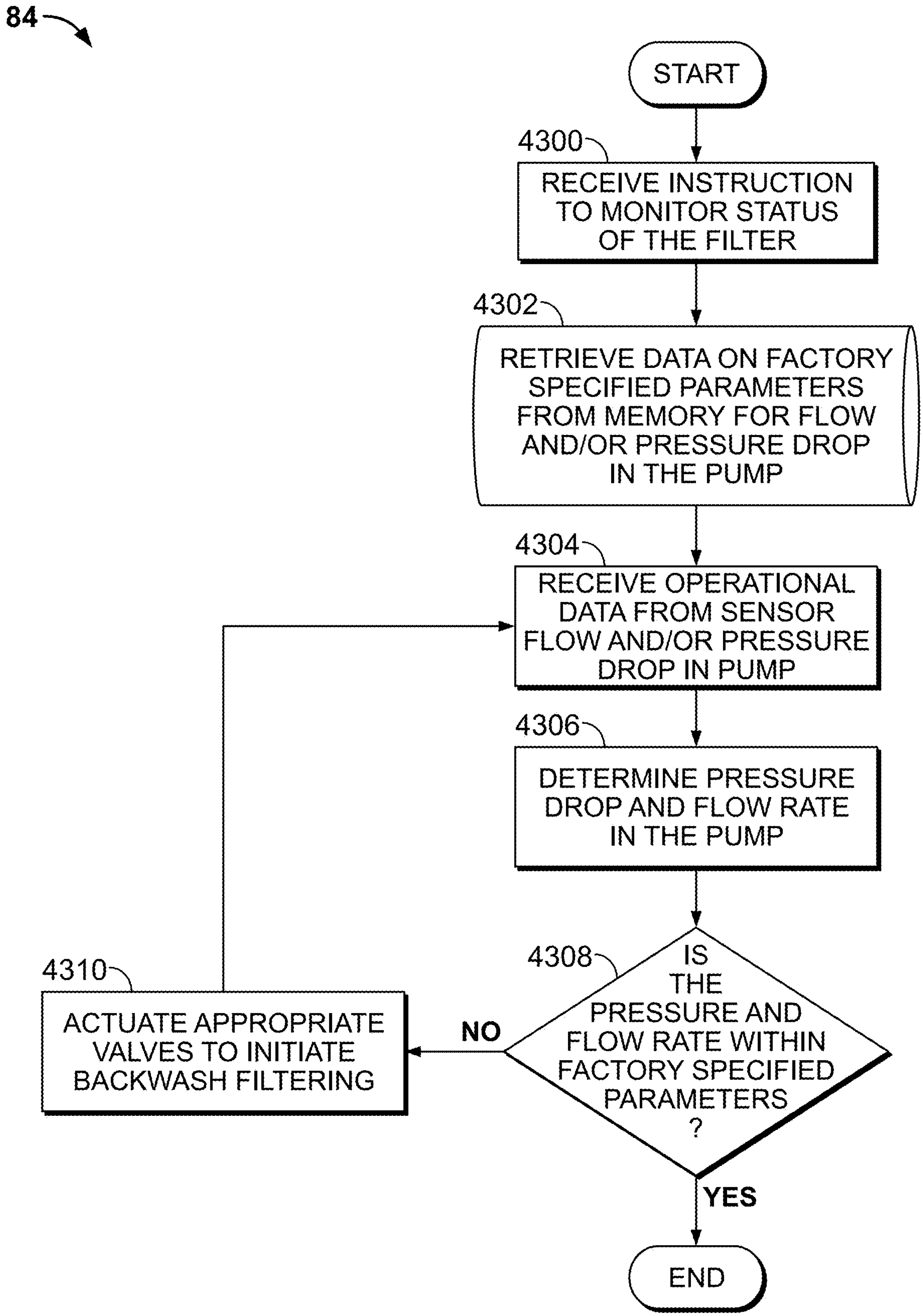
Figure 19A:
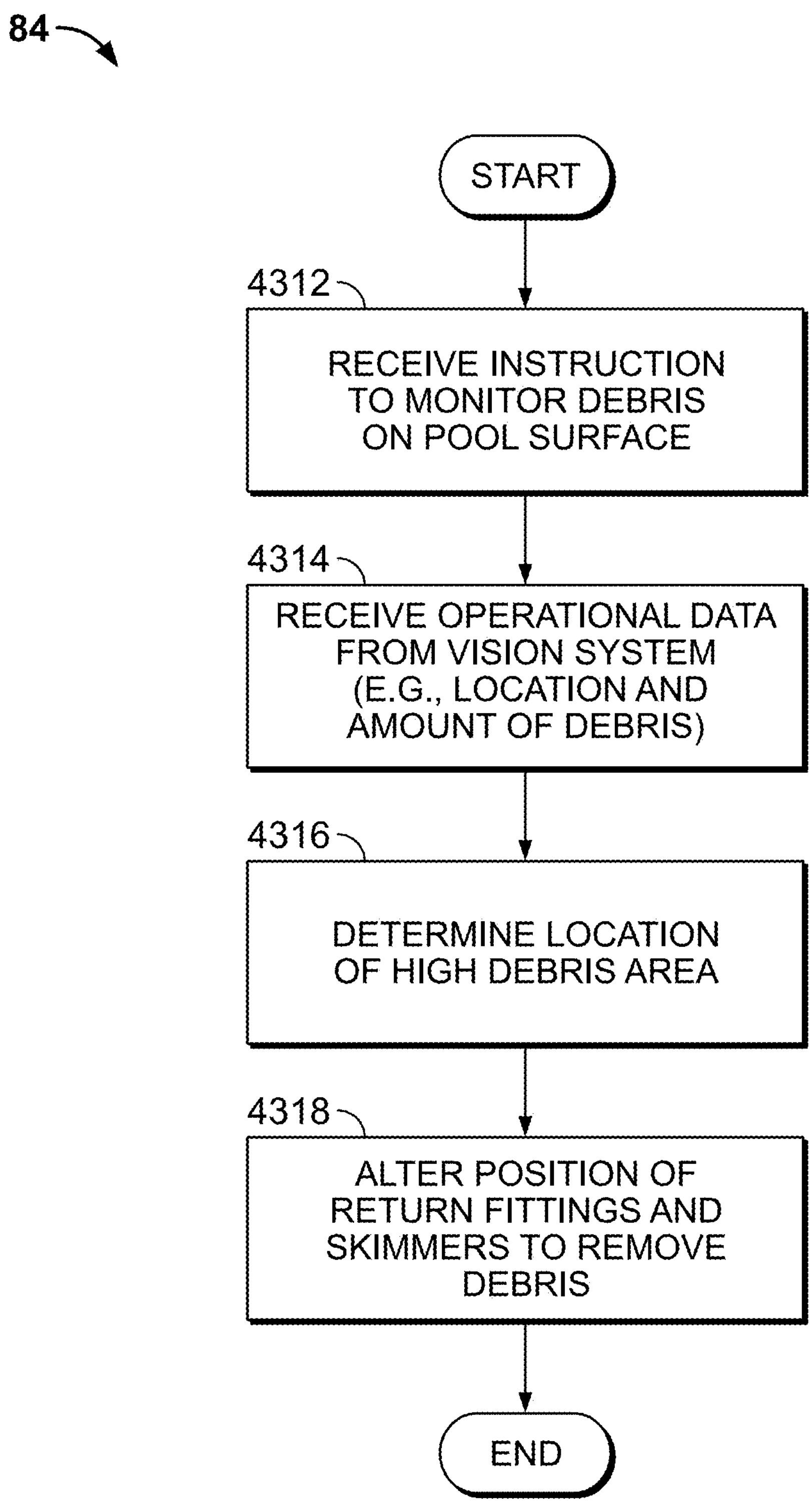
Figure 19A:
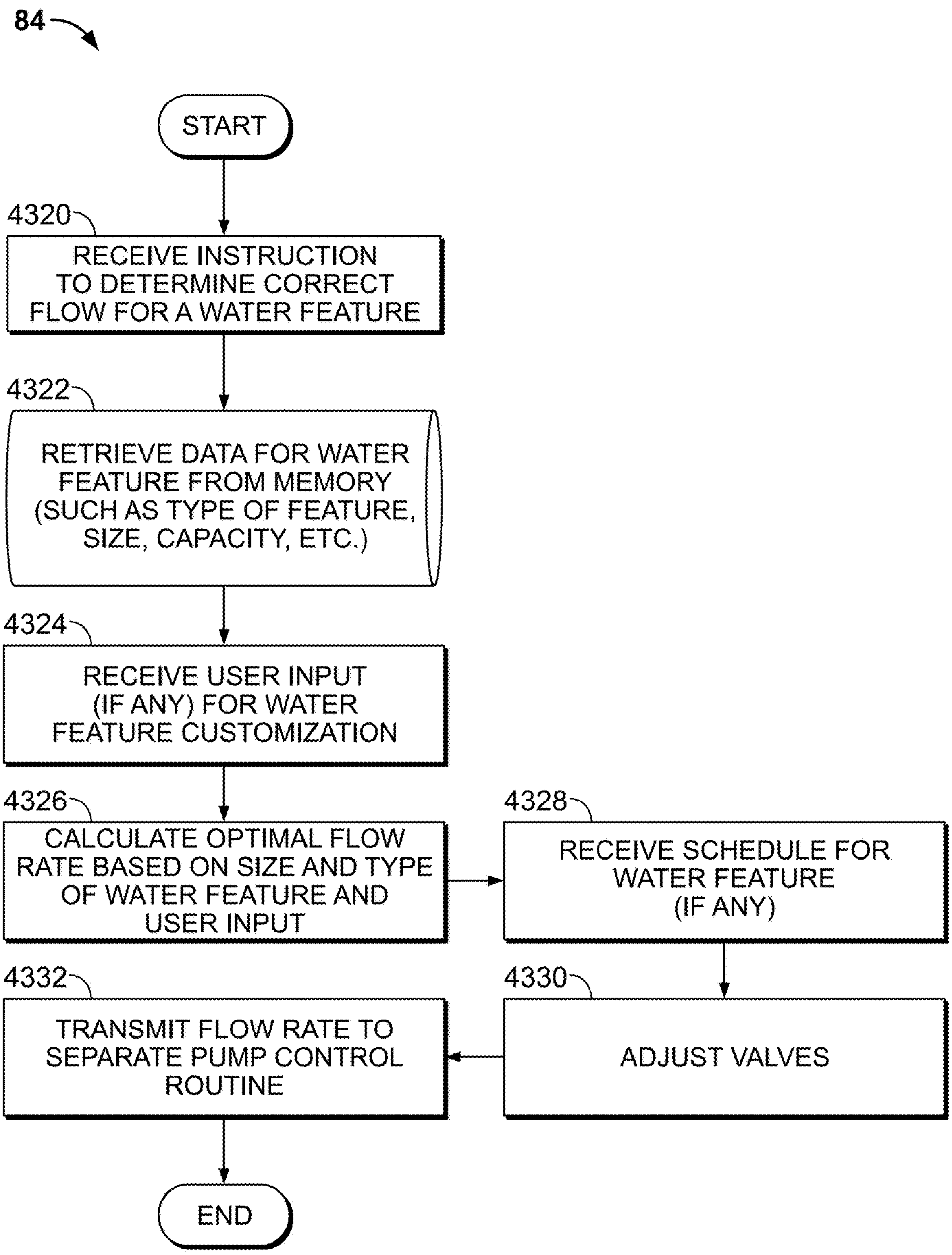
Figure 19A:
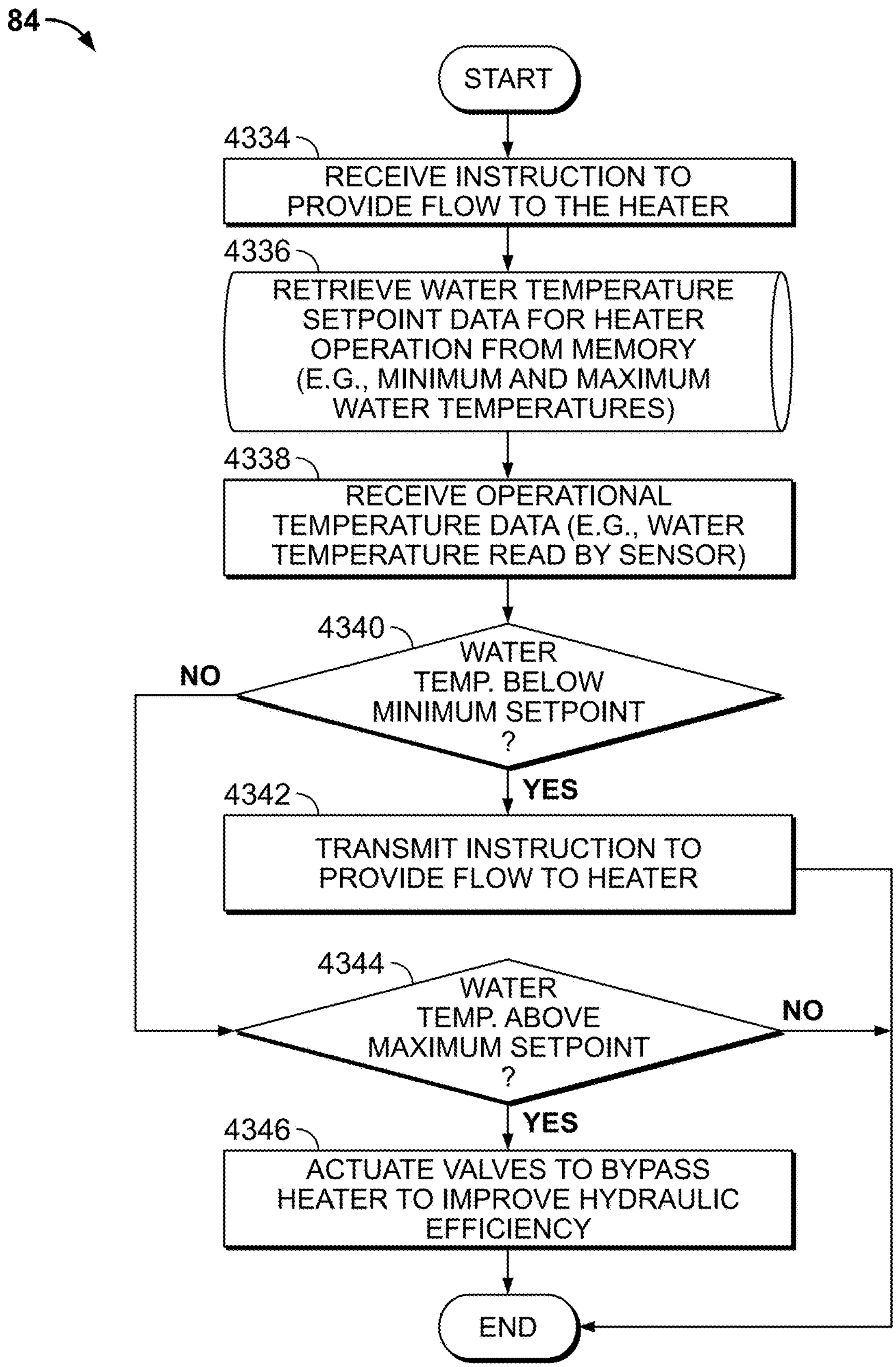
Figure 19A:
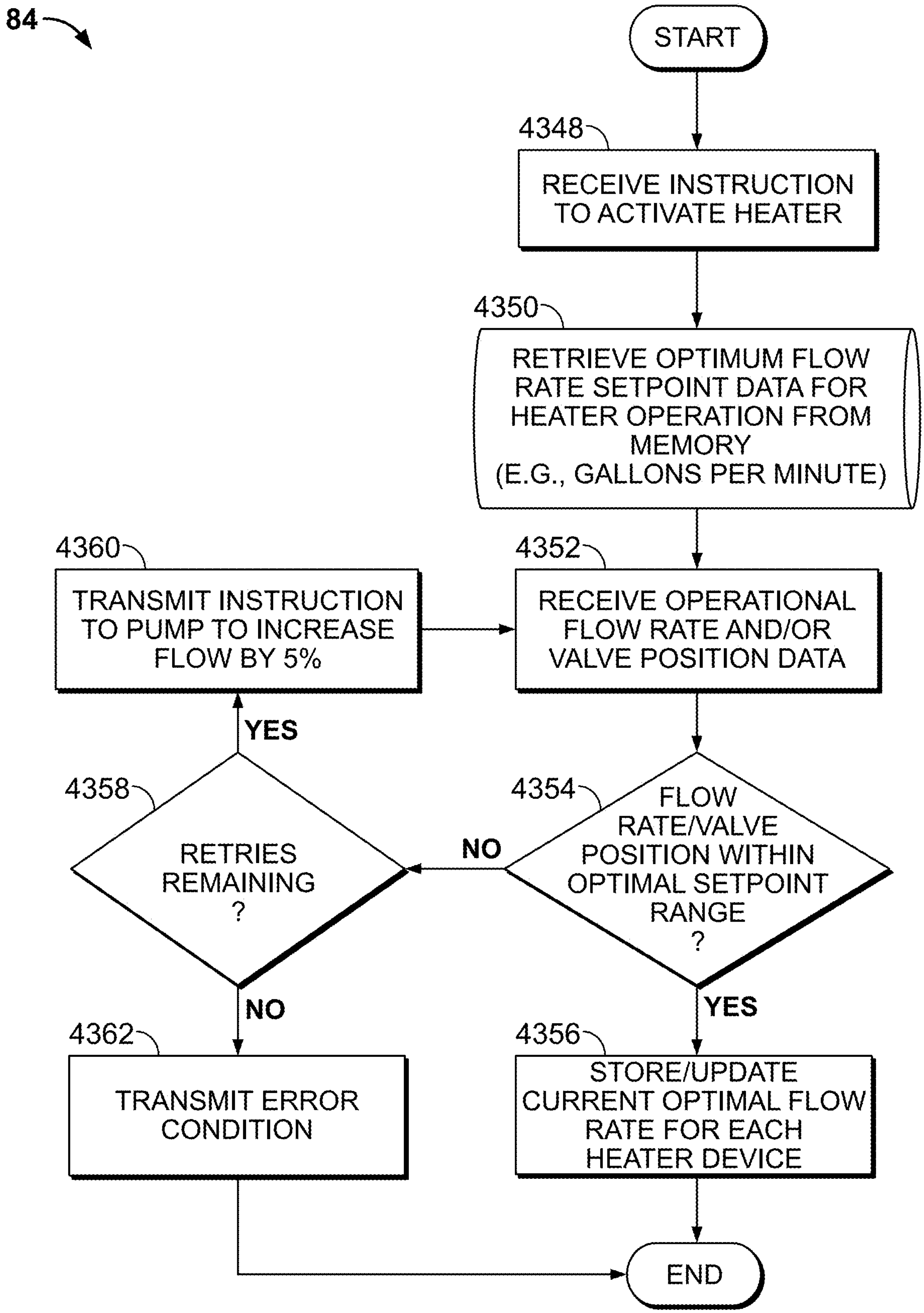
Figure 19A:
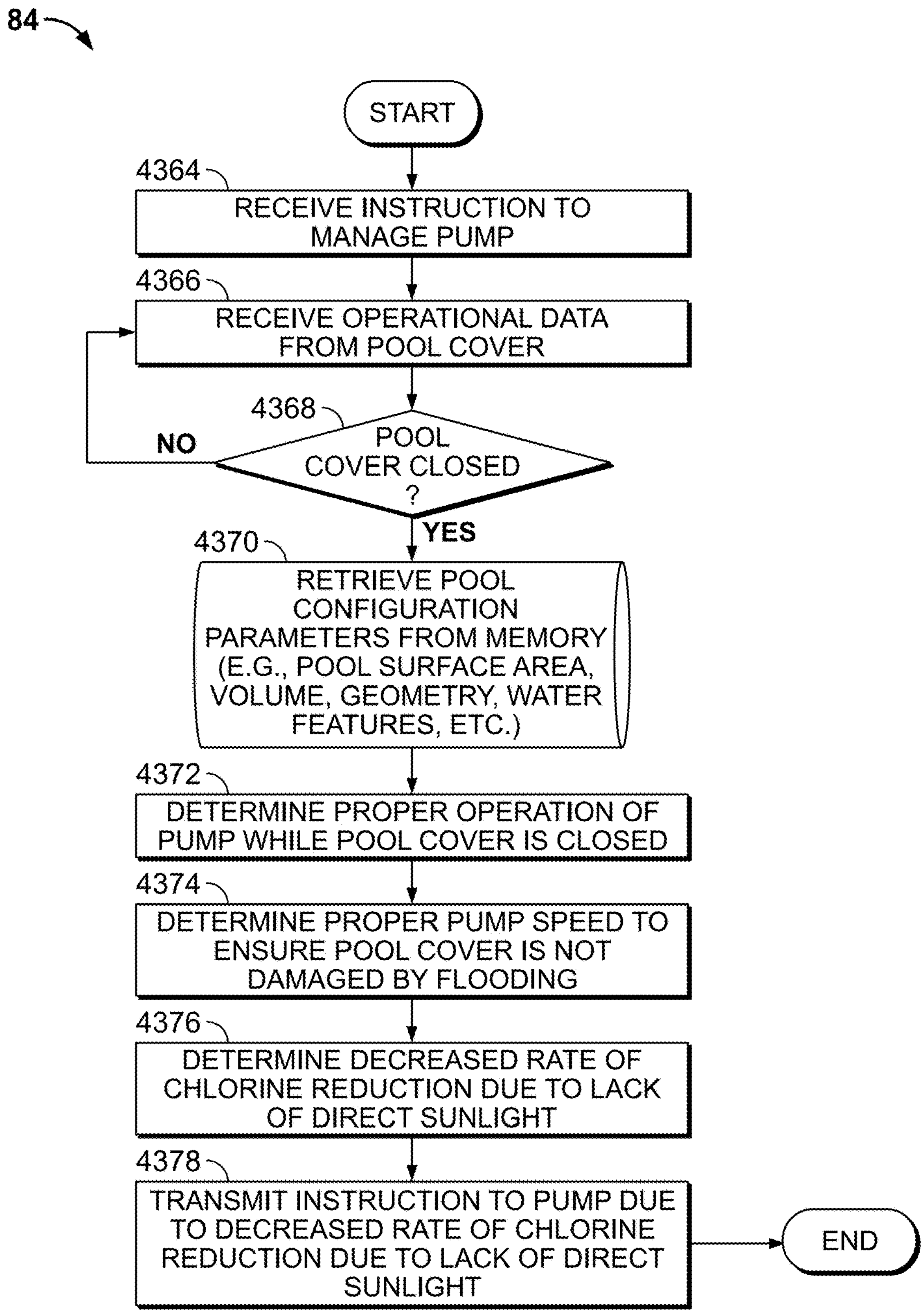
Figure 19A:
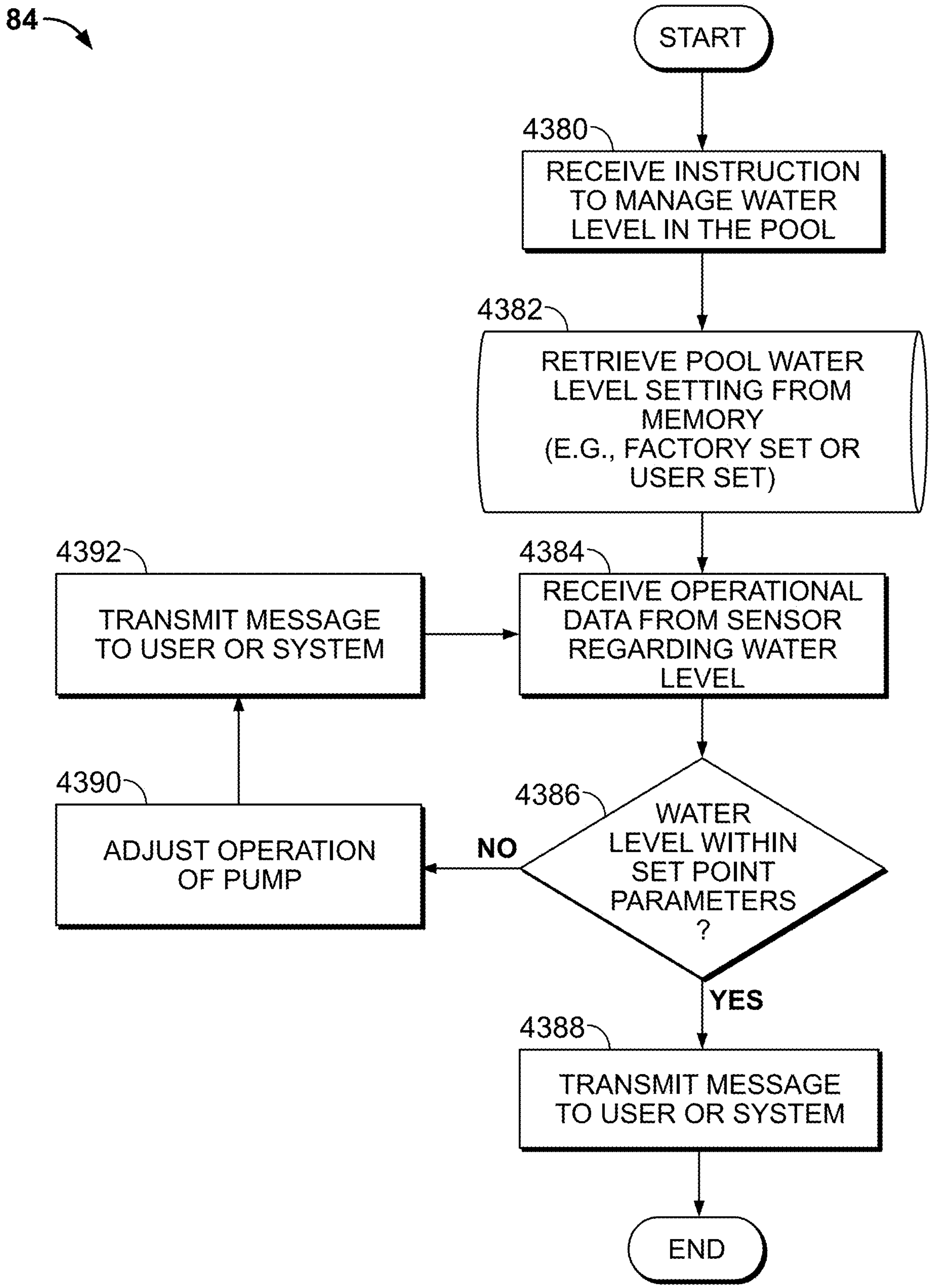
Figure 19A:
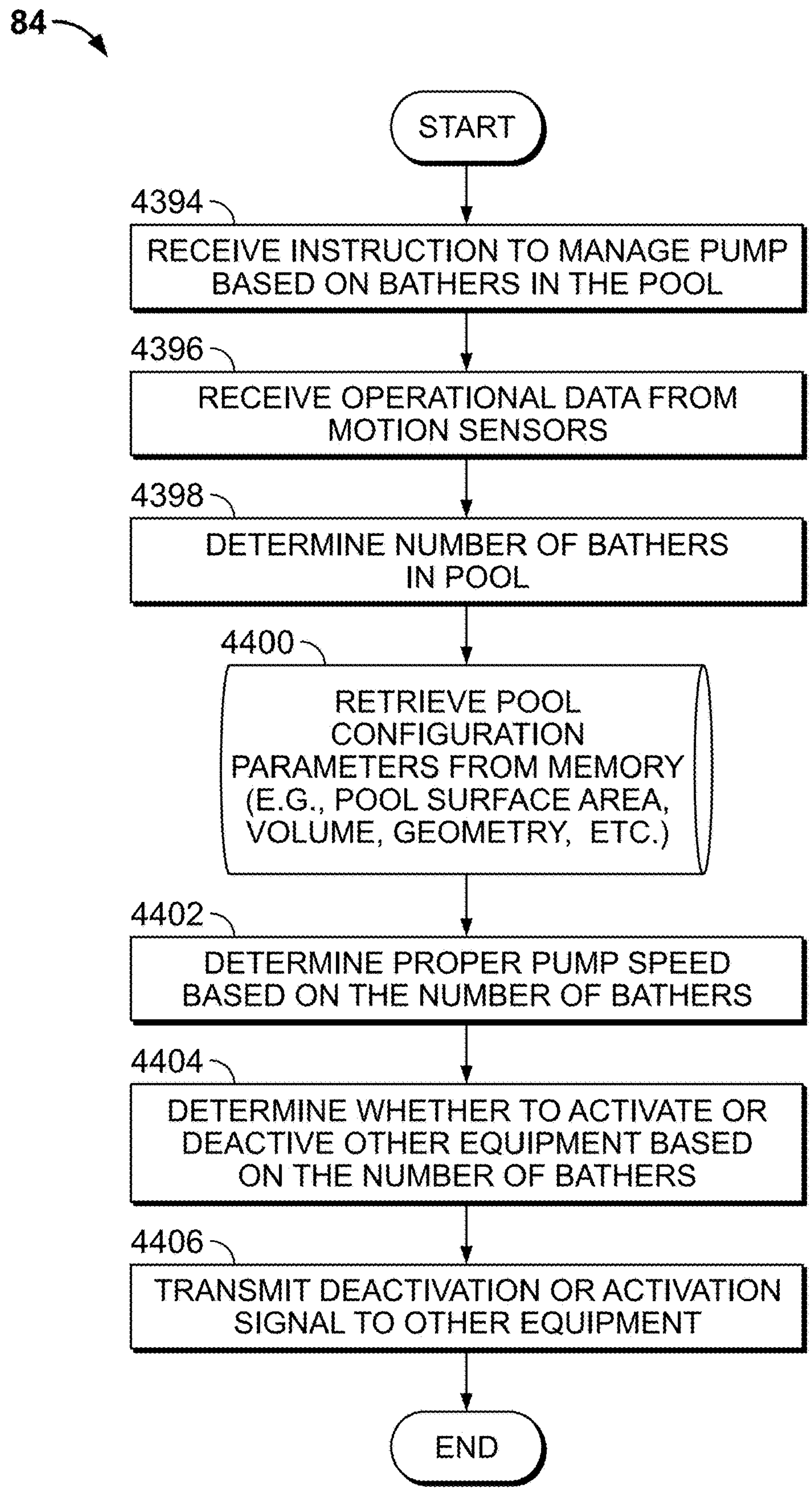
Figure 19A:
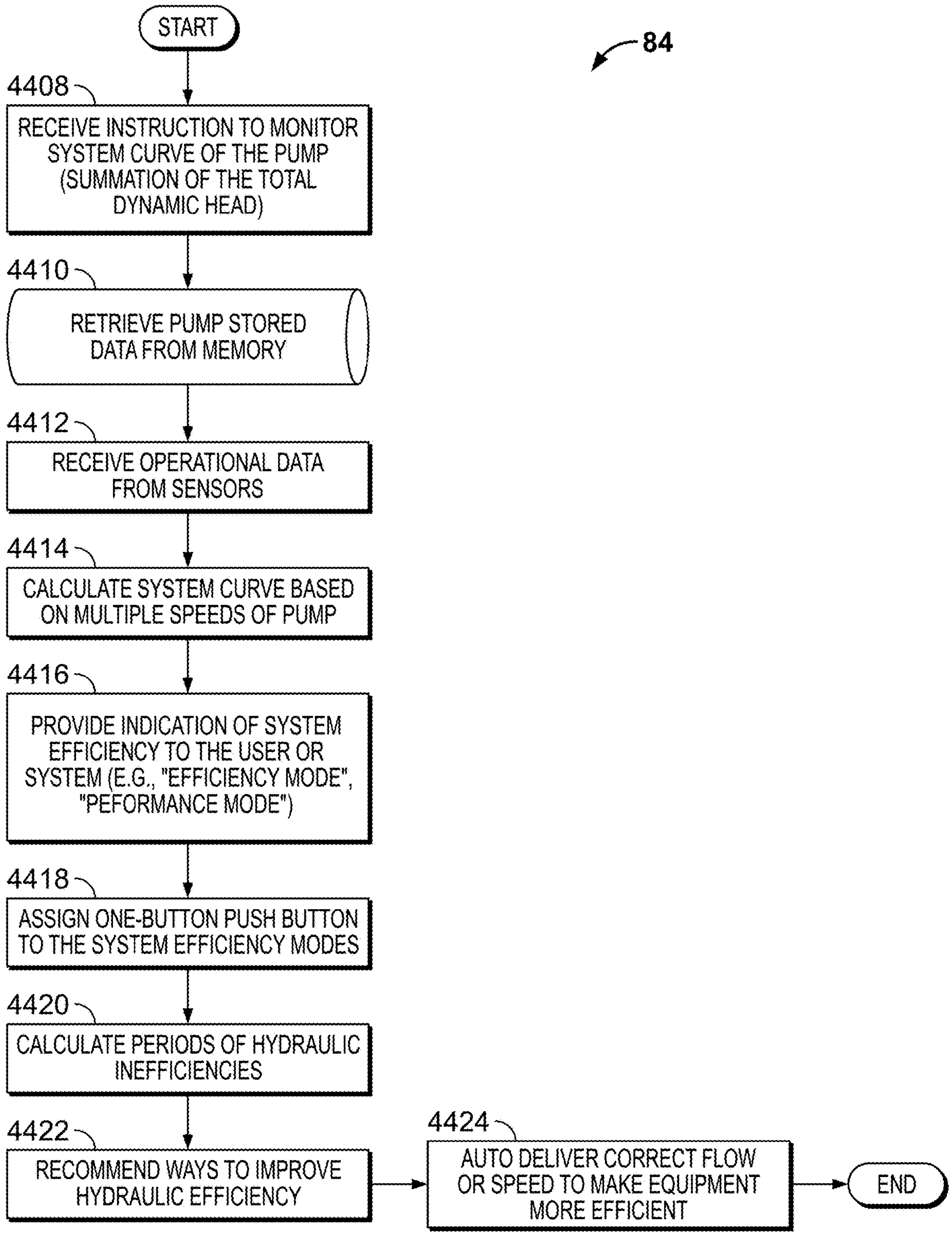
Figure 19A:
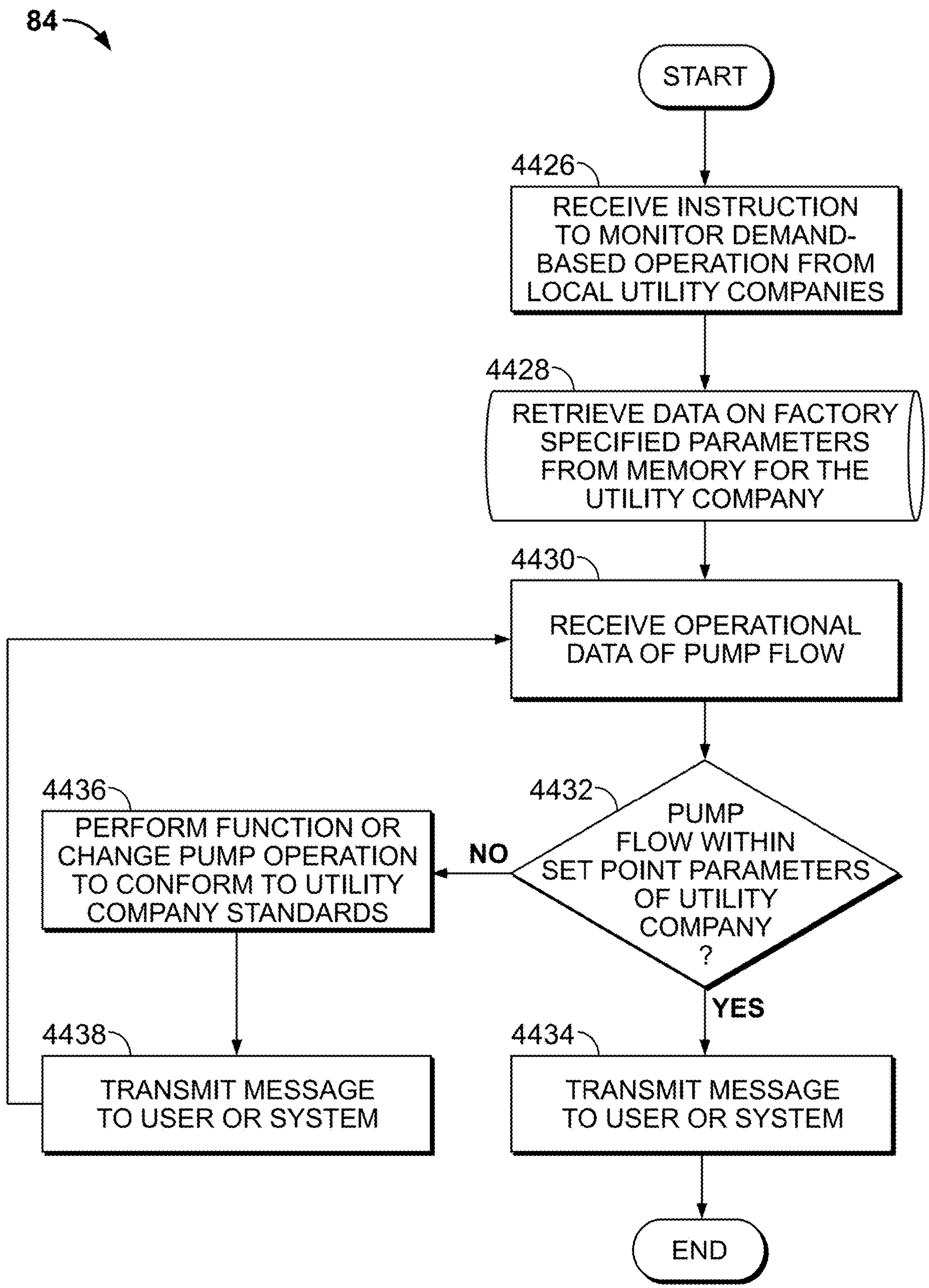
Figure 19A:
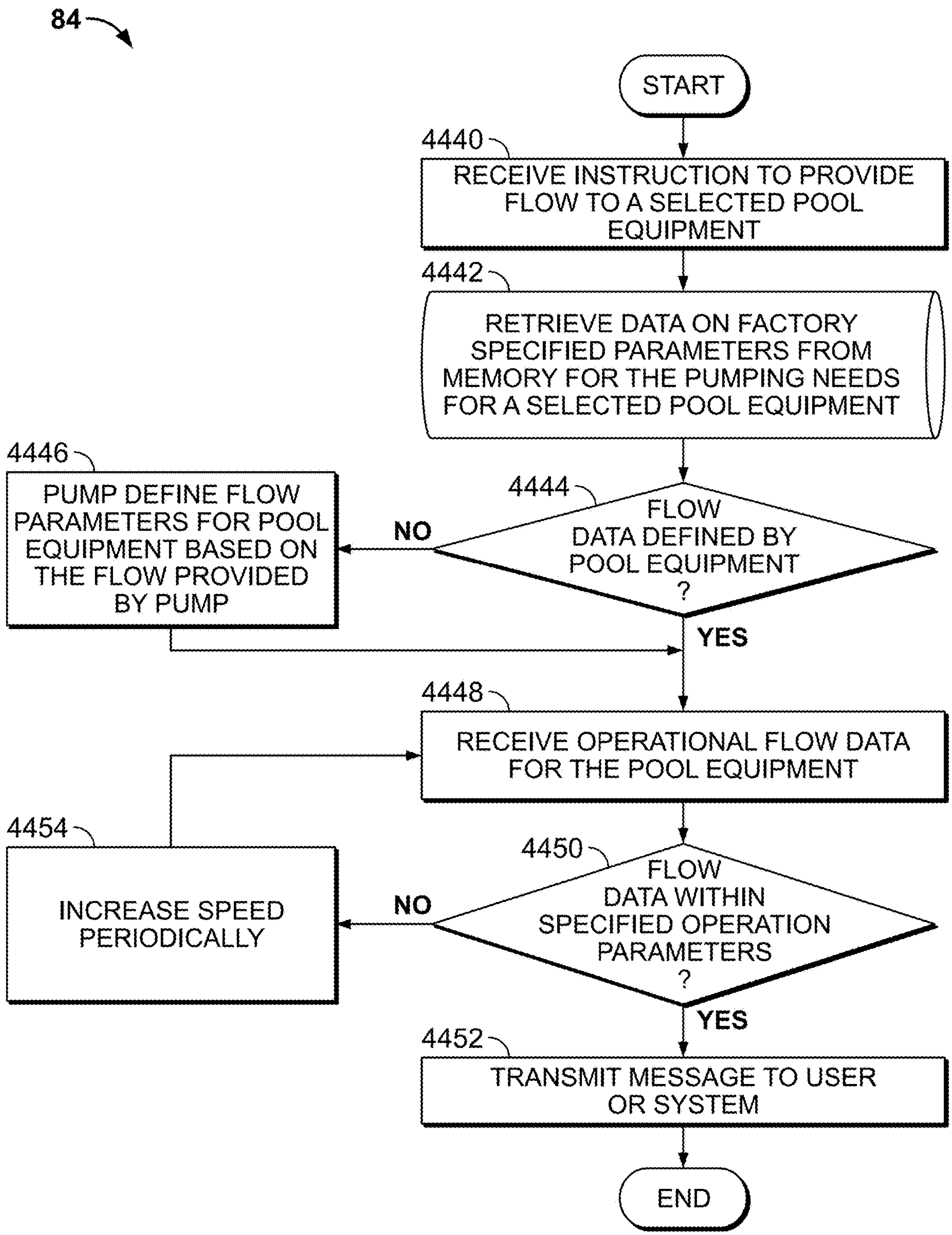
Figure 19A:
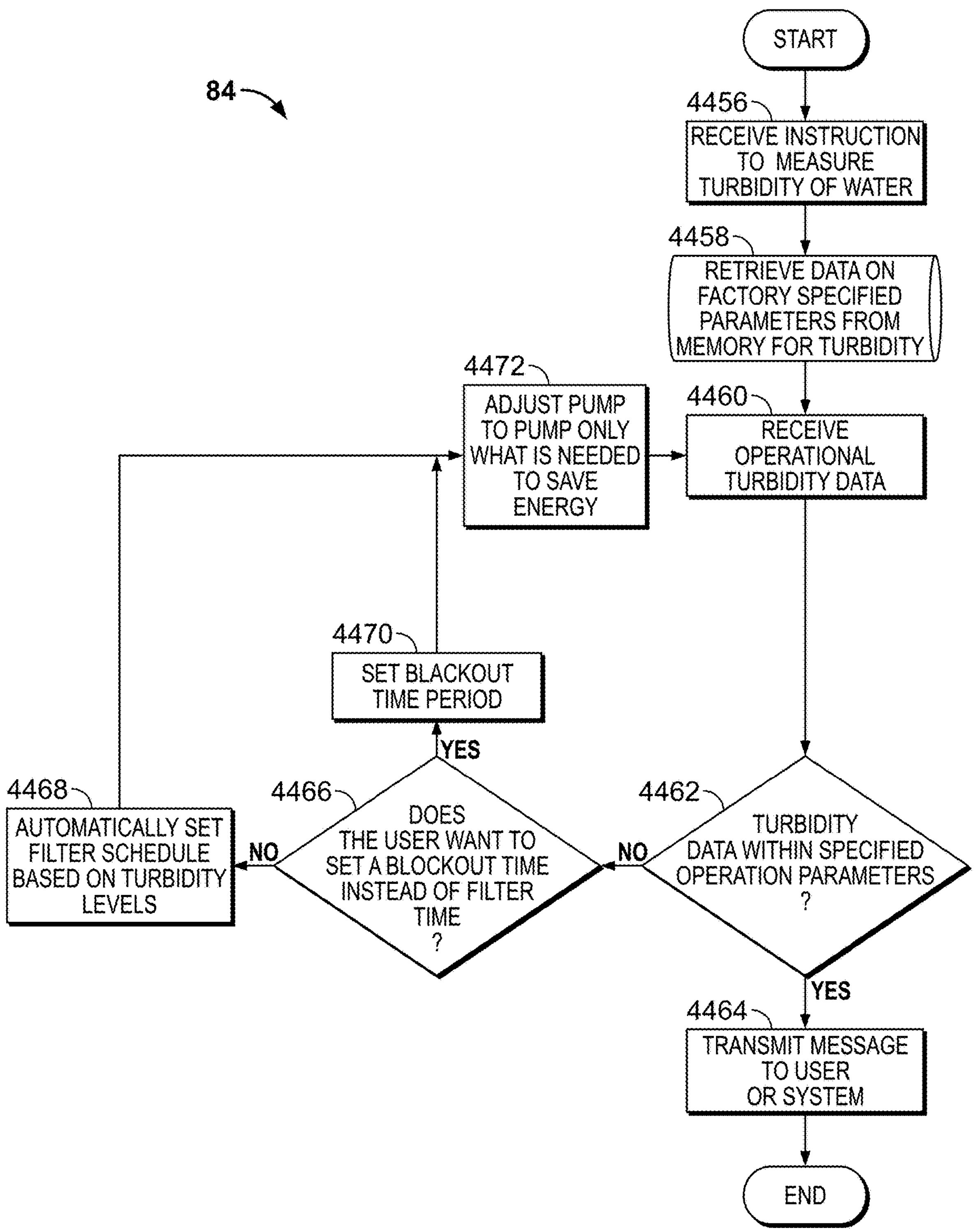
Figure 19A:
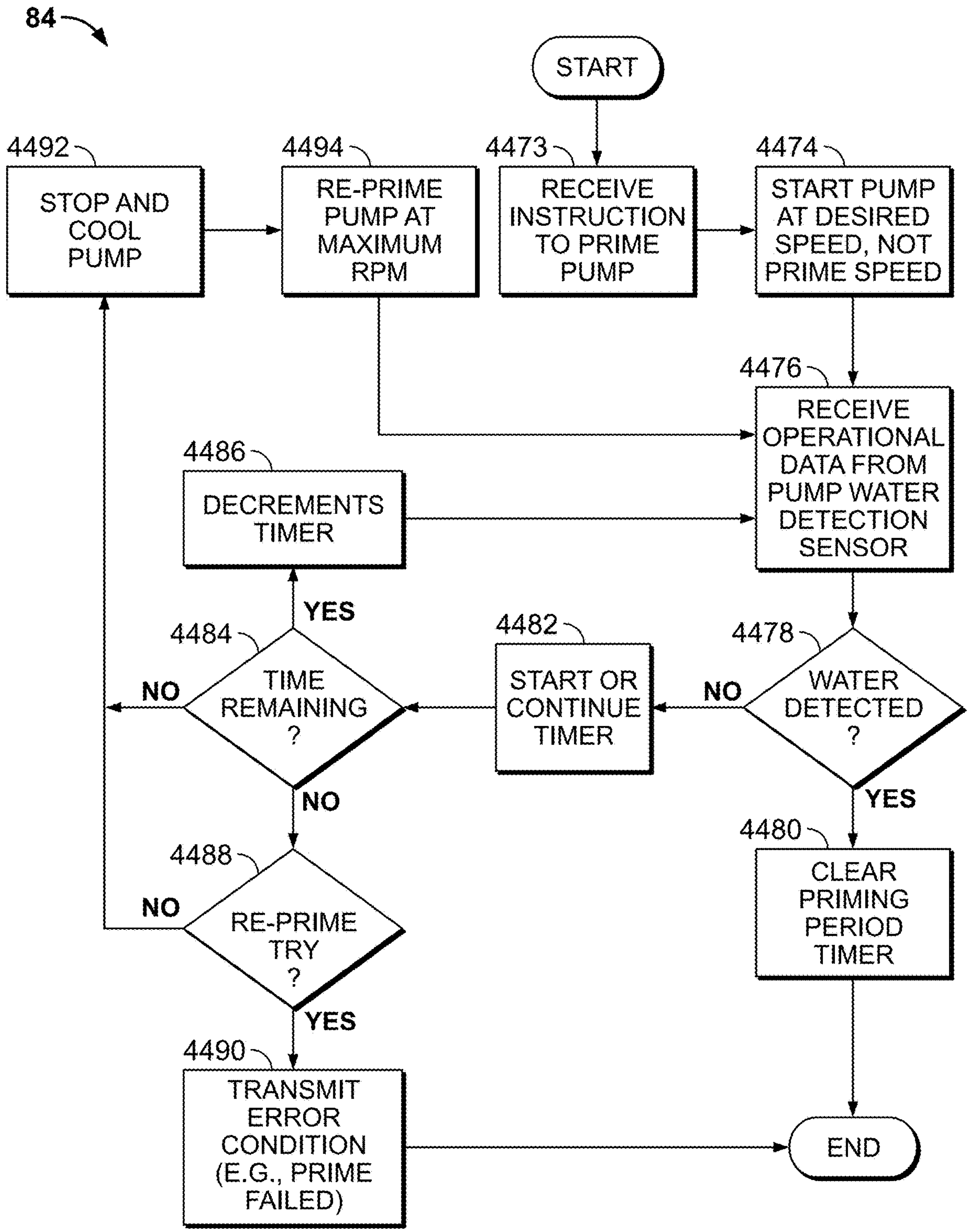

FIG. 19Z is a flowchart illustrating processing steps carried out by the pump control logic 84 for automated operation of pool devices based on current weather conditions (e.g., high winds). In step 4054, pump control logic 84 retrieves current weather conditions (e.g., wind speed) data from the memory. The current weather conditions can be obtained by way of the process described herein, in connection with FIG. 19V. In step 4056, pump control logic 84 retrieves maximum wind speed setpoint data from memory. In step 4058, pump control logic 84 determines if the current wind speed is above the maximum wind speed setpoint. If a positive determination is made, the process proceeds to step 4060, where pump control logic 84 transmits an instruction to the pump to increase circulation, thereby providing better skimmer performance. Optionally, in step 4062, pump control logic 84 could transmit an instruction to actuate a smart valve(s). As referred to herein, smart valves (or smart valve actuators) include an actuator which rotates valves in response to a control signal from pool control logic 70 (e.g., water feature control logic 72, valve actuator control logic 74, cleaner control logic 76, lighting control logic 78, heater control logic 80, chemistry automation control logic 82). Accordingly, smart valves could be utilized in any application that requires the automated operation of valves in a pool/spa environment. For example, actuation of smart valves by pump control logic 84 could thereby automatically engage pool/spa operation, solar heating, pool cleaners, water features, provide additional flow to the skimmer(s), and/or decrease flow from the suction outlets during periods of high winds. Also optionally, in step 4064, pump control logic 84 could further detect accumulated debris at pool/spa equipment (e.g., motor fan inlet) and in step 4066, pump control logic 84 could transmit an alert to the user (e.g., "Remove Debris from Motor Fan Inlet"). The process then reverts to step 4054. If a negative determination is made in step 4058, the process proceeds to step 4068, where pump control logic 84 determines if the operation of any pool devices has been altered due to the weather condition (e.g., high winds). If a negative determination is made, the process reverts to step 4054. If a positive determination is made, the process proceeds to step 4070, where pump control logic 84 transmits an instruction to revert to regular operation of the pool device(s). Optionally, in step 4072, pump control logic 84 could transmit a message to the user (e.g., "Wind Has Subsided"). The process then reverts to step 4054.

FIG. 19AA is a flowchart illustrating processing steps carried out by pump control logic 84 for automatically adjusting pump speed/flow for cleaning a pool/spa in response to a weather condition (e.g., high winds). More specifically, pump control logic 84 can manage and/or respond to heavy debris/particulate sources (e.g., trees, vegetation, dust, etc.) up-wind of the pool/spa area by adjusting the pump speed or flow, based on wind speed and/or direction. For example, in step 4074, pump control logic 84 retrieves current weather conditions (e.g., wind speed, direction) data from the memory. The current weather conditions can be obtained by way of the process described herein, in connection with FIG. 19V. In step 4076, pump control logic 84 retrieves maximum wind speed setpoint data from memory. In step 4078, pump control logic 84 determines if the current wind speed is above the maximum wind speed setpoint. If a positive determination is made, the process proceeds to step 4080, where pump control logic 84 retrieves skimmer location data from the memory. The skimmer location data can be obtained by way of the process described herein, in connection with FIG. 33A. In step 4082, pump control logic 84 determines the most downwind skimmer(s). In step 4084, pump control logic 84 transmits an instruction to increase the flow to the downwind skimmer(s) and the process then reverts to step 4074. The flow to the downwind skimmer(s) can be increased in various ways, including, but not limited to, transmitting an instruction to the pump to increase the pump speed, and transmitting an instruction to a smart valve to actuate, thereby adjusting to a position that optimizes flow to the skimmer. Optionally, in step 4086, pump control logic 84 could transmit an instruction to deactivate or reduce water features (e.g., decrease pump speed, adjust valve positions to reduce flow, etc.), thereby preventing splash-out. If a negative determination is made in step 4078, the process proceeds to step 4088, where pump control logic 84 determines if the operation of any pool devices (e.g., pump, smart valves, etc.) have been altered due to the weather condition (e.g., high winds). If a negative determination is made in step 4088, the process reverts to step 4074. If a positive determination is made in step 4088, pump control logic 84 proceeds to step 4090, where pump control logic 84 transmits an instruction to revert to regular operation of the pool device(s). Optionally, in step 4092, pump control logic 84 could transmit a message to the user (e.g., "Wind Has Subsided"). The process then reverts to step 4074.

FIG. 19AB is a flowchart illustrating processing steps carried out by pump control logic 84 for automatically adjusting operation of the pump in response to weather conditions (e.g., ambient temperature, wind speed, and/or wind chill) to provide freeze protection. This enables pump control logic 84 to provide a lower, more energy efficient setpoint (e.g., minimum speed and temperature). In step 4094, pump control logic 84 retrieves current weather conditions data from memory (e.g., ambient temperature, wind speed, and/or wind chill). The current weather conditions can be obtained by way of the process described herein, in connection with FIG. 19V. In step 4096, pump control logic 84 receives operational data from the pump (e.g., pump speed/flow). In step 4098, pump control logic 84 determines if there is a freeze risk based on the current weather conditions and the speed/flow of the pump. If a negative determination is made (e.g., there is no freeze risk) in step 4098, pump control logic 84 returns to step 4094. If a positive determination is made (e.g., there is a freeze risk) in step 4098, pump control logic 84 transmits an instruction to the pump to increase speed/flow. Pump control logic 84 then reverts to step 4094.

FIG. 19AC is a flowchart illustrating processing steps carried out by pump control logic 84 for adjusting the operation of the pump to meet the needs of other pool/spa equipment. For example, pump control logic 84 could increase the speed/flow of the pump in response to an increase in the output of the heater, necessitated by a drop in ambient temperature (e.g., heater output increased to maintain desired pool/spa temperature). In step 4102, the heater output is increased (e.g., due to a drop in ambient temperature). In step 4104, pump control logic 84 receives operational data from the heater (e.g., current or requested BTU output). In step 4106, pump control logic 84 determines if an increase in pump speed/flow is required based on the operational data received from the heater. If a negative determination is made in step 4106, pump control logic 84 returns to step 4104. If a positive determination is made in step 4106, pump control logic 84 proceeds to step 4108, where an instruction is transmitted to the pump to increase speed/flow. Pump control logic 84 then returns to step 4104. While the foregoing process steps are discussed in connection with the pump control logic 84 adjusting the operation of the pump in response to the needs of the heater during a drop in ambient temperature, it is contemplated that pump control logic 84 can adjust the operation of the pump in response to the needs of any of the installed pool/spa equipment disclosed herein.

FIG. 19AD is a flowchart illustrating processing steps carried out by the pump control logic 84 for determining and running a mode of operation based on the time of day (e.g., daytime or evening) or time of year (e.g., season). In step 4110, pump control logic 84 receives an IP address from a smart device on a local network. In step 4112, pump control logic 84 receives location data based on the IP address (e.g., web data/geolocation provider). In step 4114, pump control logic 84 receives web data on sunrise/sunset times (based on ZIP code, location/address, or GPS coordinates, discussed hereinbelow). It is noted that pump control logic 84 can receive web data through any wired and/or wireless communication protocols disclosed herein. In step 4116, pump control logic 84 saves the sunrise/sunset data to the memory for later retrieval. In step 4118, pump control logic 84 receives current time and date data (e.g., from web or internal clock). In step 4120, pump control logic 84 determines if the current time is between sunrise and sunset (e.g., daytime). If a positive determination is made in step 4120, pump control logic 84 proceeds to step 4122, where pump control logic 84 retrieves equipment setpoints for a daytime operation mode (e.g., pump speed/flow during the day). In step 4124, pump control logic 84 transmits instructions to installed pool/spa equipment to operate at the retrieved setpoints and then pump control logic 84 returns to step 4118. If a negative determination is made in step 4120, pump control logic 84 proceeds to step 4126, where pump control logic 84 retrieves equipment setpoints for an evening operation mode (e.g., pump speed/flow during the evening) and then pump control logic 84 proceeds to step 4124, discussed hereinabove. While the foregoing process steps have been discussed in terms of selecting a mode of operation based on the time of day, it is also contemplated that pump control logic 84 could select the mode of operation based on the time of year (e.g., season). Furthermore the modes of operation could be pre-programmed (e.g., default seasonal modes of operation/programming provided by the manufacturer, pool professional (e.g., service technician, builders, installers, etc.)) or user-defined (e.g., customized modes of operation based on the time of day or season). Optionally, in step 4128, pump control logic 84 could transmit an instruction to the user to enter a ZIP code via a user interface device and in step 4130, pump control logic 84 could receive the ZIP code data from the user interface device. In step 4132, pump control logic 84 could also/alternatively receive GPS data from a smart device on the local network (e.g., smart phone connected to home WiFi).

FIG. 19AE is a flowchart illustrating processing steps carried out by the pump control logic 84 for determining and running a mode of operation based on the amount of sun exposure. In step 4134, pump control logic 84 receives operational data from an ambient light sensor (e.g., sun exposure). In step 4136, pump control logic 84 retrieves ambient light setpoints (e.g., minimum and/or maximum sun exposure for modes of operation) from the memory. In step 4138, pump control logic 84 determines if the current ambient light is above the minimum setpoint. Conversely, pump control logic 84 could also determine if the current ambient light is below the below the minimum setpoint or above or below the maximum setpoint, thereby determining high or low sun exposure. If a positive determination is made in step 4138, pump control logic 84 proceeds to step 4140, where pump control logic 84 retrieves equipment setpoints (e.g., pump speed/flow) for a high sun exposure operation mode. If a negative determination is made in step 4138, pump control logic 84 proceeds to step 4144, where pump control logic 84 retrieves equipment setpoints (e.g., pump speed/flow) for a low sun exposure operation mode. In step 4142, pump control logic 84 transmits an instruction(s) to installed pool/spa equipment to operate at the retrieved setpoints for the current operation mode and then the process reverts to step 4134.

FIG. 19AF is a flowchart illustrating processing steps carried out by pump control logic 84 for minimizing sound pressure when pool occupants are in close proximity to a pumping system. In step 4146, pump control logic 84 receives operational data from a proximity sensor. In step 4148, pump control logic 84 determines if there are pool occupants in close proximity. If a positive determination is made in step 4148, pump control logic 84 proceeds to step 4150, where pump control logic 84 retrieves maximum ambient noise setpoint data for pump operation from the memory (e.g., maximum allowable decibels when occupants are in close proximity to the pump). In step 4152, pump control logic 84 receives ambient noise operational data (e.g., measured decibels from a microphone positioned at or near the pump). In step 4154, pump control logic 84 determined if the measured ambient noise is above the maximum ambient noise setpoint. If a positive determination is made at step 4154, pump control logic 84 proceeds to step 4156, where pump control logic 84 transmits an instruction to the pump to decrease output (e.g., reduce speed by 5%), thereby reducing the decibels generated by the pump. Pump control logic 84 then reverts to step 4152. If a negative determination is made at step 4154, pump control logic 84 reverts to step 4152. If a negative determination is made at step 4148, pump control logic 84 proceeds to step 4158, where pump control logic 84 determines if the operation of the pumping system has been altered (e.g., the output of the pump was previously reduced from normal operating levels). If a negative determination is made in step 4158, pump control logic 84 reverts to step 4146. If a positive determination is made in step 4158, pump control logic 84 proceeds to step 4160, where pump control logic 84 transmits an instruction to the pump system equipment to resume normal operation. Thus, pump control logic 84 could reduce the output of the pumping system to reduce decibel levels when pool occupants are detected, but resume normal operation when pool occupants are no longer present.

FIG. 19AG is a flowchart illustrating processing steps carried out by pump control logic 84 for addressing alert conditions. More specifically, pump control logic 84 could ask the user if it should automatically address the issue and if it should automatically address the issue in the future. In step 4162, pump control logic 84 transmits an alert and recommendation to the user (e.g., "Excessive Motor Heating—Reduce Speed"). The alert and recommendation can be generated as described herein, in connection with FIG. 19D. In step 4164, pump control logic 84 prompts the user for automatic system implementation of the recommendation (e.g., "Reduce Motor Speed?—Y/N"). In step 4166, pump control logic 84 determines if the user elects automatic implementation of the recommendation. If a negative determination is made in step 4166, the process ends. If a positive determination is made in step 4166, pump control logic 84 proceeds to step 4168, where pump control logic 84 prompts the user for automatic implementation of the recommendation for subsequent similar alerts (e.g., "Automatically Address This Alert From Now On?"). In step 4170, pump control logic 84 determines if the user elects automatic implementation for subsequent alerts. If a positive determination is made in step 4170, pump control logic 84 saves the user preference to memory. In step 4174, pump control logic 84 transmits an instruction to the installed pool/spa equipment to implement the recommendation (e.g., reduce motor speed). If a negative determination is made in step 4170, pump control logic 84 proceeds to step 7174 and the process then ends.

FIG. 19AH is a flowchart illustrating processing steps carried out by pump control logic 84 for automatically advising the user of nearby pool service companies when the pumping system, or any other installed pool/spa equipment, needs attention. It is contemplated that pump control logic 84 could notify the user by way of an on-board indicator provided on the pumping system and/or by way of a notification "pushed" out to other devices (e.g., smart devices) via any of the communication protocols disclosed herein. Pump control logic 84 could also automatically notify a user's preferred pool service provider when the pumping system, or any other installed pool/spa equipment, needs attention. In step 4176, pump control logic 84 receives operational data from the installed pool/spa equipment (e.g., temperature of pump motor). In step 4178, pump control logic 84 determines if any of the installed pool/spa equipment is in need of service. Pump control logic 84 can determine if any of the pool/spa equipment is in need of service by way of a similar process as described herein, in connection with FIG. 19D. If a negative determination is made in step 4178, pump control logic 84 returns to step 4176. If a positive determination is made in step 4178, pump control logic 84 proceeds to step 4186, where pump control logic 84 determines the location of the pool/spa. The location of the pool/spa can be determined by way of a similar process as described herein, in connection with FIG. 19V. In step 4188, pump control logic 84 receives web data on local pool service providers (e.g., pool service providers in close proximity to the pool/spa location). In step 4190, pump control logic 84 prompts the user to select a preferred service provider (e.g., from a list of the local pool service providers. In step 4192, pump control logic 84 stores the selected service provider to memory. In step 4194, pump control logic 84 transmits an alert to the selected service provider (e.g., skimmer filter at [address] requires replacement). Optionally, pump control logic 84 could automatically notify a previously selected preferred service provider when any of the pool/spa equipment needs attention. For example, in step 4180, pump control logic 84 could determine if a pool service provider was previously selected. If a negative determination is made in step 4180, pump control logic 84 proceeds to step 4186. If a positive determination is made in step 4180, pump control logic 84 proceeds to step 4182, where pump control logic 84 retrieves the previously selected service provider data from the memory. In step 4184, pump control logic 84 transmits an alert to the previously selected service provider (e.g., skimmer filter at [address] requires replacement). Pump control logic 84 then returns to step 4176. FIG. 19AI is another flowchart illustrating the processing logic of the pump control logic 84. In step 4300, the pump control logic 84 receives an instruction to monitor the status of the filter. In step 4302, the pump control logic 84 retrieves data on the factory specified parameters from memory for flow and/or pressure drop in the pump. In step 4304, the pump control logic 84 receives operational data from a sensor regarding the flow and/or pressure drop in the pump. In step 4306, the pump control logic 84 determines the pressure drop and/or flow rate in the pump. In step 4308, the pump control logic 84 determines whether the pressure and/or flow rate is within the factory specified parameters. If a positive determination is made, the process ends, and if a negative determination is made, the pump control logic 84 proceeds to step 4310 where the appropriate valves are actuated to initiate backwash filtering.

FIG. 19AJ is another flowchart illustrating the processing logic of the pump control logic 84. In step 4312, the pump control logic 84 receives an instruction to monitor the debris on the surface of the pool. In step 4314, the pump control logic 84 receives operational data from the vision system which provides the location and amount of debris in locations of the pool surface. In step 4316, the pump control logic 84 determines the location of high debris area on the pool surface. In step 4318, the pump control logic 84 alters the position of return fittings and the skimmers to remove debris from the pool surface in an efficient and effective manner.

FIG. 19AK is another flowchart illustrating the processing logic of the pump control logic 84. For example, pump control logic 84 could determine the correct water flow for water features by communicating with other pieces of installed pool/spa equipment which advise pump control logic 84 of optimum performance criteria. This logic could reside in other installed pool/spa equipment and be communicated to the pump, or the logic could be contained within the pump itself. In step 4320, the pump control logic 84 receives an instruction to determine the correct flow for a water feature. In step 4322, the pump control logic 84 retrieves data for the water features from memory. The data retrieved can include, but is not limited to, type of water feature, size, capacity, water flow capacity, water flow levels, etc. In step 4324, the pump control logic 84 receives user input, if any, for water feature customization to achieve a custom appearance. For example, a manual mode could be provided to allow the user to specify the desired water feature performance. If there is no user input, then the pump control logic 84 can use the data retrieved in step 4322. In step 4326, the pump control logic 84 can calculate the optimal flow rate based on the characteristics of the water feature. Such characteristics, include but is not limited to, water feature, size, capacity, water flow capacity, water flow levels, etc. In step 4328, the pump control logic 84 receives a schedule for the water features, if any. In step 4330, the pump control logic 84 adjusts the valves of the water feature so that the their operation can be schedule based. In step 4332, the pump control logic 84 transmits the flow rate needed for the water feature. The type of water features can include, but is not limited to, laminars, bubblers, waterfalls, deck jets, fountains, and skuppers.

FIG. 19AL is another flowchart illustrating the processing logic of the pump control logic 84. In step 4334, the pump control logic 84 receives an instruction to provide flow to a heater. In step 4336, the pump control logic 84 retrieves water temperature set point data for heater operation from memory. This data could include minimum and maximum water temperatures set by a user or set by factory specified operating parameters. In step 4338, the pump control logic 84 receives operational temperature data. In step 4340, the pump control logic 84 determines whether the water temperature is below a minimum set point. If a positive determination is made, the pump control logic 84 proceeds to step 4342 to transmit an instruction to provide flow to the heater. If a negative determination is made, the pump control logic 84 proceeds to step 4344 to determine whether the water temperature is above a maximum set point. If a negative determination is made, the process ends. If a positive determination is made, the pump control logic 84 actuates valves to bypass the heater to improve hydraulic efficiency in step 4346.

FIG. 19AM is another flowchart illustrating the processing logic of the pump control logic 84. In step 4348, the pump control logic 84 receives an instruction to activate a heater or monitor or address heating controls. In step 4350, the pump control logic 84 retrieves an optimum flow rate set point data for heater operation from memory. In step 4352, the pump control logic 84 receives operational flow rate and/or valve position data. In this step, the pump control logic 84 receives data from the heat source identifying when the heat source has adequate flow and/or pressure to operate. In step 4354, the pump control logic 84 determines whether the operational data is within the optimal set point range. If a positive determination is made, the pump control logic 84 proceeds to step 4356 to store and/or update current optimal flow rate for each heater device. The pump control logic 84 can store a history of this data. If a negative determination is made, the pump control logic 84 proceeds to step 4358 where a determination is made regarding whether retries are remaining. If a positive determination is made, the pump control logic 84 proceeds to step 4360, to transmit an instruction to increase flow to the heater by five percent. Any other percentage increase could be used. If a negative determination is made, the pump control logic 84 proceeds to step 4362 to transmit an error condition and the process would then end.

FIG. 19AN is another flowchart illustrating the processing logic of the pump control logic 84. In step 4364, the pump control logic 84 receives an instruction to manage a pump. In step 4366, the pump control logic 84 receives operational data from a pool cover. In step 4368, the pump control logic 84 determines whether the pool cover is closed. If a negative determination is made, the pump control logic 84 reverts back to step 4366. If a positive determination is made, the pump control logic 84 proceeds to step 4370 where it retrieves pool configuration parameters from memory such as pool surface area, volume, geometry, water features, etc. in step 4372, the pump control logic 84 determines proper operation of the pump when the pool cover is closed based on the factors retrieved above. In step 4374, the pump control logic 84 determines proper pump speed to ensure the pool cover is not damaged by flooding. In step 4376, the pump control logic 84 can determine the decreased rate of chlorine reduction due to lack of direct sunlight or less solar loading. In step 4378, the pump control logic 84 transmits instructions to pump of the foregoing calculations such as proper pump speed.

FIG. 19AO is another flowchart illustrating the processing logic of the pump control logic 84. In step 4380, the pump control logic 84 receives an instruction to manage the water level in the pool. In step 4382, the pump control logic 84 retrieves pool water level settings from memory. This setting can be user set or set by factory default parameters. In step 4384, the pump control logic 84 receives operational data from a sensor monitoring the water level in a pool. In step 4386, the pump control logic 84 determines whether the water level is within the set point parameters. If a positive determination is made, the pump control logic 84 proceeds to step 4388 to transmit an appropriate message to the user or the system. If a negative determination is made, the pump control logic 84 proceeds to step 4390 to adjust the operation of the pump to allow the water level in the pool to reach the set point parameters. In step 4392, the pump control logic 84 transmit an appropriate message to the user or the system that the water level is not in set point range and that the pump operation has been adjusted to remedy the water level situation.

FIG. 19AP is another flowchart illustrating the processing logic of the pump control logic 84. In step 4394, the pump control logic 84 receives an instruction to manage the operation of the pump based on the number of bathers in the pool. In step 4396, the pump control logic 84 receives operational data from motion sensors. In step 4398, the pump control logic 84 determines the number of bathers in the pool based on the data from the motion sensors. In step 4400, the pump control logic 84 retrieves pool configuration parameters from memory. Such parameters could include, but is not limited to, pool surface area, volume, geometry, etc. The parameters will assist the pump control logic 84 in step 4402 to determine proper pump speed based on the number of bathers in the pool. The pump in step 4402 can adjust its operation based on the number of bathers. Furthermore, the pump control logic 84 could also control other equipment that needs to be deactivated or activated based on the presence and/or number of bathers in the pool. For example, in step 4404, the pump control logic 84 determines whether to activate or deactivate other pool equipment based on the number of bathers in the pool. In step 4406, the pump control logic 84 transmits the deactivation or activation signal to the other equipment.

FIG. 19AQ is another flowchart illustrating the processing logic of the pump control logic 84. In step 4408, the pump control logic 84 receives an instruction to monitor system curve of the pump which is the summation of the dynamic head. In step 4410, the pump control logic 84 retrieves data regarding the pump from memory. In step 4412, the pump control logic 84 receives operational data from sensors monitoring the pump. In step 4414, the pump control logic 84 estimates or calculates the system curve based on the multiple speeds of the pump. Alternatively, pump control logic 84 could estimate or calculate the overall system curve based on a single point. In step 4416, the pump control logic 84 provides an indication of system efficiency rating and alerts trade and/or consumers based on factory defined or selectable changes. In step 4418, the pump control logic 84 provides an indication of system efficiency such as "efficiency mode," "performance mode" etc. and assigns a push button to go to a selected mode with one push of a button. In step 4420, the pump control logic 84 calculates periods of hydraulic inefficiencies and in step 4422, it recommends ways to improve hydraulic efficiency. In step 4424, the pump control logic 84 auto-delivers the correct flow or speed to make the equipment more efficient. For example, pump control logic 84 could measure suction head (negative pressure) on the vacuum side of the pump and measure pressure head on the pressure side of pump, both measurement devices being integral or adjacent to the pump, to derive Total Dynamic Head ("TDH"). An overall System Curve (TDH vs. flow) could also be estimated or calculated from a single point, or generated when measured at multiple speeds when using a multi-speed pump. Further pump control logic 84 could compare the calculated system curve to known industry system curves (e.g., "Curve A", "Curve C", etc.) and determine a hydraulic efficiency "score." Pump control logic 84 could then determine how to improve the efficiency score and then either provide general suggestions to the user to improve said score, or automatically implement the suggestions. In one example, pump control logic 84 could monitor the typical operating flow of the pool/pump and suggest alternate schedules that would achieve the same number of turnovers in a day with lower power consumption.

FIG. 19AR is another flowchart illustrating the processing logic of the pump control logic 84. In step 4426, the pump control logic 84 receives an instruction to monitor demand based operation from local utility companies. In step 4428, the pump control logic 84 retrieves data on factory specified parameters from memory for the utility company. In step 4430, the pump control logic 84 receives operation data of the pump flow. In step 4432, the pump control logic 84 determines whether the pump operational data is within the set point parameters set by the utility company. If a positive determination is made, the pump control logic 84 proceeds to step 4434 where a message is transmitted to the user regarding the pump operational data being within the set point parameters of the utility company and the process ends. If a negative determination is made, the pump control logic 84 proceeds to step 4436 where the pump control logic 84 performs a function or changes the pump operation to conform to the utility company set point parameters. Then in step 4438, the pump control logic 84 transmits a message that the pump operation has changed to conform to the utility company standards.

FIG. 19AS is another flowchart illustrating the processing logic of the pump control logic 84. In step 4440, the pump control logic 84 receives an instruction to provide flow to a selected pool equipment. In step 4442, the pump control logic 84 retrieves data on factory specified parameters from memory for the pumping needs of a selected pool equipment. In step 4444, the pump control logic 84 determines whether the flow data is being defined by the selected pool equipment. If a negative determination is made, the pump control logic 84 proceeds to step 4446 where the pump itself defines the flow parameters for the selected pool equipment based on the flow provided by the pump. If a positive determination is and after step 4446, the pump control logic 84 proceeds to step 4448 where it receives operational data for the flow of the pool equipment. In step 4450, the pump control logic 84 determines whether the flow data is within the set point parameters either defined by the equipment or the pump. If a positive determination is made, a message is transmitted to the user or the system that the flow data is within operating parameters. If a negative determination is made, the pump control logic 84 proceeds to step 4454 where the speed of the pump is increased periodically to meet the demand of the pool equipment and the process again reverts to step 4448 to receiver operational data and make the same determination in step 4450.

FIG. 19AT is another flowchart illustrating the processing logic of the pump control logic 84. In step 4456, the pump control logic 84 receives an instruction to measure the turbidity of the water. In step 4458, the pump control logic 84 retrieves data on factory specified parameters from memory regarding the turbidity of the water. In step 4460, the pump control logic 84 receives operational turbidity data. In step 4462, the pump control logic 84 determines whether the turbidity data is within the specified operating parameters. If a positive determination is made, the pump control logic 84 proceeds to step 4464 where a message is transmitted regarding the turbidity data being within the operating range. If a negative determination is made, the pump control logic 84 proceeds to step 4466 where a determination is made as to whether the user wants to set a blackout time instead of a filter time. If a negative determination is made, the pump control logic 84 proceeds to step 4468 where the pump control logic 84 automatically sets the filter schedule based on turbidity level. If a positive determination is made, the pump control logic 84 sets a blackout time period based on the user input in step 4470. Then in step 4472, the pump control logic 84 adjusts the pump to pump only what is needed to save energy and meet turbidity levels.

FIG. 19AU is another flowchart illustrating the processing logic of the pump control logic 84. In step 4473, the pump control logic 84 receives an instruction to prime the pump. In step 4474, the pump control logic 84 can start the pump at the desired speed, not the prime speed. In step 4476, the pump control logic 84 receives operation data from the pump regarding water detection. In step 4478, the pump control logic 84 determines whether water is detected. If a positive determination is made, the pump control logic 84 proceeds to step 4480 where the priming period timer is cleared and the process ends. If a negative determination is made, the pump control logic 84 proceeds to step 4482 where a timer is started or continued. In step 4484, the pump control logic 84 make a determination as to whether there is time remaining in the timer that was started. If a positive determination is made, the pump control logic 84 decrements the timer and proceeds back to step 4476. If a negative determination is made, the pump control logic 84 proceeds to step 4484 where a determination is made as to whether if the current try is a retry. If a positive determination is made, the pump control logic 84 proceeds to step 4490 where an error condition is transmitted alerting the system or user that the priming failed and the process ends. If a negative determination is made and the current try is the first try, then the pump control logic 84 proceeds to step 4492 where the pump is stopped and allowed to cool. Then in step 4494, the pump control logic 84 reprimes at the maximum rotations per minute until flow return, then immediately the pump control logic 84 will return to the user or firmware desired speed.

The above processes for the pump control logic 84 can also be applied to a pumping system that is able to manage auxiliary pumps used at any given site. Some of the management features can include, but is not limited to, turning auxiliary pumps on/off according to specific schedules, as well as changing the pump speed for a variable speed pump. Indeed, all of the processes for the pump control logic 84 as shown with respect to FIGS. 18-19AU can be applied to auxiliary pumps. Auxiliary pumps can include, but are not limited to, pressure cleaner booster pumps, waterfall pumps, and pumps used for water features or spas.

It is contemplated that any of the various processes in the embodiments described herein in connection with FIGS. 19A-19AU could be incorporated into pump control logic 84 either alone or in any combination. Further any additional processes disclosed herein in connection with pool control logic 70 (e.g., water feature control logic 72, valve actuator control logic 74, cleaner control logic 76, lighting control logic 78, heater control logic 80, chemistry automation control logic 82) could also be incorporated into pump control logic 84 either alone or in any combination. For example, the pump could include or be modularly upgradeable to include any of the various processes in the embodiments described herein in connection with FIGS. 19A-19AU. Further still, any of the flowcharts illustrating processing steps disclosed in connection with pump control logic 84 can be applied to pool control logic 70 (e.g., water feature control logic 72, valve actuator control logic 74, cleaner control logic 76, lighting control logic 78, heater control logic 80, chemistry automation control logic 82).

As mentioned briefly above, embodiments may provide smart valves/smart valve actuators that include an actuator which rotates valves in response to a control signal. In one embodiment, the smart valve actuator may function as a stand-alone control for its associated valve or valves. In another embodiment, the smart valve actuator may operate in conjunction with a control automation system as described herein. In a further embodiments, the smart valve actuator can operate according to a preset, preconfigured, and/or modifiable schedule. The smart valve actuator as described further below may provide for an easier installation and use by untrained installers and users. Further, the smart valve actuator may reduce the time and cost required when needing multiple pumps and ball valves to attain a perfect balance of distributed or shared water features. Additionally the smart valve actuator gives the pool owner control over his water features, the ability to articulate and balance them remotely, and the possibility of providing varied effects on demand.

Traditional (non-smart) valve actuators have been used to electrify a valve to enable remote control. Existing valve actuators have internal or software driven limit switches that the installer can use to program the valve actuator to stop turning the valve at the desired point. This allows a valve to turn to a desired point and deliver a desired effect on a water feature, and prevents the actuator motor from turning the valve to inappropriate positions that may ‘dead-head’ the plumbing, blocking all water flow. However, the installer of such a valve actuator must carefully mount the valve actuator in one of four orientations on top of the valve in order to place the existing 180 degrees of control in the needed orientation with the valve. Then the installer must disassemble the actuator body and carefully re-position two cams so that when the shaft position reaches the desired limit, the cam depresses an internal limit switch and disconnects power to the motor. This installation procedure is time consuming and requires skill.

Traditional (non-smart) valve actuators have also required an AC low-volt power supply to power the actuator’s motor. This power source may require additional circuitry or power transformers to generate this power source dedicated only for use to power the actuator motor. Additionally, traditional valve actuators have only one programmable limit for clockwise and one for counterclockwise actuation. These programmable limits may be set to achieve a particular effect on a water feature, for example causing a pleasing flow on a fountain or a desired height on a deck jet. However, if the water flow or pressure changes at the input port of the valve, the desired effect is lost. Similarly, water flow will change due to pump speed changes, filter media condition, and interaction with the valve position of additional valves in the system or booster pumps that may divert water. Having water features that are influenced by interactions with other equipment and valves results in undesired performance. Installers often add completely isolated plumbing systems only for water features to avoid this undesired behavior. An additional issue with traditional valve actuators is that the cam setting of traditional valves is limited in resolution to the splines present on the actuator drive shaft, and is often too coarse to allow setting for an exact water feature effect. This requires compromise in setting to the nearest setting.

Embodiments provide a smart valve actuator that addresses many of the drawbacks of traditional valve actuators. In one embodiment, a smart valve actuator has the ability to be controlled directly at the device or from the pool automation system in the same manner as one would control a variable speed pump, for example, by providing control of intermediate positions via software control. In one embodiment the smart valve actuator may be addressed automatically from the control. In another embodiment, the control may be given an address of the smart valve actuator that enables the control to transmit fixed and variable commands to the smart valve actuator. Embodiments may provide a number of additional features such as the ability to set minimum and maximum settings for each smart valve actuator to allow for minimum and maximum allowed flow and to set protection limits to prevent the valve from turning to potentially damaging positions. Additional features may enable the configuration/setting of high, medium and low default flow settings and the ability to control positions variably by using, as non-limiting examples, digital or analog + and − buttons, a digital or analog slider, or a rotary knob on the controller or on the actuator to control the flow. In one embodiment LEDs may be provided that allow the pool owner or servicer to identify settings, set points and flow at a glance. In further embodiments, an added flow, temperature or pressure sensor can monitor the water properties of the output flow and automatically adjust the valve position to seek a programmed setpoint and/or an absolute position sensor can allow manual valve actuation without requiring re-synchronization after the motor is re-connected to the shaft, thereby eliminating the need to mount the smart valve actuator in a particular orientation because the device can manage the valve angle over the entire 360 degree rotation of the valve.

The smart valve actuator can be used manually or through automation. The smart valve actuator may sit on an existing valve, may have a valve integral to it on pool equipment plumbing or may be located at a location in the backyard to control a flow of water between one to many plumbed water ports. In one embodiment, the smart valve actuator is capable of receiving from, or giving to, a pool controller, a unique address that enables communication of specific commands and settings between the actuator and its controlling entity. In some embodiments, when controlled by the pool automation system, the smart valve actuator may communicate by communication protocols, including without limitation, RS485, Ethernet, WiFi, Bluetooth, ZWave, Zigbee, thread, cellular or another communication protocol. Wireless control of the smart valve actuator from a web-enabled device or the pool controller may occur in the following embodiments: when the WiFi chip is on main (intelligence) PCB, is attached/plugged into main PCB, is modularly upgraded on the main PCB or in the PCB enclosure, is modularly upgraded on/external to the main PCB enclosure, or is remote to the main PCB enclosure. An antenna may be mounted with, or located remote to, the WiFi chip for all prescribed locations/methods described above. The smart valve actuator may also allow pool controlling devices to communicate directly with web-enabled devices (e.g.: phone, tablets, phones, thermostats, voice enabled devices, etc. . . . ) without the need to go through a home router.

The smart valve actuator can be configured to set specific open and close valve settings, and it can be defaulted or configured with default settings for low flow, medium flow, high flow, or programmable flow at varied angles. These flow rates can be used to dial in settings when a pump is powering the water associated with water features. In some cases these flow rates can be used to achieve the desired outcome at the lowest flow increasing the pool's energy efficiency. The smart valve actuator's position may be variably controlled in a number of ways, such as without limitation, by using push and hold digital or analog buttons, digital or analog + and − buttons, a digital or analog slider, and/or a rotary knob on the controller or on the actuator to control the flow.

In one embodiment, the smart valve actuator may be used to automate filter valves and their associated positions such as, for example, filter, backwash, rinse, waste, closed, recirculate, and winterize. An additional benefit of the smart valve actuator is that it may allow filters and valves to be bypassed when not required for certain applications, such as when operating an attached spa, thereby improving flow and energy efficiency. In another embodiments, the smart valve actuator could be used in connection with the addition of chemicals (e.g., ORP, pH, free chlorine, etc.) to the pool/spa. For example, the smart valve actuator could be used to integrate the automation of various positions for tablet feeding automation.

In an embodiment, the smart valve actuator may be used to automatically manage water flow needed for operation of suction and pressure cleaners. When a smart valve actuator is used in conjunction with a variable speed pump, the pump may be able to increase its speed to deliver the flow necessary for proper operation of a suction or pressure cleaner, thereby maximizing energy savings when compared to running the variable speed pump at a higher speed throughout the day. In one embodiment, the smart valve actuator control may set angles via commands. The commands may be stored in the controller or the actuator processor. The change in settings may be done automatically; may be done through power interruption to move to the next setting, may be done through time duration of the power interruption; and may be done with a manual setting on the actuator.

Among its features, the smart valve actuator may have 1 to many increments with increments set at 0.5 degrees for 180 degrees, or other resolution or range. The smart valve actuator may measure the angle set manually and store that position in memory for use as one of its default settings. In one embodiment the smart valve actuator may include sensor capabilities to measure the temperature, flow rates and/or pressure of the input water or output water when the valve is diverted and be able to use the measured parameters to turn the motor to achieve a desired setpoint. The flow sensing or pressure sensing may be built into the smart valve actuator or may be attained by a secondary flow sensor.

In one embodiment, a stored setpoint flow/pressure level may be used by a PID loop (or other control algorithm) to turn the valve to a needed position to achieve the flow and the smart valve actuator may update the position if conditions (pressure, flow, etc.) changes.

As noted, the smart valve actuator provides a number of improvements over traditional (non-smart) valve actuators. For example, the smart valve actuator may manage a fluid level in a spa with a sensor or may manage return valves from a spa to prevent the spa from emptying or overfilling via level sensing. The smart valve actuator may block a water feature flow if ambient temperatures are too low thus providing a valve-controlled freeze protection. For example, the smart valve actuator may be operated by a bi-metallic switch as an input that reverses the motor at low temperatures (no circuit board needed). The smart valve actuator may communicate with a pool cover sensor input that prevents activation of a water feature if the pool cover is closed. Additionally, in some embodiments, the smart valve actuator may open a solar panel return if the solar panel temperature has reached a desired setpoint. In one embodiment, the smart valve actuator may include a wind sensor and block a water feature flow if forecasted wind (retrieved from the web) is too high. For example, the smart valve actuator may reverse the motor at higher wind speeds to stop water features from dumping water out of the pool. The smart valve actuator may also block a water feature if flooding is sensed by float or conductivity sensing. In one embodiment, the smart valve actuator may include a dual input power capability that can accept either AC power inputs or DC power input to power the motor. Further, in some embodiments, the smart valve actuator can include a handle, or the like, to provide for manual operation of the smart valve actuator, if necessary, during loss of power (e.g., power cable being cut) or loss of communication (e.g., communications cable being cut, electronics failure, etc.) to the smart valve actuator.

Among the improvements made possible through the use of the smart valve actuator as described herein are increased efficiency in the pool system. For example, in one embodiment, the smart valve actuator may monitor energy saving interactions with a pump to support a minimum required speed to achieve requested flows in all of the active water features. This approach may enable all water to go through the water features and none through the return jets because of 100% efficiency. Similarly, the smart valve actuator may request a higher RPM if the desired flow cannot be achieved (a pump runs only at filtration speed, but if a water feature is turned on, the smart valve actuator controller can request increased speed if the flow setpoint cannot be achieved). The smart valve actuator position may also be adjusted to see if a desired flow rate can be achieved at the filtration flow rate. Calculations may be performed to determine the most efficient pump speed to achieve the desired results by algorithm or by communication from the pump of the power draw. The use of the smart valve actuator may facilitate measuring and reporting excess flow by comparing the controlled quantity to the valve position and computing the margin available; i.e. determining if the pump speed is higher than needed to achieve the requested water feature flow. The computation may indicate what reduction in pump speed may be implemented.

Embodiments may perform flow sensing and pressure sensing. For example, flow may be measured with a paddle wheel or a turbine and interpreted by a co-located processor or remotely located processor. Flow may also be measured with ultrasonic doppler methods, thermal mass/dispersion methods, magnetic/induction methods, optical methods, etc. Pressure sensing may be performed with a flow sensor mounted on a pipe, or a tube run from the pipe to a sensor mounted on the circuit board. Methods for pressure sensing include strain gage piezoresistive methods, capacitive methods, magnetic diaphragm displacement methods, optical methods, resonant frequency methods, etc. The smart valve actuator may also utilize a temperature sensor. For example, temperature sensing can determine ambient temperature, remote solar panel temperature, or water temperature at the input or output ports.

In some embodiments, the smart valve actuator may include protection features for the pool system. The protection features may include stored limits of damaging valve positions and undesired valve positions along with software to automatically restore permitted valve positions after manual actuation of the valve or understand its position upon power-up to assure that the valve is in the correct position. Additionally, the smart valve actuator may facilitate motor current monitoring and input voltage monitoring to initiate scale-back or shutdown to protect life and prevent internal damage to pool system components.

In one embodiment, the pool system may have a ‘legacy’ mode that can accept travel limit settings via pushbutton or power interrupt signaling from the controller. This legacy mode can be implemented by disconnecting the motor from the drive shaft and signaling the software by timed direction reversals, wireless communication, or a physical or magnetic pushbutton. In some embodiments, software can learn the relationship between valve angle and measured parameters and predict if a requested setting is possible based on a simulation of what valve angle will be needed to achieve the desired effect. In one embodiment the software may contain methods to prevent ‘hunting’ or needless motor activation for minor fluctuations of the measured parameters. Further, the motor drive software may generate stepper motor signals to drive the motor faster or slower than current products based on synchronous motors.

Figure 20:
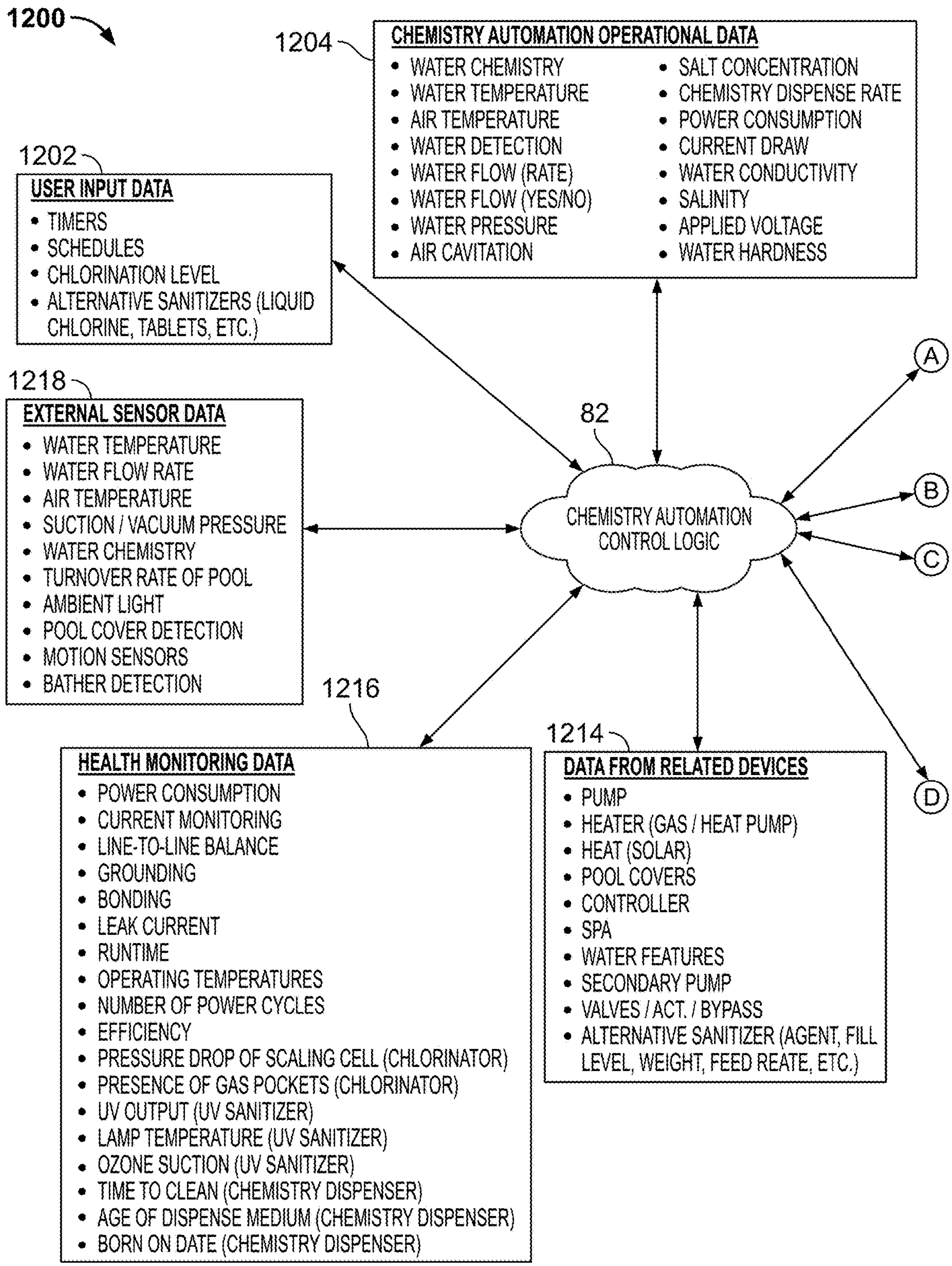
FIG. 20 is a diagram illustrating chemistry automation control logic of FIG. 3.
Figure 20:
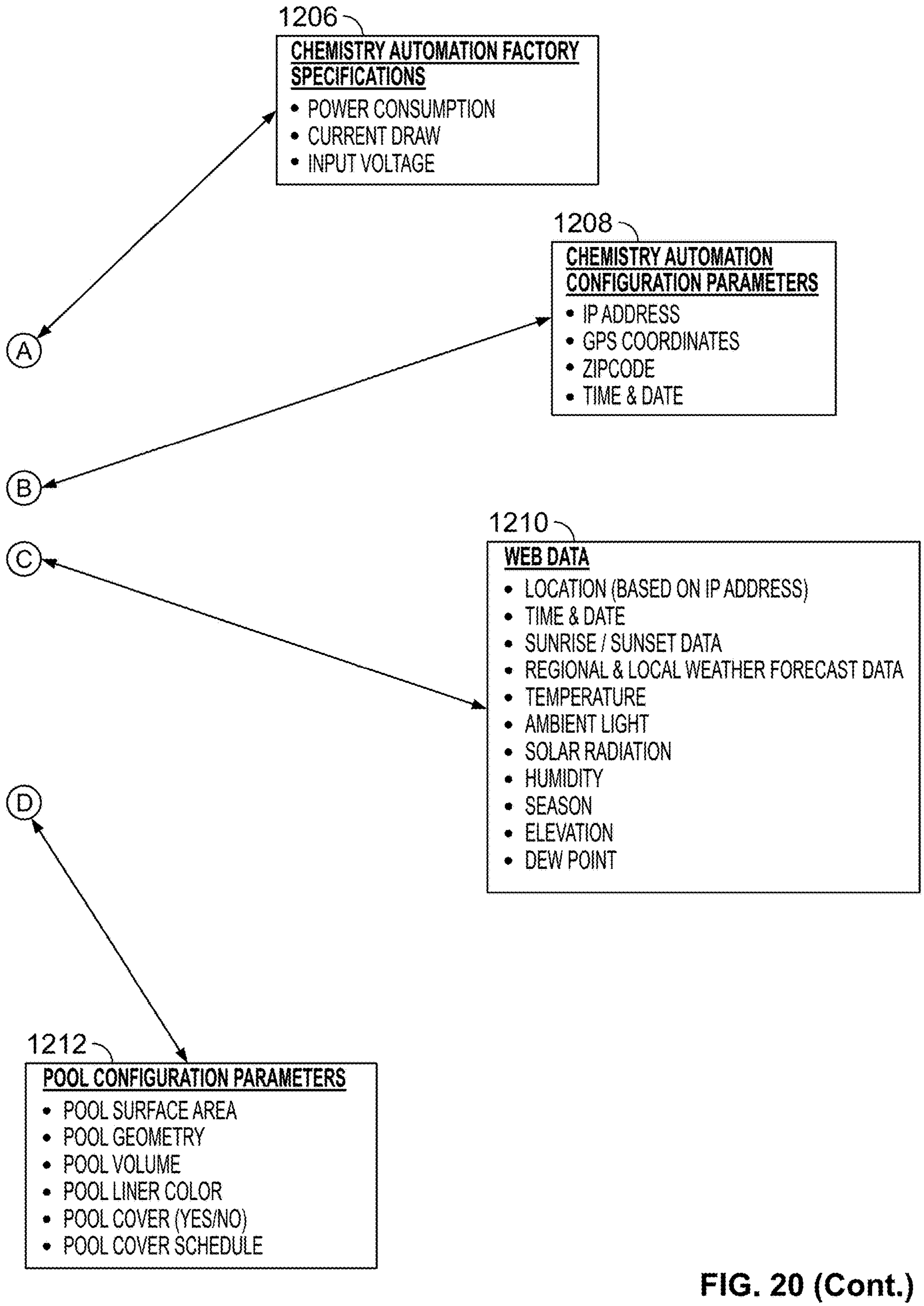

FIG. 20 is a diagram 1200 illustrating chemistry automation control logic 82. Chemistry automation control logic 82 could incorporate and/or be in communication with a variety of types of data and/or data sources. More specifically, chemistry automation control logic 82 can communicate with, or receive, user input data 1202, chemistry automation operational data 1204, chemistry automation factory specifications 1206, chemistry automation configuration parameters 1208, web data 1210, pool configuration parameters 1212, data from related devices 124, health monitoring data 1216, and/or external sensor data 1218.

User input data 1202 could include timers, schedules (e.g., on/off, what speed, operation duration, etc.), chlorination levels, alternative sanitizers (e.g., liquid, chlorine, tablets, etc.), etc. Chemistry automation operational data 1204 could include water chemistry, water temperature, air temperature, water detection, water flow (rate), water flow (yes/no), water pressure, air cavitation, salt concentration, chemistry dispense rate, power consumption, current draw, water conductivity, salinity, applied voltage, water hardness, etc. Chemistry automation factory specifications 1206 could include power consumption, current draw, input voltage, etc. Chemistry automation configuration parameters 1208 could include IP address, GPS coordinates, zip code, time and date, etc. Web data 1210 could include location (based on IP address), time and date, sunrise/sunset data, regional and local weather forecast data, temperature, ambient light, solar radiation, humidity, season, elevation, dew point, etc. In one example the chemistry automation logic 82 could shift operation based on weather input. Pool configuration parameters 1212 could include pool surface area, pool geometry, pool liner color, pool cover (yes/no), volume, etc. Data from related devices 1214 could include data relating to at least the following: pump(s), heater(s) (gas/heat pump), heat (solar), pool covers, controller(s), spa(s), water feature(s), secondary pump(s), valves/actuators/bypasses, alternative sanitizers (agent, fill level, weight, feed rate, etc.), etc. In one example, the chemistry automation control logic 82 could receive input from an external device to identify an operating profile. Health monitoring data 1216 could include power consumption, current monitoring, line-to-line balance, grounding, bonding, leak current, runtime, operating temperatures, number of power cycles, efficiency, pressure drop of scaling cell (chlorinator), presence of gas pockets (chlorinator), ultraviolet output (UV sanitizer), ozone suction (UV sanitizer), lamp temperature (UV sanitizer), time to clean (chemistry dispenser), age of dispense medium (chemistry dispenser), born on date (chemistry dispenser), etc. External sensor data 1218, could include water temperature, water flow rate, air temperature, suction/vacuum pressure, water chemistry, turnover rate of pool, ambient light, pool cover detection, motion sensors, bather detection, salt concentration, pH, water hardness, cyanuric acid levels, turbidity, ozone concentrations, algae, microbial populations, phosphate levels, nitrate levels, water level, bather load, etc. It is noted that, the chemistry automation control logic 82 could sample the water from various locations, including ports, as well as offline sensing equipment. It is further noted that the external sensor data 1218 (as well as external sensor data received by any and/or all of the control logic systems 72-83) can be received from sensors in a plurality of locations, including but not limited to, the pool pad, in the pool itself, or remote from the pool. Additionally, the chemistry automation control logic 82 can receive learned information and a pool cover schedule. While it may be desirable for external sensors to monitor/provide data on as many system parameters as possible (thereby providing greater optimization, automation, and user/operator comfort), it is contemplated that some systems need not utilize an external sensor to monitor every system parameter. For example, if a particular pool chemistry sensor has not been installed in a particular system, the user/operator can provide this information by first determining the pool chemistry (e.g., by manually testing the pool chemistry by conventional means that are well known to the art) and then entering the pool chemistry information into the system via a user interface.

Figure 21A:
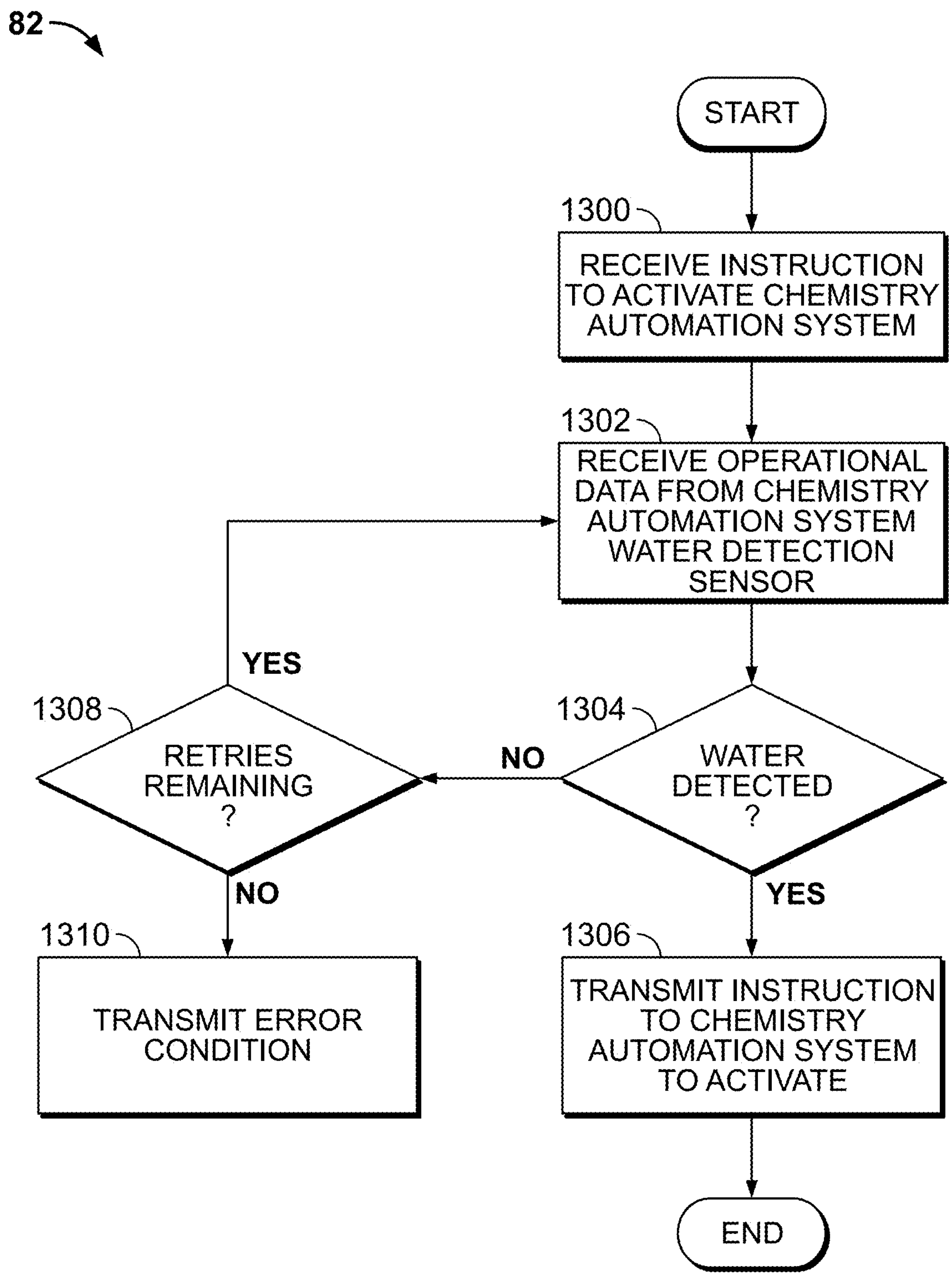
FIGS. 21A-21I are flowcharts illustrating processing steps of the chemistry automation control logic of FIG. 3.

FIGS. 21A-21I are flowcharts illustrating processing steps of the chemistry automation control logic 82. FIG. 21A is a flowchart illustrating processing logic of the chemistry automation control logic 82 communicating with a chemistry automation system. In step 1300, the chemistry automation control logic 82 receives an instruction to activate the chemistry automation system. In step 1302, the chemistry automation control logic 82 receives operational data from the chemistry automation system water detection sensor. The chemistry automation system water detection sensor can be, for example, a flow switch, flow meter, current flow ("gas sensor"), etc. In step 1304, the chemistry automation control logic 82 determines if water is detected. If a positive determination is made, then the chemistry automation control logic 82 proceeds to step 1306 where it transmits an instruction to the chemistry automation system to activate, and the process ends. If a negative determination is made, then the chemistry automation control logic 82 proceeds to step 1308 where it determines if there are any retries remaining. For example, in step 1308 the chemistry automation control logic 82 could determines if there are any retries remaining for a timer (e.g., 1 hour, 6 hours, 24 hours, or any other suitable time interval), or if there has been no flow detected over the same period of time. If a positive determination is made, e.g., the twenty-four hour timer has not expired, then the process returns to step 1302 and continues from there. If a negative determination is made, e.g., the twenty-four hour timer has expired indicating that there has been no flow over a twenty-four hour period, then the process proceeds to step 1310 where an error condition is transmitted, and the process ends.

Figure 21B:
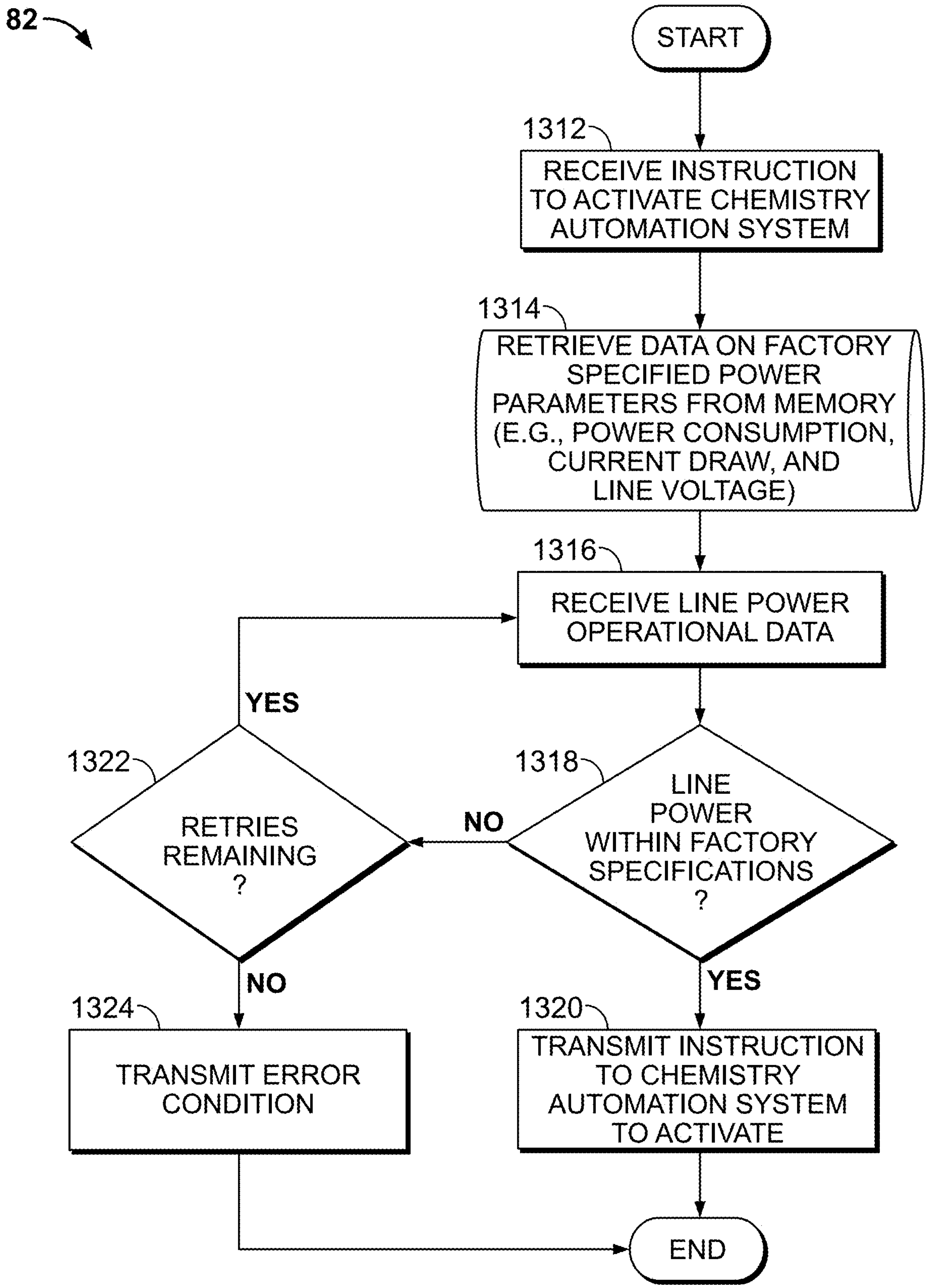

FIG. 21B is another flowchart illustrating processing logic of the chemistry automation control logic 82 communicating with a chemistry automation system. In step 1312, the chemistry automation control logic 82 receives an instruction to activate the chemistry automation system. In step 1314, the chemistry automation control logic 82 retrieves data on factory specified power parameters from memory (e.g., power consumption, current draw, and line voltage). In step 1316, the chemistry automation control logic 82 receives line power operational data. In step 1318, the chemistry automation control logic 82 determines if the line power is within factory specifications. If a positive determination is made, then the chemistry automation control logic 82 proceeds to step 1320 where it transmits an instruction to the chemistry automation system to activate, and the process ends. If a negative determination is made, then the chemistry automation control logic 82 proceeds to step 1322 where it determines if there are any retries remaining. If a positive determination is made, then the process returns to step 1316 and continues from there. If a negative determination is made, then the process proceeds to step 1324 where an error condition is transmitted, and the process ends.

Figure 21C:
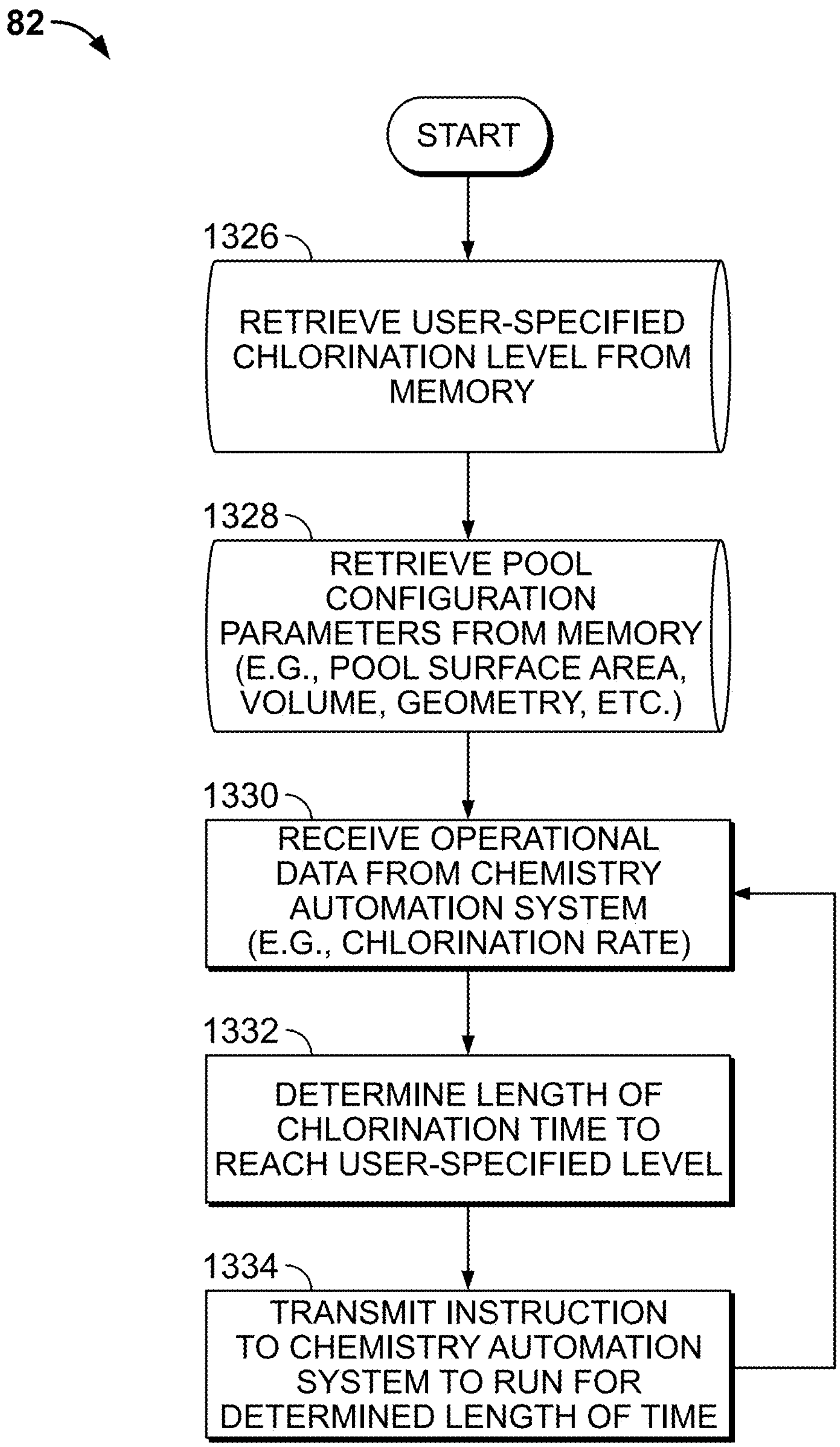

FIG. 21C is another flowchart illustrating processing logic of the chemistry automation control logic 82 communicating with a chemistry automation system. In step 1326, the chemistry automation control logic 82 retrieves user-specified chlorination levels from memory. In step 1328, the chemistry automation control logic 82 retrieves pool configuration parameters from memory, e.g., pool surface area, volume, geometry, etc. In step 1330, the chemistry automation control logic 82 receives operational data from the chemistry automation system, e.g., chlorination rate. In step 1332, chemistry automation control logic 82 determines the length of chlorination time to reach the user-specified level. In step 1334, chemistry automation control logic 82 transmits an instruction to the chemistry automation system to run for the determined length of time, and then returns to step 1330.

Figure 21D:
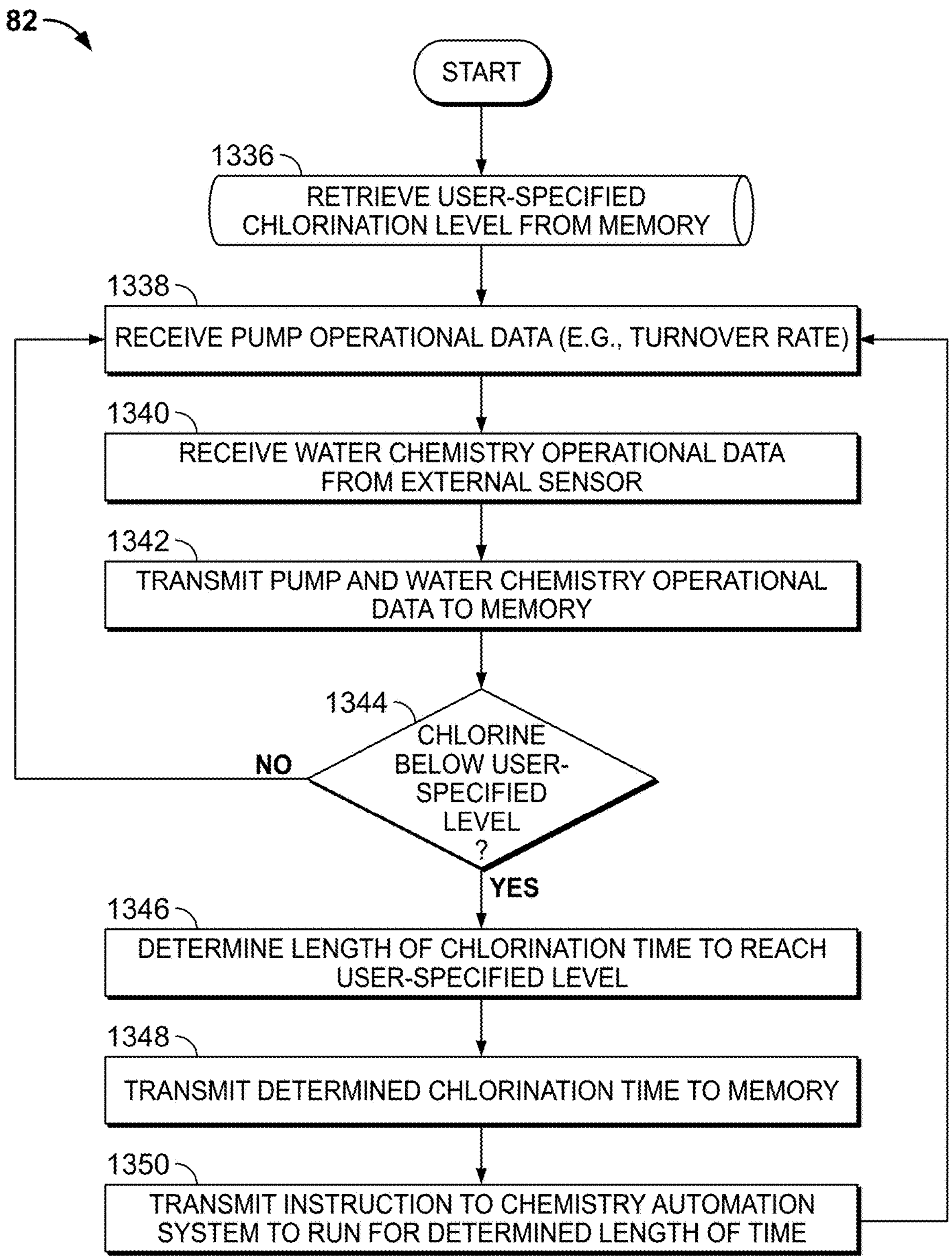

FIG. 21D is another flowchart illustrating processing logic of the chemistry automation control logic 82 communicating with a chemistry automation system. In step 1336, the chemistry automation control logic 82 retrieves user-specified chlorination levels from memory. In step 1338, the chemistry automation control logic 82 receives pump operational data, e.g., turnover rate. In step 1340, the chemistry automation control logic 82 receives water chemistry operational data from external sensors. In step 1342, chemistry automation control logic 82 transmits pump and water chemistry operational data to memory. In step 1344, the chemistry automation control logic 82 determines if the chlorine level is below the user-specified level. If a negative determination is made, then the chemistry automation control logic 82 returns to step 1338 and continues from there.

If a positive determination is made, then the chemistry automation control logic 82 proceeds to step 1346 where it determines the length of chlorination time required to reach the user-specified chlorine level. In step 1348, the chemistry automation control logic 82 transmits the determined chlorination time to memory. In step 1350, the chemistry automation control logic 82 transmits an instruction to the chemistry automation system to run for the determined length of time, and then returns to step 1338.

Figure 21E:
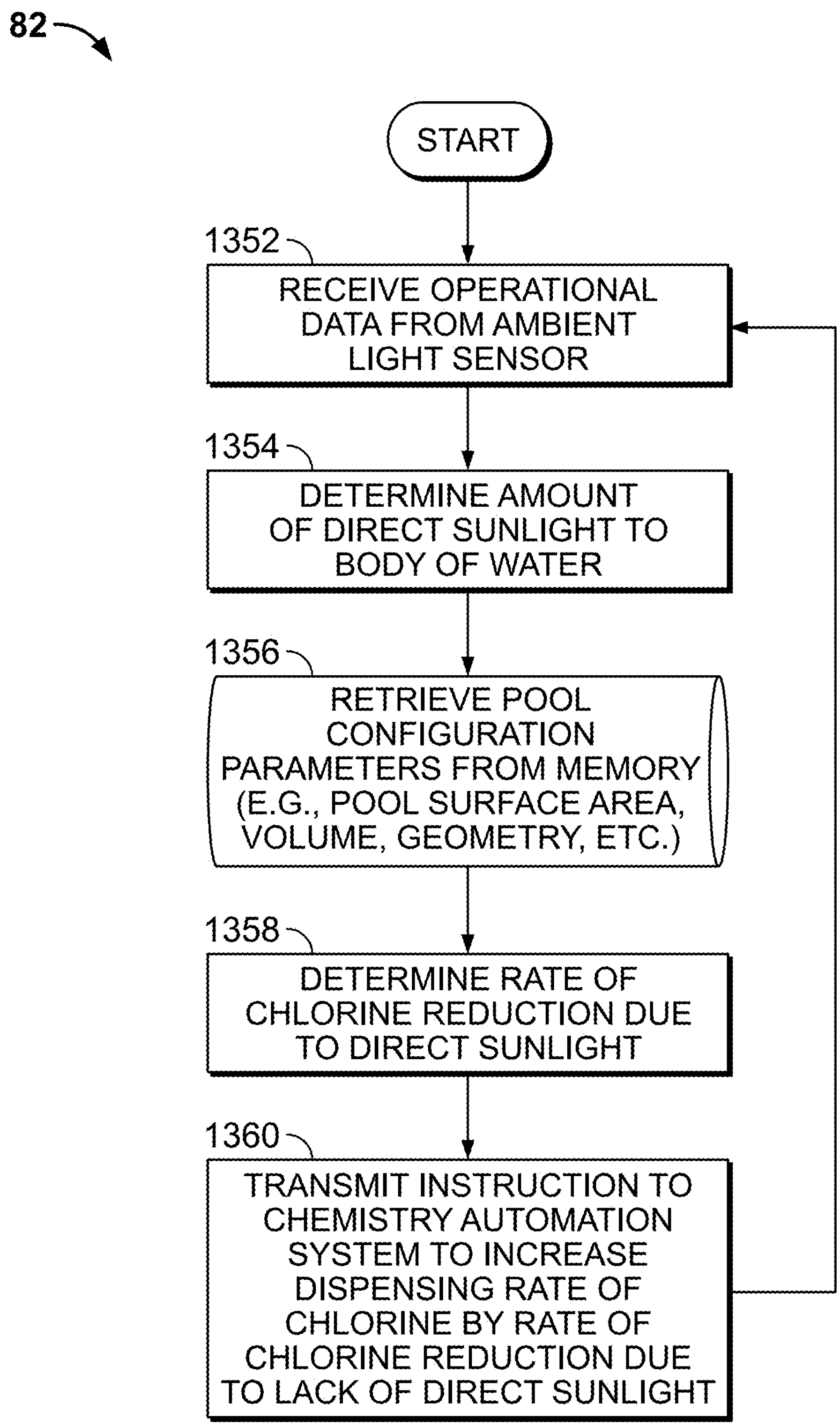

FIG. 21E is another flowchart illustrating processing logic of the chemistry automation control logic 82 communicating with a chemistry automation system. In step 1352, the chemistry automation control logic 82 receives operational data from ambient light sensors. In step 1354, the chemistry automation control logic 82 determines the amount of direct sunlight to a body of water. In step 1356, the chemistry automation control logic 82 retrieves pool configuration parameters from memory, e.g., pool surface area, volume, geometry, etc. In step 1358, the chemistry automation control logic 82 determines the rate of chlorine reduction due to direct sunlight. In step 1360, the chemistry automation control logic 82 transmits an instruction to the chemistry automation system to increase dispensing rate of chlorine by rate of chlorine reduction due to direct sunlight, and then returns to step 1352.

Figure 21F:
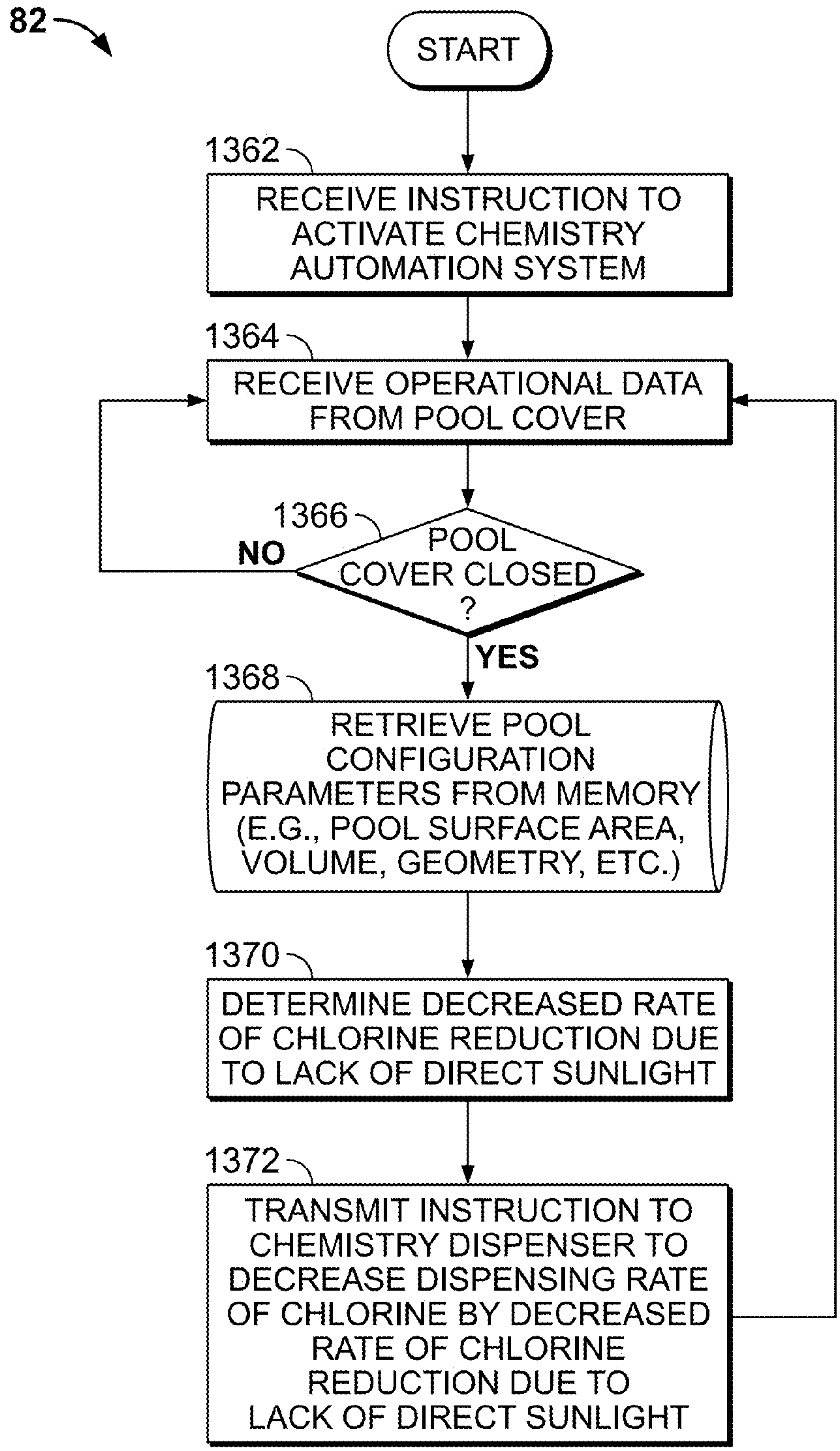

FIG. 21F is another flowchart illustrating processing logic of the chemistry automation control logic 82 communicating with a chemistry automation system. In step 1362, the chemistry automation control logic 82 receives an instruction to activate the chemistry automation system. In step 1364, the chemistry automation control logic 82 receives operational data from the pool cover. In step 1366, the chemistry automation control logic 82 determines if the pool cover is closed. If a negative determination is made, then the chemistry automation control logic 82 returns to step 1364 and continues from there. If a positive determination is made, then the chemistry automation control logic 82 proceeds to step 1368 where it retrieves pool configuration parameters from memory, e.g., pool surface area, volume, geometry, etc. In step 1370, the chemistry automation control logic 82 determines the decreased rate of chlorine reduction due to lack of direct sunlight. In step 1372, the chemistry automation control logic 82 transmits an instruction to the chemistry automation system to decrease the dispensing rate of chlorine by the decreased rate of chlorine reduction due to lack of direct sunlight, and then returns to step 1364.

Figure 21G:
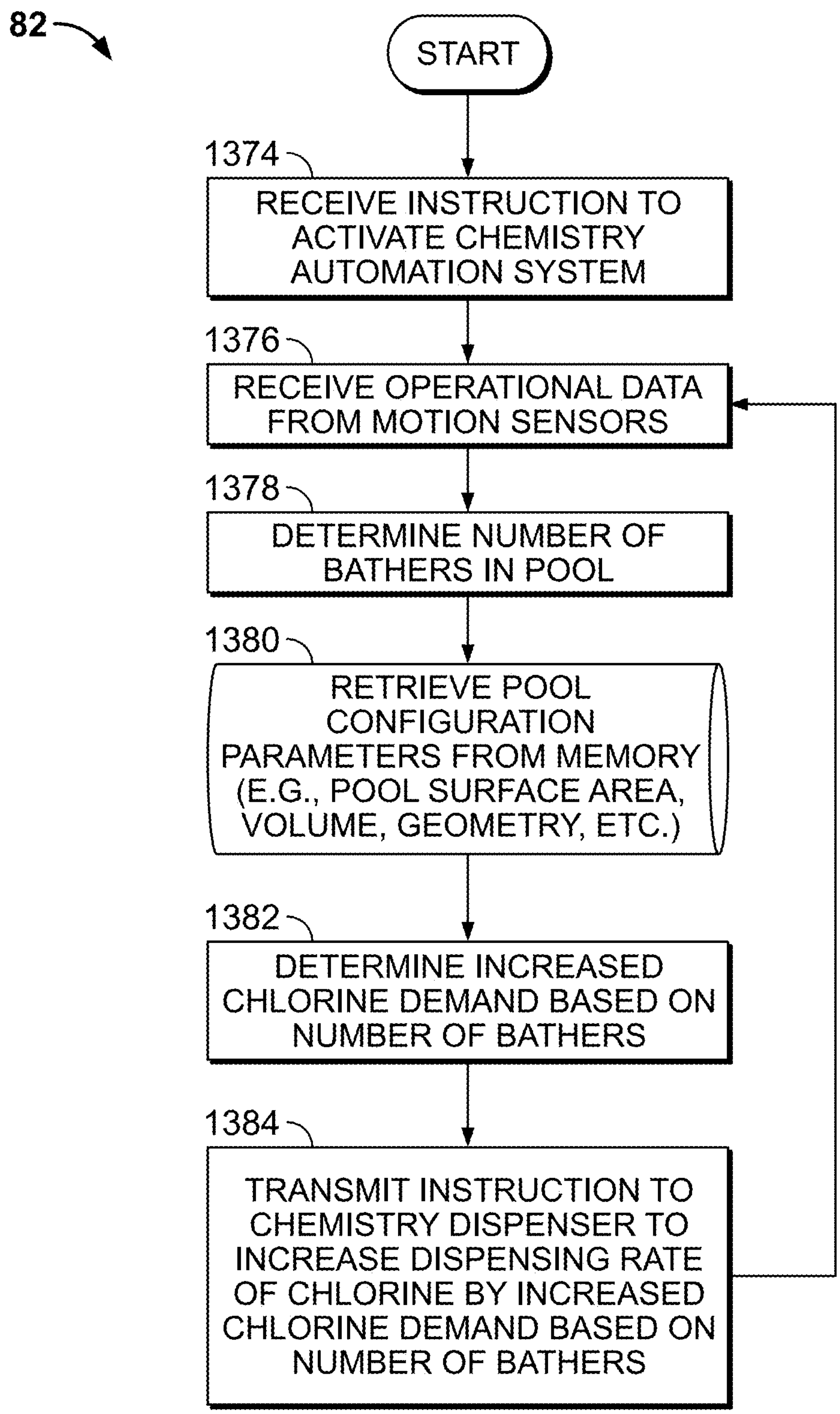

FIG. 21G is another flowchart illustrating processing logic of the chemistry automation control logic 82 communicating with a chemistry automation system. In step 1374, the chemistry automation control logic 82 receives an instruction to activate the chemistry automation system. In step 1376, the chemistry automation control logic 82 receives operational data from the motion sensors. In step 1378, the chemistry automation control logic 82 determines the number of bathers in the pool. In step 1380, the chemistry automation control logic 82 retrieves pool configuration parameters from memory, e.g., pool surface area, volume, geometry, etc. In step 1382, the chemistry automation control logic 82 determines an increased chlorine demand based on the number of bathers. In step 1384, the chemistry automation control logic 82 transmits an instruction to the chemistry automation system to increase the dispensing rate of chlorine by the increased chlorine demand based on the number of bathers, and then returns to step 1376.

Figure 21H:
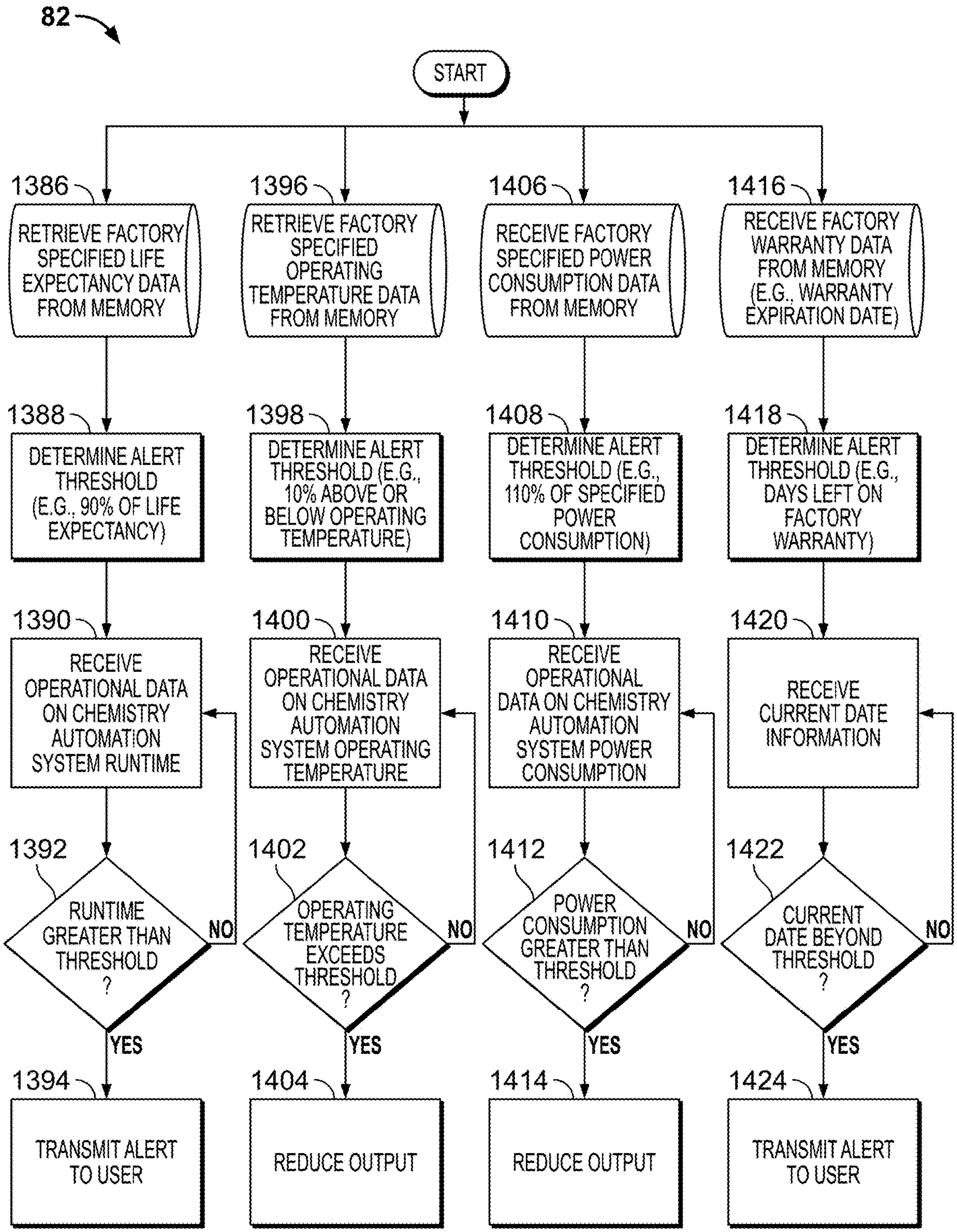

FIG. 21H is a flowchart illustrating processing logic of the chemistry automation control logic 82 determining alert conditions of a chemistry automation system. The chemistry automation control logic 82 proceeds with four parallel routine sequences that respectively begin with steps 1386, 1396, 1406, 1416. Each routine sequence is discussed sequentially, though it should be understood that the routine loops could operate in parallel, or alternatively, in series with each other. The first sequence begins in step 1386 where the chemistry automation control logic 82 retrieves factory specified life expectancy data from memory. In step 1388, the chemistry automation control logic 82 determines an alert threshold, e.g., less than 90% of chemistry automation life expectancy remaining or runtime value. In step 1390, the chemistry automation control logic 82 receives operational data on chemistry automation runtime. In step 1392, the chemistry automation control logic 82 determines if the chemistry automation runtime is greater than the threshold. If a negative determination is made, then the process returns to step 1390 and continues to receive operational data on chemistry automation runtime. If a positive determination is made, then the process proceeds to step 1394 where an alert is transmitted to a user, and the process ends.

The second sequence begins in step 1396 where the chemistry automation control logic 82 retrieves factory specified operating temperature data from memory. In step 1398, the chemistry automation control logic 82 determines an alert threshold, e.g., a temperature value that is 10% above or below operating temperature. In step 1400, the chemistry automation control logic 82 receives operational data on chemistry automation system operating temperature. In step 1402, the chemistry automation control logic 82 determines if the chemistry automation system operating temperature exceeds the threshold, or is outside of a threshold range. If a negative determination is made, then the process returns to step 1400 and continues to receive operational data on chemistry automation system operating temperature. If a positive determination is made, then the process proceeds to step 1404 where the chemistry automation control logic 82 reduces the output of the chemistry automation system.

The third sequence begins in step 1406 where the chemistry automation control logic 82 retrieves factory specified power consumption data from memory. In step 1408, the chemistry automation control logic 82 determines an alert threshold, e.g., power value that is 110% of specified power consumption. In step 1410, the chemistry automation control logic 82 receives operational data on chemistry automation system power consumption. In step 1412, the chemistry automation control logic 82 determines if the chemistry automation system power consumption is greater than the threshold. If a negative determination is made, then the process returns to step 1410 and continues to receive operational data on chemistry automation system power consumption. If a positive determination is made, then the process proceeds to step 1414 where the chemistry automation control logic 82 reduces the output of the chemistry automation system.

The fourth sequence begins in step 1416 where the chemistry automation control logic 82 retrieves factory warranty data from memory, e.g., a warranty expiration date. In step 1418, the chemistry automation control logic 82 determines an alert threshold, e.g., days left on factory warranty. In step 1420, the chemistry automation control logic 82 receives current date information. In step 1422, the chemistry automation control logic 82 determines if the current date is beyond the threshold date or the number of days remaining is below the threshold date. If a negative determination is made, then the process returns to step 1420 and continues to receive current date information. If a positive determination is made, then the process proceeds to step 1424 where an alert is transmitted to a user, and the process ends.

Figure 21I:
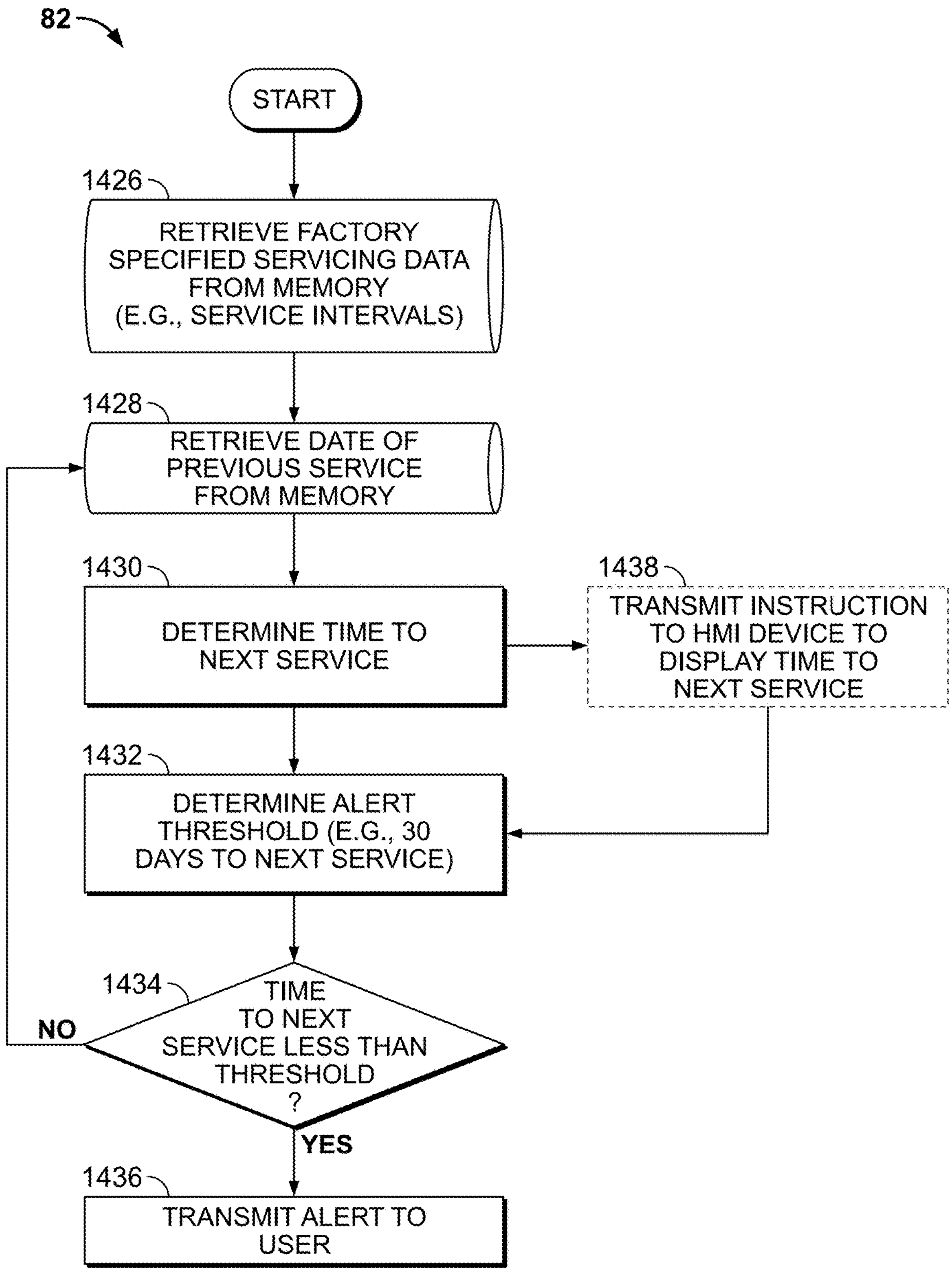

FIG. 21I is another flowchart illustrating processing logic of the chemistry automation control logic 82 communicating with a chemistry automation system. In step 1426, the chemistry automation control logic 82 retrieves factory specified servicing data from memory, e.g., service intervals. In step 1428, the chemistry automation control logic 82 retrieves date of previous service from memory. In step 1430, the chemistry automation control logic 82 determines the time to the next service and then proceeds to steps 1432 and 1438. In step 1438, the chemistry automation control logic 82 transmits an instruction to the human-machine interface device to display the time to the next service. In step 1432, the chemistry automation control logic 82 determines the alert threshold, e.g., 30 days to next service. In step 1434, the chemistry automation control logic 82 determines if the time to the next service is less than the threshold. If a negative determination is made, then the process returns to step 1428 and continues to receive the date of pervious service from memory. If a positive determination is made, then the process proceeds to step 1436 where the chemistry automation control logic 82 transmits an alert to the user.

Figure 22:
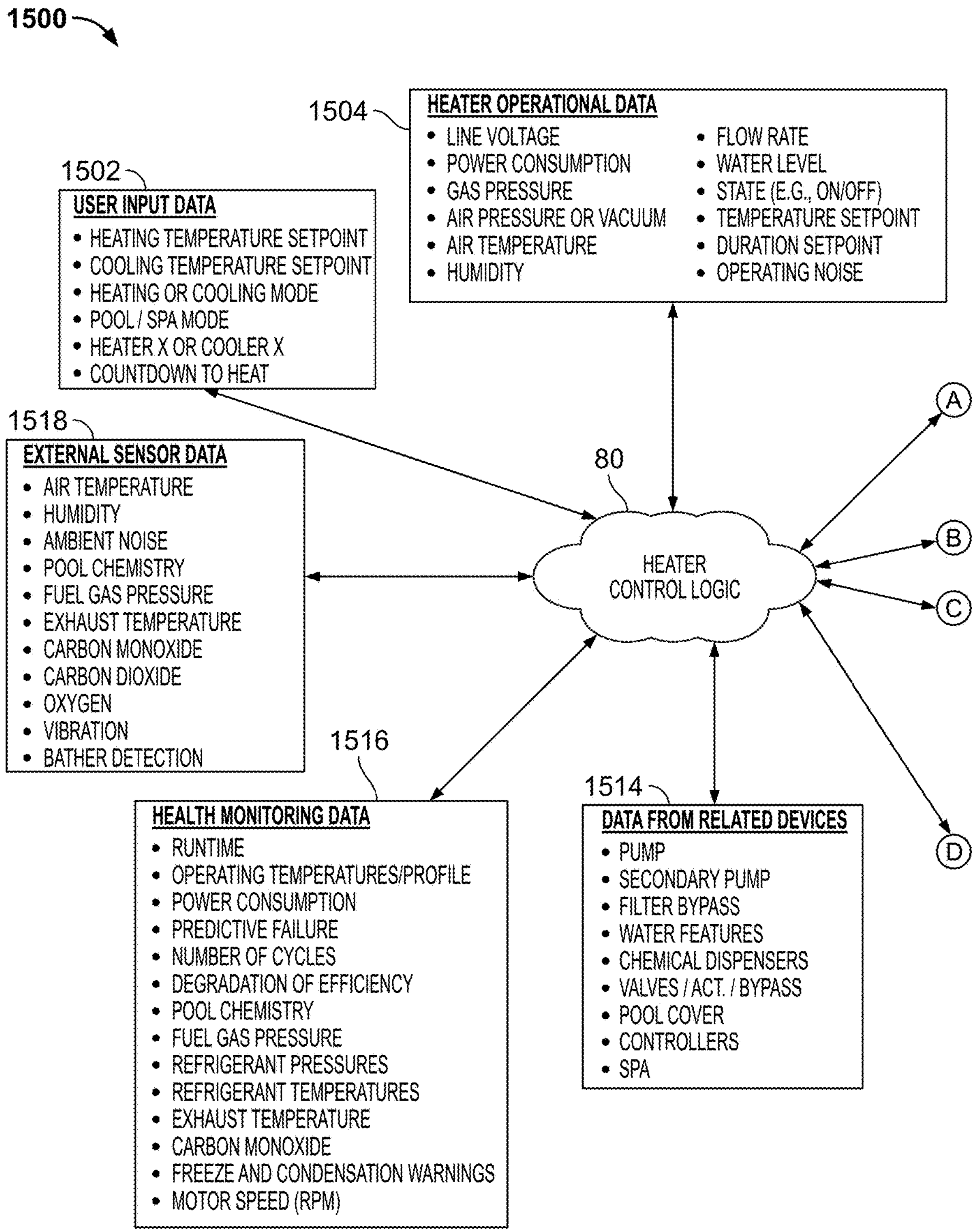
FIG. 22 is a diagram illustrating the heater control logic of FIG. 3.
Figure 22:
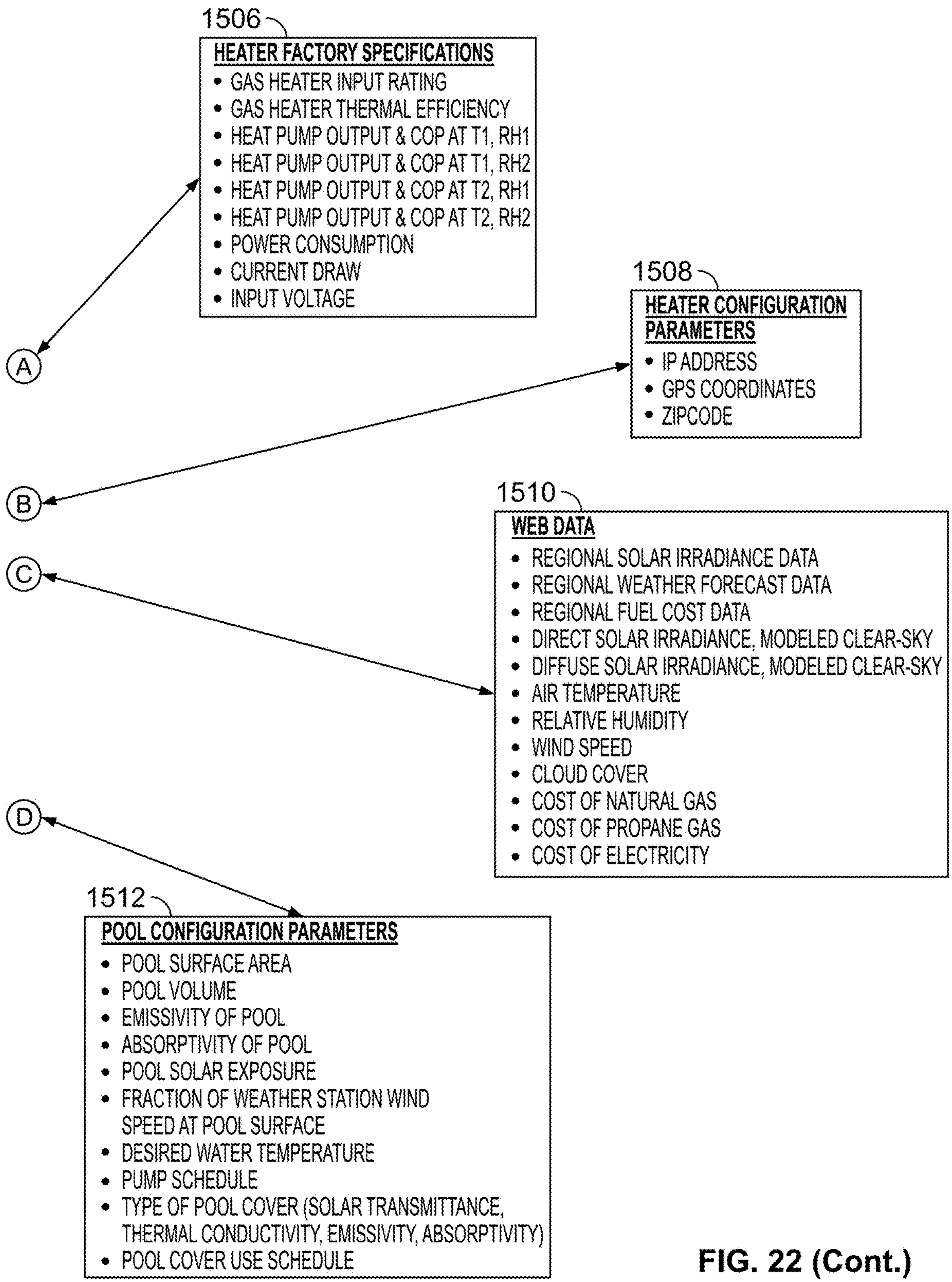

FIG. 22 is a diagram 1500 illustrating heater control logic 80. Heater control logic 80 could incorporate and/or be in communication with a variety of types of data and/or data sources. More specifically, heater control logic 80 can communicate with, or receive, user input data 1502, heater operational data 1504, heater factory specifications 1506, heater configuration parameters 1508, web data 1510, pool configuration parameters 1512, data from related devices 1514, health monitoring data 1516, and/or external sensor data 1518.

User input data 1502 could include heating and/or cooling temperature set points, heating or cooling mode, pool/spa mode, heater x or cooler x, where "x" is an index referring to one or more heating and/or cooling devices, countdown to heat, etc. Heater operational data 1504 could include line voltage, power consumption, gas pressure, air pressure or vacuum, air temperature, humidity, other environmental conditions, flow rate, water level, state (e.g., on/off), temperature setpoint, duration setpoint, operating noise, etc. Heater factory specifications 1506 could include gas heater input rating, gas heater thermal efficiency, heat pump output & COP (coefficient of performance) at T1 (reference test temperature 1), RH1 (reference test relative humidity 1), heat pump output & COP at T1, RH2 (reference test relative humidity 2), heat pump output & COP at T2 (reference test temperature 2), RH1, heat pump output & COP at T2, RH2, power consumption, current draw, input voltage, etc. Heater configuration parameters 1508 could include IP address, GPS coordinates, zip code, etc. Web data 1510 could include regional solar irradiance data, regional weather forecast data, regional fuel cost data, direct solar irradiance—modeled clear-sky, diffuse solar irradiance—modeled clear-sky, air temperature, relative humidity, wind speed, cloud cover, cost of natural gas, cost of propane gas, cost of electricity, etc. Pool configuration parameters 1512 could include pool surface area, pool volume, emissivity of pool, absorptivity of pool, pool solar exposure, fraction of weather station wind speed at pool surface, desired water temperature, pump schedule, type of pool cover (solar transmittance, thermal conductivity, emissivity, absorptivity), pool cover use schedule, etc. Data from related devices 1514 could include data relating to at least the following: pump(s), secondary pump(s), filter bypass, water feature(s), chemical dispensers, valves/actuators/bypass, pool cover(s), controller(s), spa(s), etc. The following relationships could exist between the heater control logic 80 the related devices: water features (used to assist loss of heat/coolers), chemical dispensers (logic 80 could open bypass to prevent off balance chemistry from entering the heater), secondary pump (affects overall system flow), tablet/liquid chlorine feeder (if present in system should not be used on the same loop as the heater), and external sensors (could have shared flow switch and water temperature sensors). Health monitoring data 1516 could include runtime, operating temperatures/profile, power consumption, predictive failure, number of cycles, degradation of efficiency, pool chemistry, fuel gas pressure, refrigerant pressures, refrigerant temperatures, exhaust temperature, carbon monoxide, freeze and condensation warnings, motor speed (RPM), other operating conditions, settings, troubleshooting data, etc. External sensor data 1518, could include air temperature, humidity, ambient noise, pool chemistry, fuel gas pressure, exhaust temperature, carbon monoxide, carbon dioxide, oxygen, vibration, bather detection, etc. Additionally, the heater control logic 80 can receive information pertaining to time limits on setting block heater schedules, maximum allowable temperatures, password protection, scheduled heating, and setback schedules. While it may be desirable for external sensors to monitor/provide data on as many system parameters as possible (thereby providing greater optimization, automation, and user/operator comfort), it is contemplated that some systems need not utilize an external sensor to monitor every system parameter. For example, if a temperature sensor has not been installed in a particular system, the user/operator can provide this information by first determining the temperature (e.g., by checking a thermometer, a thermocouple, a weather forecast, the internet, etc.) and then entering the temperature into the system via a user interface.

Figure 23A:
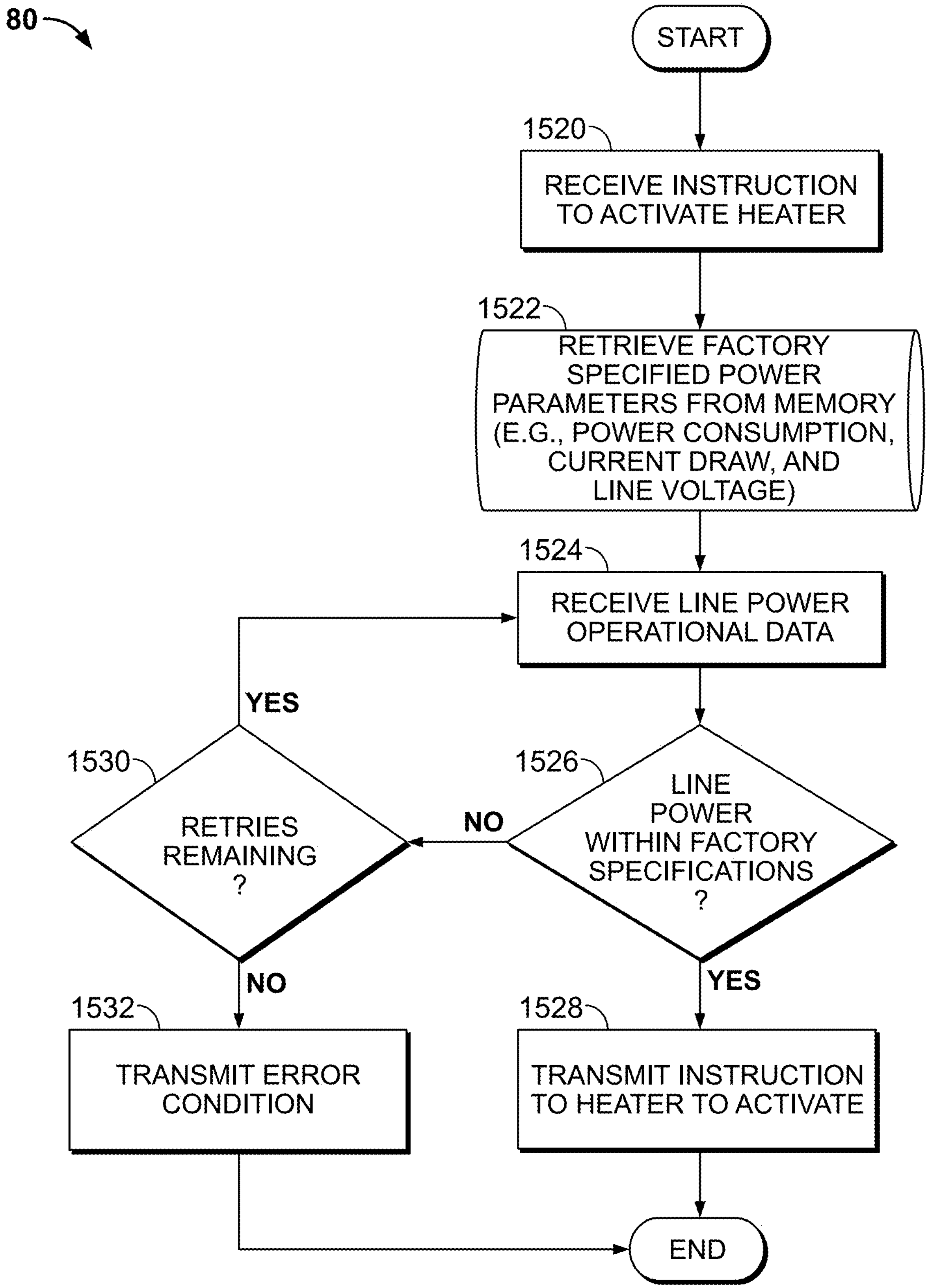
FIGS. 23A-23J are flowcharts illustrating processing steps of the heater control logic of FIG. 3.

FIGS. 23A-23J are flowcharts illustrating processing steps of the heater control logic 80. FIG. 23A is a flowchart illustrating processing logic of the heater control logic 80 communicating with a heater. In step 1520, the heater control logic 80 receives an instruction to activate the heater. In step 1522, the heater logic 80 retrieves data pertaining to factory specified power parameters from memory, e.g., parameters relating to power consumption, current draw, and line voltage. In step 1524, the heater logic 80 receives line power operational data. In step 1526, the heater logic 80 determines whether the line power operational data is within factory specifications. If a positive determination is made, the process proceeds to step 1528. If a negative determination is made, the process proceeds to step 1530. In step 1528, the heater control logic 80 transmits an instruction to the heater to activate, and the process ends. As referenced above, if a negative determination is made at step 1526, then the process proceeds to step 1530. In step 1530, the heater control logic 80 determines if there are any retries remaining. If a positive determination is made, then the heater control logic 80 proceeds to step 1524 and continues the process from that step. If a negative determination is made, then the heater control logic 80 proceeds to step 1532 and transmits an error condition signal, and then ends the process.

Figure 23B:
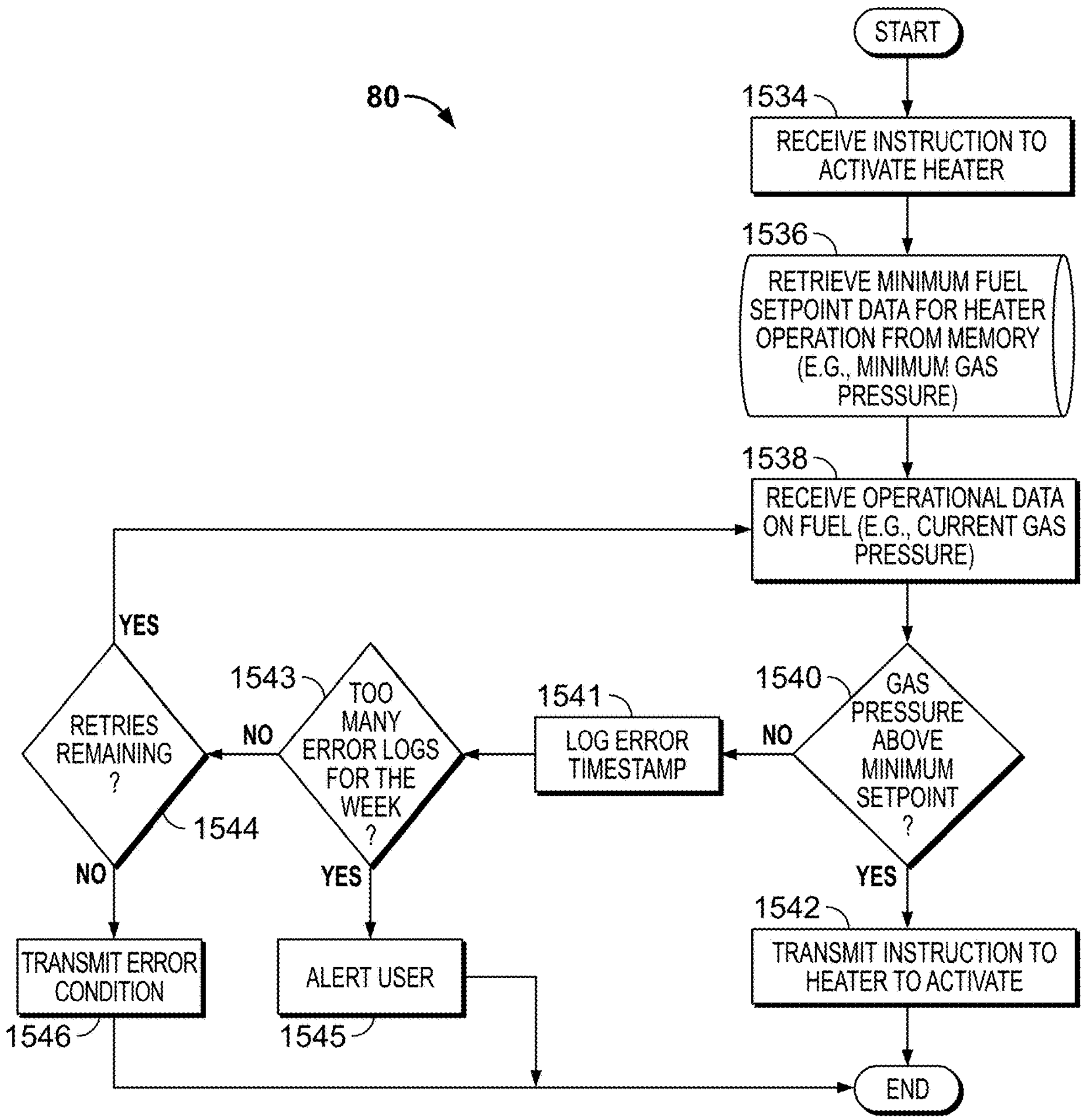

FIG. 23B is another flowchart illustrating processing logic of the heater control logic 80 communicating with a heater. In step 1534, the heater control logic 80 receives an instruction to activate the heater. In step 1536, the heater logic 80 retrieves minimum fuel setpoint data for heater operation from memory, e.g., minimum gas pressure. In step 1538, the heater logic 80 receives operational data on fuel, e.g., current gas pressure. In step 1540, the heater logic 80 determines whether the gas pressure is above a minimum setpoint. If a positive determination is made, the process proceeds to step 1542. If a negative determination is made, the process proceeds to step 1541. In step 1542, the heater control logic 80 transmits an instruction to the heater to activate, and the process ends. As referenced above, if a negative determination is made at step 1540, then the process proceeds to step 1541. In step 1541, the heater control logic 80 logs the error timestamp. In step 1543, the heater control logic 80 determines if the number of error logs for the week exceeds the allowable amount. If a positive determination is made, the process proceeds to step 1545. If a negative determination is made, the process proceeds to step 1544. In step 1545, the heater control logic 80 transmits an alert to the user, and the process ends. As referenced above, if a negative determination is made at step 1543, then the process proceeds to step 1544 where the heater control logic 80 determines if there are any retries remaining. If a positive determination is made, then the heater control logic 80 proceeds to step 1538 and continues the process from that step. If a negative determination is made, then the heater control logic 80 proceeds to step 1546 and transmits an error condition signal, and then ends the process.

Figure 23C:
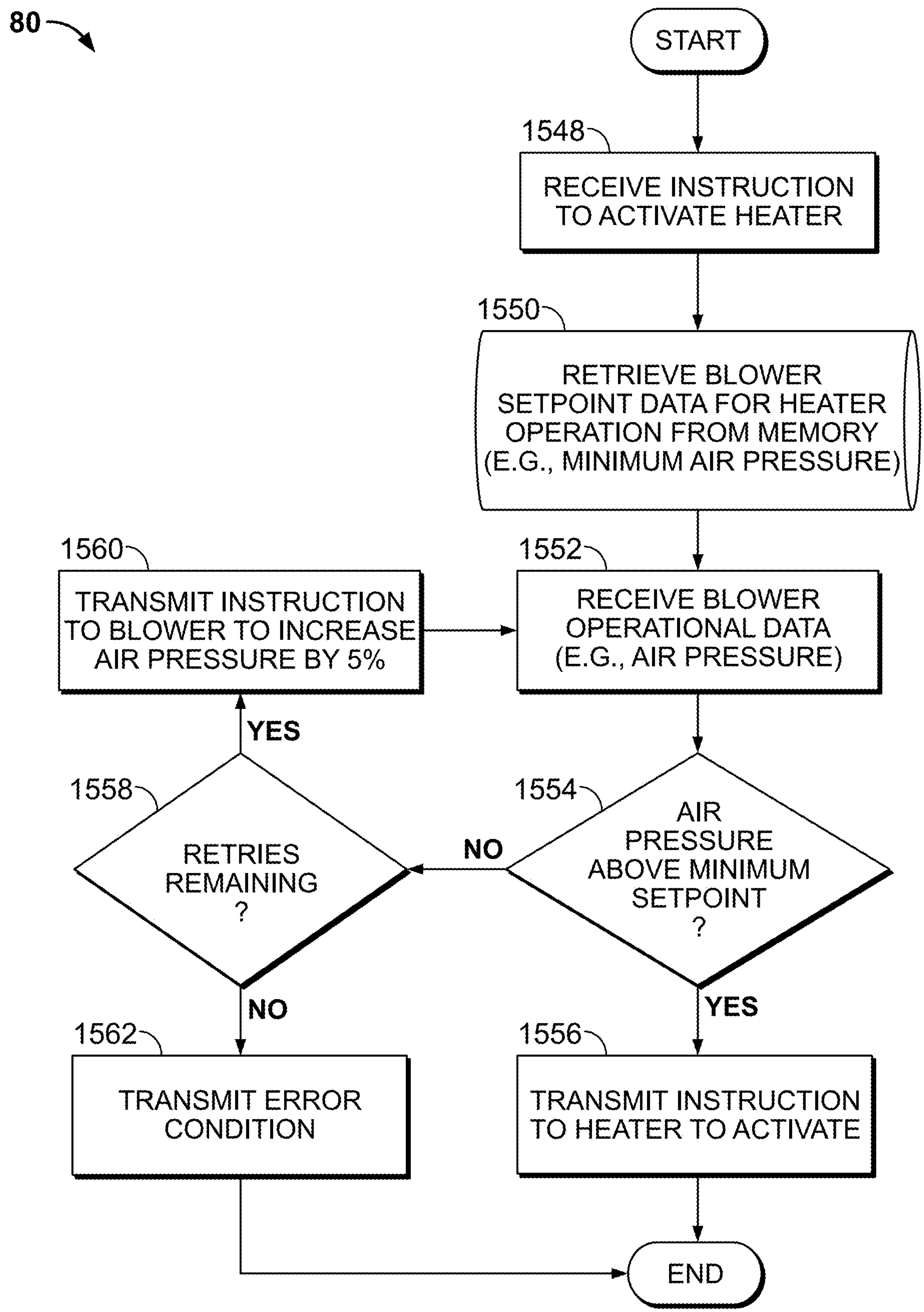

FIG. 23C is another flowchart illustrating processing logic of the heater control logic 80 communicating with a heater. In step 1548, the heater control logic 80 receives an instruction to activate the heater. In step 1550, the heater logic 80 retrieves blower setpoint data for heater operation from memory, e.g., minimum air pressure. In step 1552, the heater logic 80 receives blower operational data, e.g., air pressure. In step 1554, the heater logic 80 determines whether the air pressure is above the minimum setpoint. If a positive determination is made, the process proceeds to step 1556. If a negative determination is made, the process proceeds to step 1558. In step 1556, the heater control logic 80 transmits an instruction to the heater to activate, and the process ends. As referenced above, if a negative determination is made at step 1554, then the process proceeds to step 1558. In step 1558, the heater control logic 80 determines if there are any retries remaining. If a positive determination is made, then the heater control logic 80 proceeds to step 1560 and transmits an instruction to the blower to increase the air pressure by 5%, and proceeds to step 1552 and continues the process from that step. It is noted that while the blower could increase air pressure in 5% increments it is contemplated that any satisfactory incremental value could be chosen for optimization of the system (e.g., 1%, 2%, 5%, 10%, etc.). If a negative determination is made, then the heater control logic 80 proceeds to step 1562 and transmits an error condition signal, and then ends the process.

Figure 23D:
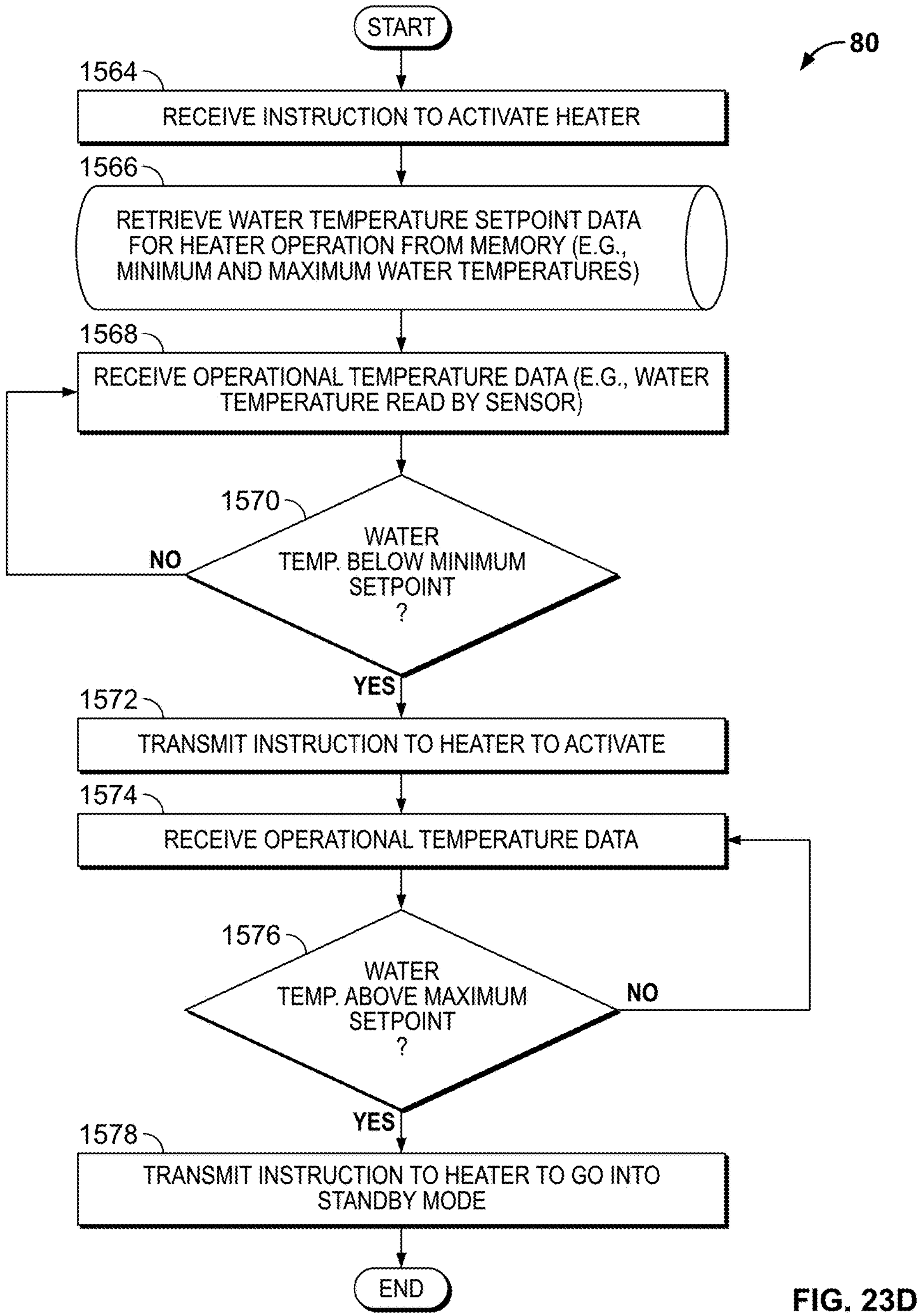

FIG. 23D is another flowchart illustrating processing logic of the heater control logic 80 communicating with a heater. In step 1564, the heater control logic 80 receives an instruction to activate the heater. In step 1566, the heater logic 80 retrieves water temperature setpoint data for heater operation from memory, e.g., minimum and maximum water temperatures. In step 1568, the heater logic 80 receives operational temperature data, e.g., water temperature read by a sensor. In step 1570, the heater logic 80 determines whether the water temperature is below the minimum setpoint. If a positive determination is made, the process proceeds to step 1572. If a negative determination is made, the process returns to step 1568. In step 1572, the heater control logic 80 transmits an instruction to the heater to activate. In step 1574, the heater control logic 80 receives operational temperature data. In step 1576, the heater control logic 80 determines if the water temperature is above a maximum setpoint. If a positive determination is made, then the heater control logic 80 proceeds to step 1578 and transmits an instruction to the heater to switch to standby mode, and the process ends. If a negative determination is made, then the heater control logic 80 returns to step 1574.

Figure 23E:
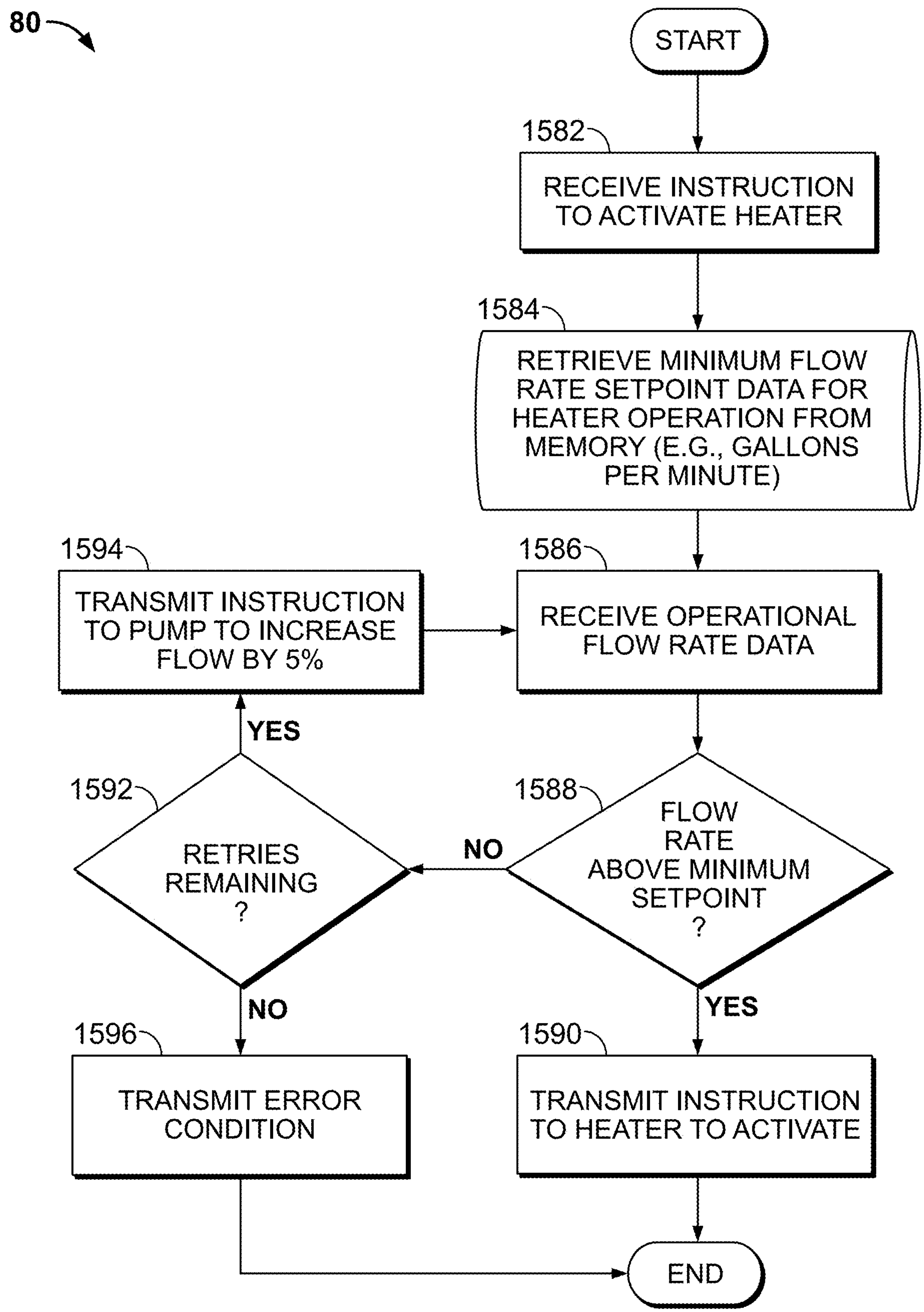

FIG. 23E is another flowchart illustrating processing logic of the heater control logic 80 communicating with a heater. In step 1582, the heater control logic 80 receives an instruction to activate the heater. In step 1584, the heater logic 80 retrieves minimum flow rate setpoint data for heater operation from memory, e.g., gallons per minute. In step 1586, the heater logic 80 receives operational flow rate data. In step 1588, the heater logic 80 determines whether the flow rate is above the minimum setpoint. If a positive determination is made, the process proceeds to step 1590. If a negative determination is made, the process proceeds to step 1592. In step 1590, the heater control logic 80 transmits an instruction to the heater to activate, and the process ends. As referenced above, if a negative determination is made at step 1588, then the process proceeds to step 1592. In step 1592, the heater control logic 80 determines if there are any retries remaining. If a positive determination is made, then the heater control logic 80 proceeds to step 1594 and transmits an instruction to the pump to increase the flow by 5%, and proceeds to step 1586 and continues the process from that step. It is noted that while the pump could increase flow in 5% increments it is contemplated that any satisfactory incremental value could be chosen for optimization of the system (e.g., 1%, 2%, 5%, 10%, etc.). If a negative determination is made, then the heater control logic 80 proceeds to step 1596 and transmits an error condition signal, and then ends the process.

Figure 23F:
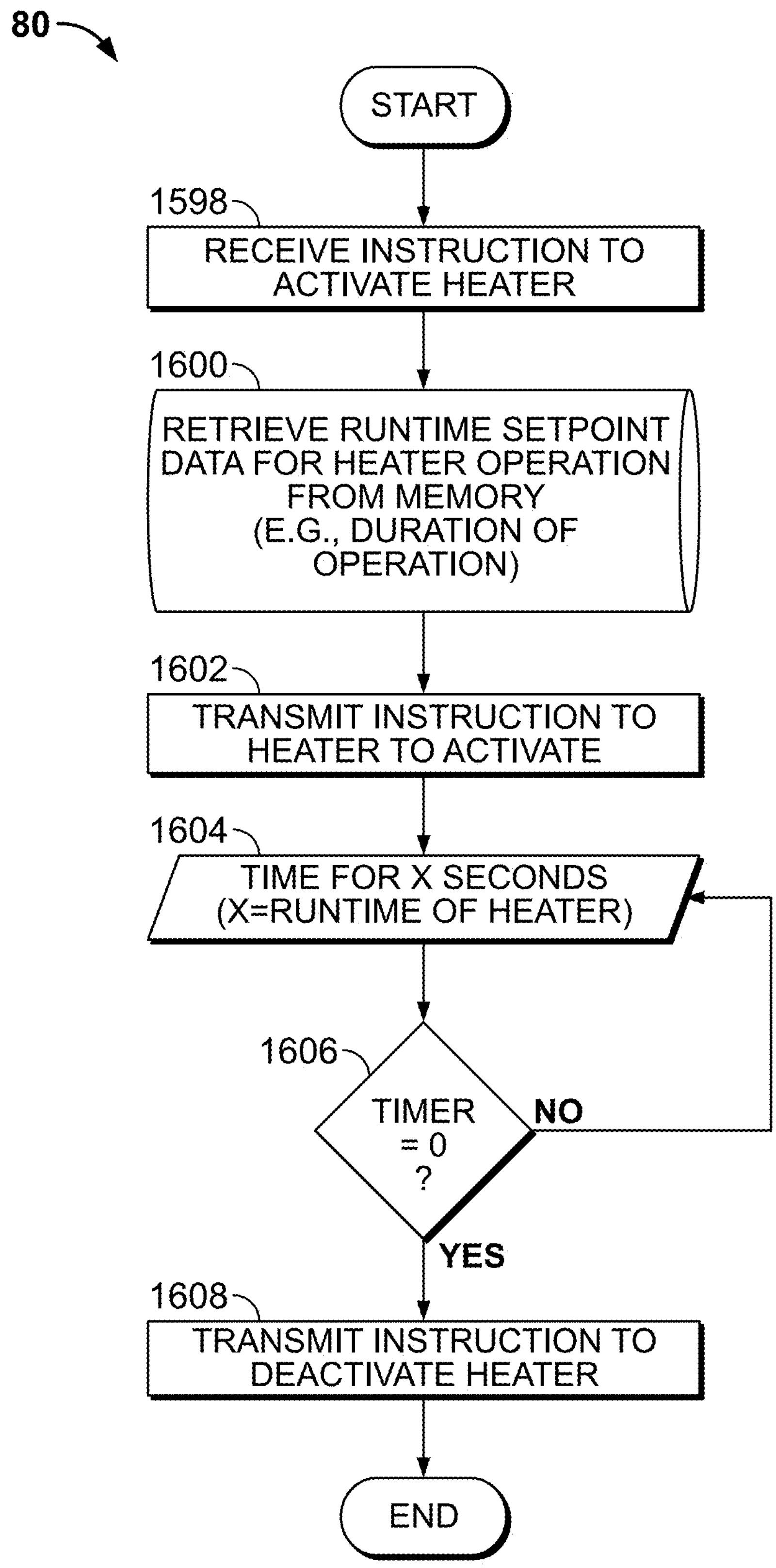

FIG. 23F is another flowchart illustrating processing logic of the heater control logic 80 communicating with a heater. In step 1598, the heater control logic 80 receives an instruction to activate the heater. In step 1600, the heater logic 80 retrieves runtime setpoint data for heater operation from memory, e.g., duration of operation. In step 1602, the heater logic 80 transmits an instruction to the heater to activate. In step 1604, the heater logic 80 sets a countdown timer for a predefined number ("x") of seconds, where "x" is the desired runtime of the heater, and activates the timer. In step 1606, the heater logic 80 determines if the timer has reached "0." If a positive determination is made, the process proceeds to step 1608. If a negative determination is made, the process returns to step 1604. In step 1608, the heater control logic 80 transmits an instruction to deactivate the heater, and the process ends.

Figure 23G:
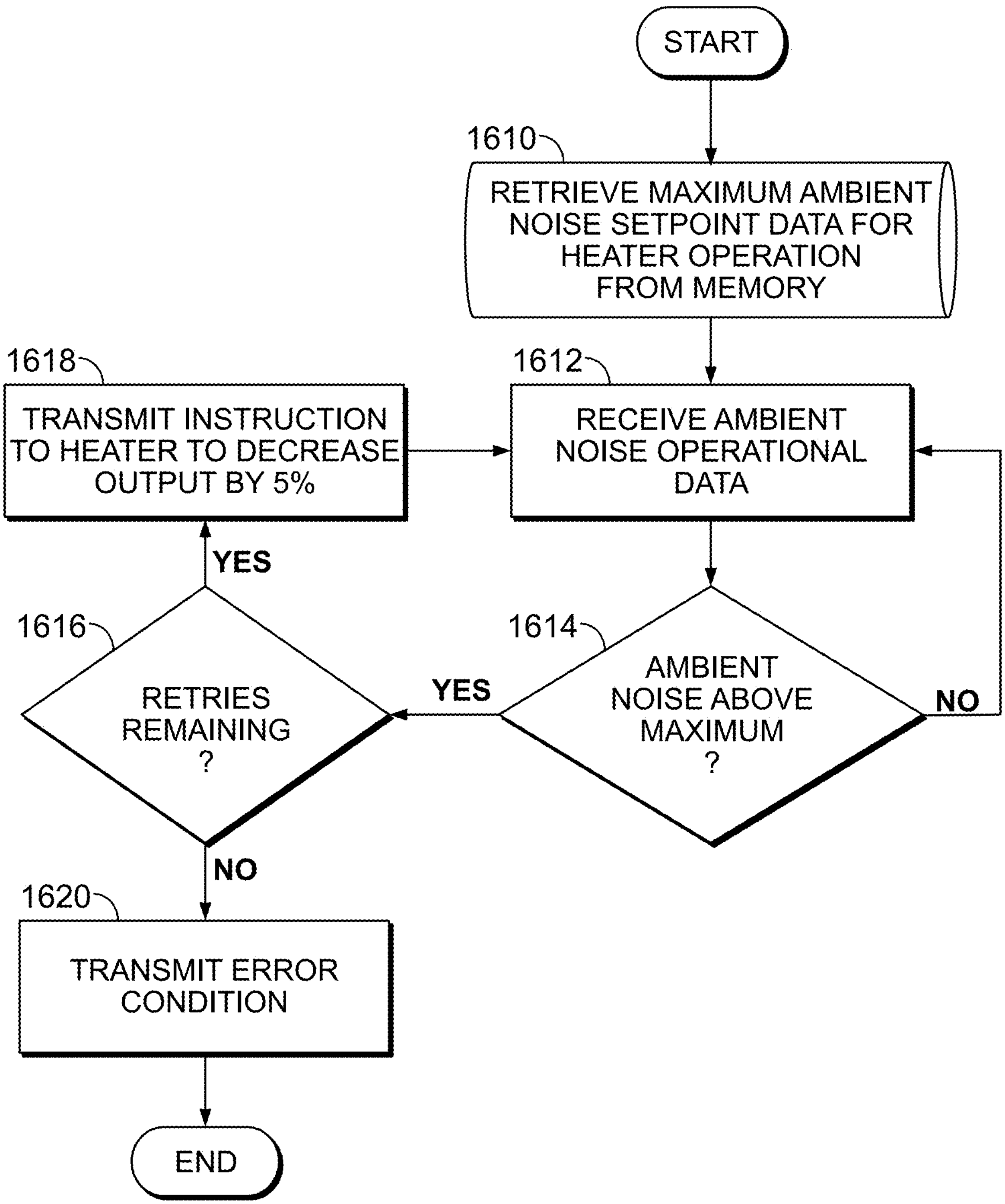

FIG. 23G is another flowchart illustrating processing logic of the heater control logic 80 communicating with a heater. In step 1610, the heater control logic 80 retrieves maximum ambient noise setpoint data for heater operation from memory. In step 1612, the heater logic 80 receives ambient noise operational data. In step 1614, determines if the ambient noise is above the maximum allowed value. If a positive determination is made, the process proceeds to step 1616. If a negative determination is made, the process returns to step 1612. In step 1616, the heater control logic 80 determines if there are any retries remaining. If a positive determination is made, then the heater control logic 80 proceeds to step 1618 and transmits an instruction to the heater to decrease the output by 5%, and proceeds to step 1612 and continues the process from that step. It is noted that while the heater could decrease output in 5% increments it is contemplated that any satisfactory incremental value could be chosen for optimization of the system (e.g., 1%, 2%, 5%, 10%, etc.). If a negative determination is made, then the heater control logic 80 proceeds to step 1620 and transmits an error condition signal, and then ends the process.

Figure 23H:
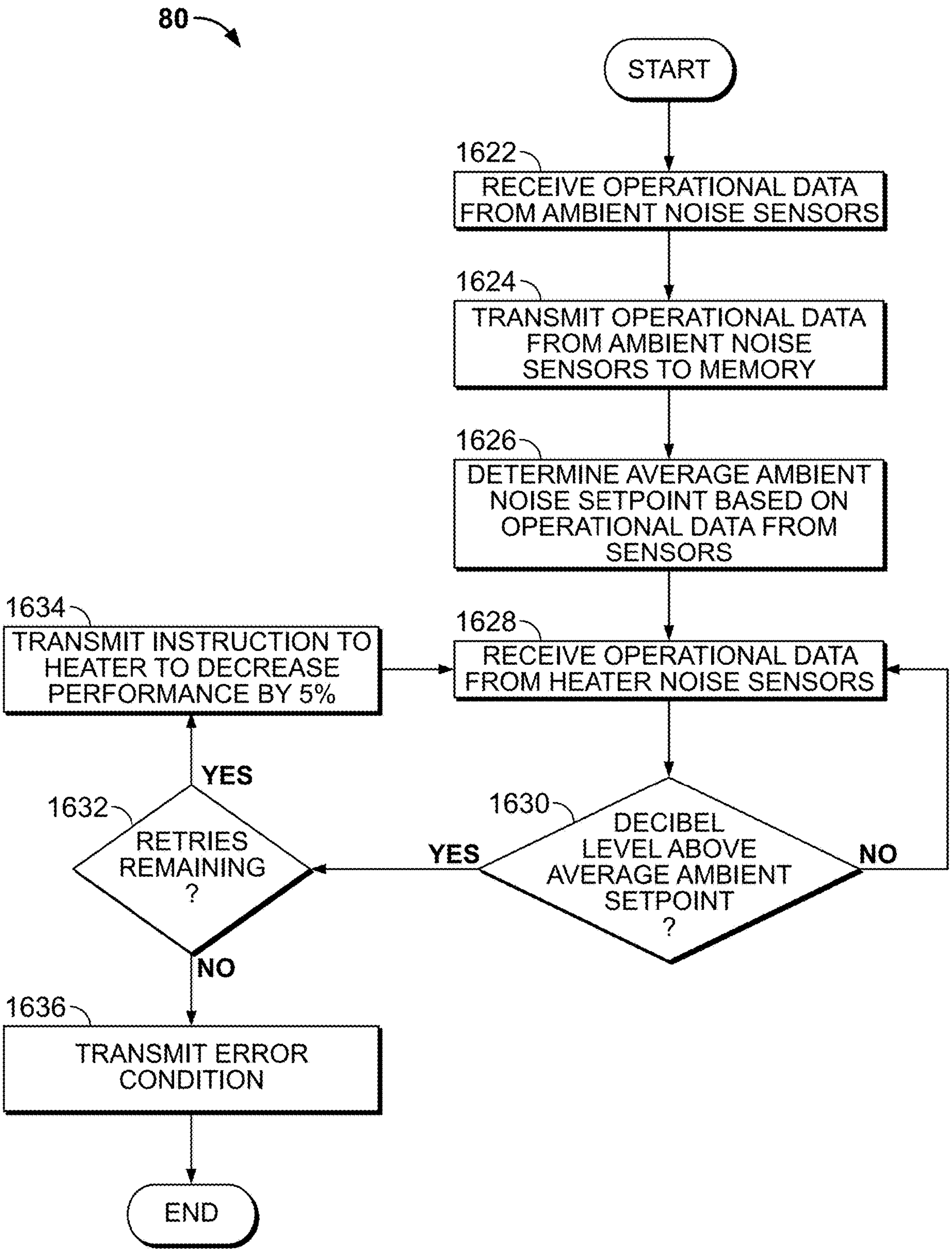

FIG. 23H is another flowchart illustrating processing logic of the heater control logic 80 communicating with a heater. In step 1622, the heater logic 80 receives operational data from ambient noise sensors. In step 1624, the heater logic 80 transmits operational data from ambient noise sensors to memory. In step 1626, the heater logic 80 determines the average ambient noise setpoint based on operational data from the sensors. In step 1628, the heater logic 80 receives operational data from heater noise sensors. In step 1630, the heater logic 80 determines if the decibel level is above the average ambient setpoint. If a positive determination is made, the process proceeds to step 1632. If a negative determination is made, the process returns to step 1628. In step 1632, the heater control logic 80 determines if there are any retries remaining. If a positive determination is made, then the heater control logic 80 proceeds to step 1634 and transmits an instruction to the heater to decrease performance by 5%, and proceeds to step 1628 and continues the process from that step. It is noted that while the heater could decrease performance in 5% increments it is contemplated that any satisfactory incremental value could be chosen for optimization of the system (e.g., 1%, 2%, 5%, 10%, etc.). If a negative determination is made, then the heater control logic 80 proceeds to step 1636 and transmits an error condition signal, and then ends the process.

It is noted that the processing logic of the heater control logic 80 shown in FIGS. 23G and 23H could be combined into a process that determines the average ambient noise level over a given period of time and then saves the average ambient noise level to the memory for later retrieval as the maximum ambient noise setpoint data for heater operation, illustrated in step 1610 of FIG. 23G. The process could then proceed according to the steps as illustrated in FIG. 23G as described above.

Figure 23I:
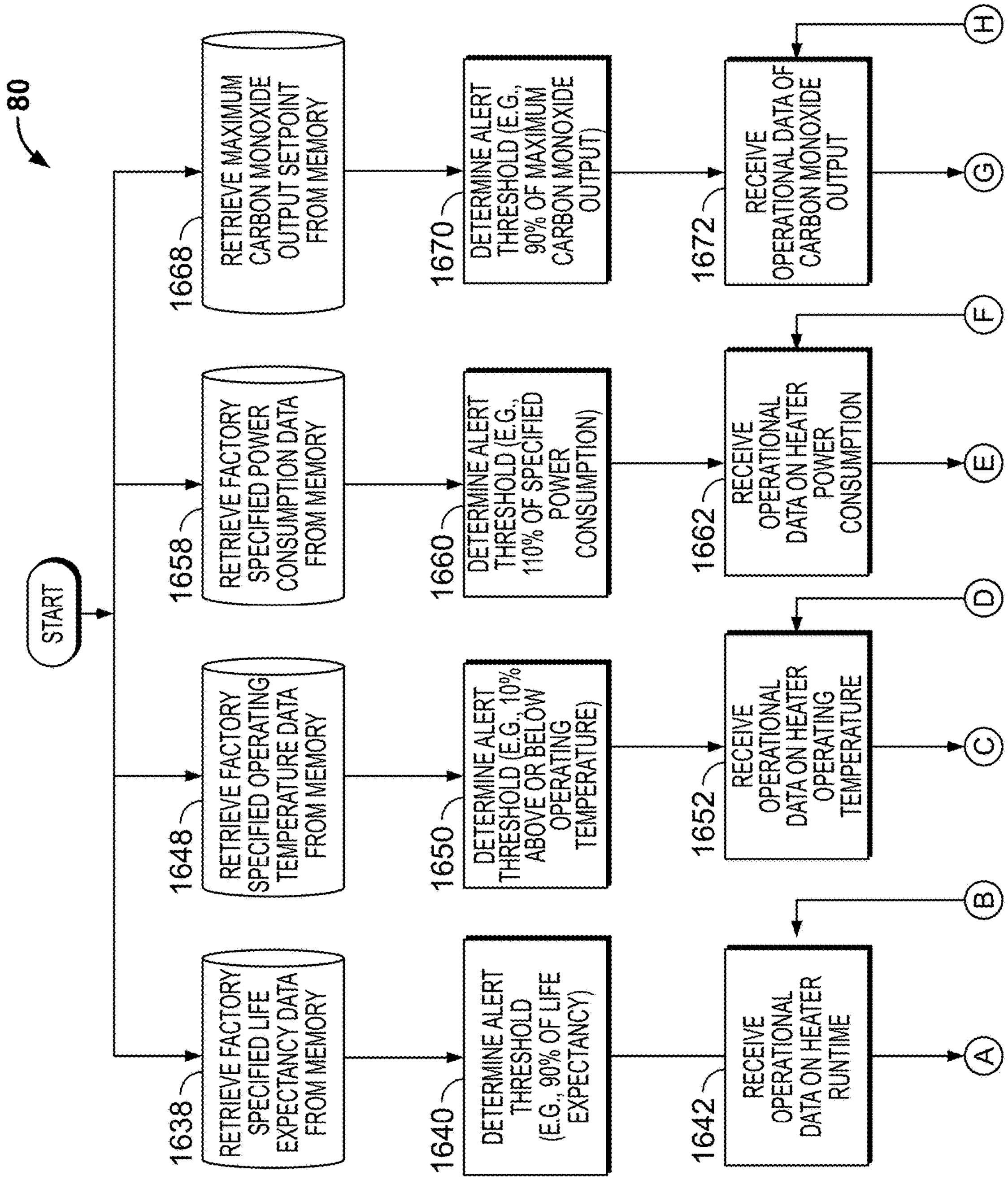
Figure 23I:
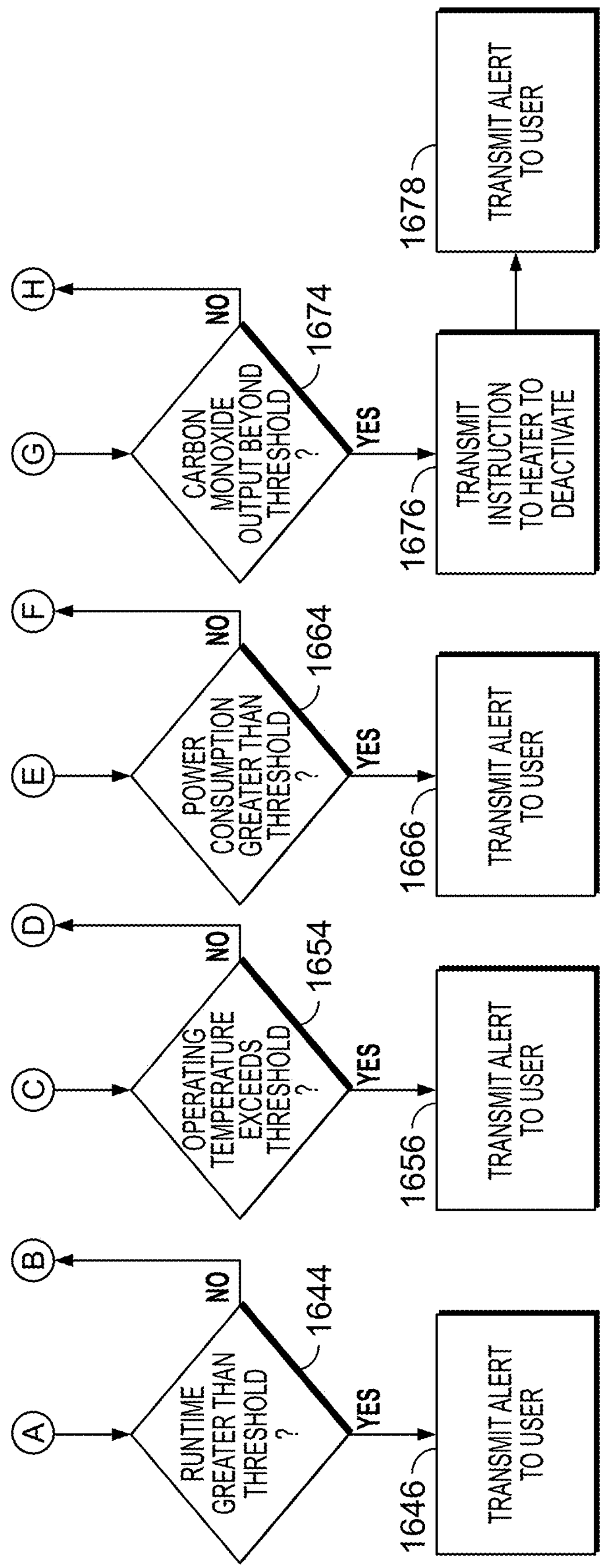

FIG. 23I is a flowchart illustrating processing logic of the heater control logic 80 determining alert conditions of a heater. The heater control logic 80 proceeds with four parallel routine sequences that respectively begin with steps 1638, 1648, 1658, and 1668. Each routine sequence is discussed sequentially, though it should be understood that the routine loops could operate in parallel, or alternatively, in series with each other. The first sequence begins in step 1638 where the heater control logic 80 retrieves factory specified life expectancy data from memory. In step 1640, the heater control logic 80 determines an alert threshold, e.g., less than 90% of heater life expectancy remaining or runtime value. In step 1642, the heater control logic 80 receives operational data on heater runtime. In step 1642, the heater control logic 80 determines if the heater runtime is greater than the threshold. If a negative determination is made, then the process returns to step 1642 and continues to receive operational data on heater runtime. If a positive determination is made, then the process proceeds to step 1646 where an alert is transmitted to a user, and the process ends.

The second sequence begins in step 1648 where the heater control logic 80 retrieves factory specified operating temperature data from memory. In step 1650, the heater control logic 80 determines an alert threshold, e.g., a temperature value that is 10% above or below operating temperature. In step 1652, the heater control logic 80 receives operational data on heater system operating temperature. In step 1654, the heater control logic 80 determines if the heater system operating temperature exceeds the threshold, or is outside of a threshold range. If a negative determination is made, then the process returns to step 1652 and continues to receive operational data on heater system operating temperature. If a positive determination is made, then the process proceeds to step 1656 where an alert is transmitted to a user, and the process ends.

The third sequence begins in step 1658 where the heater control logic 80 retrieves factory specified power consumption data from memory. In step 1660, the heater control logic 80 determines an alert threshold, e.g., power value that is 110% of specified power consumption. In step 1662, the heater control logic 80 receives operational data on heater system power consumption. In step 1664, the heater control logic 80 determines if the heater system power consumption is greater than the threshold. If a negative determination is made, then the process returns to step 1662 and continues to receive operational data on heater system power consumption. If a positive determination is made, then the process proceeds to step 1666 where an alert is transmitted to a user, and the process ends.

The fourth sequence begins in step 1668 where the heater control logic 80 retrieves maximum carbon monoxide output setpoint from memory, e.g., the maximum permitted carbon monoxide output for the heater. In step 1670, the heater control logic 80 determines an alert threshold, e.g., 905 of maximum carbon monoxide output. In step 1672, the heater control logic 80 receives operational data on heater system carbon monoxide output. In step 1674, the heater control logic 80 determines if the heater system carbon monoxide output is greater than the threshold. If a negative determination is made, then the process returns to step 1672 and continues to receive operational data on heater system carbon monoxide output. If a positive determination is made, then the process proceeds to step 1676 where it transmits an instruction to the heater to deactivate. The process then proceeds to step 1678 and transmits an alert to a user, and the process ends.

Figure 23J:
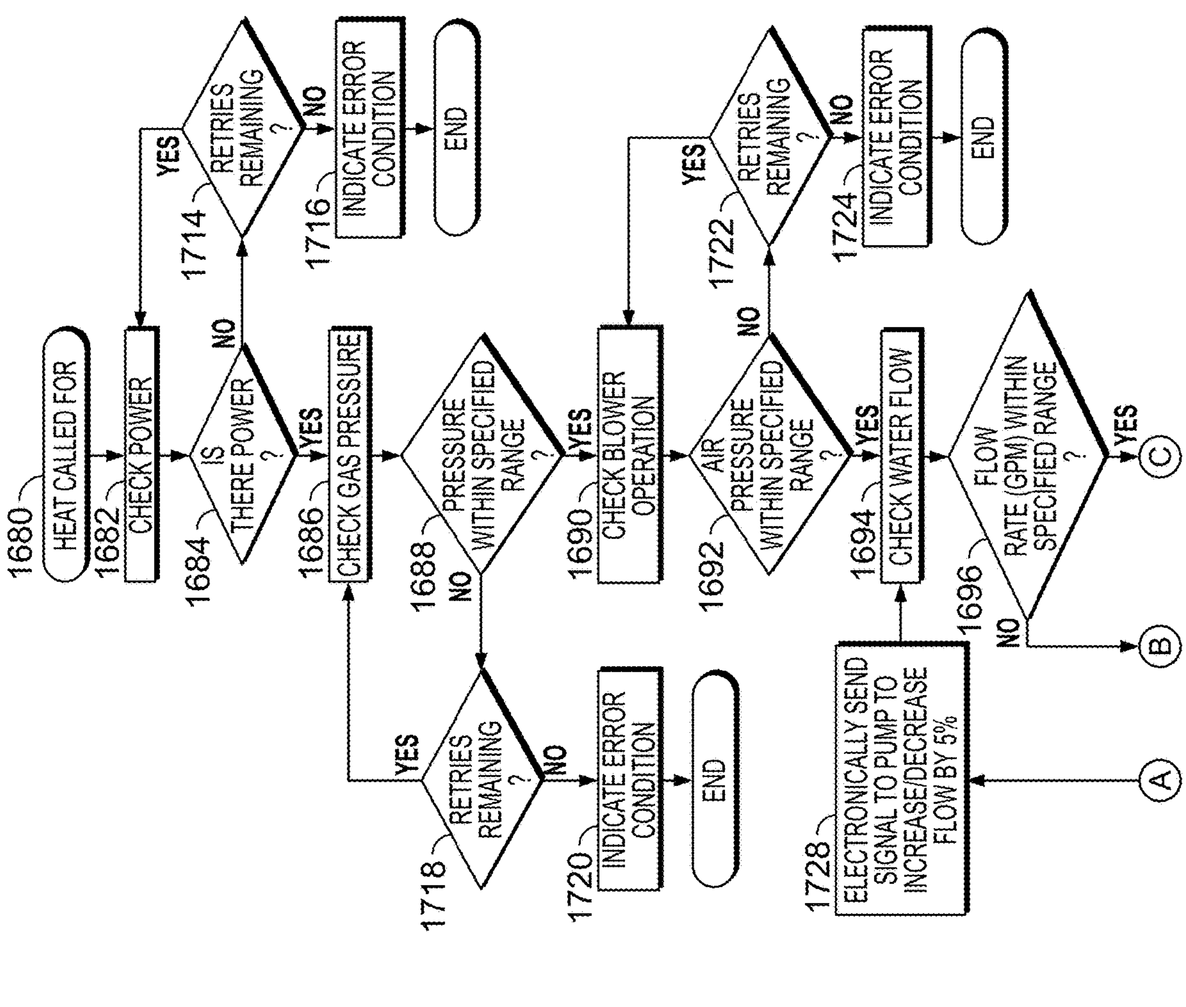
Figure 23J:
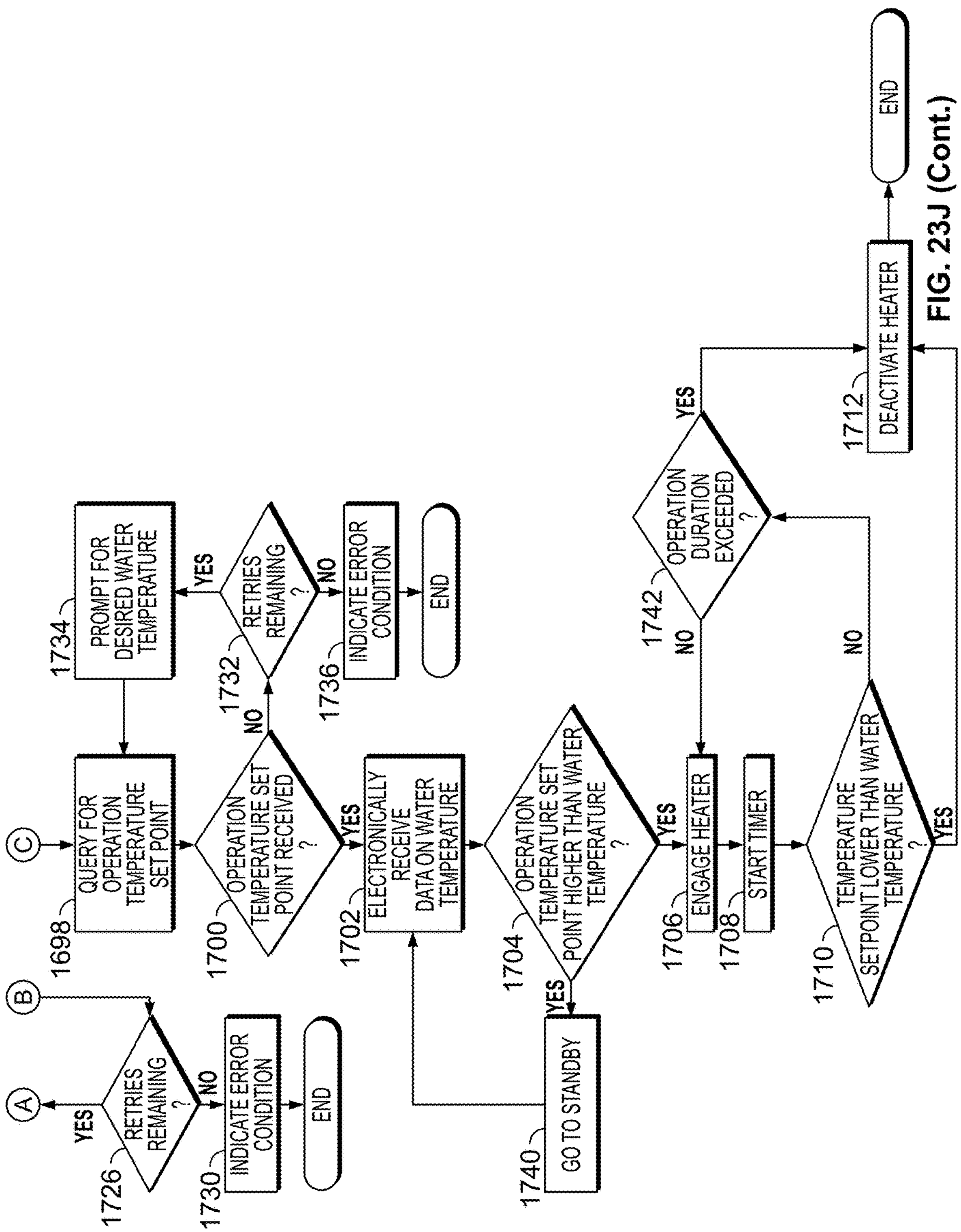

FIG. 23J is a flowchart illustrating the procedure implemented when heat is being requested by a user. In step 1680, the heater control logic 80 receives an instruction that heat is called for. In step 1682, the heater control logic 80 proceeds to check if the heater has power. In step 1684, the heater control logic determines if the heater has power. If a negative determination is made, then the process proceeds to step 1714. If a positive determination is made, then the process proceeds to step 1686. In step 1714, the heater control logic 80 determines if there are any retries remaining. If a positive determination is made then the process returns to step 1682, but if a negative determination is made then the process proceeds to step 1716 where the heater control logic 80 indicates an error condition and the process ends. As referenced above, if a positive determination is made in step 1684, then the process proceeds to step 1686. In step 1686, the heater control logic 80 checks the gas pressure. In step 1688, the heater control logic 80 determines if the pressure is within the specified range. If a positive determination is made, then the process proceeds to step 1690. If a negative determination is made, then the process proceeds to step 1718. In step 1718, the heater control logic 80 determines if there are any retries remaining. If a positive determination is made then the process returns to step 1686. If a negative determination is made then the process proceeds to step 1720 where the heater control logic 80 indicates an error condition and the process ends. As referenced above if a positive determination is made in step 1688, then the process proceeds to step 1690. In step 1690, the heater control logic 80 checks the blower operation. In step 1692, the heater control logic 80 determines if the air pressure is within the specified range. If a positive determination is made, then the process proceeds to step 1694. If a negative determination is made, then the process proceeds to step 1722. In step 1722, the heater control logic 80 determines if there are any retries remaining. If a positive determination is made then the process returns to step 1690. If a negative determination is made then the process proceeds to step 1724 where the heater control logic 80 indicates an error condition and the process ends. As referenced above if a positive determination is made in step 1692, then the process proceeds to step 1694. In step 1694, the heater control logic 80 checks the water flow. In step 1696, the heater control logic 80 determines if the flow rate (GPM) is within the specified range. If a positive determination is made, then the process proceeds to step 1698. If a negative determination is made, then the process proceeds to step 1726. In step 1726, the heater control logic 80 determines if there are any retries remaining. If a positive determination is made then the process proceeds to step 1728 where it sends an electronic signal to the pump to increase or decrease the flow by 5%, and then returns to step 1694. It is noted that while the pump could increase or decrease flow in 5% increments it is contemplated that any satisfactory incremental value could be chosen for optimization of the system (e.g., 1%, 2%, 5%, 10%, etc.). If a negative determination is made in step 1726 then the process proceeds to step 1730 where the heater control logic 80 indicates an error condition and the process ends. As referenced above if a positive determination is made in step 1696, then the process proceeds to step 1698. In step 1698, the heater control logic 80 queries for an operation temperature setpoint. In step 1700, the heater control logic 80 determines if the operation temperature setpoint has been received. If a positive determination is made, then the process proceeds to step 1702. If a negative determination is made, then the process proceeds to step 1732. In step 1732, the heater control logic 80 determines if there are any retries remaining. If a positive determination is made then the process proceeds to step 1734 where it prompts the heater for a desired water temperature, and then returns to step 1698. If a negative determination is made in step 1732 then the process proceeds to step 1736 where the heater control logic 80 indicates an error condition and the process ends. As referenced above if a positive determination is made in step 1700, then the process proceeds to step 1702. In step 1702, the heater control logic 80 electronically receives data relating to the water temperature. In step 1704, the heater control logic 80 determines if the operation temperature setpoint is greater than the water temperature. If a positive determination is made, then the process proceeds to step 1706. If a negative determination is made, then the process proceeds to step 1740. In step 1740, the heater control logic 80 places the heater in standby and returns to step 1702. As referenced above if a positive determination is made in step 1704, then the process proceeds to step 1706. In step 1706, the heater control logic 80 engages the heater. In step 1708, the heater control logic 80 starts a timer. In step 1710, the heater control logic 80 determines if the temperature setpoint is lower than the water temperature. If a positive determination is made, then the process proceeds to step 1712 where it deactivates the heater and the process ends. If a negative determination is made, then the process proceeds to step 1742. In step 1742, the heater control logic 80 determines if the operation duration has exceeded the threshold. If a positive determination is made, then the process proceeds to step 1712 where it deactivates the heater and the process ends. If a negative determination is made then the process returns to step 1706.

Figure 24:
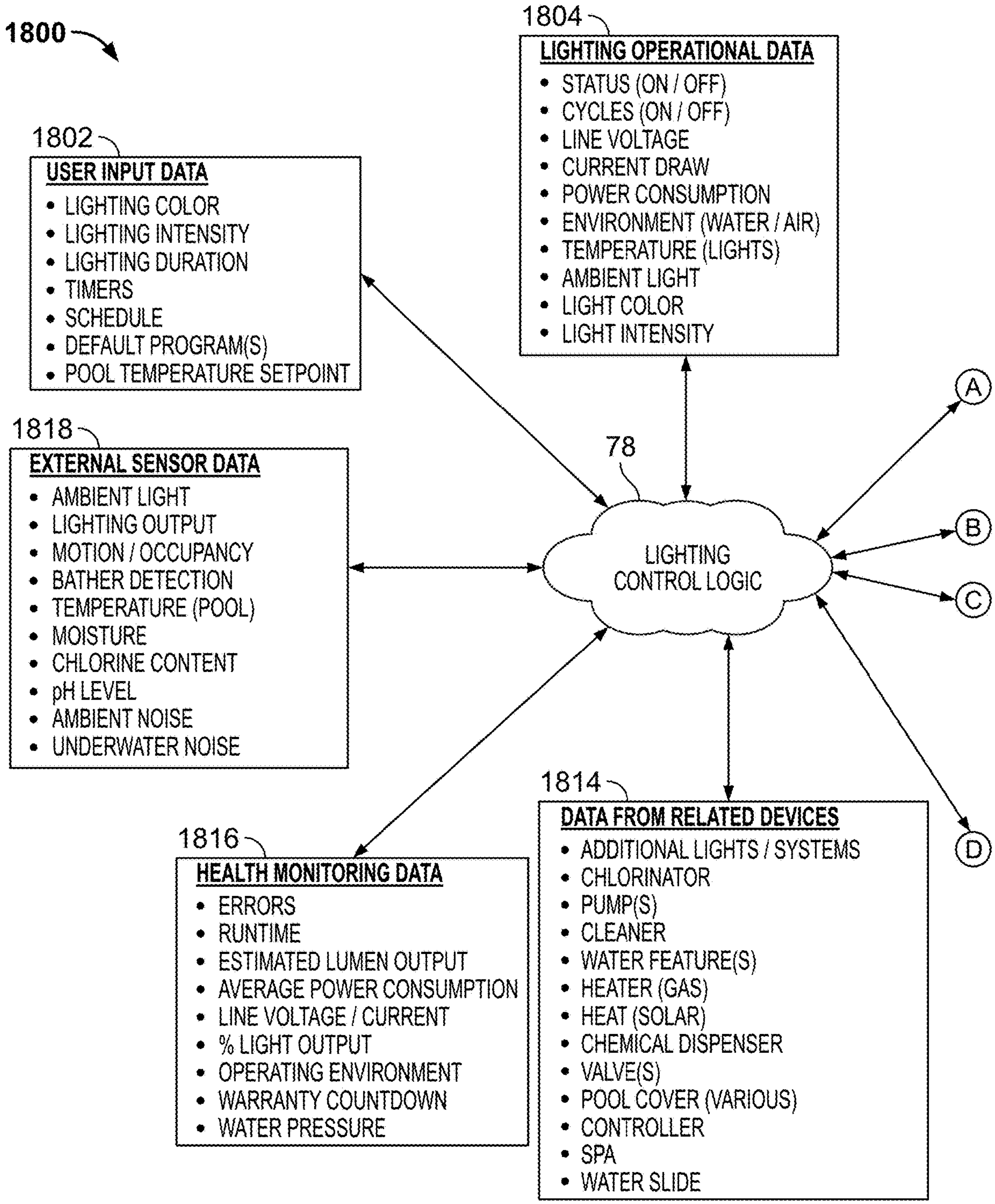
FIG. 24 is a diagram illustrating the lighting control logic of FIG. 3.
Figure 24:
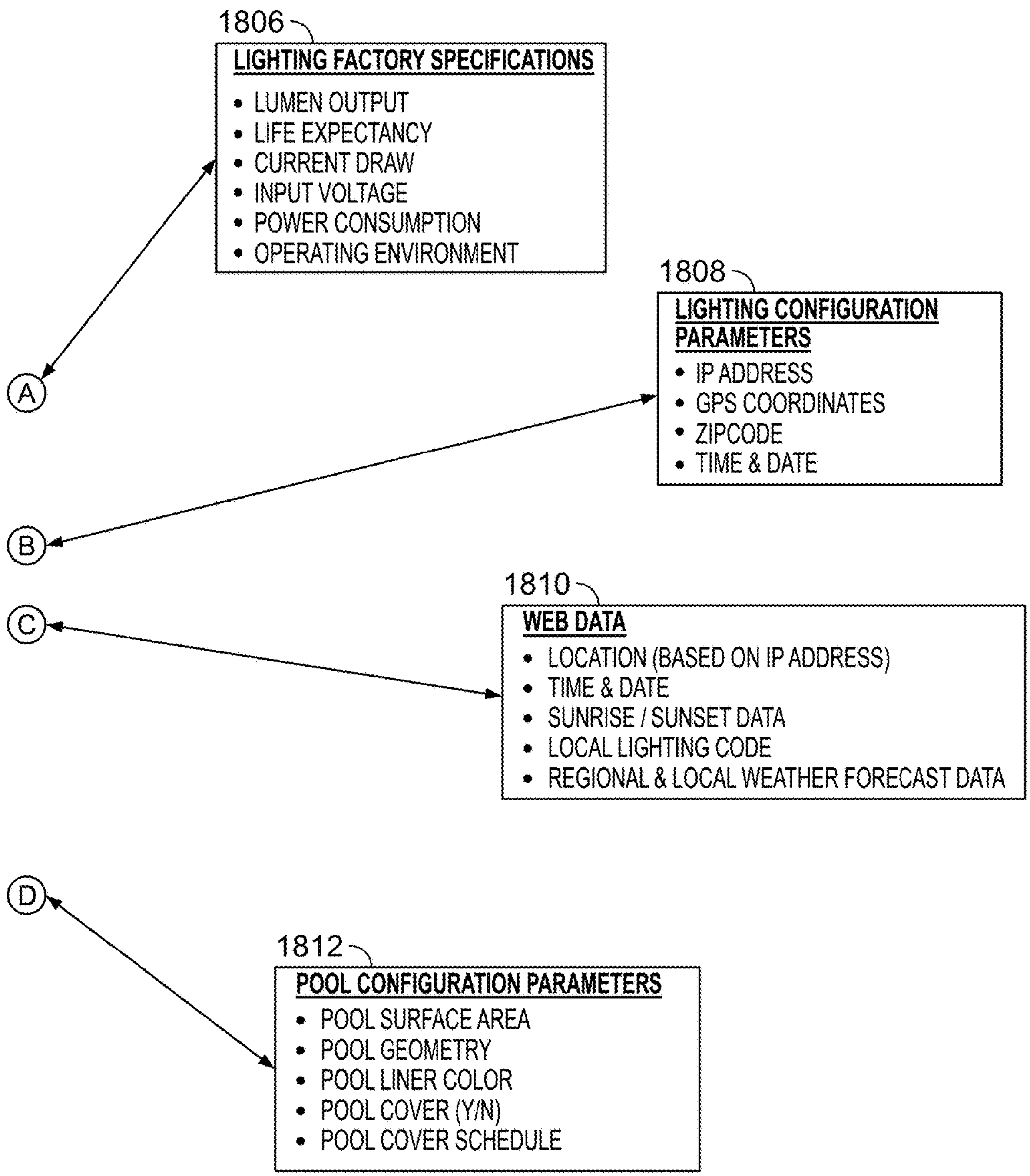

FIG. 24 is a diagram 1800 illustrating lighting control logic 78. Lighting control logic 78 could incorporate and/or be in communication with a variety of types of data and/or data sources. More specifically, lighting control logic 78 can communicate with, or receive, user input data 1802, lighting operational data 1804, lighting factory specifications 1806, lighting configuration parameters 1808, web data 1810, pool configuration parameters 1812, data from related devices 1814, health monitoring data 1816 and/or external sensor data 1818.

Figure 25A:
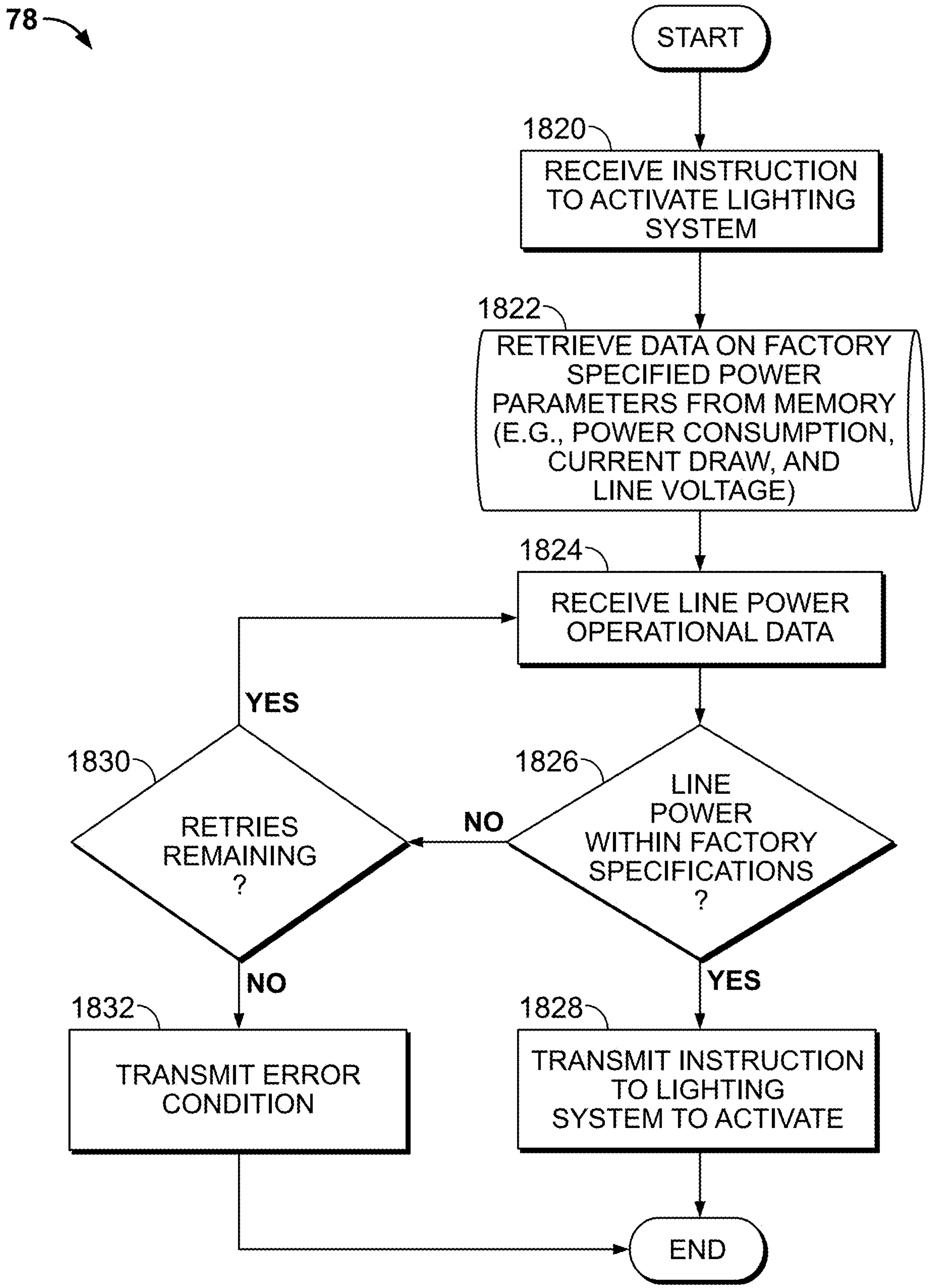
FIGS. 25A-25AB are flowcharts illustrating processing steps of the lighting control logic of FIG. 3.

User input data 1802 could include lighting color, lighting intensity, lighting duration, timers, schedule, default program(s), pool temperature setpoint(s), etc. Lighting operational data 1804 could include status (on/off), cycles (on/off), line voltage, current draw, power consumption, environment (water/air), temperature (lights), ambient light, light color, light intensity, etc. Lighting factory specifications 1806 could include lumen output, life expectancy, current draw, input voltage, power consumption, operating environment, etc. Lighting configuration parameters 1808 could include IP address, GPS coordinates, zip code, time and date, etc. Web data 1810 could include location (based on IP address), time and date, sunrise/sunset data, local lighting code, regional and local weather forecast data, etc. Pool configuration parameters 1812 could include pool surface area, pool geometry, pool liner color, pool cover (yes/no), pool cover schedule, etc. Data from related devices 1814 could include data relating to at least the following: additional lights/systems, chlorinator(s), pump(s), cleaner(s), water feature(s), heater (gas), heater (solar), chemical dispenser, valve(s), pool cover (various), controller, spa, water slide, etc. For example, the following relationships could exist between the lighting control logic 78 the related devices: valves (activate water features, solenoid, dancing waters, etc.), and water slide (shows path, auto-on). Health monitoring data 1816 could include errors, runtime, estimated lumen output, average power consumption, line voltage, line current, percent of light output, operating environment, warranty countdown, water pressure, etc. External sensor data 1818, could include ambient light, lighting output, motion/occupancy, bather detection, temperature (pool), moisture, chlorine content, pH level, etc. While it may be desirable for external sensors to monitor/provide data on as many system parameters as possible (thereby providing greater optimization, automation, and user/operator comfort), it is contemplated that some systems need not utilize an external sensor to monitor every system parameter. For example, if a pool temperature sensor has not been installed in a particular system, the user/operator can provide this information by first determining the pool temperature (e.g., by checking a thermometer, thermocouple, etc.) and then entering the pool temperature into the system via a user interface. FIGS. 25A-25AB are flowcharts illustrating processing steps of the lighting control logic 78. FIG. 25A is a flowchart illustrating processing logic of the lighting control logic 78 communicating with a lighting system. In step 1820, the lighting control logic 78 receives an instruction to activate the lighting system. In step 1822, the lighting control logic 78 retrieves data pertaining to factory specified power parameters from memory, e.g., parameters relating to power consumption, current draw, and line voltage. In step 1824, the lighting control logic 78 receives line power operational data. In step 1826, the lighting logic 78 determines whether the line power operational data is within factory specifications. If a positive determination is made, the process proceeds to step 1828. If a negative determination is made, the process proceeds to step 1830. In step 1828, the lighting control logic 78 transmits an instruction to the lighting system to activate, and the process ends. As referenced above, if a negative determination is made at step 1826, then the process proceeds to step 1830. In step 1830, the lighting control logic 78 determines if there are any retries remaining. If a positive determination is made, then the lighting control logic 78 proceeds to step 1824 and continues the process from that step. If a negative determination is made, then the lighting control logic 78 proceeds to step 1832 and transmits an error condition signal, and the process ends.

Figure 25B:
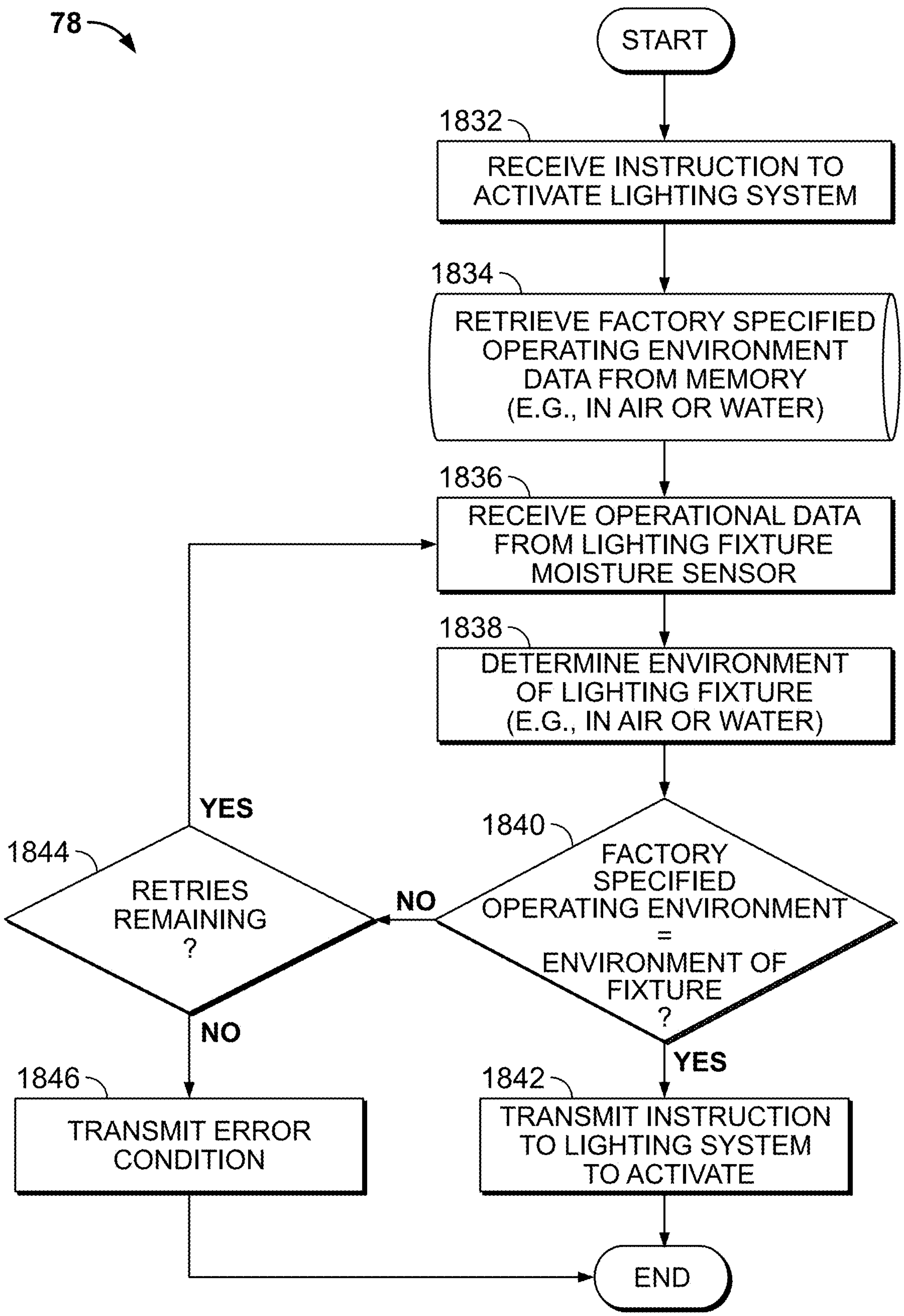

FIG. 25B is another flowchart illustrating processing logic of the lighting control logic 78 communicating with a lighting system. In step 1832, the lighting control logic 78 receives an instruction to activate the lighting system. In step 1834, the lighting control logic 78 retrieves factory specified operating environment data from memory, e.g., is the light in air or water. In step 1836, the lighting control logic 78 receives data from lighting fixture moisture sensor. In step 1838, the lighting control logic 78 determines the environment of the lighting fixture, e.g., is the fixture in air or water. In step 1840, the lighting control logic 78 determines if the lighting fixture is in the environment specified by the factory specified operating environment. If a positive determination is made, the process proceeds to step 1842. If a negative determination is made, the process proceeds to step 1844. In step 1842, the lighting control logic 78 transmits an instruction to the lighting system to activate, and the process ends. As referenced above, if a negative determination is made at step 1840, then the process proceeds to step 1844. In step 1844, the lighting control logic 78 determines if there are any retries remaining. If a positive determination is made, then the lighting control logic 78 proceeds to step 1836 and continues the process from that step. If a negative determination is made, then the lighting control logic 78 proceeds to step 1846 and transmits an error condition signal, and the process ends.

Figure 25C:
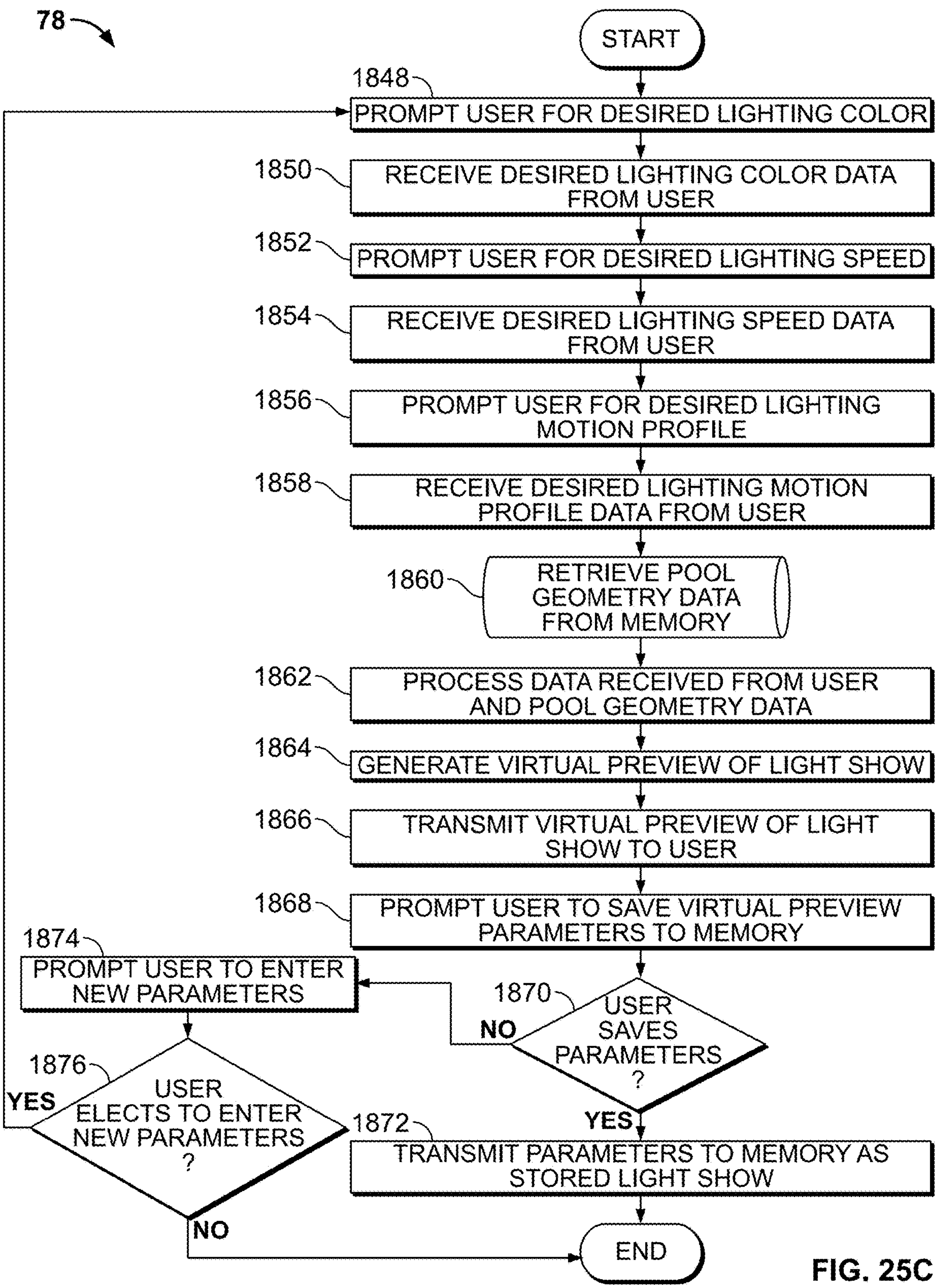

FIG. 25C is a flowchart illustrating a process for a user to define a light show. In step 1848, the lighting control logic 78 prompts the user for a desired lighting color. In step 1850, the lighting control logic 78 receives the desired lighting color data from the user. In step 1852, the lighting control logic 78 prompts the user for a desired lighting speed. In step 1854, the lighting control logic 78 receives the desired lighting speed data from the user. In step 1856, the lighting control logic 78 prompts the user for a desired lighting motion profile. In step 1858, the lighting control logic 78 receives desired lighting motion profile data from the user. In step 1860, the lighting control logic 78 retrieves pool geometry data from memory. In step 1862, the lighting control logic 78 processes the data received from the user and the pool geometry data. In step 1864, the lighting control logic 78 generates a virtual preview of a light show from the user data and pool geometry data. In step 1866, the lighting control logic 78 transmits the virtual preview of the light show to the user. In step 1868, the lighting control logic 78 prompts the user to save virtual preview parameters to the memory. In step 1870, the lighting control logic 78 determines if the user has saved the parameters. If a positive determination is made then the process proceeds to step 1872 where the lighting control logic 78 transmits the parameters to memory as a stored light show, and the process ends. If a negative determination is made, then the process proceeds to step 1874 where the lighting control logic 78 prompts the user to enter new parameters, and then proceeds to step 1876. In step 1876, the lighting control logic 78 determines if the user has elected to enter new parameters. If a positive determination is made then the process returns to step 1848. If a negative determination is made then the process ends.

Figure 25D:
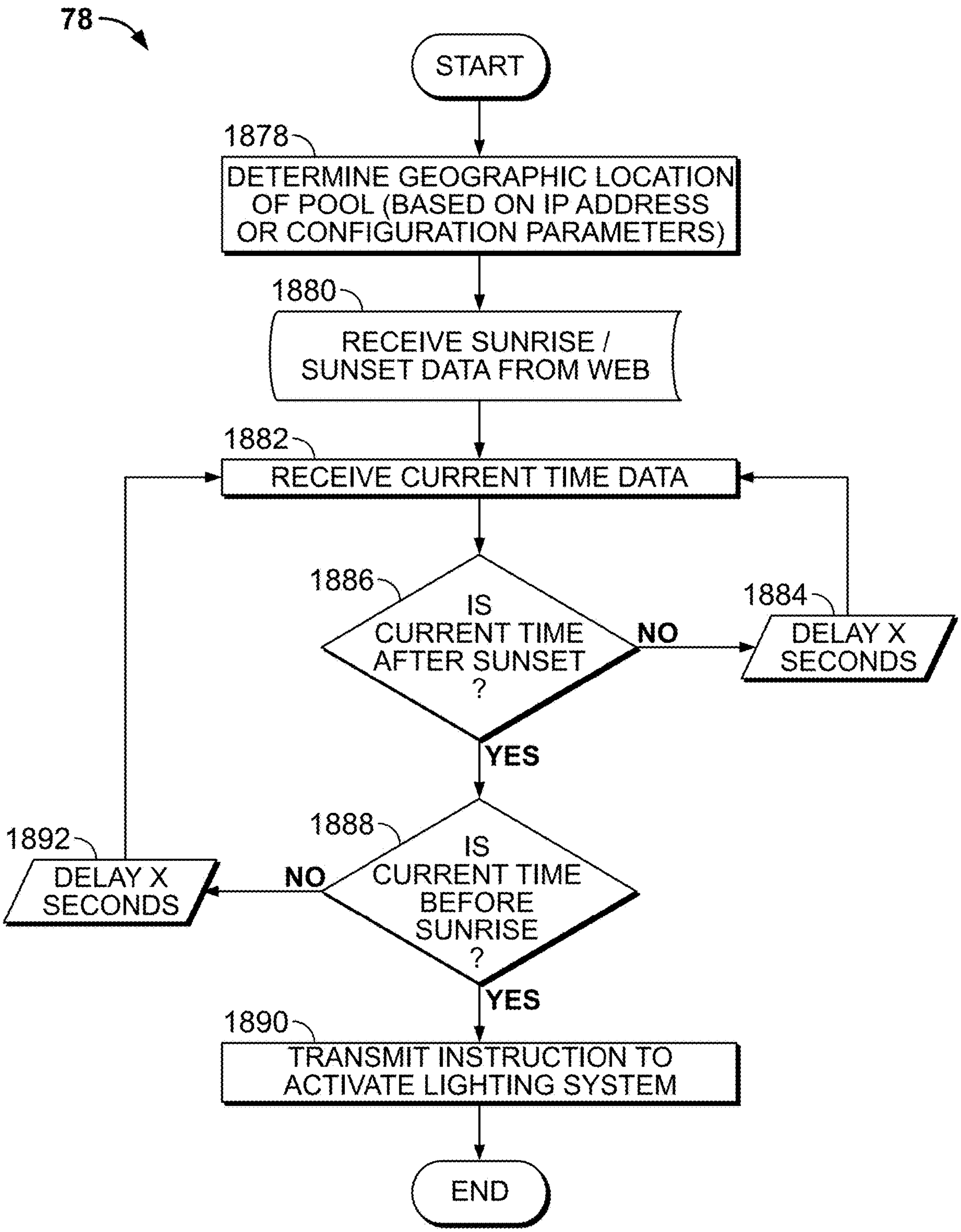

FIG. 25D is another flowchart illustrating processing logic of the lighting control logic 78 communicating with a lighting system. In step 1878, the lighting control logic 78 determines the geographic location of the pool, e.g., based on IP address or configuration parameters. In step 1880, the lighting control logic 78 receives sunrise/sunset data from the web based on the geographic location. In step 1882, the lighting control logic 78 receives current time data. In step 1886, the lighting control logic 78 determines if the current time is after sunset. If a positive determination is made, the process proceeds to step 1888. If a negative determination is made, the process proceeds to step 1884 where the lighting control logic 78 delays operation for a predetermined period of time, and after the expiration of the predetermined period of time returns to step 1882. As referenced above, if a positive determination is made at step 1886, then the process proceeds to step 1888. In step 1888, the lighting control logic 78 determines if the current time is before sunrise. If a positive determination is made, then the lighting control logic 78 proceeds to step 1890 where it transmits an instruction to activate the lighting system, and the process ends. If a negative determination is made, then the lighting control logic 78 proceeds to step 1892 where it delays operation for a predetermined period of time, and after the expiration of the predetermined period of time returns to step 1882.

Figure 25E:
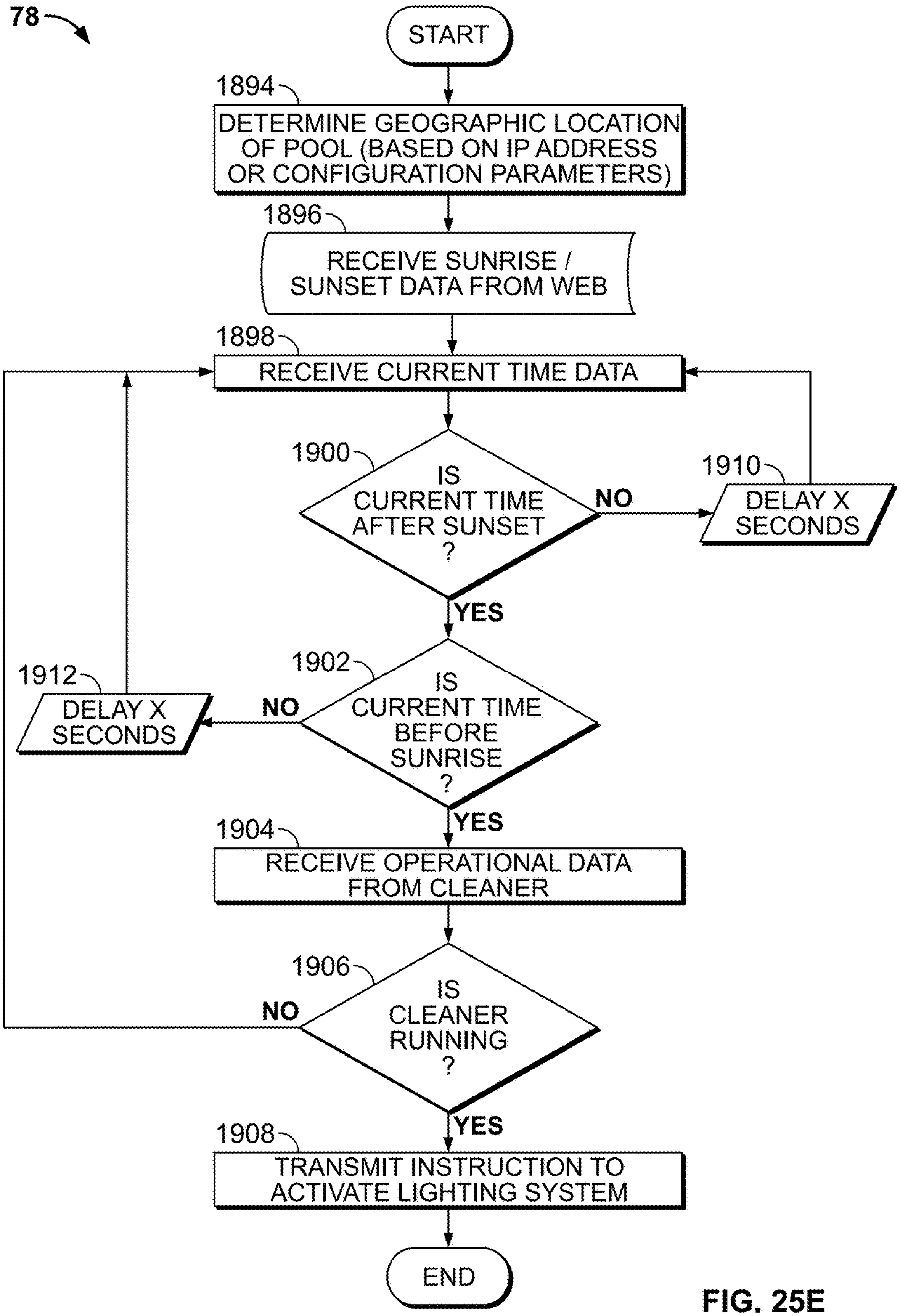

FIG. 25E is another flowchart illustrating processing logic of the lighting control logic 78 communicating with a lighting system. In step 1894, the lighting control logic 78 determines the geographic location of the pool, e.g., based on IP address or configuration parameters. In step 1896, the lighting control logic 78 receives sunrise/sunset data from the web based on the geographic location. In step 1898, the lighting control logic 78 receives current time data. In step 1900, the lighting control logic 78 determines if the current time is after sunset. If a positive determination is made, the process proceeds to step 1902. If a negative determination is made, the process proceeds to step 1910 where the lighting control logic 78 delays operation for a predetermined period of time, and after the expiration of the predetermined period of time returns to step 1898. As referenced above, if a positive determination is made at step 1900, then the process proceeds to step 1902. In step 1902, the lighting control logic 78 determines if the current time is before sunrise. If a positive determination is made, then the lighting control logic 78 proceeds to step 1904. If a negative determination is made, then the lighting control logic 78 proceeds to step 1892 where it delays operation for a predetermined period of time, and after the expiration of the predetermined period of time returns to step 1898. As referenced above, if a positive determination is made at step 1902, then the process proceeds to step 1904. In step 1904, the lighting control logic 78 receives operational data from a pool cleaner. In step 1906, the lighting control logic 78 determines if the pool cleaner is running. If a negative determination is made, then the process returns to step 1898. If a positive determination is made, then the process proceeds to step 1908 where the lighting control logic 78 transmits an instruction to activate the lighting system.

Figure 25F:
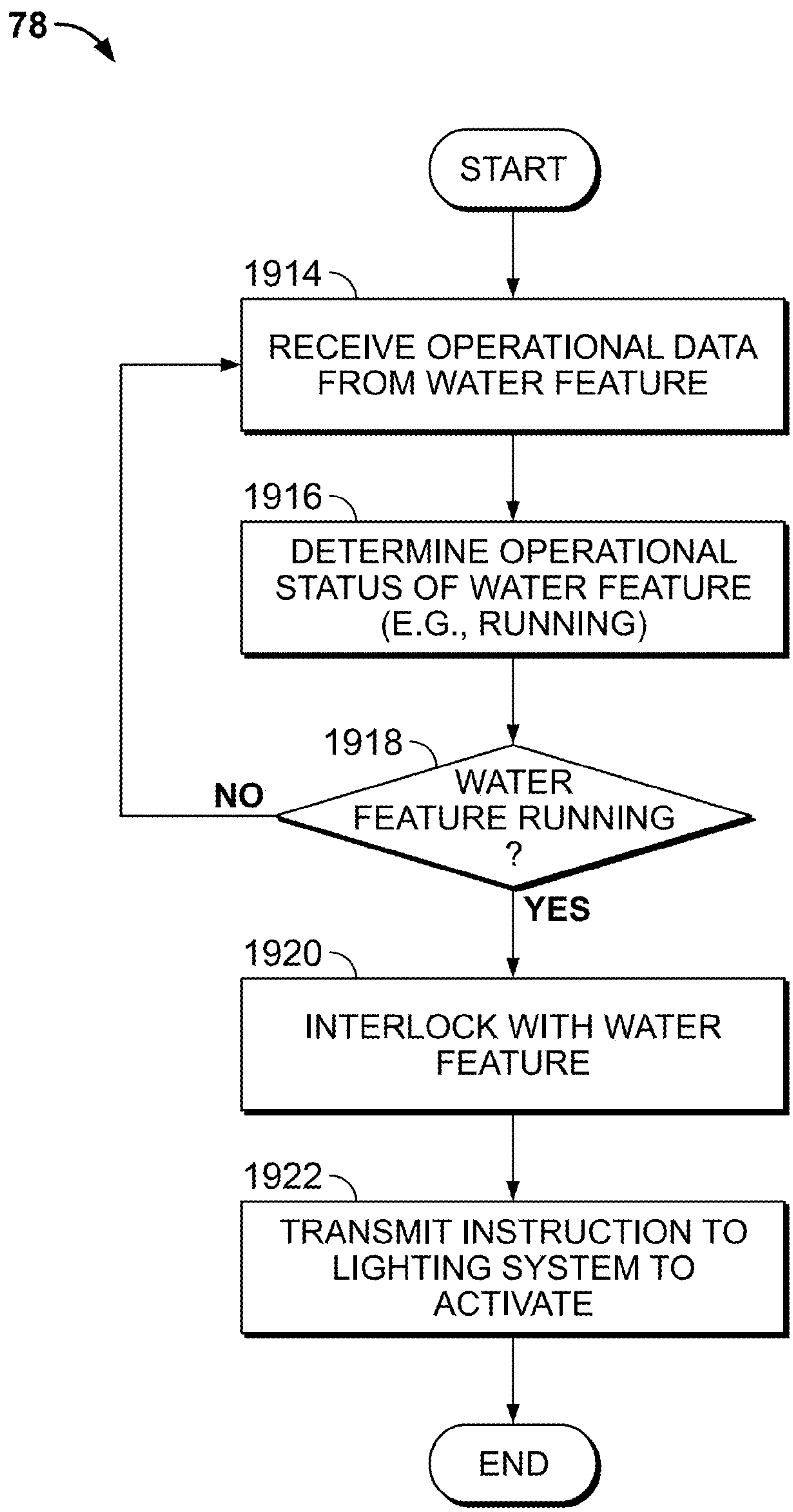

FIG. 25F is another flowchart illustrating processing logic of the lighting control logic 78 communicating with a lighting system. In step 1914, the lighting control logic 78 receives operational data from a water feature. In step 1916, the lighting control logic 78 determines the operational status of the water feature. In step 1918, the lighting control logic 78 determines if the water feature is running. If a negative determination is made, then the process returns to step 1914. If a positive determination is made, then the process proceeds to step 1920 where the lighting control logic 78 interlocks with the water feature. In step 1922, the lighting control logic 78 transmits an instruction to the lighting system to activate.

Figure 25G:
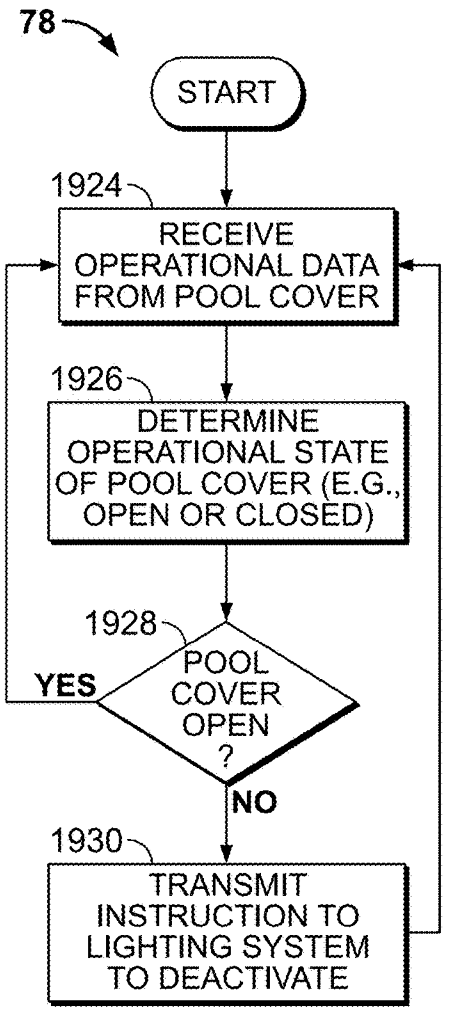

FIG. 25G is another flowchart illustrating processing logic of the lighting control logic 78 communicating with a lighting system. In step 1924, the lighting control logic 78 receives operational data from a pool cover. In step 1926, the lighting control logic 78 determines the operational status of the pool cover, e.g., is the pool cover open or closed. In step 1928, the lighting control logic 78 determines if the pool cover is open. If a positive determination is made, then the process returns to step 1924. If a negative determination is made, then the process proceeds to step 1930 where the lighting control logic 78 transmits an instruction to the lighting system to deactivate, and then returns to step 1924.

Figure 25H:
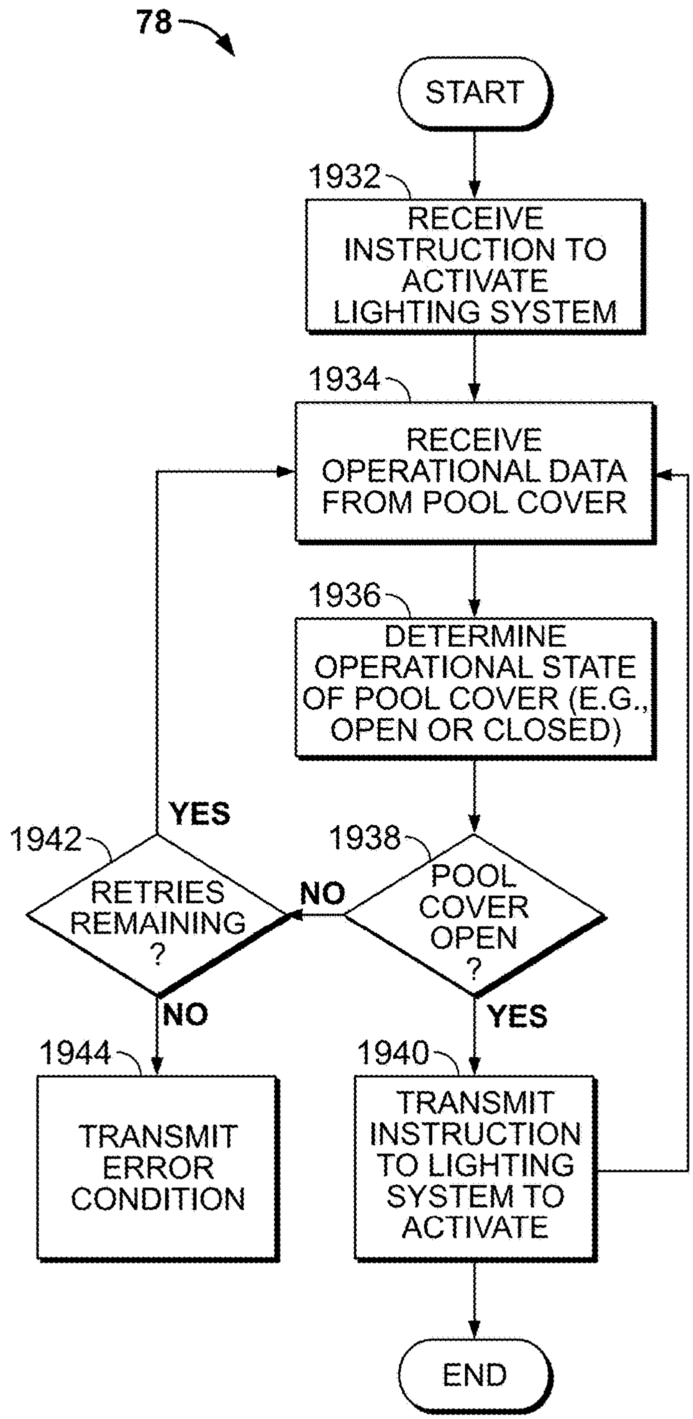

FIG. 25H is another flowchart illustrating processing logic of the lighting control logic 78 communicating with a lighting system. In step 1932, the lighting control logic 78 receives an instruction to activate the lighting system. In step 1934, the lighting control logic 78 receives operational data from a pool cover. In step 1936, the lighting control logic 78 determines the operational state of the pool cover, e.g., is the pool cover open or closed. In step 1938, the lighting control logic 78 determines if the pool cover is open. If a positive determination is made, then the process proceeds to step 1940 where the lighting control logic 78 transmits an instruction to the lighting system to activate and then returns to step 1934. If a negative determination is made, then the process proceeds to step 1942 where the lighting control logic 78 determines if there are any retries remaining. If a positive determination is made, then the process returns to step 1934. If a negative determination is made, then the process proceeds to step 1944 where an error condition is transmitted, and the process ends.

Figure 25I:
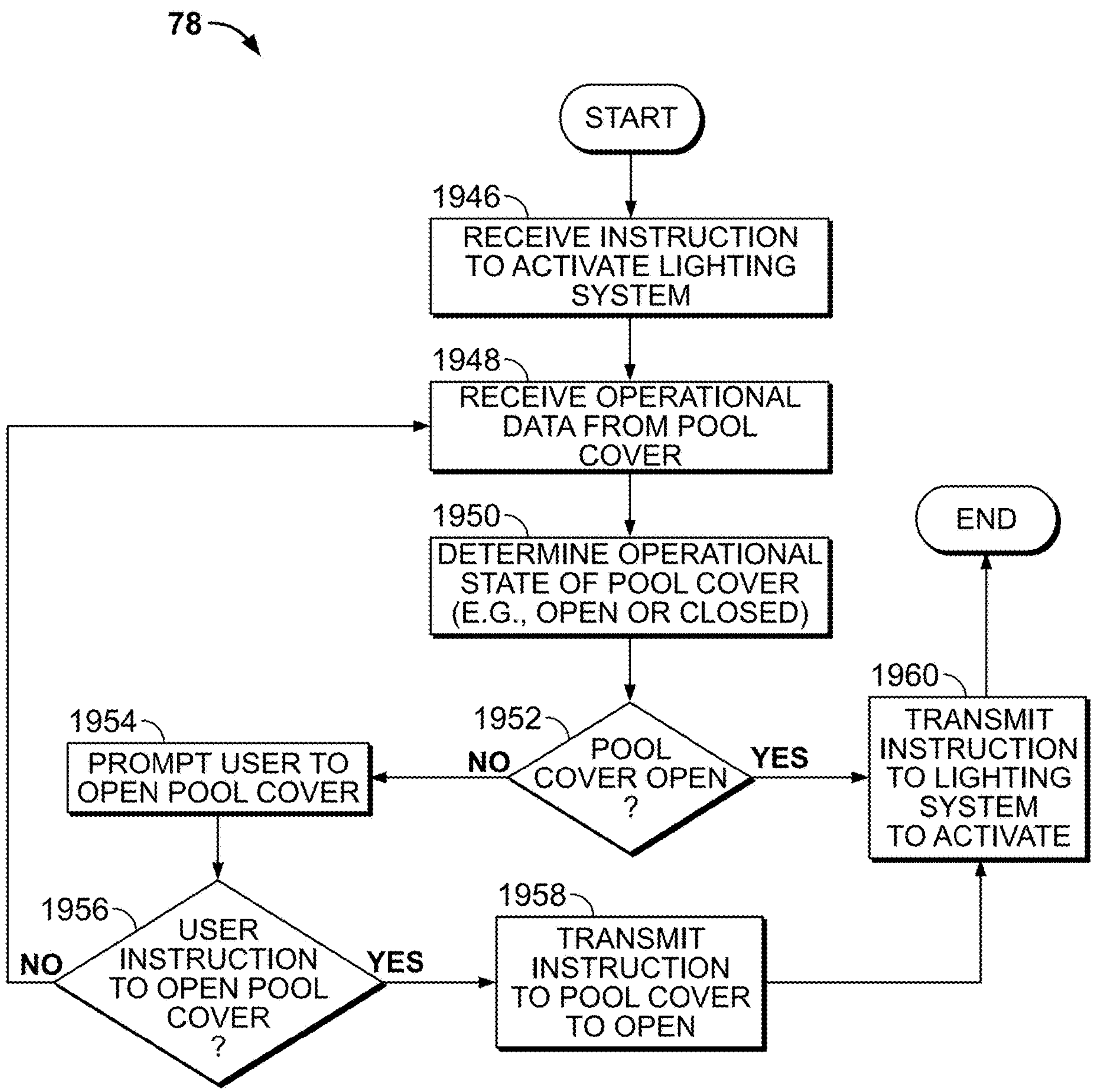

FIG. 25I is another flowchart illustrating processing logic of the lighting control logic 78 communicating with a lighting system. In step 1946, the lighting control logic 78 receives an instruction to activate the lighting system. In step 1948, the lighting control logic 78 receives operational data from a pool cover. In step 1950, the lighting control logic 78 determines the operational state of the pool cover, e.g., is the pool cover open or closed. In step 1952, the lighting control logic 78 determines if the pool cover is open. If a positive determination is made, then the process proceeds to step 1960 where the lighting control logic 78 transmits an instruction to the lighting system to activate, and the process ends. If a negative determination is made, then the process proceeds to step 1954 where the lighting control logic 78 prompts a user to open the pool cover. In step 1956, the lighting control logic 78 determines if the user has issued an instruction to open the pool cover. If a negative determination is made, then the process returns to step 1948. If a positive determination is made, then the process proceeds to step 1958 where the lighting control logic 78 transmits an instruction to the pool cover to open, and the process ends.

Figure 25J:
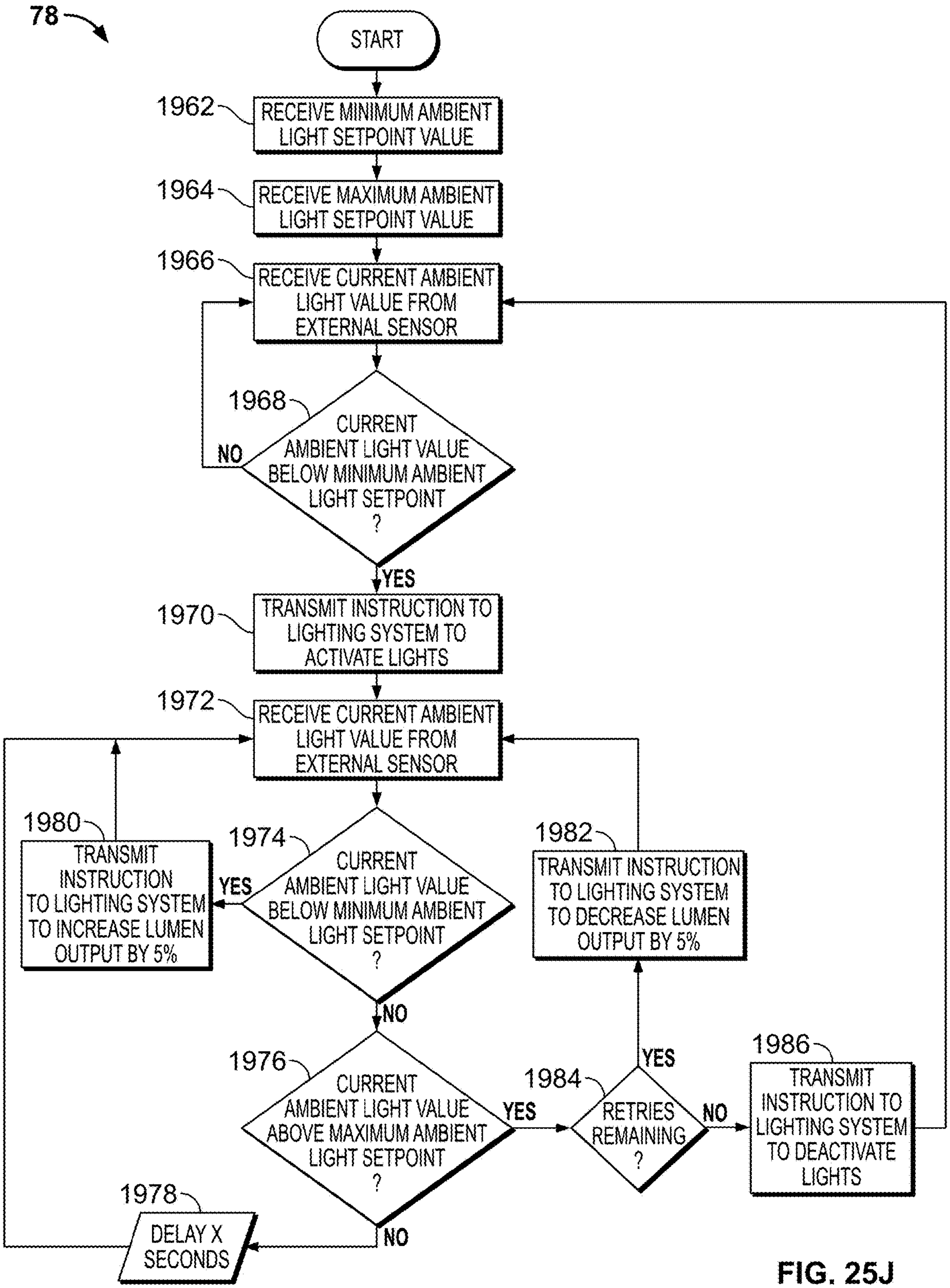
Figure 25K:
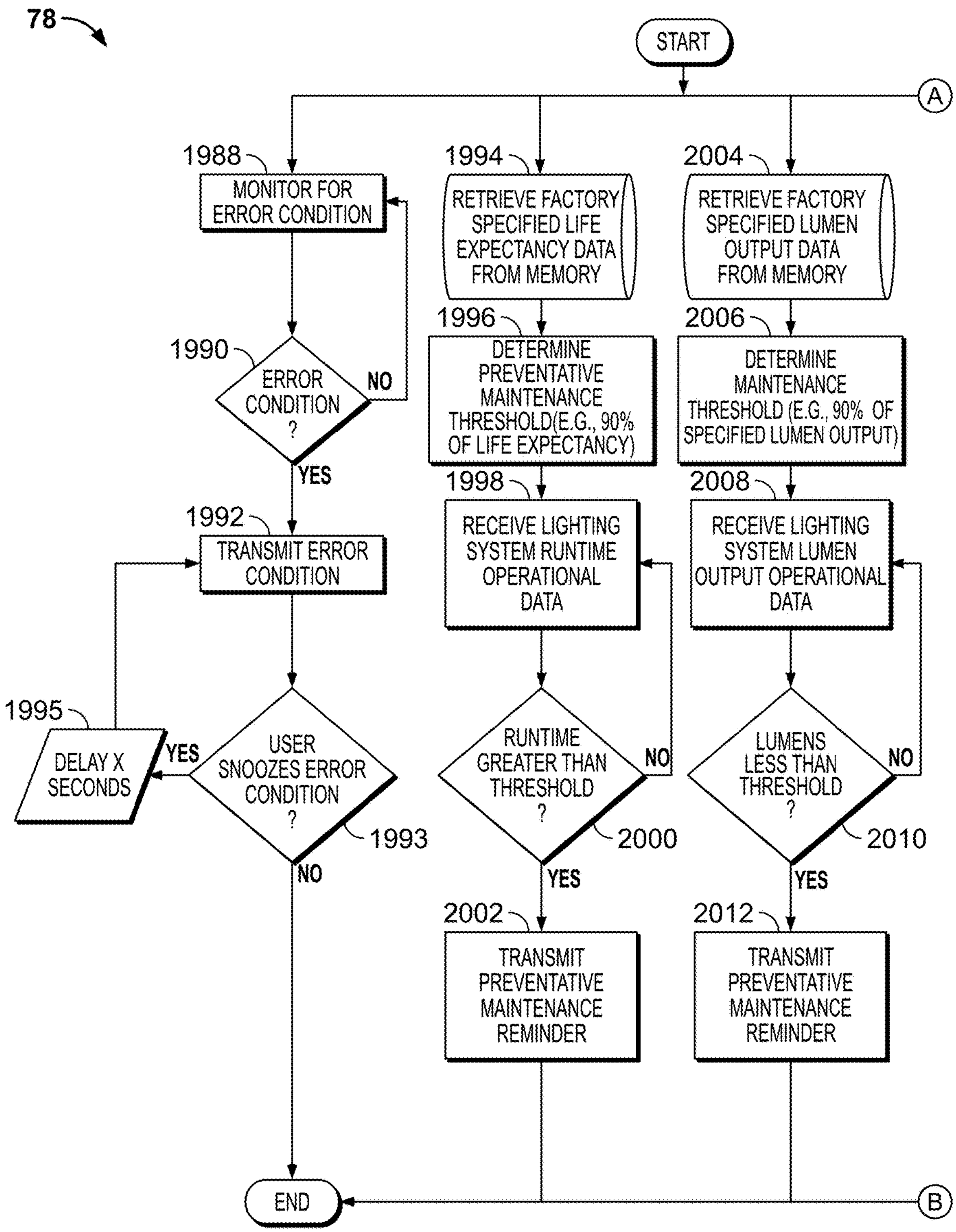
Figure 25K:
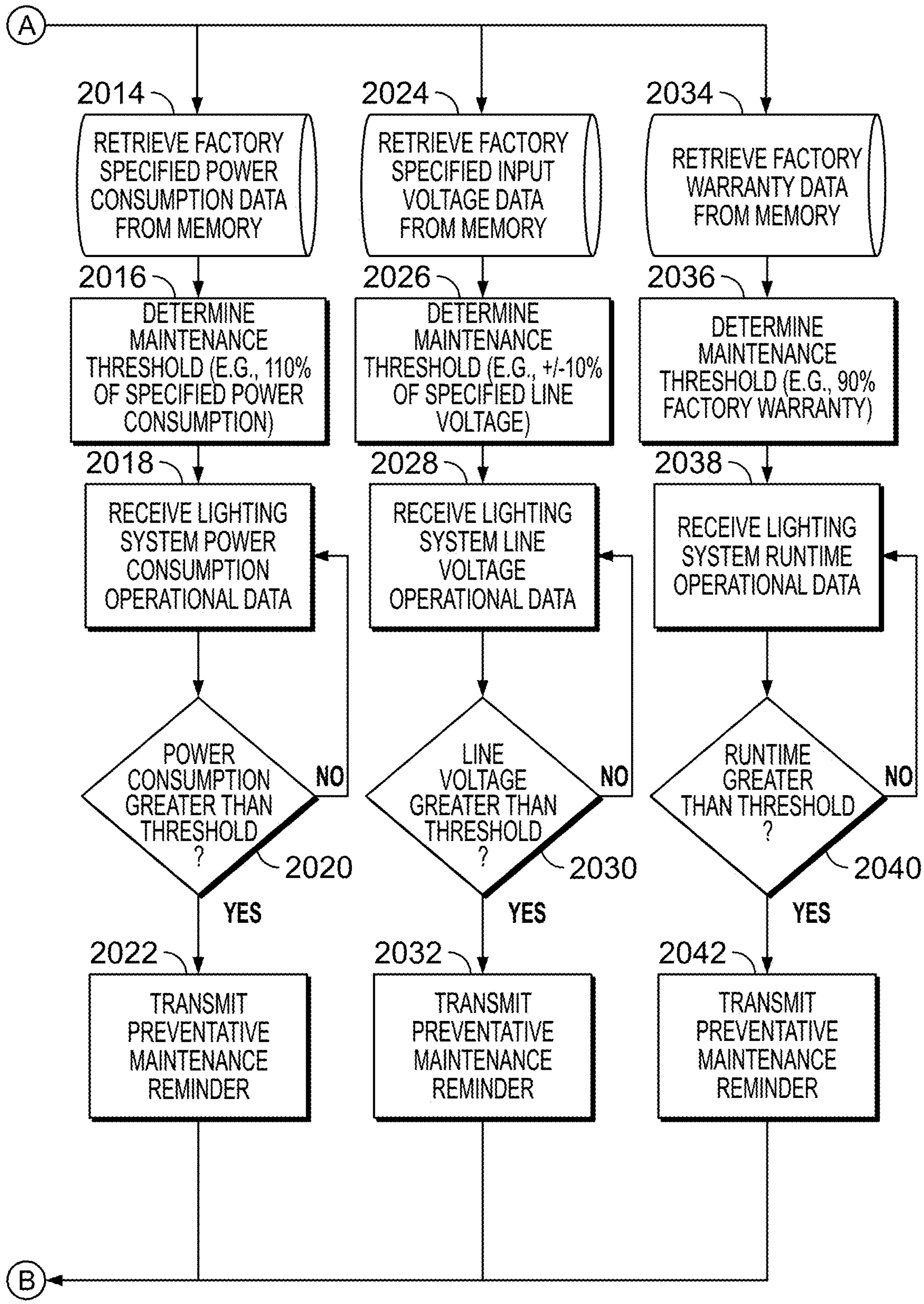

FIG. 25J is another flowchart illustrating processing logic of the lighting control logic 78 communicating with a lighting system. In step 1962, the lighting control logic 78 receives a minimum ambient light setpoint value. In step 1964, the lighting control logic 78 receives a maximum ambient light setpoint value. In step 1966, the lighting control logic 78 receives a current ambient light value from an external sensor. In step 1968, the lighting control logic 78 determines if the current ambient light value is below the minimum ambient light setpoint. If a negative determination is made, then the process returns to step 1966. If a positive determination is made, then the process proceeds to step 1970 where the lighting control logic 78 transmits an instruction to the lighting system to activate the lights. In step 1972, the lighting control logic 78 receives a current ambient light value from an external sensor. In step 1974, the lighting control logic 78 determines if the current ambient light value is below a minimum ambient light setpoint. If a positive determination is made, then the process proceeds to step 1980 where the lighting control logic 78 transmits an instruction to the lighting system to increase the lumen output by 5% and then returns to step 1972. It is noted that while the lighting system could increase lumen output in 5% increments it is contemplated that any satisfactory incremental value could be chosen for optimization of the system (e.g., 1%, 2%, 5%, 10%, etc.). If a negative determination is made, then the process proceeds to step 1976. In step 1976, the lighting control logic 78 determines if the current ambient light value is above the maximum ambient light setpoint. If a negative determination is made (e.g., the ambient light is in the acceptable range—above the minimum setpoint and below the maximum setpoint), then the process proceeds to step 1978 where it delays for a predetermined time period and then returns to step 1972. If a positive determination is made, then the process proceeds to step 1984 where the lighting control logic 78 determines if there are any retries remaining. If a negative determination is made, then the process proceeds to step 1986 where the lighting control logic 78 transmits an instruction to the lighting system to deactivate the lights and then returns to step 1966. If a positive determination is made, then the process proceeds to step 1982 where the lighting control logic 78 transmits an instruction to the lighting system to decrease lumen output by 5% and then returns to step 1972. It is noted that while the lighting system could increase lumen output in 5% increments it is contemplated that any satisfactory incremental value could be chosen for optimization of the system (e.g., 1%, 2%, 5%, 10%, etc.).

FIG. 23K is a flowchart illustrating processing logic of the lighting control logic 78 determining an error condition and preventative maintenance reminders for a lighting system. The lighting control logic 78 proceeds with six parallel routine sequences that respectively begin with steps 1988, 1994, 2004, 2014, 2024, 2034. Each routine sequence is discussed sequentially, though it should be understood that the routine loops could operate in parallel, or alternatively, in series with each other. The first sequence begins in step 1988 where the lighting control logic 78 monitors for an error condition. In step 1990, the lighting control logic 78 determines if there is an error condition. If a negative determination is made, then the process returns to step 1988. If a positive determination is made, then the process proceeds to step 1992 where the lighting control logic 78 transmits an error condition. In step 1993, the lighting control logic 78 determines if the user has snoozed the error condition. If a negative determination is made, then the process ends. If a positive determination is made, then the process proceeds to step 1995 where it delays for a predetermined period of time and then returns to step 1992.

The second sequence begins at step 1994, where the lighting control logic 78 retrieves factory specified life expectancy data from memory. In step 1996, the lighting control logic 78 determines a preventative maintenance threshold, e.g., less than 90% of light life expectancy remaining or runtime value. In step 1998, the lighting control logic 78 receives operational data on lighting system runtime. In step 2000, the lighting control logic 78 determines if the lighting system runtime is greater than the threshold. If a negative determination is made, then the process returns to step 1998 and continues to receive operational data on lighting system runtime. If a positive determination is made, then the process proceeds to step 2002 where a preventative maintenance reminder is transmitted to a user, and the process ends.

The third sequence begins in step 2004 where the lighting control logic 78 retrieves factory specified lumen output data from memory. In step 2006, the lighting control logic 78 determines a maintenance threshold, e.g., a lumen output value that is 90% of a specified lumen output. In step 2008, the lighting control logic 78 receives operational data on lighting system lumen output. In step 2010, the lighting control logic 78 determines if the lighting system operating lumen output is less than the threshold. If a negative determination is made, then the process returns to step 2008 and continues to receive operational lumen output data for the lighting system. If a positive determination is made, then the process proceeds to step 2012 where a preventative maintenance reminder is transmitted to a user, and the process ends.

The fourth sequence begins in step 2014 where the lighting control logic 78 retrieves factory specified power consumption data from memory. In step 2016, the lighting control logic 78 determines a maintenance threshold, e.g., power value that is 110% of specified power consumption. In step 2018, the lighting control logic 78 receives operational data on lighting system power consumption. In step 2020, the lighting control logic 78 determines if the lighting system power consumption is greater than the threshold. If a negative determination is made, then the process returns to step 2018 and continues to receive operational data on lighting system power consumption. If a positive determination is made, then the process proceeds to step 2022 where a preventative maintenance reminder is transmitted to a user, and the process ends.

The fifth sequence begins in step 2024 where the lighting control logic 78 retrieves factory specified input voltage data from memory. In step 2026, the lighting control logic 78 determines a maintenance threshold, e.g., an input voltage value that is +/−10% of specified line voltage. In step 2028, the lighting control logic 78 receives operational data on lighting system line voltage. In step 2030, the lighting control logic 78 determines if the lighting system line voltage is greater than the threshold. If a negative determination is made, then the process returns to step 2028 and continues to receive operational data on lighting system line voltage. If a positive determination is made, then the process proceeds to step 2032 where a preventative maintenance reminder is transmitted to a user, and the process ends.

The sixth sequence begins in step 2034 where the lighting control logic 78 retrieves factory warranty data from memory. In step 2036, the lighting control logic 78 determines a maintenance threshold, e.g., 90% of the time period of the factory warranty has expired. In step 2038, the lighting control logic 78 receives operational data on lighting system runtime. In step 2040, the lighting control logic 78 determines if the lighting system runtime is greater than the threshold. If a negative determination is made, then the process returns to step 2038 and continues to receive operational data on lighting system runtime. If a positive determination is made, then the process proceeds to step 2042 where a preventative maintenance reminder is transmitted to a user, and the process ends.

Figure 25L:
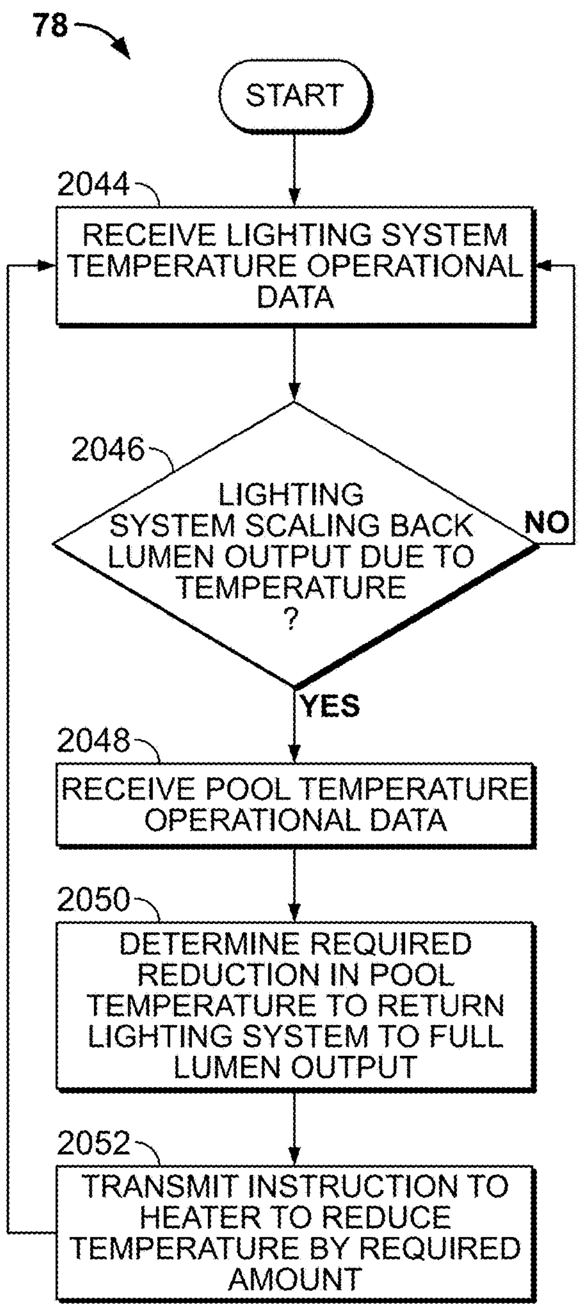

FIG. 25L is another flowchart illustrating processing logic of the lighting control logic 78 communicating with a lighting system. In step 2044, the lighting control logic 78 receives lighting system temperature operational data. In step 2046, the lighting control logic 78 determines if the lighting system needs to scale back lumen output due to temperature. If a negative determination is made, then the process returns to step 2044. If a positive determination is made, then the process proceeds to step 2048 where the lighting control logic 78 receives pool temperature operational data. In step 2050, the lighting control logic 78 determines the required reduction in pool temperature to return the lighting system to full lumen output. In step 2052, the lighting control logic 78 transmits an instruction to the heater to reduce the temperature by the required amount, and then returns to step 2044.

Figure 25M:
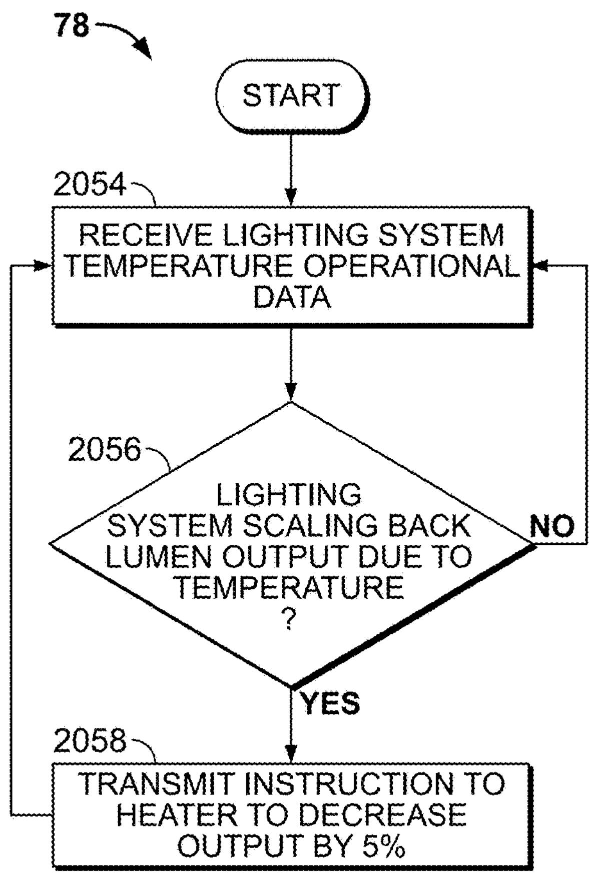

FIG. 25M is another flowchart illustrating processing logic of the lighting control logic 78 communicating with a lighting system. In step 2054, the lighting control logic 78 receives lighting system temperature operational data. In step 2056, the lighting control logic 78 determines if the lighting system needs to scale back lumen output due to temperature. If a negative determination is made, then the process returns to step 2054. If a positive determination is made, then the process proceeds to step 2058 where the lighting control logic 78 transmits an instruction to the heater instructing it to decrease output by 5%, and then returns to step 2054. It is noted that while the heater could decrease output in 5% increments it is contemplated that any satisfactory incremental value could be chosen for optimization of the system (e.g., 1%, 2%, 5%, 10%, etc.).

Figure 25N:
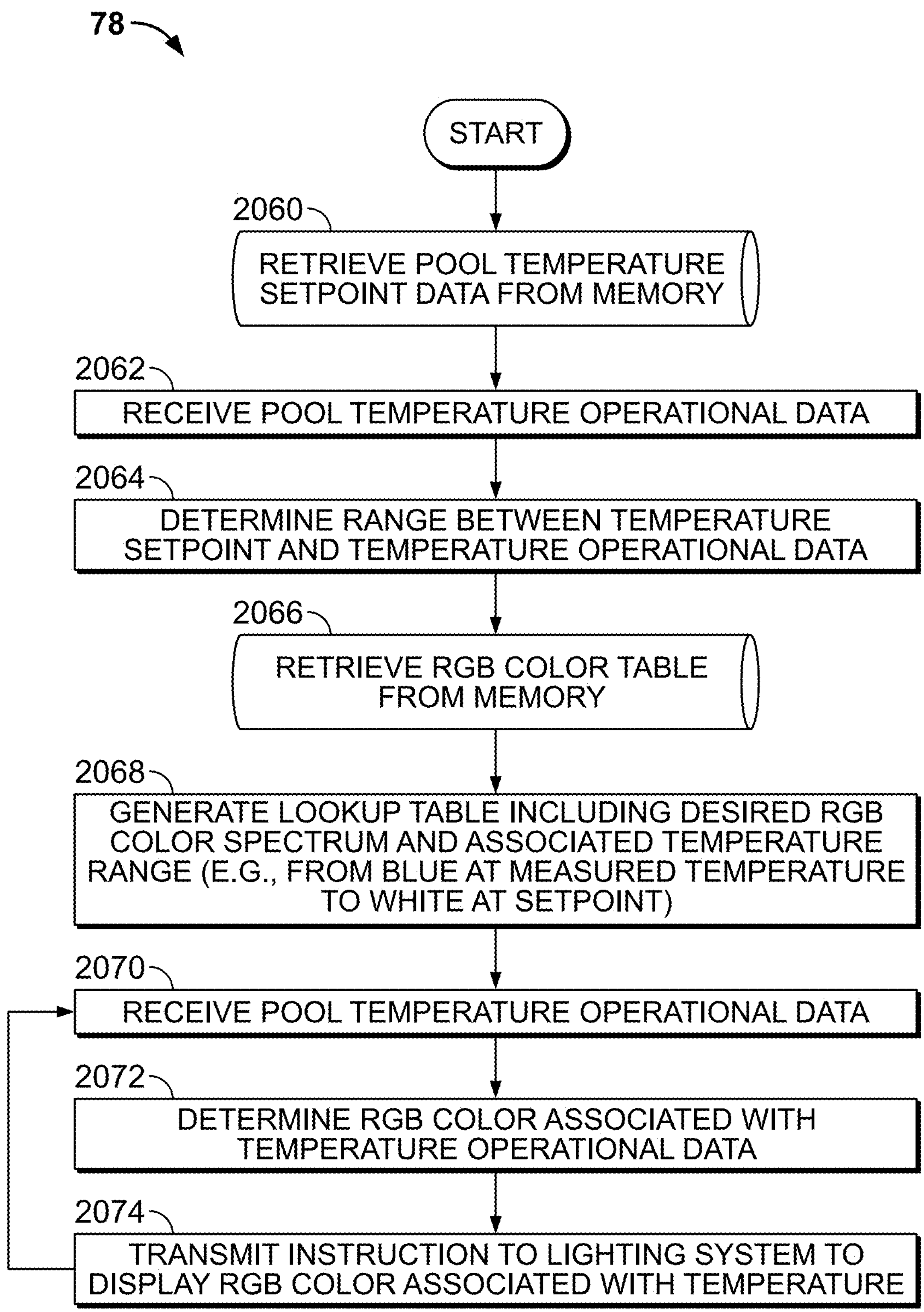

FIG. 25N is another flowchart illustrating processing logic of the lighting control logic 78 communicating with a lighting system. In step 2060, the lighting control logic 78 retrieves pool temperature setpoint data from memory. In step 2062, the lighting control logic 78 receives pool temperature operational data. In step 2064, the lighting control logic 78 determines the range between temperature setpoint and temperature operational data. In step 2066, the lighting control logic 78 retrieves RGB color table from memory. In step 2068, the lighting control logic 78 generates a lookup table including desired RGB color spectrum and associated temperature range (e.g., from blue at measured temperature to white at setpoint). In step 2070, the lighting control logic 78 receives pool temperature operational data. In step 2072, the lighting control logic 78 determines the RGB color associated with temperature operational data. In step 2074, the lighting control logic 78 transmits an instruction to the lighting system to display the RGB color associated with the pool temperature, and then returns to step 2070.

Figure 25O:
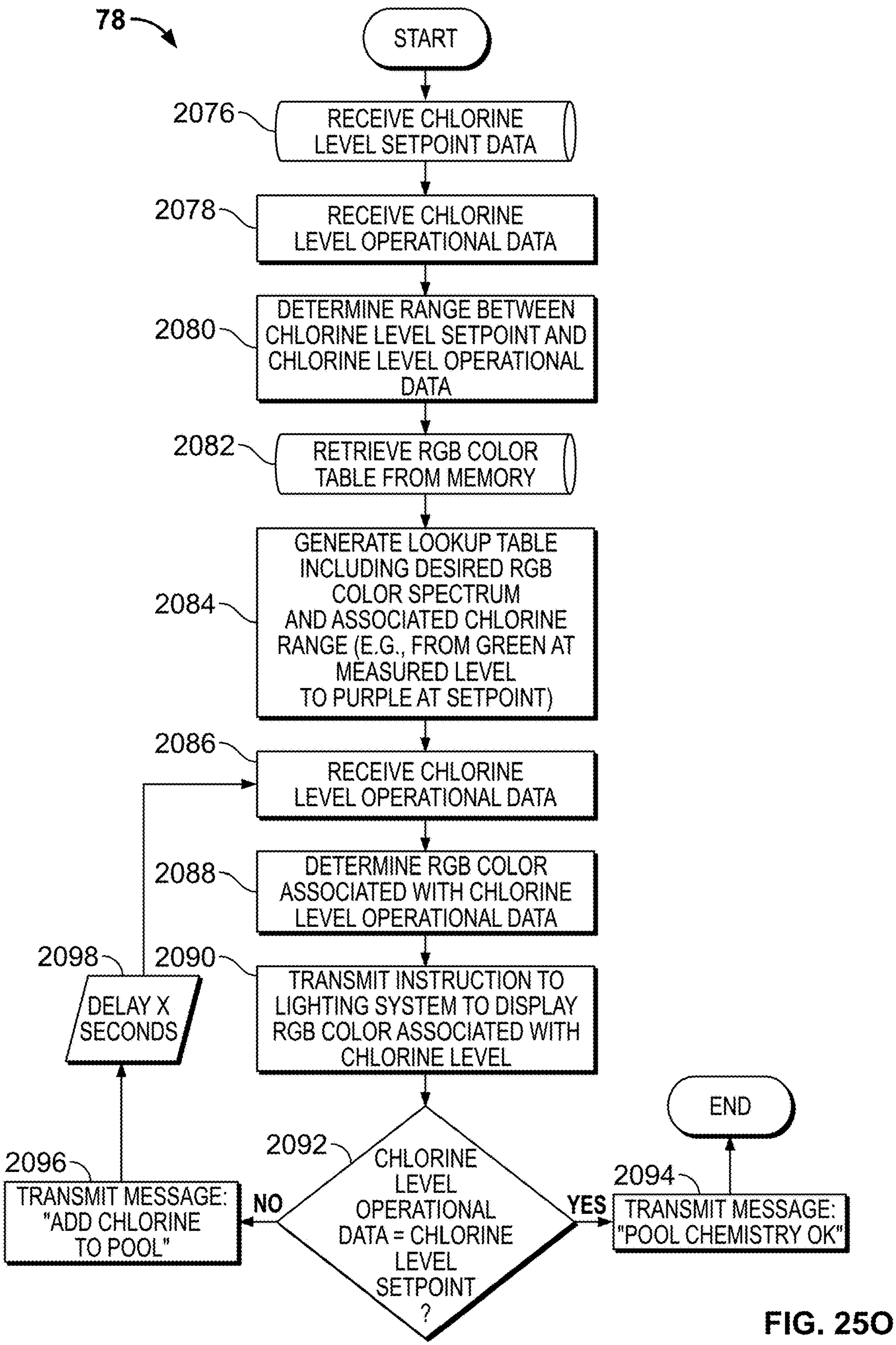

FIG. 25O is another flowchart illustrating processing logic of the lighting control logic 78 communicating with a lighting system. In step 2076, the lighting control logic 78 retrieves chlorine level setpoint data from memory. In step 2078, the lighting control logic 78 receives chlorine level operational data. In step 2080, the lighting control logic 78 determines the range between chlorine level setpoint and chlorine level operational data. In step 2082, the lighting control logic 78 retrieves RGB color table from memory. In step 2084, the lighting control logic 78 generates a lookup table including desired RGB color spectrum and associated chlorine level range (e.g., from green at measured temperature to purple at setpoint). In step 2086, the lighting control logic 78 receives chlorine level operational data. In step 2088, the lighting control logic 78 determines the RGB color associated with chlorine level operational data. In step 2090, the lighting control logic 78 transmits an instruction to the lighting system to display the RGB color associated with the chlorine level. In step 2092, the lighting control logic 78 determines if the chlorine level operational data is equal to the chlorine level setpoint. If a positive determination is made, then the process proceeds to step 2094 where the lighting control logic 78 transmits a message stating that the pool chemistry is "OK," and the process ends. If a negative determination is made, then the process proceeds to step 2096 where the lighting control logic 78 transmits a message stating that chlorine should be added to the pool. The process then proceeds to step 2098 where it delays for a predetermined period of time before returning to step 2086.

Figure 25P:
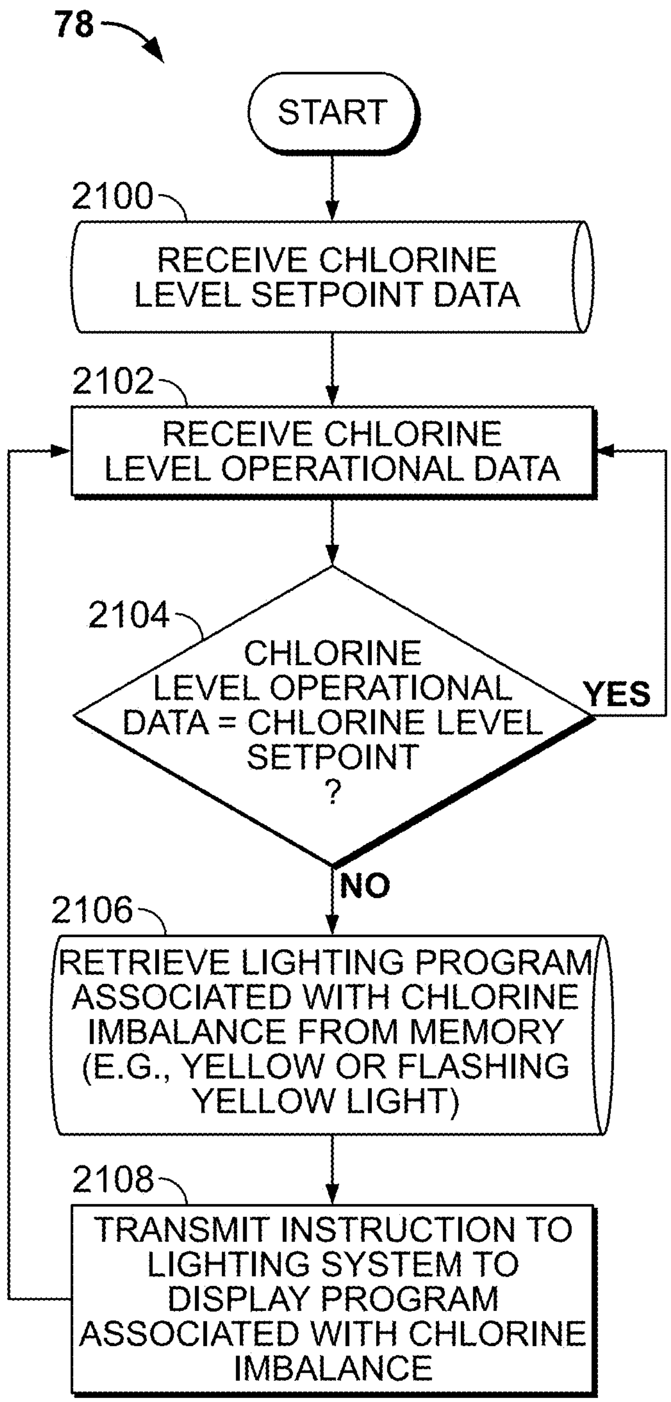

FIG. 25P is another flowchart illustrating processing logic of the lighting control logic 78 communicating with a lighting system. In step 2100, the lighting control logic 78 retrieves chlorine level setpoint data from memory. In step 2102, the lighting control logic 78 receives chlorine level operational data. In step 2104, the lighting control logic 78 determines if the chlorine level operational data is equal to the chlorine level setpoint. If a positive determination is made, then the process returns to step 2102. If a negative determination is made then the process proceeds to step 2106 where it retrieves a lighting program associated with a chlorine imbalance from memory, e.g., activate yellow or flashing yellow light to alert a user to a chlorine imbalance. In step 2108, the lighting control logic 78 transmits an instruction to the lighting system to display the program associated with a chlorine imbalance, and then returns to step 2102.

Figure 25Q:
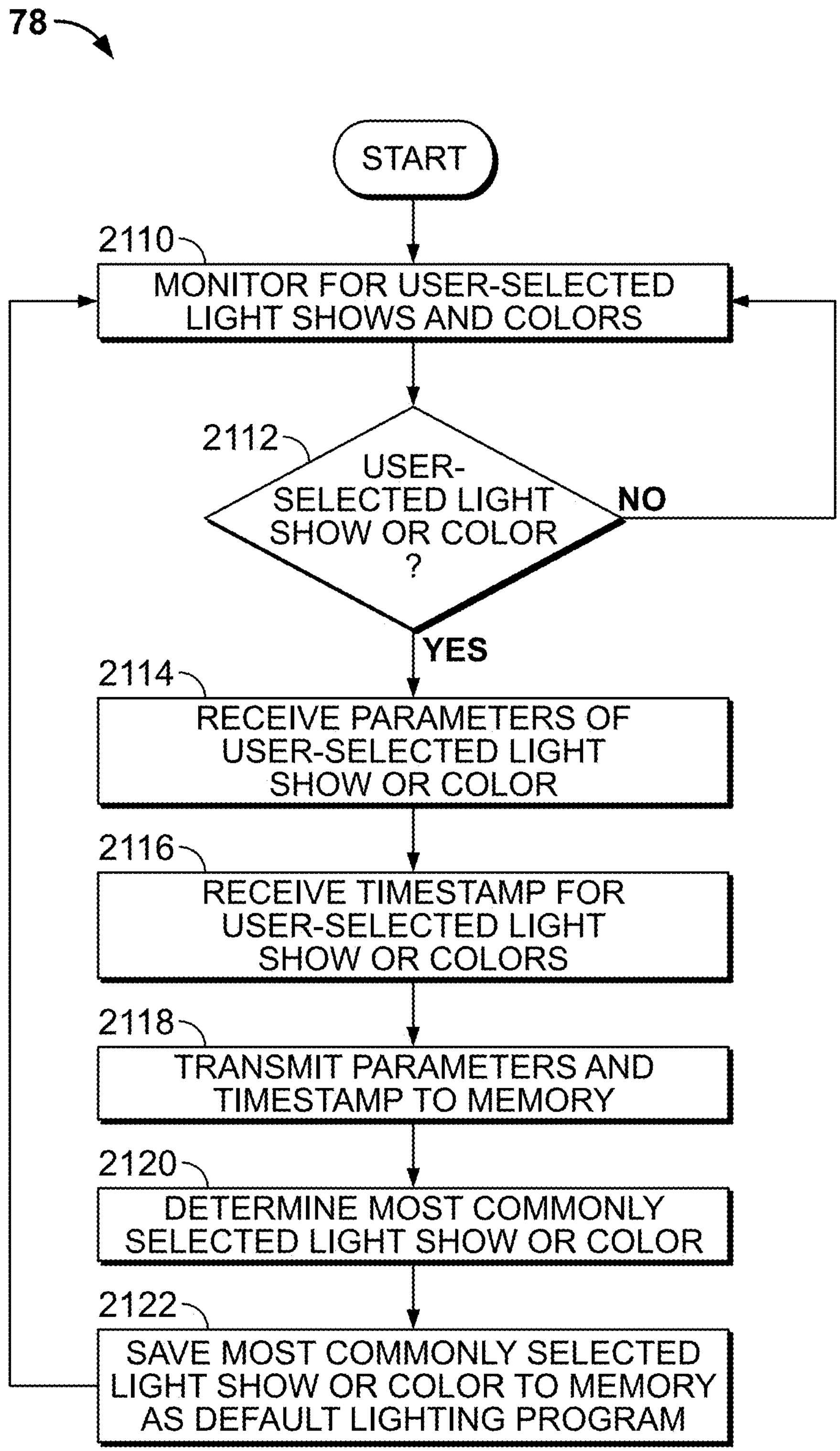

FIG. 25Q is another flowchart illustrating processing logic of the lighting control logic 78 communicating with a lighting system. In step 2110, the lighting control logic 78 monitors for user-selected light shows and colors. In step 2112, the lighting control logic 78 determines if the user has selected a light show or colors. If a negative determination is made, then the process returns to step 2110. If a positive determination is made, then the process proceeds to step 2114 where the lighting control logic 78 receives parameters of the user-selected light show or color. In step 2116, the lighting control logic 78 receives a timestamp for the user-selected light show or colors. In step 2118, the lighting control logic 78 transmits the parameters and timestamp to memory. In step 2120, the lighting control logic 78 determines the most commonly selected light show or colors. In step 2122, the lighting control logic 78 saves the most commonly selected light show or colors to memory as a default lighting program, and then returns to step 2110.

Figure 25R:
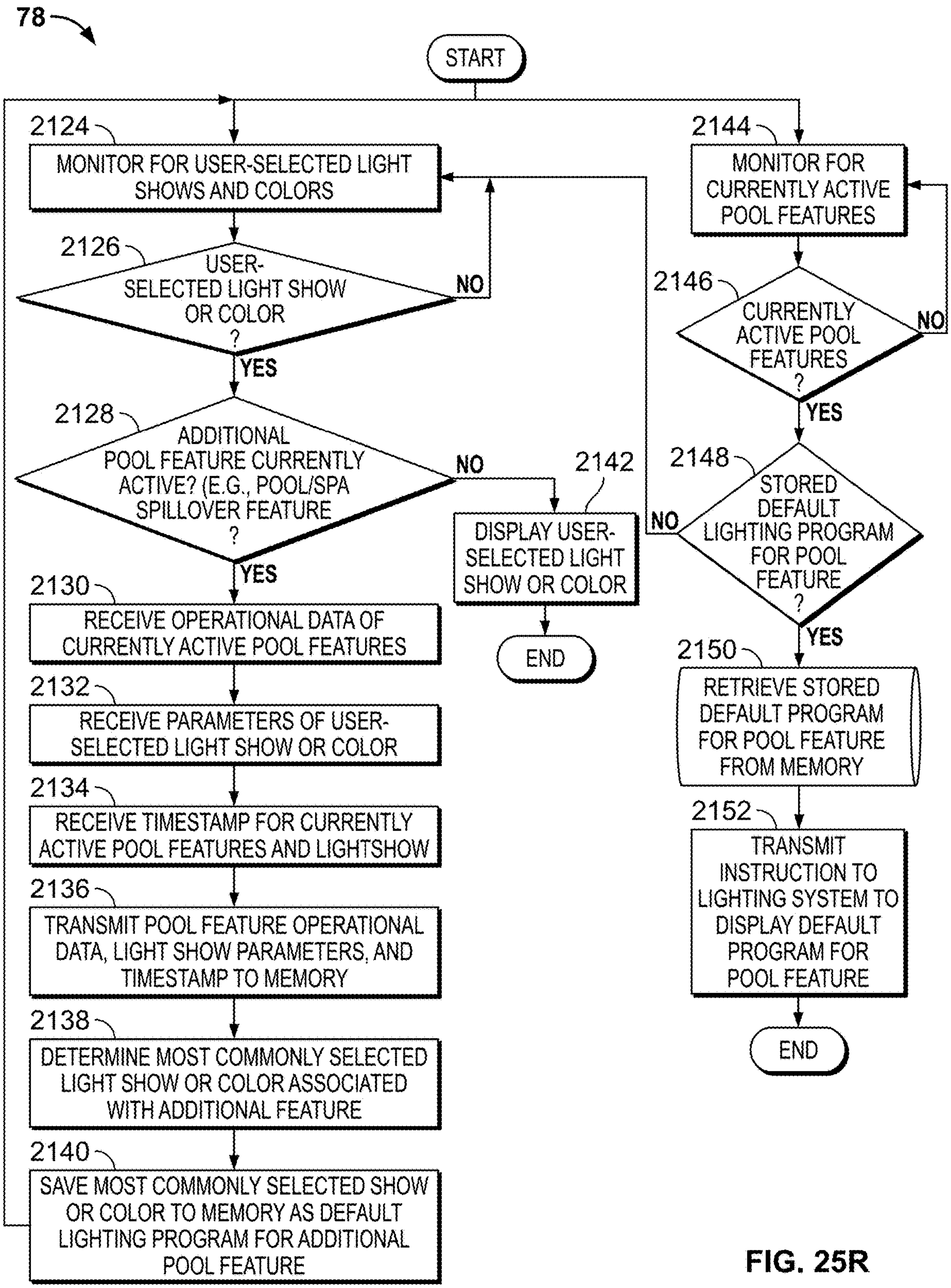

FIG. 25R is another flowchart illustrating processing logic of the lighting control logic 78 communicating with a lighting system. This process includes two parallel branches for defining a lighting program for pool features and displaying a lighting program for a specific pool features. The process begins at steps 2124 and 2144. In step 2124, the lighting control logic 78 monitors for user-selected light shows and colors. In step 2126, the lighting control logic 78 determines if the user has selected a light show or colors. If a negative determination is made, then the process returns to step 2124. If a positive determination is made, then the process proceeds to step 2128 where the lighting control logic 78 determines if additional pool features are currently active, e.g., pool/spa spillover features. If a negative determination is made, then the process proceeds to step 2142 where the lighting control logic 78 displays the user-selected light show or colors, and the process ends. If a positive determination is made, then the process proceeds to step 2130 where it receives operational data of the currently active pool features. In step 2132, the lighting control logic 78 receives parameters of the user-selected light show or color. In step 2134, the lighting control logic 78 receives a timestamp for the currently active pool features and light-show. In step 2136, the lighting control logic 78 transmits the pool feature operational data, light show parameters, and timestamp to memory. In step 2138, the lighting control logic 78 determines the most commonly selected light show or colors associated with the additional pool feature. In step 2140, the lighting control logic 78 saves the most commonly selected light show or colors to memory as a default lighting program for the additional pool features, and then returns to step 2124.

In step 2144, the lighting control logic 78 monitors for currently active pool features. In step 2146, the lighting control logic 78 determines if there are any currently active pool features. If a negative determination is made, then the process returns to step 2144. If a positive determination is made, then the process proceeds to step 2148 where the lighting control logic 78 determines if there is a stored default lighting program for the pool feature. If a negative determination is made, then the process proceeds to step 2124, where it goes through the process of having a user define a light show for that pool feature. If a positive determination is made, then the process proceeds to step 2150, where the lighting control logic 78 retrieves the stored default program for the pool feature from memory. In step 2152, the lighting control logic 78 transmits an instruction to the lighting system to display the default program for the pool feature, and the process ends.

Figure 25S:
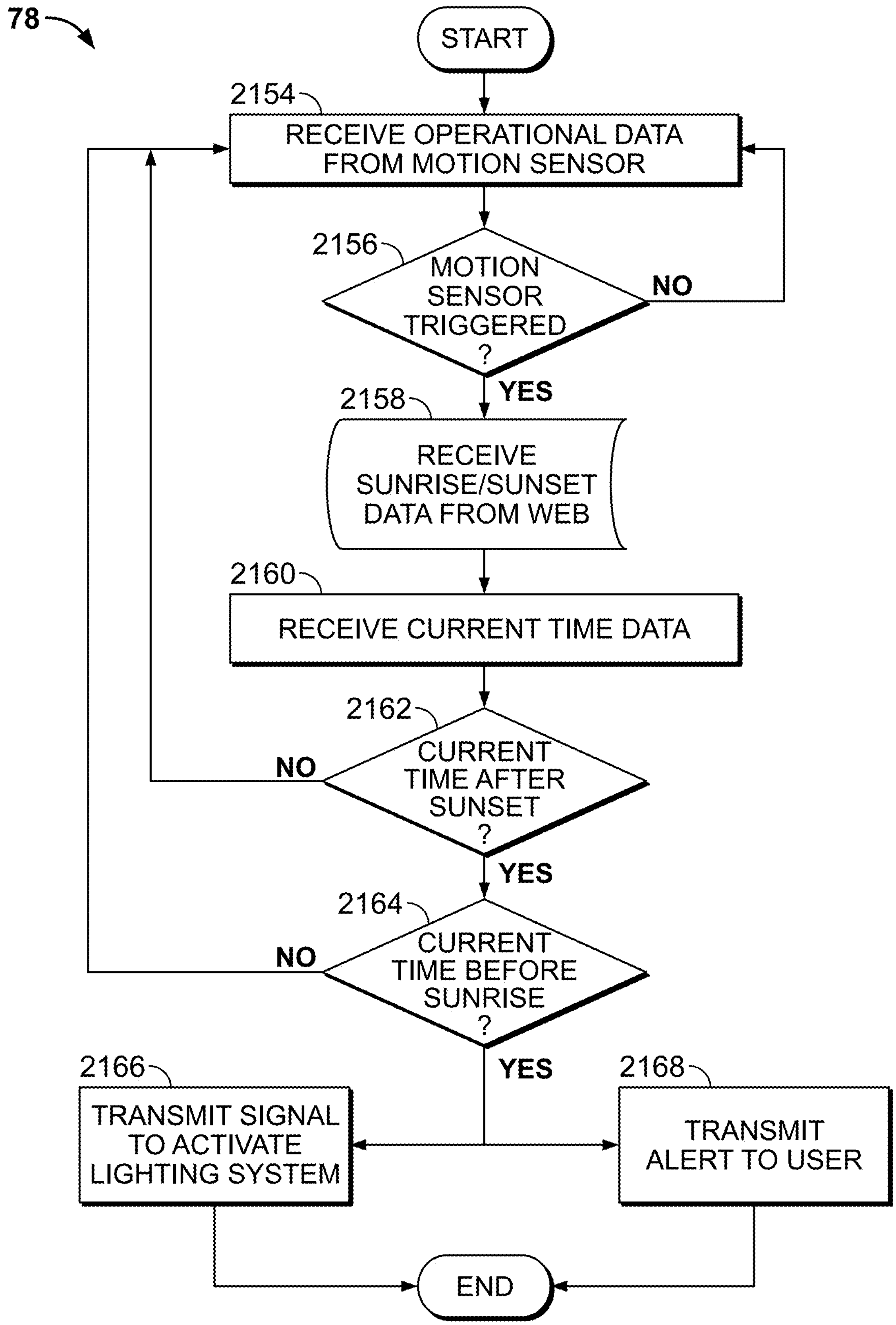

FIG. 25S is another flowchart illustrating processing logic of the lighting control logic 78 communicating with a lighting system. In step 2154, the lighting control logic 78 receives operational data from a motion sensor. In step 2156, the lighting control logic 78 determines if the motion sensor has been triggered. If a negative determination is made, then the process returns to step 2154. If a positive determination is made, then the process proceeds to step 2158 where the lighting control logic 78 receives sunrise/sunset data from the Internet. In step 2160, the lighting control logic 78 receives the current time data. In step 2162, the lighting control logic 78 determines if the current time is after sunset. If a negative determination is made, then the process returns to step 2154. If a positive determination is made, then the process proceeds to step 2164. In step 2164, the lighting control logic 78 determines if the current time is before sunrise. If a negative determination is made, then the process returns to step 2154. If a positive determination is made then the process proceeds to steps 2166 and 2168, where the lighting control logic 78 transmits a signal to activate the lighting system, transmits an alert to the user, and then ends the process.

Figure 25T:
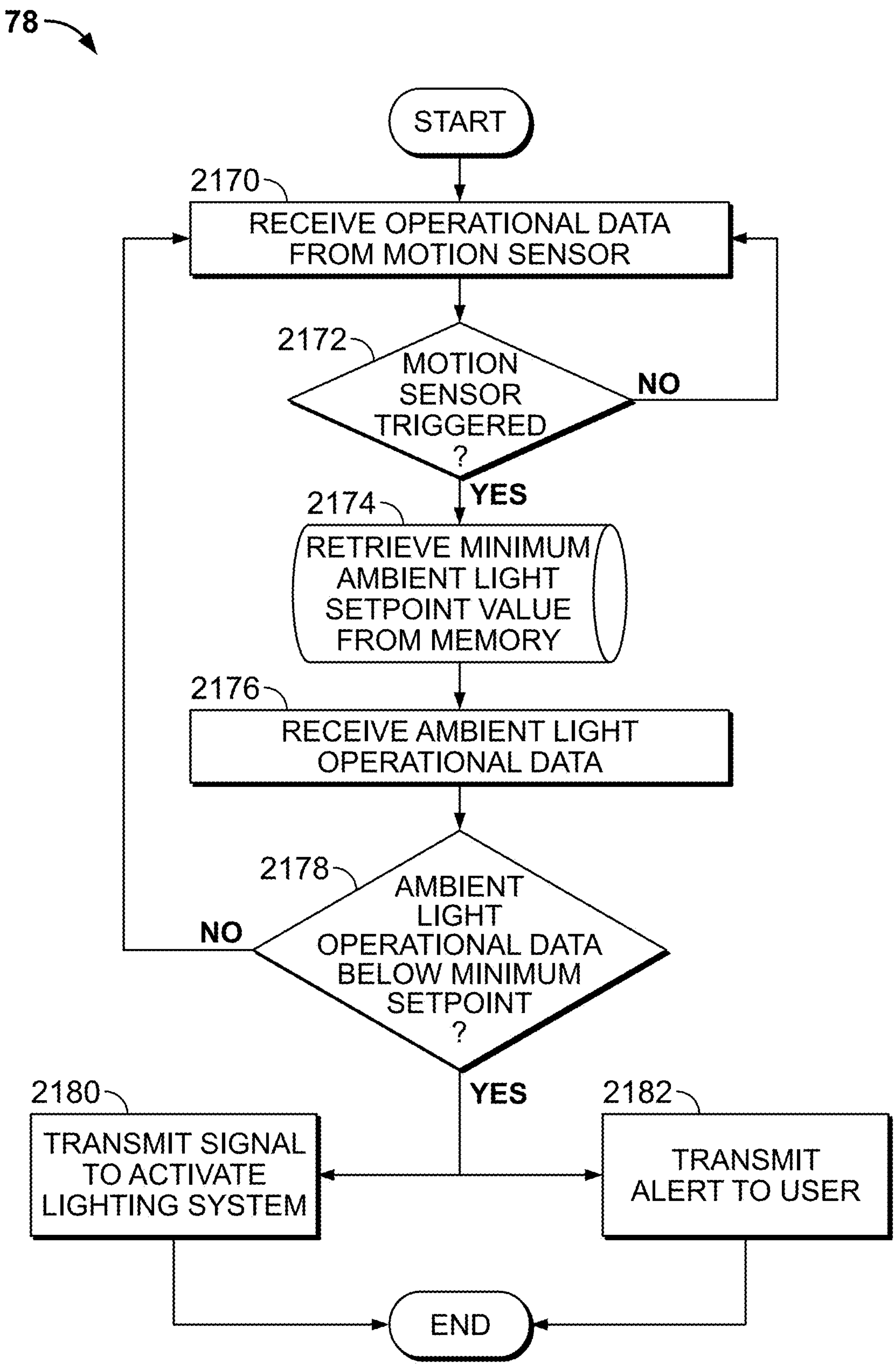

FIG. 25T is another flowchart illustrating processing logic of the lighting control logic 78 communicating with a lighting system. In step 2170, the lighting control logic 78 receives operational data from a motion sensor. In step 2172, the lighting control logic 78 determines if the motion sensor has been triggered. If a negative determination is made, then the process returns to step 2170. If a positive determination is made, then the process proceeds to step 2174 where the lighting control logic 78 retrieves a minimum ambient light setpoint value from memory. In step 2176, the lighting control logic 78 receives ambient light operational data. In step 2178, the lighting control logic 78 determines if the ambient light operational data is below the minimum setpoint. If a negative determination is made, then the process returns to step 2170. If a positive determination is made, then the process proceeds to steps 2180 and 2182, where the lighting control logic 78 transmits a signal to activate the lighting system, transmits an alert to the user, and then ends the process.

Figure 25U:
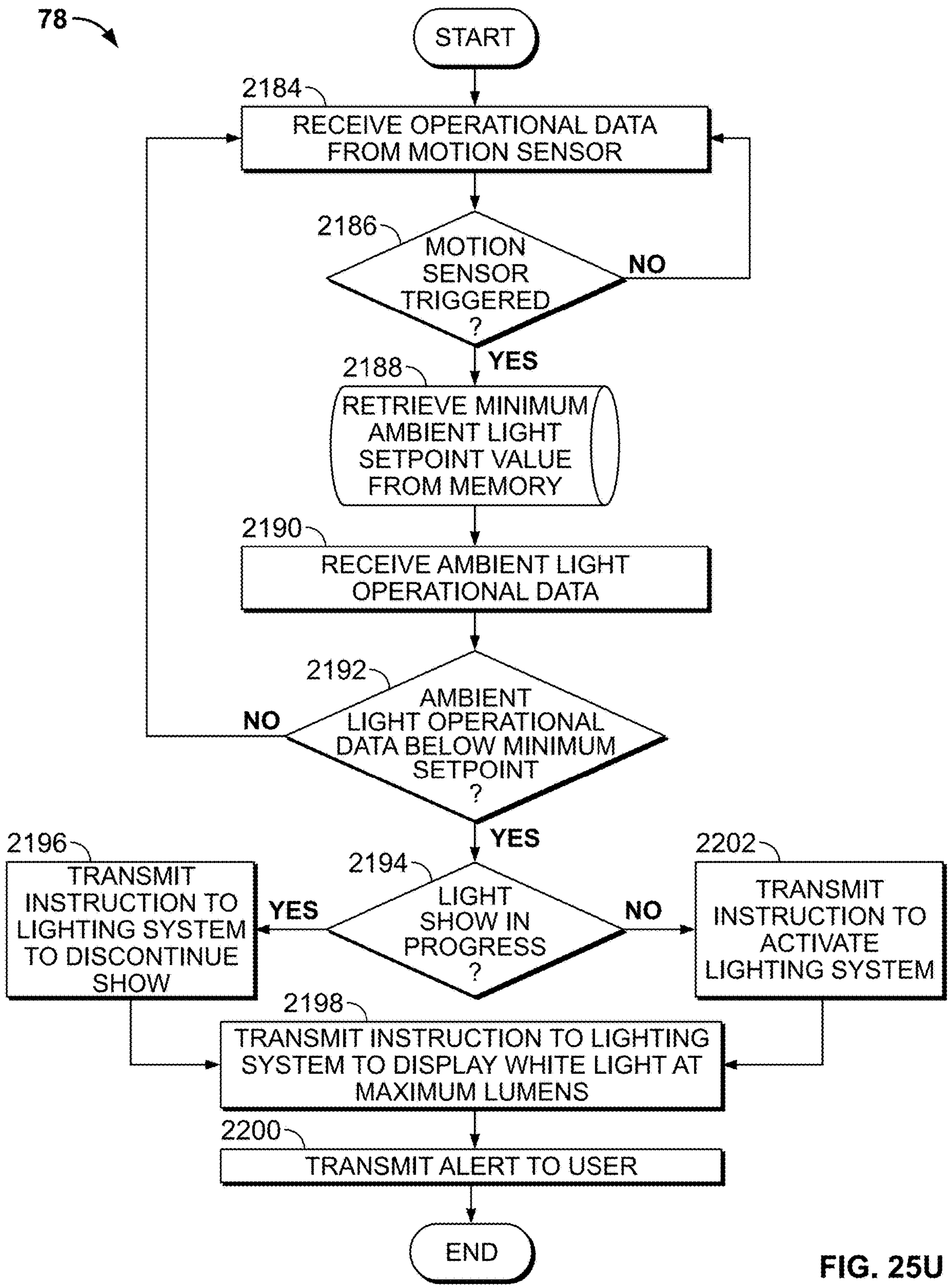

FIG. 25U is another flowchart illustrating processing logic of the lighting control logic 78 communicating with a lighting system. In step 2184, the lighting control logic 78 receives operational data from a motion sensor. In step 2186, the lighting control logic 78 determines if the motion sensor has been triggered. If a negative determination is made, then the process returns to step 2184. If a positive determination is made, then the process proceeds to step 2188 where the lighting control logic 78 retrieves a minimum ambient light setpoint value from memory. In step 2190, the lighting control logic 78 receives ambient light operational data. In step 2192, the lighting control logic 78 determines if the ambient light operational data is below the minimum setpoint. If a negative determination is made, then the process returns to step 2184. If a positive determination is made, then the process proceeds to step 2194 where it determines if a light show is in progress. If a negative determination is made, then the process proceeds to step 2202. If a positive determination is made then the process proceeds to step 2196. In step 2196, the lighting control logic 78 transmits an instruction to the lighting system to discontinue showing the current show. As referenced above, if a negative determination is made in step 2194, then the process proceeds to step 2202. In step 2202, the lighting control logic 78 transmits an instruction to activate the lighting system. Step 2196 and 2202 both proceed to step 2198 where the lighting control logic 78 transmits an instruction to the lighting system to display white light at the maximum lumen value. In step 2200, the lighting control logic 78 transmits an alert to the user, and the process ends.

Figure 25V:
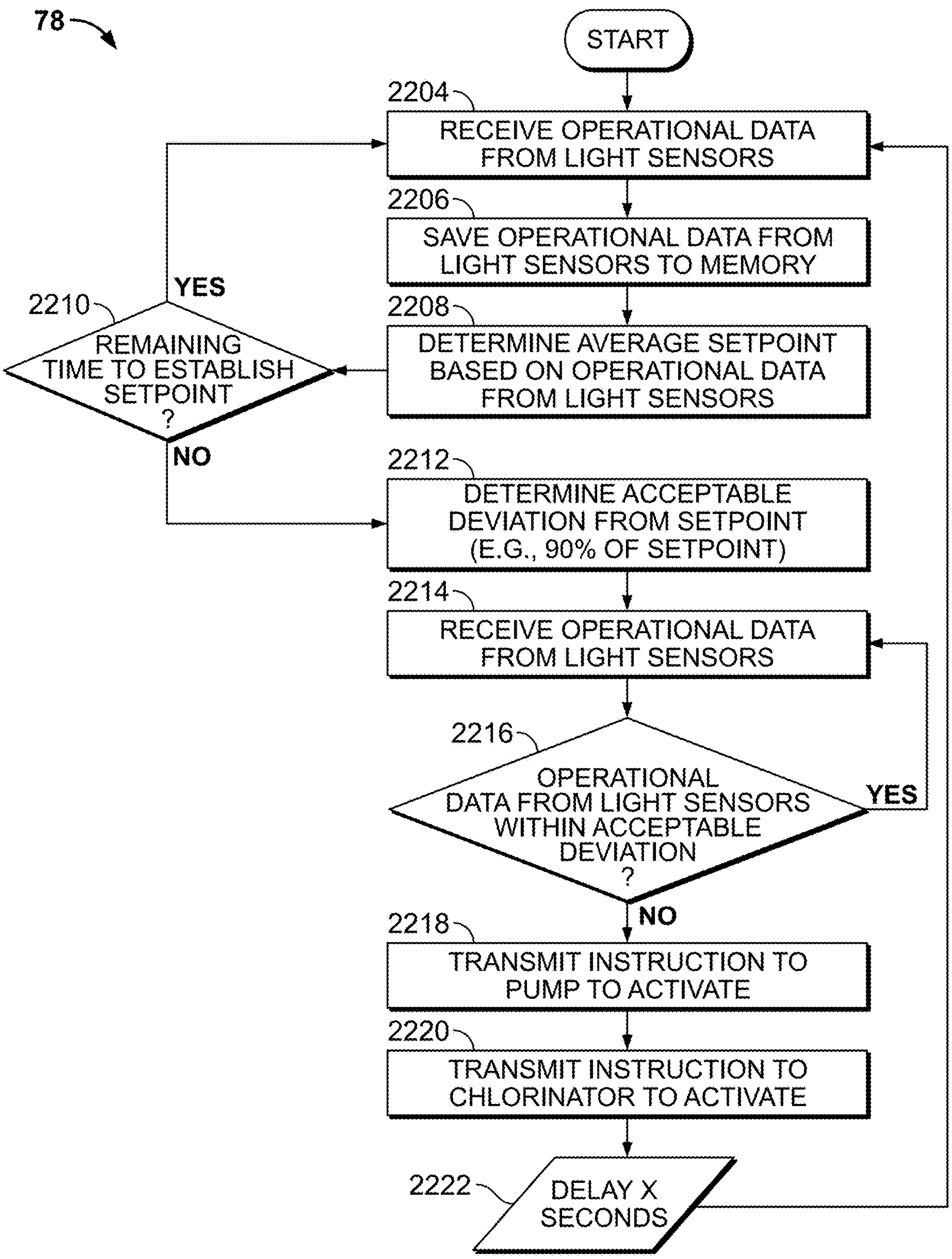

FIG. 25V is another flowchart illustrating processing logic of the lighting control logic 78 communicating with a lighting system. In step 2204, the lighting control logic 78 receives operational data from light sensors. In step 2206, the lighting control logic 78 saves operational data from the light sensors to memory. In step 2208, the lighting control logic 78 determines the average setpoint based on operational data from the light sensors. In step 2210, the lighting control logic 78 determines if there is remaining time to establish the setpoint. If a positive determination is made, then the process returns to step 2204 and the setpoint continues to be established. If a negative determination is made, then the process proceeds to step 2212 where the lighting control logic 78 determines the acceptable deviation from the setpoint, e.g., 90% of the setpoint. In step 2214, the lighting control logic 78 receives operational data from the light sensors. In step 2216 the lighting control logic 78 determines if the operational data from the light sensors is within the acceptable deviation. If a positive determination is made, then the process returns to step 2214. If a negative determination is made, then the process proceeds to step 2218 where the lighting control logic 78 transmits an instruction to the pump to activate. In step 2220, the lighting control logic 78 transmits an instruction to the chlorinator to activate and then proceeds to step 2222 where it delays for a predetermined period of time before returning to step 2204.

Figure 25W:
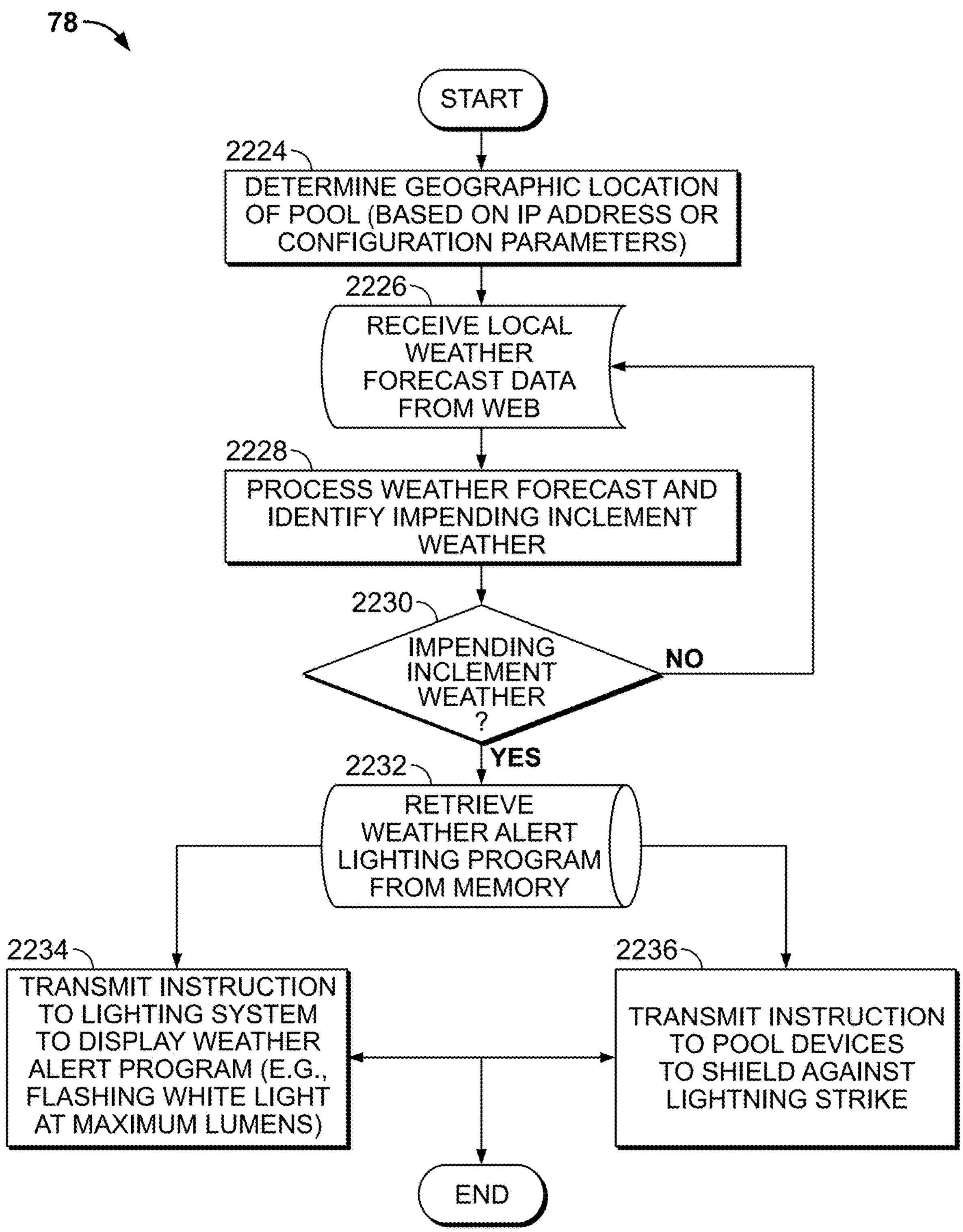

FIG. 25W is another flowchart illustrating processing logic of the lighting control logic 78 communicating with a lighting system. In step 2224, the lighting control logic 78 determines the geographic location of the pool, e.g., based on IP address or configuration parameters. In step 2226, the lighting control logic 78 receives local weather forecast data from the Internet/Web. In step 2228, the lighting control logic 78 processes the weather forecast and identifies impending inclement weather. In step 2230, the lighting control logic 78 determines if there is any impending inclement weather. If a negative determination is made, then the process returns to step 2226. If a positive determination is made, then the process proceeds to step 2232 where the lighting control logic 78 retrieves a weather alert lighting program from memory and then proceeds to steps 2234 and 2236. In step 2234, the lighting control logic 78 transmits an instruction to the lighting system to display the weather alert program, e.g., a flashing white light at maximum lumen output. In step 2236, the lighting control logic 78 transmits an instruction to the pool devices to shield against lightning strike.

Figure 25X:
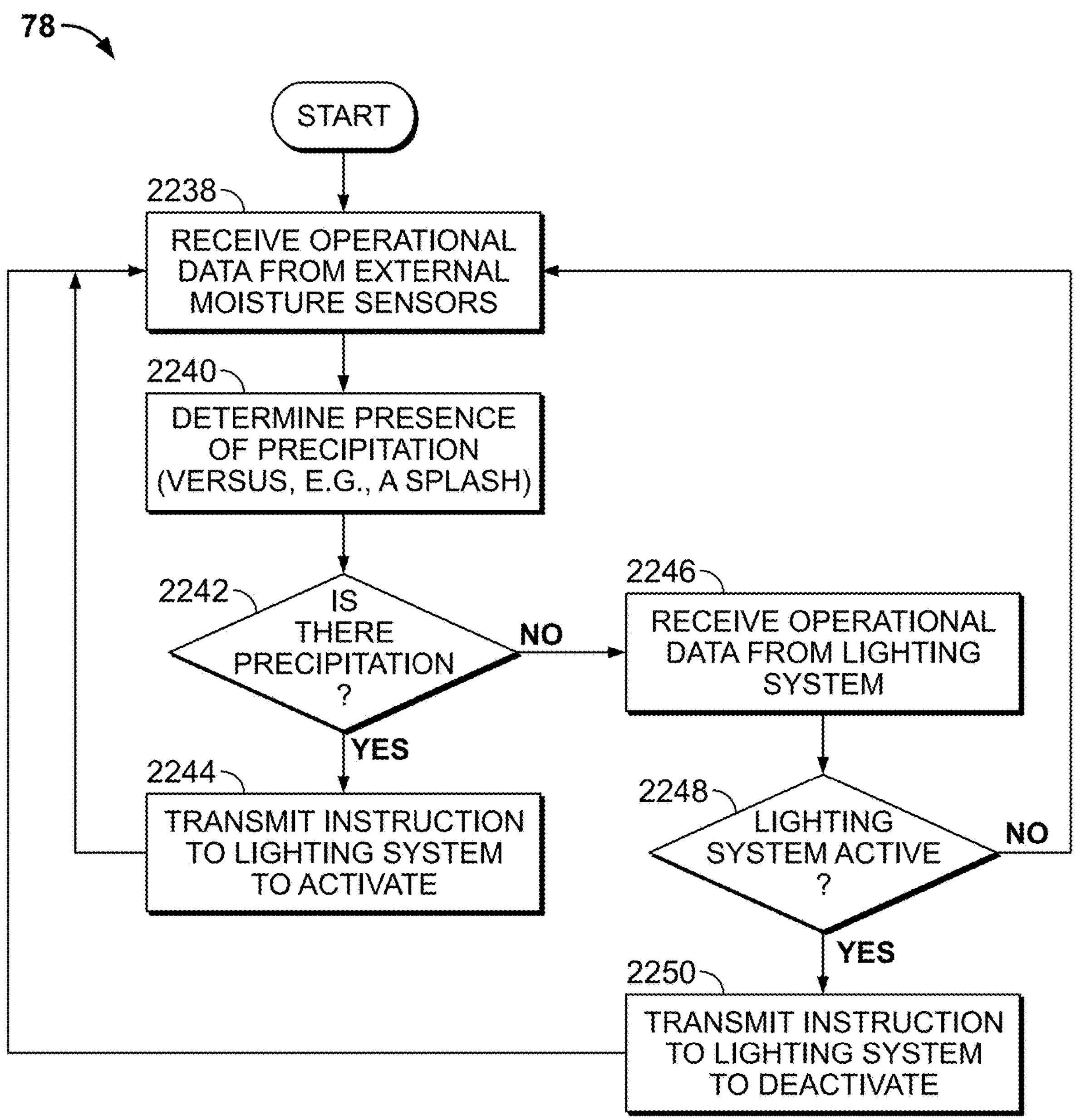

FIG. 25X is another flowchart illustrating processing logic of the lighting control logic 78 communicating with a lighting system. In step 2238, the lighting control logic 78 receives operational data from external moisture sensors. In step 2240, the lighting control logic 78 determines the presence of precipitation, e.g., versus a splash of water, for example. In step 2242, the lighting control logic 78 determines if there is precipitation. If a negative determination is made, then the process proceeds to step 2246. If a positive determination is made, then the process proceeds to step 2244 where the lighting control logic 78 transmits an instruction to the lighting system to activate, and then returns to step 2238. In step 2246, the lighting control logic 78 receives operational data from the lighting system. In step 2248, the lighting control logic 78 determines if the lighting system is active. If a negative determination is made, then the process returns to step 2238. If a positive determination is made, then the process proceeds to step 2250 where the lighting control logic 78 transmits an instruction to the lighting system to deactivate, and returns to step 2238.

Figure 25Y:
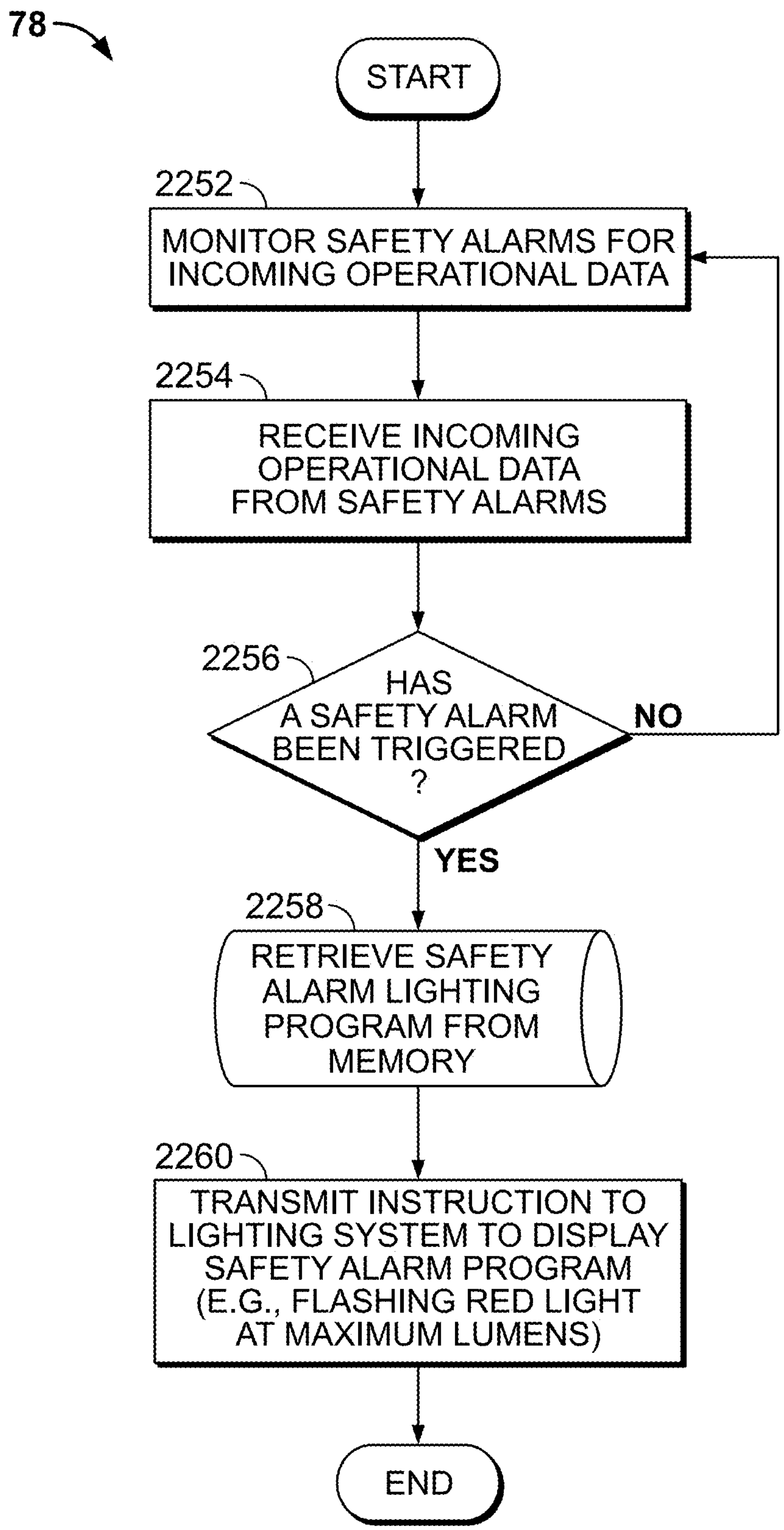

FIG. 25Y is another flowchart illustrating processing logic of the lighting control logic 78 communicating with a lighting system. In step 2252, the lighting control logic 78 monitors safety alarms for incoming operational data. In step 2254, the lighting control logic 78 receives incoming operational data from the safety alarms. In step 2256, the lighting control logic 78 determines if a safety alarm has been triggered. If a negative determination is made, then the process returns to step 2252. If a positive determination is made, then the process proceeds to step 2258 where the lighting control logic 78 receives parameters of the user-selected light show or color. In step 2116, the lighting control logic 78 retrieves a safety alarm lighting program from the memory. In step 2260, the lighting control logic 78 transmits an instruction to the lighting system to display the safety alarm program, e.g., a flashing red light at maximum lumen output, and the process ends.

Figure 25Z:
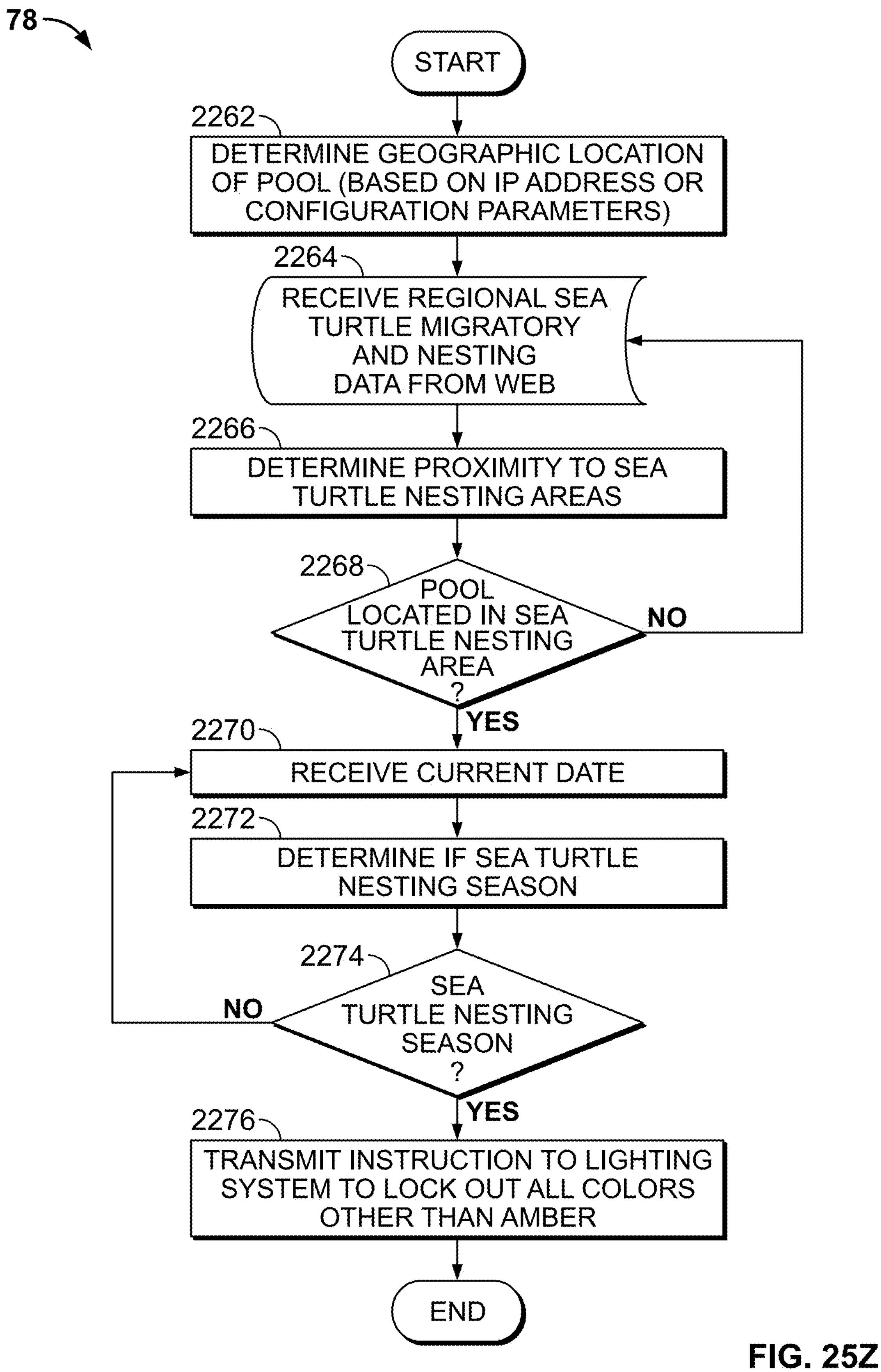
Figure 25A:
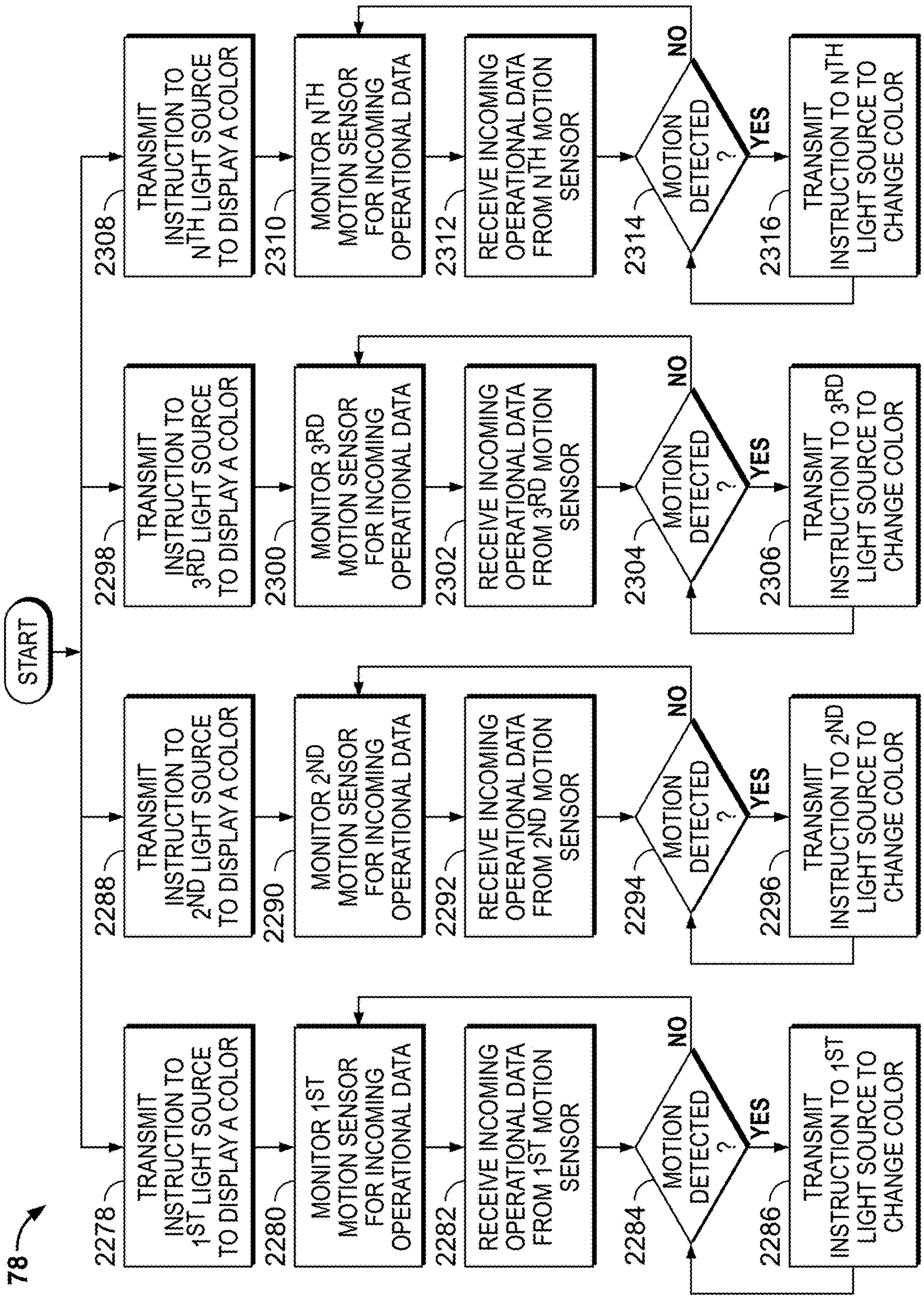
Figure 25A:
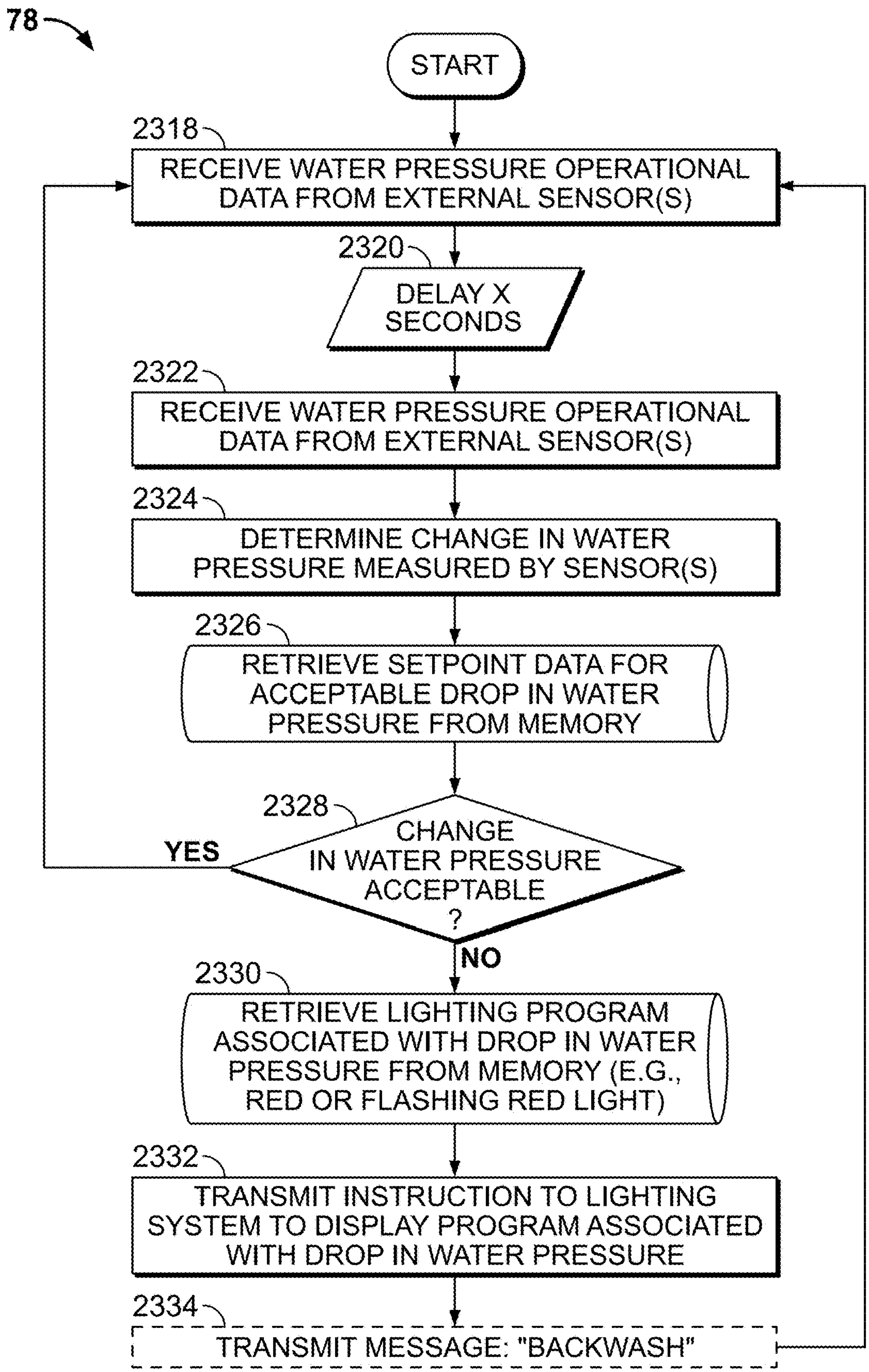

FIG. 25Z is another flowchart illustrating processing logic of the lighting control logic 78 communicating with a lighting system. In step 2262, the lighting control logic 78 determines the geographic location of the pool, e.g., based on IP address or configuration parameters. In step 2264, the lighting control logic 78 receives regional sea turtle migratory and nesting data from the Internet/Web. In step 2266, the lighting control logic 78 determines the proximity of the pool to sea turtle nesting areas. In step 2268, the lighting control logic 78 determines if the pool is located in a sea turtle nesting area. If a negative determination is made, then the process returns to step 2264. If a positive determination is made, then the process proceeds to step 2270 where the lighting control logic 78 receives the current data. In steps 2272 and 2274, the lighting control logic 78 determines if the current date is during the sea turtle nesting season. If a negative determination is made then the process returns to step 2270. If a positive determination is made, then the process proceeds to step 2276 where the lighting control logic 78 transmits an instruction to the lighting system to lock out all colors other than amber, and the process ends.

FIG. 25AA is a flowchart illustrating processing logic of the lighting control logic 78 for controlling multiple light sources. The lighting control logic 78 proceeds with four parallel routine sequences that respectively begin with steps 2278, 2288, 2298, 2308. Each routine sequence is discussed sequentially, though it should be understood that the routine loops could operate in parallel, or alternatively, in series with each other. The first sequence begins in step 2278 where the lighting control logic 78 transmits an instruction to a first light source to display a color. In step 2280, the lighting control logic 78 monitors a first motion sensor for incoming operational data. In step 2282, the lighting control logic 78 receives incoming operational data from the first motion sensor. In step 2284, the lighting control logic 78 determines if motion has been detected. If a negative determination is made then the process returns to step 2280. If a positive determination is made then the process proceeds to step 2286 where the lighting control logic 78 transmits an instruction to the first light source to change the color, and then returns to step 2284.

The second sequence begins in step 2288 where the lighting control logic 78 transmits an instruction to a second light source to display a color. In step 2290, the lighting control logic 78 monitors a second motion sensor for incoming operational data. In step 2292, the lighting control logic 78 receives incoming operational data from the second motion sensor. In step 2294, the lighting control logic 78 determines if motion has been detected. If a negative determination is made then the process returns to step 2290. If a positive determination is made then the process proceeds to step 2296 where the lighting control logic 78 transmits an instruction to the second light source to change the color, and then returns to step 2294.

The third sequence begins in step 2298 where the lighting control logic 78 transmits an instruction to a third light source to display a color. In step 2300, the lighting control logic 78 monitors a third motion sensor for incoming operational data. In step 2302, the lighting control logic 78 receives incoming operational data from the third motion sensor. In step 2304, the lighting control logic 78 determines if motion has been detected. If a negative determination is made then the process returns to step 2300. If a positive determination is made then the process proceeds to step 2306 where the lighting control logic 78 transmits an instruction to the third light source to change the color, and then returns to step 2304.

The $n^{th}$ sequence begins in step 2308 where the lighting control logic 78 transmits an instruction to an $n^{th}$ light source to display a color. In step 2310, the lighting control logic 78 monitors an $n^{th}$ motion sensor for incoming operational data. In step 2312, the lighting control logic 78 receives incoming operational data from the $n^{th}$ motion sensor. In step 2314, the lighting control logic 78 determines if motion has been detected. If a negative determination is made then the process returns to step 2310. If a positive determination is made then the process proceeds to step 2316 where the lighting control logic 78 transmits an instruction to the $n^{th}$ light source to change the color, and then returns to step 2314.

FIG. 25AB is another flowchart illustrating processing steps of the lighting control logic 78 communicating with the lighting system 14*h*. In step 2318, the lighting control logic 78 receives water pressure operational data from external sensor(s) at a first time. In step 2320, the lighting control logic 78 delays for x seconds, where "x" refers to any suitable integral value (e.g., 30, 60, 3600, 7200, etc.). In step 2322, the lighting control logic 78 receives water pressure operational data from external sensor(s) at a second time. In step 2324, the lighting control logic 78 determines the change (e.g., delta (A)) in water pressure. In step 2326, the lighting control logic 78 retrieves setpoint data for the acceptable drop, or increase, in water pressure from the memory. In step 2328, the lighting control logic 78 determines if the change in water pressure is acceptable (e.g., by comparing the actual change in water pressure to the acceptable change in water pressure). If a positive determination is made, then the process returns to step 2318. If a negative determination is made, then the process proceeds to step 2230 where the lighting control logic 78 retrieves a lighting program associated with a drop, or increase, in water pressure from the memory (e.g., red lights, red flashing lights, fast pulsing lights for pressure increase, slow pulsing lights for pressure decrease, etc.). In step 2332, the lighting control logic 78 transmits instructions the lighting system 14*h* to display the lighting program associated with the drop, or increase, in pressure. Optionally, in step 2334, the lighting control system 78 could also for example, transmit a "Backwash" message to the user/operator. The processing control logic 78 then returns to step 2318.

The lighting control logic 78 can also manage and/or control the brightness of a plurality of lights in response to noise or sound. An ambient noise or sound sensor can be used to detect a plurality of bathers ingress and egress from the swimming pool and even the bathers voices. For example, the ambient noise sensor can detect voice commands and/or noise levels and control the lights based such voice commands and noise levels. Furthermore, the lighting control logic 78 can modulate the plurality of lights color, tempo, etc. if the control logic senses music, games, voices, etc. Further, the noise sensor could also sense for games being played by bathers, for example, "Marco Polo," and adjust output of the lights accordingly.

The lighting control logic 78 can also receive input from a pressure sensor for effectively determining depth of the water above the sensor. This sensor can be located in a light or any other suitable location in a pool or spa environment. The lighting control logic 78 can trigger an automatic water fill routine or draining routine to adjust the water level based on any set level in the system.

Figure 26:
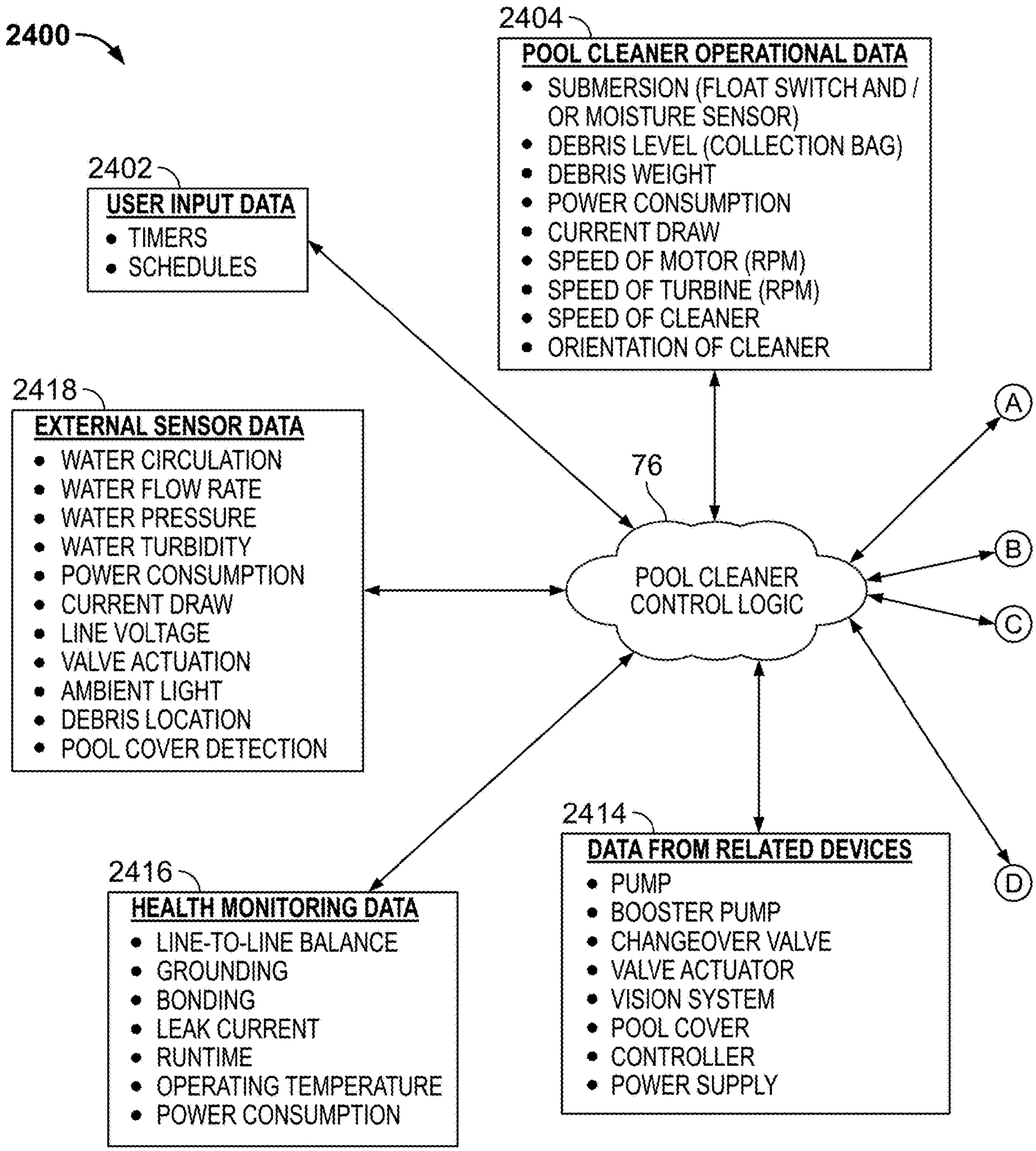
FIG. 26 is a diagram illustrating the pool cleaner control logic of FIG. 3.
Figure 26:
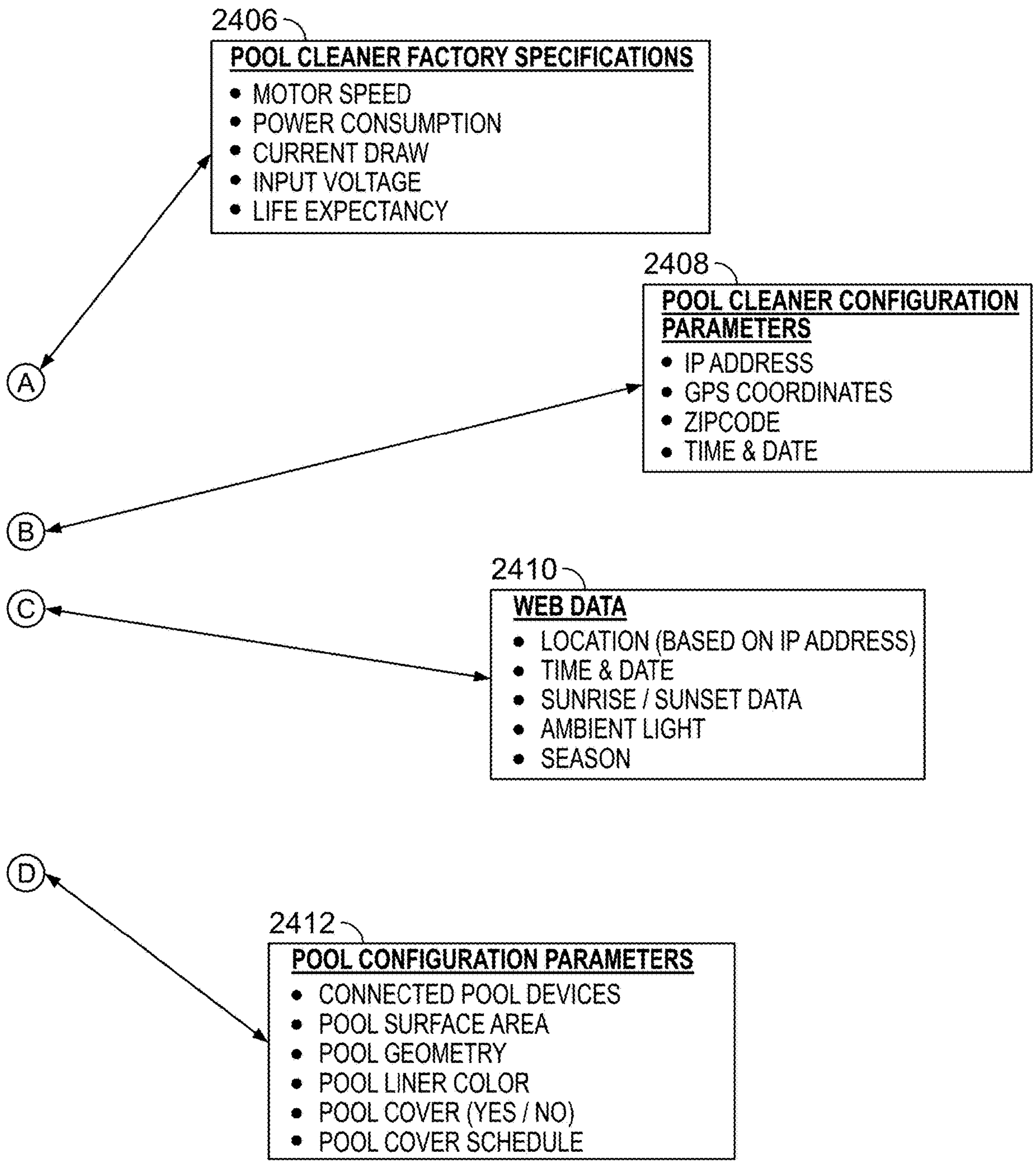

FIG. 26 is a diagram 2400 illustrating pool cleaner control logic 76. Pool cleaner control logic 76 could incorporate a variety of types of data and/or data sources. More specifically, pool cleaner control logic 76 could incorporate user input data 2402, pool cleaner operational data 2404, pool cleaner factory specifications 2406, pool cleaner configuration parameters 2408, web data 2410, pool configuration parameters 2412, data from related devices 2414, health monitoring data 2416, and/or external sensor data 2418. While it may be desirable for external sensors to monitor/provide data on as many system parameters as possible (thereby providing greater optimization, automation, and user/operator comfort), it is contemplated that some systems need not utilize an external sensor to monitor every system parameter. For example, if a pool cover detection sensor has not been installed in a particular system, the user/operator can provide this information by first determining if the pool cover has been deployed (e.g., by visual inspection) and then entering the pool cover deployment status into the system via a user interface.

User input data 2402 could include timers, schedules (e.g., on/off and what speed), cleaning patterns (e.g., orientation of cleaner), etc. Pool cleaner operational data 2404 could include submersion (e.g., float switch and/or moisture sensor), debris level (e.g., collection bag), debris weight, power consumption, current draw, speed of motor (RPM), speed of turbine (RPM), speed of cleaner, orientation of cleaner, etc. In one example, the pool cleaner control logic 76 could make a determination as to whether energy can be supplied to the cleaner via an integral turbine. Pool cleaner factor specifications 2406 could include motor speed, power consumption, current draw, input voltage, life expectancy, etc. Pool cleaner configuration parameters 2408 could include IP address, GPS coordinates, zipcode, time and date, etc. Web data 2410 could include location (e.g., based on IP address), time and date, sunrise/sunset data, ambient light, season, etc. Pool configuration parameters 2412 could include connected pool devices, pool surface area, pool geometry, pool liner color, pool cover (e.g., yes or no), pool cover schedule, etc. Data from related devices 2414 could include the pump, booster pump, changeover valve, valve actuator, vision system, pool cover, controller, power supply, etc. Health monitoring data 2416 could include line-to-line balance, grounding, bonding, leak current, runtime, operating temperature, power consumption, etc. External sensor data 2418 could include water circulation, water flow rate, water pressure water turbidity, power consumption, current draw, line voltage, valve actuation, ambient light, debris location, pool cover detection, etc. Using this data, the pool cleaner control logic 76 could optimize the operation of the pool cleaner. Examples include, anti-kink/hose un-tangle, adjust performance based on internal sensors, cleaner and/or cleaner circuit pressure sensing, time of day sensing, and send cleaner to dirty/high debris area of the pool.

Figure 27A:
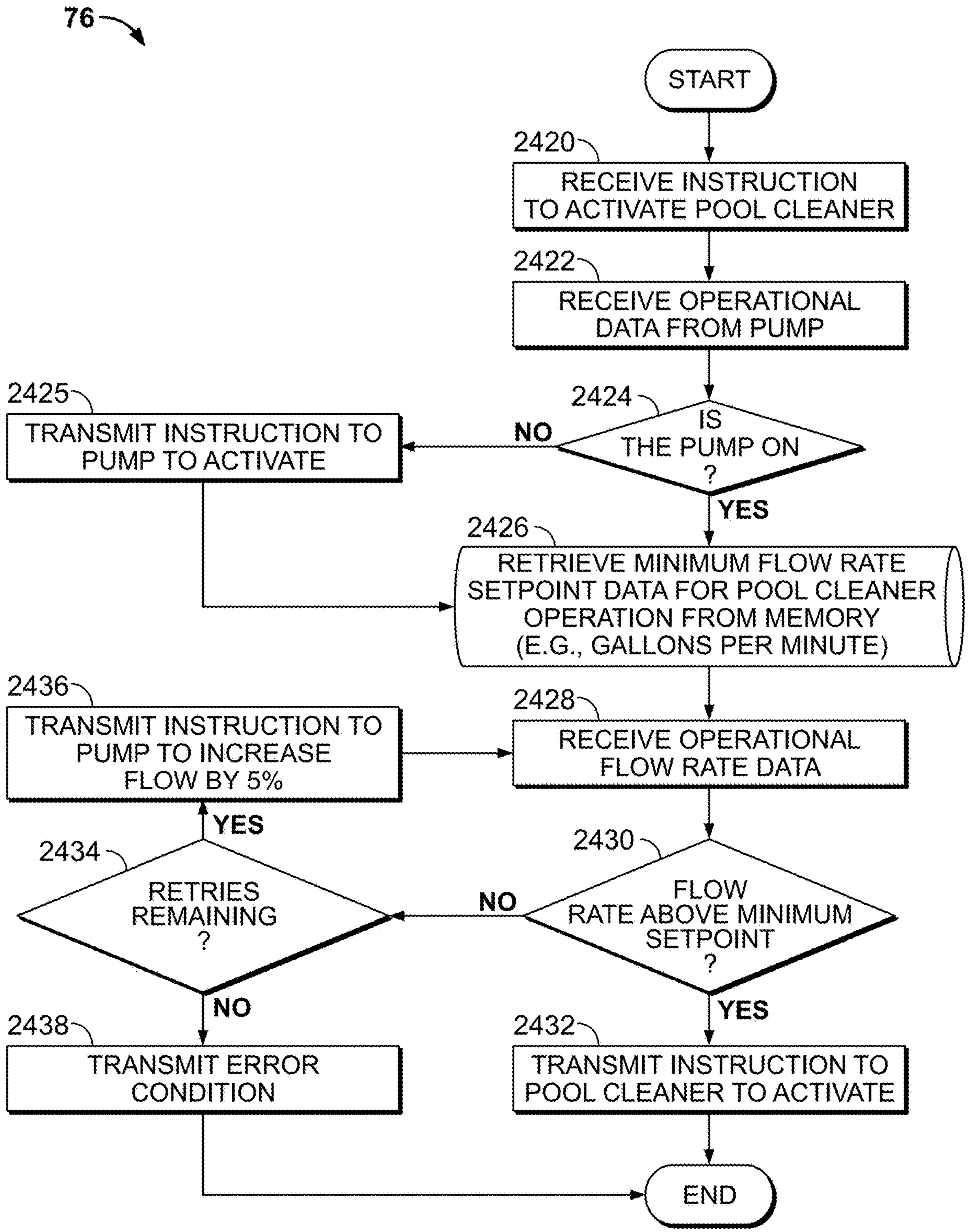
FIGS. 27A-27O are flowcharts illustrating processing steps of the pool cleaner control logic of FIG. 3.
Figure 27B:
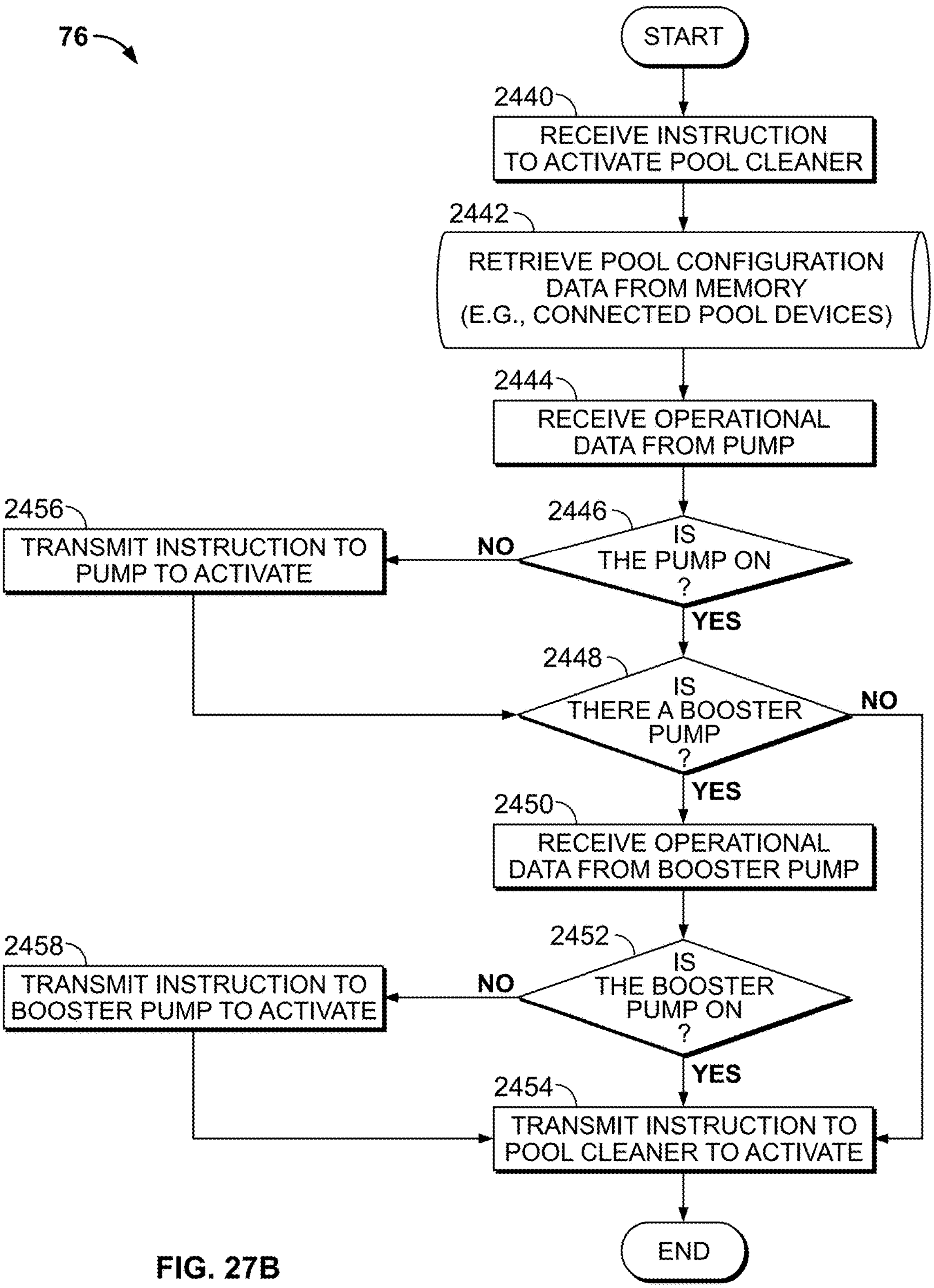
Figure 27C:
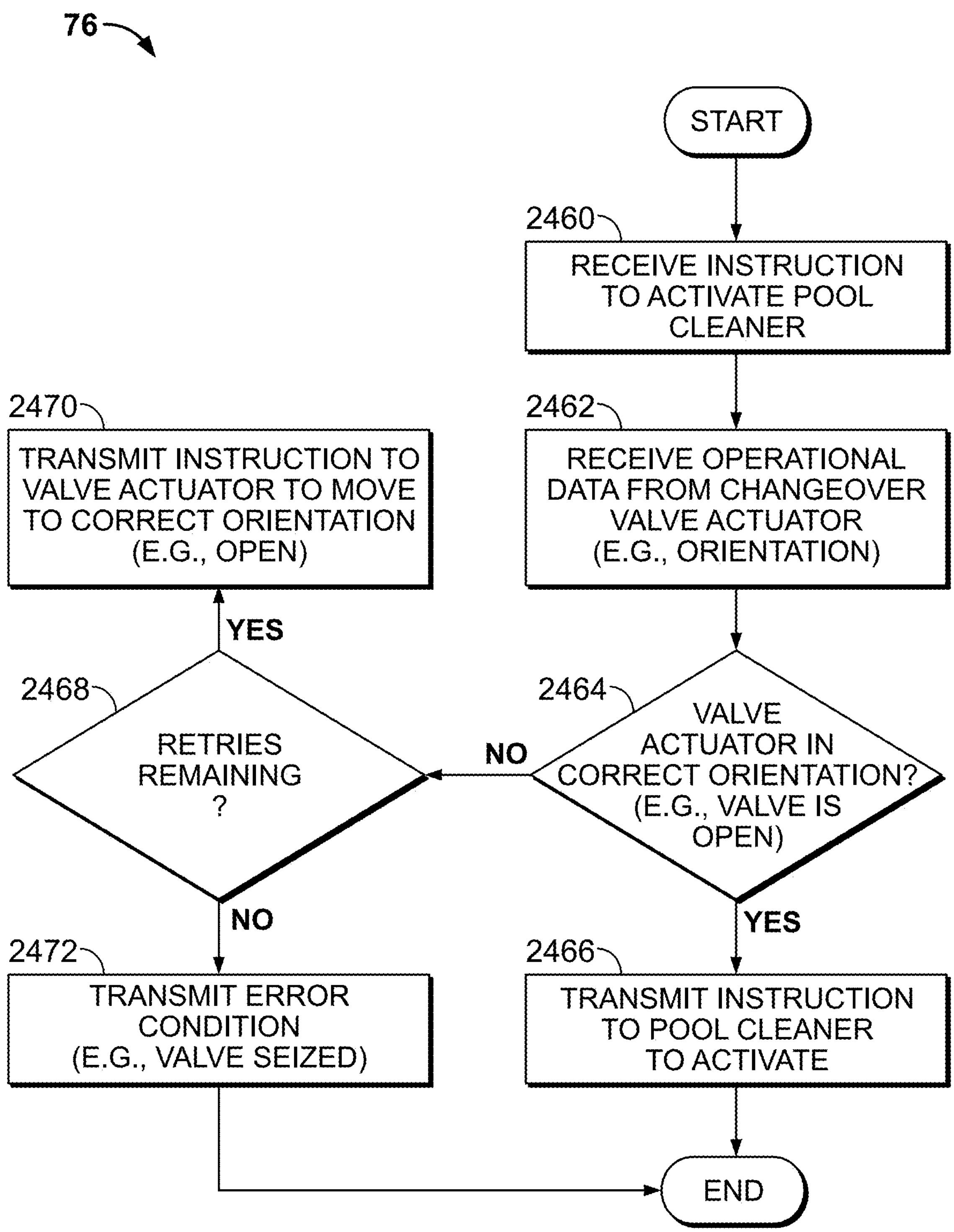
Figure 27D:
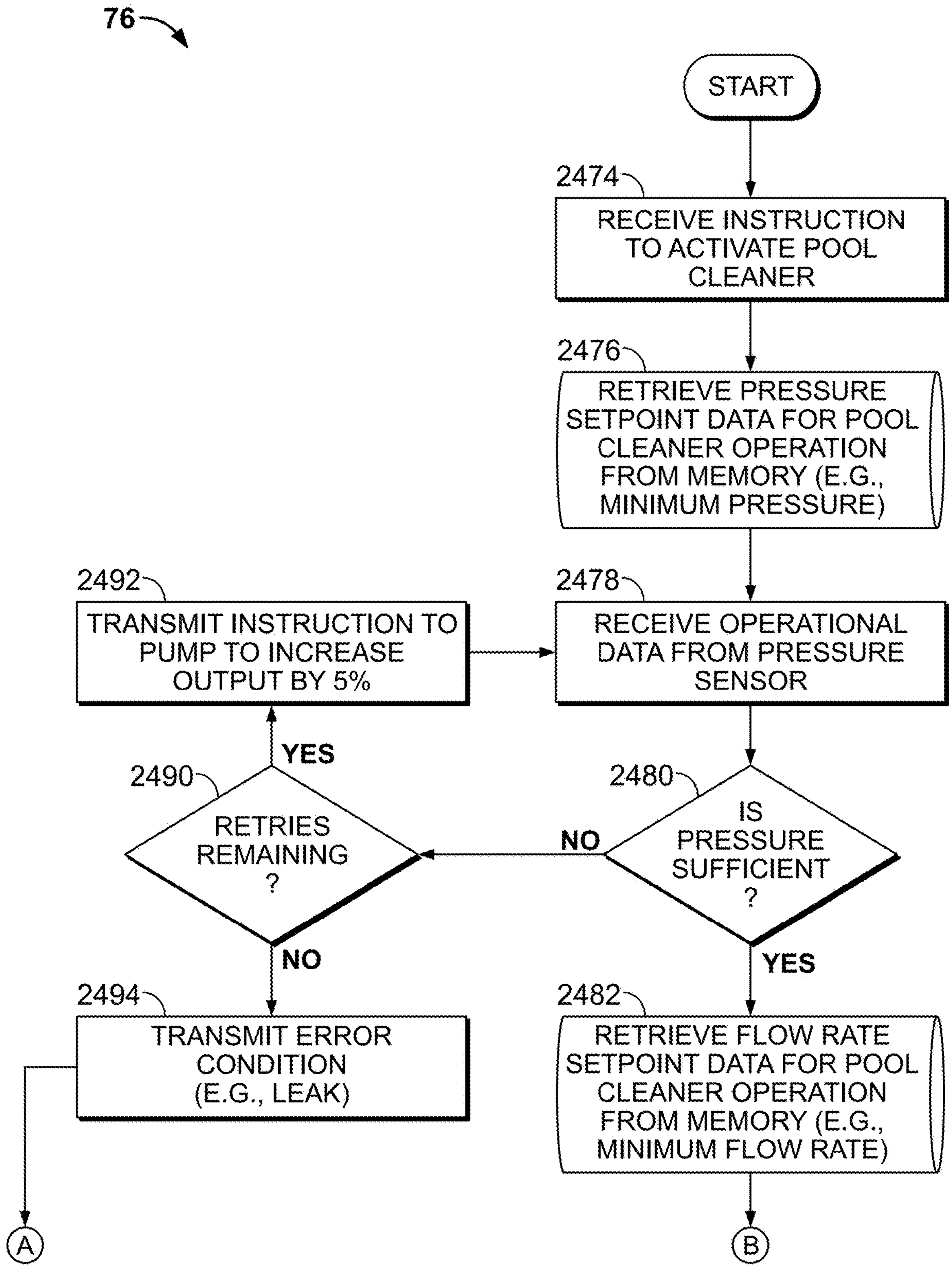
Figure 27D:
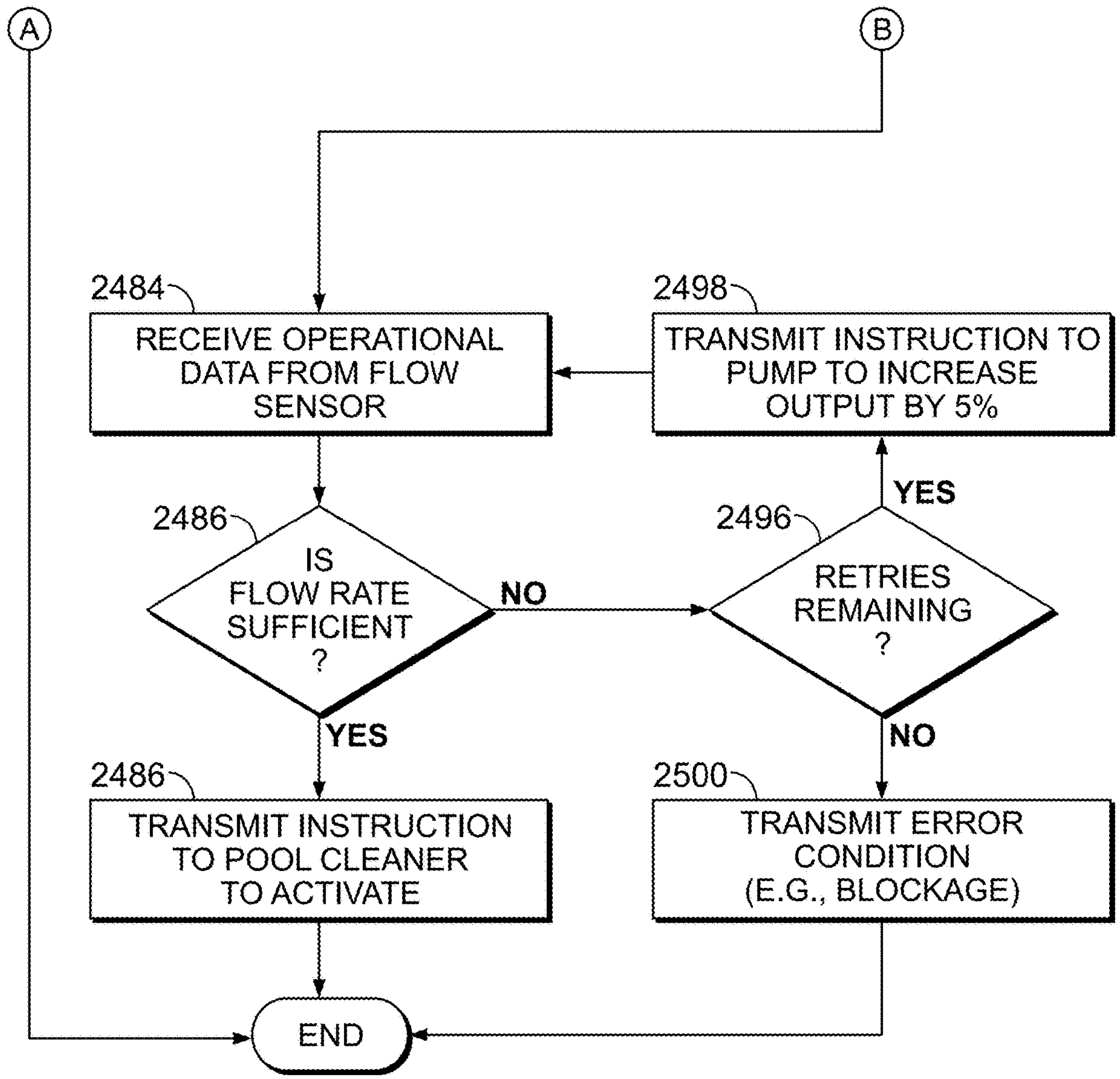
Figure 27E:
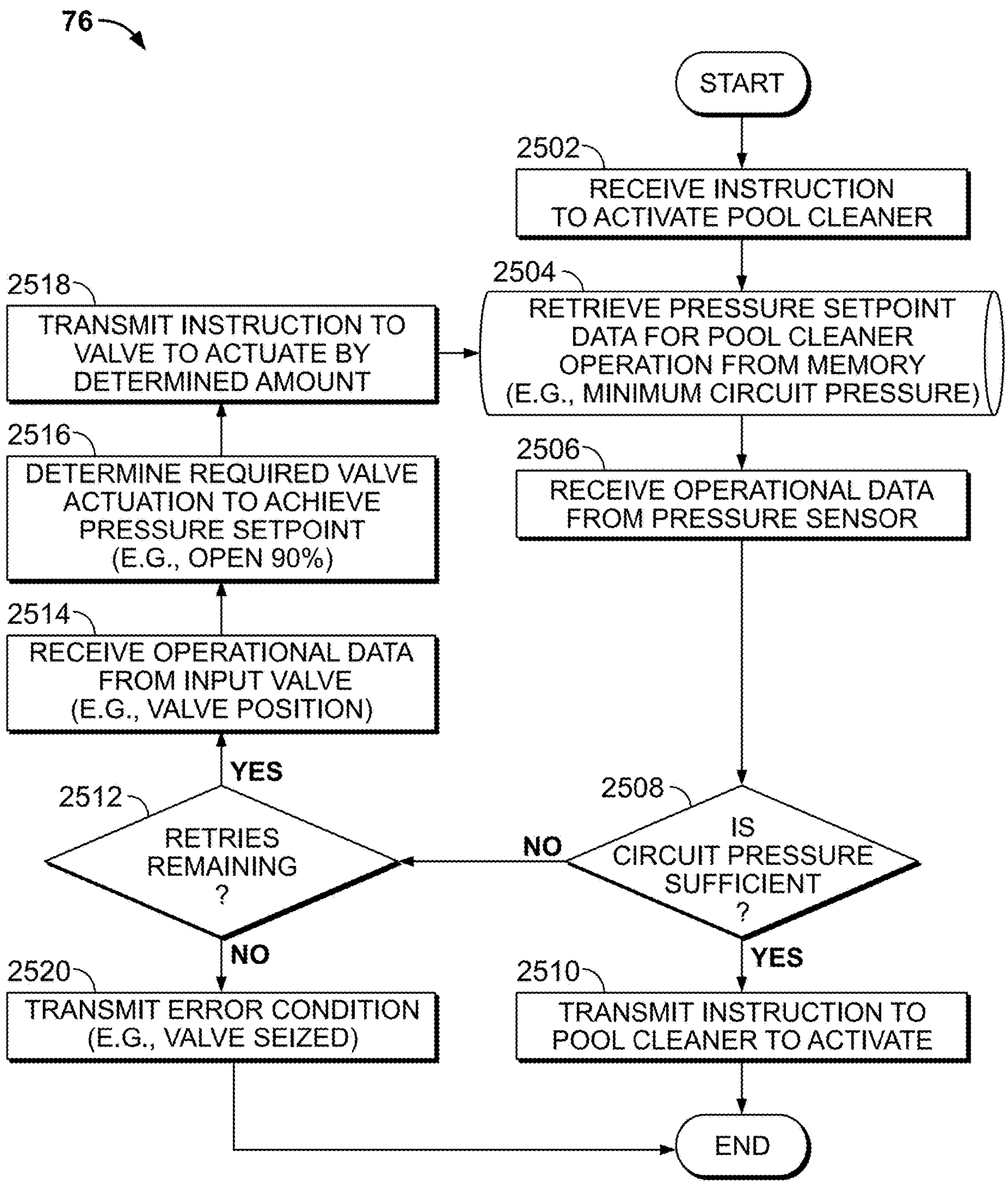
Figure 27F:
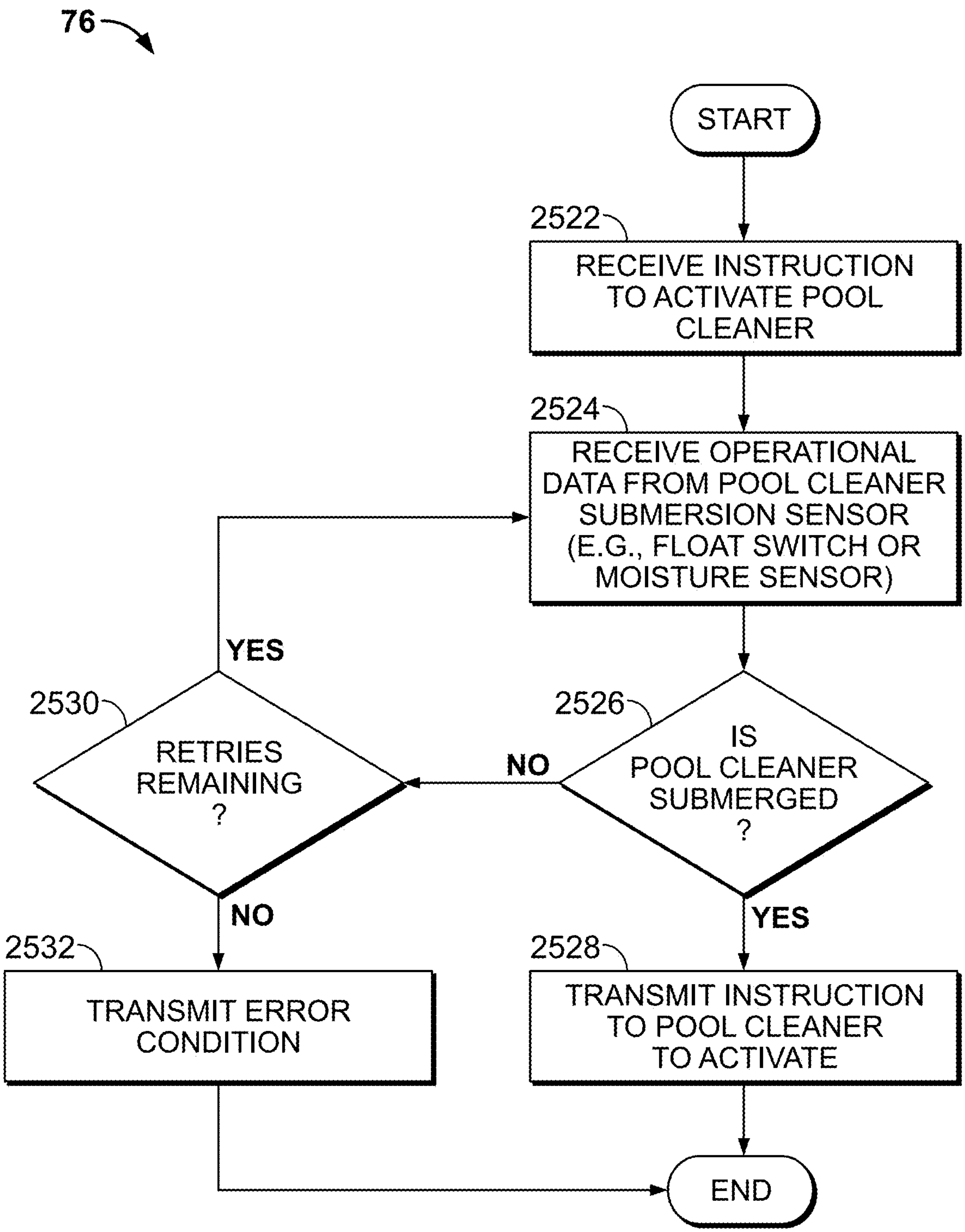
Figure 27G:
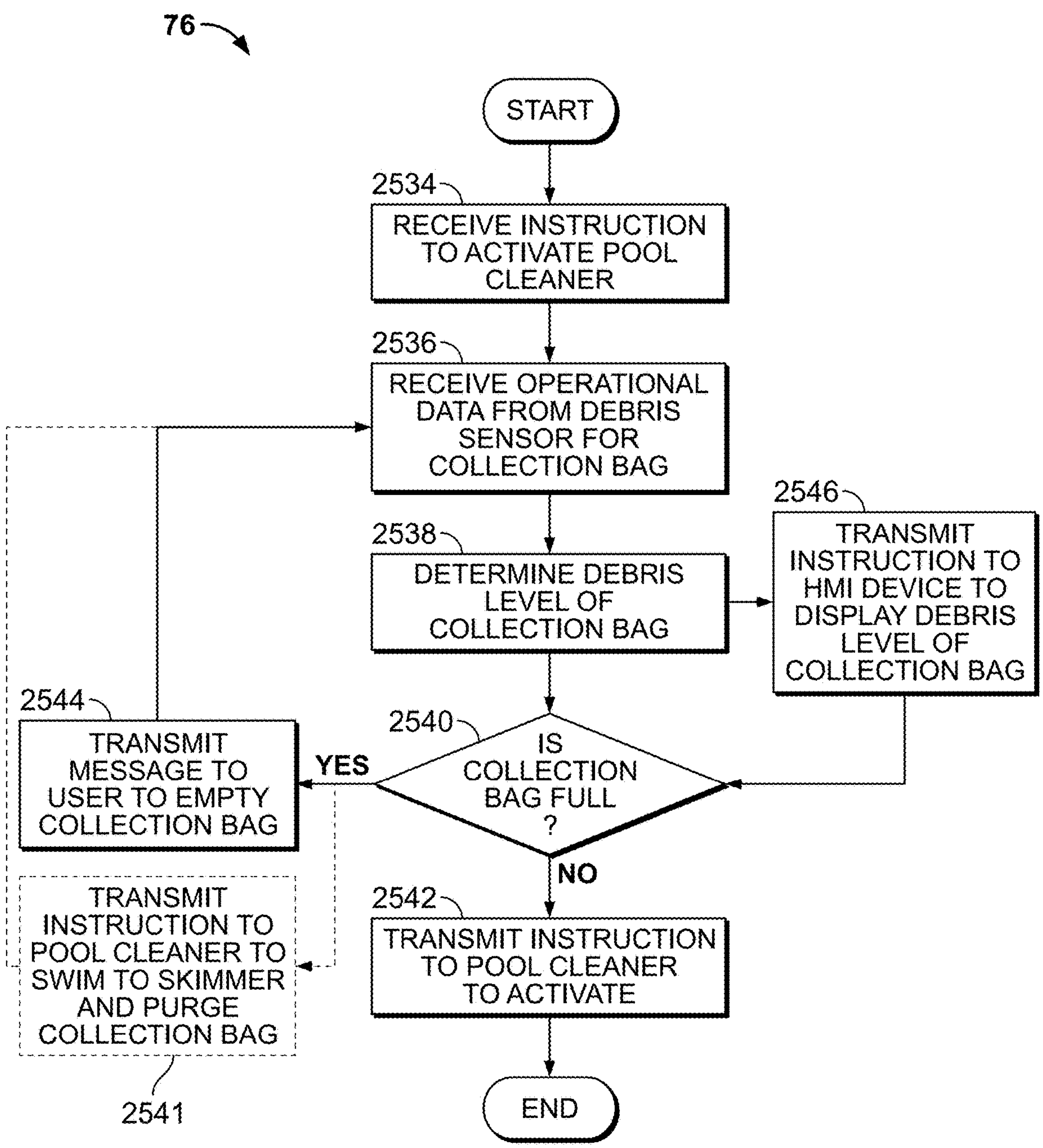
Figure 27H:
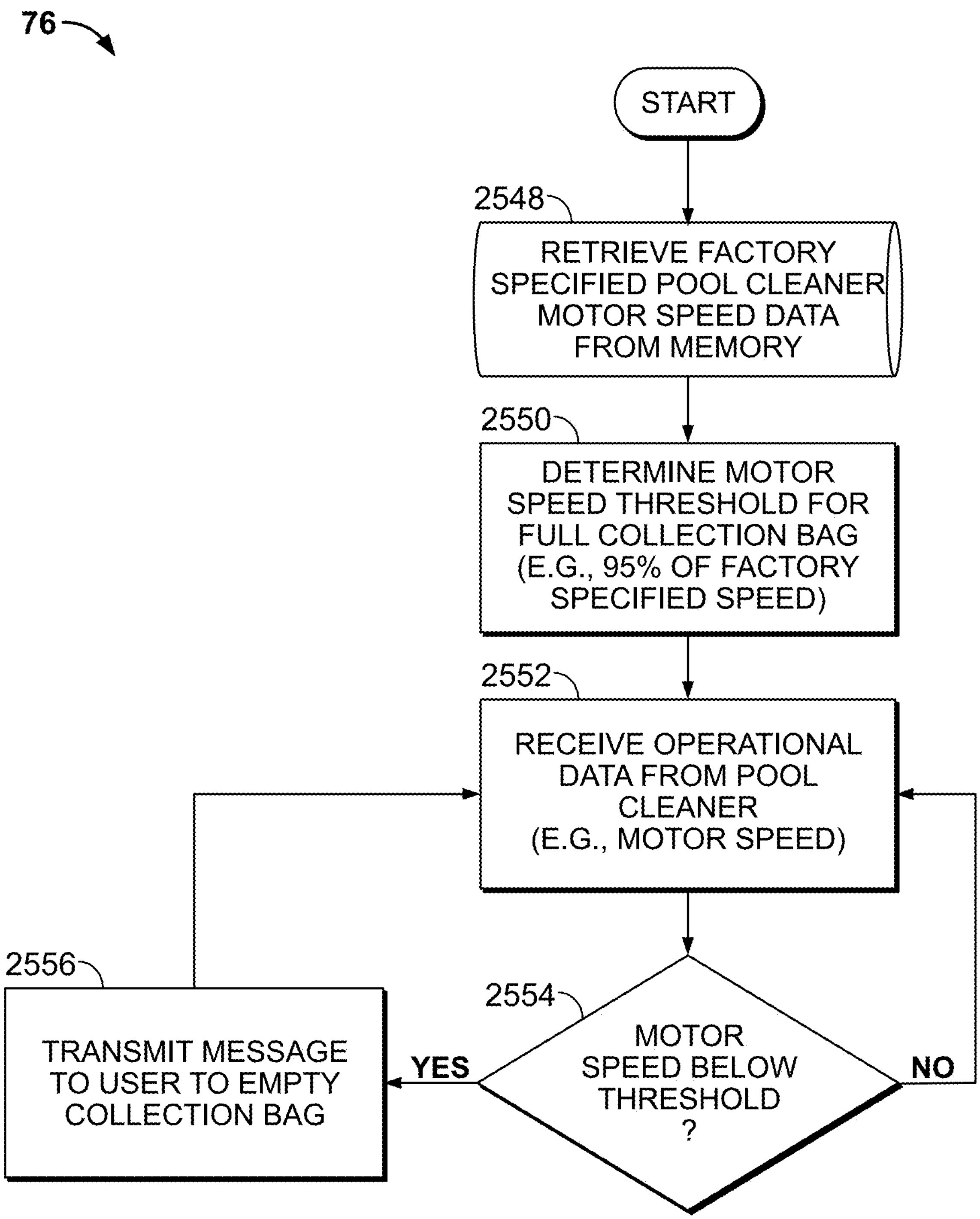
Figure 27I:
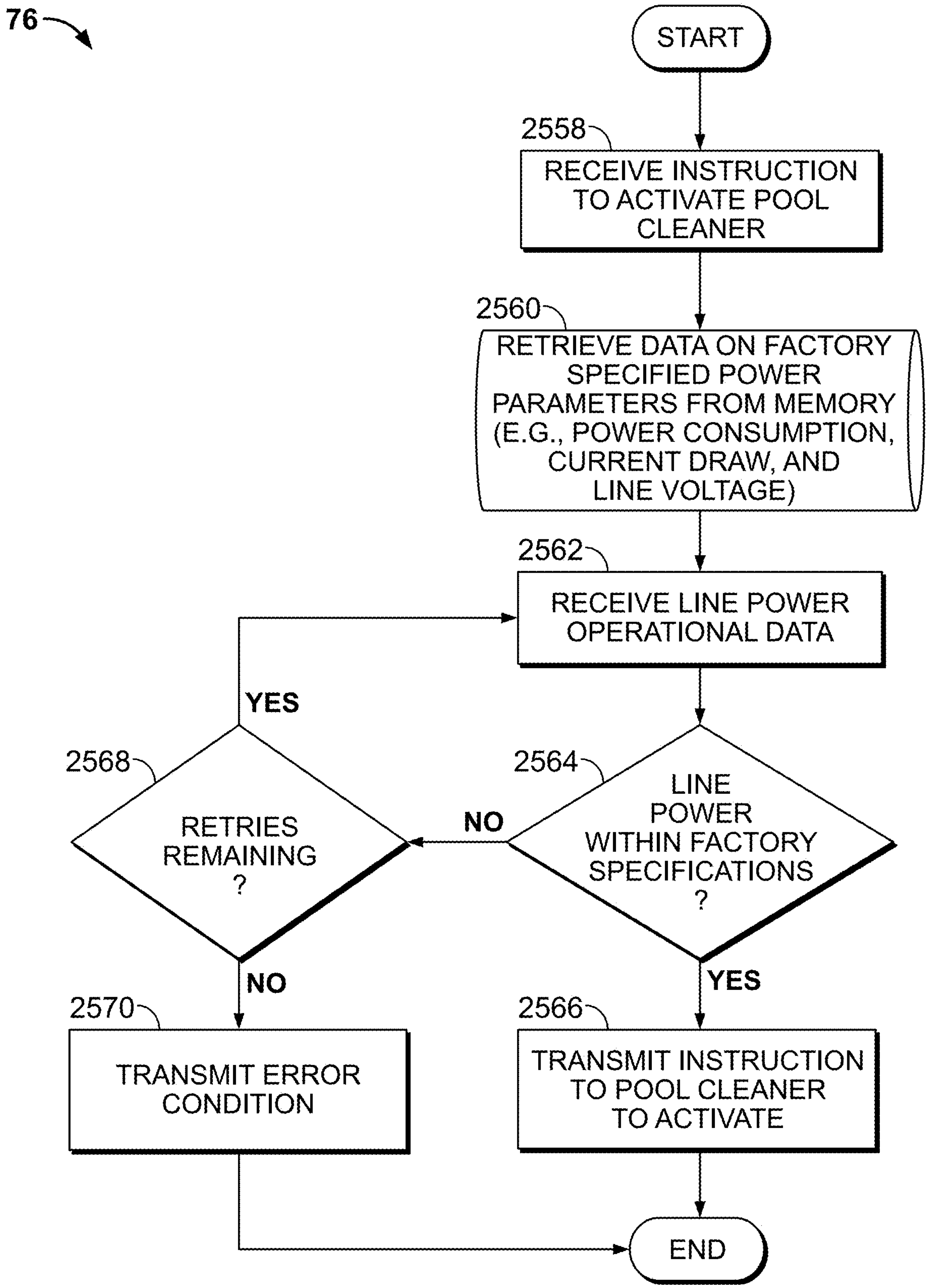
Figure 27J:
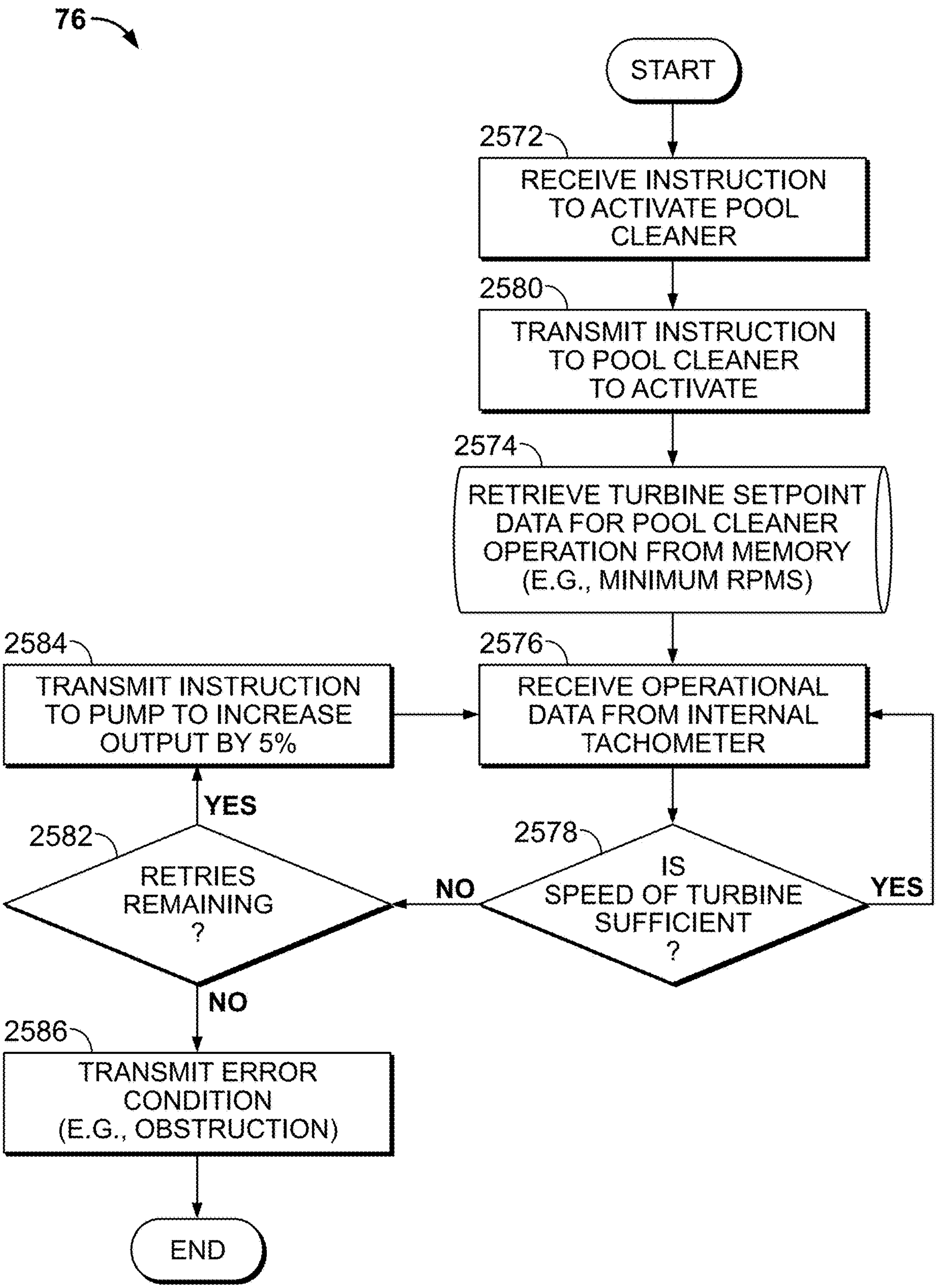
Figure 27K:
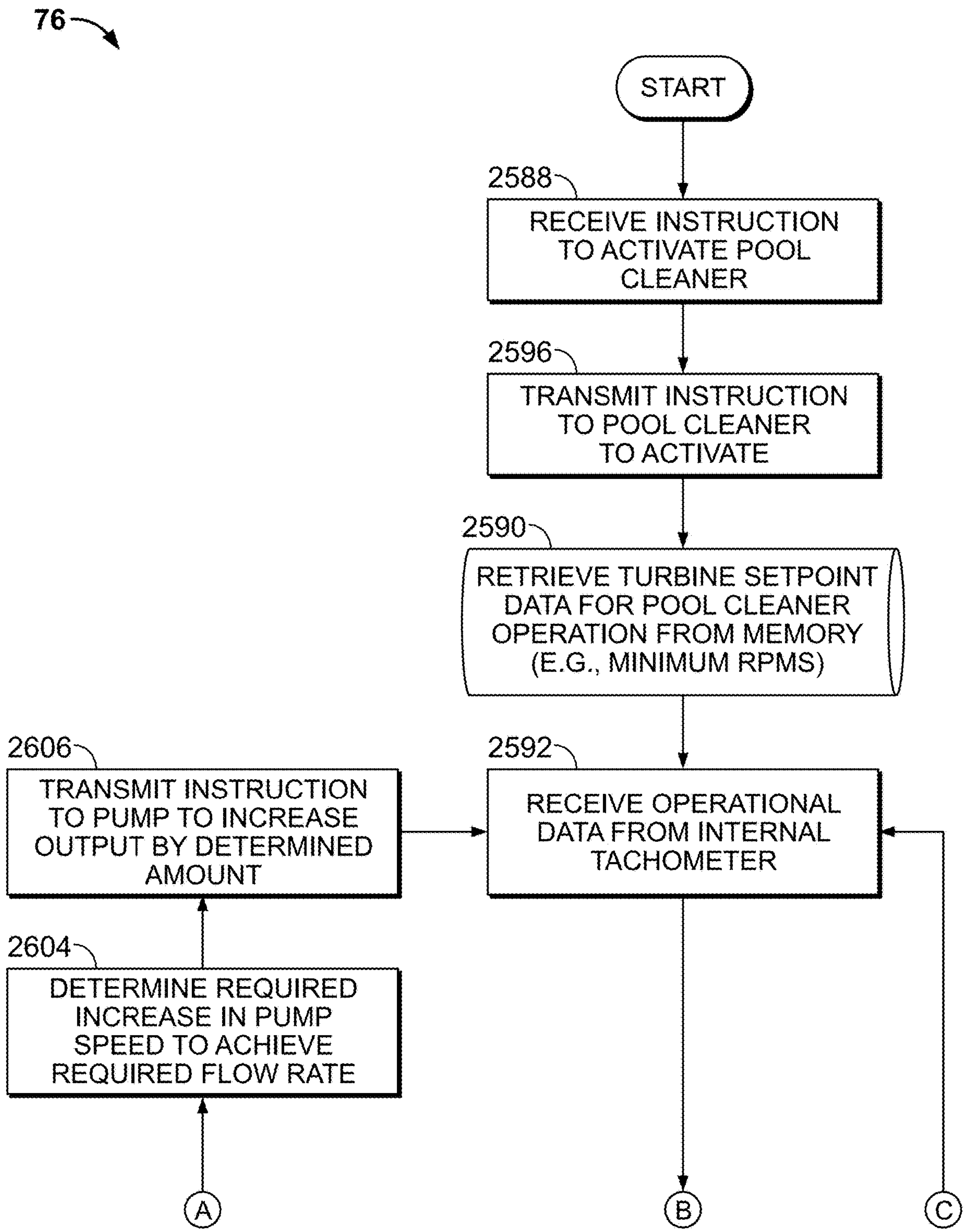
Figure 27K:
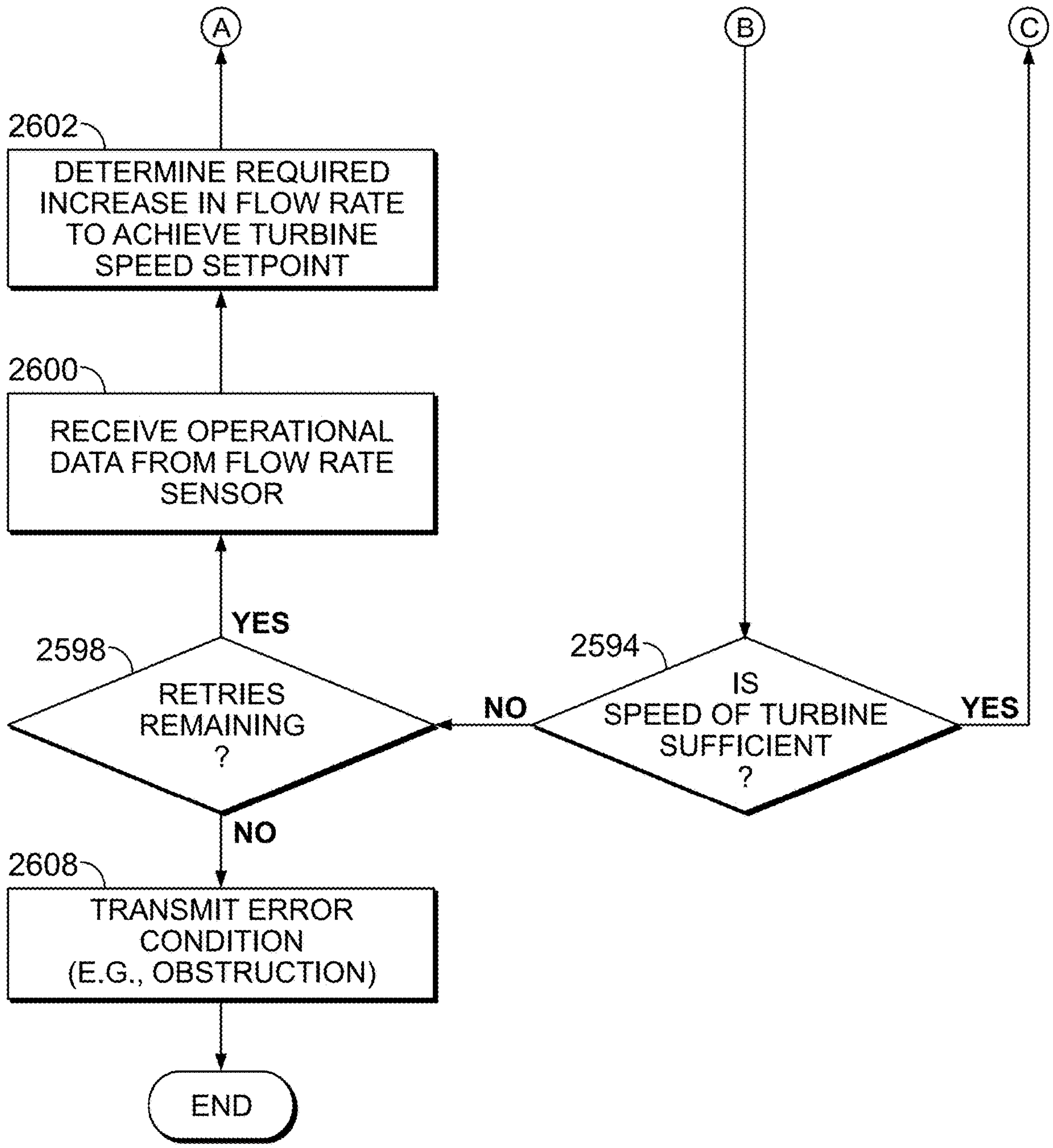
Figure 27L:
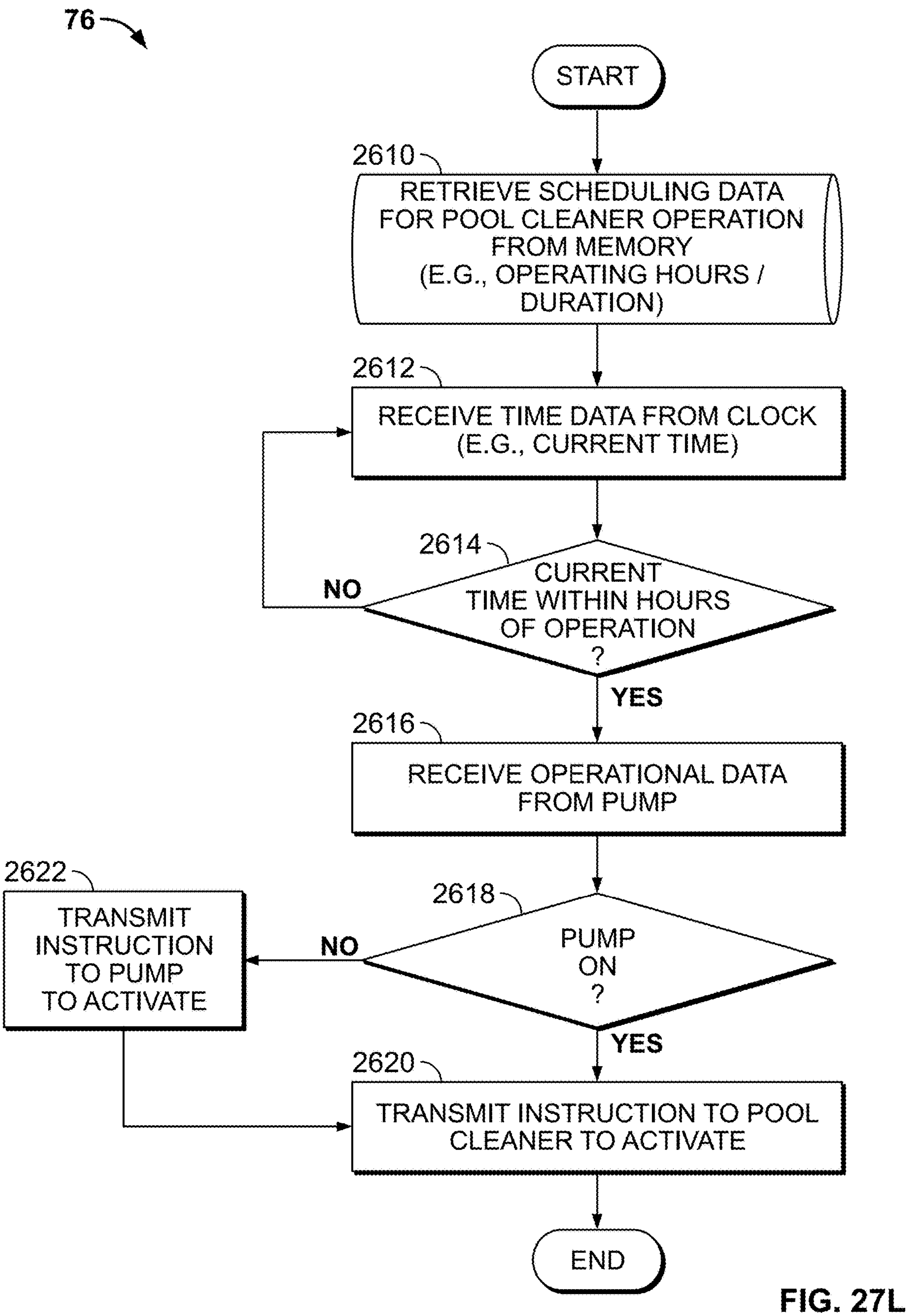
Figure 27M:
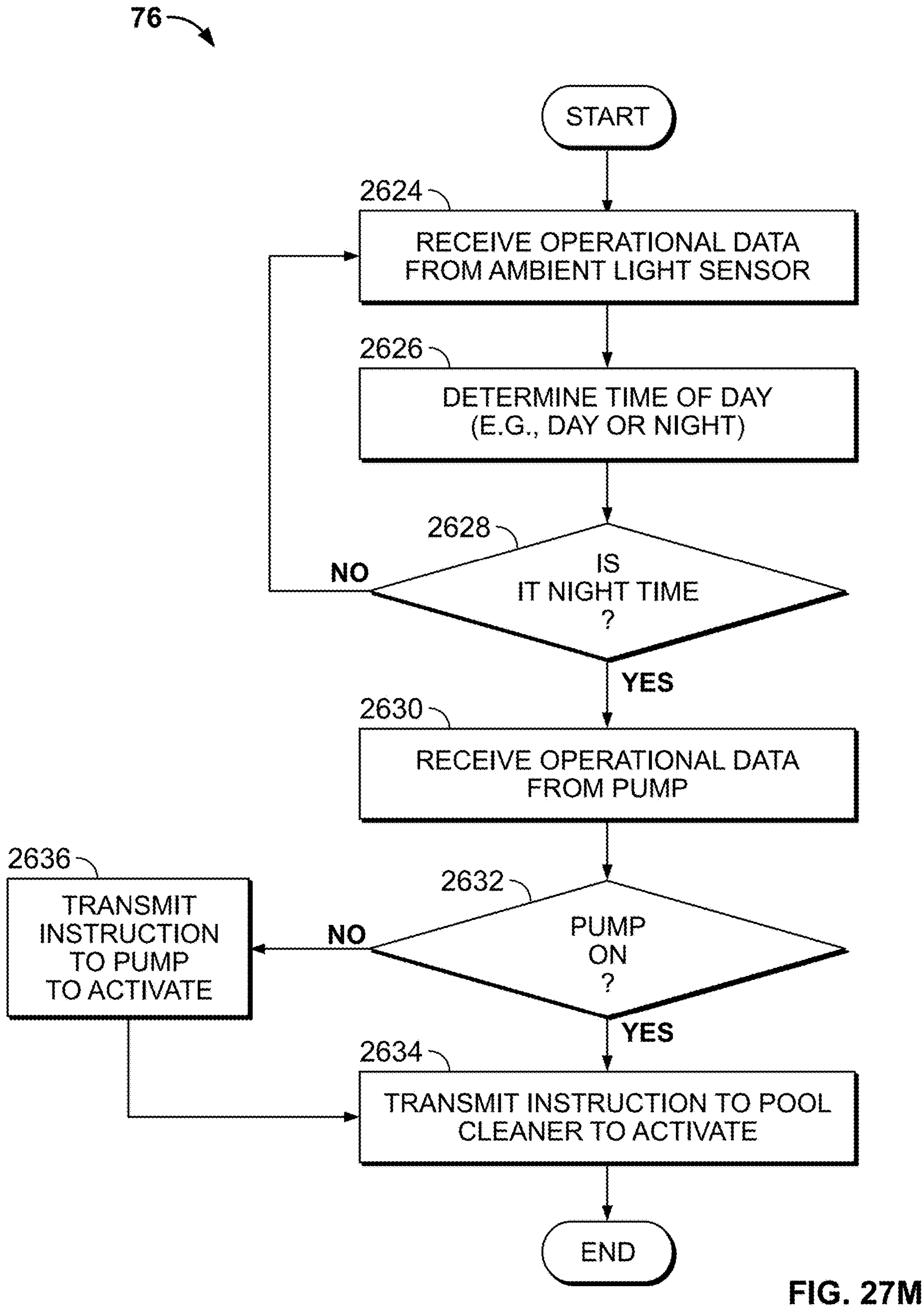
Figure 27N:
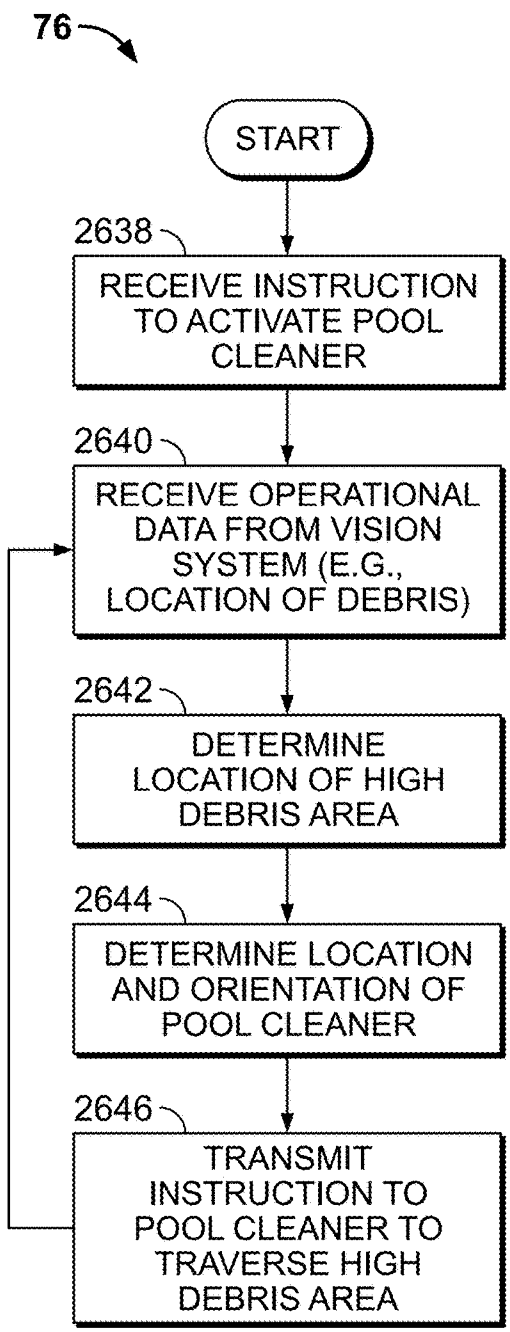
Figure 27O:
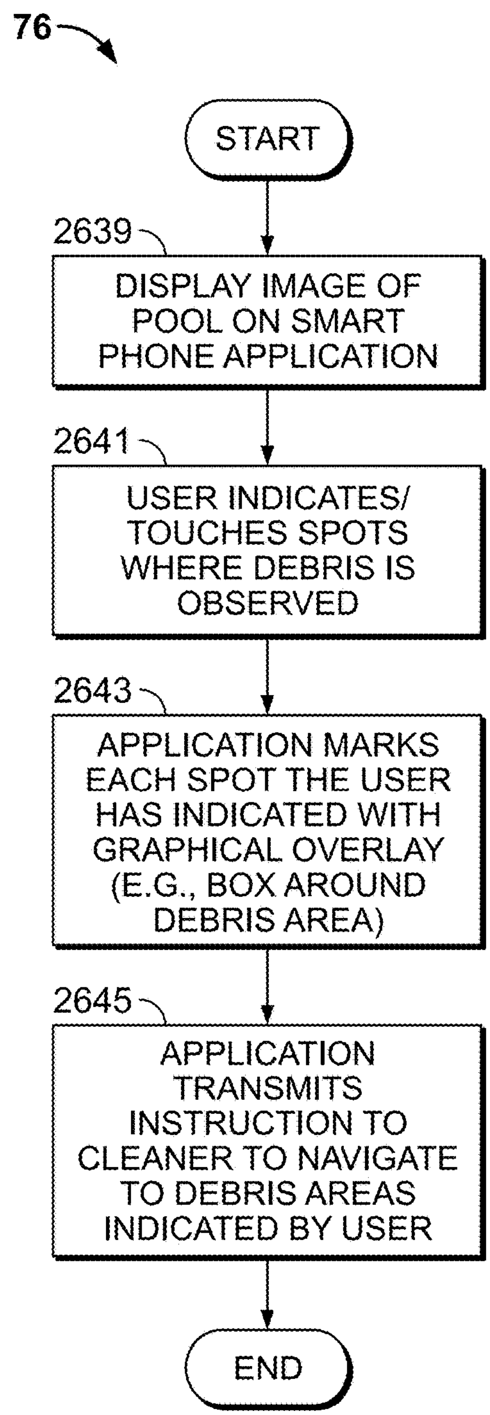

FIGS. 27A-27O are flowcharts illustrating processing steps of the pool cleaner control logic 76. FIG. 27A is a flowchart illustrating processing logic of the pool cleaner control logic 76 communicating with a pump. In step 2420, the pool cleaner control logic 76 receives instruction to activate a pool cleaner. In step 2422, the pool cleaner control logic 76 receives operation data from a pump. In step 2424, the pool cleaner control logic 76 determines whether the pump is on. If a positive determination is made, the process proceeds to step 2426. If a negative determination is made, then in step 2425 the pool cleaner control logic 76 transmits instructions to the pump to activate, and then proceeds to step 2426. In step 2426, the pool cleaner control logic 76 retrieves minimum flow rate setpoint data for the pool cleaner operation from a memory (e.g., gallons per minute. In step 2428, the pool cleaner control logic 76 receives operational flow rate data 2428. In step 2430, the pool cleaner control logic 76 determines whether the flow rate is above a minimum setpoint. If a positive determination is made, then the process proceeds to step 2432, where the pool cleaner control logic 76 transmits instructions to the pool cleaner to activate, and then the process ends. If a negative determination is made in step 2430, then the process proceeds to step 2434, where the pool cleaner control logic 76 determines whether there are retries remaining. If a positive determination is made, then in step 2436, the pool cleaner control logic 76 transmits instructions to the pump to increase the flow rate (e.g., by 5%), and the process reverts back to step 2428. If instead, a negative determination is made in step 2434, then in step 2438, the pool cleaner control logic 76 transmits an error condition, and the process ends.

FIG. 27B is a flowchart illustrating processing steps of the pool cleaner control logic 76 communicating with a booster pump. In step 2440, the pool cleaner control logic 76 receives instructions to activate the pool cleaner. In step 2442, the pool cleaner control logic 76 retrieves pool configuration data from memory (e.g., connected pool devices). In step 2444, the pool cleaner control logic 76 receives operational data from a pump. In step 2446, the pool cleaner control logic 76 determines whether the pump is on. If a positive determination is made, the process proceeds to step 2448. If a negative determination is made, in step 2456, the pool cleaner control logic 76 transmits instructions to the pump to activate, and the proceeds to step 2448. In step 2448, the pool cleaner control logic 76 determines whether there is a booster pump. If a positive determination is made, then in step 2450 the pool cleaner control logic 76 receives operational data from the booster pump. In step 2452, the pool cleaner control logic 76 determines whether the booster pump is on. If a positive determination is made in step 2452, then in step 2454, the pool cleaner control logic 76 transmits instructions to the pool cleaner to activate. If a negative determination is made in step 2452, then in step 2458 the pool cleaner control logic 76 transmits instructions to the booster pump to activate, and then proceeds to step 2454. If a negative determination is made in step 2448, then the process proceeds to step 2454 (as discussed above).

FIG. 27C is a flowchart illustrating processing steps of the pool cleaner control logic 76 communicating with a valve actuator. In step 2460, the pool cleaner control logic 76 receives instructions to activate a pool cleaner. In step 2462, the pool cleaner control logic 76 receives operational data from a changeover valve actuator (e.g., orientation). In step 2464, the pool cleaner control logic 76 determines whether the valve actuator is in the correct orientation (e.g., valve is open). If a positive determination is made, then the process proceeds to step 2466, where the pool cleaner control logic 76 transmits instructions to the pool cleaner to activate, and then the process ends. If a negative determination is made in step 2464, then the process proceeds to step 2468, where the pool cleaner control logic 76 determines whether there are retries remaining. If a positive determination is made, then in step 2470, the pool cleaner control logic 76 transmits instructions to the valve actuator to move to the correct orientation (e.g., open), and the process reverts to step 2462. If instead, a negative determination is made in step 2468, then in step 2472, the pool cleaner control logic 76 transmits an error condition (e.g., valve seized), and the process ends.

FIG. 27D is a flowchart illustrating processing steps of the pool cleaner control logic 76 communicating with a pressure sensor. In step 2474, the pool cleaner control logic 76 receives instructions to activate a pool cleaner. In step 2476, the pool cleaner control logic 76 retrieves pressure setpoint data for pool cleaner operation from memory (e.g., minimum pressure). In step 2478, the pool cleaner control logic 76 receives operational data from a pressure sensor. In step 2480, the pool cleaner control logic 76 determines whether the pressure is sufficient. If a negative determination is made in step 2480, then in step 2490, the pool cleaner control logic 76 determines whether there are any retries remaining. If a positive determination is made in step 2490, then in step 2492, the pool cleaner control logic 76 transmits instructions to the pump to increase output (e.g., by 5%), and the process reverts back to step 2478. If a negative determination is made in step 2490, then in step 2494, the pool cleaner control logic 76 transmits an error condition (e.g., leak), and the process ends. If a positive determination is made in step 2480, then in step 2482, the pool cleaner control logic 76 retrieves flow rate setpoint data for pool cleaner operation from a memory (e.g., minimum flow rate). In step 2484, the pool cleaner control logic 76 receives operational data from a flow sensor. In step 2486, the pool cleaner control logic 76 determines whether the flow rate is sufficient. If a positive determination is made in step 2486, then in step 2488, the pool cleaner control logic 76 transmits instructions to the pool cleaner to activate, and then the process ends. If a negative determination is made in step 2486, then in step 2496, the pool cleaner control logic 76 determines whether there are any retries remaining. If a positive determination is made, then in step 2498, the pool cleaner control logic 76 transmits instructions to the pump to increase output (e.g., by 5%), and the process reverts to step 2484. If instead, a negative determination is made in step 2496, then in step 2500, the pool cleaner control logic 76 transmits an error condition (e.g., blockage), and the process ends. It should be noted that the above process can apply to actuate valves to control the pool cleaner. The valve actuation algorithms are explained in greater detail below.

FIG. 27E is a flowchart illustrating processing steps of the pool cleaner control logic 76 communicating with a valve. In step 2502, the pool cleaner control logic 76 receives instructions to activate a pool cleaner. In step 2504, the pool cleaner control logic 76 retrieves pressure setpoint data for a pool cleaner operation from a memory (e.g., minimum circuit pressure). In step 2506, the pool cleaner control logic 76 receives operational data from a pressure sensor. In step 2508, the pool cleaner control logic 76 determines whether the circuit pressure is sufficient. If a positive determination is made, then in step 2510, the pool cleaner control logic 76 transmits instructions to the pool cleaner to activate, and the process ends. If a negative determination is made in step 2508, then in step 2512, the pool cleaner control logic 76 determines whether there are any retries remaining. If a positive determination is made, then in step 2514, the pool cleaner control logic 76 receives operational data from an input valve (e.g., valve position). In step 2516, the pool cleaner control logic 76 determines required valve actuation to achieve pressure setpoint (e.g., open 90%). In step 2518, the pool cleaner control logic 76 transmits instructions to the valve to actuate by a determined amount. If a negative determination is made in step 2512, then in step 2520, the pool cleaner control logic 76 transmits an error condition (e.g., valve seized), and the process ends.

FIG. 27F is a flowchart illustrating processing steps of the pool cleaner control logic 76 communicating with a pool cleaner submersion sensor. In step 2522, the pool cleaner control logic 76 receives instruction to activate a pool cleaner. In step 2524, the pool cleaner control logic 76 receives operational data from the pool cleaner submersion sensor (e.g., float switch or moisture sensor). In step 2526, the pool cleaner control logic 76 determines whether the pool cleaner is submerged. If a positive determination is made, then in step 2528, the pool cleaner control logic 76 transmits instructions to the pool cleaner to activate. If a negative determination is made in step 2526, then in step 2530, the pool cleaner control logic 76 determines whether there are any retries remaining. If a positive determination is made, then the process reverts to step 2524. If a negative determination is made, then the process proceeds to step 2532, where the pool cleaner control logic 76 transmits an error condition, and the process ends.

FIG. 27G is a flowchart illustrating processing steps of the pool cleaner control logic 76 communicating with a debris sensor of the pool cleaner collection bag. In step 2534, the pool cleaner control logic 76 receives instructions to activate a pool cleaner. In step 2536, the pool cleaner control logic 76 receives operational data from a debris sensor for a collection bag. In step 2538, the pool cleaner control logic 76 determines the debris level of the collection bag. In step 2546, the pool cleaner control logic 76 could optionally transmit instruction to an HMI device to display the debris level of the collection bag. In step 2540, the pool cleaner control logic 76 determines whether the collection bag is full. If a positive determination is made, then in step 2544, the pool cleaner control logic 76 transmits a message to the user to empty the collection bag, and the process reverts to step 2536. Optionally, in step 2541 the pool cleaner logic 76 could transmit an instruction to the pool cleaner to swim to a pool skimmer and purge the collection bag so that the debris from the collection bag is emptied without user intervention and quickly removed from the pool via the skimmer. If a negative determination is made in step 2540, then in step 2542, the pool cleaner control logic 76 transmits instructions to the pool cleaner to activate, and the process ends.

FIG. 27H is a flowchart illustrating processing steps of the pool cleaner control logic 76 communicating with a pool cleaner regarding a motor speed threshold. In step 2548, the pool cleaner control logic 76 retrieves factory specified pool cleaner motor speed data from memory. In step 2550, the pool cleaner control logic 76 determines the motor speed threshold for a full collection bag (e.g., 95% of factory specified speed). In step 2552, the pool cleaner control logic 76 receives operational data from the pool cleaner (e.g., motor speed). In step 2554, the pool cleaner control logic 76 determines whether the motor speed is below a threshold. If a negative determination is made, the process reverts to step 2552. If a positive determination is made, the process proceeds to step 2556, where the pool cleaner control logic 76 transmits a message to the user to empty the collection bag, and the process reverts to step 2552.

FIG. 27I is a flowchart illustrating processing steps of the pool cleaner control logic 76 communicating regarding line power operational data. In step 2558, the pool cleaner control logic 76 receives instructions to activate a pool cleaner. In step 2560, the pool cleaner control logic 76 retrieves data on factory specified power parameters from a memory (e.g., power consumption, current draw, and/or line voltage). In step 2562, the pool cleaner control logic 76 receives line power operational data. In step 2564, the pool cleaner control logic 76 determines whether the line power is within factory specifications. If a positive determination is made, then in step 2566, the pool cleaner control logic 76 transmits instructions to the pool cleaner to activate. If a negative determination is made in step 2564, then in step 2568, the pool cleaner control logic 76 determines whether there are any retries remaining. If a positive determination is made in step 2568, then the process reverts to step 2562. If a negative determination is made in step 2570, then in step 2570, the pool cleaner control logic 76 transmits an error condition, and the process ends.

FIG. 27J is a flowchart illustrating processing steps of the pool cleaner control logic 76 communicating with an internal tachometer. In step 2572, the pool cleaner control logic 76 receives instructions to activate a pool cleaner. In step 2580, the pool cleaner control logic 76 transmits instructions to the pool cleaner to activate. In step 2574, the pool cleaner control logic 76 retrieves turbine setpoint data for a pool cleaner operation from memory (e.g., minimum RPMs). In step 2576, the pool cleaner control logic 76 receives operational data from an internal tachometer. In step 2578, the pool cleaner control logic 76 determines whether the speed of the turbine is sufficient. If a positive determination is made in step 2578, the process reverts to step 2576. If a negative determination is made in step 2578, then in step 2582, the pool cleaner control logic 76 determines whether there are any retries remaining. If a positive determination is made in step 2582, then in step 2584, the pool cleaner control logic 76 transmits instructions to the pump to increase output (e.g., by 5%), and the process reverts to step 2576. If a negative determination is made in step 2582, then in step 2586, the pool cleaner control logic 76 transmits an error condition (e.g., obstruction), and the process ends.

FIG. 27K is a flowchart illustrating processing steps of the pool cleaner control logic 76 communicating with an internal tachometer. In step 2588, the pool cleaner control logic 76 receives instructions to activate a pool cleaner. In step 2596, the pool cleaner control logic 76 transmits instructions to the pool cleaner to activate. In step 2590, the pool cleaner control logic 76 retrieves turbine setpoint data for a pool cleaner operation from a memory (e.g., minimum RPMs). In step 2592, the pool cleaner control logic 76 receives operational data from an internal tachometer. In step 2594, the pool cleaner control logic 76 determines whether the speed of the turbine is sufficient. If a positive determination is made, the process reverts to step 2592. If in step 2594, a negative determination is made, then in step 2598, the pool cleaner control logic 76 determines whether there are any retries remaining. If a positive determination is made in step 2598, then in step 2600, the pool cleaner control logic 76 receives operational data from a flow rate sensor. In step 2602, the pool cleaner control logic 76 determines the required increase in flow rate to achieve the turbine speed setpoint. In step 2604, the pool cleaner control logic 76 determines the required increase in pump speed to achieve a required flow rate. In step 2606, the pool cleaner control logic 76 transmits the instruction to the pump to increase output by the determined amount, and the process reverts to step 2592. If a negative determination is made in step 2598, then in step 2608, the pool cleaner control logic 76 transmits an error condition (e.g., obstruction), and the process ends.

FIG. 27L is a flowchart illustrating processing steps of the pool cleaner control logic 76 communicating with a pump. In step 2610, the pool cleaner control logic 76 retrieves scheduling data for a pool cleaner operation from a memory (e.g., operating hours, duration, schedule, weather conditions, upcoming events at the site, etc.). In step 2612, the pool cleaner control logic 76 receives time data from a clock (e.g., current time). In step 2614, the pool cleaner control logic 76 determines whether the current time is within hours of operation. If a negative determination is made, then the process reverts to step 2612. If a positive determination is made, then in step 2616, the pool cleaner control logic 76 receives operational data from a pump. In step 2618, the pool cleaner control logic 76 determines whether the pump is on. If a positive determination is made in step 2618, then in step 2620, the pool cleaner control logic 76 transmits instructions to the pool cleaner to activate. If a negative determination is made in step 2618, then in step 2622, the pool cleaner control logic 76 transmits instructions to the pump to activate, and the process proceeds to step 2620.

FIG. 27M is a flowchart illustrating processing steps of the pool cleaner control logic 76 communicating with an ambient light sensor. In step 2624, the pool cleaner control logic 76 receives operational data from an ambient light sensor. In step 2626, the pool cleaner control logic 76 determines the time of day (e.g., day, night, etc.). In step 2628, the pool cleaner control logic 76 determines whether it is nighttime. If a negative determination is made, the process reverts to step 2624. If a positive determination is made, then in step 2630, the pool cleaner control logic 76 receives operational data from a pump. In step 2632, the pool cleaner control logic 76 determines whether the pump is on. If a positive determination is made in step 2632, then in step 2634, the pool cleaner control logic 76 transmits instructions to the pool cleaner to activate, and the process ends. If a negative determination is made in step 2632, then in step 2636, the pool cleaner control logic 76 transmits instructions to the pump to activate, and the process proceeds to step 2634.

FIG. 27N is a flowchart illustrating processing steps of the pool cleaner control logic 76 communicating with a vision system. In step 2638, the pool cleaner control logic 76 receives instructions to activate a pool cleaner. In step 2640, the pool cleaner control logic 76 receives operational data from a vision system (e.g., location of debris). In step 2642, the pool cleaner control logic 76 determines the location of a high debris area. In step 2644, the pool cleaner control logic 76 determines the location and orientation of the pool cleaner. In step 2646, the pool cleaner control logic 76 transmits instructions to the pool cleaner to traverse the high debris area. The process then reverts to step 2640.

FIG. 27O is a flowchart illustrating processing steps of the pool cleaner control logic 76 communicating with a software application. In step 2639 the application displays a graphical representation or image of the pool on the device on which the software application is installed. While step 2639 shows the software application installed on a smartphone, it is to be appreciated that the software application can be installed on various devices of the system 10, including but not limited to, the computer system 20 or the pool/spa control system 14*f*. In step 2641, the user indicates (e.g., by touching the smartphone screen in the appropriate location) where debris is observed in the pool. In step 2643 the software application marks each spot that the user has indicated with a graphical overlay (e.g., a box is placed around each indicated debris area). In step 2645 the software application transmits an instruction to the cleaner 14*g* to navigate to the debris areas indicated by the user and clean the same. The process then ends.

It is noted that the pool cleaner control logic illustrated in FIGS. 27A-27O and discussed above could be used to control a pool/spa cleaner that does not have on-board electronic controls, such as, for example, a conventional suction or pressure cleaner. In such instances, control of the cleaner could be implemented by way of a valve actuator that has an associated processor and network connectivity, such as the valve actuator discussed herein in connection with FIGS. 28-29I. The valve actuator would be in fluid communication with the cleaner, and the control logic discussed in connection with FIGS. 27A-27O would be applied to control the valve actuator to correspondingly control operation of the cleaner.

Figure 28:
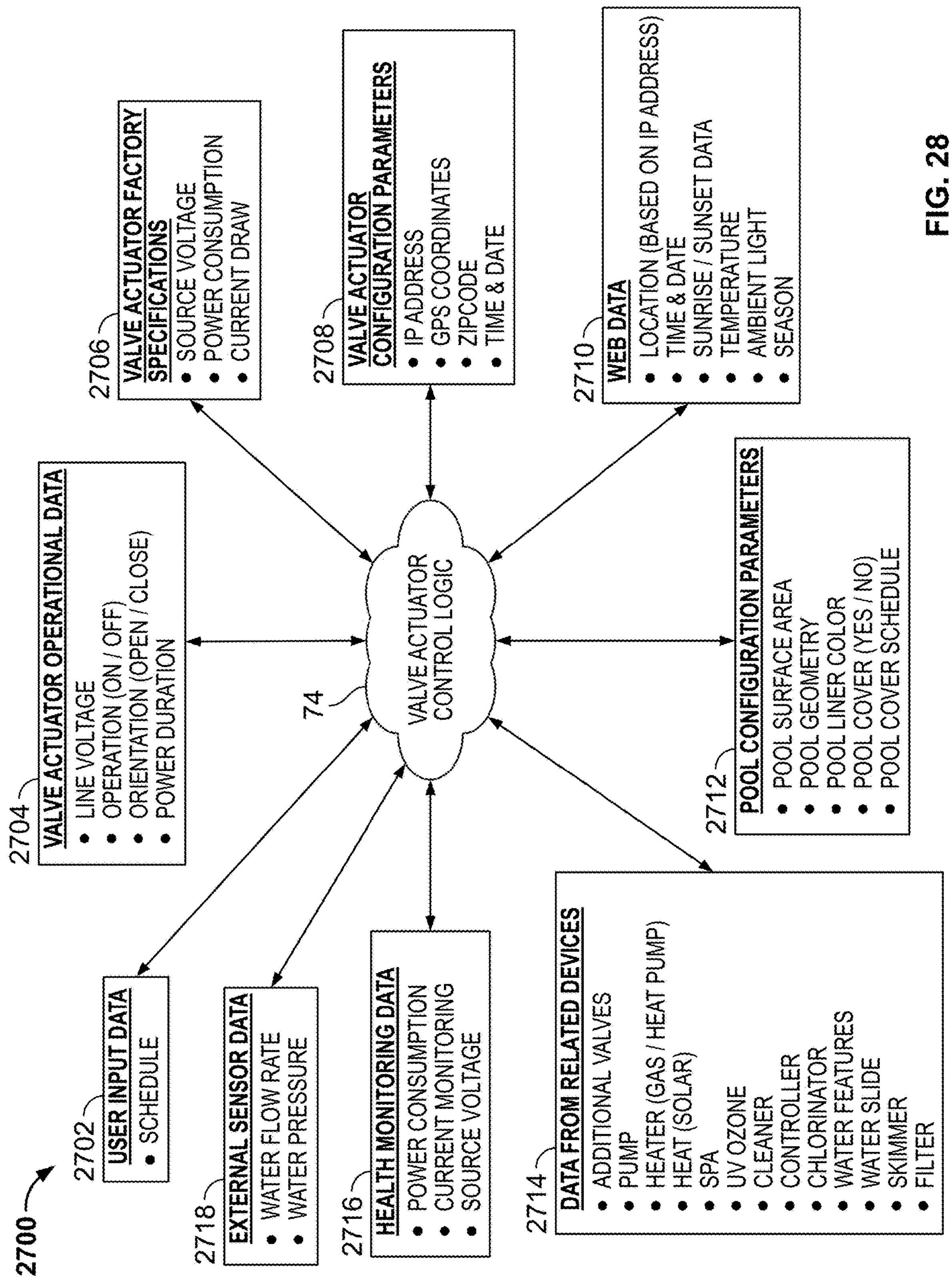
FIG. 28 is a diagram illustrating the valve actuator control logic of FIG. 3.

FIG. 28 is a diagram 2700 illustrating valve actuator control logic 74. Valve actuator control logic 74 could incorporate a variety of types of data and/or data sources. More specifically, valve actuator control logic 76 could incorporate user input data 2702, valve actuator operational data 2704, valve actuator factory specifications 2706, valve actuator configuration parameters 2708, web data 2710, pool configuration parameters 2712, data from related devices 2714, health monitoring data 2716, and/or external sensor data 2718.

User input data 2702 could include schedule information (e.g., on/off and what orientation, duration of power on/off for specific orientation, open/close), etc. Valve actuator operational data 2704 could include line voltage, operation (e.g., on, off, etc.), orientation (e.g., open, close, etc.), power duration, etc. Valve actuator factor specification 2706 could include source voltage, power consumption, current draw, etc. Valve actuator configuration parameters 2708 could include IP address, GPS coordinates, zipcode, time and date, etc. Web data 2710 could include location (e.g., based on IP address), time and date, sunrise/sunset data, temperature, ambient light, season, etc. Pool configuration parameters 2712 could include pool surface area, pool geometry, pool line color, pool cover (e.g., yes, no, etc.), pool cover schedule, etc. Data from related devices 2714 could include additional valves, pump, heater (e.g., gas, heat pump, etc.), heat (e.g., solar), spa, UV ozone, cleaner, controller, chlorinator, water features, water slide, skimmer, filter, etc. Health monitoring data 2716 could include power consumption, current monitoring, source voltage, etc. External sensor data 2718 could include water flow rate, water pressure, etc. While it may be desirable for external sensors to monitor/provide data on as many system parameters as possible (thereby providing greater optimization, automation, and user/operator comfort), it is contemplated that some systems need not utilize an external sensor to monitor every system parameter. For example, if a water pressure sensor has not been installed in a particular system, the user/operator can provide this information by first determining the water pressure (e.g., by visually inspecting an analog water pressure gauge) and then entering the water pressure information into the system via a user interface.

Figure 29A:
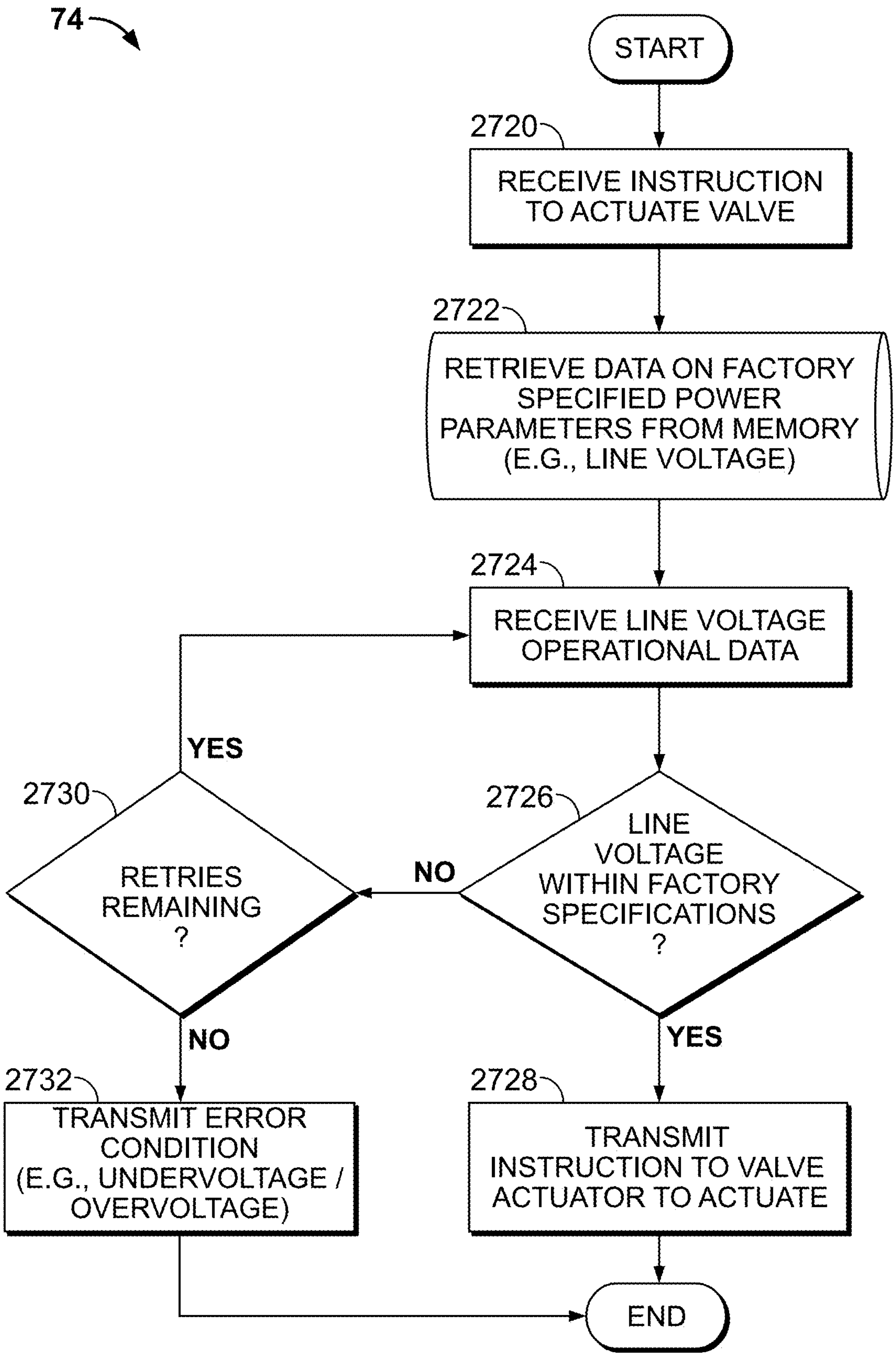
FIGS. 29A-29I are flowcharts illustrating processing steps of the valve actuator control logic of FIG. 3.

FIGS. 29A-29I are flowcharts illustrating processing steps of the valve actuator control logic 74. FIG. 29A is a flowchart illustrating processing steps of the valve actuator control logic 74 communicating with a valve actuator. In step 2720, the valve actuator control logic 74 receives instructions to actuate a valve. In step 2722, the valve actuator control logic 74 retrieves data on factory specified power parameters from a memory (e.g., line voltage). In step 2724, the valve actuator control logic 74 receives line voltage operational data. In step 2726, the valve actuator control logic 74 determines whether the line voltage is within the factory specifications. If a positive determination is made, then in step 2728, the valve actuator control logic 74 transmits instructions to the valve actuator to actuate. If a negative determination is made in step 2726, then in step 2730, the valve actuator control logic 74 determines whether there are any retries remaining. If a positive determination is made in step 2730, then the process reverts to step 2724. If a negative determination is made in step 2730, then in step 2732, the valve actuator control logic 74 transmits an error condition (e.g., undervoltage, overvoltage, etc.), and the process ends.

Figure 29B:
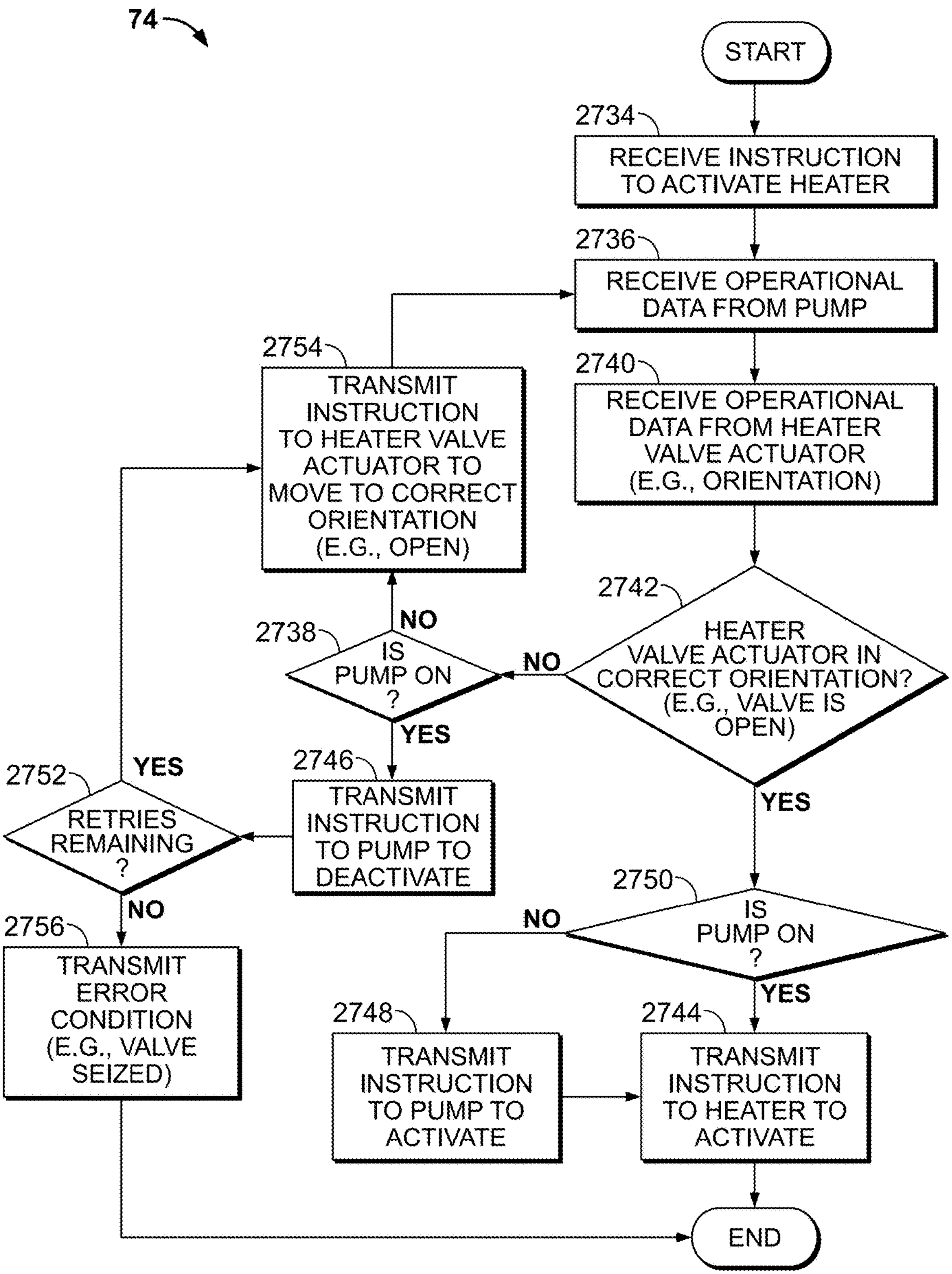

FIG. 29B is a flowchart illustrating processing steps of the valve actuator control logic 74 communicating with a heater. In step 2734, the valve actuator control logic 74 receives instructions to activate a heater. In step 2736, the valve actuator control logic 74 receives operational data from a pump. In step 2740, the valve actuator control logic 74 receives operational data from a heater valve actuator (e.g., orientation) 14*e*. In step 2742, the valve actuator control logic 74 determines whether the heater valve actuator 14*e* is in the correct orientation (e.g., valve is open). If a positive determination is made in step 2742, then in step 2750 a determination is made as to whether the pump 14*a* is on. If a positive determination is made in step 2750, in step 2744, the valve actuator control logic 74 transmits instructions to the heater 14*b* to activate, and the process ends. If a negative determination is made in step 2750 the valve actuator control logic 74 transmits an instruction to the pump 14*a* to activate and the process then proceeds to step 2744. If a negative determination is made in step 2742, then in step 2738, a determination is made as to whether the pump 14*a* is on. If a positive determination is made in step 2738, the valve actuator control logic 74 transmits an instruction to the pump 14*a* to deactivate. If a negative determination is made in step 2738, the process proceeds to step 2754. In step 2752, the valve actuator control logic 74 determines whether there are any retries remaining. If a positive determination is made in step 2752, then in step 2754, the valve actuator control logic 74 transmits instructions to the heater valve actuator 14*e* to move to the correct orientation (e.g., open) and the process then reverts to step 2736. If a negative determination is made in step 2752, then in step 2756, the valve actuator control logic 74 transmits an error condition (e.g., valve seized), and the process ends.

Figure 29C:
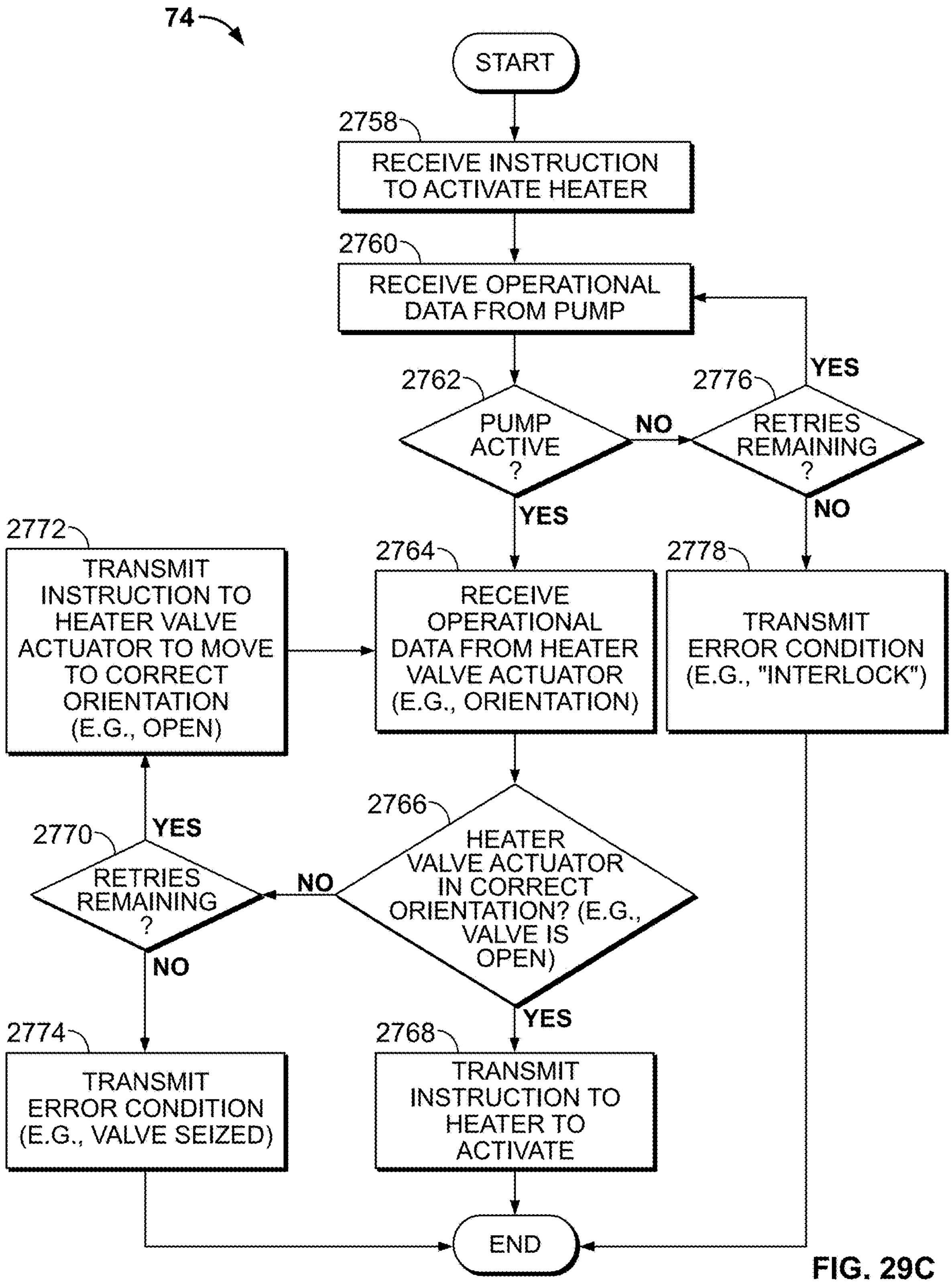

FIG. 29C is a flowchart illustrating processing steps of the valve actuator control logic 74 communicating with a heater. In step 2758, the valve actuator control logic 74 receives instructions to activate a heater. In step 2760, the valve actuator control logic 74 receives operational data from a pump. In step 2762, the valve actuator control logic 74 determines whether the pump is active. If a negative determination is made in step 2762, then in step 2776, the valve actuator control logic 74 determines whether there are any retries remaining. If a positive determination is made in step 2776, then the process reverts to step 2760. If a negative determination is made in step 2776, then in step 2778, the valve actuator control logic 74 transmits an error condition (e.g., interlock), and the process ends. If a positive determination is made in step 2762, then in step 2764, the valve actuator control logic 74 receives operational data from a heater valve actuator (e.g., orientation). In step 2766, the valve actuator control logic 74 determines whether the heater valve actuator is in the correct orientation (e.g., valve is open). If a positive determination is made in step 2766, then in step 2768, the valve actuator control logic 74 transmits instructions to the heater to activate, and the process ends. If a negative determination is made in step 2766, then in step 2770, the valve actuator control logic 74 determines whether there are any retries remaining. If a positive determination is made in step 2770, then in step 2772, the valve actuator control logic 74 transmits instructions to the heater valve actuator to move to the correct orientation (e.g., open). If a negative determination is made in step 2770, then in step 2774, the valve actuator control logic 74 transmits an error condition (e.g., valve seized), and the process ends.

Figure 29D:
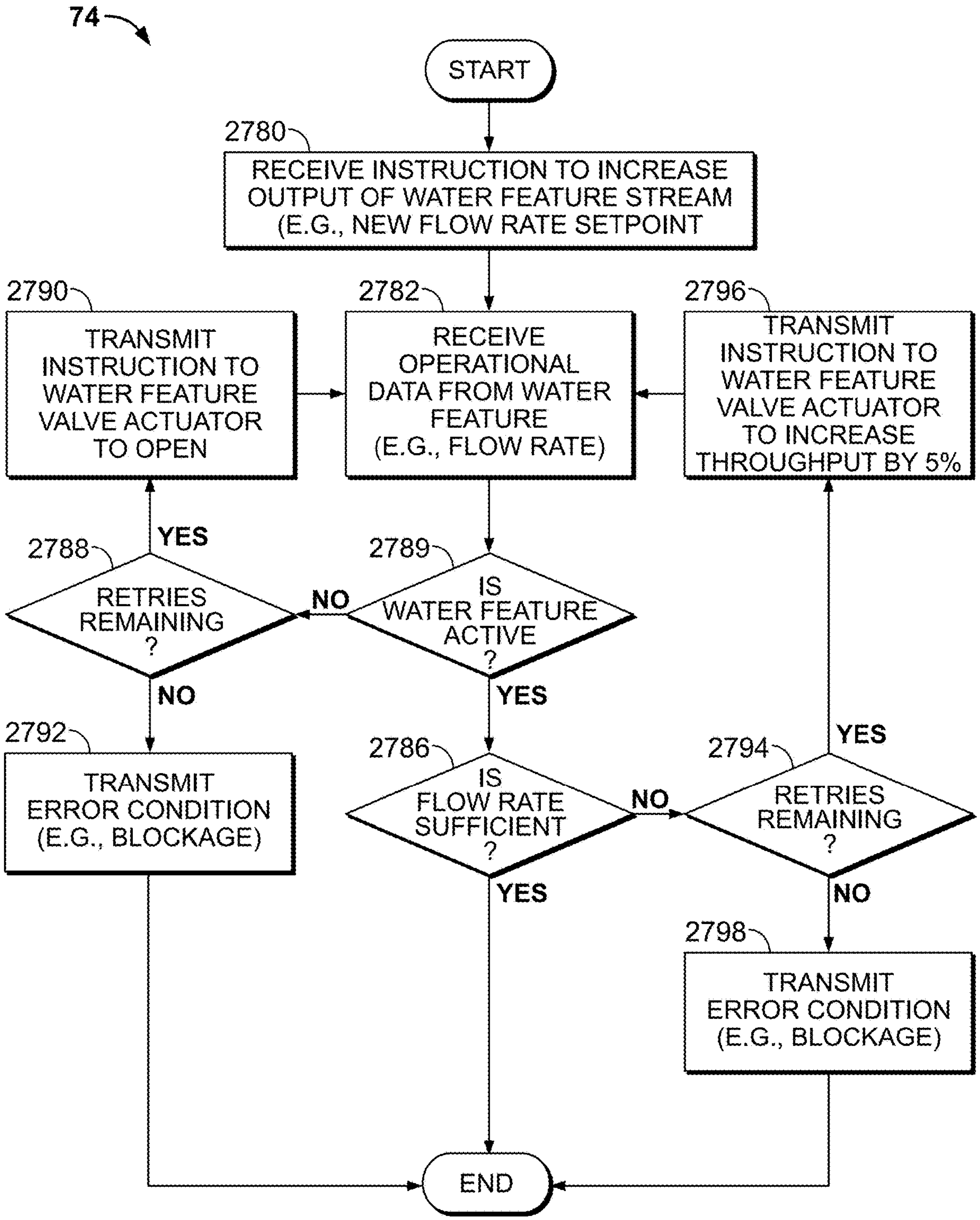

FIG. 29D is a flowchart illustrating processing steps of the valve actuator control logic 74 communicating with a water feature valve actuator. In step 2780, the valve actuator control logic 74 receives instructions to increase the output of the water stream feature (e.g., new flow rate setpoint). In step 2782, the valve actuator control logic 74 receives operational data from a water feature (e.g., flow rate). In step 2784, the valve actuator control logic 74 determines whether the water feature is active. If a positive determination is made in step 2784, then in step 2786, the valve actuator control logic 74 determines whether the flow rate is sufficient. If a positive determination is made in step 2786, then the process ends. If a negative determination is made in step 2786, then in step 2794, the valve actuator control logic 74 determines whether there are any retries remaining. If a positive determination is made in step 2794, then in step 2796, the valve actuator control logic 74 transmits instructions to the water feature valve actuator to increase throughput (e.g., by 5%), and the process reverts to step 2782. If a negative determination is made in step 2794, then in step 2798, the valve actuator control logic 74 transmits an error condition (e.g., blockage), and the process ends. If a negative determination is made in step 2784, then in step 2788, the valve actuator control logic 74 determines whether there are any retries remaining. If a positive determination is made in step 2788, then in step 2790, the valve actuator control logic 74 transmits instructions to the water feature valve actuator to open, and the process reverts to step 2782. If a negative determination is made in step 2788, then in step 2792, the valve actuator control logic 74 transmits an error condition (e.g., blockage), and the process ends. It is to be appreciated that while flow rate operational data is received from the water feature in the process described above, similar process steps could be followed should pressure, or other, operational data be received from the water feature.

Figure 29E:
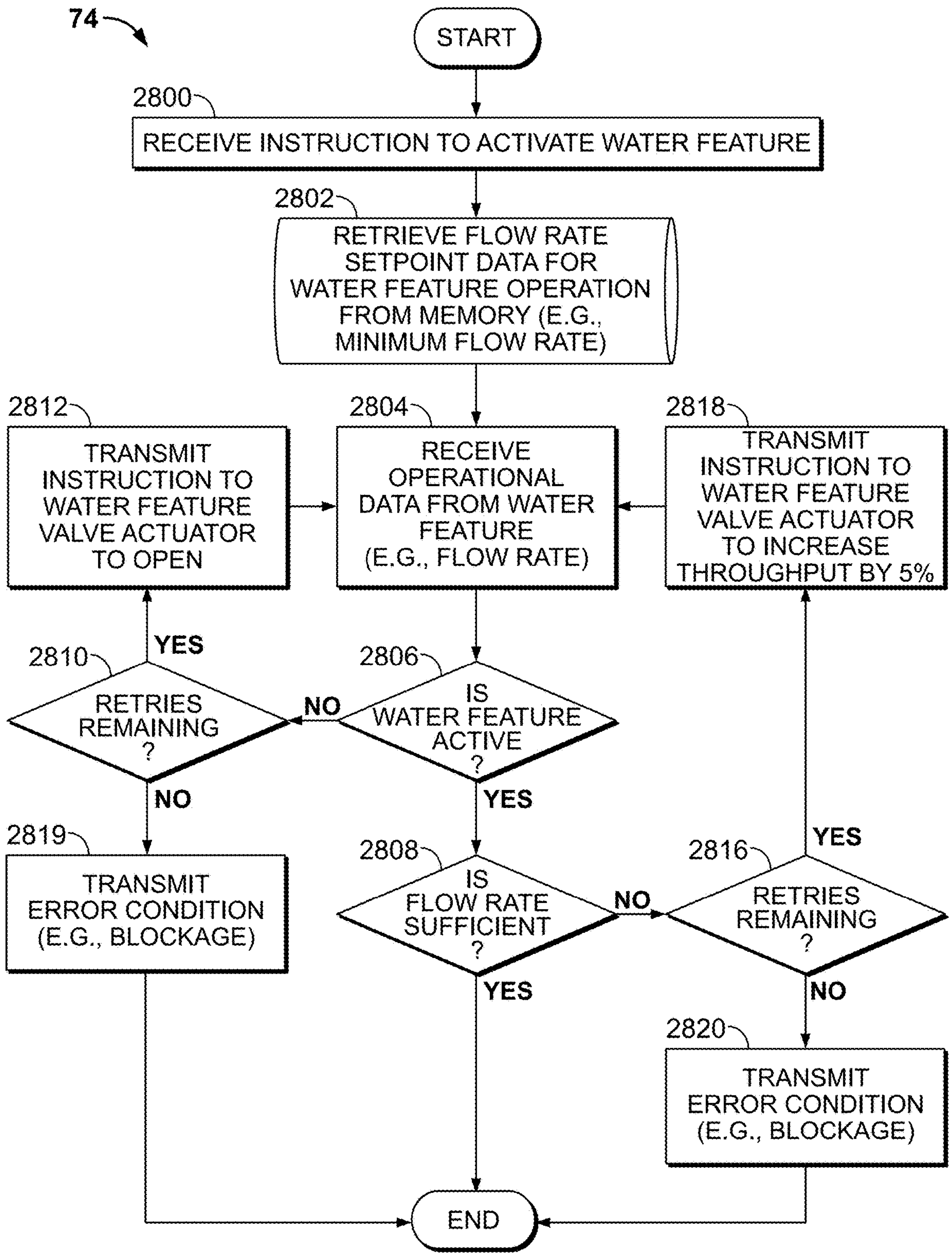

FIG. 29E is a flowchart illustrating processing steps of the valve actuator control logic 74 communicating with a water feature valve actuator. In step 2800, the valve actuator control logic 74 receives instructions to activate a water feature. In step 2802, the valve actuator control logic 74 retrieves flow rate setpoint data for water feature operation from a memory (e.g., minimum flow rate). In step 2804, the valve actuator control logic 74 receives operational data from a water feature (e.g., flow rate). In step 2806, the valve actuator control logic 74 determines whether the water feature is active. If a positive determination is made in step 2806, then in step 2808, the valve actuator control logic 74 determines whether the flow rate is sufficient. If a positive determination is made in step 2808, then the process ends. If a negative determination is made in step 2808, then in step 2816, the valve actuator control logic 74 determines whether there are any retries remaining. If a positive determination is made in step 2816, then in step 2818, the valve actuator control logic 74 transmits instructions to the water feature valve actuator to increase throughput (e.g., by 5%), and the process reverts to step 2804. If a negative determination is made in step 2816, then in step 2820 the valve actuator control logic 74 transmits an error condition (e.g., blockage), and the process ends. If a negative determination is made in step 2806, then in step 2810, the valve actuator control logic 74 determines whether there are any retries remaining. If a positive determination is made in step 2810, then in step 2812, the valve actuator control logic 74 transmits instructions to the water feature valve actuator to open, and the process reverts to step 2802. If a negative determination is made in step 2810, then in step 2814, the valve actuator control logic 74 transmits an error condition (e.g., blockage), and the process ends.

Figure 29F:
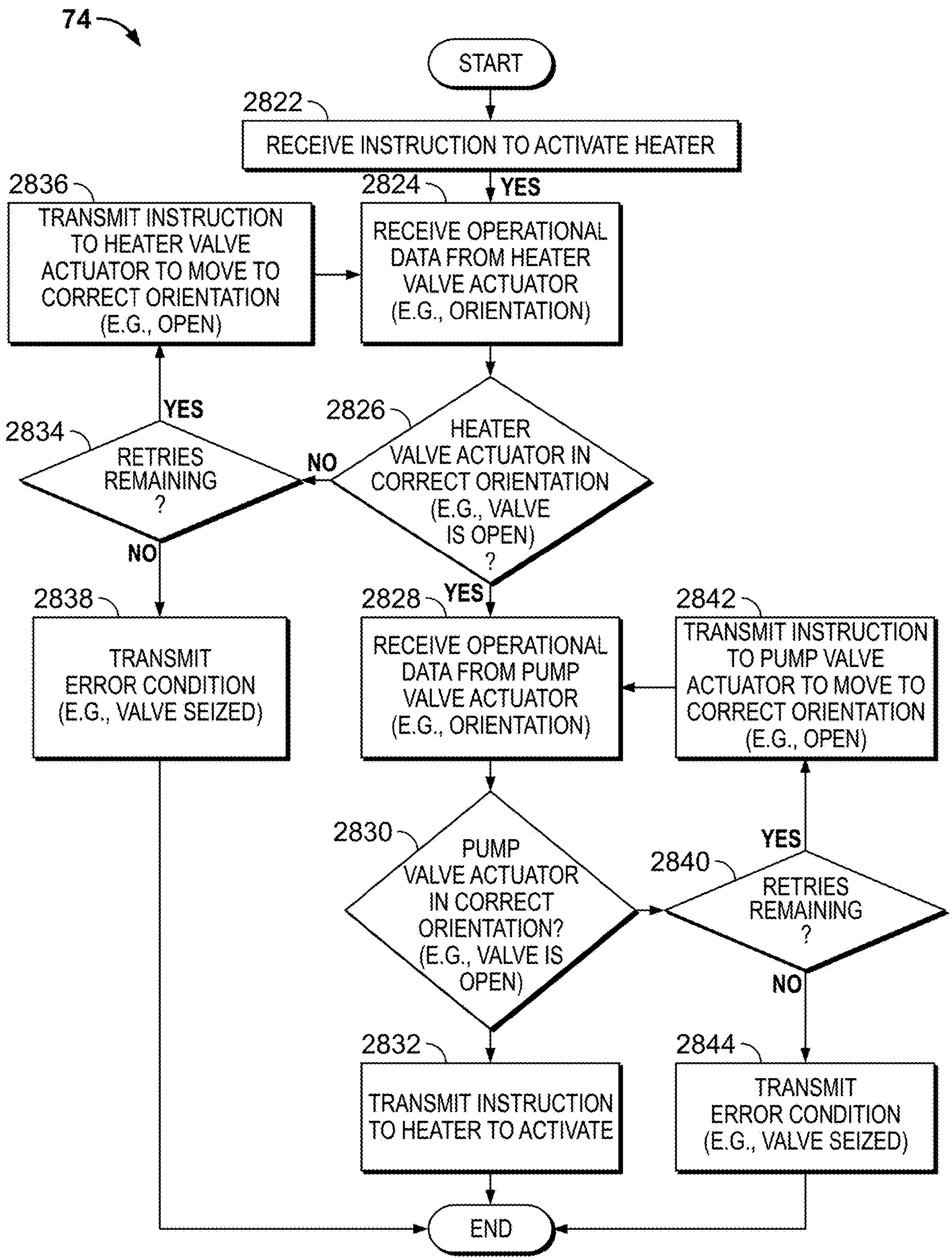

FIG. 29F is a flowchart illustrating processing steps of the valve actuator control logic 74 communicating with a heater valve actuator. In step 2822, the valve actuator control logic 74 receives instructions to activate the heater. In step 2824, the valve actuator control logic 74 receives operational data from a heater valve actuator (e.g., orientation). In step 2826, the valve actuator control logic 74 determines whether the heater valve actuator is in the correct orientation (e.g., valve is open). If a negative determination is made in step 2826, then in step 2834, the valve actuator control logic 74 determines whether there are any retries remaining. If a positive determination is made in step 2834, then in step 2836, the valve actuator control logic 74 transmits instructions to the heater valve actuator to move to the correct orientation (e.g., open), and the process reverts to step 2824. If a negative determination is made in step 2834, then in step 2838, the valve actuator control logic 74 transmits an error condition (e.g., valve seized), and the process ends. If a positive determination is made in step 2826, then in step 2828, the valve actuator control logic 74 receives operational data from a pump valve actuator (e.g., orientation). In step 2830, the valve actuator control logic 74 determines whether the pump valve actuator is in the correct orientation (e.g., valve is open). If a positive determination is made in step 2830, then in step 2832, the valve actuator control logic 74 transmits instructions to the heater to activate. If a negative determination is made in step 2830, then in step 2840, the valve actuator control logic 74 determines whether there are any retries remaining. If a positive determination is made in step 2840, then in step 2842, the valve actuator control logic 74 transmits instructions to the pump valve actuator to move to the correct orientation (e.g., open), and the process reverts to step 2828. If a negative determination is made in step 2840, then in step 2844, the valve actuator control logic 74 transmits an error condition (e.g., valve seized), and the process ends.

Figure 29G:
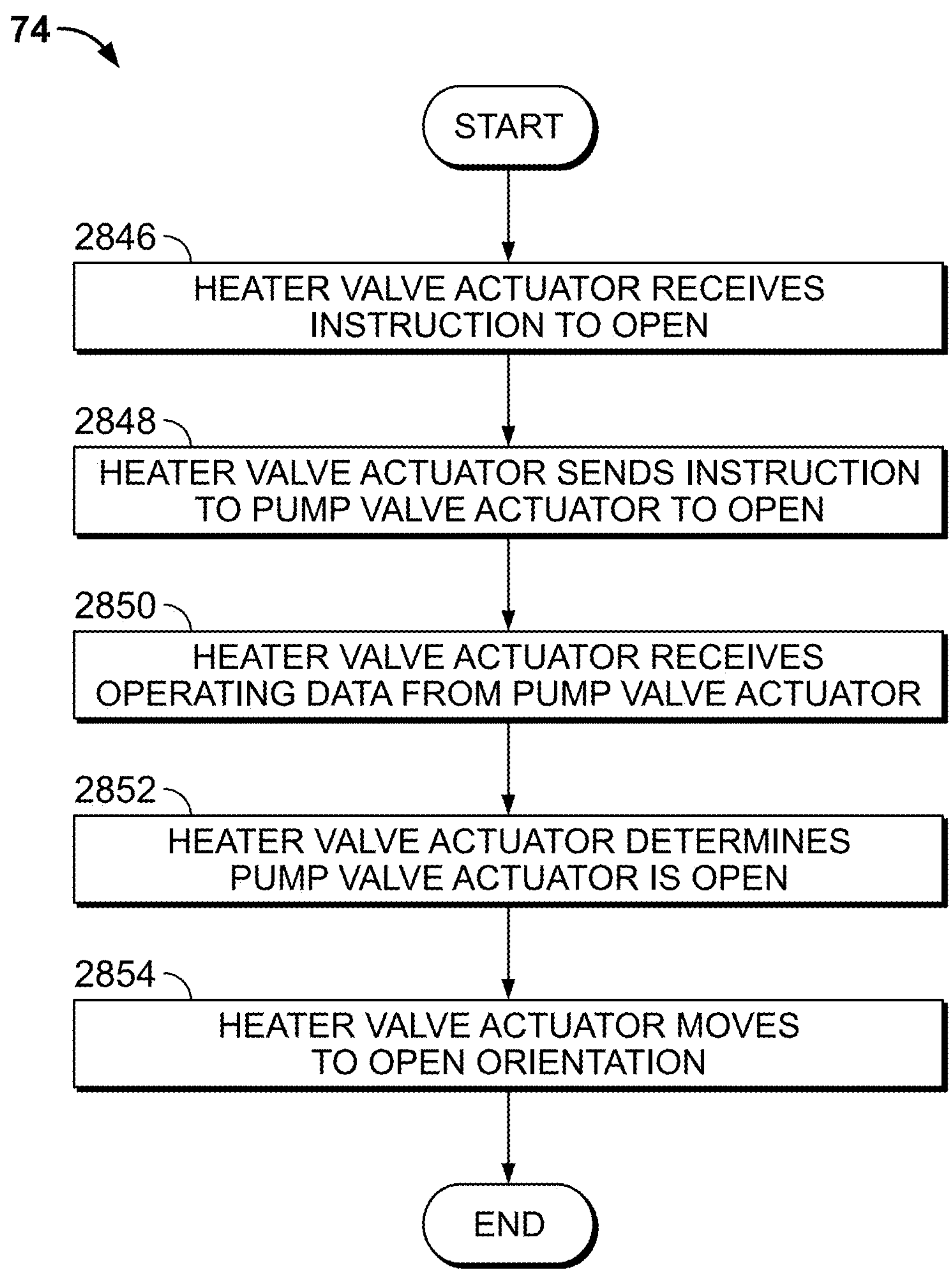

FIG. 29G is a flowchart illustrating processing steps of the valve actuator control logic 74. In step 2846, the heater valve actuator receives instructions to open. In step 2848, the heater valve actuator sends instructions to the pump valve actuator to open. In step 2850, the heater valve actuator receives operating data from the pump valve actuator. In step 2852, the heater valve actuator determines if the pump valve actuator is open. In step 2854, the heater valve actuator moves to the open orientation.

Figure 29H:
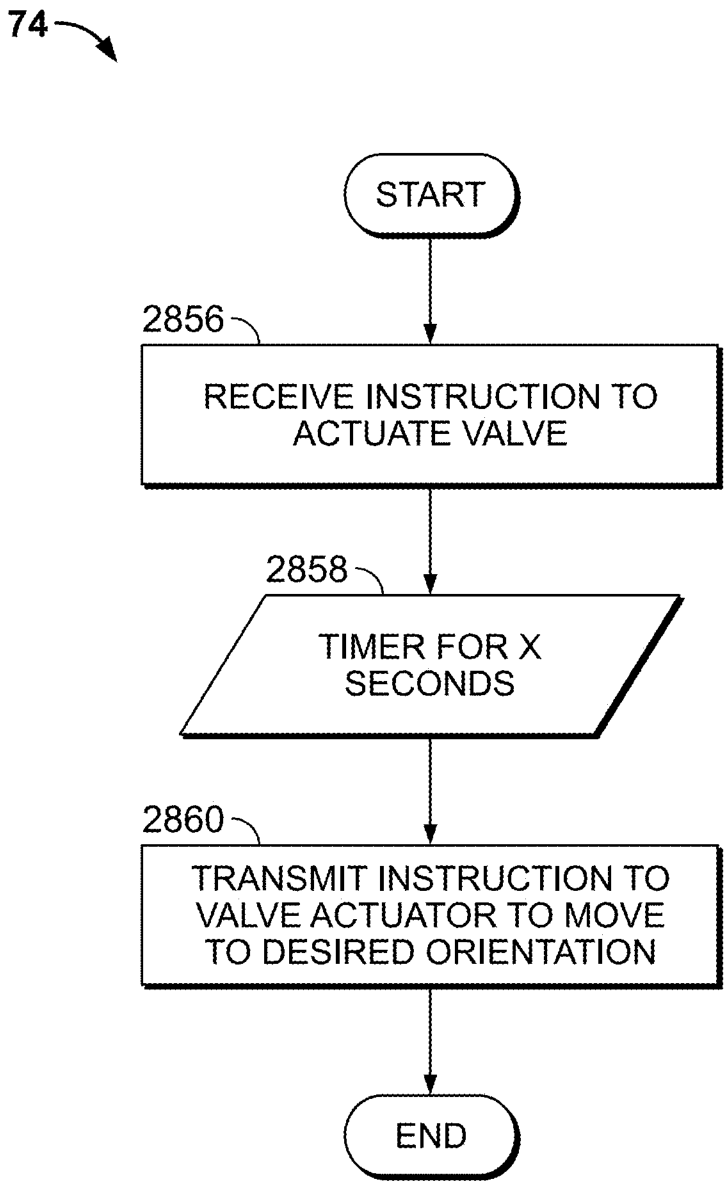

FIG. 29H is a flowchart illustrating processing steps of the valve actuator control logic 74. In step 2856, the valve actuator control logic 74 receives instructions to actuate a valve. In step 2858, the valve actuator control logic 74 receives an input from a timer for x seconds. In step 2860, the valve actuator control logic 74 transmits instructions to the valve actuator to move to a desired orientation.

Figure 29I:
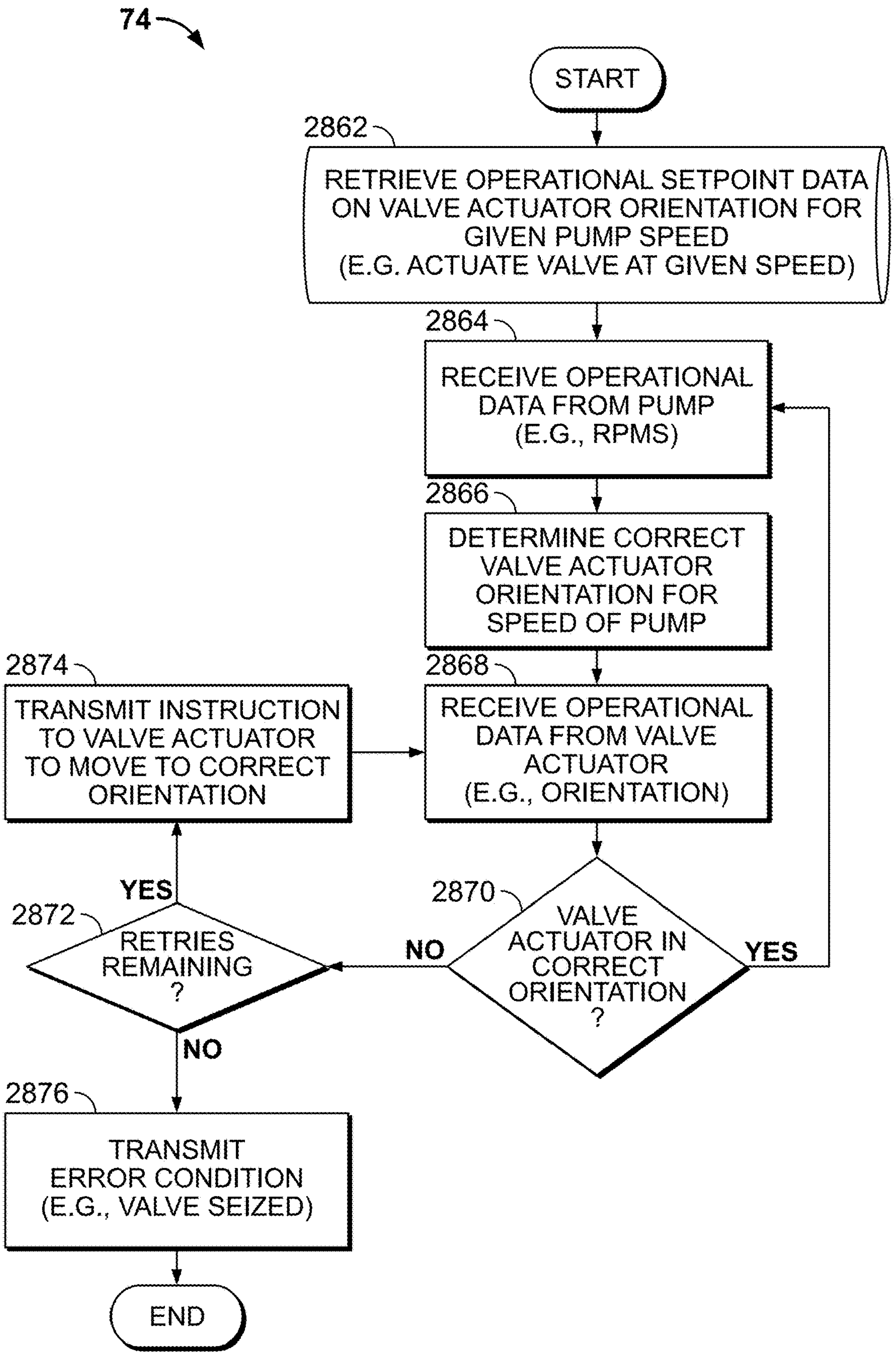

FIG. 29I is a flowchart illustrating processing steps of the valve actuator control logic 74 communicating with a pump. In step 2862, the valve actuator control logic 74 retrieves operational setpoint data on valve actuator orientation for a given pump speed (e.g., actuate valve at a given speed). In step 2864, the valve actuator control logic 74 receives operational data from a pump (e.g., RPMs). In step 2866, the valve actuator control logic 74 determines the correct valve actuator orientation for a speed of the pump. In step 2868, the valve actuator control logic 74 receives operational data from a valve actuator (e.g., orientation). In step 2870, the valve actuator control logic 74 determines whether the valve actuator is in the correct orientation. If a positive determination is made in step 2870, then the process reverts to step 2864. If a negative determination is made in step 2870, then in step 2872, the valve actuator control logic 74 determines whether there are any retries remaining. If a positive determination is made in step 2872, then in step 2874, the valve actuator control logic 74 transmits instructions to the valve actuator to move to the correct orientation, and the process reverts to step 2868. If a negative determination is made in step 2872, then in step 2876, the valve actuator control logic 74 transmits an error condition (e.g., valve seized), and the process ends.

Figure 30:
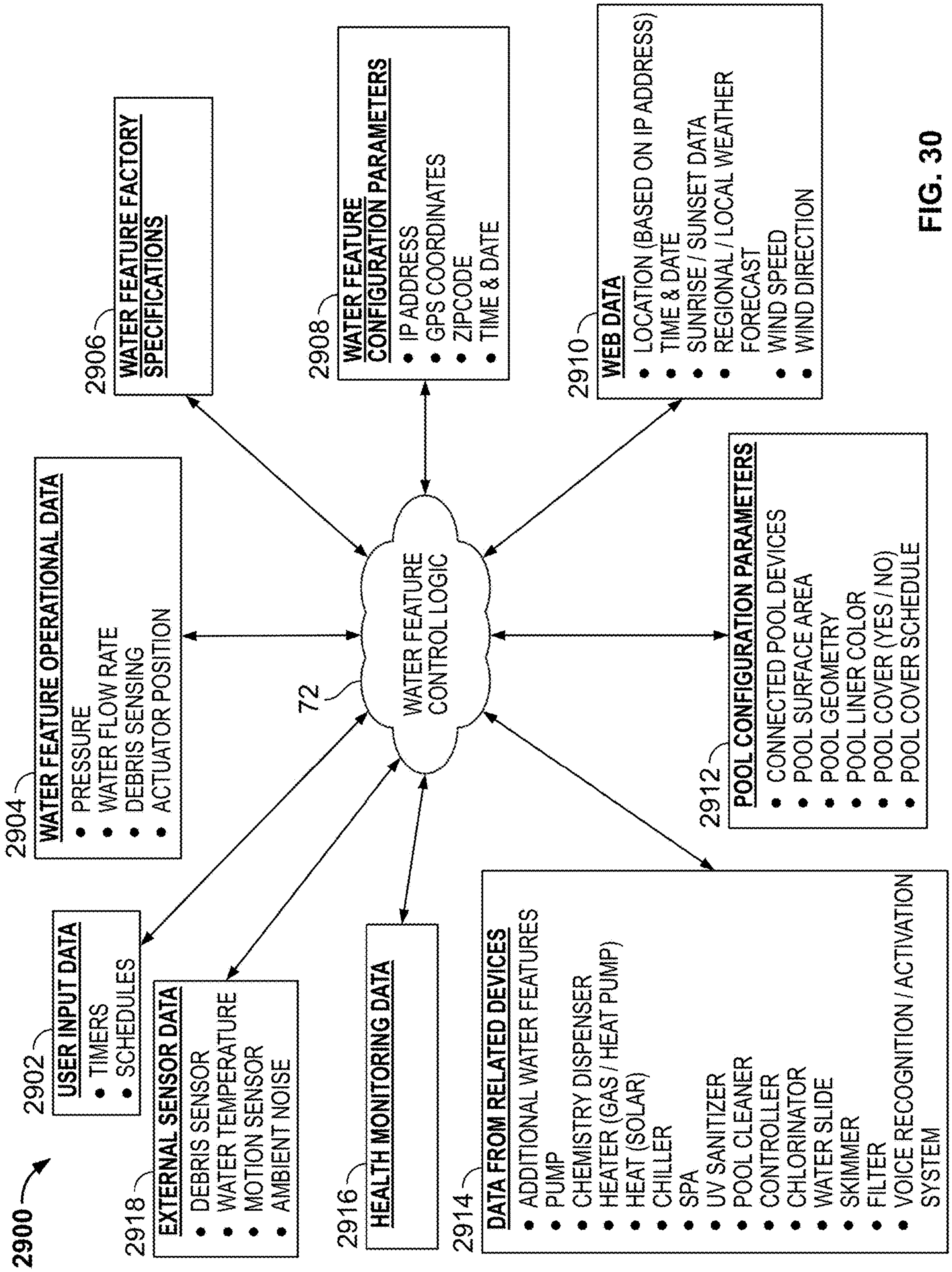
FIG. 30 is a diagram illustrating water feature control logic of FIG. 3.

FIG. 30 is a diagram 2900 illustrating water feature control logic 72. Water feature control logic 72 could incorporate a variety of types of data and/or data sources. More specifically, water feature control logic 72 could incorporate user input data 2902, water feature operational data 2904, water feature factory specifications 2906, water feature configuration parameters 2908, web data 2910, pool configuration parameters 2912, data from related devices 2914, health monitoring data 2916, and/or external sensor data 2918.

User input data 2902, could include timers, schedules, feature parameters (e.g., how high, how much flow for effect), etc. Water feature operational data 2904 could include pressure, water flow rate, debris sensing, actuator position, etc. Water feature configuration parameters 2908 could include IP address, GPS coordinates, zipcode, time and date, etc. Web data 2910 could include location (e.g., based on IP address), time and date, sunrise/sunset data, regional/local weather forecast, wind speed, wind direction, etc. Pool configuration parameters 2912 could include connected pool devices, pool surface area, pool geometry, pool line color, pool cover (e.g., yes, no, etc.), pool cover schedule, etc. Data from related devices 2914 could include additional water features, pump, chemistry dispenser, heater (e.g., gas pump, heat pump, etc.), heat (e.g., solar), chiller, spa, UV sanitizer, pool cleaner, controller, chlorinator, water slide, skimmer, filter, voice recognition/activation system, etc. External sensor data 2918 could include debris sensor, water temperature, motion sensor, ambient noise, etc. While it may be desirable for external sensors to monitor/provide data on as many system parameters as possible (thereby providing greater optimization, automation, and user/operator comfort), it is contemplated that some systems need not utilize an external sensor to monitor every system parameter. For example, if a water temperature sensor has not been installed in a particular system, the user/operator can provide this information by first determining the water temperature (e.g., by checking a thermometer, thermocouple, etc.) and then entering the water temperature into the system via a user interface. Using this data, the water feature control logic 76 could optimize the operation of the water features by, for example, determining if the feature has been degraded due to debris by receiving data from a pressure sensor in the unit, determining appropriate operation by receiving weather data (e.g., wind location, direction, and speed) and modifying operating parameters, not running the water feature or altering the operation thereof if users are present (e.g., auto-home, or auto-away), enhance turn-over and make pH adjustments, varying the height of water from a water feature by using a variable position actuator, self-leveling the water feature using an actuator and level sensor.

Figure 31A:
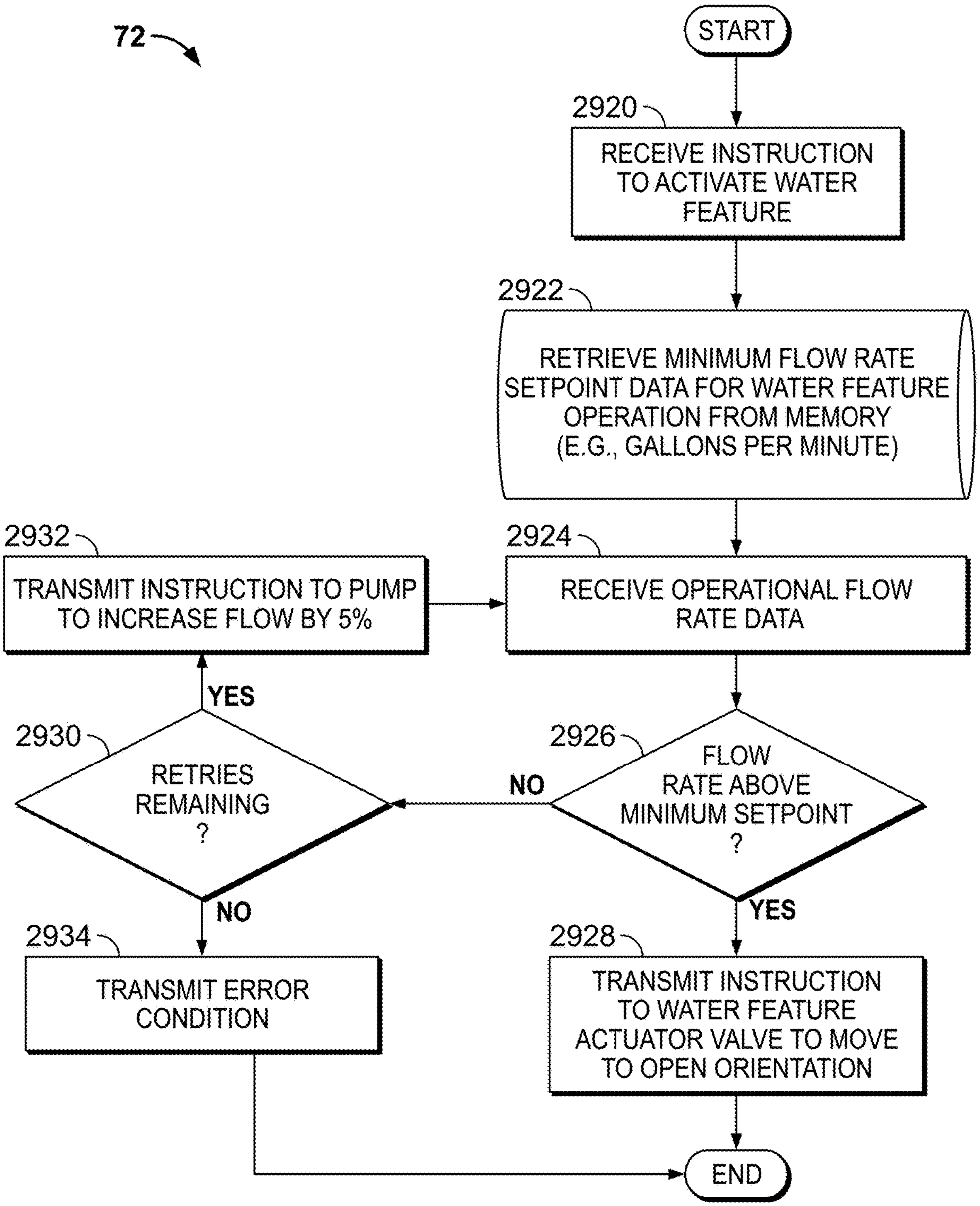
FIGS. 31A-31F are flowcharts illustrating processing steps of the water feature control logic of FIG. 3.

FIGS. 31A-31F are flowcharts illustrating processing steps of the water feature control logic 72. FIG. 31A is a flowchart illustrating processing steps of the water feature control logic 72. In step 2920, the water feature control logic 72 receives instructions to activate a water feature. In step 2922, the water feature control logic 72 retrieves minimum flow rate setpoint data for water feature operation from a memory (e.g., gallons per minute). In step 2924, the water feature control logic 72 receives operational flow rate data. In step 2926, the water feature control logic 72 determines whether the flow rate is above a minimum setpoint. If a positive determination is made in step 2926, then in step 2928, the water feature control logic 72 transmits instructions to the water feature actuator valve to move to an open orientation, and the process ends. If a negative determination is made in step 2926, then in step 2930, the water feature control logic 72 determines whether there are any retries remaining. If a positive determination is made in step 2930, then in step 2932, the water feature control logic 72 transmits instructions to the pump to increase flow (e.g., by 5%), and the process reverts to step 2924. If a negative determination is made in step 2930, then in step 2934, the water feature control logic 72 transmits an error condition, and the process ends.

Figure 31B:
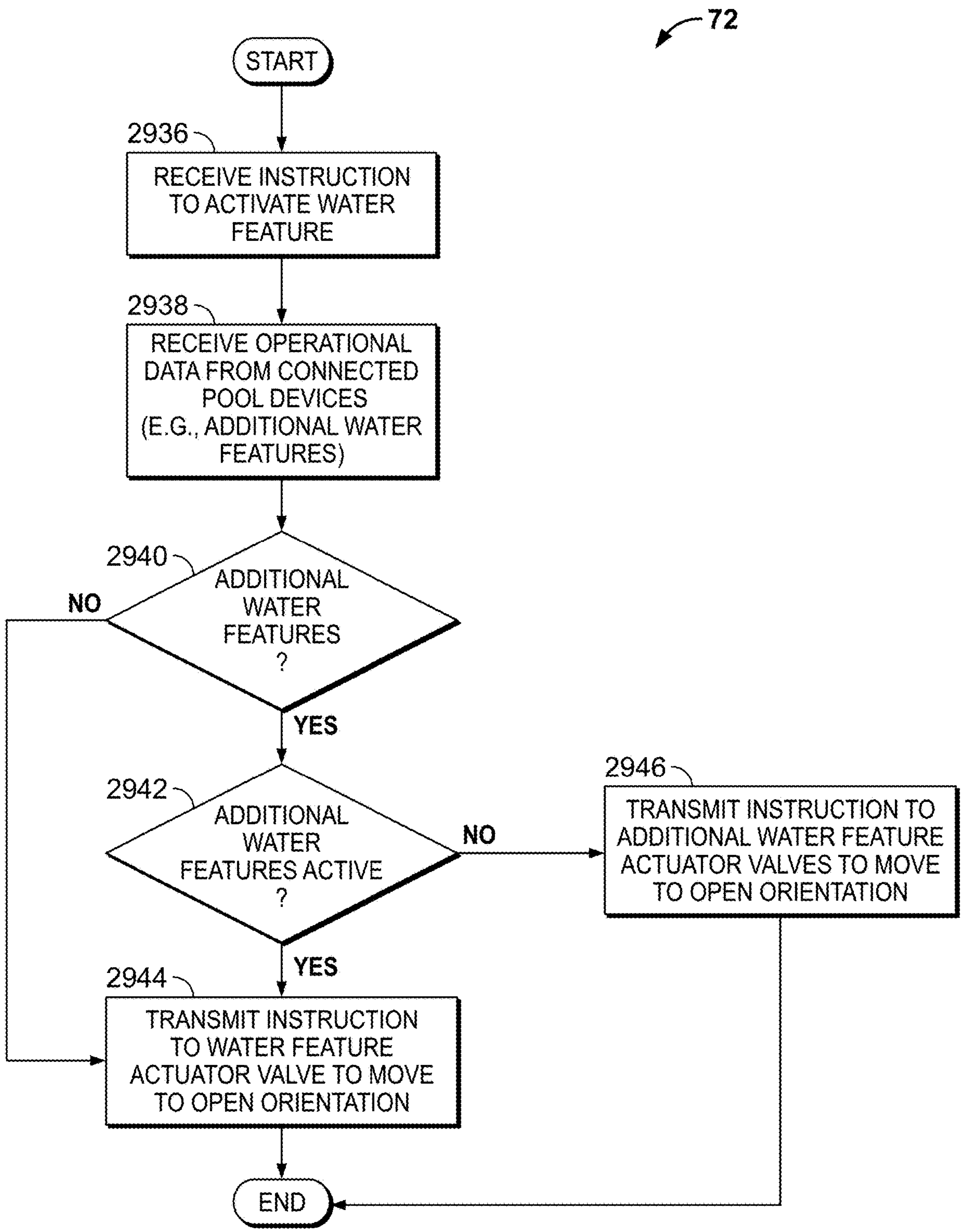

FIG. 31B is a flowchart illustrating processing steps of the water feature control logic 72. In step 2936, the water feature control logic 72 receives instructions to activate a water feature. In step 2938, the water feature control logic 72 receives operational data from connected pool devices (e.g., additional water features). In step 2940, the water feature control logic 72 determines whether there are additional water features. If a positive determination is made in step 2940, then in step 2942, the water feature control logic 72 determines whether additional water features are active. If a positive determination is made in step 2942, then in step 2944, the water feature control logic 72 transmits instructions to the water feature actuator valve to move to an open orientation, and the process ends. If a negative determination is made in step 2942, then in step 2946, the water feature control logic 72 transmits instruction to additional water feature actuator valves to move to the open orientation, and the process ends. If a negative determination is made in step 2940, then the process proceeds to step 2944 (as discussed above).

Figure 31C:
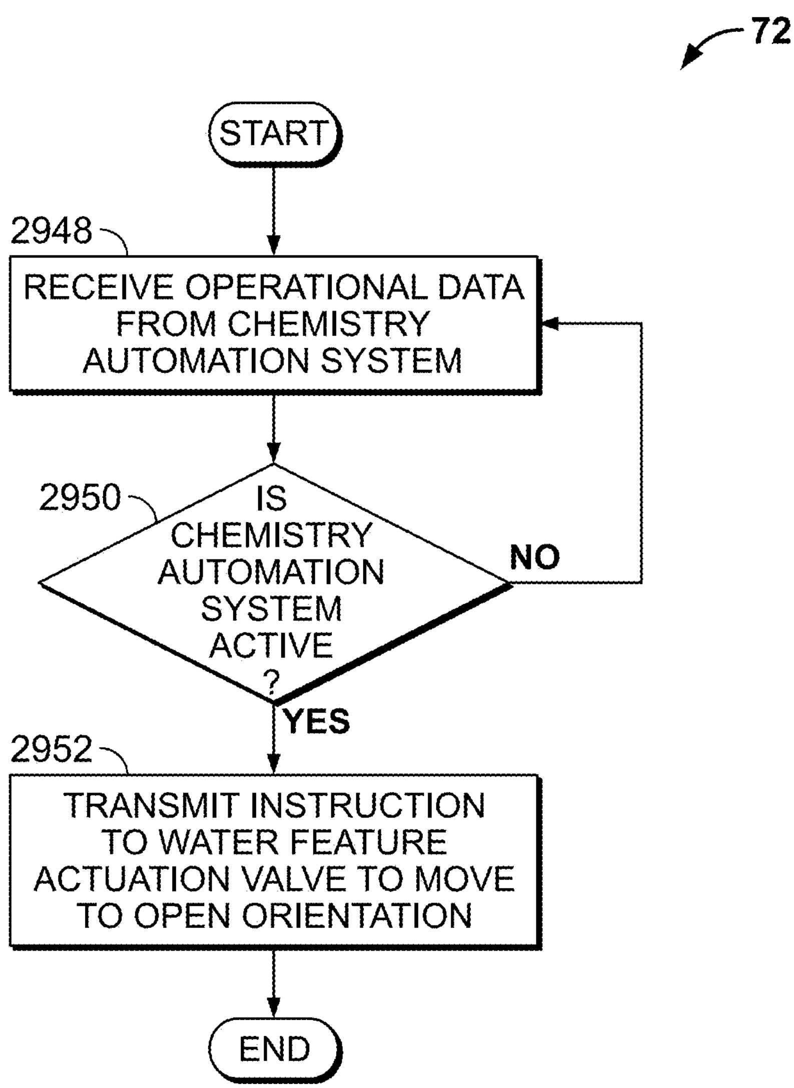

FIG. 31C is a flowchart illustrating processing steps of the water feature control logic 72. In step 2948, the water feature control logic 72 receives operational data from chemistry automation system. In step 2950, the water feature control logic 72 determines if the chemistry automation system is active. If a negative determination is made in step 2950, then the process reverts to step 2948. If a positive determination is made in step 2950, then in step 2952, the water feature control logic 72 transmits instructions to the water feature actuation valve to move to the open orientation.

Figure 31D:
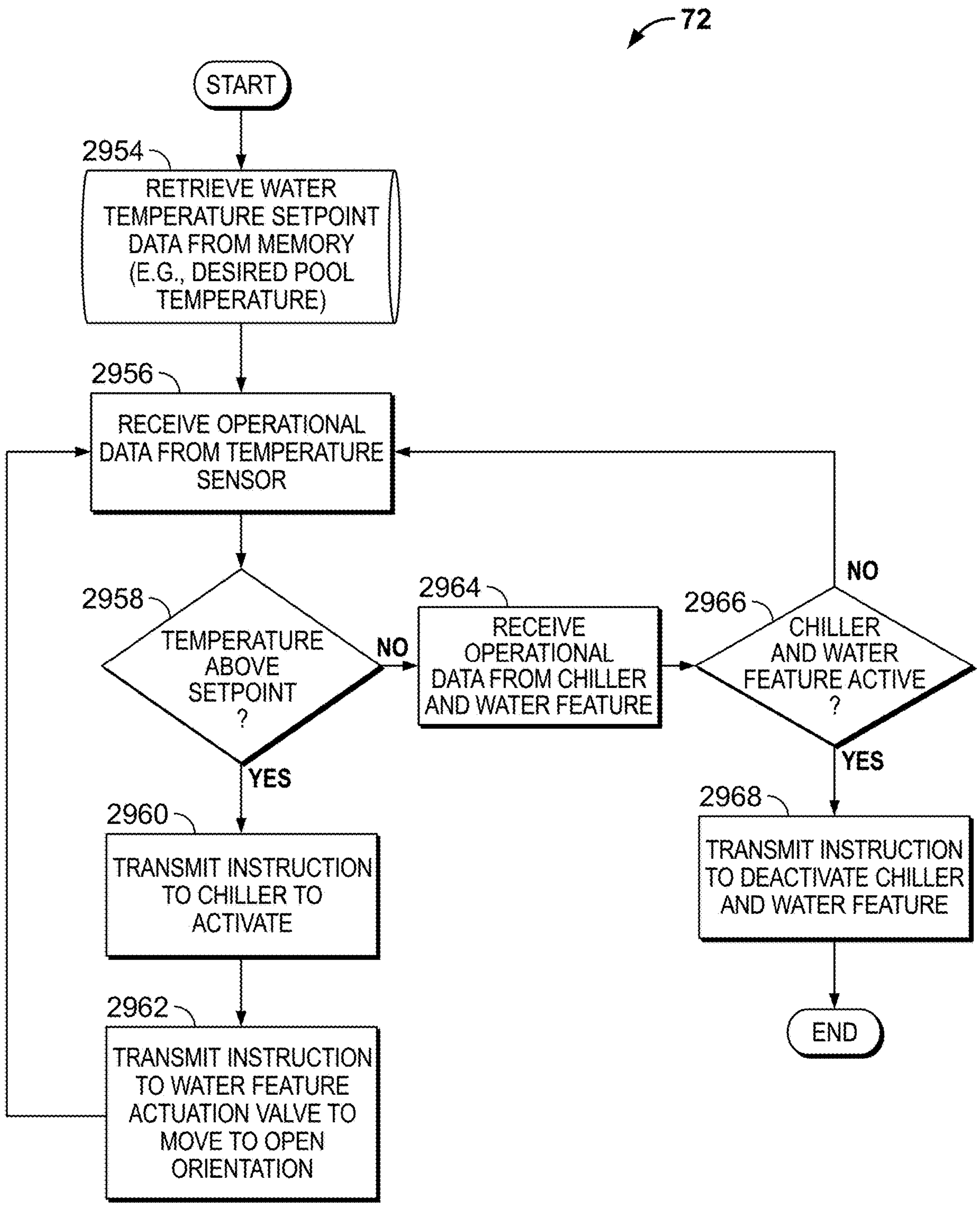

FIG. 31D is a flowchart illustrating processing steps of the water feature control logic 72. In step 2954, the water feature control logic 72 retrieves water temperature setpoint data from memory (e.g., desired pool temperature). In step 2956, the water feature control logic 72 receives operational data from a temperature sensor. In step 2958, the water feature control logic 72 determines whether the temperature is above a setpoint. If a positive determination is made in step 2958, then in step 2960, the water feature control logic 72 transmits instructions to the chiller to activate. In step 2962, the water feature control logic 72 transmits instructions to the water feature actuation valve to move to the open orientation, and the process reverts to step 2956. If a negative determination is made in step 2958, then in step 2964, the water feature control logic 72 receives operational data from chiller and water feature. In step 2966, the water feature control logic 72 determines whether the chiller and water feature are active. If a negative determination is made in step 2966, then the process reverts to step 2956. If a positive determination is made in step 2966, then in step 2968, the water feature control logic 72 transmits instruction to deactivate the chiller and water feature.

Figure 31E:
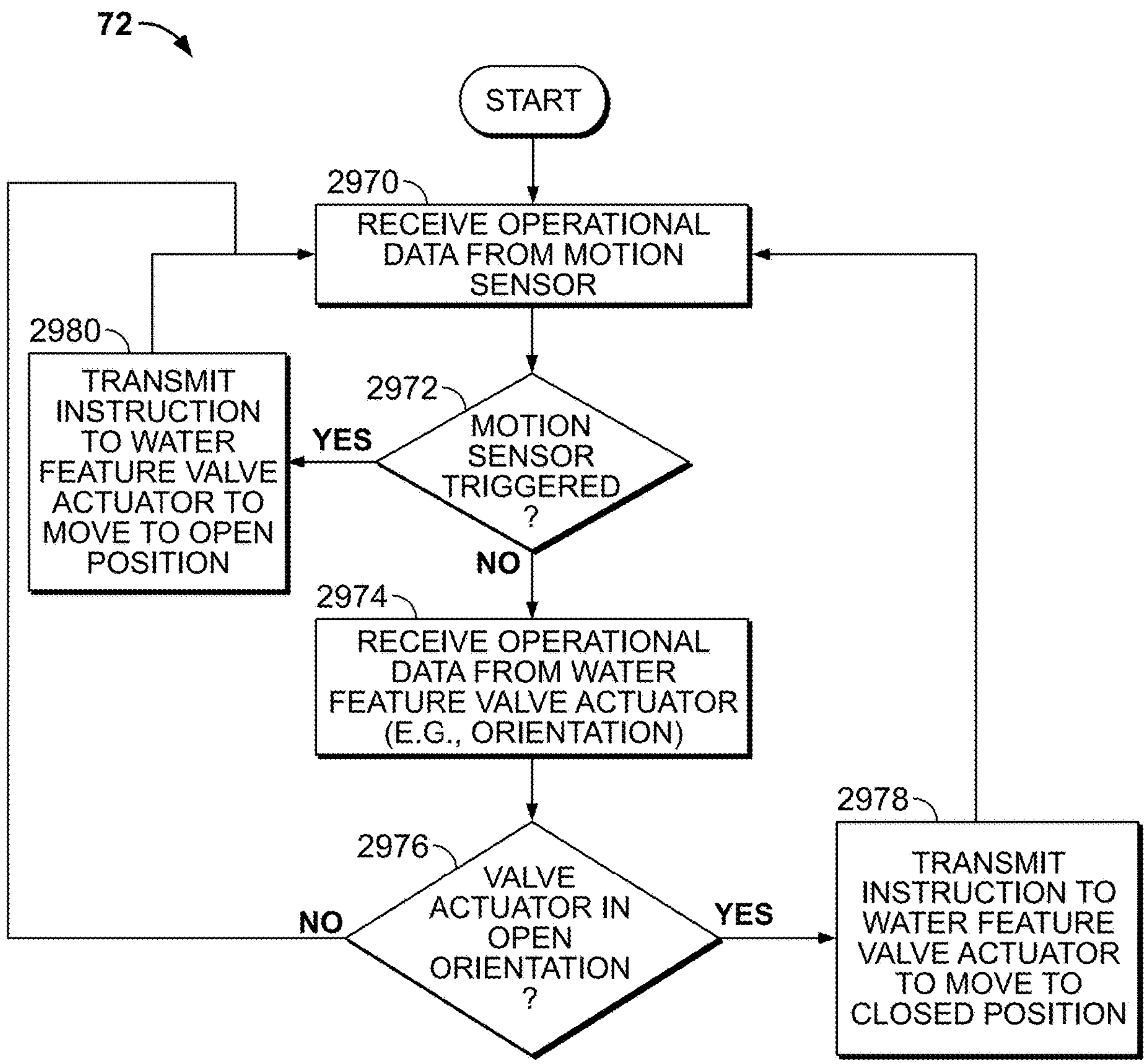

FIG. 31E is a flowchart illustrating processing steps of the water feature control logic 72. In step 2970, the water feature control logic 72 receives operational data from a motion sensor. In step 2972, the water feature control logic 72 determines whether the motion sensor is triggered. If a positive determination is made in step 2972, then in step 2980, the water feature control logic 72 transmits instruction to the water feature valve actuator to move to the open position, and the process reverts to step 2970. If a negative determination is made in step 2972, then in step 2974, the water feature control logic 72 receives operational data from a water feature valve actuator (e.g., orientation). In step 2976, the water feature control logic 72 determines whether the valve actuator is in the open orientation. If a negative determination is made in step 2976, the process reverts to step 2970. If a positive determination is made in step 2976, then in step 2978, the water feature control logic 72 transmits instruction to the water feature valve actuator to move to the closed position, and the process reverts to step 2970.

Figure 31F:
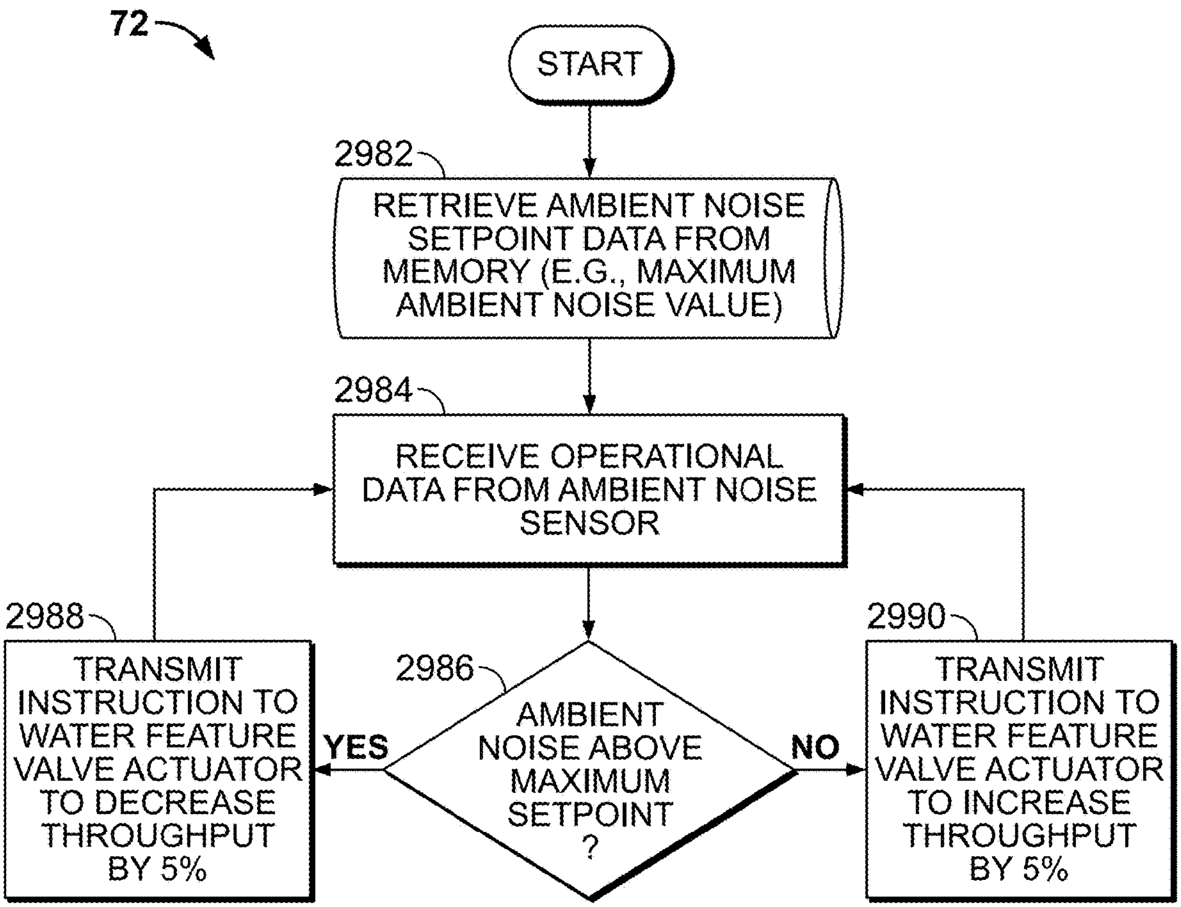

FIG. 31F is a flowchart illustrating processing steps of the water feature control logic 72. In step 2982, the water feature control logic 72 retrieves ambient noise setpoint data from memory (e.g., maximum ambient noise value). In step 2984, the water feature control logic 72 receives operational data from an ambient noise sensor. In step 2986, the water feature control logic 72 determines whether the ambient noise is above a maximum setpoint. If a positive determination is made in step 2986, then in step 2988, the water feature control logic 72 transmits instruction to water feature valve actuator to decrease throughput (e.g., by 5%), and the process reverts to step 2984. If a negative determination is made in step 2986, then in step 2990, the water feature control logic 72 transmits instruction to the water feature valve actuator to increase throughput (e.g., by 5%), and the process reverts to step 2984.

It is noted that the water feature control logic illustrated in FIGS. 31A-31F and discussed above could be used to control a pool/spa water feature that does not have on-board electronic controls, such as, for example, a conventional water feature. In such instances, control of the water feature could be implemented by way of a valve actuator that has an associated processor and network connectivity, such as the valve actuator discussed herein in connection with FIGS. 28-29I. The valve actuator would be in fluid communication with the water feature, and the control logic discussed in connection with FIGS. 27A-27O would be applied to control the valve actuator to correspondingly control operation of the water feature.

Figure 32:
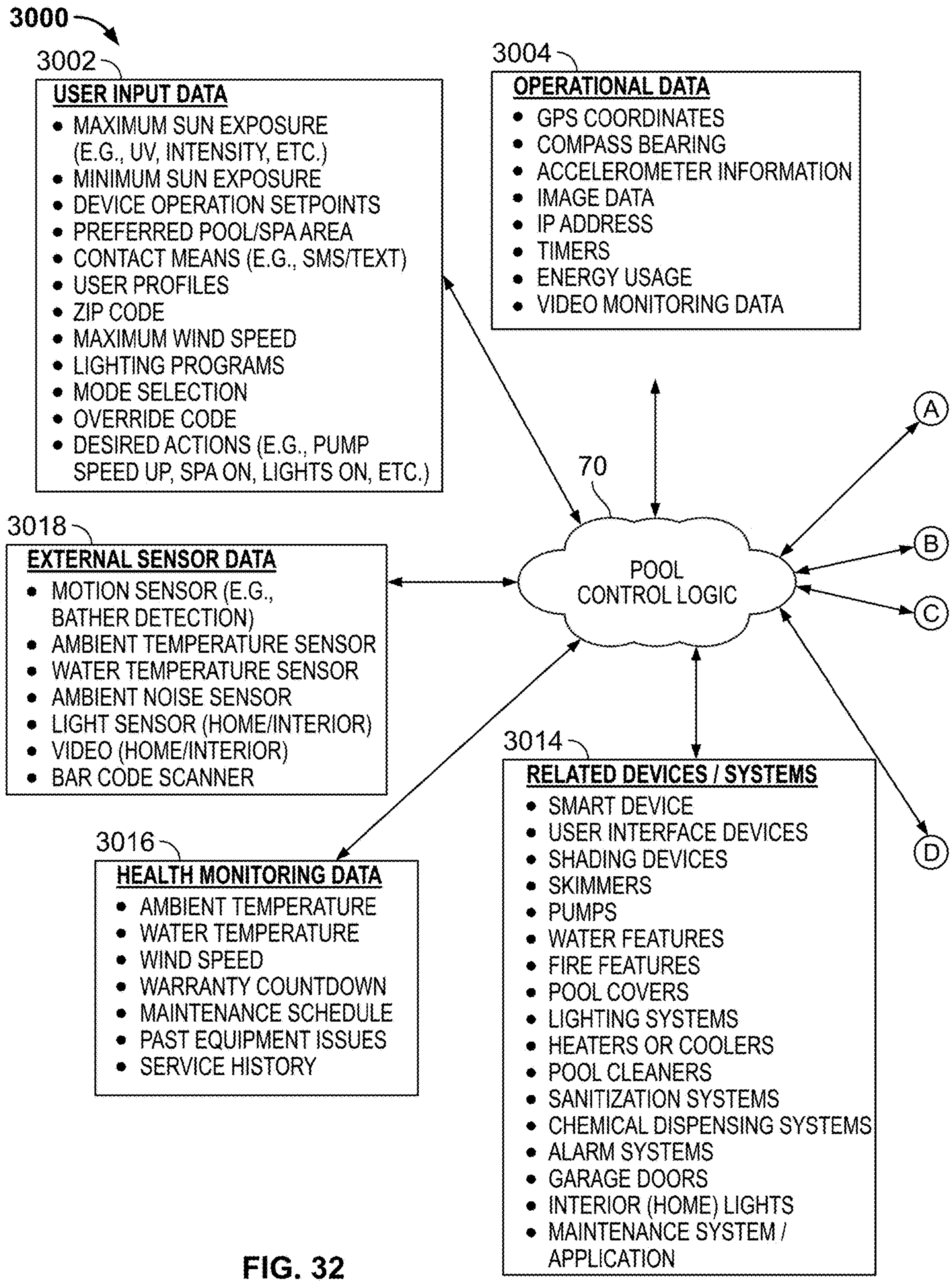
FIG. 32 is a diagram illustrating pool control logic of FIG. 3.
Figure 32:
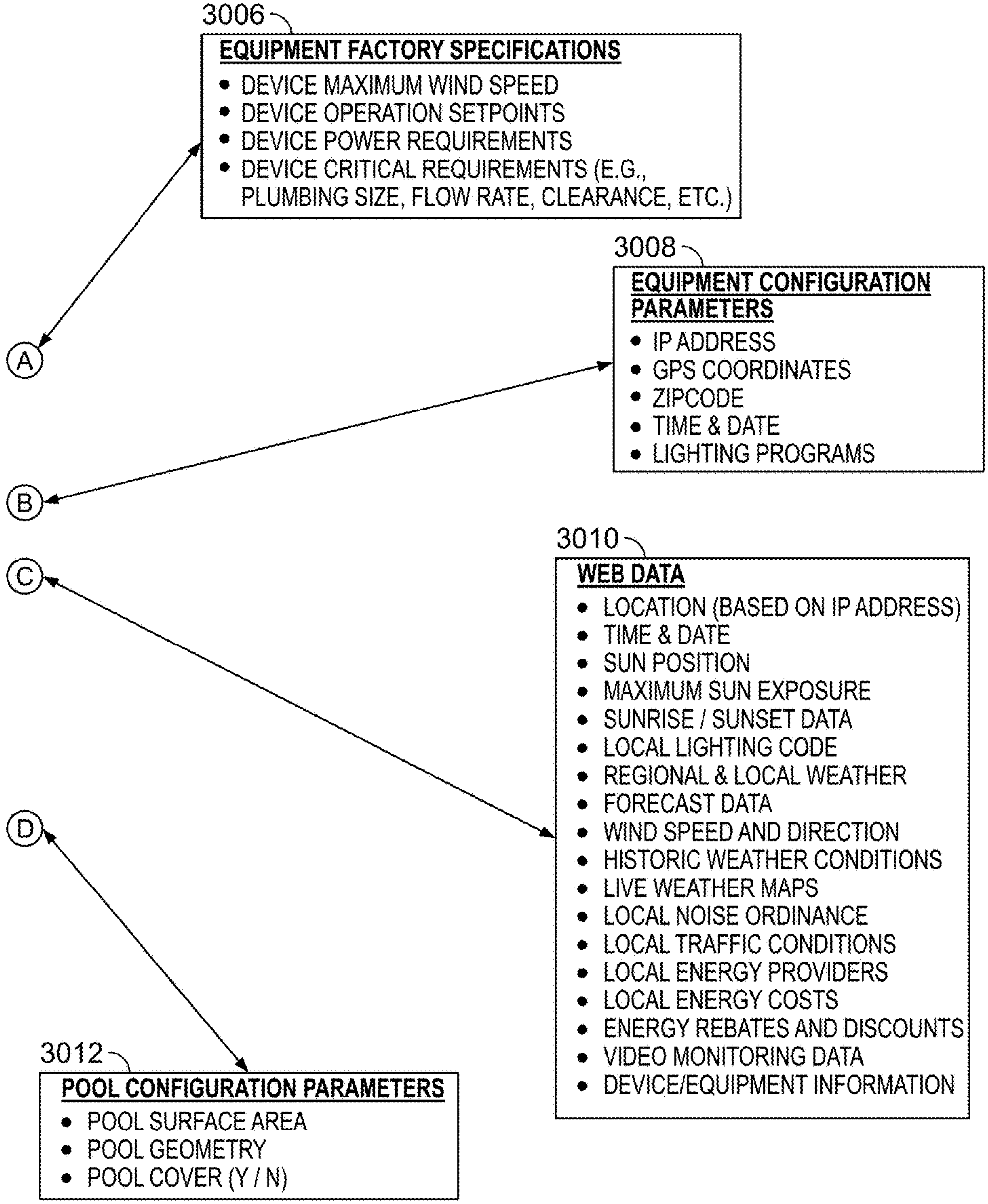

FIG. 32 is a diagram 3000 illustrating another embodiment of pool control logic 70. Pool control logic 70 could incorporate a variety of types of data and/or data sources in addition to those discussed hereinabove. More specifically, pool control logic 70 could process user input data 3002, operational data 3004, equipment factory specifications 3006, equipment configuration parameters 3008, web data 3010, pool configuration parameters 3012, data from related devices 3014, health monitoring data 3016, and/or external sensor data 3018.

User input data 3002, could include maximum sun exposure (e.g., UV, intensity, etc.), minimum sun exposure, device operation setpoints, preferred pool/spa area, contact means (e.g., SMS/text), user profiles, zip code, maximum wind speed setpoint, lighting programs, mode selection, override code, and desired actions (e.g., pump speed up, spa on, lights on, etc.). Operational data 3004 could include GPS coordinates, compass bearing, accelerometer information, image data, IP address, timers, energy usage, and video monitoring data. Equipment factory specifications 3006 could include device maximum wind speed, device operation setpoints, device power requirements, and device critical requirements (e.g., plumbing size, flow rate, clearance, etc.). Equipment configuration parameters 3008 could include IP address, GPS coordinates, ZIP code, time and date, lighting programs, etc. Web data 3010 could include location (based on IP address), time & date, sun position, maximum sun exposure, sunrise/sunset data, local lighting code, regional & local weather, forecast data, wind speed and direction, historic weather conditions, live weather maps, local noise ordinance, local traffic conditions, local energy providers, local energy costs, energy rebates and discounts, video monitoring data, device/equipment information, etc. Pool configuration parameters 3012 could include, pool surface area, pool geometry, pool cover (e.g., yes, no), etc. Related devices/systems 3014 could include smart devices, user interface devices, shading devices, skimmers, pumps, water features, fire features, pool covers, lighting systems, heaters or coolers, pool cleaners, sanitization systems, chemical dispensing systems, alarm systems, garage doors, interior (home) lights, maintenance system/application, etc. Health monitoring data 3016 could include ambient temperature, water temperature, wind speed, warranty countdown, maintenance schedule, past equipment issues, service history, etc. External sensor data 3018 could include motion sensors (e.g., bather detection), ambient temperature sensors, water temperature sensors, ambient noise sensors, light sensors (home/interior), video (home/interior), bar code scanners, etc. While it may be desirable for external sensors to monitor/provide data on as many system parameters as possible (thereby providing greater optimization, automation, and user/operator comfort), it is contemplated that some systems need not utilize an external sensor to monitor every system parameter. For example, if a temperature sensor has not been installed in a particular system, the user/operator can provide this information by first determining the temperature (e.g., by checking a thermometer, a thermocouple, a weather forecast, the internet, etc.) and then entering the temperature into the system via a user interface.

Figure 33A:
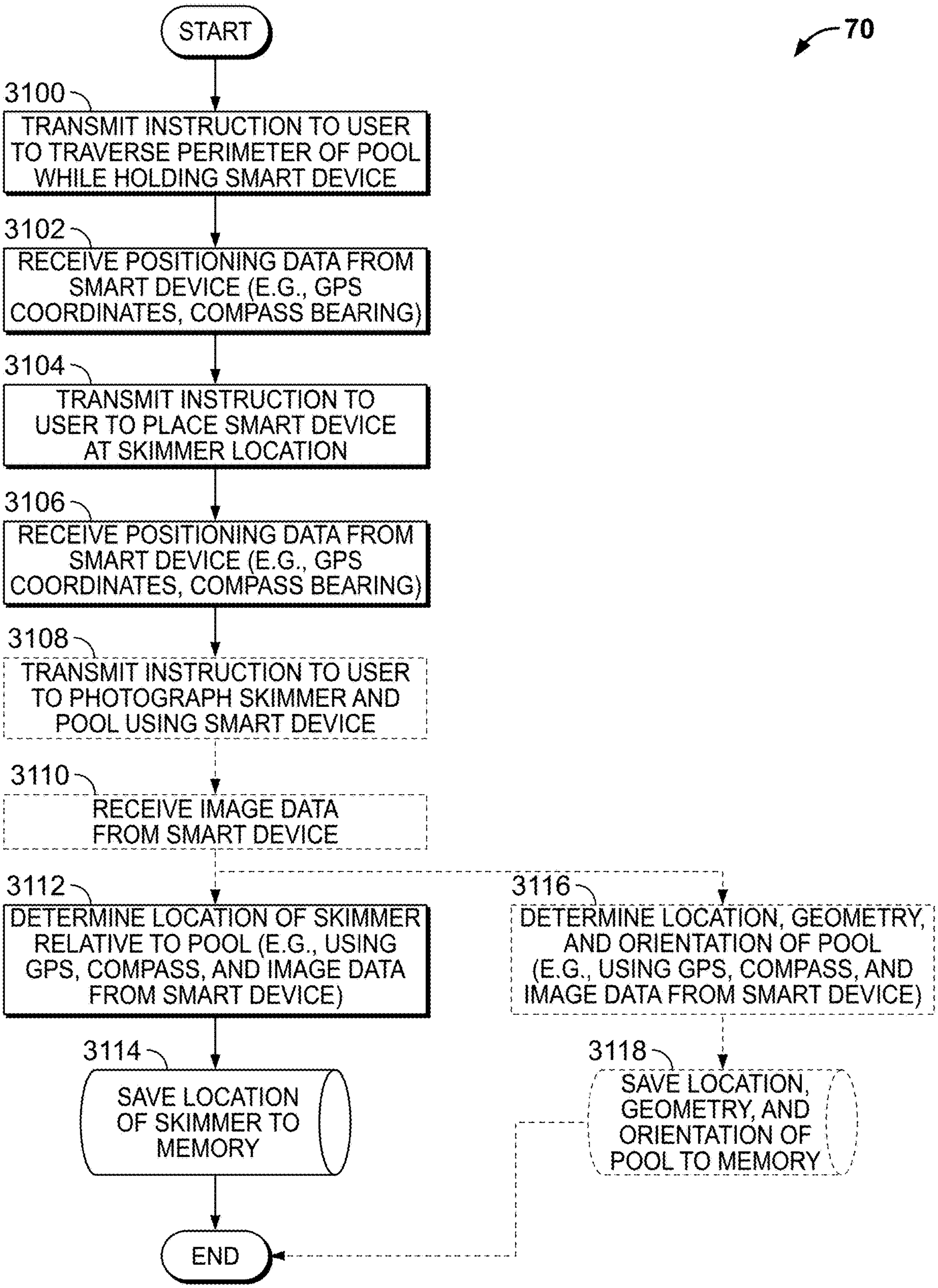
FIGS. 33A-33AH are flowcharts illustrating processing steps of the pool control logic of FIG. 3.

FIGS. 33A-33AH are flowcharts illustrating additional processing steps of the pool control logic 70 carried out with respect to related devices, systems, and applications. FIG. 33A is a flowchart illustrating processing steps of the pool control logic 70 for determining locations of skimmers and/or the pool/spa to account for wind, sun, or other external factors. In step 3100, the pool control logic 70 transmits an instruction to the user to traverse the perimeter of the pool while holding the smart device. In step 3102, the pool control logic 70 receives positioning data (e.g., GPS coordinates, compass bearing, etc.) from the smart device as the user traverses the pool. In step 3104, the pool control logic 70 transmits an instruction to the user to place the smart device at a skimmer location. In step 3106, the pool control logic 70 receives positioning data (e.g., GPS coordinates, compass bearing, accelerometer information, etc.) from the smart device placed at the skimmer location. Optionally, to enable higher accuracy in locating the skimmer and/or pool/spa, in step 3108, the pool control logic 70 transmits an instruction to the user to photograph the skimmer and pool using the smart device and in step 3110, the pool control logic 70 receives image data from the smart device. In step 3112, the pool control logic 70 determines the location of the skimmer relative to the pool (e.g., using GPS, compass, accelerometer information, and/or image data provided by the smart device). In step 3114, pool control logic 70 saves the location of the skimmer to memory for later retrieval, described hereinbelow in connection with FIG. 33G. Optionally, in step 3116 pool control logic can also determine the location, geometry, and orientation of the pool/spa (e.g., using GPS, compass, accelerometer information, and/or image data from the smart device) and in step 3118, pool control logic 70 could save the location, geometry, and orientation of the pool/spa to memory for later retrieval, described hereinbelow in connection with FIG. 33L.

Figure 33B:
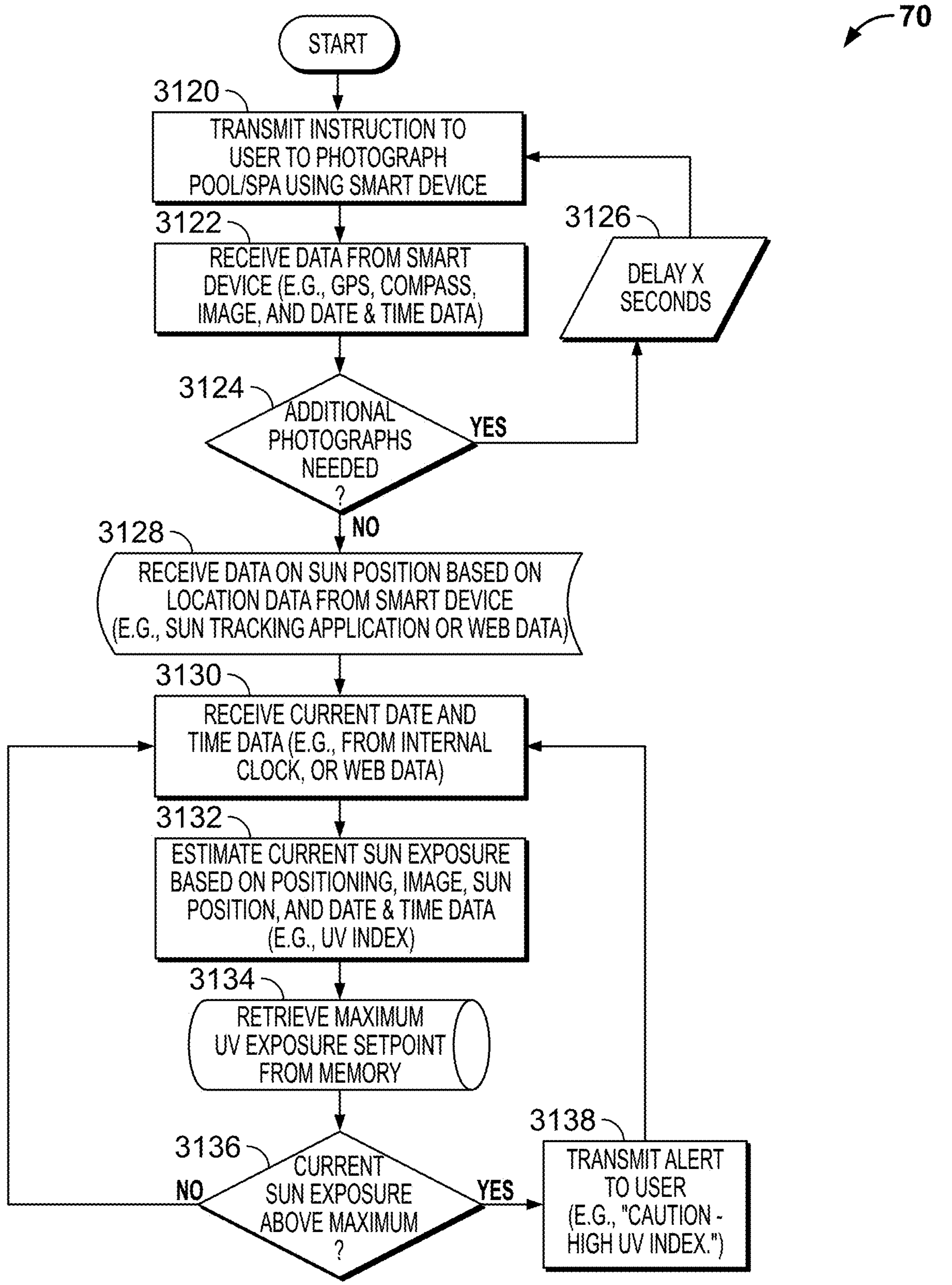

FIG. 33B is a flowchart illustrating processing steps carried out by the pool control logic 70 for estimating sun exposure and alerting the user to the same. In step 3120, pool control logic 70 transmits an instruction to the user to photograph the pool/spa using a smart device. In step 3122, pool control logic 70 receives data from the smart device (e.g., GPS, compass, image, date and time data, etc.). In step 3124, pool control logic 70 determines if additional photographs are needed (e.g., multiple photographs could be taken at various times during the day). If a positive determination is made, pool control logic 70 proceeds to step 3126, where the logic is delayed for X seconds, wherein X is any suitable integer (e.g., 5, 10, 3600, etc.), and the process then reverts to step 3120. If a negative determination is made, the process proceeds to step 3128, where pool control logic 70 receives data on sun position (e.g., from sun tracking application or web data) based on location data from the smart device. In step 3130, pool control logic 70 receives current date and time data (e.g., from internal clock or as web data). In step 3132, pool control logic estimates the current sun exposure (e.g., ultraviolet "UV" index) based on location, image, sun position, and date and time data. In step 3134, pool control logic 70 retrieves a maximum UV exposure setpoint from the memory. The maximum UV exposure setpoint could be provided by the user, or retrieved as web data provided by a recognized health organization. In step 3136, pool control logic 70 determines if the current sun exposure is above the maximum UV exposure setpoint. If a positive determination is made, the process proceeds to step 3138, where pool control logic 70 transmits an alert to the user (e.g., "Caution—High UV Index"). If a negative determination is made, the process reverts to step 3130.

Figure 33C:
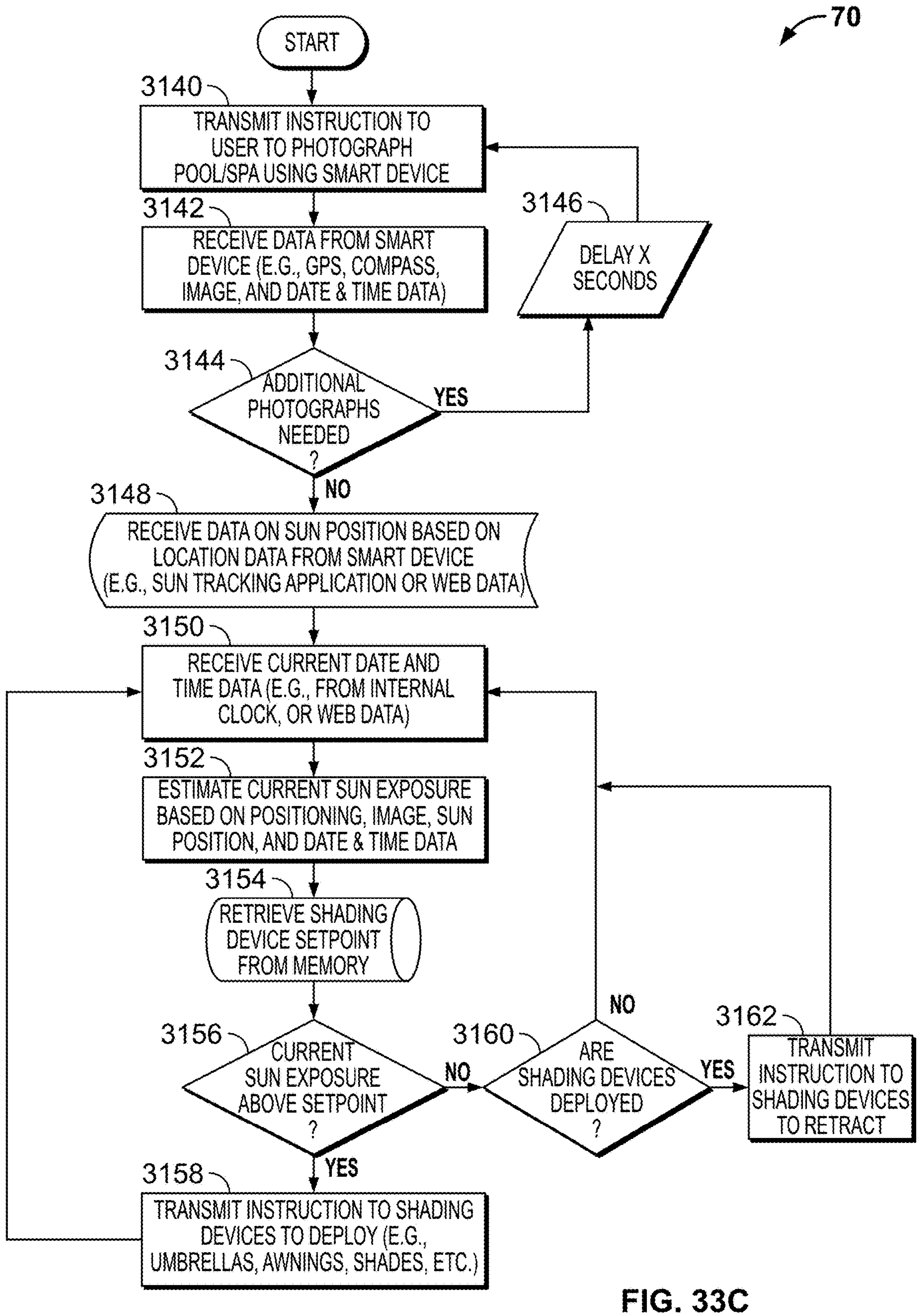

FIG. 33C is a flowchart illustrating processing steps carried out by the pool control logic 70 for automatically deploying shading devices (e.g., umbrellas, awnings, shades, etc.) based on estimated sun exposure. In step 3140, pool control logic 70 transmits an instruction to the user to photograph the pool/spa using a smart device. In step 3142, pool control logic 70 receives data from the smart device (e.g., GPS, compass, image, date and time data, etc.). In step 3144, pool control logic 70 determines if additional photographs are needed (e.g., multiple photographs could be taken at various times during the day). If a positive determination is made, pool control logic 70 proceeds to step 3146, where the logic is delayed for X seconds, wherein X is any suitable integer (e.g., 5, 10, 3600, etc.), and the process then reverts to step 3140. If a negative determination is made, the process proceeds to step 3148, where pool control logic 70 receives data on sun position (e.g., from sun tracking application or web data) based on location data from the smart device. In step 3150, pool control logic 70 receives current date and time data (e.g., from internal clock or as web data). In step 3152, pool control logic 70 estimates the current sun exposure (e.g., ultraviolet "UV" index, sun intensity, etc.) based on location, image, sun position, and date and time data. In step 3154, pool control logic 70 retrieves a shading device setpoint from the memory. The shading device setpoint is a sun exposure value for triggering operation of the shading devices, and could be provided by the user, as a configuration parameter, or retrieved as web data. In step 3156, pool control logic 70 determines if the current estimated sun exposure is above the shading device setpoint. If a positive determination is made, the process proceeds to step 3158, where pool control logic 70 transmits an instruction to the shading devices to deploy and then reverts to step 3150. If a negative determination is made, the process proceeds to step 3160, where pool control logic 70 determines if the shading devices are deployed. If a negative determination is made, the process reverts to step 3150. If a positive determination is made, the process proceeds to step 3162, where pool control logic 70 transmits an instruction to the shading devices to retract and then reverts to step 3150.

Figure 33D:
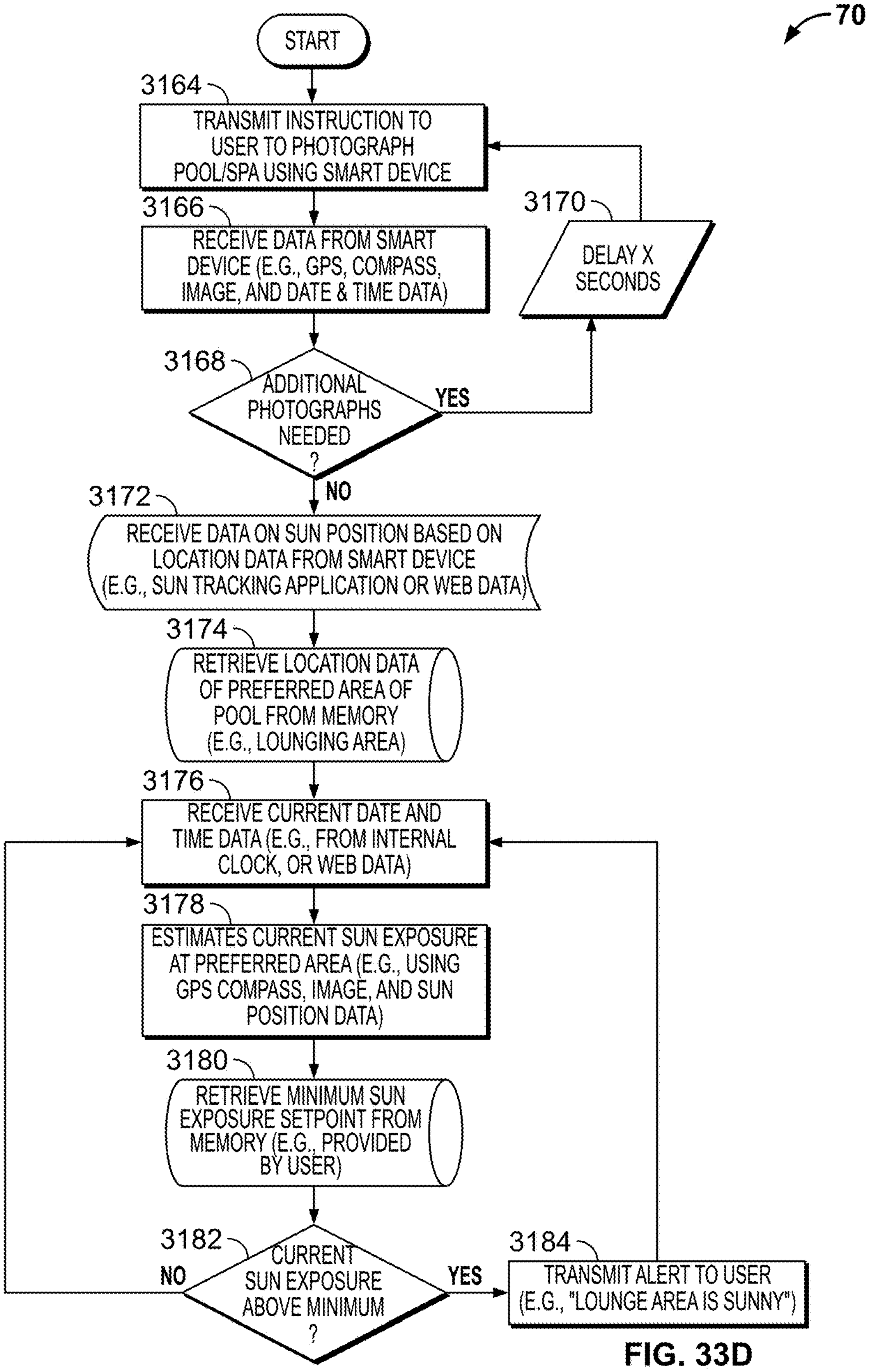

FIG. 33D is a flowchart illustrating processing steps carried out by the pool control logic 70 for notifying a user of sun conditions at a preferred area of the pool (e.g., lounging area). In step 3164, pool control logic 70 transmits an instruction to the user to photograph the pool/spa using a smart device. In step 3166, pool control logic 70 receives data from the smart device (e.g., GPS, compass, image, date and time data, etc.). In step 3168, pool control logic 70 determines if additional photographs are needed (e.g., multiple photographs could be taken at various times during the day). If a positive determination is made, pool control logic 70 proceeds to step 3170, where the logic is delayed for X seconds, wherein X is any suitable integer (e.g., 5, 10, 3600, etc.), and the process then reverts to step 3164. If a negative determination is made, the process proceeds to step 3172, where pool control logic 70 receives data on sun position (e.g., from sun tracking application or web data) based on location data from the smart device. In step 3174, pool control logic 70 retrieves location data of a preferred area of the pool from the memory. The location data of the preferred area of the pool can be obtained by way of a similar process, as described herein, in connection with FIG. 33A (e.g., process for determining skimmer location). In some embodiments, multiple users could specify one or more preferred areas of the pool/spa area. In step 3176, the pool control logic 70 receives current date and time data (e.g., from internal clock, or as web data). In step 3178, pool control logic 70 estimates the current sun exposure at the preferred area (e.g., using GPS, compass, image, and sun positioning data). In step 3180, pool control logic 70 retrieves a minimum sun exposure setpoint (e.g., minimum UV index or sun intensity) from the memory. In step 3182, pool control logic 70 determines if the current estimated sun exposure is above the minimum sun exposure setpoint. If a negative determination is made, the process reverts to step 3176. If a positive determination is made, the process proceeds to step 3184, where pool control logic 70 transmits an alert to the user (e.g., "Lounge Area is Sunny"). In some embodiments, multiple users can create profiles containing their preferred areas of the pool and a means for receiving alerts. For example, a user could create a profile with two preferred areas of the pool, name the preferred areas of the pool (e.g., "lounge area," "spa area," etc.) and pool control logic 70 could sent the user a SMS/text message when either of the preferred areas are sunny. It is also noted that pool control logic 70 could collect historical usage data for each user and save the data (e.g., to the memory) to individual user profiles for later retrieval and use.

Figure 33E:
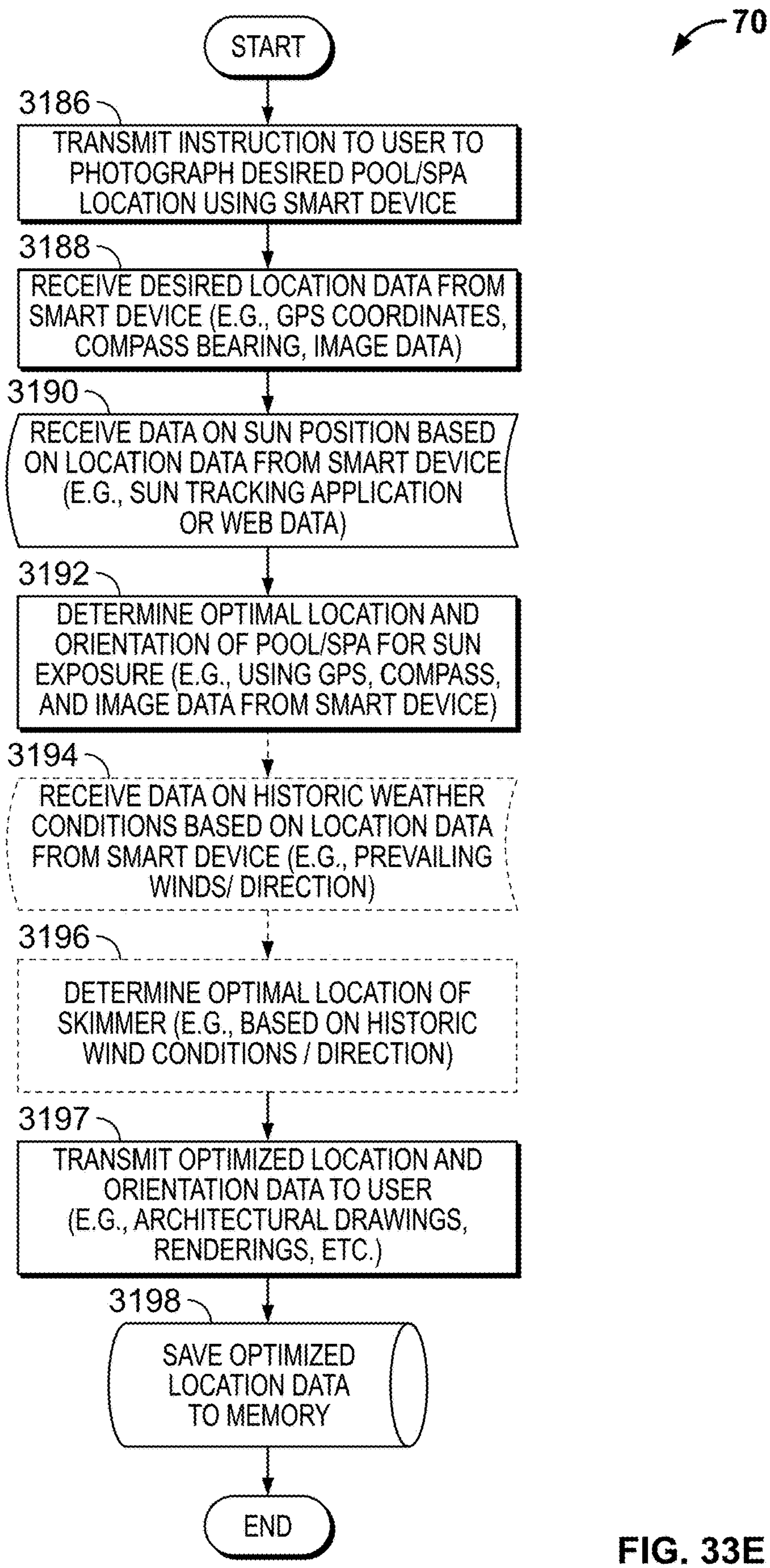

FIG. 33E is a flowchart illustrating processing steps carried out by the pool control logic 70 for planning the optimal placement of a pool/spa prior to installation. In step 3186, pool control logic 70 transmits an instruction to the user to photograph a desired pool/spa location using a smart device. In step 3188, pool control logic 70 receives desired location data from the smart device (e.g., GPS coordinates, compass bearing, image data, etc.). In step 3190, pool control logic 70 receives data on sun position (e.g., data from sun tracking application or as web data), based on the location data from the smart device. In step 3192, pool control logic 70 determines the optimal location and orientation of the pool/spa for ideal sun exposure (e.g., using GPS, compass, and image data from smart device). Optionally, in step 3194, pool control logic 70 receives data on historic weather conditions (e.g., prevailing winds, speed, direction, etc.) based on the location data from the smart device and in step 3196, pool control logic 70 determines the optimal location of a skimmer (e.g., based on historic wind conditions/direction). In step 3197, pool control logic 70 transmits the optimized location and orientation data to the user (e.g., in the form of architectural drawings, renderings, etc.). In step 3198, pool control logic 70 saves the optimized location data to the memory for later retrieval.

Figure 33F:
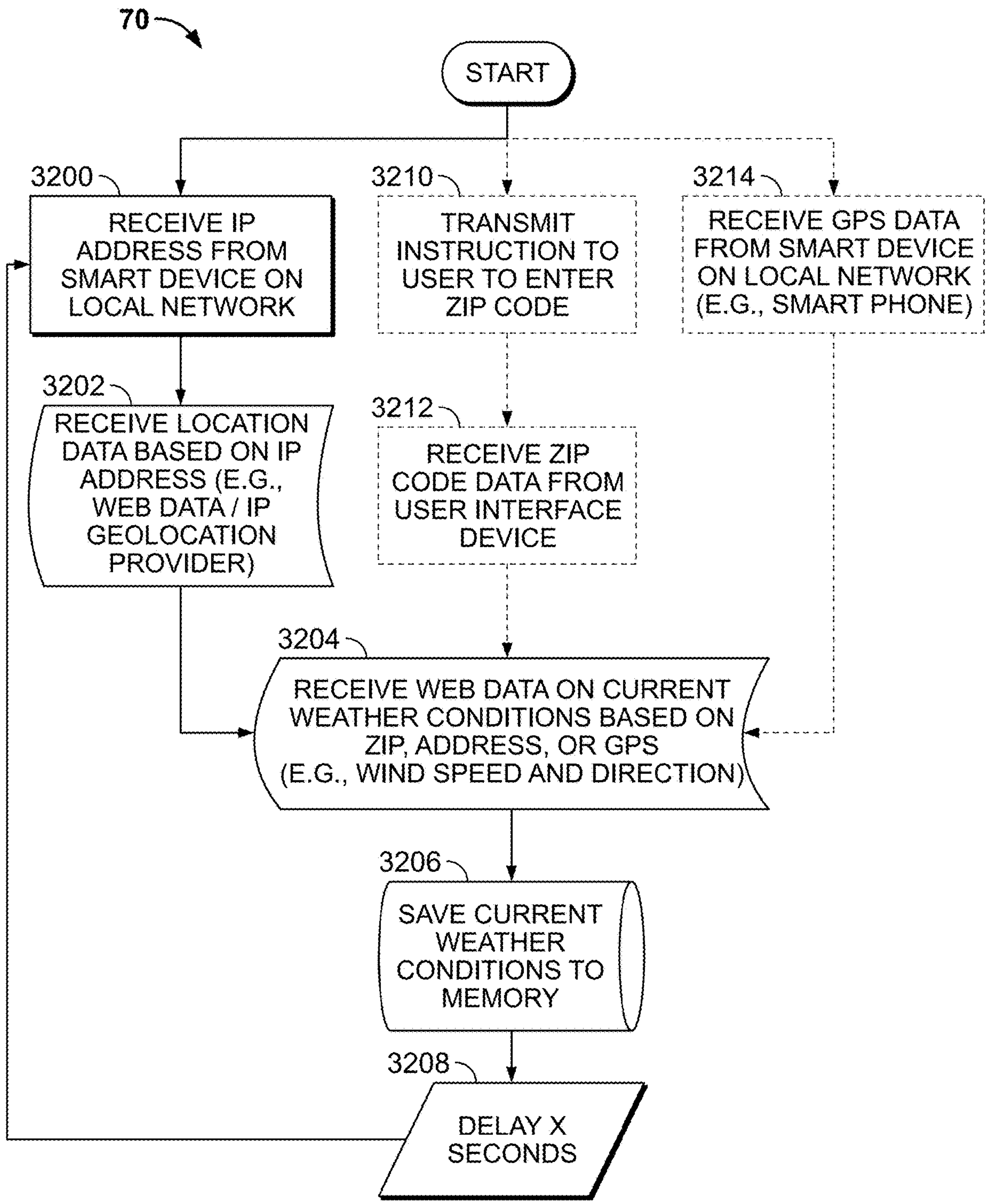

FIG. 33F is a flowchart illustrating processing steps carried out by the pool control logic 70 for determining current weather conditions. In step 3200, pool control logic 70 receives an IP address from a smart device on a local network. In step 3202, pool control logic 70 receives location data based on the IP address (e.g., web data/geolocation provider). In step 3204, pool control logic 70 receives web data on current weather conditions (based on ZIP code, location/address, or GPS coordinates, discussed hereinbelow). Current weather conditions can include, for example, temperature, precipitation, wind speed, wind direction, etc. Web data on current weather conditions could also include live 3$^{rd}$ party data, for example, live weather maps of precipitation and cloud cover. In step 3206, pool control logic 70 saves the current weather conditions to the memory for later retrieval. In step 3208, pool control logic 70 is delayed by X seconds, wherein X is any suitable integer (e.g., 5, 10, 3600, etc.) and then the process returns to step 3200. Optionally, in step 3210, pool control logic 70 could transmit an instruction to the user to enter a ZIP code via a user interface device and in step 3212, pool control logic 70 could receive the ZIP code data from the user interface device. In step 3214, pool control logic 70 could also/alternatively receive GPS data from a smart device on the local network (e.g., smart phone connected to home WiFi.

Figure 33G:
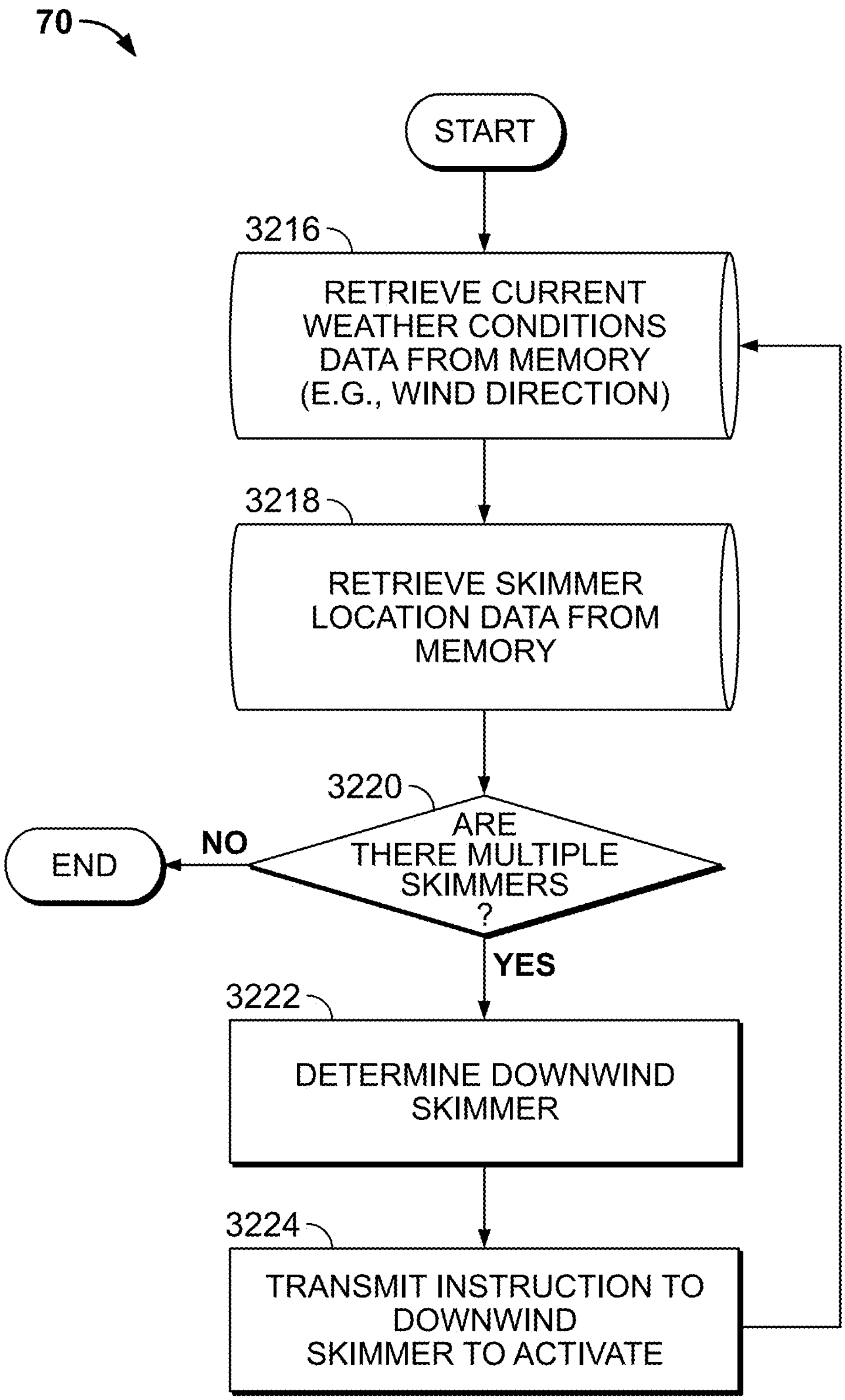

FIG. 33G is a flowchart illustrating processing steps carried out by the pool control logic 70 for selecting a skimmer based on current weather conditions. In step 3216, pool control logic 70 retrieves current weather conditions (e.g., wind direction) data from the memory. The current weather conditions can be obtained by way of the process described herein, in connection with FIG. 33F. In step 3218, pool control logic 70 retrieves skimmer location data from the memory. The skimmer location data can be obtained by way of the process described herein, in connection with FIG. 33A. In step 3220, pool control logic 70 determines if there are multiple skimmers. If a negative determination is made, the process ends. If a positive determination is made, the process proceeds to step 3222, where pool control logic 70 determines the most downwind skimmer (using the location data). In step 3224, pool control logic 70 transmits an instruction to the most downwind skimmer to activate. Pool control logic 70 could also sent an instruction to all other skimmers to deactivate. The process then reverts to step 3216. In some embodiments, pool control logic 70 could transmit an instruction to increase the suction of an upwind skimmer to compensate for the wind conditions or pool control logic 70 could transmit an instruction to decrease the suction of a downwind skimmer to compensate for the increased debris flowing therethrough due to the wind condition. In further embodiments, pool control logic 70 could transmit an instruction to alter the skimmer suction relative to main drain suction.

Figure 33H:
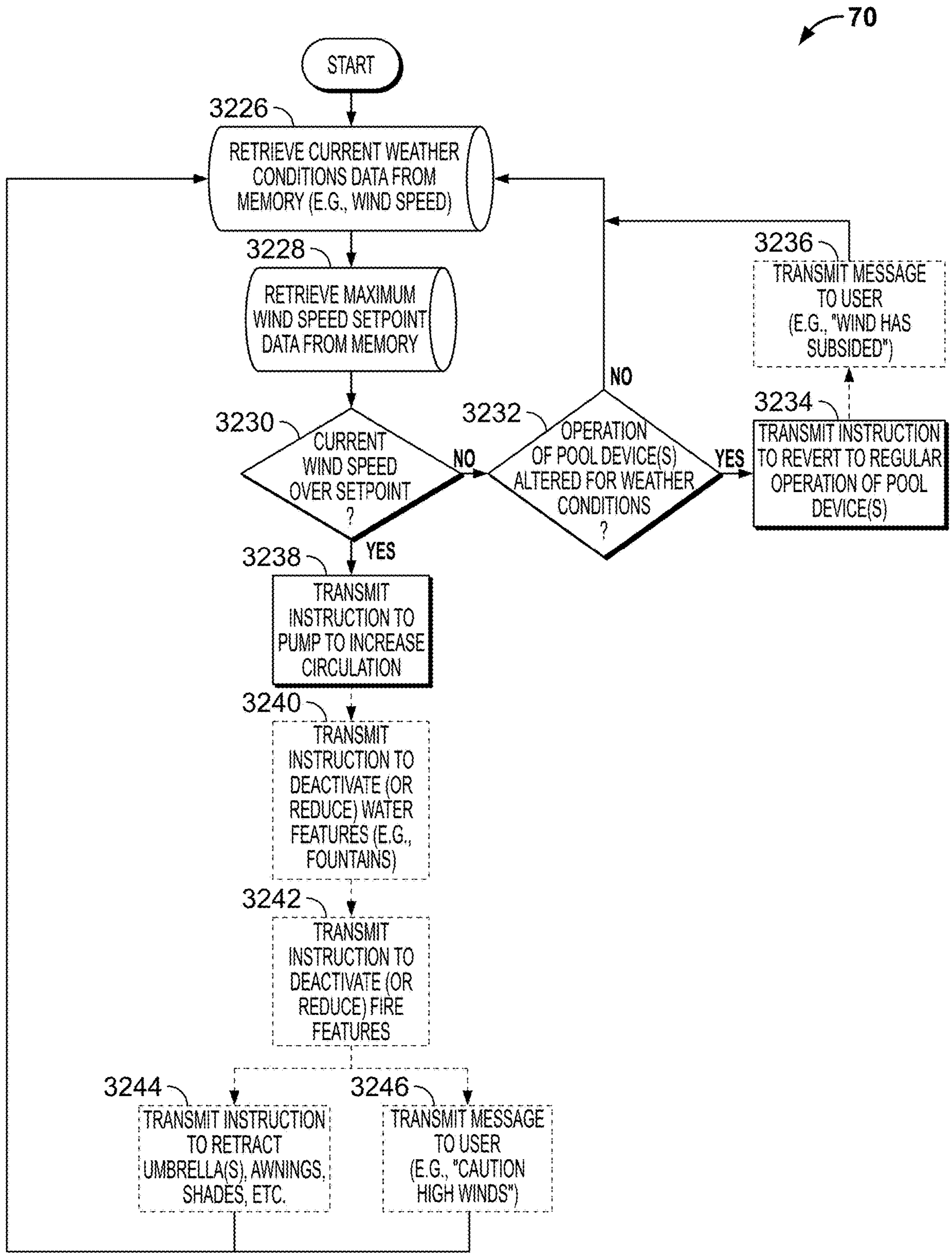

FIG. 33H is a flowchart illustrating processing steps carried out by the pool control logic 70 for automated operation of pool devices based on current weather conditions. In step 3226, pool control logic 70 retrieves current weather conditions (e.g., wind speed, up-wind debris source direction) data from the memory. The current weather conditions can be obtained by way of the process described herein, in connection with FIG. 33F. In step 3228, pool control logic 70 retrieves maximum wind speed setpoint data from memory. In step 3230, pool control logic 70 determines if the current wind speed is above the maximum wind speed setpoint. If a positive determination is made, the process proceeds to step 3238, where pool control logic 70 transmits an instruction to the pump to increase circulation. Optionally, in step 3240, pool control logic 70 could transmit an instruction to deactivate or reduce water features (e.g., fountains). Optionally, in step 3242, pool control logic 70 could transmit an instruction to deactivate or reduce fire features. Optionally, in step 3224, pool control logic 70 could transmit an instruction to retract shading devices (e.g., umbrellas, awnings, shades, etc.). Alternatively, in the event of pool devices that are not capable of being automated/receiving control signals/are not connected to the system 10, in step 3246, pool control logic 70 could transmit a message to the user (e.g., "Caution—High Winds"). The process then reverts to step 3226. If a negative determination is made in step 3230, the process proceeds to step 3232, where pool control logic 70 determines if the operation of any pool devices has been altered due to the weather condition (e.g., high winds). If a negative determination is made, the process reverts to step 3226. If a positive determination is made, the process proceeds to step 3234, where pool control logic 70 transmits an instruction to revert to regular operation of the pool device(s). Optionally, in step 3236, pool control logic 70 could transmit a message to the user (e.g., "Wind Has Subsided"). The process then reverts to step 3226. The above process can also be used to configure the skimmer locations with respect to the up-wind debris direction.

Figure 33I:
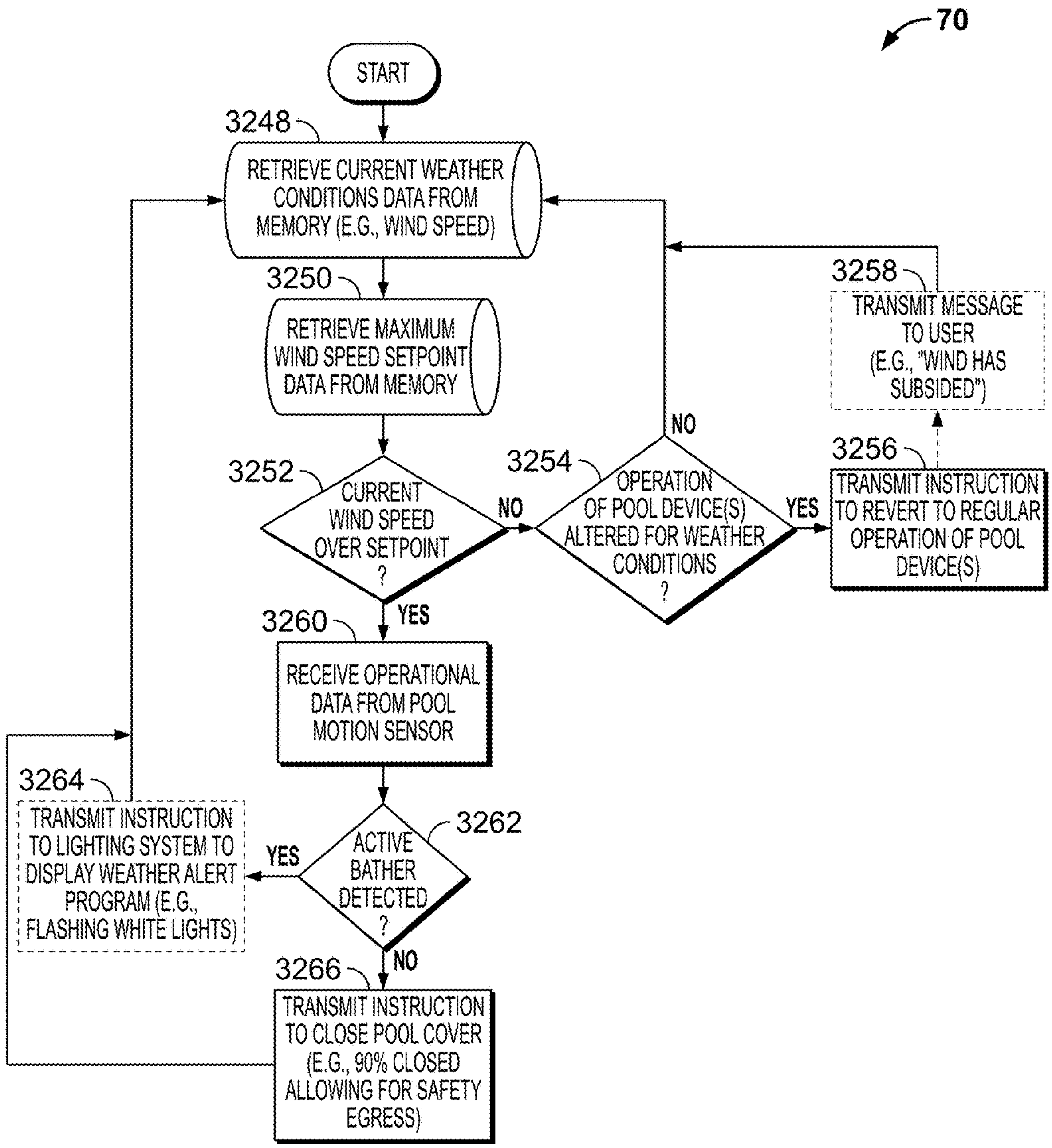

FIG. 33I is a flowchart illustrating processing steps carried out by the pool control logic 70 for automated operation of a pool cover based on current weather conditions. In step 3248, pool control logic 70 retrieves current weather conditions (e.g., wind speed) data from the memory. The current weather conditions can be obtained by way of the process described herein, in connection with FIG. 33F. In step 3250, pool control logic 70 retrieves maximum wind speed setpoint data from memory. In step 3252, pool control logic 70 determines if the current wind speed is above the maximum wind speed setpoint. If a positive determination is made, the process proceeds to step 3260, where pool control logic 70 receives operational data from a pool motion sensor (e.g., bather detection, as described hereinabove). In step 3262, pool control logic 70 determines if an active bather has been detected. If a positive determination is made, the process could optionally proceed to step 3264, where pool control logic 70 transmits an instruction to the lighting system to display a weather alert program (e.g., flashing white lights) and the process then reverts to step 3248. If a negative determination is made, the process proceeds to step 3266, where pool control logic 70 transmits an instruction to close the pool cover (e.g., 90% closed, allowing for safety egress). If a negative determination is made in step 3252, the process proceeds to step 3254, where pool control logic 70 determines if the operation of any pool devices (e.g., pool cover, lighting system) has been altered due to the weather condition (e.g., high winds). If a negative determination is made, the process reverts to step 3248. If a positive determination is made, the process proceeds to step 3256, where pool control logic 70 transmits an instruction to revert to regular operation of the pool device(s). Optionally, in step 3258, pool control logic 70 could transmit a message to the user (e.g., "Wind Has Subsided"). The process then reverts to step 3248.

Figure 33J:
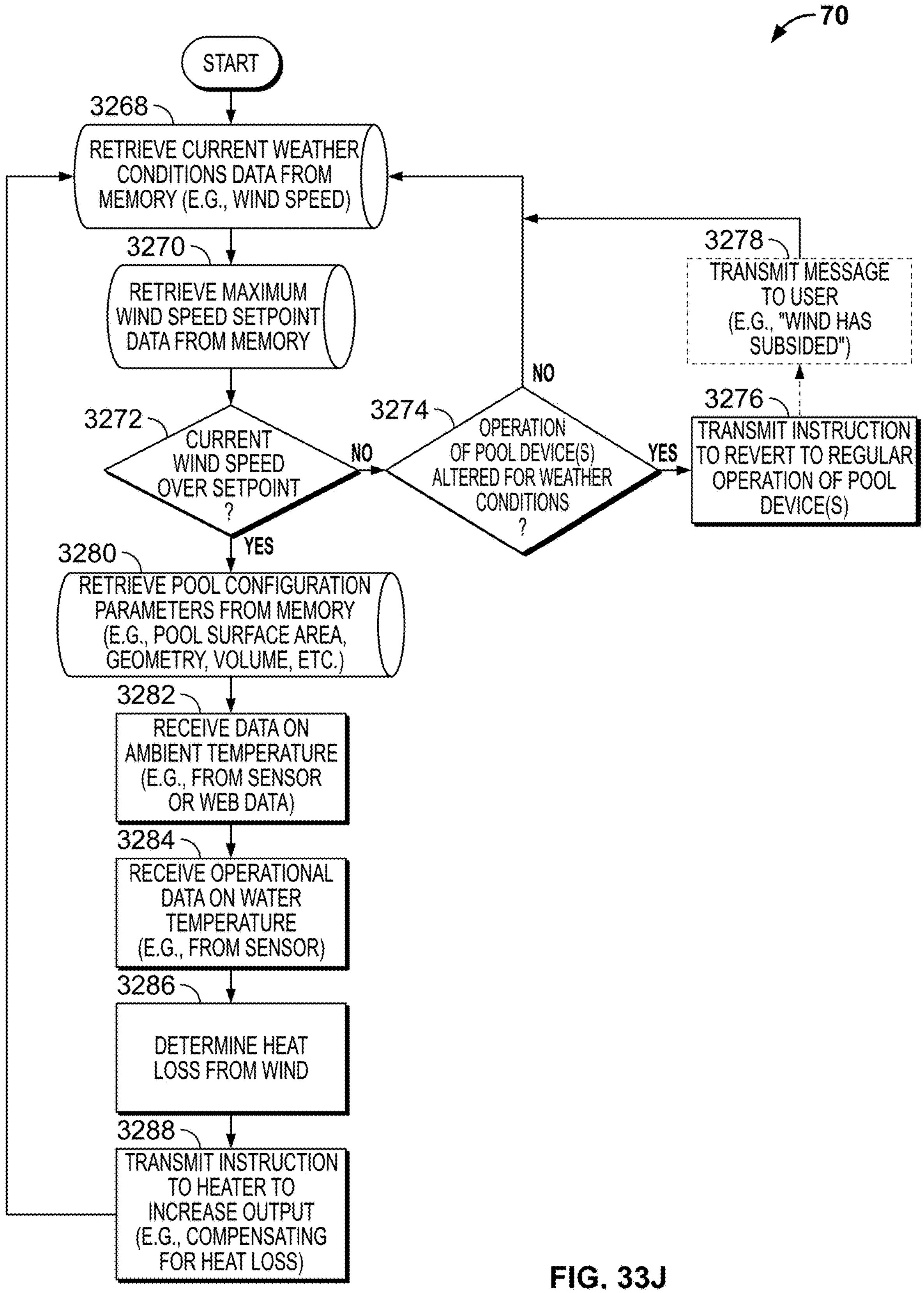

FIG. 33J is a flowchart illustrating processing steps carried out by the pool control logic 70 for compensating heat loss due to current weather conditions. In step 3268, pool control logic 70 retrieves current weather conditions (e.g., wind speed) data from the memory. The current weather conditions can be obtained by way of the process described herein, in connection with FIG. 33F. In step 3270, pool control logic 70 retrieves maximum wind speed setpoint data from memory. In step 3272, pool control logic 70 determines if the current wind speed is above the maximum wind speed setpoint. If a positive determination is made, the process proceeds to step 3280, where pool control logic 70 retrieves pool configuration parameters from memory (e.g., pool surface area, geometry, volume, etc.). In step 3282, pool control logic 70 receives data on the ambient temperature (e.g., from sensor or web data). In step 3284, pool control logic 70 receives operational data on water temperature (e.g., from sensor). In step 3286, pool control logic 70 determines heat loss due to the current weather condition (e.g., prevailing winds). In step 3288, pool control logic 70 transmits an instruction to the heater to increase output (e.g., compensating for the heat loss) and the process reverts to step 3268. If a negative determination is made in step 3272, the process proceeds to step 3274, where pool control logic 70 determines if the operation of any pool devices (e.g., heater) has been altered due to the weather condition (e.g., high winds). If a negative determination is made, the process reverts to step 3268. If a positive determination is made, the process proceeds to step 3276, where pool control logic 70 transmits an instruction to revert to regular operation of the pool device(s). Optionally, in step 3278, pool control logic 70 could transmit a message to the user (e.g., "Wind Has Subsided"). The process then reverts to step 3268.

Figure 33K:
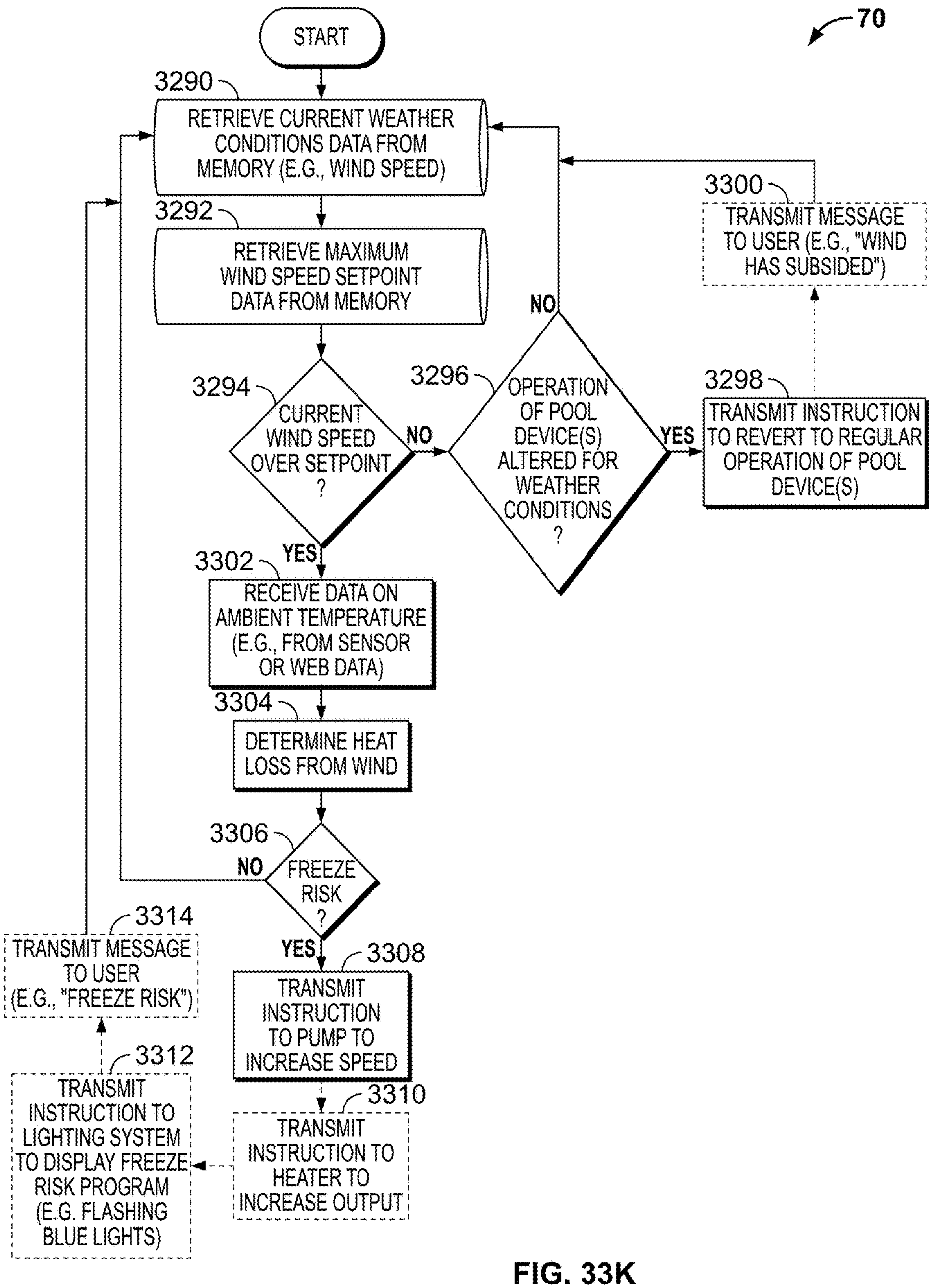

FIG. 33K is a flowchart illustrating processing steps carried out by the pool control logic 70 for determining if a freeze risk exists and if so, taking appropriate action. In step 3290, pool control logic 70 retrieves current weather conditions (e.g., wind speed) data from the memory. The current weather conditions can be obtained by way of the process described herein, in connection with FIG. 33F. In step 3292, pool control logic 70 retrieves maximum wind speed setpoint data from memory. In step 3294, pool control logic 70 determines if the current wind speed is above the maximum wind speed setpoint. If a positive determination is made, the process proceeds to step 3302, where pool control logic 70 receives data on the ambient temperature (e.g., from sensor or web data). In step 3304, pool control logic 70 determines heat loss due to the current weather condition (e.g., prevailing winds). Heat loss due to the weather conditions (e.g., wind) can be obtained by way of the process described herein, in connection with FIG. 33J. In step 3306, pool control logic 70 determines if a freeze risk exists (e.g., due to ambient temperature, heat loss, wind chill, etc.). If a negative determination is made, the process reverts to step 3290. If a positive determination is made, the process proceeds to step 3308, where pool control logic 70 transmits an instruction to the pump to increase speed. Optionally, in step 3310, pool control logic 70 could transmit an instruction to the heater to increase output, in step 3312, pool control logic 70 could transmit an instruction to the lighting system to display a freeze risk program (e.g., flashing blue lights), and in step 3314, pool control logic 70 could transmit a message to the user (e.g., "Freeze Risk"). The process then reverts to step 3290. If a negative determination is made in step 3294, the process proceeds to step 3296, where pool control logic 70 determines if the operation of any pool devices (e.g., pump, heater, lighting system, etc.) has been altered due to the weather condition (e.g., high winds). If a negative determination is made, the process reverts to step 3290. If a positive determination is made, the process proceeds to step 3298, where pool control logic 70 transmits an instruction to revert to regular operation of the pool device(s). Optionally, in step 3300, pool control logic 70 could transmit a message to the user (e.g., "Wind Has Subsided"). The process then reverts to step 3290.

Figure 33L:
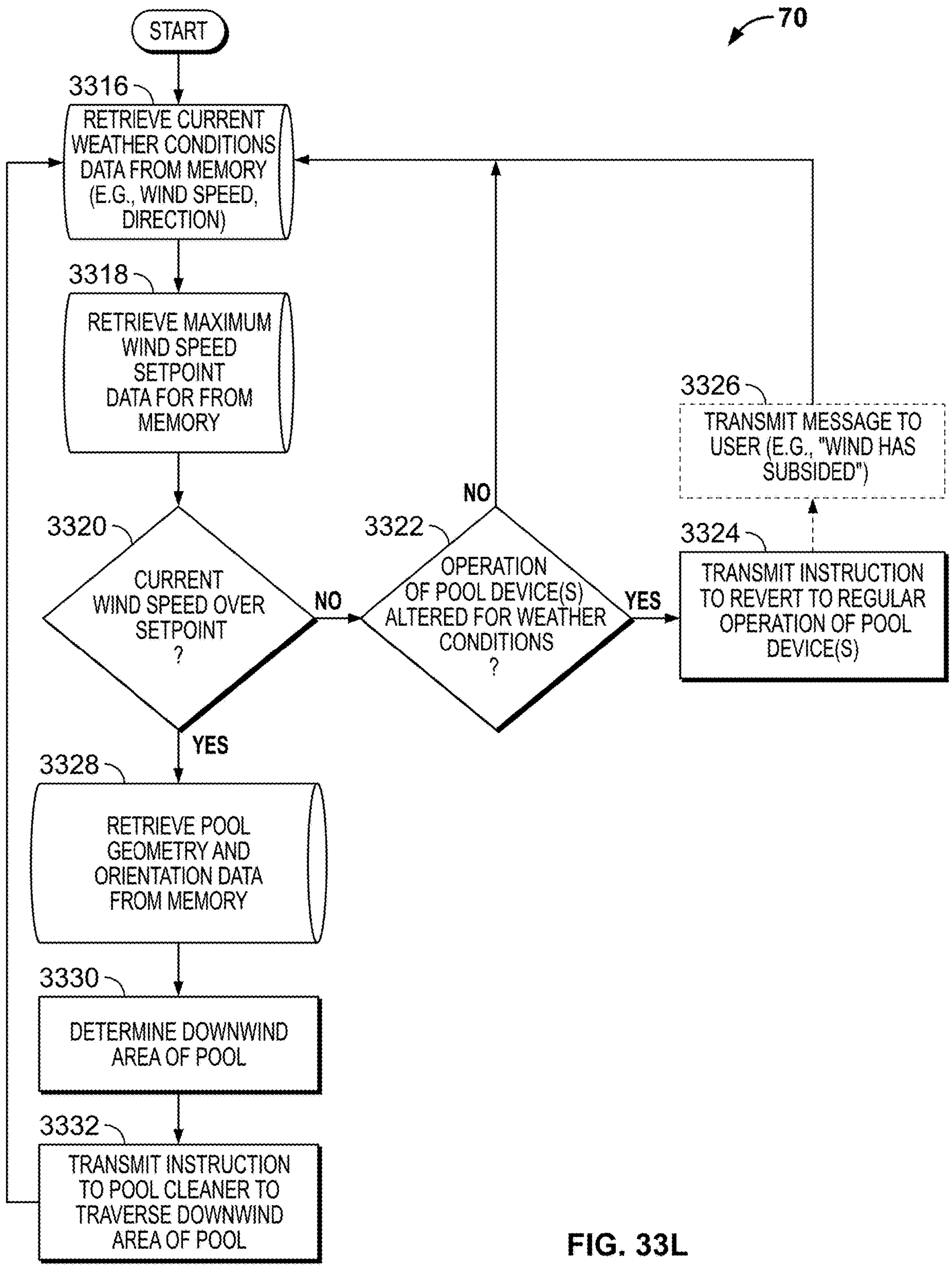

FIG. 33L is a flowchart illustrating processing steps carried out by the pool control logic 70 for cleaning a pool/spa in response to a weather condition (e.g., high winds). In step 3316, pool control logic 70 retrieves current weather conditions (e.g., wind speed, direction) data from the memory. The current weather conditions can be obtained by way of the process described herein, in connection with FIG. 33F. In step 3318, pool control logic 70 retrieves maximum wind speed setpoint data from memory. In step 3320, pool control logic 70 determines if the current wind speed is above the maximum wind speed setpoint. If a positive determination is made, the process proceeds to step 3328, where pool control logic 70 retrieves pool geometry and orientation data from the memory. The pool geometry and orientation data can be obtained by way of the process described herein, in connection with FIG. 33A. In step 3330, pool control logic 70 determines the downwind area of the pool/spa. In step 3332, pool control logic 70 transmits an instruction to a pool cleaner to traverse the downwind area of the pool and the process then reverts to step 3316. If a negative determination is made in step 3320, the process proceeds to step 3322, where pool control logic 70 determines if the operation of any pool devices (e.g., pool cleaner) has been altered due to the weather condition (e.g., high winds). If a negative determination is made, the process reverts to step 3316. If a positive determination is made, the process proceeds to step 3324, where pool control logic 70 transmits an instruction to revert to regular operation of the pool device(s). Optionally, in step 3326, pool control logic 70 could transmit a message to the user (e.g., "Wind Has Subsided"). The process then reverts to step 3316.

Figure 33M:
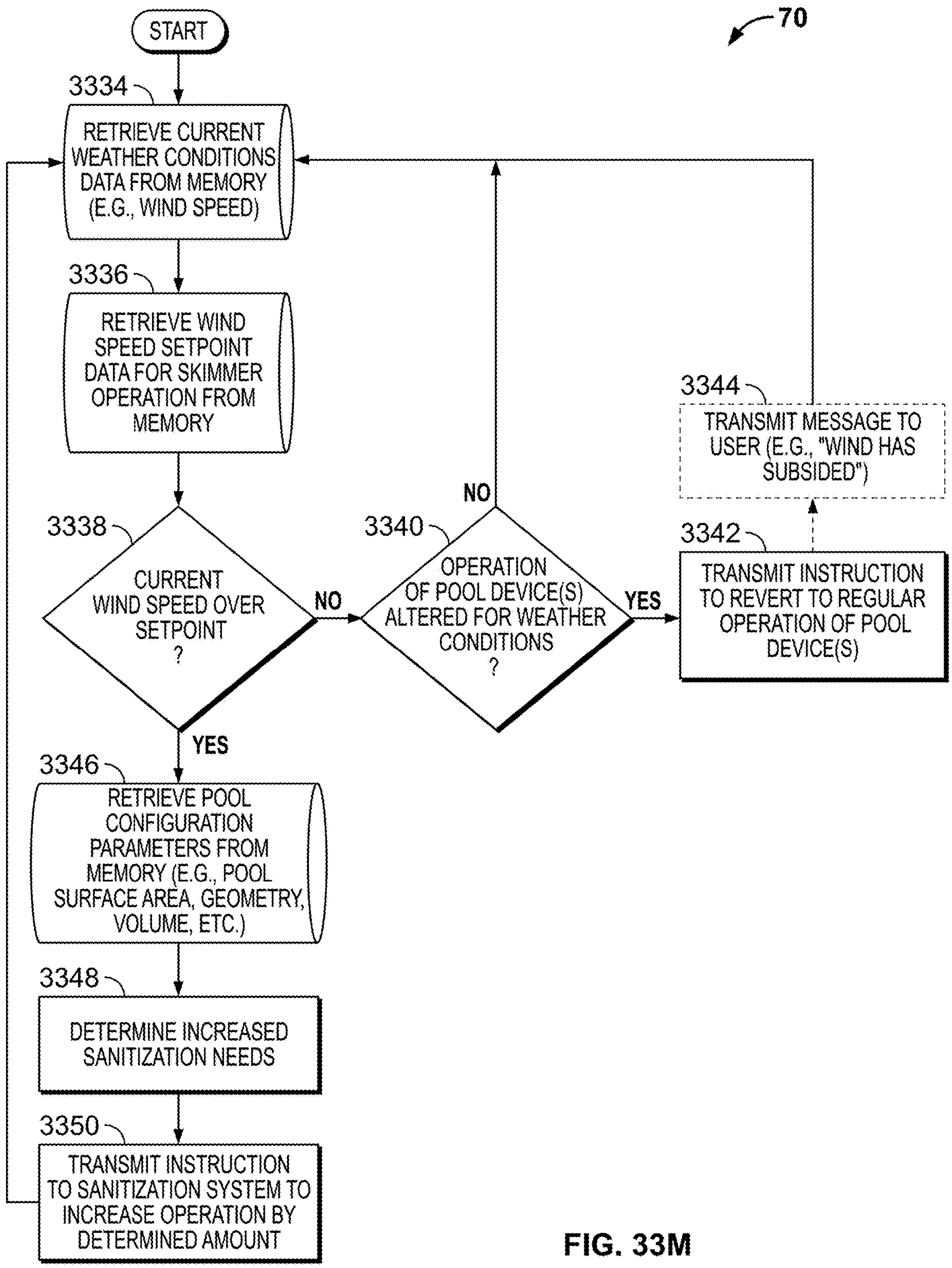

FIG. 33M is a flowchart illustrating processing steps carried out by the pool control logic 70 for sanitizing a pool/spa in response to a weather condition (e.g., high winds). In step 3334, pool control logic 70 retrieves current weather conditions (e.g., wind speed) data from the memory. The current weather conditions can be obtained by way of the process described herein, in connection with FIG. 33F. In step 3336, pool control logic 70 retrieves maximum wind speed setpoint data from memory. In step 3338, pool control logic 70 determines if the current wind speed is above the maximum wind speed setpoint. If a positive determination is made, the process proceeds to step 3346, where pool control logic 70 retrieves pool configuration parameters (e.g., pool surface area, geometry, volume, etc.) from the memory. In step 3348, pool control logic 70 determines the increased sanitization needs of the pool due to the weather condition (e.g., high winds causing increased debris in pool). In step 3350, pool control logic 70 transmits an instruction to a sanitization system to increase operation by the determined amount and the process then reverts to step 3334. If a negative determination is made in step 3338, the process proceeds to step 3340, where pool control logic 70 determines if the operation of any pool devices (e.g., sanitization system) has been altered due to the weather condition (e.g., high winds). If a negative determination is made, the process reverts to step 3334. If a positive determination is made, the process proceeds to step 3342, where pool control logic 70 transmits an instruction to revert to regular operation of the pool device(s). Optionally, in step 3344, pool control logic 70 could transmit a message to the user (e.g., "Wind Has Subsided"). The process then reverts to step 3334.

Figure 33N:
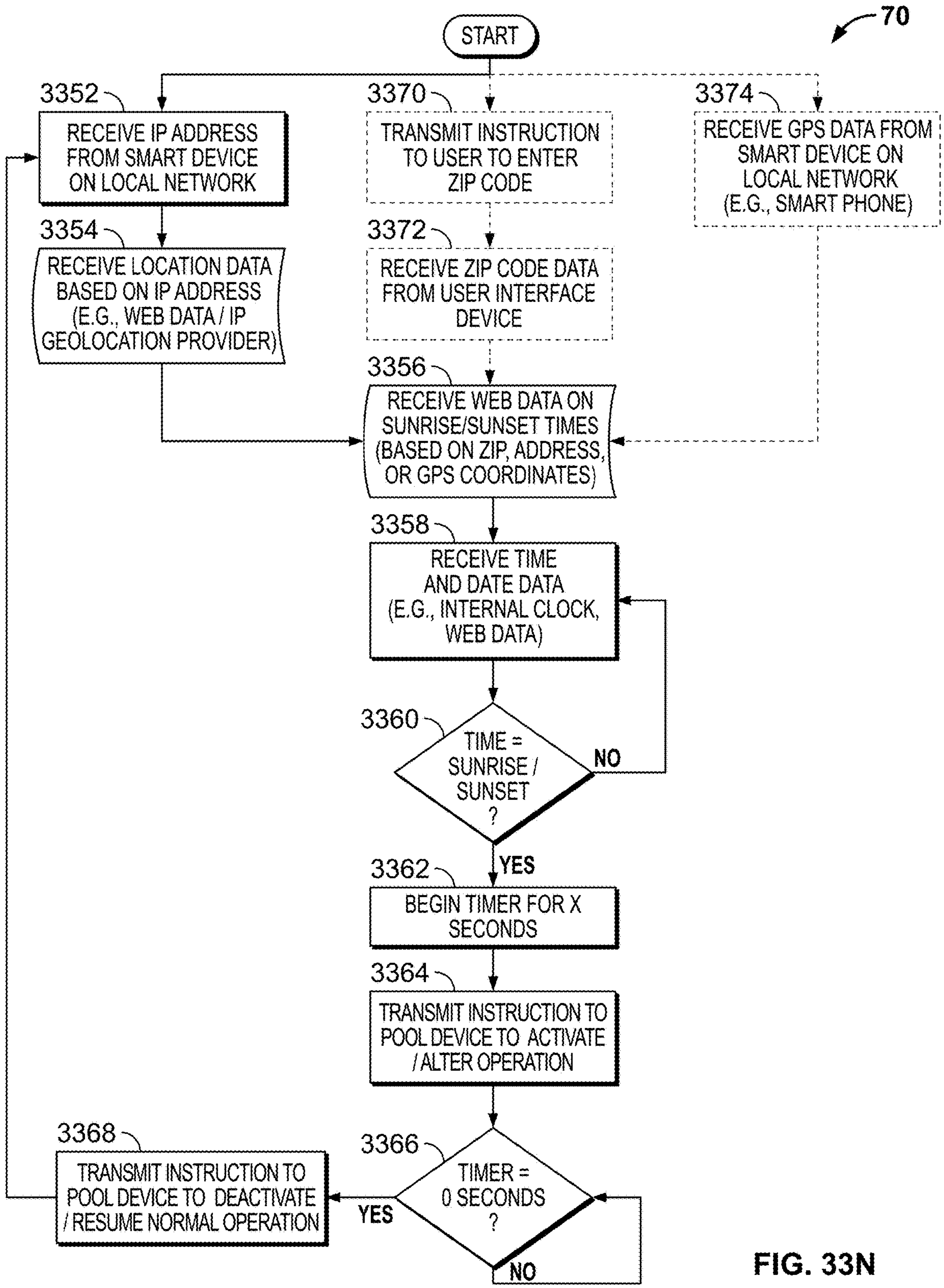

FIG. 33N is a flowchart illustrating processing steps carried out by the pool control logic 70 for operating pool devices based on timers triggered by sunrise/sunset times. In step 3352, pool control logic 70 receives an IP address from a smart device on a local network. In step 3354, pool control logic 70 receives location data based on the IP address (e.g., web data/geolocation provider). In step 3356, pool control logic 70 receives web data on sunrise/sunset times (based on ZIP code, location/address, or GPS coordinates, discussed hereinbelow). In step 3358, pool control logic 70 receives time and date data (e.g., via an internal clock or as web data). In step 3360, pool control logic 70 determines if the current time is the sunrise or sunset time. If a negative determination is made, the process reverts to step 3358. If a positive determination is made, the process proceeds to step 3362, where pool control logic 70 begins a timer for X seconds, wherein X is any suitable integer (e.g., 5, 10, 3600, etc.). In step 3364, pool control logic 70 transmits an instruction to a pool device to activate/alter operation. For example, pool control logic 70 could transmit an instruction to the pump 14*a* to increase speed upon sunrise, for a specified duration of time, or pool control logic 70 could transmit an instruction to display a countdown to sundown. In step 3366, pool control logic 70 determines if the timer has reached zero (0) seconds. If a negative determination is made, the process repeats step 3366. If a positive determination is made, the process proceeds to step 3368, where pool control logic 70 transmits an instruction to the pool device to deactivate/resume normal operation. The process then reverts to step 3352. Optionally, in step 3370, pool control logic 70 could transmit an instruction to the user to enter a ZIP code via a user interface device and in step 3372, pool control logic 70 could receive the ZIP code data from the user interface device and then the process could proceed to step 3356. In step 3374, pool control logic 70 could also/alternatively receive GPS data from a smart device on the local network (e.g., smart phone connected to home WiFi) and then the process could proceed to step 3356.

Figure 33O:
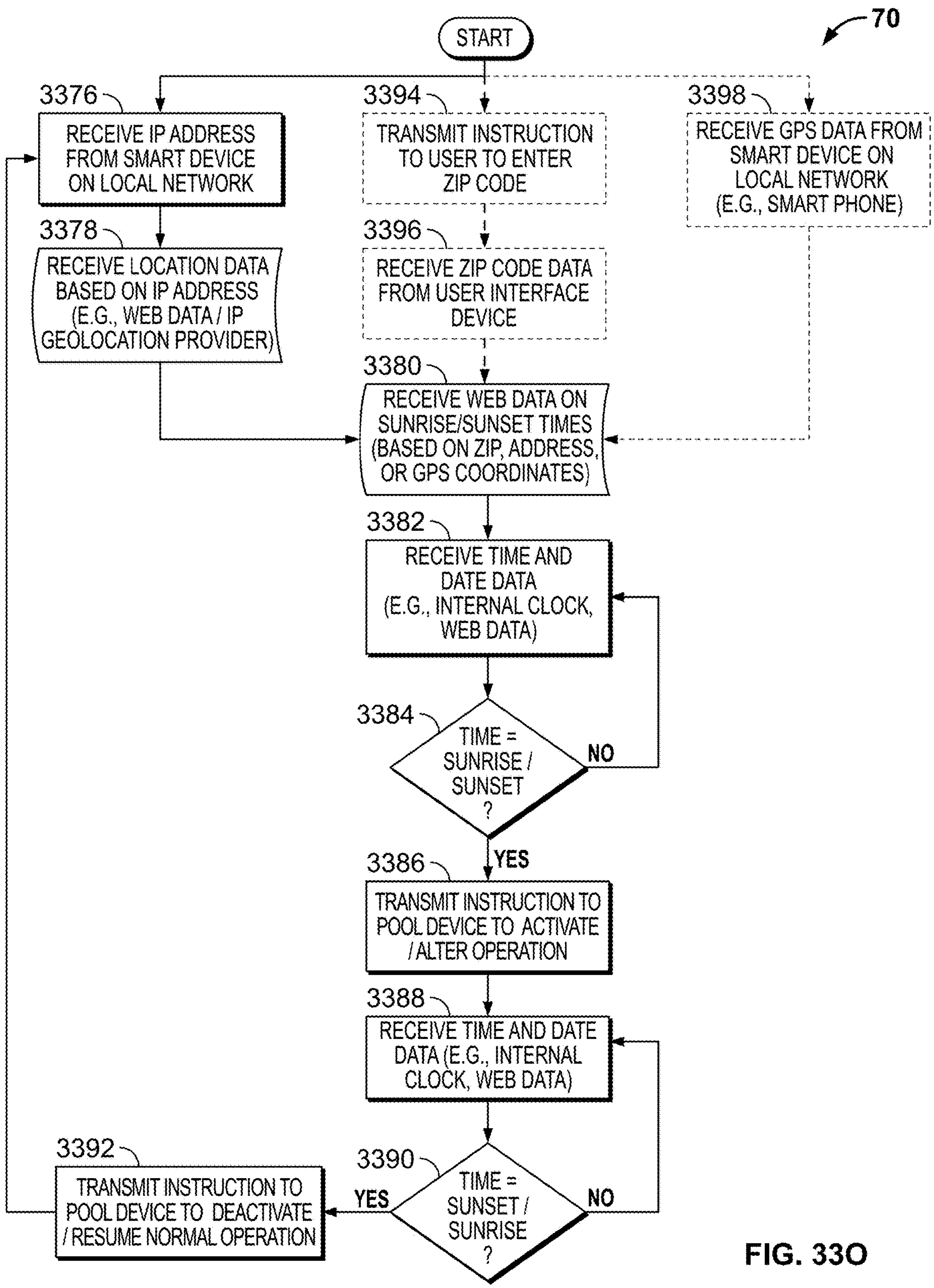

FIG. 33O is a flowchart illustrating processing steps carried out by the pool control logic 70 for operating pool devices based on sunrise/sunset times (e.g., activate at sunrise, deactivate at sunset). For example, the pool control logic 70 could transmit an instruction to the pump 14*a* to increase speed upon sunrise and decrease speed upon sunset, the pool control logic 70 could transmit an instruction to increase the filtration rate or hours based on sunlight hours, or the pool control logic 70 could transmit an instruction to the lighting system 14*h* to activate upon sundown and deactivate upon sunrise. In step 3376, pool control logic 70 receives an IP address from a smart device on a local network. In step 3378, pool control logic 70 receives location data based on the IP address (e.g., web data/geolocation provider). In step 3380, pool control logic 70 receives web data on sunrise/sunset times (based on ZIP code, location/address, or GPS coordinates, discussed hereinbelow). In step 3382, pool control logic 70 receives time and date data (e.g., via an internal clock or as web data). In step 3384, pool control logic 70 determines if the current time is the sunrise or sunset time. If a negative determination is made, the process reverts to step 3382. If a positive determination is made, the process proceeds to step 3386, where pool control logic 70 transmits an instruction to a pool device to activate/alter operation. In step 3388, pool control logic 70 receives time and date data (e.g., via an internal clock or as web data). In step 3390, pool control logic 70 determines if the current time is the sunrise or sunset time. If a negative determination is made, the process reverts to step 3388. If a positive determination is made, the process proceeds to step 3392, where pool control logic 70 transmits an instruction to the pool device to deactivate/resume normal operation. The process then reverts to step 3376. Optionally, in step 3394, pool control logic 70 could transmit an instruction to the user to enter a ZIP code via a user interface device and in step 3396, pool control logic 70 could receive the ZIP code data from the user interface device and then the process could proceed to step 3380. In step 3398, pool control logic 70 could also/alternatively receive GPS data from a smart device on the local network (e.g., smart phone connected to home WiFi) and then the process could proceed to step 3380.

Figure 33P:
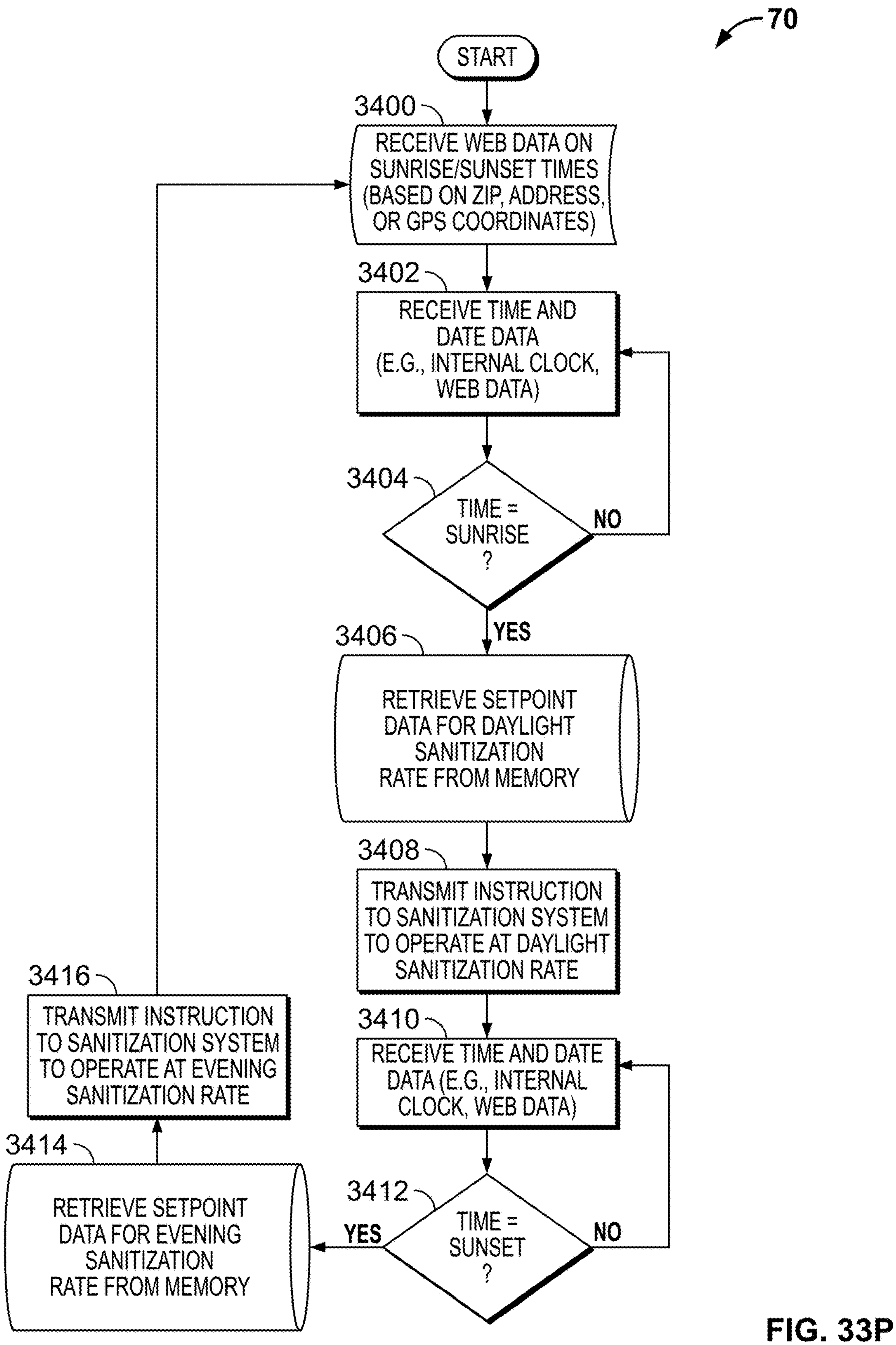

FIG. 33P is a flowchart illustrating processing steps carried out by the pool control logic 70 for operating pool devices at different setpoints during the daytime and evening. For example, pool control logic 70 could operate a sanitization system at a first setpoint during the daytime and operate at a second setpoint during the evening. In step 3400, pool control logic 70 receives web data on sunrise/sunset times. The web data on sunrise/sunset times can be obtained by way of the process described herein, in connection with FIG. 33N. In step 3402, pool control logic 70 receives time and date data (e.g., via an internal clock or as web data). In step 3404, pool control logic 70 determines if the current time is the sunrise or sunset time. If a negative determination is made, the process reverts to step 3402. If a positive determination is made, the process proceeds to step 3406, where pool control logic 70 retrieves setpoint data for a daylight sanitization rate from the memory. In step 3408, pool control logic 70 transmits an instruction to a sanitization system to operate at the daylight sanitization rate. In step 3410, pool control logic 70 receives time and date data (e.g., via an internal clock or as web data). In step 3412, pool control logic 70 determines if the current time is the sunrise or sunset time. If a negative determination is made, the process reverts to step 3410. If a positive determination is made, the process proceeds to step 3414, where pool control logic 70 retrieves setpoint data on an evening sanitization rate from the memory. In step 3416, pool control logic 70 transmits an instruction to the sanitization system to operate at the evening sanitization rate. The process then reverts to step 3400.

Figure 33Q:
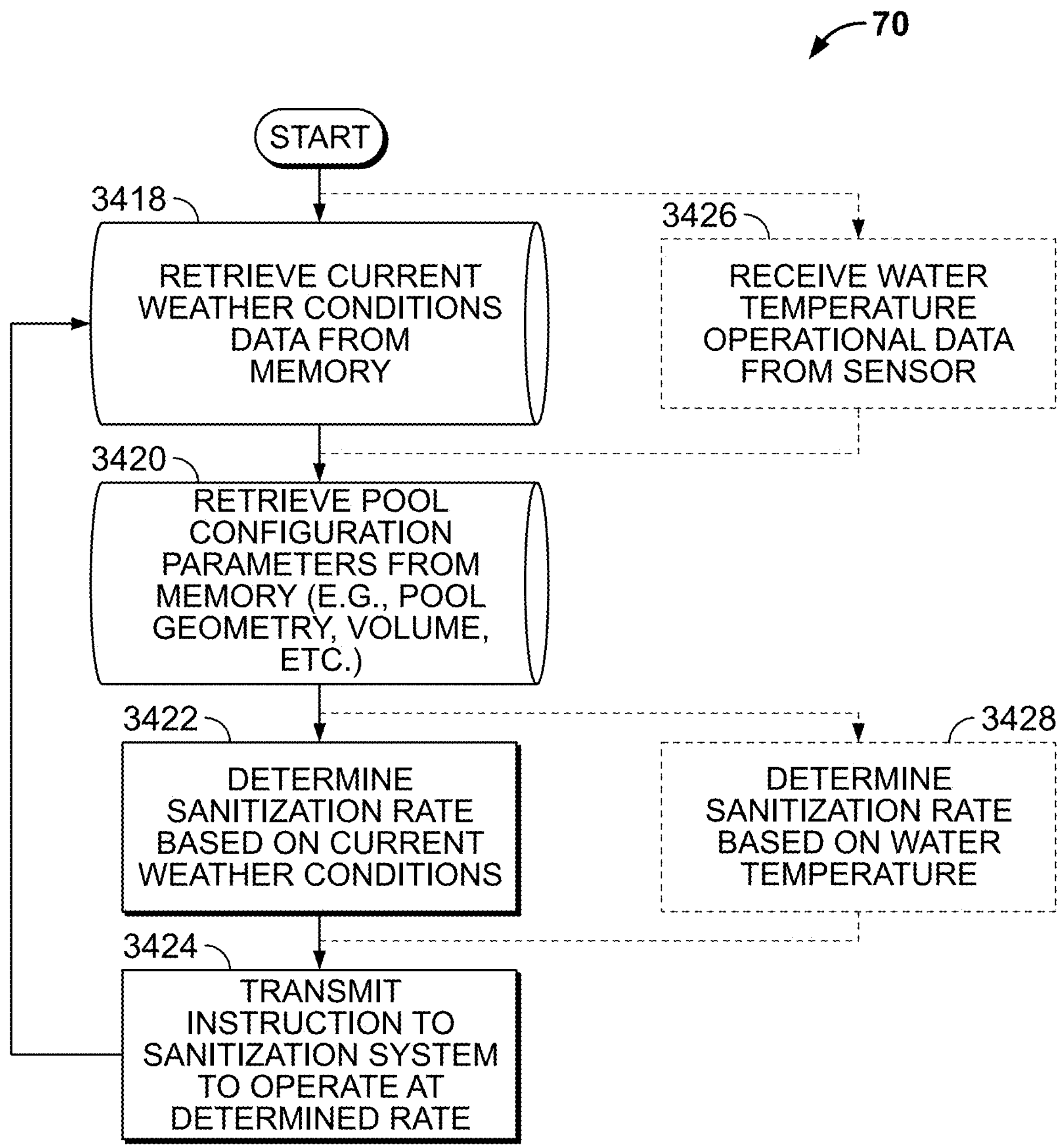

FIG. 33Q is a flowchart illustrating processing steps carried out by the pool control logic 70 for operating a sanitization system based on the current weather conditions. In step 3418, pool control logic 70 retrieves current weather conditions data from the memory. Current weather conditions data can be obtained by way of the process described herein, in connection with FIG. 33F. Current weather conditions could include air temperature, humidity, heat/cold index, wind-chill, etc. Optionally, in step 3426, pool control logic 70 could receive water temperature operational data from a sensor. In step 3420, pool control logic 70 retrieves pool configuration parameters from the memory. In step 3422, pool control logic 70 determines the sanitization rate based on the current weather conditions. While the sanitization rate could be determined based on the current weather conditions, other chemical dispensing and/or production rates could be determined as well. Optionally, in step 3428, pool control logic 70 could determine the sanitization rate based on the water temperature. In step 3424, pool control logic 70 transmits an instruction to the sanitization system to operate at the determined rate. The process then reverts to step 3418.

Figure 33R:
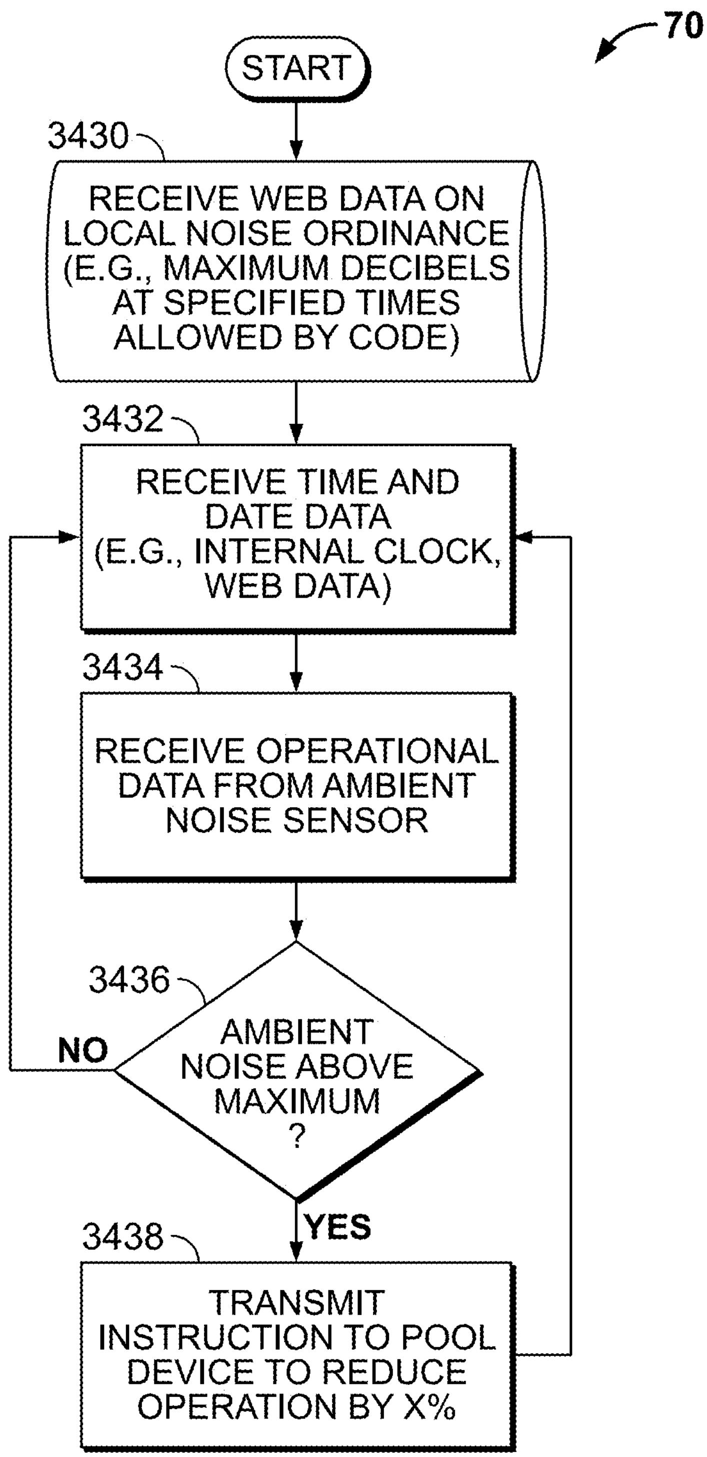

FIG. 33R is a flowchart illustrating processing steps carried out by the pool control logic 70 for operating the system 10 based on maximum ambient noise. In step 3430, pool control logic 70 receives web data on the local noise ordinance (e.g., maximum decibels at specified times allowed by code). The web data on the local noise ordinance can be obtained by way of a similar process as described herein, in connection with FIG. 33N (e.g., by determining the location of the system 10 and then receiving web data based on that location). In step 3432, pool control logic 70 receives time and date data (e.g., internal clock or web data). In step 3434, pool control logic 70 receives operational data from an ambient noise sensor. In step 3436 pool control logic 70 determines if the current ambient noise is above the maximum ambient noise (set by ordinance) at the current time. If a negative determination is made, the process reverts to step 3432. If a positive determination is made, the process proceeds to step 3438, where pool control logic 70 transmits an instruction to a pool device (e.g., water feature, pump, heater, blower, etc.) to reduce operation by X %, wherein X is any suitable integer between one (1) and one hundred (100) (e.g., 1, 2, 5, 10, etc.). The process then reverts to step 3432. The above process can apply based on geo-positioning data.

Figure 33S:
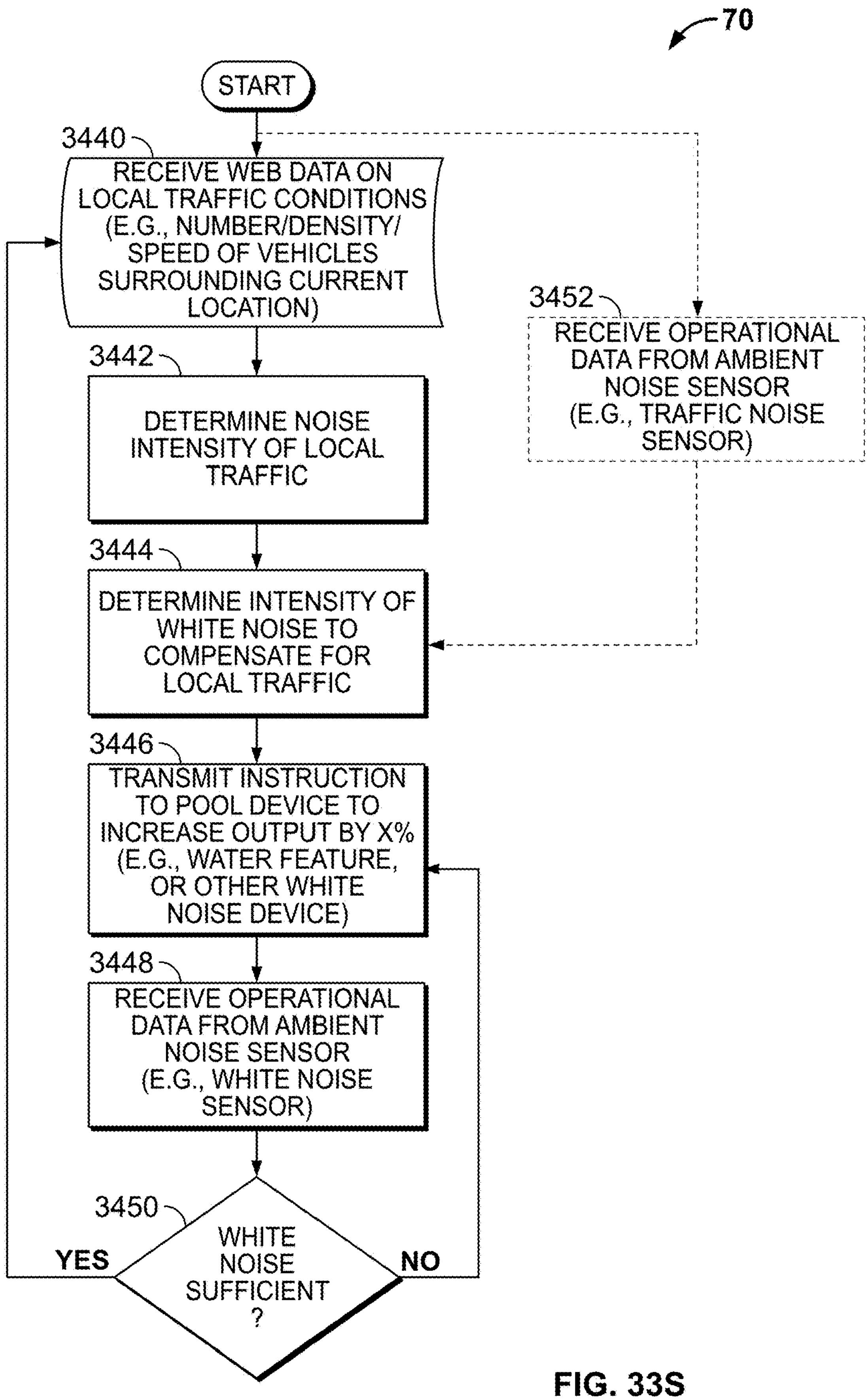

FIG. 33S is a flowchart illustrating processing steps carried out by the pool control logic 70 for compensating for ambient noise. In step 3440, pool control logic 70 receives web data (e.g., Google maps) on local traffic conditions (e.g., number/density/speed of vehicles surrounding current location). The web data on the local traffic conditions can be obtained by way of a similar process as described herein, in connection with FIG. 33N (e.g., by determining the location of the system 10 and then receiving web data based on that location). In step 3442, pool control logic 70 determines/estimates the noise intensity of the local traffic. Optionally, in step 3452, pool control logic 70 could receive operational data from an ambient noise sensor that is positioned to sense the noise produced by the local traffic. In step 3444, pool control logic 70 determines the intensity of white noise needed to compensate for the noise intensity of the local traffic. In step 3446, pool control logic 70 transmits an instruction to a pool device (e.g., water feature or other device capable of producing white noise) to increase output by X %, wherein X is any suitable integer (e.g., 5, 10, 50, etc.). In step 3448, pool control logic 70 receives operational data from an ambient noise sensor (e.g., white noise sensor). In step 3450, pool control logic 70 determines if the white noise being produced is sufficient to compensate for the noise being produced by the local traffic. If a negative determination is made, the process reverts to step 3446. If a positive determination is made, the process reverts to step 3440.

Figure 33T:
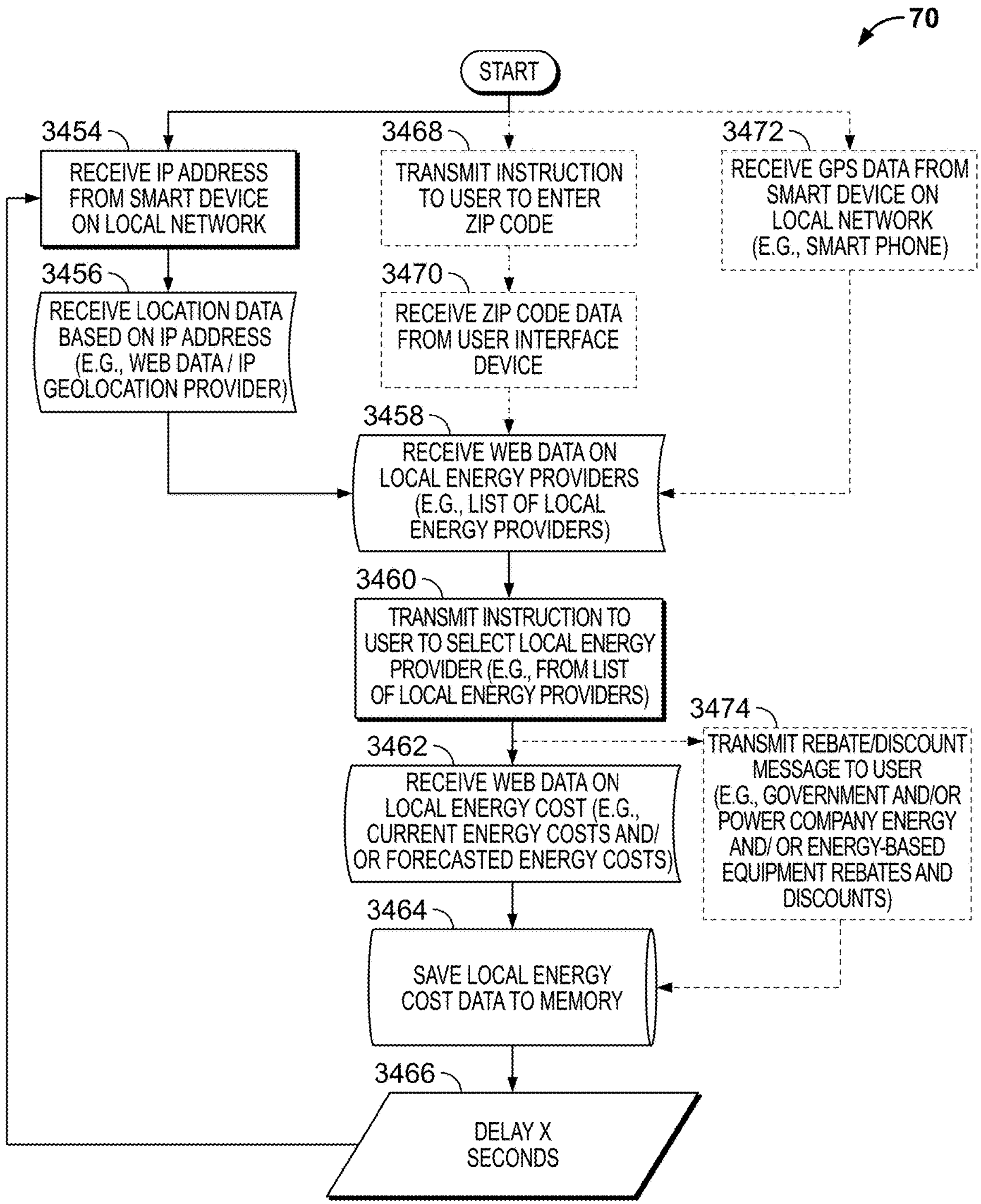

FIG. 33T is a flowchart illustrating processing steps carried out by the pool control logic 70 for determining the local cost of energy. In step 3454, pool control logic 70 receives an IP address from a smart device on a local network. In step 3456, pool control logic 70 receives location data based on the IP address (e.g., web data/geolocation provider). In step 3458, pool control logic 70 receives web data (e.g., a listing) of local energy providers (based on ZIP code, location/address, or GPS coordinates, discussed hereinbelow). In step 3460, pool control logic 70 transmits an instruction to the user to select their local energy provider (e.g., from a list of local energy providers). The local energy providers/vendors can also be determined by way of the user entering, scanning, or selecting the vendor from a drop-down menu. In step 3462, pool control logic 70 receives web data on local energy cost (e.g., as provided by the selected energy vendor). The local energy costs could include both current energy costs and/or forecasted energy costs. Optionally, in step 3474, pool control logic 70 could transmit a rebate/discount message to the user (e.g., government and/or power company energy and/or energy-based equipment rebates and discounts). In step 3464, pool control logic 70 saves the local energy cost data to the memory for later retrieval. In step 3466, pool control logic 70 is delayed for X seconds, wherein X is any suitable integer (e.g., 5, 10, 3600, etc.) and the process then reverts to step 3454. Optionally, in step 3468, pool control logic 70 could transmit an instruction to the user to enter a ZIP code via a user interface device and in step 3470, pool control logic 70 could receive the ZIP code data from the user interface device and then the process could proceed to step 3458. In step 3472, pool control logic 70 could also/alternatively receive GPS data from a smart device on the local network (e.g., smart phone connected to home WiFi) and then the process could proceed to step 3458.

Figure 33U:
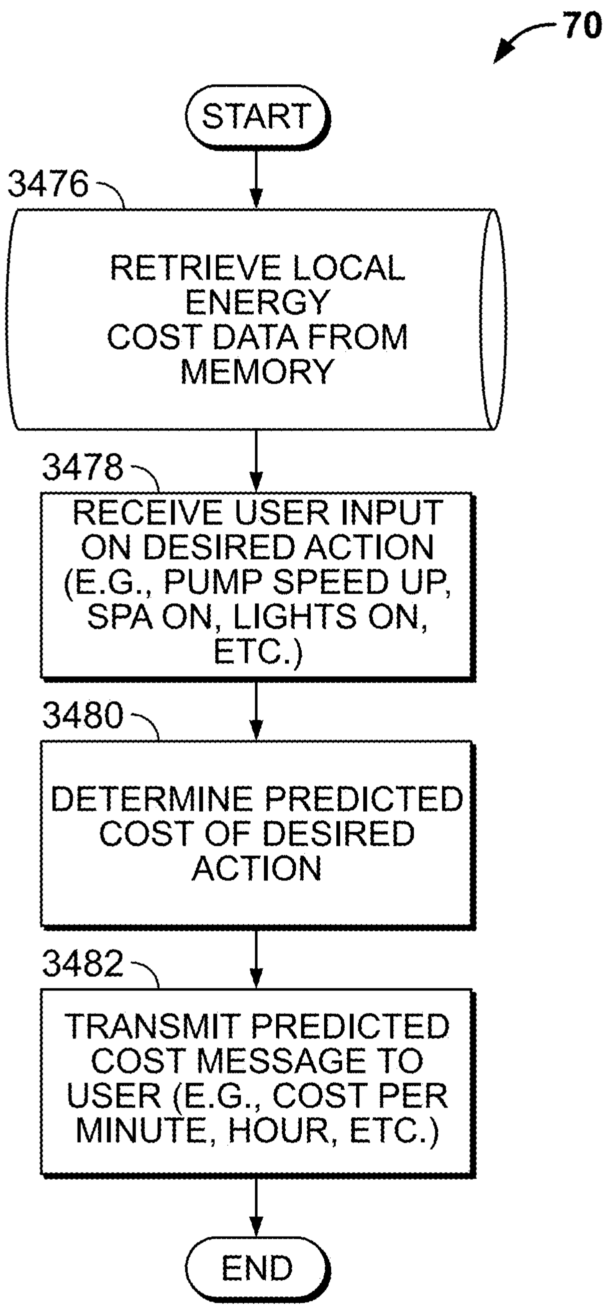

FIG. 33U is a flowchart illustrating processing steps carried out by the pool control logic 70 for informing the user of the cost of a desired action. In step 3476, pool control logic 70 retrieves local energy cost data from the memory. The web data on the local energy costs can be obtained by way of the process as described herein, in connection with FIG. 33T (e.g., by determining the location of the system 10 and then receiving web data based on that location). In step 3478, pool control logic 70 receives user input on a desired action (e.g., pump speed up, spa on, lights on, etc.). The desired action could also include bringing a pool feature to a desired state, over time (e.g., bringing the pool water temperature to 80 degrees Fahrenheit by Friday at 5:00 pm and maintaining the temperature for a specified duration of time). In step 3480, pool control logic 70 determines the predicted cost of the desired action. In step 3482, pool control logic 70 transmits a message to the user (e.g., cost per minute, hour, day, etc.).

Figure 33V:
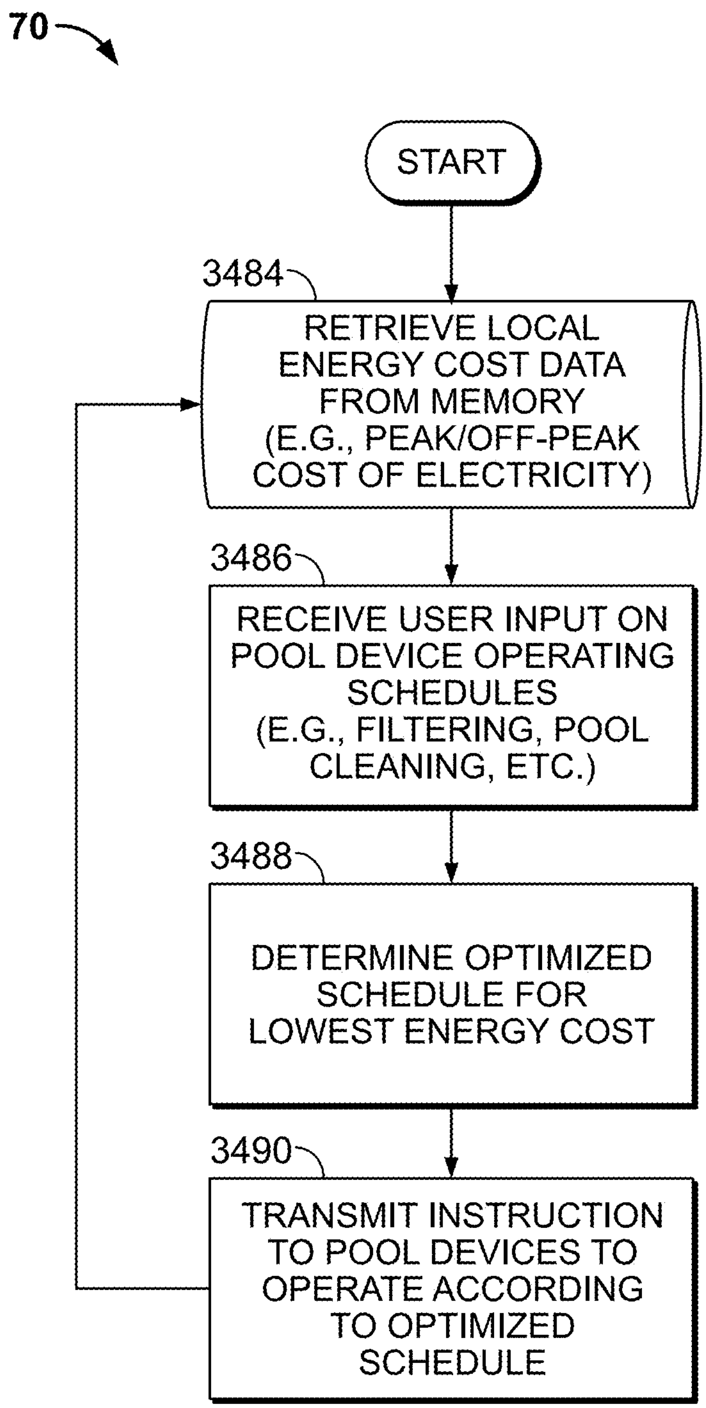

FIG. 33V is a flowchart illustrating processing steps carried out by the pool control logic 70 for optimizing the operation of pool devices based on energy cost (peak and off-peak hours). In step 3484, pool control logic 70 retrieves local energy cost data from the memory (e.g., peak/off-peak cost of electricity). The web data on the local energy costs can be obtained by way of the process as described herein, in connection with FIG. 33T (e.g., by determining the location of the system 10 and then receiving web data based on that location). In step 3486, pool control logic 70 receives user input on pool device operating schedules (e.g., filtering, pool cleaning, etc.). In step 3488, pool control logic 70 determines an optimized schedule for the lowest energy cost. For example, normal filtering and pool cleaner operation cycles could be adjusted based on the lowest cost of energy during off-peak hours. In step 3490, pool control logic 70 transmits an instruction to the pool devices to operate according to the optimized schedule. In addition, energy-based commands could be capable of auto-overriding other system commands, and vice-versa, based on weather/environmental demands (e.g., optimized energy settings vs. weather vs. basic pool requirements—clean, sanitized, etc.). The process then returns to step 3484.

Figure 33W:
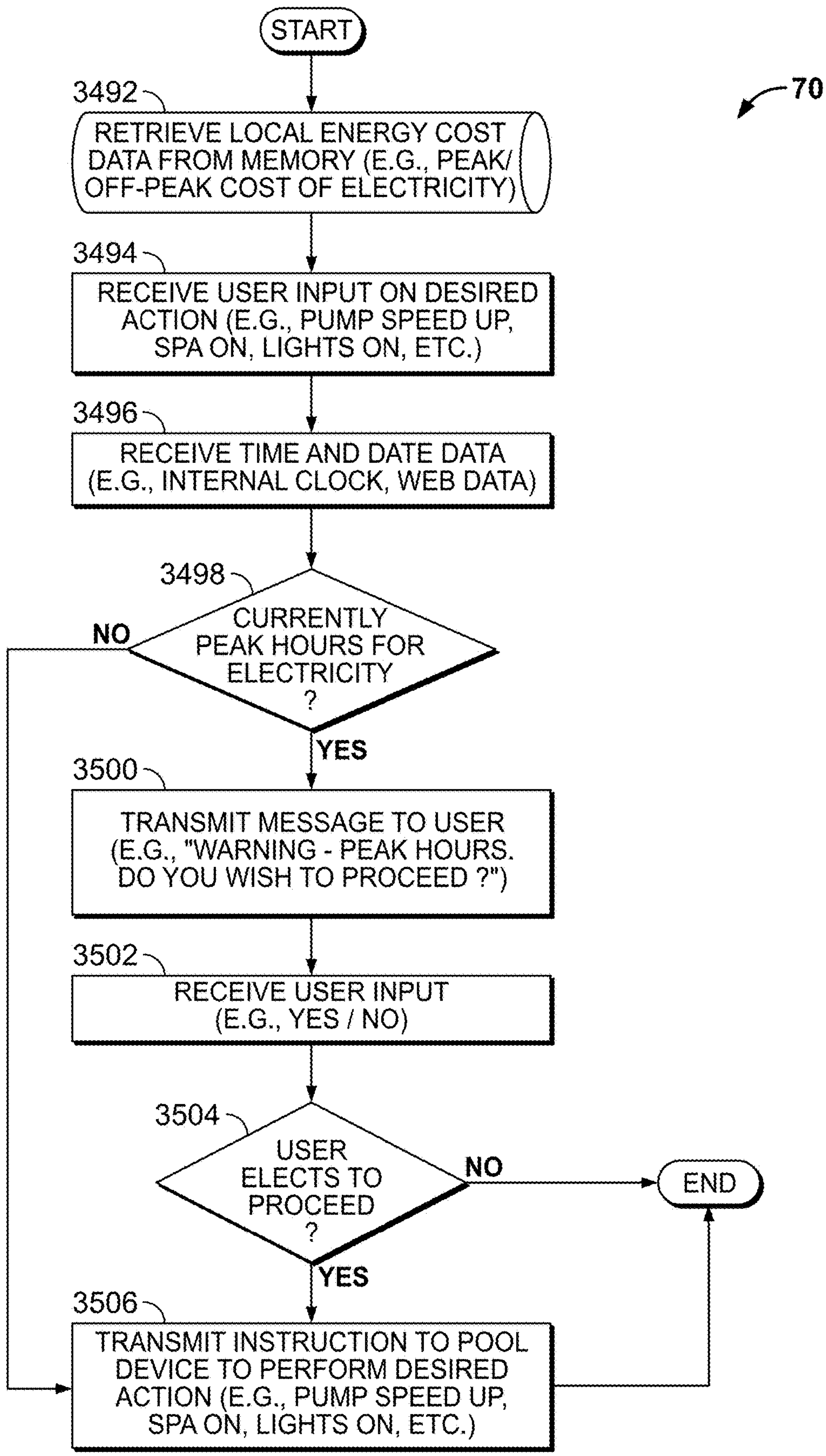

FIG. 33W is a flowchart illustrating processing steps carried out by the pool control logic 70 for warning the user of pool device operation during peak energy cost hours. In step 3492, pool control logic 70 retrieves local energy cost data from the memory (e.g., peak/off-peak cost of electricity). The web data on the local energy costs can be obtained by way of the process as described herein, in connection with FIG. 33T (e.g., by determining the location of the system 10 and then receiving web data based on that location). In step 3494, pool control logic 70 retrieves user input on a desired action (e.g., pump speed up, spa on, lights on, etc.). In step 3496, pool control logic 70 receives time and date data (e.g., internal clock, or as web data). In step 3498, pool control logic 70 determines whether the current time corresponds to peak hours for electricity costs. If a positive determination is made, the process proceeds to step 3500, where pool control logic 70 transmits a message to the user (e.g., "Warning—Peak hours. Do you wish to proceed?"). In step 3502, pool control logic 70 receives user input (e.g., yes/no). In step 3504, pool control logic 70 determines if the user wishes to proceed with the desired action. If a negative determination is made, the process ends. If a positive determination is made, the process proceeds to step 3506, where pool control logic 70 transmits an instruction to the pool device to perform the desired action (e.g., pump speed up, spa on, lights on, etc.) and the process ends. If a negative determination is made at step 3498, the process proceeds to step 3506.

Figure 33X:
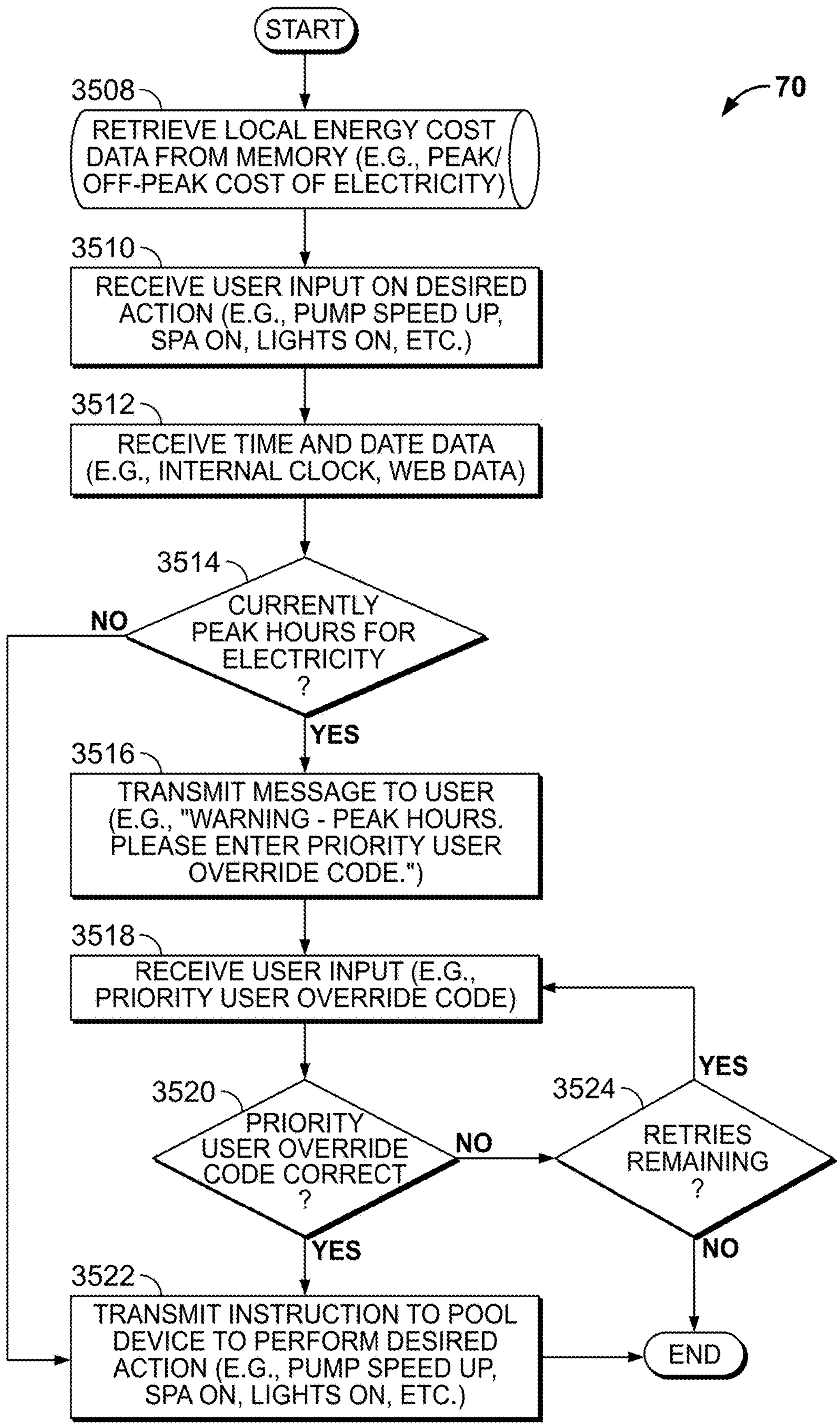

FIG. 33X is a flowchart illustrating processing steps carried out by the pool control logic 70 for preventing use of the system 10 during peak electrical cost hours. In step 3508, pool control logic 70 retrieves local energy cost data from the memory (e.g., peak/off-peak cost of electricity). The web data on the local energy costs can be obtained by way of the process as described herein, in connection with FIG. 33T (e.g., by determining the location of the system 10 and then receiving web data based on that location). In step 3510, pool control logic 70 retrieves user input on a desired action (e.g., pump speed up, spa on, lights on, etc.). In step 3512, pool control logic 70 receives time and date data (e.g., internal clock, or as web data). In step 3514, pool control logic 70 determines if it is currently peak hours for electricity costs. If a positive determination is made, the process proceeds to step 3516, where pool control logic 70 transmits a message to the user (e.g., "Warning—Peak hours. Please enter Priority User override code."). In step 3518, pool control logic 70 receives user input (e.g., Priority User override code). In step 3520, pool control logic 70 determines if the Priority User override code is correct. If a positive determination is made, the process proceeds to step 3522, where pool control logic 70 transmits an instruction to the pool device to perform the desired action (e.g., pump speed up, spa on, lights on, etc.) and the process ends. If a negative determination is made, the process proceeds to step 3524, where pool control logic 70 determines if there are retries remaining (e.g., remaining attempts to enter the correct code). If a negative determination is made at step 3524, the process ends. If a positive determination is made at step 3524, the process reverts to step 3518. If a negative determination is made at step 3514, the process proceeds to step 3522.

Figure 33Y:
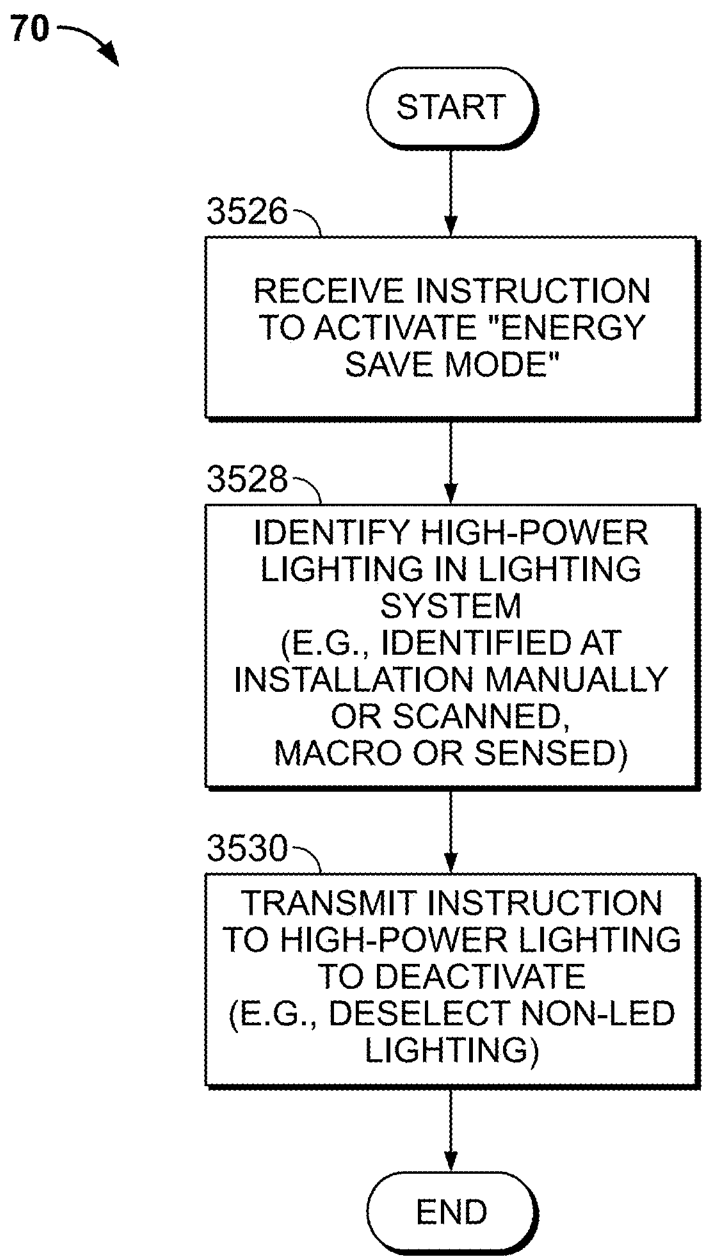

FIG. 33Y is a flowchart illustrating processing steps carried out by the pool control logic 70 for deactivating high-powered systems/devices/components to reduce electrical costs. In step 3526, pool control logic 70 receives an instruction to activate "Energy Save Mode." In step 3528, pool control logic 70 identifies high-powered lighting devices in the lighting system. The high-powered lighting devices could be identified at the time of installation (e.g., manually or scanned) or by pool control logic 70 (e.g., macro or sensed). In step 3530, pool control logic 70 transmits an instruction to the high-powered lighting to deactivate (e.g., deactivate non-LED lighting devices). While the "Energy Save Mode" has been described herein in connection with lighting devices, "Energy Save Mode" could also identify and deactivate any device using an amount power that exceeds a predefined setpoint. Additionally, pool control logic 70 could transmit an instruction to a device to reduce operation until the device is only consuming power at low, predefined setpoint. In addition to the examples discussed hereinabove, in connection with FIGS. 33T-33Y, web data (e.g., 3rd party Web advised conditions, energy cost, weather, environmental, etc.) could be used to prompt/trigger pool control logic 70 (e.g., pump control, valve control, lighting control, cleaner control, etc.) to adjust speed, flow, position, mode, performance, behavior, etc. of any piece of pool equipment or feature, or any other device in communication with the system 10, to reduce energy costs, or to return to a previous state.

Figure 33Z:
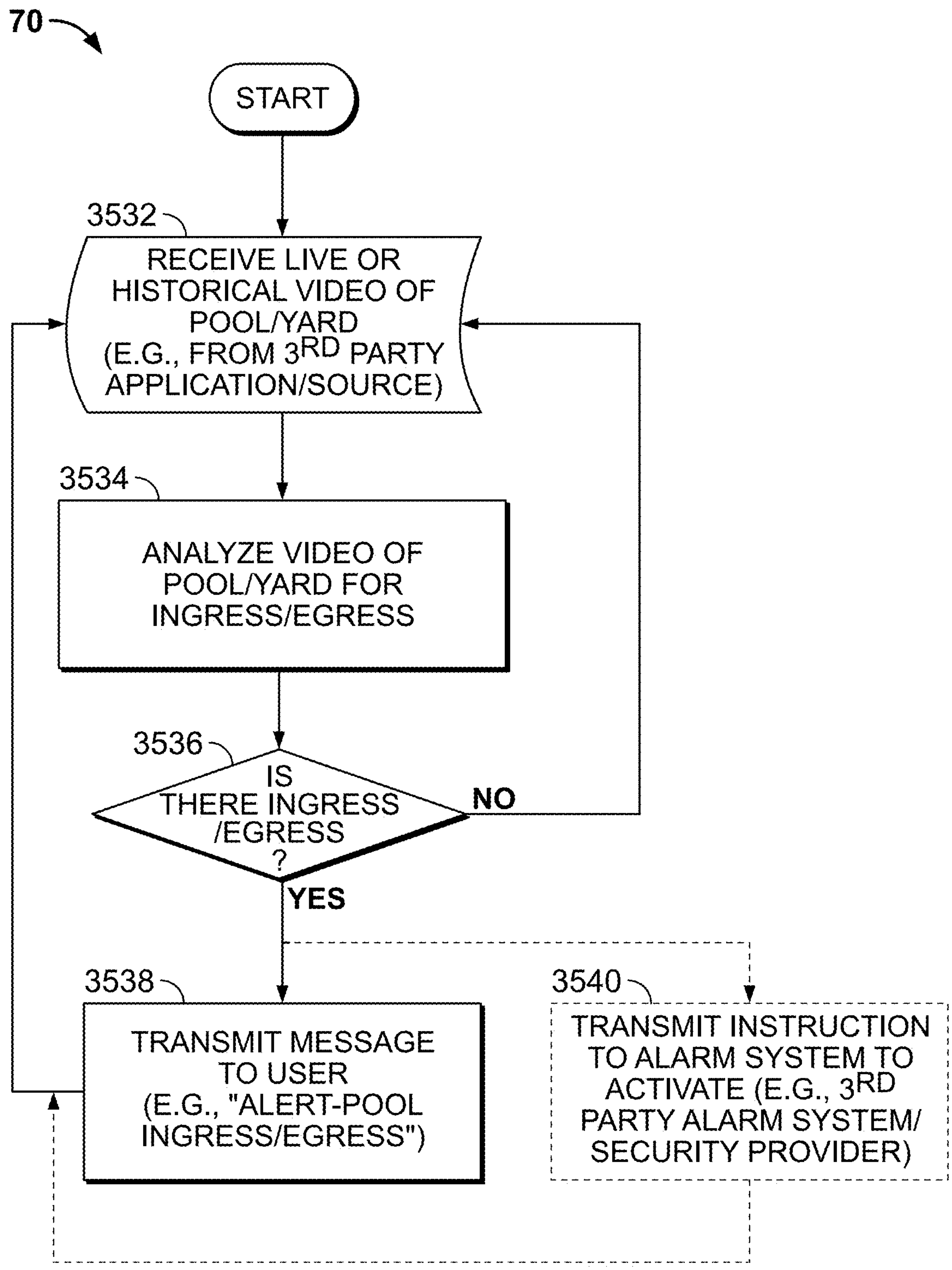
Figure 33A:
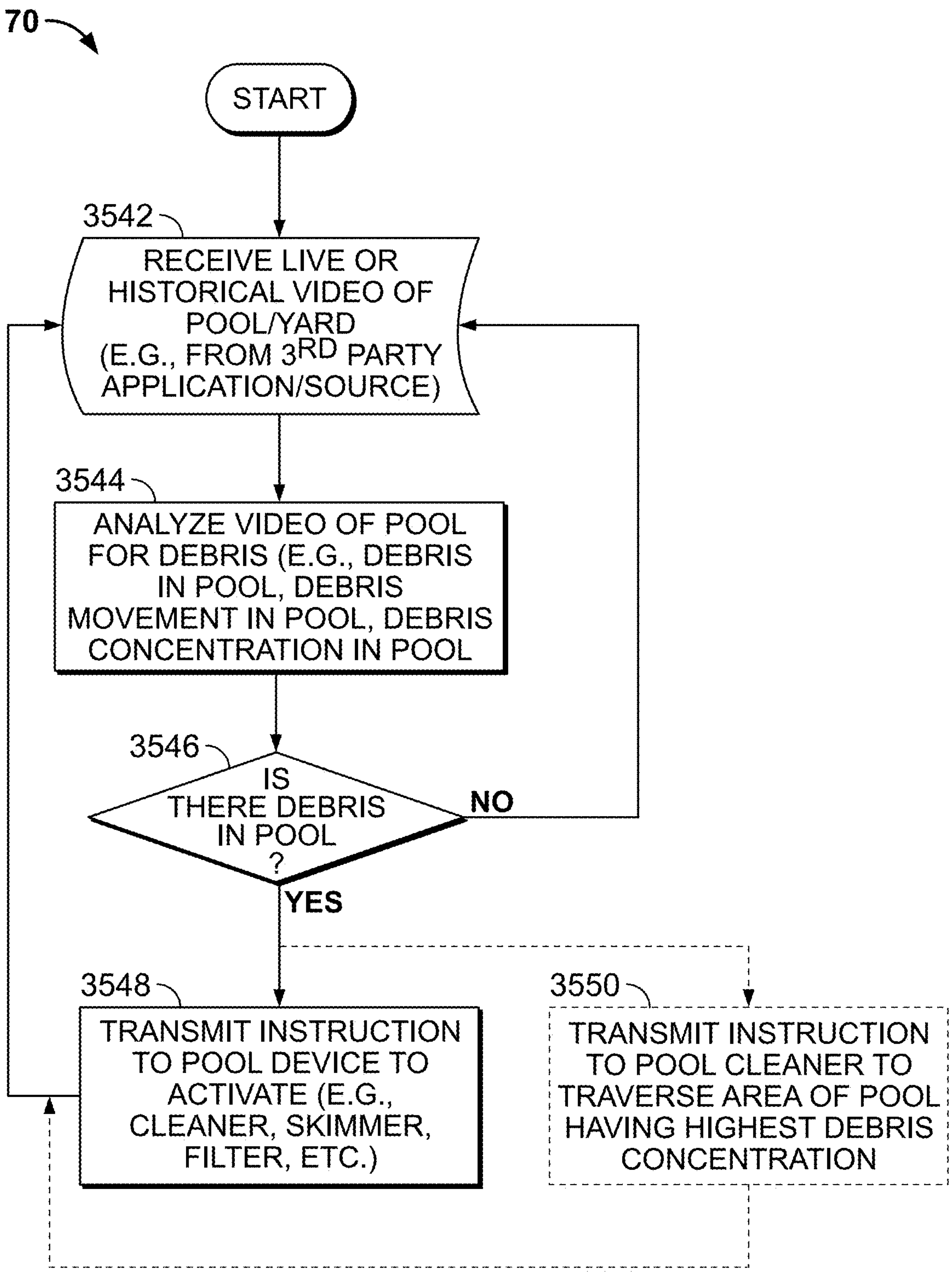
Figure 33A:
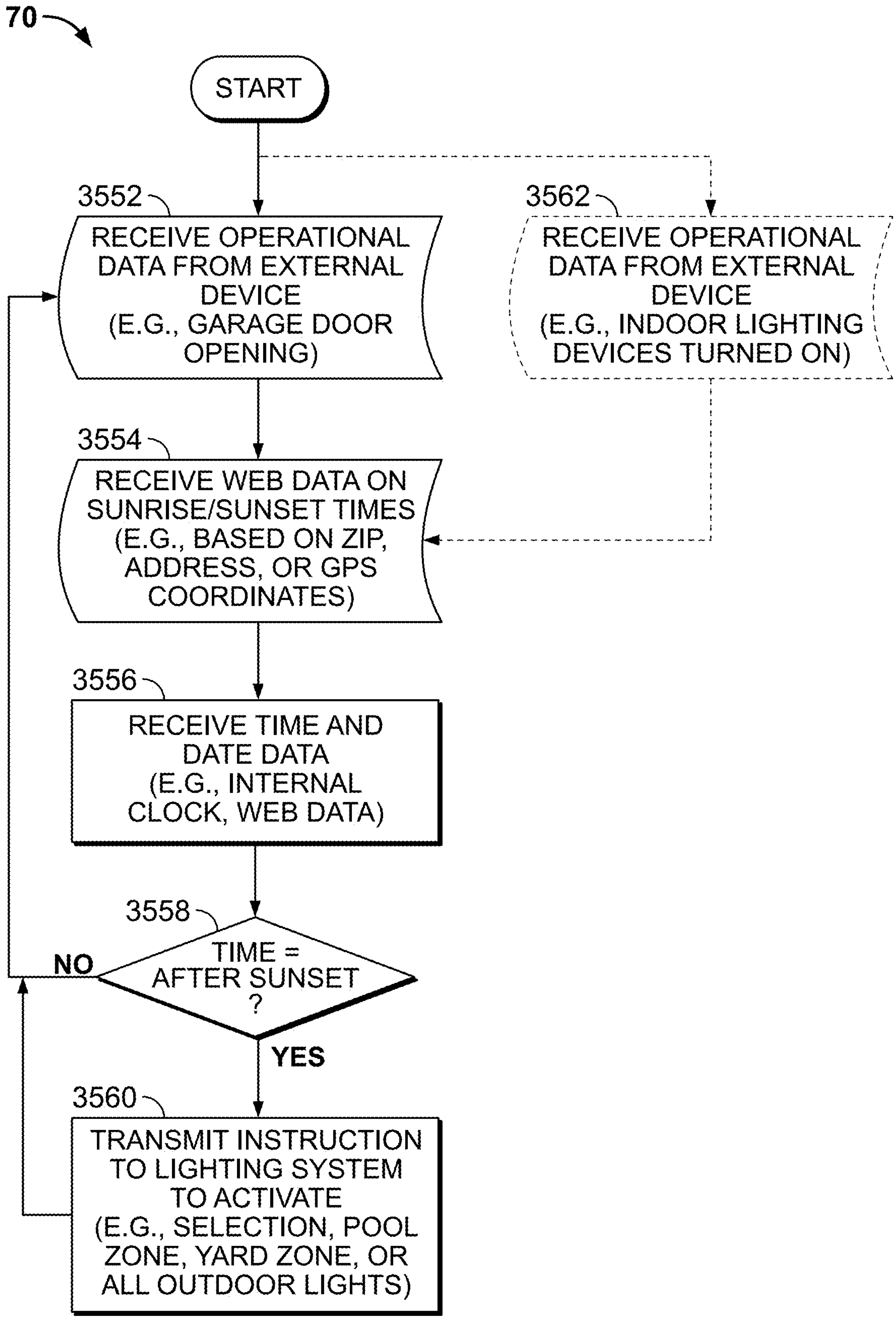
Figure 33A:
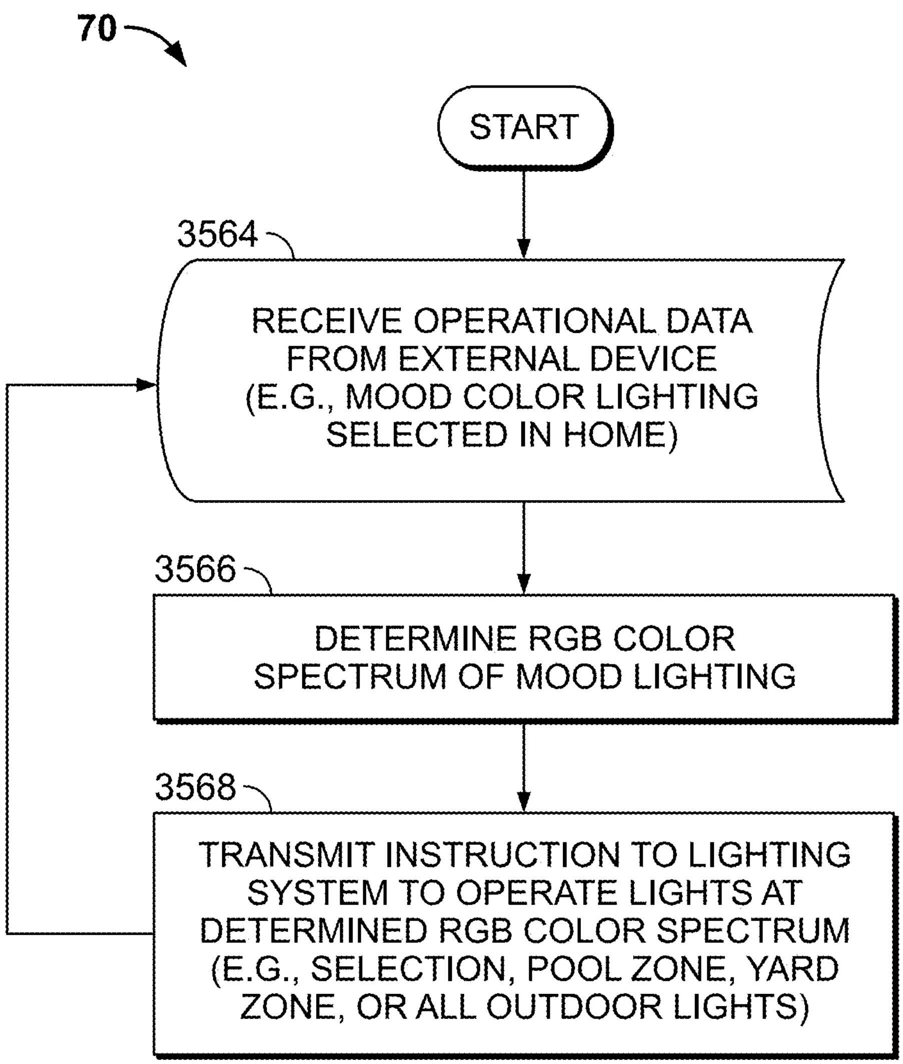
Figure 33A:
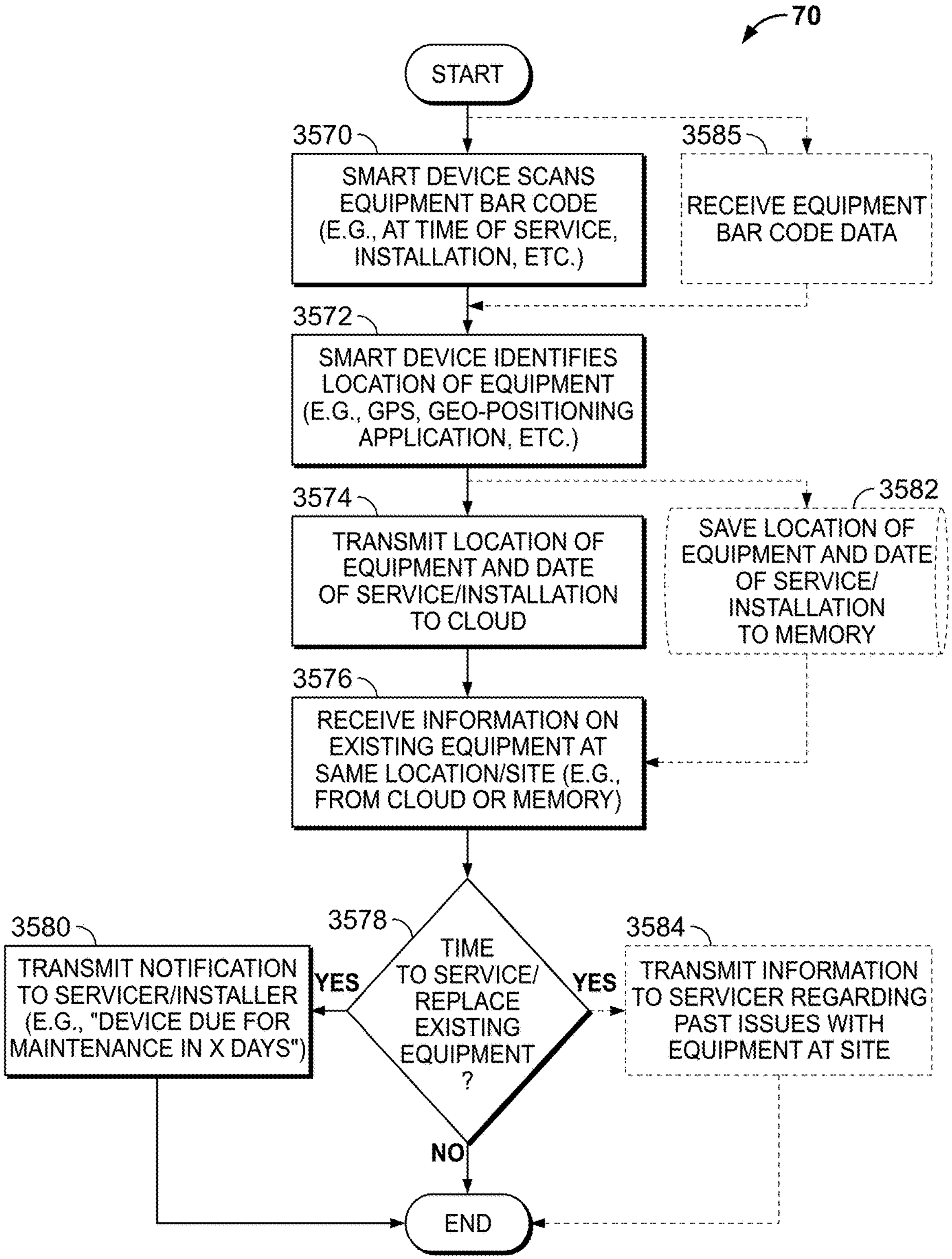
Figure 33A:
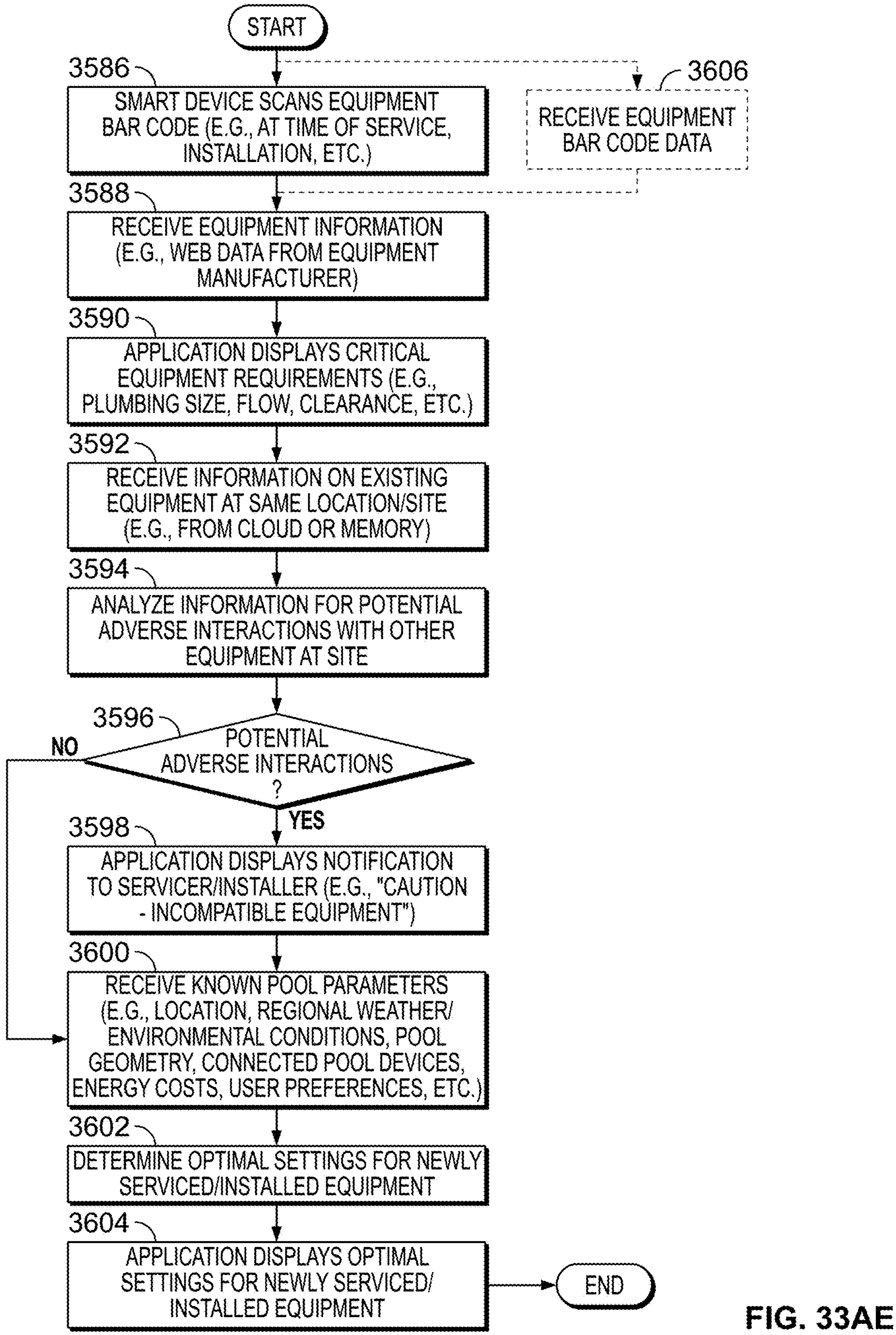
Figure 33A:
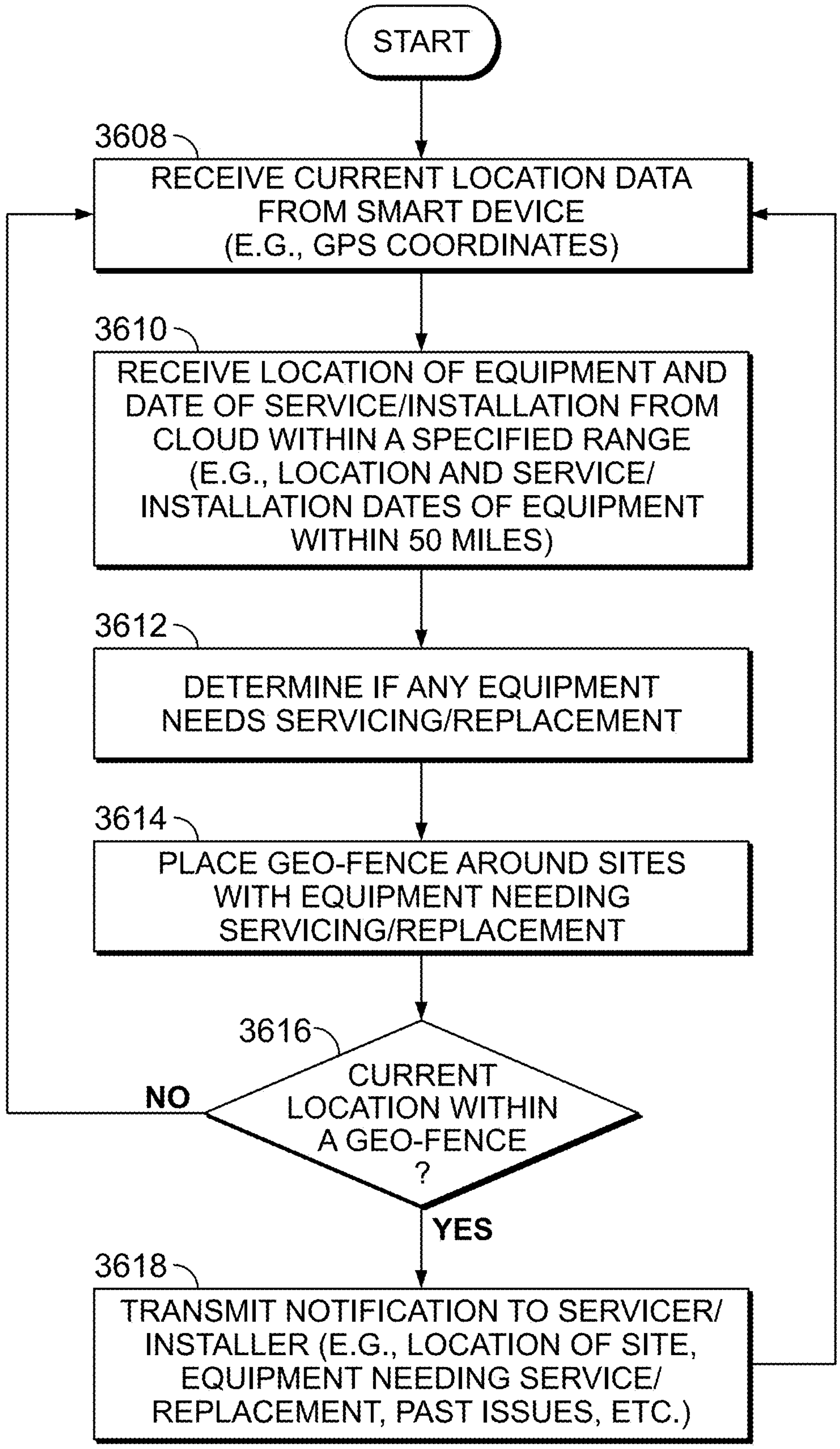
Figure 33A:
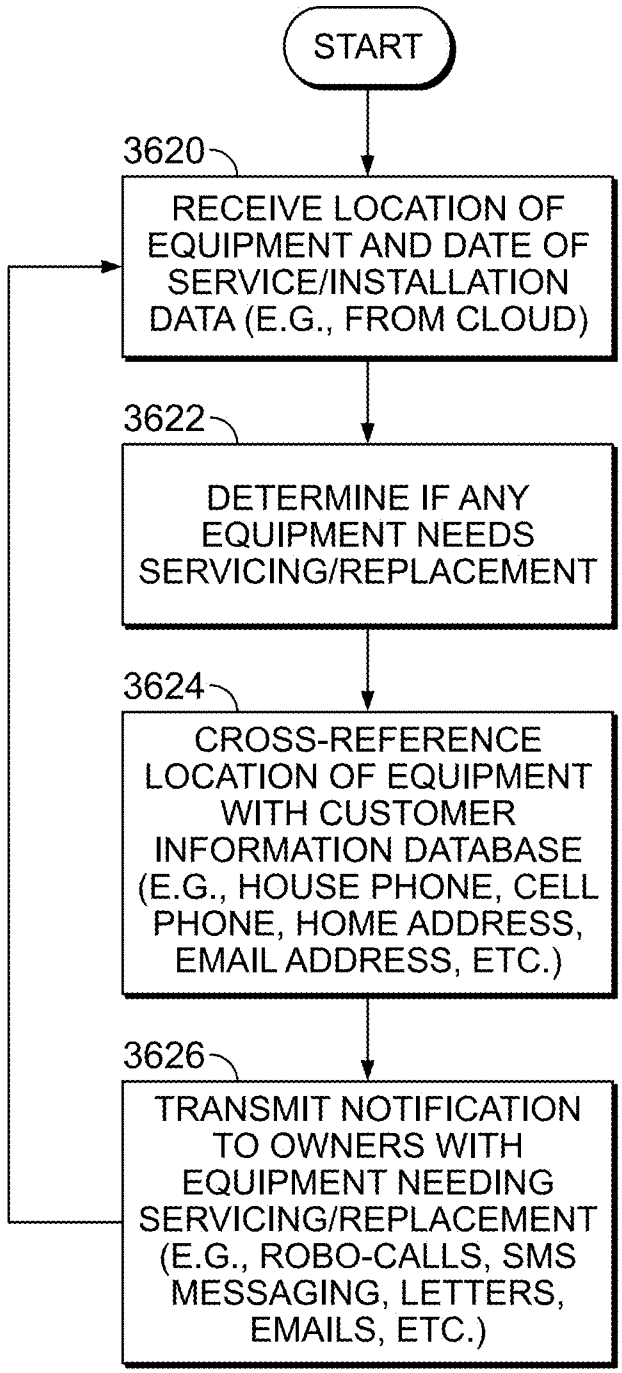
Figure 33A:
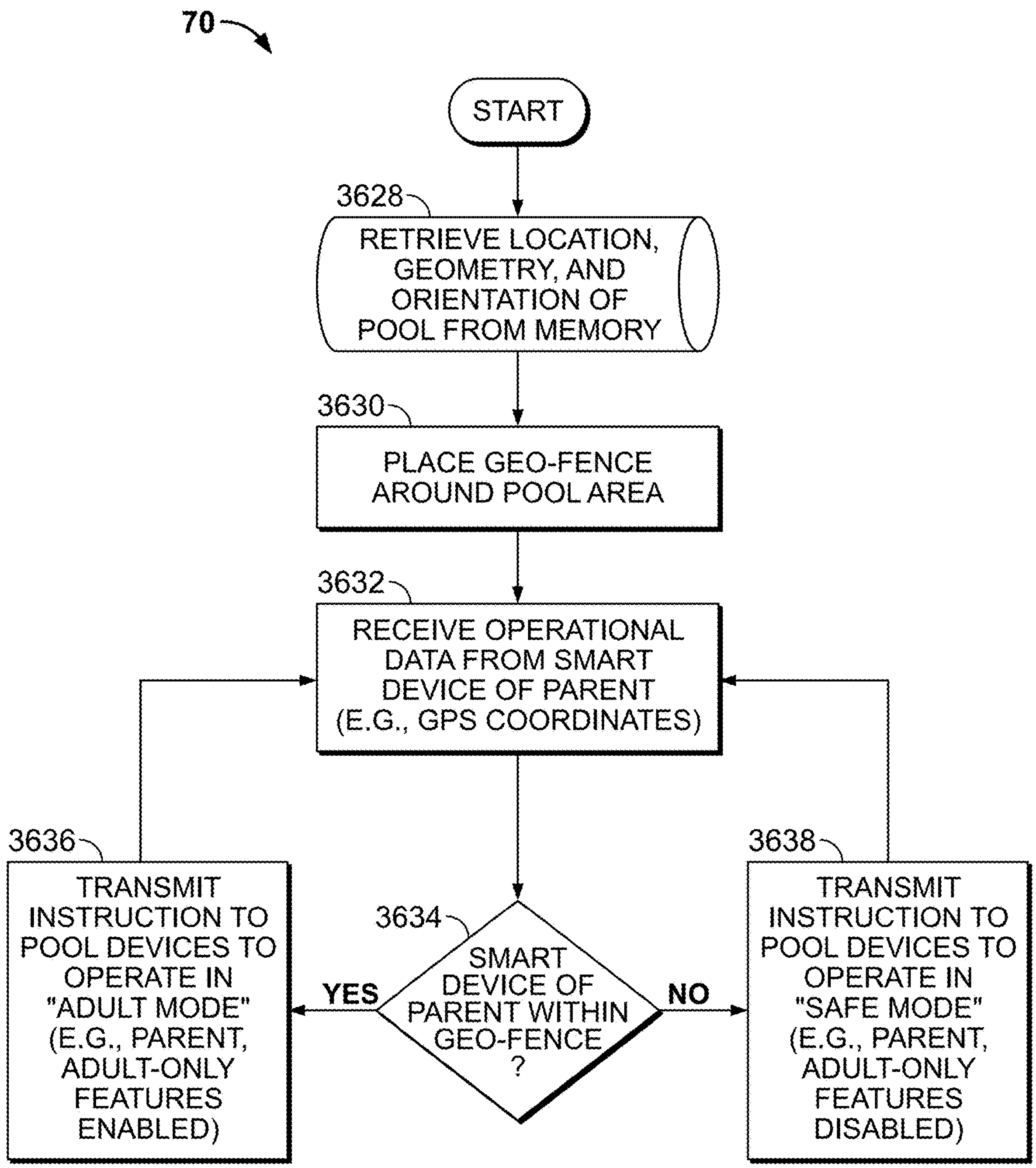

The system of the present disclosure also provides systems for leveraging synergies between the pool control logic 70 and other applications (e.g., connecting to and/or communicating with a common application and sharing a user interface, advising the user of various alerts/conditions, controlling pool functions and/or devices, reaction or synchronization to/with external devices connected through the cloud, etc.). For example, FIG. 33Z is a flowchart illustrating processing steps carried out by the pool control logic 70 for alerting the user to pool/spa area ingress and egress. In step 3532, pool control logic 70 receives live or historical video of the pool/yard (e.g., from 3rd party application/source). In step 3534, pool control logic 70 analyzes the video of the pool/yard for occupant ingress/egress. In step 3536, pool control logic 70 determines if there has been an ingress/egress (e.g., unwanted intrusion, monitoring the whereabouts of children, etc.) in connection with a body of water. If a negative determination is made, the process reverts to step 3532. If a positive determination is made, the process proceeds to step 3538, where pool control logic 70 transmits a message to the user (e.g., "Alert—pool ingress/egress"). The process then reverts to step 3532. Optionally, in step 3540, pool control logic 70 could transmit instructions to an alarm system to activate (e.g., 3rd party alarm system/security provider) and then revert to step 3532. The pool control logic 70 could also communicate with 3rd party security systems (e.g., front-door systems with video, audio, door unlock/lock, etc.) and in-home lighting systems and receive data from 3rd party live satellite image/video feeds.

FIG. 33AA is a flowchart illustrating processing steps carried out by the pool control logic 70 for leveraging video data from a 3rd party to maintain the cleanliness of a pool/spa. In step 3542, pool control logic 70 receives live or historical video of the pool/yard (e.g., from 3rd party application/source). In step 3544, pool control logic 70 analyzes the video of the pool/yard for debris (e.g., presence of debris in pool, debris movement in pool, debris concentration in pool, etc.). In step 3546, pool control logic 70 determines if there is debris in the pool. If a negative determination is made, the process reverts to step 3542. If a positive determination is made, the process proceeds to step 3548, where pool control logic 70 transmits an instruction to a pool device to activate (e.g., cleaner, skimmer, filter, etc.). The process then reverts to step 3542. Optionally, in step 3550, pool control logic 70 could transmit an instruction to a pool cleaner to traverse the area of the pool having the highest concentration of debris, and then revert to step 3542.

FIG. 33AB is a flowchart illustrating processing steps carried out by the pool control logic 70 for operation of the lighting system 14*h* based on operational data from an external source. In step 3552, pool control logic 70 receives operational data from an external source (e.g., a signal that the garage door is opening). Optionally, in step 3562, pool control logic 70 could receive operational data from another external device (e.g., a signal that the indoor lighting devices are turned on). In step 3554, pool control logic 70 receives web data on sunrise/sunset times (e.g., based on ZIP code, address, or GPS coordinates). The web data on the sunrise/sunset times can be obtained by way of the process as described herein, in connection with FIG. 33N (e.g., by determining the location of the system 10 and then receiving web data based on that location). In step 3556, pool control logic 70 receives current time and date data (e.g., from an internal clock, or as web data). In step 3558, pool control logic 70 determines if the current time is after sunset. If a negative determination is made, the process reverts to step 3552. If a positive determination is made, the process proceeds to step 3560, where pool control logic 70 transmits an instruction to the lighting system to activate (e.g., a selection, pool zone, yard zone, or all outdoor lights). The process then reverts to step 3552. In addition to the foregoing, pool control logic 70 could also synchronize/trigger the outdoor/pool lighting system to an "all on" command for the indoor lights. This is particularly useful for emergency lighting scenarios. For example, the indoor lights could receive an "all on" command in response to a triggered smoke detector and pool control logic 70 could transmit an instruction to the lighting system 14*h* to activate all lights at maximum intensity. Pool control logic 70 could determine that an "all on" command has been sent to the indoor lights directly, by receiving the same command (e.g., direct communication or network communication between the indoor lights and/or smoke detector and pool control logic 70), or indirectly, by monitoring the indoor lighting and/or smoke detector (e.g., light sensors or video monitoring for the indoor lighting, noise sensor for the smoke detector, etc.).

FIG. 33AC is a flowchart illustrating processing steps carried out by the pool control logic 70 for matching or synchronizing the operation of the lighting system 14*h* to interior mood lighting in a home. In step 3564, pool control logic 70 receives operational data from an external device (e.g., mood/color lighting selected in a home). Alternatively, pool control logic 70 could receive operational data from a sensor positioned for sensing the lighting conditions (e.g., intensity or color) in the home, or pool control logic 70 could receive operational data from a third party application or video feed showing the lighting conditions in the house. In step 3566, pool control logic 70 determines the RGB color spectrum of the mood lighting. In step 3568, pool control logic 70 transmits an instruction to the lighting system to operate the lights at the determined RGB color spectrum (e.g., matching the mood lighting to a selection, pool zone, yard zone, or all outdoor lights).

FIG. 33AD is a flowchart illustrating processing steps carried out by the pool control logic 70 for communicating with a smart device in the possession of a servicer/installer. In step 3570 the smart device scans an equipment bar code (e.g., at time of service, installation, etc.). Optionally, in step 3585, pool control logic 70 could receive the equipment bar code data scanned by the smart device. In step 3572, the smart device identifies the location of the scanned equipment (e.g., via GPS, geo-positioning application, etc.). In step 3574, the smart device transmits the location of the equipment and the date of service/installation to the cloud. For example, the location of the equipment and date of service/installation could be used for warranty registration, as well as other purposes, as described hereinbelow. The cloud could be accessed by pool control logic 70, or a third party system (e.g., smart device/maintenance system used by servicer/installer). Optionally, in step 3582, pool control logic 70 could save the location of the equipment and the date of service/installation to the memory for later retrieval. In step 3576, pool control logic 70 receives information on existing equipment installed at the same location/site (e.g., from the cloud or from the memory). In step 3578, pool control logic 70 determines if it is at or near time to service/replace any of the existing installed equipment. If a positive determination is made, the process proceeds to step 3580, where pool control logic 70 transmits a notification to the servicer/installer (e.g., "Device due for maintenance in X days") and the process ends. Optionally, if a positive determination is made in step 3578, the process could proceed to step 3584, where pool control logic 70 transmits information to the servicer/installer regarding past issues with the equipment at the location/site and the process ends. If a negative determination is made in step 3578, the process ends. This service information could also be accessed through the cloud and viewed by the servicer/installer, original equipment manufacturer, or authorized service center. The service information could also be provided to the servicer/installer before arrival at the site through a smart device and/or application utilizing geo-fencing and global positioning systems (e.g., a geo-fence is placed around the site and the service information is provided to the servicer/installer upon crossing the geo-fence threshold), discussed hereinbelow.

FIG. 33AE is a flowchart illustrating processing steps carried out by the pool control logic 70 for communicating with an application used by a servicer/installer. In step 3586, a smart device scans an equipment bar code (e.g., at the time of service, installation, etc.). Optionally, in step 3606, pool control logic 70 could receive the equipment bar code data scanned by the smart device. In step 3588, an application on the smart device receives equipment information (e.g., web data from the equipment manufacturer). In step 3590, the application displays critical equipment requirements (e.g., plumbing size, flow, clearance, etc.). In step 3592, the application receives information on existing equipment at the same location/site (e.g., from the cloud or from memory). The application can receive information on existing equipment by way of a similar process as to that described herein, in connection with FIG. 33AD. Alternatively, in addition to scanning the equipment being scanned/installed, any preexisting equipment could be scanned, and data on the preexisting equipment could be received from the cloud or from memory. In step 3594, the application analyzes the information for any potential adverse interactions with other equipment installed at the same location/site. In step 3596, the application determines if there are any potential adverse interactions. If a positive determination is made, the process proceeds to step 3598, where the application displays a notification to the servicer/installer (e.g., "Caution—incompatible equipment"). If a negative determination is made, the process proceeds to step 3600, where the application receives known pool parameters (e.g., location, regional weather/environmental conditions, pool geometry, connected pool devices, energy costs, user preferences, etc.). In step 3602, the application determines optimal settings for the newly serviced/installed equipment. The application can recommend programming based on regional preferences, including seasonal programming (summer, winter, etc.). Further, the application can estimate energy costs based on location weather data and other locational factors. The price estimation can take into account local currency. In step 3604, the application displays the optimal settings for the newly serviced/installed equipment. While the process described hereinabove, in connection with FIG. 33AE, makes reference to an application that could be used by a servicer/installer, pool control logic 70 could also accomplish these same steps.

It is noted that global positioning and geo-fencing systems could be utilized with the systems of the present disclosure to provide a servicer with service opportunities (e.g., time to service/replace existing equipment). For example, a smart device having a global positioning system could be used to alert the servicer of service opportunities when an application on the smart device recognizes that the current location of the smart device is within a specified range of a geo-fenced area around a site having equipment in need of servicing/replacement. In this regard, FIG. 33AF is a flowchart illustrating processing steps carried out by notifying a servicer of servicing opportunities around his/her current location. In step 3608, an application receives current location data (e.g., GPS coordinates) from a smart device. The application could run on the smart device, a laptop, a remote server having a web-accessible user interface, or any other suitable mobile device that can accompany the servicer/installer. In step 3610, the application receives the location of equipment and date of service/installation from the cloud within a specified range (e.g., location and service/installation dates of equipment within 50 miles. In step 3612, the application determines if any of the equipment within the specified range needs servicing/replacement. In step 3614, the application places a geo-fence around sites with equipment needing servicing/replacement. In step 3616, the application determines if the current location of the smart device (e.g., mobile device running application and carried by the servicer) is within a geo-fenced area. If a negative determination is made, the process reverts to step 3608. If a positive determination is made, the process proceeds to step 3618, where the application transmits a notification to the servicer/installer (e.g., location of site, equipment needing service/replacement, past issues, etc.) and the process reverts to step 3608. While the process described hereinabove, in connection with FIG. 33AE, makes reference to an application that could be used by a servicer/installer, pool control logic 70 could also accomplish/be used in connection with these same steps. For example, pool control logic 70 could transmit the location and service date of the equipment to the cloud or same the data to memory, where the data is later accessed by the application, or pool control logic 70 could determine if any of the equipment needs servicing/replacing and transmit a notification to the application regarding same.

FIG. 33AG is a flowchart illustrating processing steps of a maintenance/targeted marketing system in accordance with the system of the present disclosure for notifying a pool/spa owner that equipment is in need of service. In step 3620, the maintenance system receives (e.g., from pool control logic, cloud, servicer, etc.) data on the location of equipment and date of service/installation. In step 3622, the maintenance system determines if any equipment needs servicing/replacement. In step 3624, the maintenance system cross-references the location of the equipment needing servicing/replacement with a customer information database (e.g., house phone, cellular phone, home address, email address, etc.). In step 3626, the maintenance system transmits a notifications to owners/users with equipment needing servicing/replacement (e.g., robo-calls, SMS messaging, letters, emails, etc.).

FIG. 33AH is a flowchart illustrating processing steps carried out by the pool control logic 70 for limiting the operation of pool devices when the an adult is not present. In step 3628, pool control logic 70 retrieves pool location, geometry, and orientation data from memory. The pool location, geometry, and orientation data can be obtained by way of the process described herein, in connection with FIG. 33A. In step 3630, pool control logic 70 places a geo-fence around the pool/spa area. In step 3632, pool control logic 70 receives operational data from a smart device of an adult/parent (e.g., GPS coordinates). In step 3634, pool control logic 70 determines if the smart device is within the geo-fenced area. If a positive determination is made, the process proceeds to step 3636, where pool control logic 70 transmits an instruction to the pool devices to operate in "Adult Mode" (e.g., parent, adult-only, features enabled) and the process reverts to step 3632. If a negative determination is made, the process proceeds to step 3638, where pool control logic 70 transmits an instruction to the pool devices to operate in "Safe Mode" (e.g., parent, adult-only, features disabled) and the process reverts to step 3632.

FIGS. 34A-34J are diagrams showing additional embodiments of the pool and/or spa control system of the present disclosure, indicated generally at 4610. More specifically, FIGS. 34A-34J illustrate modular relays 4670, a wiring hub 4646, and a control module 4661 provided in accordance with the present disclosure.

Figure 34A:
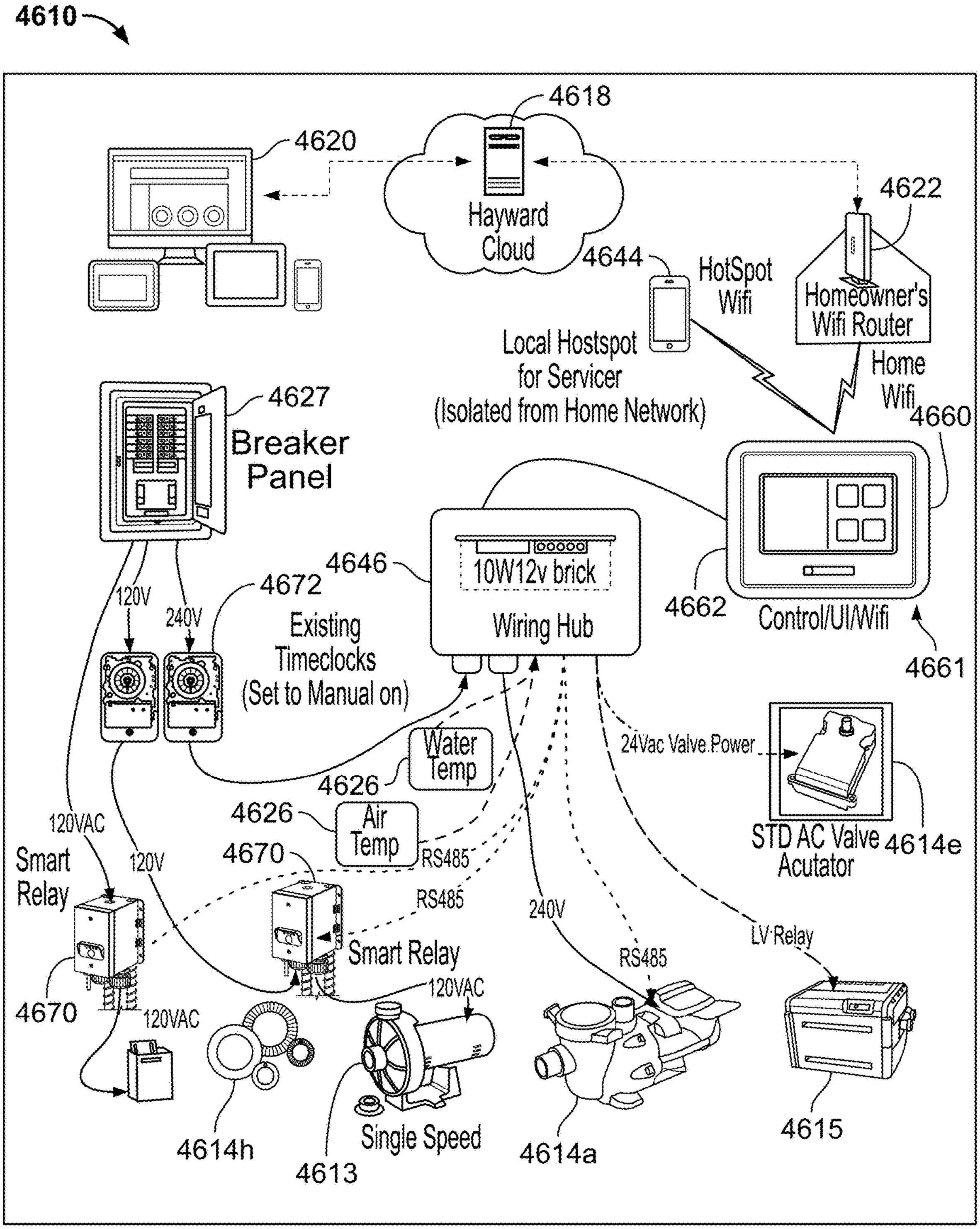
FIGS. 34A-34J are diagrams illustrating another embodiment of the system of the present disclosure.

FIG. 34A is a diagram illustrating another embodiment of the system of the present disclosure, indicated generally at 4610. In this embodiment, network connectivity and remote monitoring/control is provided by way of a wiring hub 4646 which can be easily mounted to a variety of surfaces (discussed hereinbelow in connection with FIGS. 34F-34I. The wiring hub 4646 provides connections for various pool and spa equipment, such as a variable speed pump 4614*a*, a single-speed pump 4613, and a legacy heater 4615, as well as other equipment. For example, the hub 4646 could communicate with and control a smart valve actuator 4614*e*, and/or lighting system 4614*h*. Optional smart control relays 4670 could also be in communication with the hub 4646, or could communicate with any other HUA (e.g., a unique addressing system, digital, analog or mechanical switches or dip switches) enabled pool/spa component capable of receiving or assigning a network address.

As can be seen, the hub 4646 could be in communication (e.g., using any of the wired or wireless connections and associated communication protocols discussed hereinabove) with a control module 4661 having a user interface 4660. The user interface device 4660 could include physical keys, a digital display, and/or a touchscreen 4662, as shown in FIG. 34A. Any other suitable input technologies, or any combination thereof, could also be utilized, thereby enabling a user to interact with the pool and/or spa control system 10. Additionally, the control module 4661 could provide a WiFi hotspot for allowing a service provider's cellular telephone, tablet computer, or other mobile computing device 4644 to communicate with the system 10, and to control the pool/spa equipment shown in FIG. 34A. Communication between the service provider's cellular telephone, tablet computer, or other mobile computing device 4644 and the system 10 could be established using the user interface 4660 (e.g., using physical keys, a digital display, and/or by touch) or by proximity to the control module 4661, described in greater detail hereinbelow. A breaker panel 4627 provides electrical power to the various devices shown in FIG. 34A. Breaker panel 4627 could also be a smart circuit breaker (e.g., a circuit breaker that can be controlled via wired or wireless communication) used to provide and/or to interrupt power to the devices disclosed herein. In some embodiments, photovoltaic (e.g., solar) cells and/or systems could provide electrical power to one or more of the various devices shown in FIG. 34A. The hub 4646 could also communicate with the homeowner's WiFi router 4622 via the control module 4661, thereby providing an Internet connection to the pool/spa components in communication with the wiring hub 4646. A remote pool/spa server 4618 could communicate with the router 4622 via the Internet, to provide remote monitoring and control of the pool/spa equipment, if desired. Additionally, the server 4618 could communicate with one or more remote computer systems 4620 such as a smart phone, a tablet computer, a remote computer system, home automation, etc., if desired. The pool/spa control logic discussed herein could be installed in the server 4618, in one or more of the remote computers 4620, and/or in the control module 4661, if desired.

As illustrated in FIG. 34A, the system could include a control/UI/WiFi module 4661 which includes an external controlling unit 4660 having a user interface ("UI") display 4662, a control board with processor and memory (not shown), and which is able to communicate with a home router 4622 by way of a wired or wireless connection (e.g., integral WiFi/cellular/RF, wired Ethernet, and/or an external WiFi/cellular antenna). More specifically, the Control/UI/WiFi module 4661 could include a printed circuit board (not shown), a control module having a processor and memory, a graphical user interface display 4662 (e.g., LCD, LED, buttons, knobs, capacitive plastic, etc.), a WiFi module, ethernet jack, USB port, LEDs, a sealed enclosure, a mounting bracket (e.g., for mounting the module 4661 to a wall, post, pole, plumbing, etc.), and a means for communication with a wiring hub 4646. In other embodiments, the control module 4661 could be mounted on or inside another piece of equipment such as, for example, a pump, heater, chlorinator, control, timeclock, etc.) The control module 4661 could communicate with the wiring hub 4646 by way of either wired (e.g., RS485, ethernet, USB, serial, etc.) or wireless (e.g., WiFi, Bluetooth, Zigbee, ZWave, cellular, thread, etc.) communication protocols.

The wiring hub 4646 includes an enclosure, provisions for wire routing (meeting or exceeding IPxx ingress protection standards), a printed circuit board, and a power cord "whip" (cable). The wiring hub could be provided with communication interfaces for receiving and transmitting data to one or more devices. For example, the wiring hub could communicate with, temperature sensors, external sensor, flow sensors, pressure sensors, chemical and physical property sensors, valve actuator ports, RS485 bus connections (for smart devices, smart relay(s), smart (firmware assisted) valves, smart sensors, and other smart devices) chlorination connections, lighting connections, power connectors, low voltage relays, etc. Additionally, the communication interfaces could also be used to expand the functionality of the wiring hub such as, for example, by being used to interface with wireless communication chips (e.g., WiFi, Bluetooth, Zigbee, ZWave, cellular, thread, etc.), and additional communication modules.

The Control/UI/WiFi module 4661 is used to monitor, activate, and operate installed pool equipment. The control module 4661 could operate the equipment as needed with people present or absent, in the pool or around the backyard, which may be year-round and/or all-day based on application (e.g. residential vs. commercial) or location. The control module 4661 also monitors, detects, informs, and initiates protective action through a heuristic capability (using one or more algorithms) by accumulating and analyzing raw sensor data and external data to automatically develop 'normal' and 'abnormal' operating ranges, then taking action or alerting operators when the algorithm detects that operation is out of normal or safe operating range. The heuristic algorithms can also learn from operator response to a condition, and therefore account for factors not anticipated or sensed by the equipment. Such algorithms could be implemented in any of the embodiments discussed in the present disclosure, and need not be limited to the control module 4661.

The control module 4661 provides for distributed (e.g., the control module can be moved throughout the pool/spa environment based on the particular needs of the pool/spa environment and needs/wants of the pool/spa user) control of pool equipment and conditions that can be moved according to the specific needs of a particular pool/spa environment and/or user. For example, the control module 4661 could be moved away from the power switching or pool equipment to a remote location, closer to the wireless network, or closer to the home, or closer to wherever the user is (e.g., poolside). In addition, the control module 4661 could also allow for full pool control capability to be moved, or transferred, to a remote location from the pool pad, such as for example, to a cloud server 4618 or to a remote office.

The connection to the wiring hub can be extended or virtualized via communications protocol over other mediums. The wiring hub 4646 could locally switch power or the wiring hub 4646 could command smart relays 4670 (discussed hereinbelow) to switch power or control signals. The wiring hub 4646 could further be provided with "limp mode" behaviors (discussed in greater detail hereinbelow) if communication to the controller is severed or impaired. These behaviors could include, but are not limited to, maintaining interlocks between relays, schedules, or other special behaviors that are intended to keep the pool system functional at a reduced level until normal operation is restored. The wiring hub 4646 could also integrate safety control functions needed for heating or other appliances, or the wiring hub 4646 could directly communicate with such safety controls.

The control module 4661 and wiring hub 4646 could be mounted on a wall, on a post, on a stake (e.g., rebar), on a piece of plumbing, inside or on a piece of existing pool/spa equipment (e.g., pump, heater, chlorinator, existing automation, etc.). Further the control module 4661 and wiring hub 4646 may be mounted together in a single location or mounted separately.

The wiring hub 4646 could provide power to the control system by tapping existing power connections at the load end of the conduit coming from a sub panel, timeclock, control, junction box or other electrical connection to the powered equipment. After turning off the power at breaker 4627, a pool installer or service professional could remove the power whip from the existing equipment, and then reconnect the power whip to the wiring hub, thereby providing power to the wiring hub and control module 4661 without having to access the line voltage compartment of an electrical panel. Further, a new whip could then be connected to the wiring hub 4646 which could, in turn, deliver power from the wiring hub 4646 to additional powered equipment (see FIGS. 34B and 34C). For example, an existing power conduit from a variable speed pump 4614*a* or a single speed pump 4613 could be disconnected from the variable speed pump 4614*a* and then plugged back into, or otherwise connected to, the wiring hub 4646. A new power whip could then be used to connect the wiring hub 4646 to the variable speed pump 4614*a*. Further, a communication cable (e.g., RS485) could be connected between the wiring hub 4646 and the variable speed pump 4614 to provide communication therebetween. In another example, the installed power conduit from a heater 4615 could be disconnected from the heater 4615 and then plugged into, or otherwise connected to, the wiring hub 4646. A new power conduit could then be used to connect the wiring hub 4646 to the heater 4615 and a communication cable (e.g., RS485) could be connected between the wiring hub 4646 and the heater 4615 to provide communication therebetween. In a further example, the installed power conduit from a powered device (e.g., pump, heater, chlorinator, cleaner, transformer, etc.) is disconnected from the powered device and then reconnected to an input of the wiring hub 4646. A new power conduit cable is then used to connect the wiring hub 4646 to a smart relay 4670 and an additional power conduit cable is used to connect the smart relay 4670 to the powered device (e.g., pump, heater, chlorinator, cleaner, transformer, etc.). As illustrated in FIG. 34F, the wiring hub 4646 and/or control/UI/WiFi module 4661 could also be powered directly from a 120V/240V NEMA style plug, thereby qualifying as a cord-connected appliance. Because safety codes allow for increased flexibility in the location and mounting of cord-connected appliances, the labor to install or retrofit the devices is reduced, and the accessibility to the user, installer, or site wiring technician is improved. The modular nature of the wiring hub 4646 and control module 4661 provides for configurations thereof that are tailored for integration with the installed pool/spa equipment (e.g., such as a pump, heater, chlorinator, etc.) or that can remain in stand-alone configurations, thereby providing flexible communication to the controlled devices (e.g., via a wired or wireless connection). It is within the scope of the present disclosure that any and all of the pool control logic described herein could be located in and run from the wiring hub 4646 and/or the control module 4661.

The modular relays of the present disclosure could be used in connection with both residential and some commercial applications. The modular relays provide control (e.g., activation and deactivation) of a piece of pool equipment based on a control signal received from a controller (e.g., control module 4661) or local manual input (discussed hereinbelow). For example, the modular relay 4670 could be used to control a pump, cleaner booster, spa booster, heater, pool lights, spa lights, landscape lights, post lights, accent lights, other types of lights, fans, chlorinators, water feature pumps, pond pumps, and cleaners, as well as additional pieces of electrically powered/controlled pool/spa equipment and yard equipment/devices. The modular relay 4670 could include a printed circuit board, a processor, an HUA (e.g., a unique addressing system, digital, analog or mechanical switches or dip switches), activation and/or deactivation button, status LEDs, a relay (s), an enclosure with multiple power entries, a power cord whip, and wired (e.g., RS485, USB, ethernet, etc.) and/or wireless communication (e.g., WiFi, Bluetooth, Bluetooth LE, ZWave, Zigbee, cellular, thread, mesh, etc.) interfaces for communicating with the controlling hardware.

The modular relay 4670 can be controlled by a variety of controlling devices. For example, the relay 4670 could be controlled on schedule (e.g., existing timeclocks 4672), using an algorithm (e.g., controller/pool control logic 70), through user input (e.g., a button on the modular relay), from a web enabled device (e.g., through the cloud, the router or direct) or in stand-alone manual mode. The controlling devices could include, but are not limited to, a pump, a heater, a cleaner, a salt chlorinator, a lighting controller, a chemical automation system, a hub or an existing controller, a smart phone, tablet, computer, or smartwatch, or a voice enabled device (e.g., Amazon Echo).

The modular relay of the present disclosure could be capable of detecting when there is no communication from a controlling system/device, if the modular relay has not yet been configured, or if the modular relay has been improperly operated or installed, and in response, placing itself in stand-alone manual or 'limp' modes.

In stand-alone mode (as well as service, manual, limp or other modes which are independent from commands from a controller), the relay can operate independently of the pool/spa control system. For example, in the event that communication with the control system could not be established, the modular relay could automatically enter standalone mode. In standalone mode, the modular relay could provide a visual indication (e.g., a flashing or steadily illuminated multicolor LED status indicator) that communication with the control system could not be established, or that communication has been severed. The modular relay could then implement a limp mode for the relay. In limp mode the modular relay could still be activated in response to timed events/schedules. The behaviors of the modular relay when in manual or limp modes could be defined by firmware or set by user preference, thus providing the ability to maintain a schedule, always turn off, always turn on, switch to a special schedule, or other actions intended to maintain the water body while the pool/spa control system is in a state of reduced functionality.

The relay could also enter service mode in response to motion or other proximity detection (e.g., when a service provider is in close proximity to a piece of pool/spa equipment), geofencing (e.g., when a service provider enters the vicinity of the pool/spa area), voice command (e.g., in response to audible request to "enter service mode") or a button press (e.g., a physical "service" button located on the relay). Service mode could also allow a technician to temporarily operate the relay and then pass control back (e.g., manually or via a timer) to the controller. The modular relay device could also allow local control (e.g., by touch or voice) at the smart relay without disabling remote control.

In an exemplary embodiment the relay could enter service mode in response to a service provider being in close proximity to the relay. For example, an application running on the service provider's mobile device could communicate with the relay using any of the communication protocols heretofore described and grant the service provider access to configuration parameters for the relay and/or the pool control system 10. In further embodiments, additional security measures could be implemented for preventing unauthorized access to the configuration parameters. For example, a password could be required for access to the configuration parameters. The password could be stored within the application so as to auto-populate and unlock the system parameters when the service provider is in close proximity to the relay. Alternatively, the service provider could be prompted for a password when in close proximity to the relay. Multiple passwords could be set so as to unlock various system parameters associated with individual passwords. For example, a service provider password could be used to unlock all of the system parameters, whereas a pool user password could only unlock a subset of the system parameters.

The modular relay could indicate the status of the modular relay through LEDs (e.g., integrated into the modular relay), text, graphics, or sound (e.g., provided on a user interface device), or directly to web, WiFi, Bluetooth, Zigbee enabled devices (e.g., smartphones and other mobile devices). For example the status indications could include, but are not limited to, power, Internet connection, communicating with the system, no communication with the system, WiFi connected, no WiFi, controlled mode, service mode, enabled or disabled, current, voltage, runtime history, actuation history, etc.

The smart relay can identify itself to a controller (e.g., by providing a physical or network address, or by asking for an address to be provided by the controller automatically), thereby allowing the modular relay to communicate with, and be controlled by the controller. The modular relay could also be manually given a particular network address. The controller could control one or a plurality of relays independently, in a timed sequence, or simultaneously.

As illustrated in FIG. 34A discussed in greater detail hereinbelow, the modular relay device could be provided with its own proprietary/dedicated electrical/junction box ("enclosure") for one (e.g., relay 4670) or a plurality of relays (e.g., wiring hub 4646), but could also be installed in an existing single gang, dual gang, timeclock, or non-traditional electrical/junction box. As shown in FIGS. 34G-34I, the proprietary/dedicated enclosure of the modular relay device could be provided with a multitude of means for mounting the enclosure to the pool pad. For example, the means for mounting the enclosure could include, but are not limited to, hose clamps, screw holes, rebar mounts, zip-tie holes, etc. FIG. 34F illustrates the modular relay 4670 with integral means for mounting to a plumbing pipe (e.g., rounded back). FIG. 34G illustrates the modular relay 4670 with integral means for mounting to a pole (e.g., rounded back). FIG. 34H illustrates the modular relay 4670 with integral means for mounting to a post or wall (e.g., screw bosses). FIG. 34I illustrates the modular relay 4670 with integral means for mounting to rebar inserts (e.g., rebar holders). A secondary structure could also be provided and could include one or more of the means for mounting the enclosure.

Figure 34B:
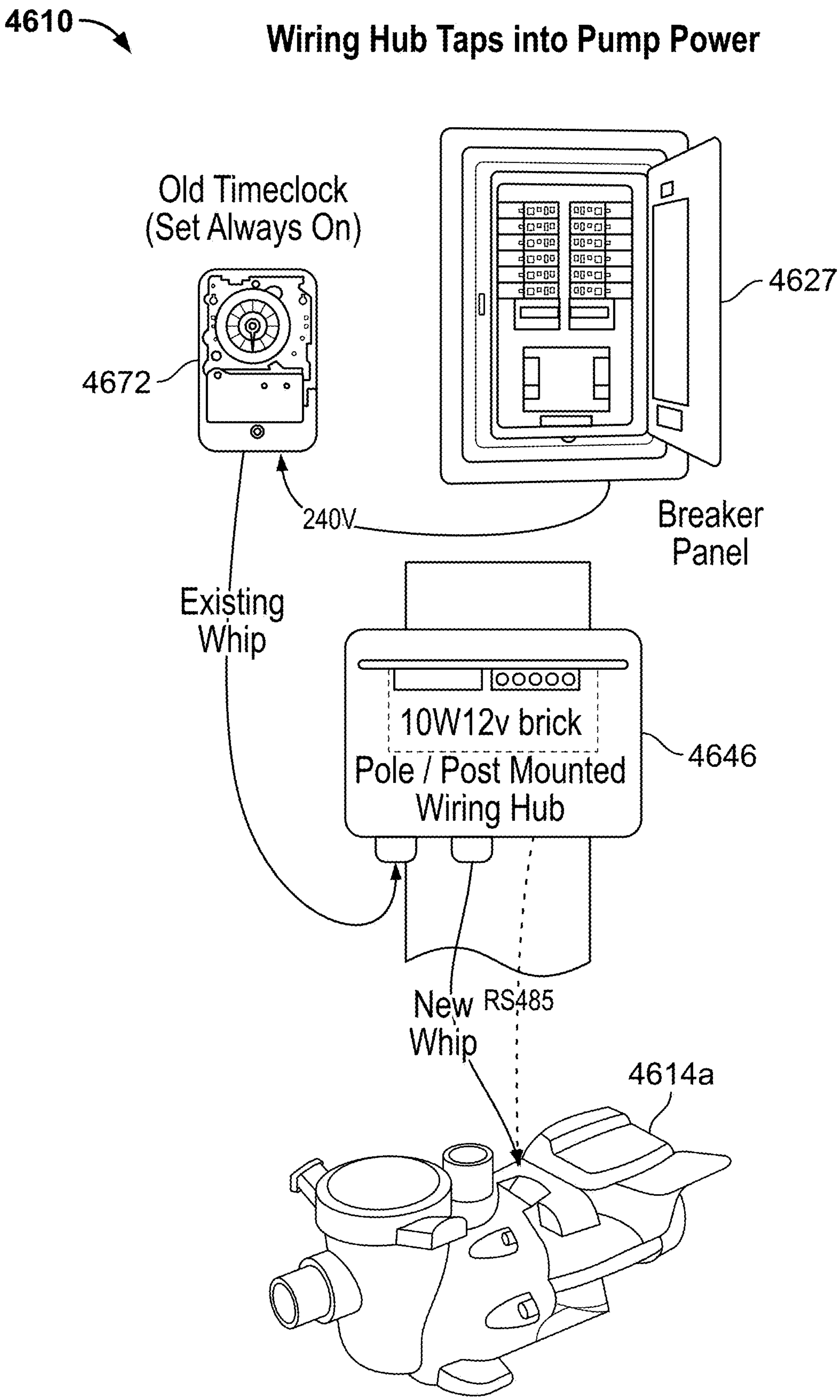
Figure 34C:
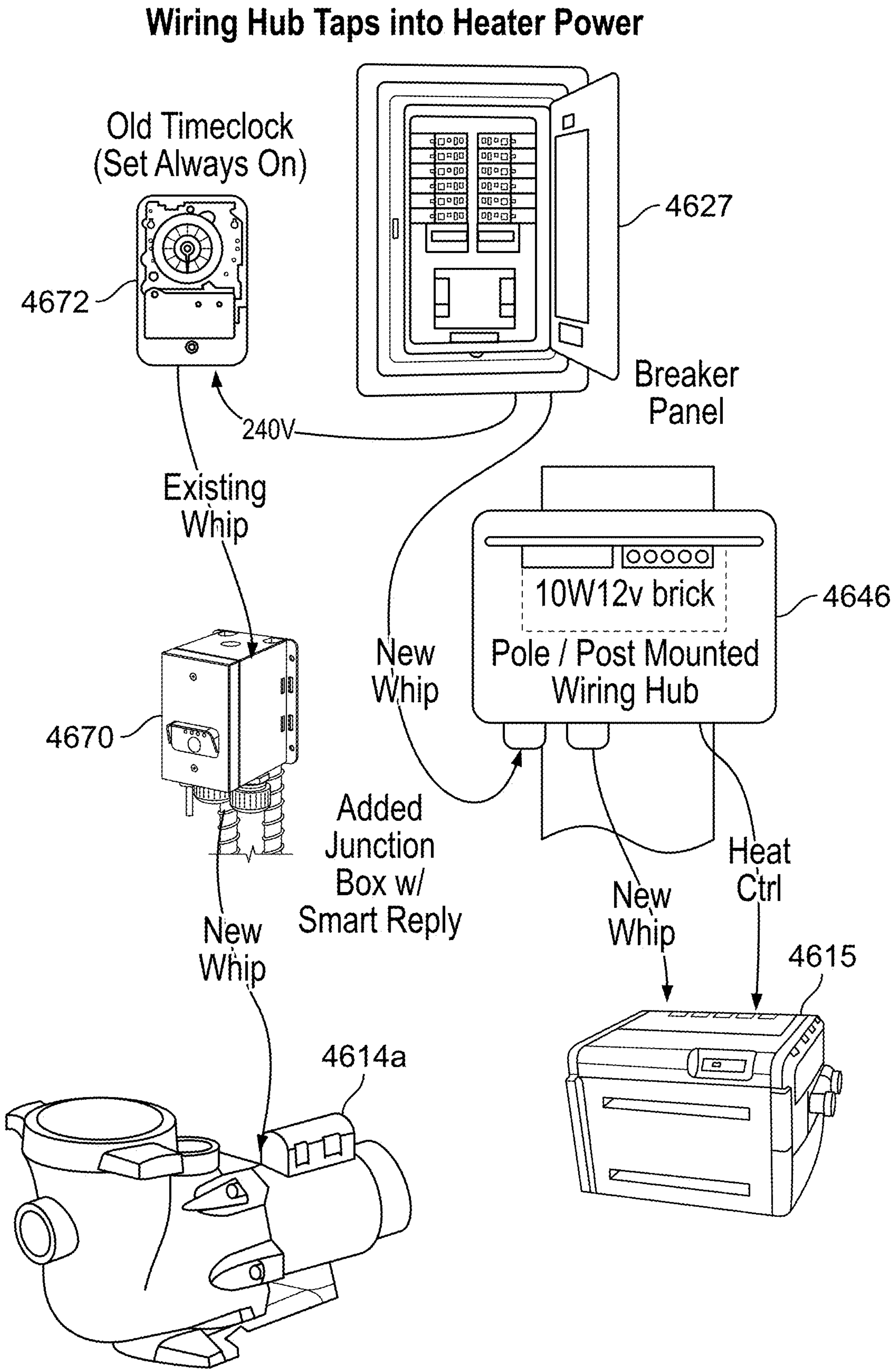
Figure 34D:
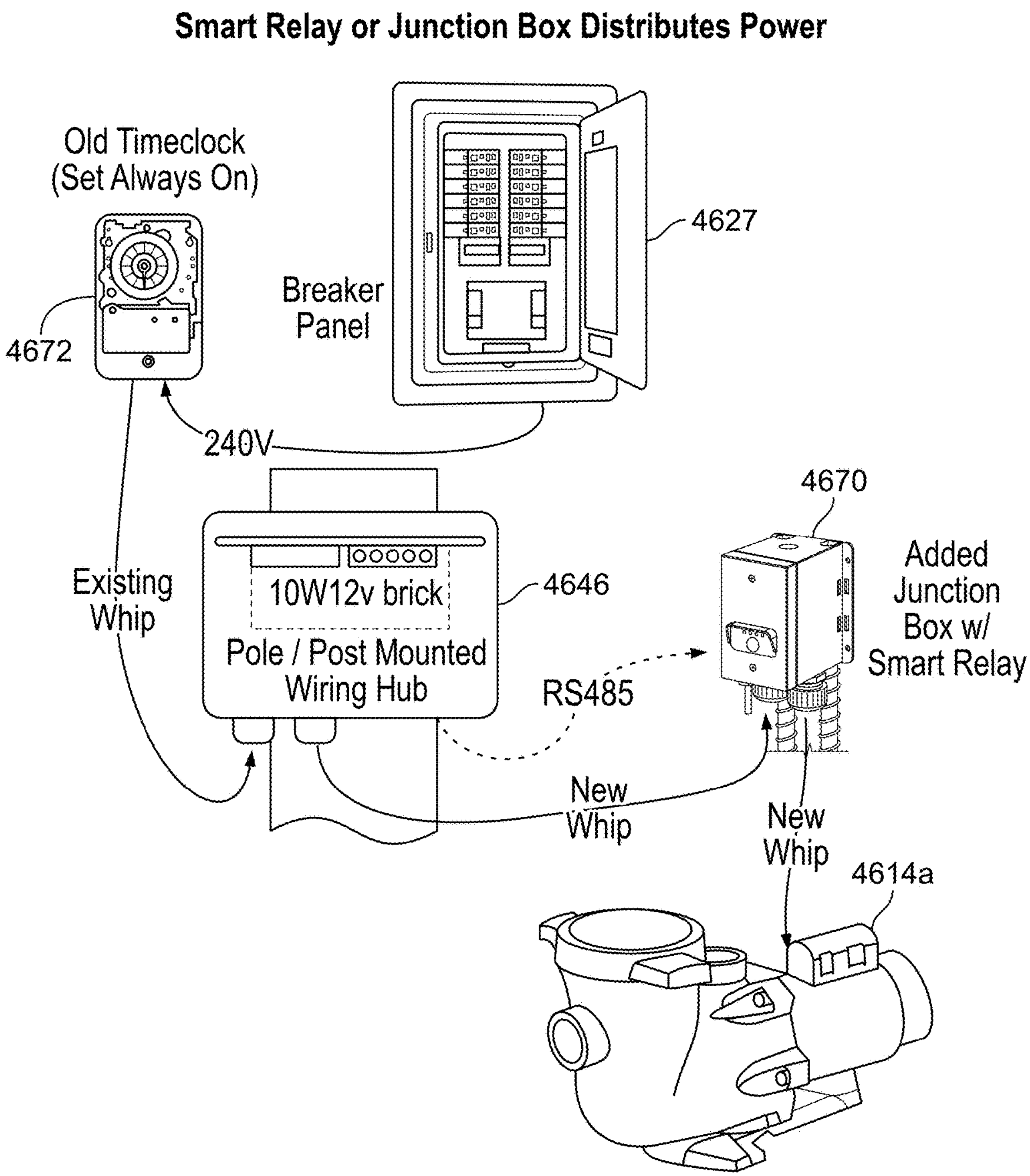
Figure 34E:
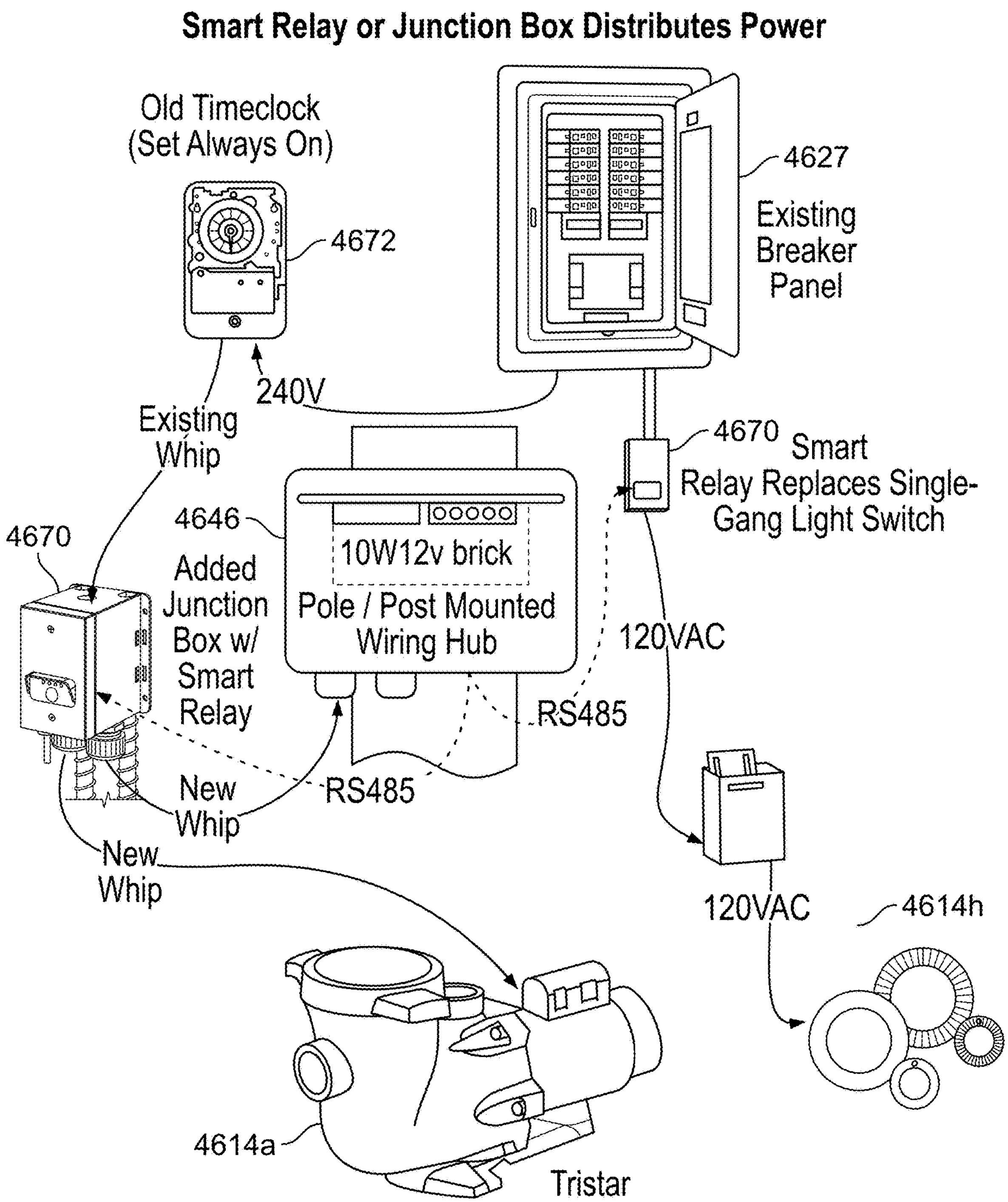
Figure 34F:
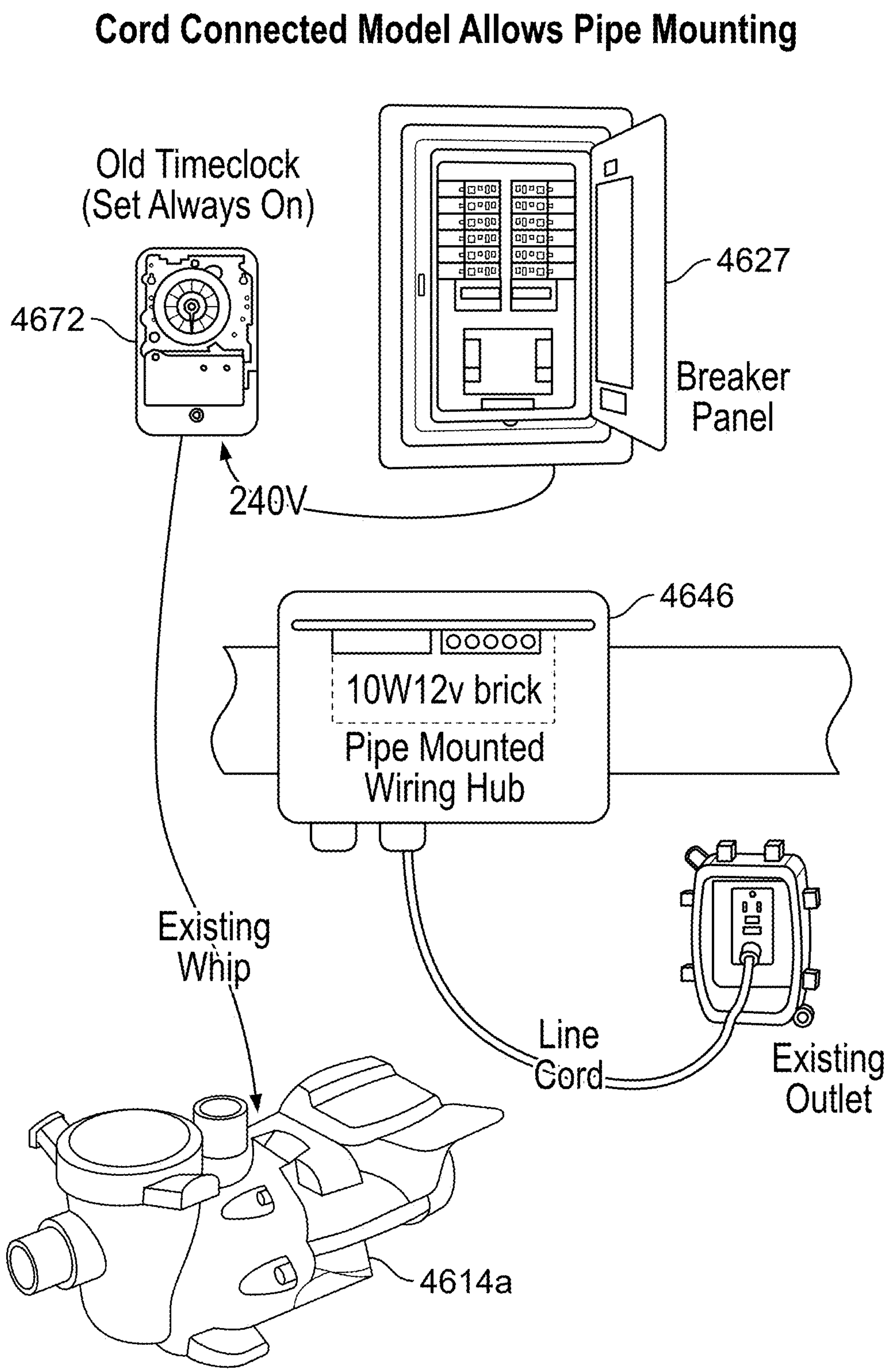
Figure 34G:
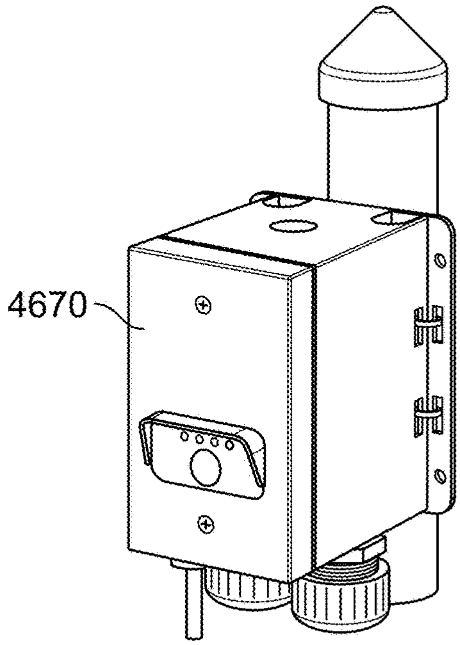
Figure 34H:
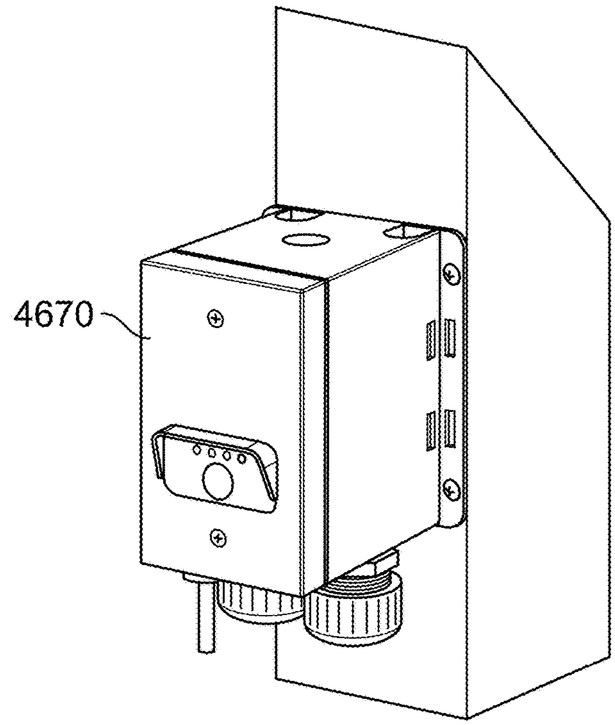
Figure 34I:
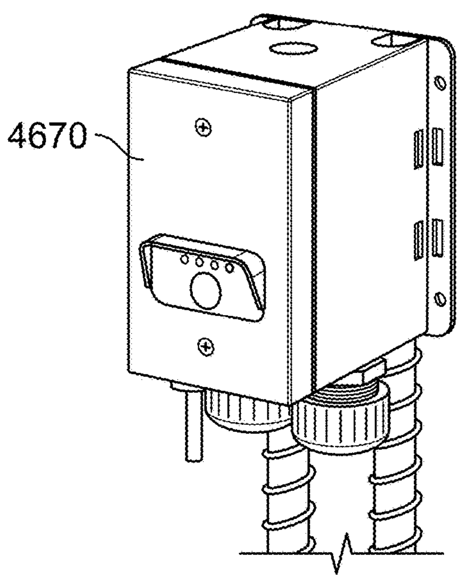
Figure 34J:
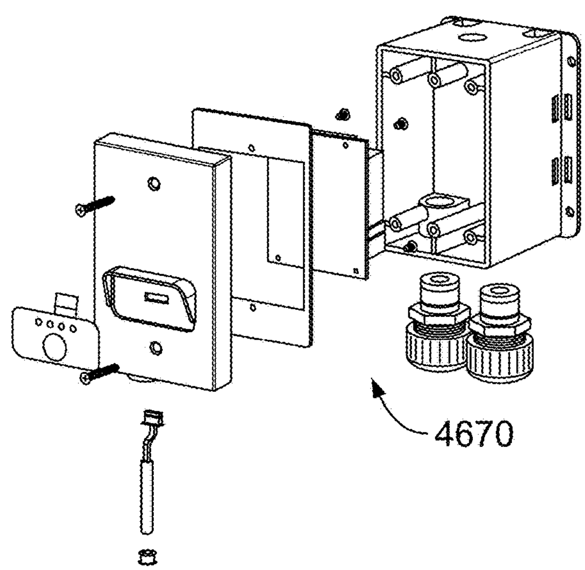

As illustrated in FIG. 34B, the modular relay device could include an incoming (power) whip/connection (including conduit connection hardware) for conducting power from the supply (e.g., breaker panel). The connection could be built in, attached, supplied or purchased separately. According to the embodiment illustrated in FIG. 34B, incoming whip(s) could connect to an existing sub-panel, timeclock enclosure, or junction box with conductors connecting to existing equipment's power connection and the opposite end of the incoming whip(s) could connect to the relay connection in the modular relay system inside the enclosure. It is desirable to utilize the existing whip to connect the breaker panel 4627 to the wiring hub 4646 or another intermediary piece of equipment (e.g., timeclock 4672) so as to avoid entering/accessing the "hot" section of the breaker panel 4627 or subpanel.

Whips can enter and exit the enclosure from the same side (e.g., both entering and exiting the bottom of the enclosure as shown in FIG. 34B) or from opposite sides (e.g., from a side to the top or bottom, from the top or bottom to the side, or from the top to the bottom or bottom to the top, etc.). The whips could be coupled to the enclosure using straight connections, using 45 degree or 90 degree conduit connectors, or low profile connectors. Standard conduit connectors could be used or proprietary connections could be added to improve simplicity of connections. The threading of the conduit connectors could be male or female, or alternatively, the conduit connectors and the enclosure need not use threading at all. Additionally, there can be a conduit entry and/or exit in the cover of the relay or relay enclosure. All of the conduit entries/exits and conduit connectors discussed hereinabove could also have integral liquid tight cord entries for ease of installation. Accordingly, the modular relay device enclosure is designed such that it readily accepts incoming whips from existing equipment (e.g., sub-panel, timeclock or junction box, etc) and exiting whips to the powered and controlled device.

The enclosure of the modular relay device could have relays that are detachable, that are integral, or that are integral and fully potted. Further, the relays could be permanently installed, mounted by way of screws, or could be mounted by way of a hinged connection (inside or outside) with one or more screws.

The modular relay device could have a ground fault circuit interrupter ("GFCI"), arc fault, or other protective circuit built into the relay. The modular relay device could also measure load power, supply voltage, contact closure, contact resistance, or general contact health. In addition, the modular relay device could measure circuit or ambient temperature, or sense water flow or temperature via an attached sensor. The inclusion of GFCI or other safety functions could satisfy wiring requirements without needing an additional (and expensive) GFCI breaker.

The relay could be encased/over molded into a line cord, thereby allowing a servicer/installer to remove the existing whip from the power supply (e.g., breaker panel) to the piece of equipment and replace it with a new line cord having an integral relay. It is desirable to utilize the existing whip to connect the breaker panel to the wiring hub so as to avoid entering/accessing the "hot" section of the breaker panel or subpanel, and use the new over molded line cord with integral relay to connect the wiring hub and piece of pool/spa equipment. However, the new over molded line cord with integral relay could be used to connect breaker panel and the wiring hub, and the existing whip could be used to connect the piece of pool/spa equipment and the wiring hub. The new line cord could further include a means to communicate with the controller (e.g., RS485, USB, Ethernet, Bluetooth, WiFi, Zigbee, Cellular, Thread, LE Bluetooth, any mesh type network, etc.).

The relay could also include a number of additional smart relay capabilities that could allow for the addition of other circuitry, inputs, or external communication modules. For example, the modular relay device could accept sensor inputs (e.g., temp, light, wind, etc.) or external data (e.g., storm detection, web servers, GPS inputs for geo fencing, etc.). It is within the scope of the current disclosure that any and all of the pool control logic described herein could be locate in and run from the relay 4670.

Figure 35:
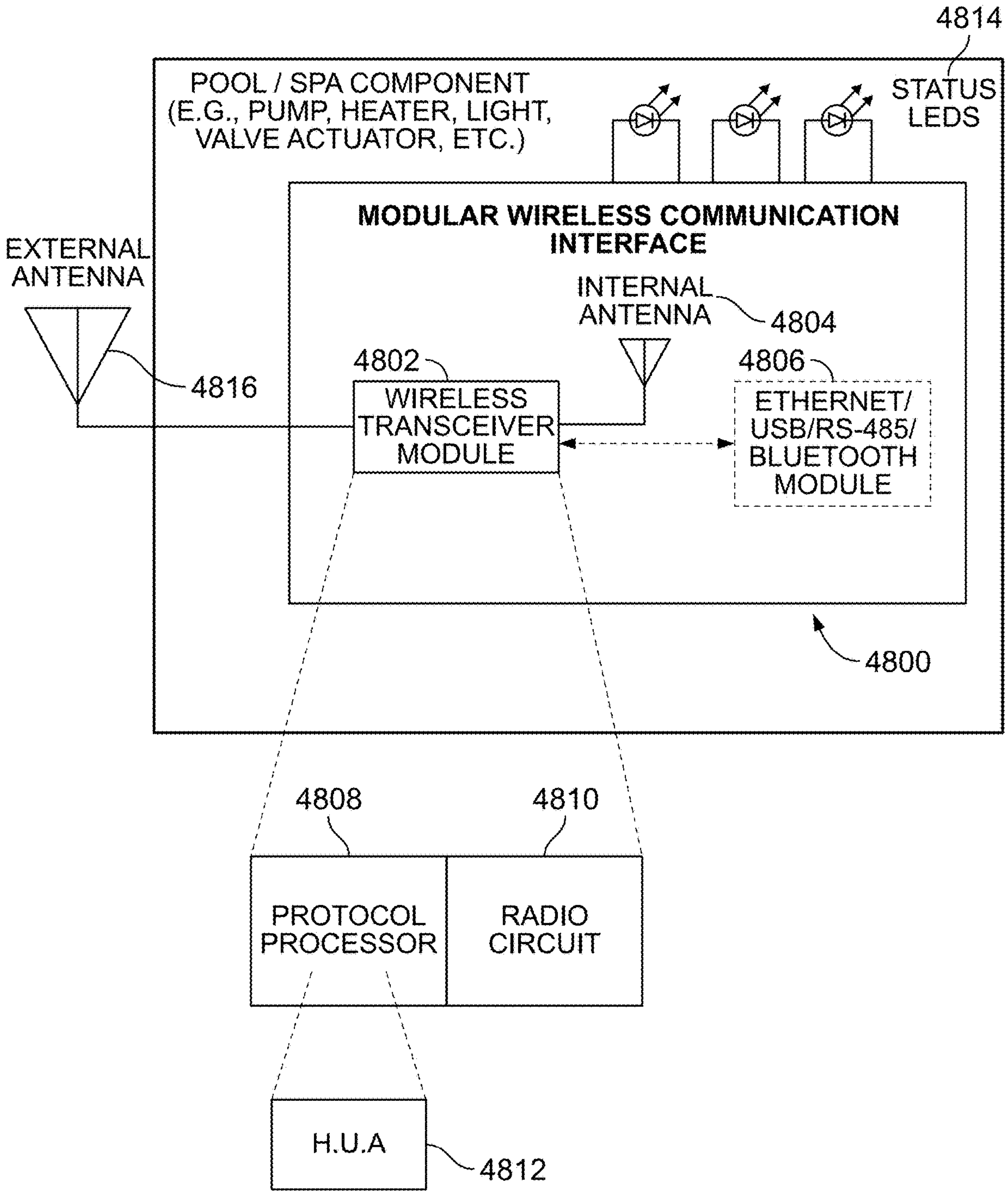
FIG. 35 is a diagram illustrating another embodiment of the system of the present disclosure.

FIG. 35 is a diagram illustrating another embodiment of the system of the present disclosure, wherein a wireless communication device, indicated generally at 4800, provides communication between pool/spa components or equipment, a home router, and the internet. The wireless communication interface 4800 allows pool controlling devices (e.g., pump, heater, chlorinator, cleaner, hub, automation, etc.) to communicate with the home router and thereby communicate with the Internet. The wireless communication device could be located directly on the main (intelligence) printed circuit board ("PCB"), could be attached/plugged into the main PCB, could be provided as a modular upgrade to the main PCB or PCB enclosure, could be a modular upgrade to/external to the main PCB enclosure, or could be located remotely to the main PCB enclosure. As shown in FIG. 35, an antenna could be mounted with (internal antenna 4804) or remote to (external antenna 4816) a wireless transceiver module 4802 in the embodiments described herein. The wireless communication interface 4800 could also allow pool controlling devices to directly communicate with web enabled devices (e.g., smartphones, tablets, thermostats, voice enabled devices, etc.) without the need to go through a home router. Additionally, the wireless communication interface 4800 could provide communication between the pool/spa components or equipment and the web/cloud server, thereby providing tools and indicators to assist a user in solving connectivity problems with the controller through the server/cloud and to the consumer and apps.

As shown in FIG. 35, the wireless communication interface 4800 includes a protocol processor 4808, a radio circuit 4810, and an antenna 4804 and could be installed directly on the circuit board of the controlling equipment. In another embodiment, the wireless communication interface 4800 could have a secondary external antenna 4816 that could be installed for better connectivity (e.g., signal strength) or for placement at a location closer to the home router.

The wireless communication interface 4800 could also include a printed circuit board, a protocol processor 4808, an HUA module 4812 (e.g., for providing a unique hardware address), a radio circuit 4810, an antenna 4804, status LEDs 4814, an ethernet/USB/RS485/Bluetooth connection 4806, and an enclosure that could be mounted using the enclosure itself or using a secondary mount. For example, a secondary mount could be provided for mounting the wireless communication interface 4800 without (or with) the use of tools (e.g., by snapping the antenna to the mount or other suitable methods). In addition to, or in place of, the ethernet/USB/RS485/Bluetooth connection 4806, the wireless communication interface 4800 could include any wired or wireless communication protocol disclosed herein for communicating with the controller hardware.

An antenna (internal antenna 4802 or external antenna 4816) is used to communicate commands from remote web enabled devices (e.g., wireless devices) to a controller unit, which activate equipment as needed with people present or absent, in the pool or around the backyard, which may be year-round and/or all-day based on application (e.g. residential vs. commercial) or location. Additionally, the wireless communication interface 4800 could communicate with the controlling devices by way of RS485, USB, Bluetooth, ethernet, cellular, WiFi, Zigbee or other communication protocols. For example, the antenna 4802 could facilitate communication with the home router through WiFi, Cellular, Bluetooth, ethernet, or other communication protocols.

The wireless communication interface 4800 could also be provided with a button to activate service/troubleshooting indicators (e.g., LEDs 4814) to provide information relating to the status/connectivity problems of the wireless communication interface 4800. For example, the wireless communication interface 4800 could be provided with LED indicators 4814 which could be illuminated in various colors (e.g., black, green, orange, red, etc.) and activation patterns (e.g., solid, blinking, etc.) based on the status of the wireless communication interface 4800. For example, a green LED could indicate normal operation, a yellow LED could indicate an issue that can be addressed by the user, and a red LED could indicate an issue that needs to be addressed by a service provider. The status LEDs could further include a power icon LED (indicating bad cable, no power, power ok, WPS activation), a router icon LED (indicating router not present, incorrect password, no IP address assigned, router DHCP error, incompatible router/black listed firmware or model), a web icon LED (indicating web not present, no UDP connection allowed, no remote server found, connected to web server), an Internet icon LED (indicating no internet/no google, high error rate, connected to the internet), a signal strength LED (indicating not configured, out of range, weak signal, 75% or greater signal), a quality of signal LED (indicating error rates via a bar graph, high error rate, strong connection/low error rate), and a connection speed LED (indicating reduced connection speed/sufficient connection speed). Additionally, the LEDs could indicate the status of the connection as illustrated in Table 1 below.

TABLE 1

| LED State | Connection Status |
|---|---|
| Power: Off | No Power, USB/Wire Corruption |
| Power: Off | No SSID Password |
| Router: Blinking | No IP Address |
| Internet: Off | No Internet Access (No Google) |
| Router: Blinking | No DHCP Server Response (Static Only) |
| Router Config: Blinking | No IP Path -> Remote Server (Internet is OK) |
| Router Config: Blinking | No UDP to Remote Server (Firewall) |
| Radio Link: Blinking | High Error Rate |
| (Break Out) | No Network Connection |
| Internet: Blinking | Frequent Internet Response Delays |
| Slow Flicker on High Trending Issue | Past Issue Not Currently Happening |
| Power: Slow Flicker | Firmware Needs Update - radio, host, optional, urgent |
| Power: Slow Flicker | WPS for Unknown Password |

The connection status could also be communicated through the controller user interface (e.g., a status page) to help installers/users identify communication problems with the cloud and/or application using similar multicolor status indicators as described above. For example, all faults could be provided in a list with one color (e.g., green) or another color (e.g., red) indicators to identify a connection problem area. The status page could also provide a solution to a particular connection problem associated with a color. Further, the system could prompt the user to contact the manufacturer in the event that a problem is not known or that the problem is known to not be resolvable through a troubleshooting manual.

The status page could be activated through a service button (e.g., provided on the control device, pool/spa equipment, or in an application) to allow a web-enabled device to obtain the status of the wireless communication interface via an application. For example, the application status page could provide all of the faults in a list with green or red indicators to easily identify problem areas, a description of the solutions to particular problems, a walk-through presentation on how to address/fix the problem, and/or a video illustrating how to address/fix the problem. The application could also provide a configuration walk-through page to instruct a user on how to configure the wireless communication interface. The configuration walk-through page could be activated through a service button. The application could also connect to a service to provide remote customer service via a web-enabled controller which could allow the service provider to remotely troubleshoot and fix the problem with minimum user interaction.

Figure 41:
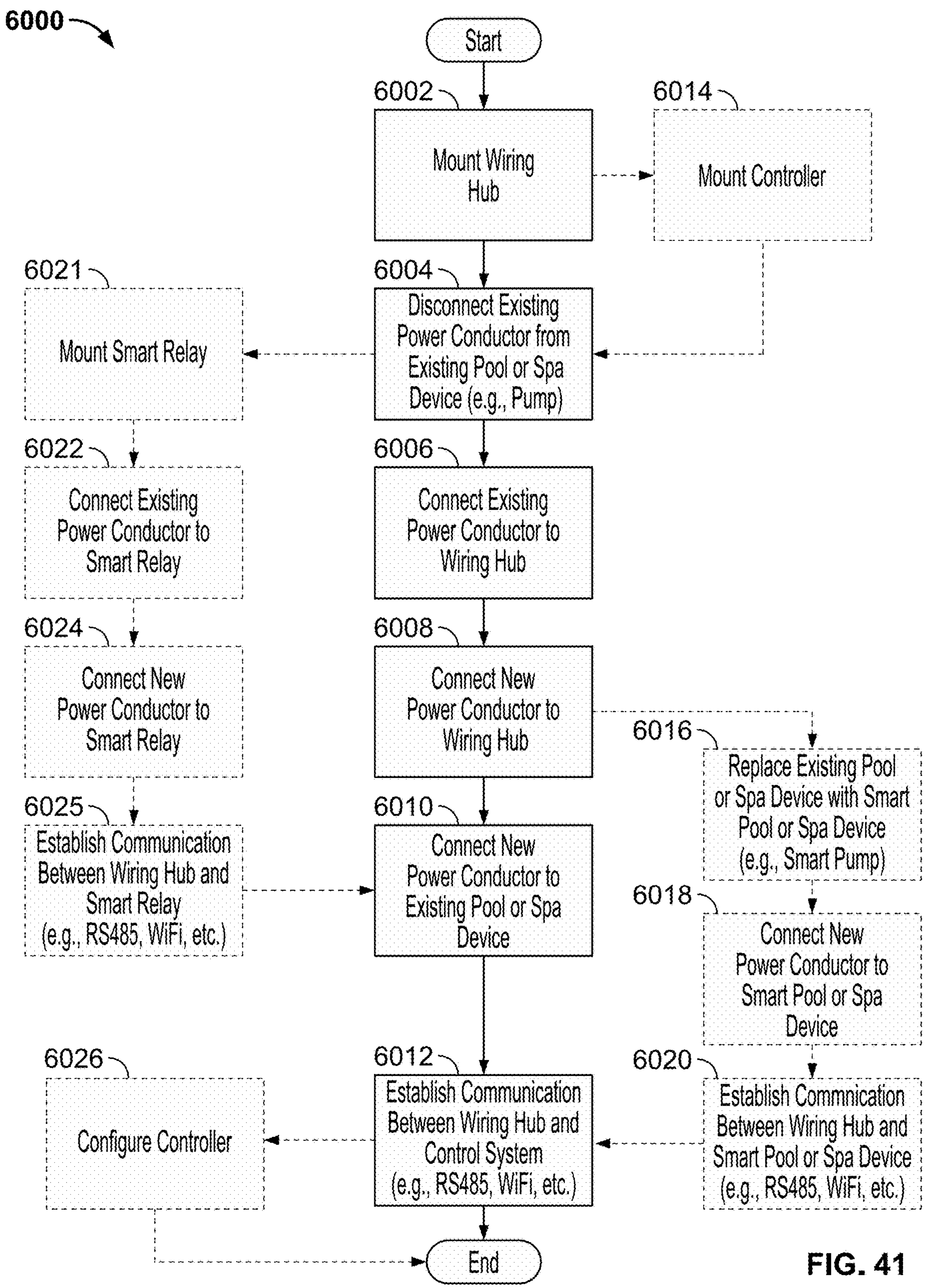
FIG. 41 is a flowchart illustrating an installation method in accordance with the present disclosure.

FIG. 41 is a flowchart illustrating installation steps, indicated generally at 6000, for installing the pool and/or spa control system 4610, as described above in connection with FIGS. 34A-34J of the present disclosure. Additionally, FIGS. 42A-42I are diagrams further illustrating the installation steps of FIG. 41.

Figure 42A:
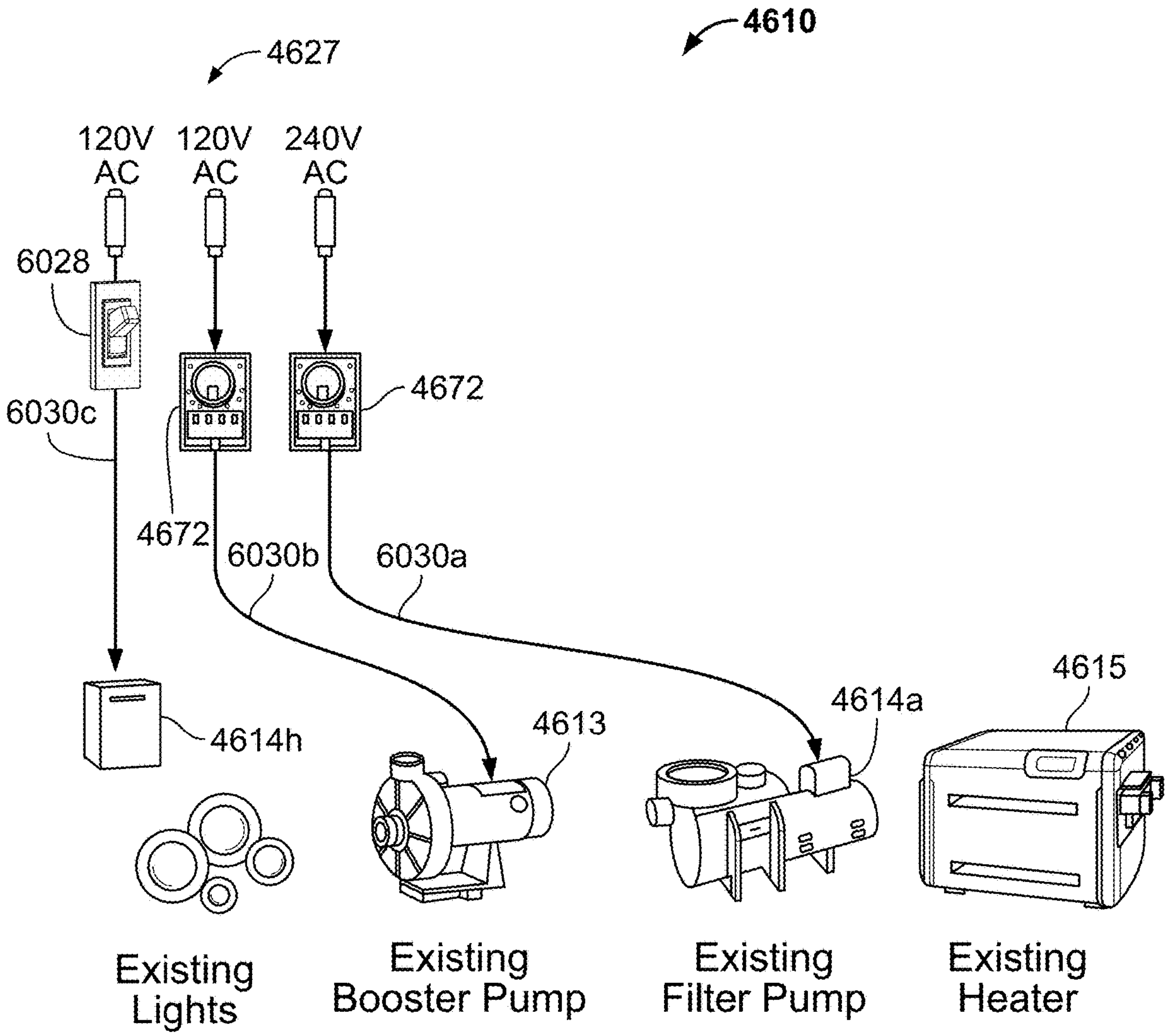
FIGS. 42A-42I are diagrams illustrating the installation method of FIG. 41.
Figure 42B:
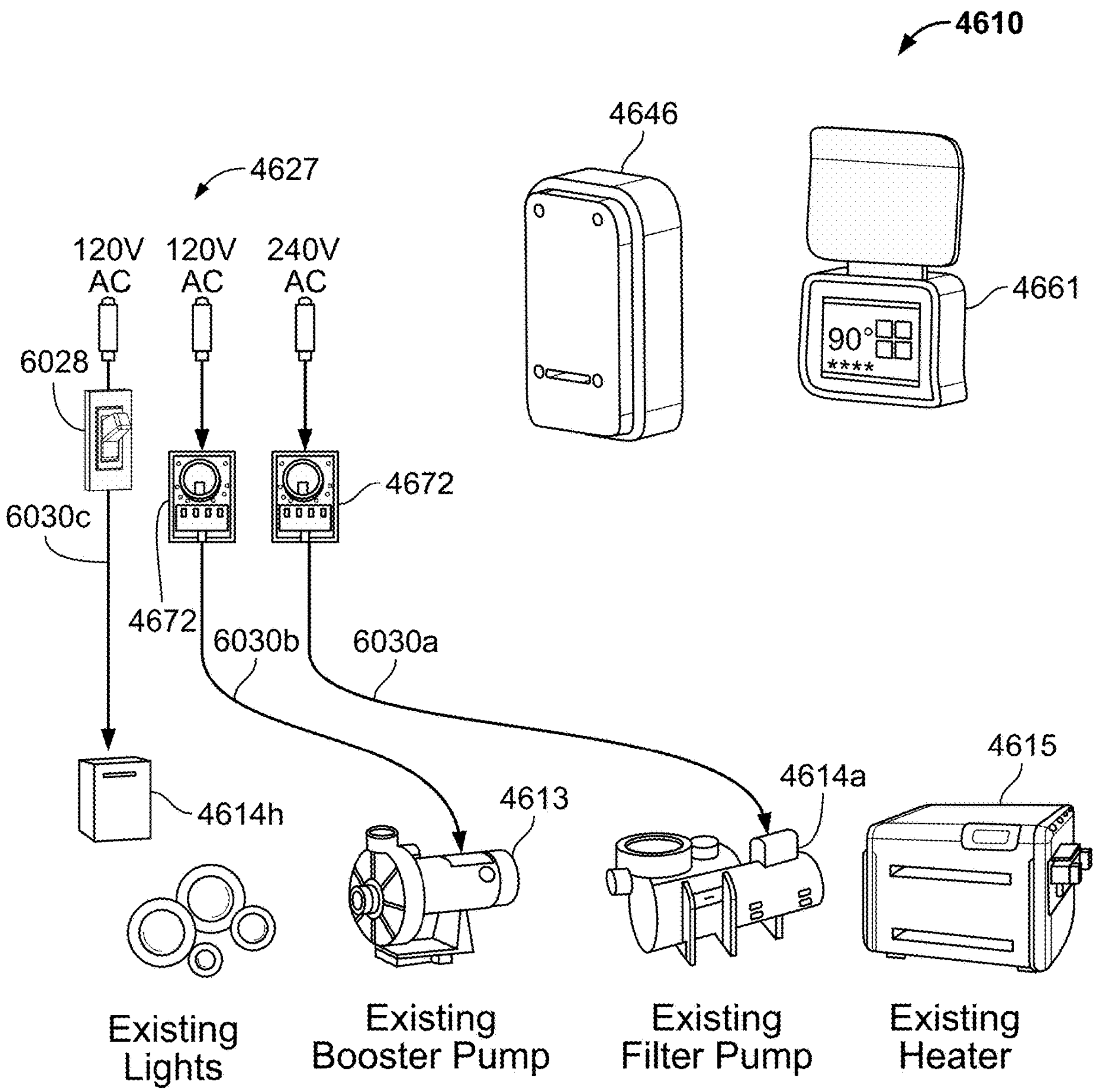

As shown in FIG. 41, in step 6002, a pool or spa installer or service professional, hereinafter "installer," could mount the wiring hub 4646, described hereinabove, in an existing pool or spa environment (e.g., at a pool equipment pad). For example, as shown in FIG. 42A, an existing pool or spa environment could include a lighting system 4614*h* having a switch 6028 (e.g., a single-gang light switch), a single-speed (e.g., booster) pump 4613, an existing filter pump (e.g., single or variable speed) 4614*a*, a heater 4615, timers or timeclocks 4672, and a power source 4627 (e.g., a breaker panel). Existing power conductors 6030*a-c* could provide power to existing pool or spa devices directly from the power source 4627 or via intermediary devices (e.g., switch 6028 or timeclocks 4672). Accordingly, the power conductors 6030*a-c* could include power cables, conduits, and the like. The existing pool or spa environment could also include any of the other pool or spa devices disclosed herein. The wiring hub 4646 could be provided with any of the mounting means described above in connection with the smart relay 4670 and shown in FIGS. 34G-34I. For example, the means for mounting the wiring hub 4646 could include, but are not limited to, hose clamps, screw holes, rebar mounts, zip-tie holes, etc.

Optionally, in step 6014, the installer could also mount a control module 4661. The control module 4661 could be mounted at a location proximate to the wiring hub 4646 (see FIG. 42B), or could be removably affixed such that it can be moved according to the specific needs of a particular pool or spa environment and/or user. For example, the control module 4661 could be removably affixed such that the control module 4661 could be moved away from the pool pad to a location closer to a wireless network, a home, or to any convenient location for the user (e.g., poolside). The control module could also be provided with any of the mounting means described above in connection with the smart relay 4670 and shown in FIGS. 34G-34I. Further, while the wiring hub 4646 and control module 4661 could be provided as separate components, it is within the scope of the present disclosure that some, or all, of the functionality of the control module 4661 could be integrated into the wiring hub 4646. Accordingly, wiring hub 4646 and control module 4661 could be provided as a single, integral component, thereby eliminating the need to separately mount control module 4661.

Figure 42C:
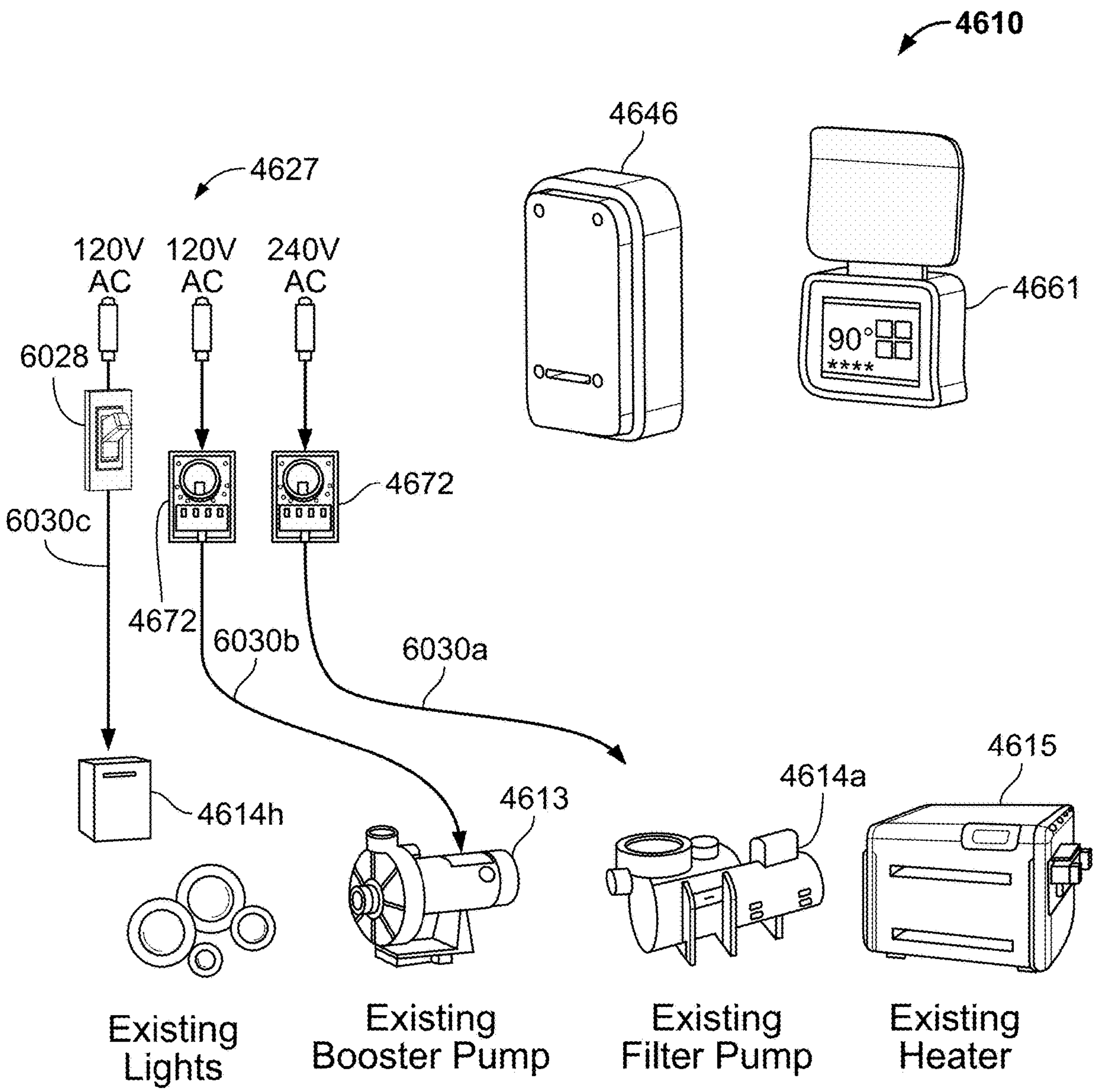
Figure 42D:
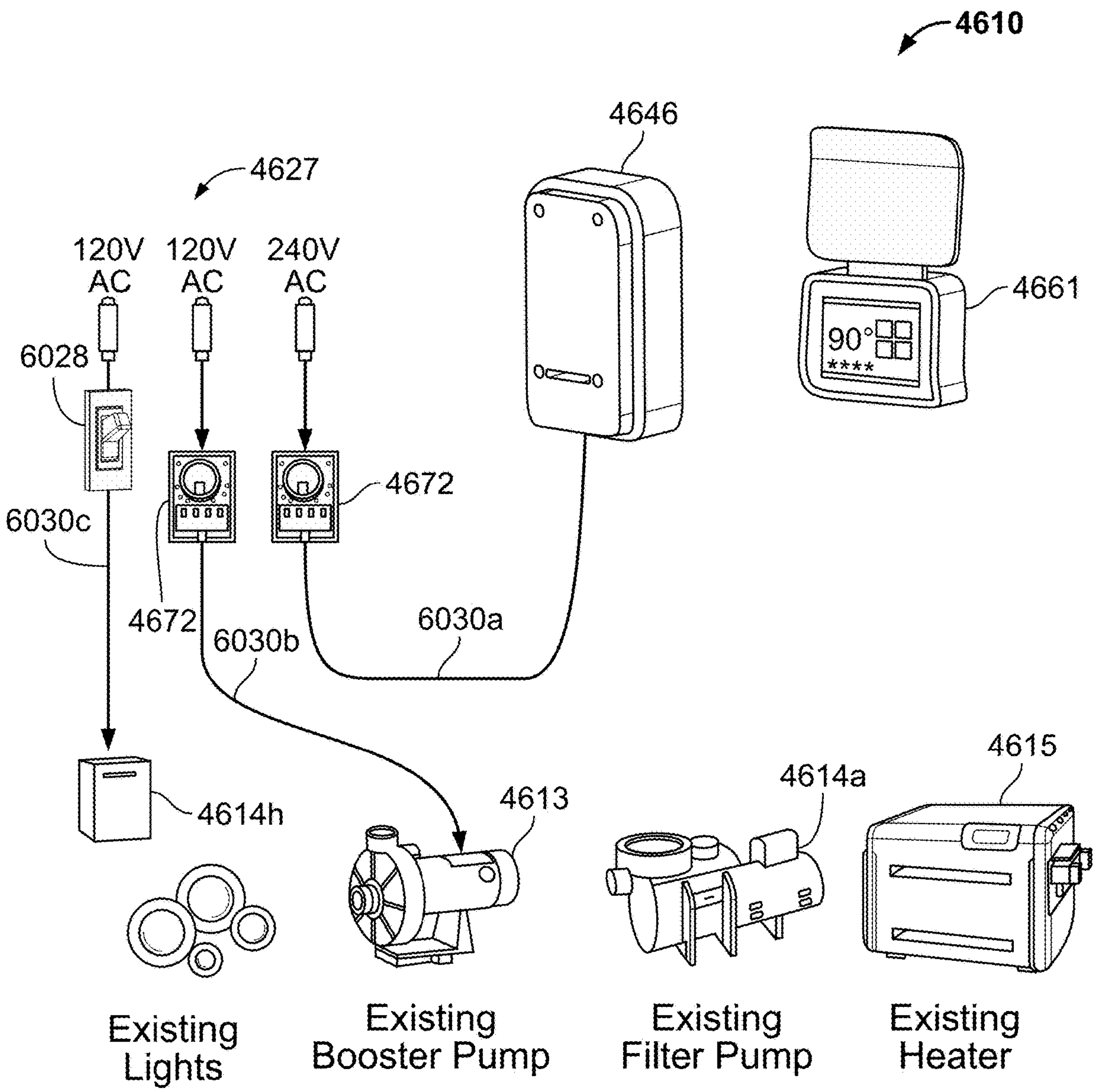
Figure 42E:
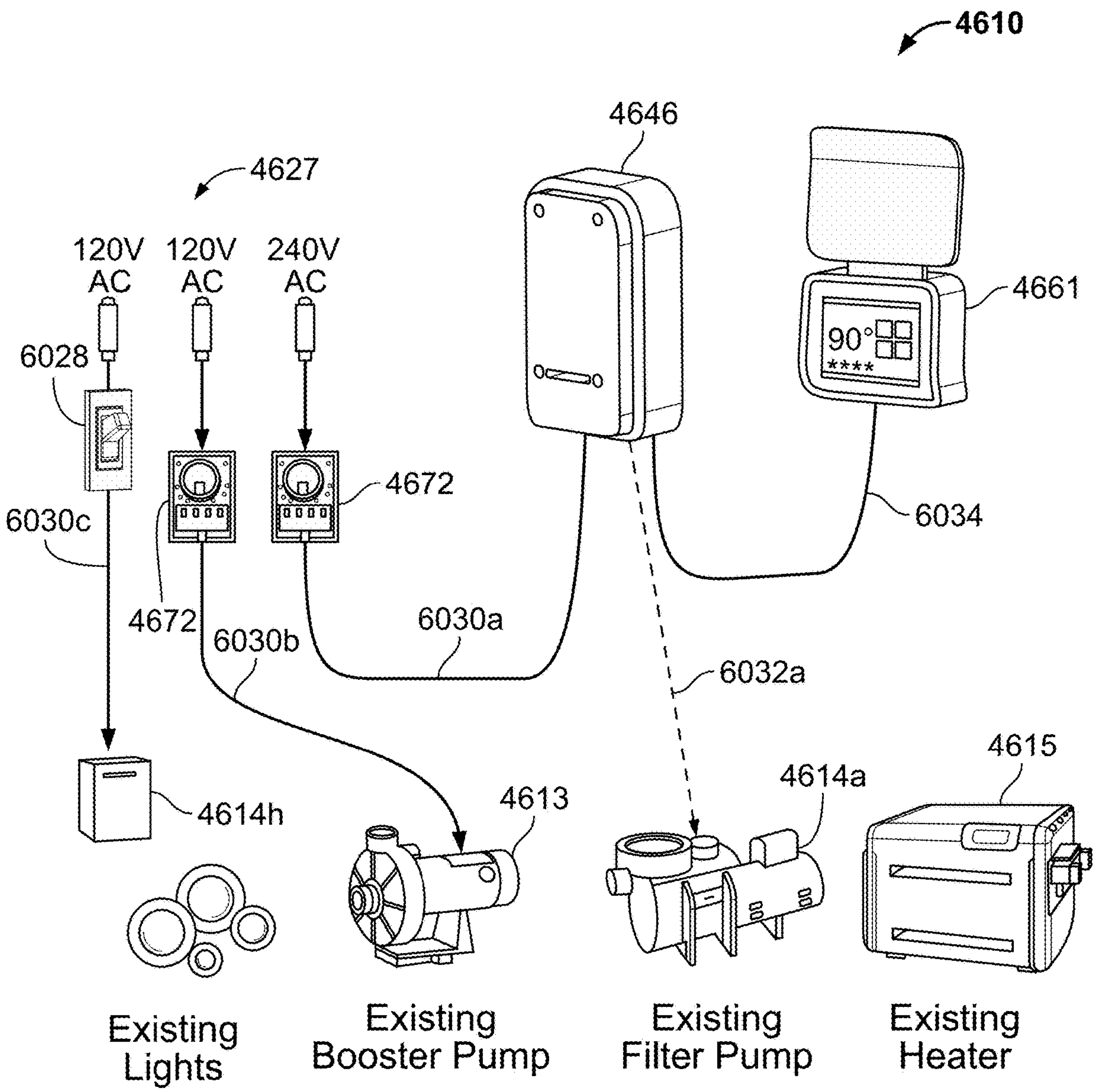

In step 6004, the installer could disconnect an existing power conductor from an existing pool or spa device. For example, as shown in FIG. 42C, existing power conductor 6030*a* could be disconnected from existing filter pump 4614*a*. In step 6006, the existing power conductor can be connected to the wiring hub. For example, as shown in FIG. 42D, the end of existing power conductor 6030*a* that was disconnected from variable speed pump 4614*a* could be connected to an input of wiring hub 4646, thereby electrically coupling the power source 4627 to the wiring hub 4646 (e.g., via timeclock 4672) and providing power thereto. In step 6008, a first end of a new power conductor can be connected to the wiring hub and then in step 6010, a second end of the new power conductor can be connected to the existing pool or spa device. For example, as shown in FIG. 42E, a first end of new power conductor 6032*a* is connected to wiring hub 4646 and a second end of the new power conductor 6032*a* is connected to the existing variable speed pump 4614*a*, thereby electrically coupling the power source 4627 to the existing variable speed pump 4614*a* (via the wiring hub 4646) and providing power thereto. This installation method enables a service provider to install the wiring hub 4646 and provide power to one or more devices therefrom without having to access the line voltage compartment of an electrical panel. Importantly, as discussed above, the wiring hub 4646 can control operation of the existing variable speed pump 4614*a* by controlling the power provided thereto based on, for example, any of the control logic 70 discussed in connection with control system 10 of the present disclosure.

In step 6012, communication is established between the wiring hub and the control system of the present disclosure. For example, as shown in FIG. 42E, a communications cable 6034 could couple the wiring hub 4646 and controller 4661, providing two-way communication therebetween. As described above, the wiring hub 4646 could communicate with the control system 4610 via the controller 4661, or the wiring hub could communicate with the control system 4610 via an integral communications module. Optionally, in step 6026, the controller 4661 can be connected to a homeowner's WiFi network and the controller can be configured.

Figure 42F:
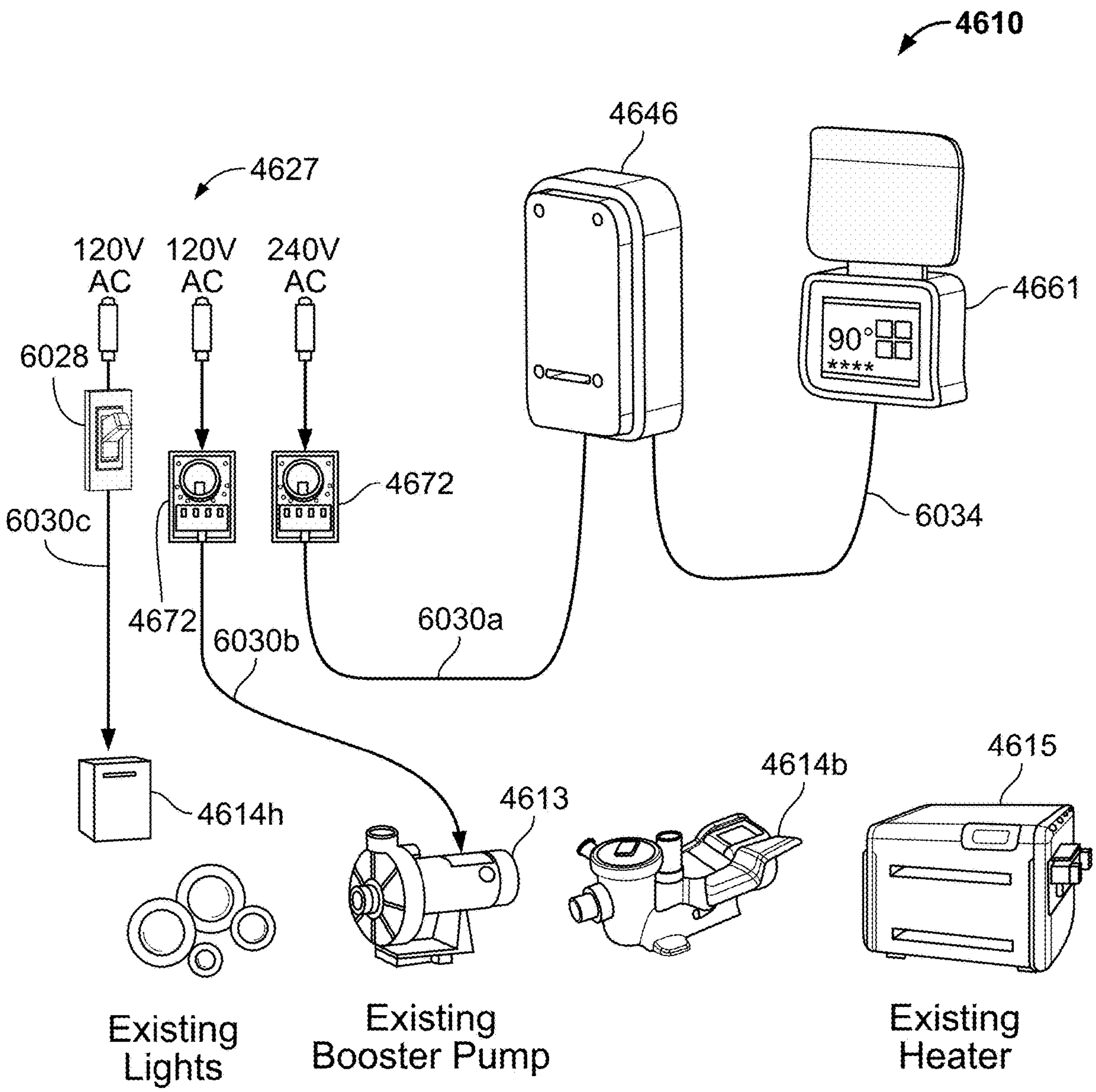

According to further optional aspects of the present disclosure, the wiring hub can provide communication between newly installed or existing smart pool or spa devices (e.g., devices having network communication capabilities) and the control system of the present disclosure. In optional step 6016 of FIG. 41, an installer could replace an existing pool or spa device (having no network communications capabilities) with a smart pool or spa device. For example, as shown in FIG. 42F, the existing filter pump 4614*a* shown in FIGS. 42A-E has been removed and a smart variable speed pump 4614*b* has been installed in its place.

Figure 42G:
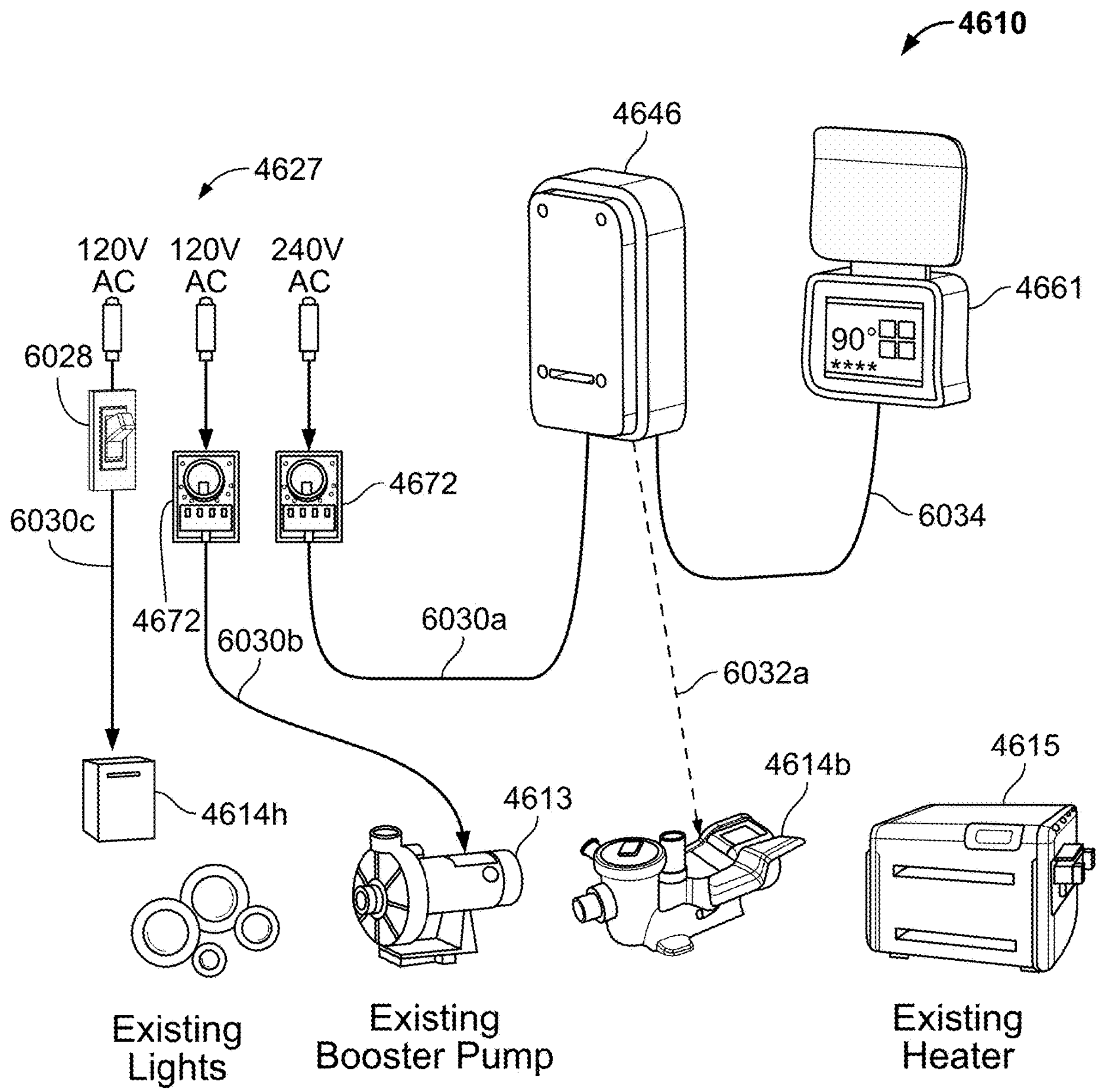

In step 6018, a second end of the new power conductor can be connected to the new smart pool or spa device. For example, as shown in FIG. 42G, a first end of new power conductor 6032*a* is connected to wiring hub 4646 and a second end of the new power conductor 6032*a* is connected to the smart variable speed pump 4614*b*, thereby electrically coupling the power source 4627 to the smart variable speed pump 4614*b* (via the wiring hub 4646) and providing power thereto.

Figure 42H:
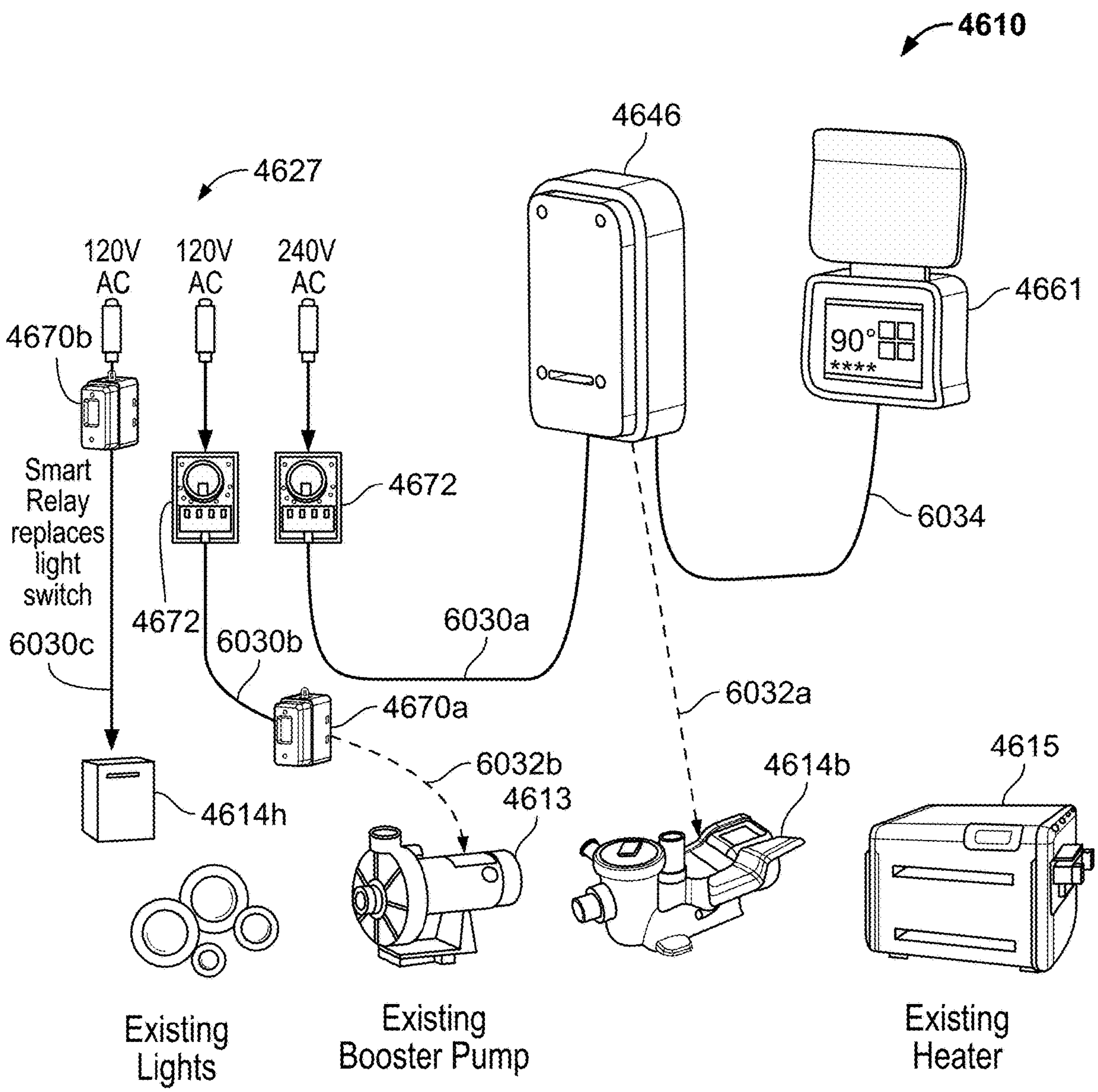
Figure 42I:
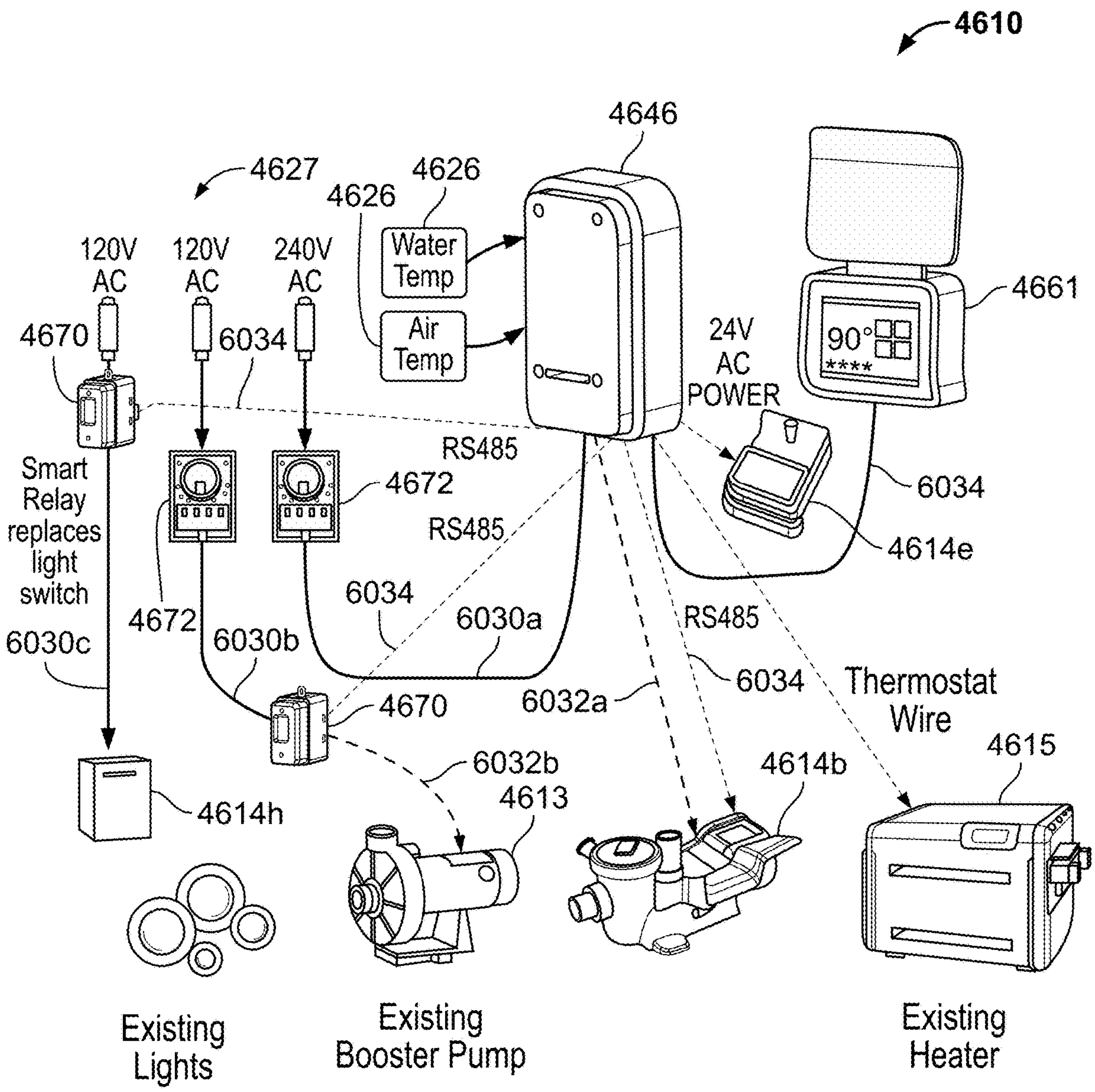

In step 6020, communication is established between the wiring hub and the smart pool or spa device. For example, as shown in FIG. 42I, a communications cable 6034 could couple the wiring hub 4646 and smart variable speed pump 4614*b*, providing two-way communication therebetween. As described above, the wiring hub 4646 could communicate with the control system 4610 via the controller 4661, or the wiring hub could communicate with the control system 4610 via an integral communications module. Accordingly, communication between the control system of the present disclosure and the smart variable speed pump 4614*b* is provided by way of wiring hub 4646. Importantly, as discussed above, the wiring hub 4646 can control operation of the smart variable speed pump 4614*b* based on, for example, any of the control logic 70 discussed in connection with control system 10 of the present disclosure.

According to further optional aspects of the present disclosure, the wiring hub can provide communication between additional newly installed or existing smart pool or spa devices and the control system of the present disclosure. For example, as shown in FIG. 42H, smart relays 4670*a-b* could be installed to provide control of existing pool or spa devices (e.g., lighting system 4614*h* and single speed pump 4613) by the control system of the present disclosure.

In order to install a smart relay 4670*a-b* according to the present disclosure, an installer can first disconnect an existing power conductor from an existing pool or spa device as shown in step 6004 of FIG. 41. For example, as shown in FIG. 42H, a first end of existing power conductor 6030*b* could be disconnected from the single speed pump 4613. In step 6021, an installer can mount a smart relay device as described above and shown in FIGS. 34G-34I. For example, the means for mounting a smart relay 4670 could include, but are not limited to, hose clamps, screw holes, rebar mounts, zip-tie holes, etc. In step 6022, the installer then connects the existing power conductor to the smart relay. For example, as shown in FIG. 42H, the first end of power conductor 6030*b* that was disconnected from the single speed pump 4613 is reconnected to an input of the smart relay 4670*a*. In step 6024, an installer can connect a new power conductor to the smart relay and then in step 6010, the new power conductor is also connected to the existing pool or spa device. For example, as shown in FIG. 42H, a first end of a new power conductor 6032*a* is coupled to the smart relay 4070*a* and a second end of the new power conductor is coupled to the existing single speed pump 4613.

In step 6025, communication is established between the smart relay and the wiring hub. For example, as shown in FIG. 42I, a communications cable 6034 could couple the wiring hub 4646 and smart relay 4670*a*, providing two-way communication therebetween. As described above, the wiring hub 4646 could communicate with the control system 4610 via the controller 4661, or the wiring hub could communicate with the control system 4610 via an integral communications module. Accordingly, communication between the control system of the present disclosure and the smart relay 4670*a* could be provided by way of wiring hub 4646.

According to further aspects of the present disclosure, a smart relay could be configured to replace a light (or other) switch, thereby providing for control of a lighting system (or other system or device controlled by a switch) by the control system of the present disclosure. For example, as shown in FIG. 42H, an installer could remove a single-gang lighting switch 6028 (see FIG. 42G) and replace it with a smart relay 4670*b*. As shown in FIG. 42I, a communications cable 6034 could couple the wiring hub 4646 and smart relay 4670*b*, providing two-way communication therebetween and providing for control of the existing lighting system 4614*h* by the control system of the present disclosure. Importantly, as discussed above, the wiring hub 4646 can control operation of the smart relays 4670 based on, for example, any of the control logic 70 discussed in connection with control system 10 of the present disclosure. According to some aspects of the present disclosure, the smart relays could also communicate directly with the control module 4661 or other controller of the control system by way of any wired (e.g., RS485, ethernet, USB, serial, etc.) or wireless (e.g., WiFi, Bluetooth, Zigbee, ZWave, cellular, thread, etc.) communication protocols discussed herein.

FIG. 42I illustrates additional aspects of control system 4610 of the present disclosure. In addition to the devices discussed above, the wiring hub 4646 could accept connections from and provide for control of additional pool or spa devices. For example, the wiring hub could provide power to and/or control a smart valve actuator 4614*e* or heater 4615 and the wiring hub 4646 could be coupled to and receive information from a plurality of sensors 4626, for example, air and water temperature sensors. Importantly, in addition to, or in place of, the communications cables 6034 shown in FIG. 42I, the pool or spa devices of could be communicatively coupled by way of any wired (e.g., RS485, ethernet, USB, serial, etc.) or wireless (e.g., WiFi, Bluetooth, Zigbee, ZWave, cellular, thread, etc.) communication protocols discussed herein.

Figure 43:
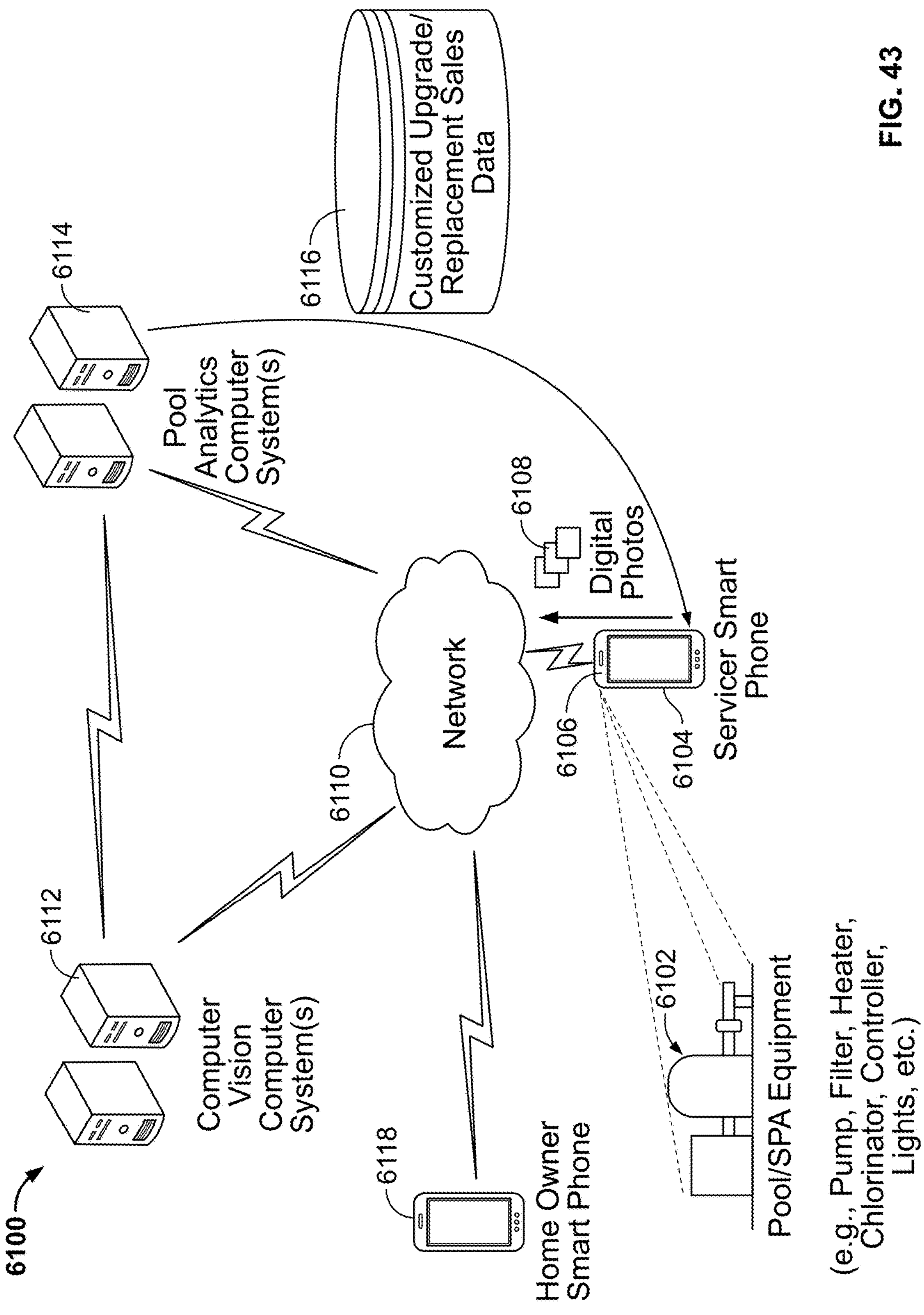
FIG. 43 is a diagram illustrating a recommendation system for recommending upgrades in pool/spa equipment.

FIG. 43 is a system diagram which illustrates a recommendation system 6100 for recommending upgrades to pool/spa equipment. The system 6100 can include a pool or spa equipment pad 6102 having at least one of a pump, filter, heater, chlorinator, controller, lights, or other pool or spa device (or any combination thereof). The present disclosure is not limited to any specific device within the pool or spa equipment pad. A servicer who services a customer's pool or spa can use his or her smartphone 6104 to take a photograph of the pool or spa equipment pad 6102 using a camera 6106 on mounted and installed with the smartphone 6104. The servicer can use the regular camera application included on the smartphone 6104. Alternatively, the servicer can launch the camera functionality of the smartphone 6104 using an application provided by the system of the present disclosure as will be discussed in greater detail below. In either scenario, the smartphone can provide "guides" to position and orientate the product in the camera application to aid in image capture and recognition. The data captured by the smartphone (e.g., in the photograph taken by the smartphone) can be a barcode or other image code on a pool device. The smartphone can also capture data labels on a product. Once the servicer takes a photograph of the pool or spa equipment pad 6102, the smartphone 6104 can upload at least one digital photo 6108 to a network 6110 (e.g., the Internet) for transfer to other computer systems as will be explained in greater detail below. The digital photo 6108 can be stored in a database and retrieved for future reference by a help desk or a service desk, if desired.

The digital photo(s) 6108 can be transmitted to and received by a computer vision computer system 6112 for processing the digital photo 6108 using suitable computer vision software to determine the make, model and manufacturer of all of the pool equipment on the pool or spa equipment pad 6102. The computer vision system 6112 can process a digital photo 6108 having a picture of just one component of the pool or spa equipment pad 6102, or it can process a plurality of components on the pool or spa equipment pad 6102. The computer vision computer system 6112 could include the IBM Watson or Google Lens systems which can process the digital photos 6108. These computer vision systems can process to the photos to determine the make, model and manufacturer of the device. The digital photo can be of the pool itself and the computer vision system can process this photo to determine the size of the pool and the amount of gallons of water in the pool by using the camera lens parameters such as a the amount of feet the camera is from the ground and the amount of feet the camera is from the pool. The system can use this information to solve for the depth of the pool and the other dimensions and thereby determine the amount of gallons and pool size. The size and capacity of water of a pool can be used to make certain recommendations as will be explained in greater detail below.

The data relating to the equipment on the pool or spa equipment pad 6102 can be sent to a pool analytics computer system 6114. The pool analytics computer system 6114 can use the data generated by the computer vision computer systems 6112 to determine if there are upgrades or replacements products that may be of interest to an owner of the pool or spa. For example, if the computer vision computer system 6112 determines that a pool or spa equipment pad 6102 has a variable speed pump that is two years old and a newer model has greater energy efficiency or more pumping speeds, the pool analytics computer system 6114 can recommend to the servicer or the pool owner that it may be time to upgrade to newer model. Alternatively, with respect to chlorinators, the pool analytics computer system 6114 can determine whether the pool or spa equipment pad has an older chlorinator and whether a newer model exists to provide additional benefits such as extending the life of chlorination cells, killing more bacteria, or reducing the overall chlorine demand. If such a determination is made, then the pool analytics computer system 6114 can recommend an upgrade to the newer model and specifically identify a device which will provide the greater benefits. With respect to pool automation, the pool analytics computer system 6114 can determine the make and model of a pool controller and determine whether a newer version exists that provides greater benefits such as more control over the pool or spa environment or a faster processor or better hardware in general. If this is the case, the pool analytics computer system 6114 can make a recommendation to upgrade to a certain newer device. With respect to pool lights, the pool analytics computer system 6114 can determine the make and model of lights being used anywhere in the pool or spa environment, and can determine if a newer version of lights exists that provide enhanced benefits such as more fixed colors, more light shows, less energy usage, and more brightness. If this is the case, the pool analytics computer system 6114 can recommend an upgrade. The above examples are for illustration purposes only and can apply to any type of upgrade for any type of device in the pool or spa environment and does not necessarily have to be limited to components on a pool or spa equipment pad 6102. It should be noted that the computer vision services provided by the computer vision computer system(s) 6112 could also be performed on a smartphone 6104, if desired.

The pool analytics computer system 6114 can be programmed and updated with information relating to new devices and new features that improve upon preexisting device to offer upgrades. The pool analytics computer system 6114 can include a database with features associated with a make and model of a device. Those features can be compared with a plurality of newer models, and computer code can apply logic to determine whether the features of the new device offer improvements over the old versions. For example, if a certain variable speed drive is rated with a certain energy performance, and a newer model is rated with a better energy performance, then the system can make a positive determination that an upgrade can be recommended. Alternatively, the pool analytics computer system 6114 can make suggestions for replacement equipment that may be better suited for a certain pool or spa environment than an existing device. For example, if a pool or spa equipment pad 6102 has a variable speed drive rated for a pool having a capacity of 15,000 gallons, but the pool actually has a capacity of 20,000 gallons, then the pool analytics computer system 6114 can recommend a variable speed drive rated at 20,000 gallons and provide the reason for the recommendation. The system can determine the size of the pool by an input from the servicer, by a database search based on the home address of the owner, by automatically using a geolocation of the digital photo 6108 as will be discussed in greater detail below, or by leveraging the photo of the pool as discussed above.

In an alternative embodiment, the system 6100 does not need to have a separate computer vision computer system 6112. Rather, the entire logic of the computer vision computer system 6112 can be done by the pool analytics computer system 6114. In this case, the digital photos 6108 can be directly received by the pool analytics computer system 6114 for processing to determine the make and model of the pool devices on the pool or spa equipment pad 6102.

The system can use the algorithms of the computer vision computer system 6112 and the pool analytics computer system 6114 to extract user data from the digital photos taken on the servicer's smartphone. For example, the data which can be determined includes model number and the data relating to the model number (power requirements, etc.). The data can also include serial number and date of manufacture. The data can also include the date the device was installed which can be obtained from the servicer phone. The data can also include geolocation/home address from the phone or cooperative application as will be discussed herein. The data can also include the installing company information and the installer's name which can be default parameters entered by a servicer. The data can also include a home owner's name which can be auto populated from address and geolocation information as discussed herein. This can be updated or overridden by the servicer or installer. The data can also include MSRP or price information of the devices, which the servicer can override and which the system can leverage the override information to provide better pricing information to the manufacturers of the devices. The data can also include cost of installation which can be provided by the installer and which can also be captured by the system to provide that information to the manufacturer so that the manufacturer can provide better price estimates for installation in the future. The data can also include information about one or more utility companies servicing the pool owner's home and the ability to select the one or more utility companies in the user interface as will be discussed below. The utility information can be captured by determining the geolocation information from the servicer smartphone and using a database based on the location to determine which utility or utilities service that area. Moreover, the data can include annual energy cost which can be determined by using the geolocation information to determine power costs at that location from the utility and a formula to make the calculation.

The system can use the algorithms of the computer vision computer system 6112 and the pool analytics computer system 6114 and the data gathered to provide auto-warranty registration and auto-rebate submissions. For example, the system can automatically register a product with the manufacturer by determining the information of the product and the pool owner information as discussed herein. Moreover the system can automatically apply for utility company rebates based on the information of the product and the pool owner information. Moreover the system can automatically apply for manufacturer rebates based on the information of the product and the pool owner information. As discussed herein, the system can automatically determine product information with computer vision systems and the pool owner information with geolocation. The system can automatically connect with a utility or merchant submit to automatically submit a rebate or the system can auto-populate a relevant form for the pool owner to allow for the owner's review and submission. These automatic procedures can be accomplished by using barcode information taken from the servicer's smartphone and geolocation information from the data capture as discussed herein.

Still with respect to FIG. 43, once the pool analytics computer system 6114 generates a recommendation for upgrading or replacing the pool devices on the pool or spa equipment pad 6102, it can send a customized upgrade/replacement sales data 6116 over the network 6110 back to the servicer smartphone 6104. Alternatively, this data can be also sent to a home owner smartphone 6118. Alternatively, this data can be also sent only to the home owner smartphone 6118. The data 6116 can be presented to the user in the form of a user interface screen as will be discussed in greater detail below. Once the servicer receives the data 6116 on his smartphone 6104, the servicer can share these details with the homeowner or owner of the pool, and can discuss the upgrades further. Alternatively, the servicer can share the data 6116 with the homeowner by sending the data 6116 over the network 6110 to the homeowner's smartphone 6118. Alternatively, as mentioned above, the homeowner and servicer can receive the data 6116 contemporaneously on each of their smartphones.

Figure 44:
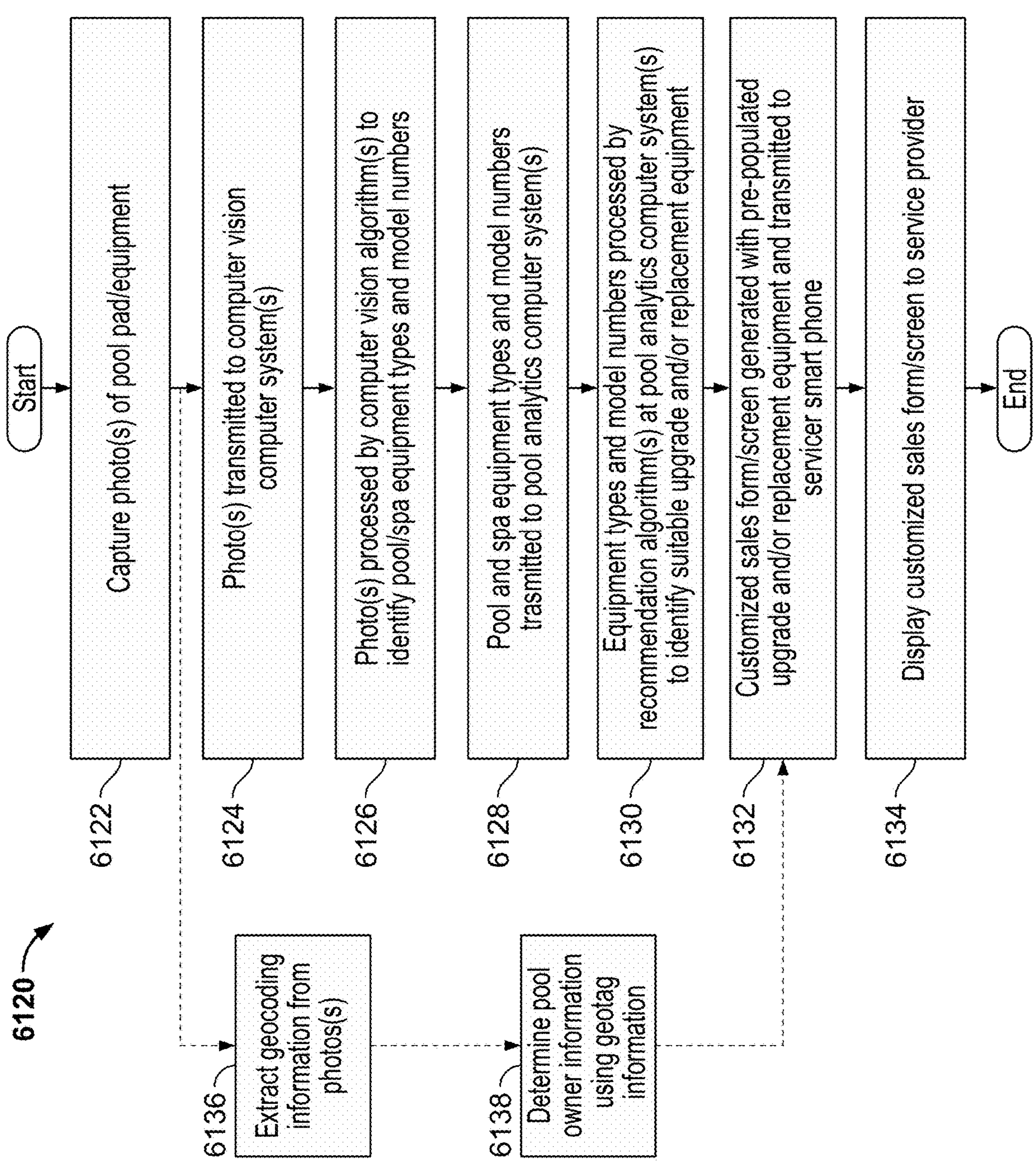
FIG. 44 is a flowchart illustrating processing steps carried out by the system of FIG. 43 for recommending upgrades in pool/spa equipment.

FIG. 44 is a flowchart illustrating processing steps 6120 carried out by the system of FIG. 43. The process can begin with step 6122, wherein the servicer captures a photo or a plurality of photos of the pool pad or any particular pool equipment with the servicer's smartphone. The process can then proceed to step 6124 where the photos taken in step 6122 are transmitted to a computer vision computer system. The process can then proceed to step 6126 where the photo(s) can be processed by computer vision algorithm(s) to identify pool/spa equipment types and model numbers. The process can be then proceed to step 6128 where pool and spa equipment types and model numbers are transmitted to a pool analytics computer system. As discussed above, the transmission and processing of the photos in steps 6124 and 6126 can occur in the pool analytics computer system. The process can proceed to step 6130 where the equipment type and model numbers are processed by recommendation algorithm(s) at the pool analytics computer system(s) to identify suitable upgrade and/or replacement equipment. As noted above, the pool analytics computer system(s) can generate recommendations based on new equipment with enhanced features or provide recommendations to adopt certain pool equipment to replace current pool equipment not suitable for the current pool or spa. The process can then proceed to step 6132 where customized sales forms/screens can be generated with pre-populated upgrade and/or replacement equipment (generated by the recommendation algorithm(s)) and transmitted to a servicer's smart phone. The process can then proceed to step 6134 where a customized sales forms/screen can be displayed to a service provider.

Optionally, as shown in FIG. 44, after step 6122, the process can proceed to step 6136 where geocoding information can be extracted from the photos taken by the servicer on his smartphone. Smartphone camera applications can provide geocoding/geolocation/geotag information with geocoding/geolocation/geotag information. Alternatively, this information can be extracted using the smartphone GPS data. The process can then proceed to step 6138 where the pool owner information is determined using geotag information extracted in step 6136. This can include a pool owner's home address. Once a home address is determined, a database of records can be searched to determine the pool equipment at that home. A computer vision algorithm does not need to process the photos because the geocoding/geolocation/geotag information can provide a means for determining the pool equipment by determining the pool owner's address and the pool equipment being used at the address through database searching. A home owner's email address can be extracted using the geocoding/geolocation/geotag data by determining a home address and cross references a database relating the home address or home owner personal identifying information. This information can be automatically populated in the user interface screens as will be discussed below.

Figure 45:
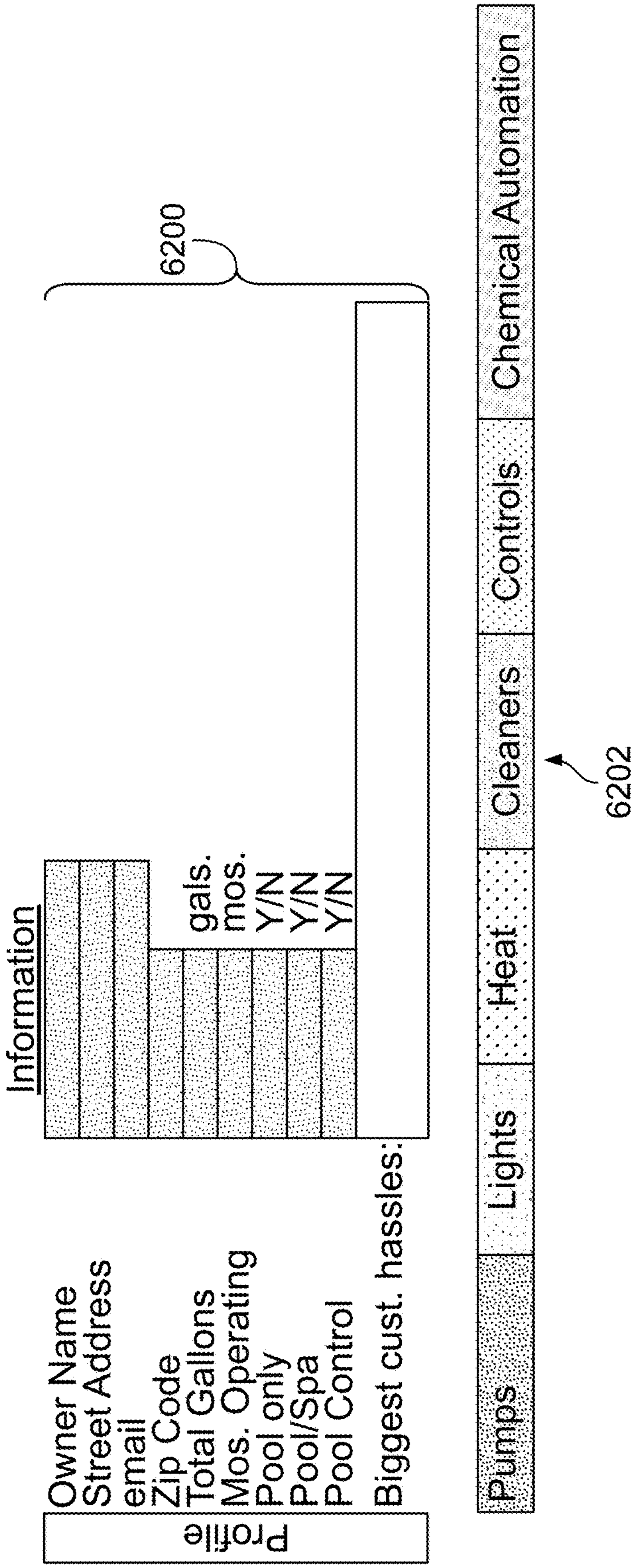

With reference to FIGS. 45-48, the user interface screens generated by the system 6100 of FIG. 43 and the process 6120 of FIG. 44 will now be discussed in greater detail. FIG. 45 illustrates an initial user interface screen generated by the system. A user profile portion 6200 is provided which can be populated with pool owner information such as owner name, street address, email, zip code, total gallons, months operating, whether there is a pool, a pool and spa, pool control, and comments with respect to customer hassles. As noted above, the user profile portion 6200 can be automatically generated by the geocoding/geolocation/geotag information extracted from the servicer's smartphone which can use this information to retrieve an address and the address can be used with a database to populate the other fields. Alternatively, a servicer can manually enter a customer name which the system can take as an input and can automatically populate the rest of the fields based on an address book or database with fields related to a customer name. Alternatively, an incoming call from a customer can use the phone number from the caller ID to query a database having the rest of the information related to the phone number, which the application can use to auto-populate the remainder of the fields. If all of the information does not get populated, the system can alert the servicer and the servicer can request the information from the pool owner. Customer hassles can be automatically extracted by the system based on the types of pool and spa components detected in the equipment pad 6102 or can be manually entered by the servicer. The screen can also include top level menus for the pool and spa devices including, but not limited to, pumps, lights, heaters, cleaners, controllers, and chemical automation. A user of the application can choose any one of the product category buttons 6202 or can choose more than one.

Figure 46:
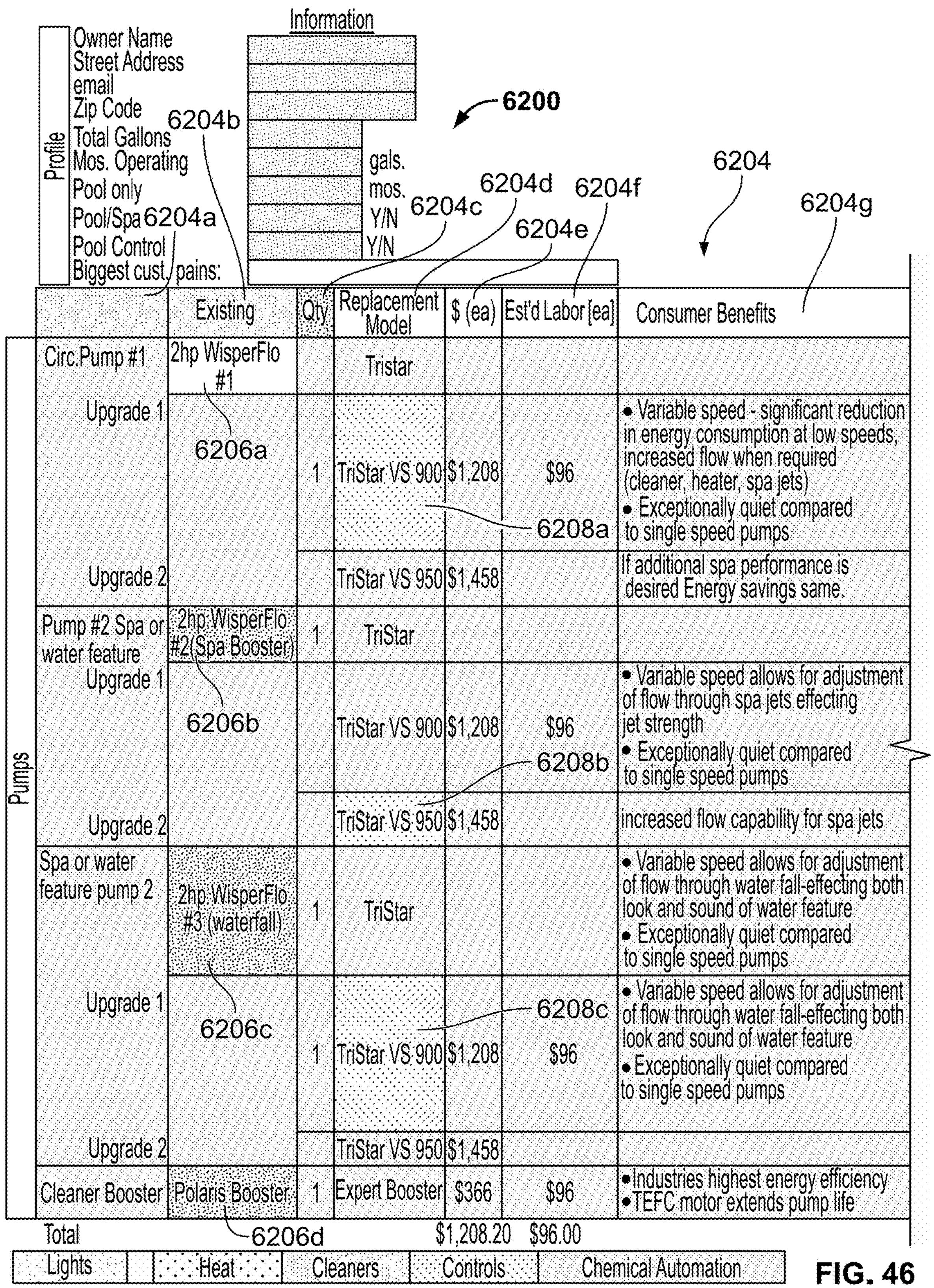

FIG. 46 is drawing of a user interface screen illustrating recommendations relating to upgrading pumps. This screen can include a pool owner profile portion 6200 which can include the pool owner's information as discussed above with respect to FIG. 45. This screen can be displayed after the user selects one or more of the product category buttons 6202 as discussed above in connection to FIG. 45. The screen can also include a plurality of columns 6204. Column 6204*a* can provide context to the rows. For example, column 6204*a* can include at least one pump which can have a general description such as "circular pump #1" or "pump #2 spa or water feature." Column 6204*a* can also include a portion for specifying the upgrade number being suggested for each general pump, such as "upgrade 1," "upgrade 2," to "upgrade n." The screen can also include the following columns: column 6204*b* can include an existing product; column 6204*c* can include a list of quantities to be recommended; column 6204*d* can list the make and model of the replacement models if any, which can be populated automatically by the recommendation systems and methods discussed above in connection with FIGS. 43 and 44; column 6204*e* can include a cost for the replacement devices; column 6204*f* can include the estimated labor costs of the replacement models; column 6204*g* can include consumer benefits for using the recommended upgrades over current devices; column 6204*h* can include an amount of energy savings for each of the recommended products if applicable; column 6204*i* can include an amount of energy savings per year for each of the recommended products if applicable; column 6204*j* can include a list of rebates if applicable; column 6204*k* can include comments with relating to the recommended products; and 6204*l* can include timing information on when the recommended product should be installed.

As can be seen in FIG. 46, fields 6206*a*, 6206*b*, 6206*c*, and 6206*d* can relate to the specific details about the current devices being used in the pool or spa which can be populated automatically by the computer vision and/or geo-location systems and methods discussed above in connection with FIGS. 43 and 44. This auto-populate feature can happen in real-time upon the servicer taking a photograph of a pool or equipment pad, or the fields can auto-populated based on a previous photo from a previous visit by the servicer. Fields 6208*a*, 6208*b*, and 6208*c* can be selected by a servicer by, for example, tapping the field which causes the system to display a color or pattern over the field. By doing so, the servicer can highlight his or her recommendation of which replacement product the pool owner should purchase out of a plurality of automatically recommended replacement products with respect to the current device in column 6204*a*. Columns 6204*h*, 6204*i*, and 6204*j* can be auto-populated with a real-time computer communication with a utility company or a database having the information. Columns 6204*d*, 6204*e* and 6204*f* can be auto-populated as prices are known and labor costs can be estimated, and the servicer or a dealer can manually update such costs before they are presented to a pool owner or in real-time. The servicer or dealer can modify the price and estimated labor for the consumer products in a source database or such modifications can exist in a limited database on the servicer or dealer device. Column 6204*l* can be modified by a servicer by any means such as a drop down menu provided by the user interface.

Once the servicer finishes making recommendations with respect to pumps as shown in FIG. 46, the servicer can select another device category in same screen and the system can repeat the process as discussed above in connection with FIG. 46. The servicer can then select a recommended device among automatically generated recommendations within the new device category. The servicer can repeat this process for all relevant device categories that are available for a pool or spa. Alternatively, as mentioned above, the servicer can select more than one device category which can prompt the system to recommend products for all devices relating to the selected device categories. The pool owner can receive the automatically generated recommendations and the servicer's choice among them by an email, text, or link to an application on the owner's smartphone for retrieving the user interface screen of the system of the present disclosure.

FIG. 47 illustrates the user interface screen of FIG. 46 after the servicer has selected a replacement product. In particular, this user interface can include the same information as the user interface of FIG. 46 such as pool owner profile information and replacement products along with the servicer recommendation. As can be seen, a pool owner can select a replacement on his/her own smartphone or on the servicer's smartphone or through any other means. Once this selection is made, the system can cause the replacement product details to be highlighted in a different color or pattern as shown in 6210*a*-6210*b*. As can be seen, the servicer recommended a replacement product in field 6208*a* and the pool owner followed the recommendation by selecting the product as shown in 6210*a*. Moreover, with respect to another device in the pool or spa environment, the servicer recommended a product among a plurality of automatically recommended products in field 6208*b* but the pool owner selected another product recommended automatically by the system of the present disclosure as shown in field 6210*b*. Still further, with respect to yet another device in the pool or spa environment, the system recommended a plurality of devices and the servicer chose one of them in field 6208*c*, but the pool owner decided not to upgrade as no device was selected. By selecting and authorizing work to be done and a replacement product to be installed, the system can generate a work order and can generate a servicer or dealer invoice for the pool owner. The invoice can provide a summary sheet for future upgrade recommendations for remaining upgrade opportunities.

FIG. 48 is a drawing illustrating another embodiment of the user interface screen of the present disclosure. The user interface screens can be modular and flexible and can be easily modified by a servicer or programmer to remove, swap, move, or modify the various columns. For example, additional columns can be included such as replacement part number 6212*a*, VPL (ea) 6212*b*, VPL (ext'd) 6212*c*, est'd labor (ext'd) 6212*d*, and utility rebate 6212*e*. It should be noted that other types of equipment including, but not limited to, filters and cleaners can be included in the user interface screen.

FIGS. 45-48 are merely example embodiments of a user interface screen generated by the system of the present disclosure. As noted above, the screens can be customizable to include any types of inputs or fields to display information helpful to a user. The system can also be programmed to generate a screen that can be customized by the servicer or the pool owner. The system can include a memory to store user screen preferences of the pool owner and servicer and can automatically display the preferred user interface layout for each user. The user interface screens can include recommendations for a plurality of devices or a single device as described above. The user interface screens can include any combination of devices in a pool or spa environment. For example, with respect to FIGS. 46-47, only pumps are shown, but this can include all the other types of devices in a pool or any combination of those devices.

It should be noted that the disclosure with respect to recommending upgrades or replacement pool device with respect to FIGS. 43-47 can be used in conjunction with the disclosure with respect to FIGS. 33AD and 33AE.

It should be noted that the databases that can be relied upon by the system of the present disclosure include a servicer database, a utilities database, a manufacturer database (having dealer, consumer, equipment pad, and product information), and an equipment pad profile database. These databases can be combined or separate.

Figure 49:
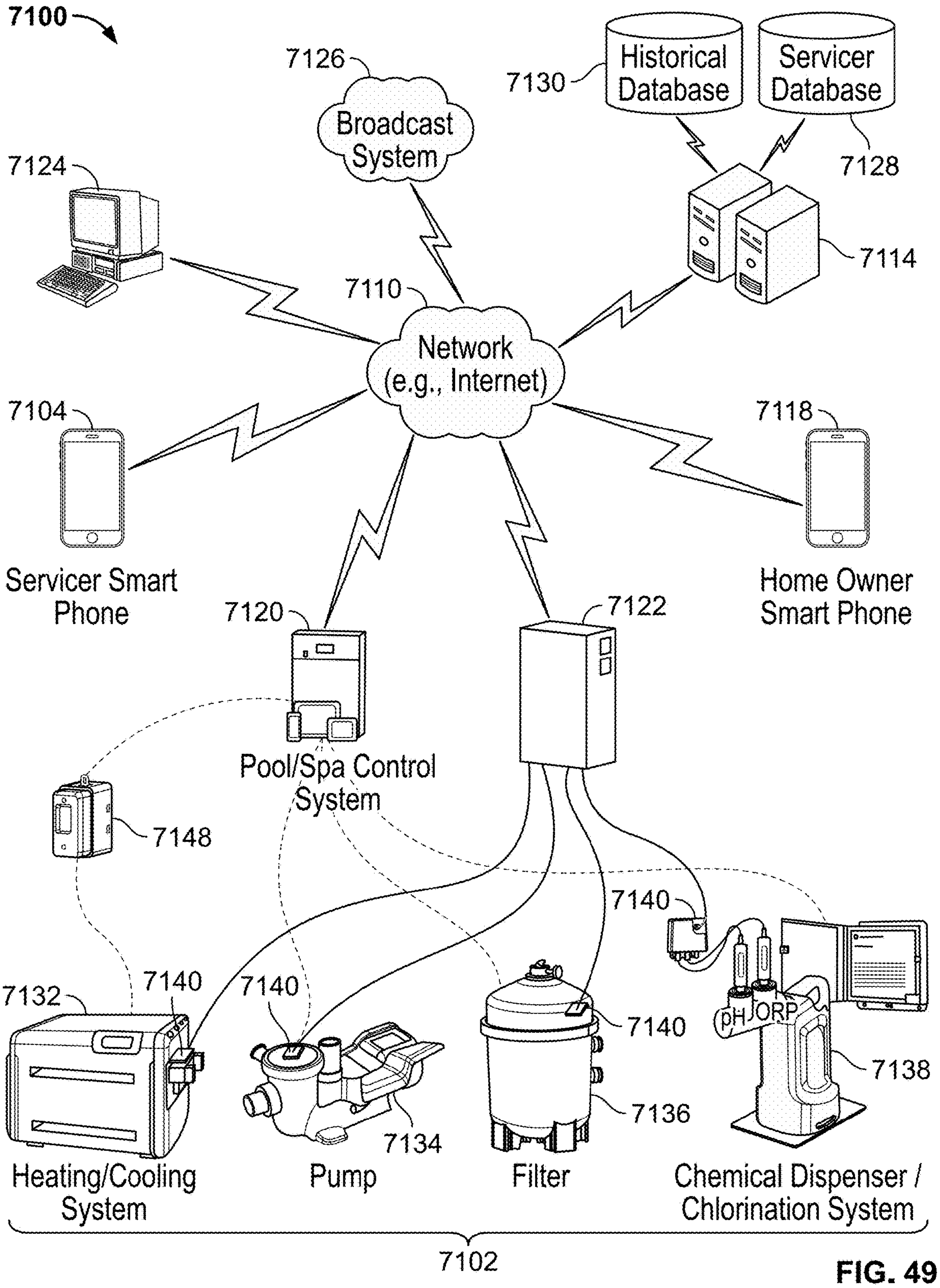
FIG. 49 is a diagram illustrating a monitoring and control system in accordance with the present disclosure.

FIG. 49 is a system diagram which illustrates a monitoring and control system 7100 for monitoring and/or controlling pool/spa equipment 7102, according to the present disclosure. The system 7100 is able to aggregate information from a variety of sources (e.g., operational data from connected devices, sensor data, web data, historical trends, etc.), process that information (e.g., via machine learning algorithms), and using the processed information, control the pool/spa equipment, preemptively address problems before they occur, and/or provide alerts if a problem does occur. The system 7100 can further provide documentation of problems, provide suggested solutions to problems, identification of problems prior to a pool/spa service technician ("servicer") arriving on-site, and identification of problem causation. The system 7100 is able to provide the aforementioned benefits utilizing combinations of one or more of hardware (system controllers, smart/connected pool/spa equipment, sensors, etc.), applications (e.g., smartphone applications, servicer systems, etc.), and cloud integration (e.g., central management/control, data storage, machine learning/analytics, etc.). According to some aspects of the present disclosure, the system 7100 can identify an alert condition (e.g., decibel level from pump microphone/sensor is exceeding historical levels), determine if a problem exists (e.g., decibel levels from pump indicative of shaft bearing failure within 30 days), provide a solution to the problem (e.g., replace shaft bearing within 30 days), and generate a list of materials needed to implement to solution (e.g., one new shaft bearing, one new shaft seal, two O-rings, shaft grease, etc.). The system 7100 can also determine where the materials can be located (e.g., in a servicer's monitored inventory, at a local distributor, online distributor, etc.), determine lead-times for the materials (e.g., in inventory, available to ship in 2 days, available for pickup at distributor, etc.), and order the materials if requested.

As shown if FIG. 49, the monitoring and control system 7100 can include a pool/spa control system 7120 for controlling and communicating with the pool/spa equipment 7102, a sensor hub 7122 in communication with a plurality of sensors 7140, an analytics system 7114, and a pool/spa servicer system 7124. The pool/spa equipment 7102 can include but is not limited to a heating/cooling system 7132, a pump 7134, a filter 7136, and a pool/spa chemistry system 7138. The plurality of sensors can be configured to gather operational data related to the equipment 7102 as will be discussed in greater detail hereinbelow.

The system 7100 is able to monitor and control smart and/or connected devices (e.g., devices which are capable of direct communication with the system 7100 via a data connection) as well as legacy devices (e.g., devices which not are capable of direct communication with the system 7100 via a data connection). For example, as shown in FIG. 49, a connected device such as pump 7134 can provide operational data (e.g., pump speed, water pressure, etc.) directly to the system 7100, and can be controlled by the system 7100, by way of a data connection (e.g., RS485, WiFi, Bluetooth, ZWave, Zigbee, etc.). However, a legacy device such as heater 7132 may not include a communication bus, or may not otherwise be capable of communication with the system 7100 (e.g., incompatible communication protocols between the heater 7132 and system 7100). In this case, sensors 7140 are provided to monitor the operation of the heater 7132 and provide this information (e.g., water outlet temperature) to the system 7100 by way of sensor hub 7122, discussed herein. The system 7100 is able to control the heater 7132 via a smart relay 7148, discussed herein, which communicates with the system 7100 and regulates power provided to the heater 7132. Of course, the system 7100 can monitor and control additional legacy devices in a similar fashion.

Figure 50:
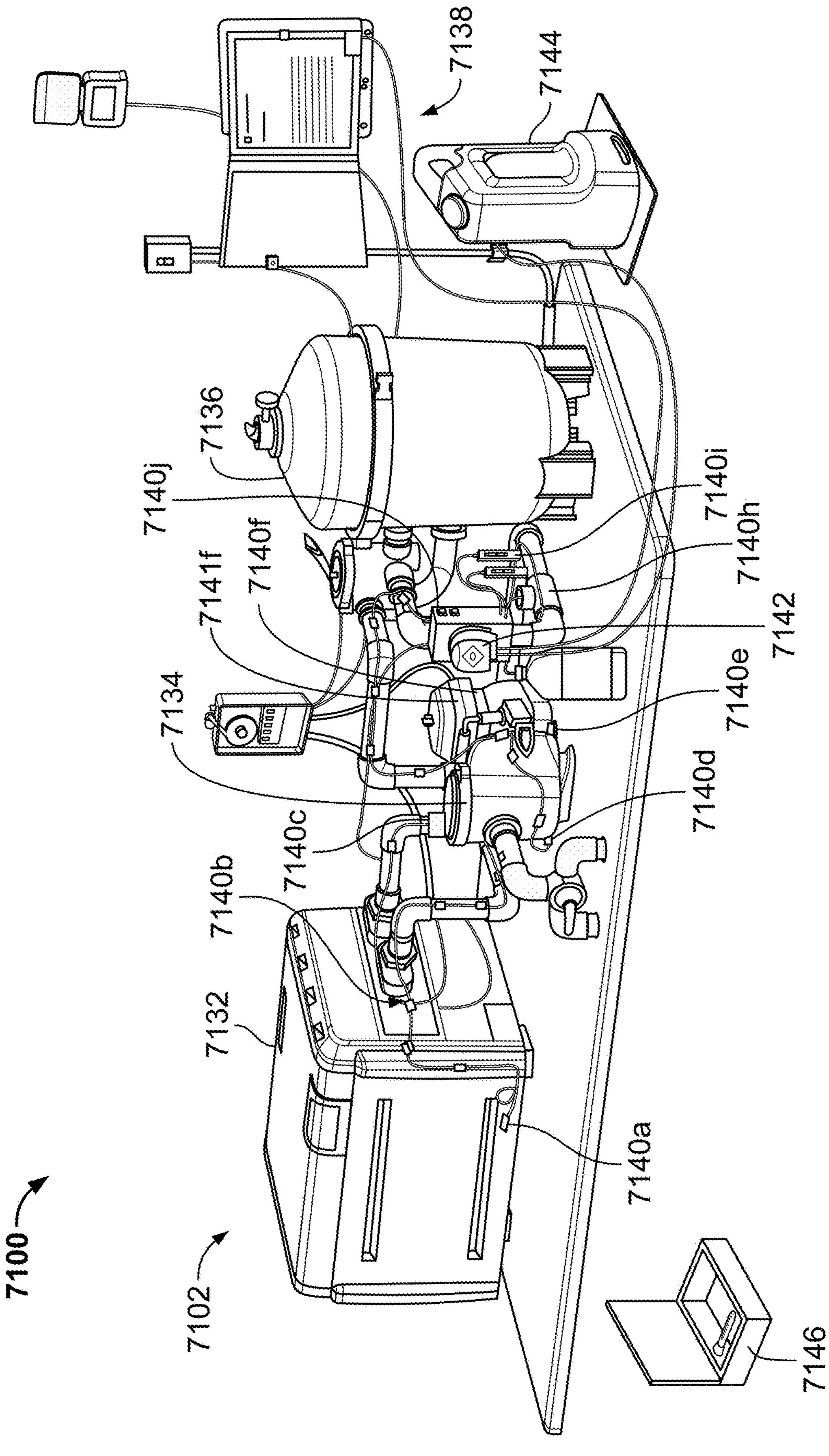
FIG. 50 is a diagram illustrating the system of FIG. 49.

FIG. 50 is another diagram which illustrates additional aspects of the sensor hub 7122 and sensors 7140 of the monitoring and control system 7100 of the present disclosure. As shown in FIG. 50, and described below, data gathered by sensors 7140 and sensor hub 7122 is used by the system 7100 to monitor various characteristics of the equipment 7102 and/or the pool/spa environment.

For example, the heating/cooling system 7132 could be provided with a flood sensor 7140*a* to determine if the heat exchanger is leaking so that it can be replaced before heater is damaged. The heating/cooling system 7132 could also be provided with a heater pod 7140*b* that can include multiple sensors (e.g., current clamping, vibration, flooding, thermostat voltage, etc.), as well as a thermostat relay, for determining if heat was called for but is not heating, heater power loss, igniter current cycling with re-tries, low gas pressure, ignition failure, blower fan failure, heat run time and energy cost calculation, acting as a remote thermostat and heat shutoff, and providing alerts (e.g., head usage rules are violated). The heating/cooling system 7132 could also be provided with an outlet temperature sensor 7140*c*, of an insulated wrap-on variety or similar, that can be used to determine heater efficiency loss due to moisture or a burner issue, that the heater is not firing, or an excessive output temperature caused by low flowrate, shortening the lifespan of the heater.

The pump 7134 could be provided with a vacuum sensor 7140*d* in its drain plug, the operational data from the vacuum sensor 7140*d*, being used by the system 7100 to determine whether a pump skimmer needs to be cleared and to detect low water below the skimmer. The vacuum sensor 7140*d* could also be used by the system 7100 to clear a loaded pool skimmer or main drain. A flood sensor 7140*e* can be provided, the operational data from the flood sensor 7140*e*, being used by the system 7100 to determine shaft seal leakage, so that the seal can be replaced before the bearings are damaged, or to determine that there is a flooded pool pad, so that the pump can be shut off, thereby avoiding emptying of the pool (and potential displacement relative to the water table). Motor temperature sensor 7140*f* and vibration sensor 7141*f* can also be provided, the operational data from the motor temperature sensor 7140*f* and vibration sensor 7141*f*, being used by the system 7100 to determine if there is a blocked fan inlet (e.g., by leaves or improper installation), or a broken or fouled fan blade (e.g., via bearing noise).

A combination sensor 7140*h* including salinity, water temperature, and flow sensing can also be provided, the operational data from the combination sensor 7140*h* being used by the system 7100 to determine the inlet water temperature for remote heat control, low salinity for salt chlorination control, insufficient flow for heating control, whether backwashing is necessary, whether the pump is running dry, the pool turnover rate or filter schedule assessment, and whether there is an energy savings opportunity by converting a single-speed pump to a variable-speed pump ("VSP"). PH and oxidation reduction potential ("ORP") sensors 7140*i* can also be provided, the operational data from the PH and ORP sensors 7140*i*, being used by the system 7100 to manage pH and chlorine dose by the pool/spa chemistry system 7138. In addition to, or in place of, the pH and ORP sensors 7140*i*, the system 7100 can include water sample mailers 7146. The water sample mailers 7146 contain sample vials of pool water which can be tested by a service provider. For example, the water samples can be provided with prepaid postage, can be pre-addressed, and can be bar-coded so that a pool owner can easily send a sample of pool water to a servicer if one is requested by the servicer, or if the pool owner required that the water be tested for another reason. The system 7100 could further include smart test strips and the system 7100 could process the data from the smart test strips and suggest an appropriate water treatment.

Still with respect to FIG. 50, according to some aspects of the present disclosure, the sensor hub 7122 could be provided with integral rain, ambient light, humidity, and air temperature sensors 7140*j*. According to further aspects of the present disclosure, the sensor hub 7122 could also be provided with an integrated jug feeder system 7142, including a peristaltic pump that draws from a container (e.g., jug) of acid, the integrated jug feeder system 7142 being used by the system 7100 to control the pH of the pool or spa water. As an alternative to, or in combination with, the integrated jug feeder system 7142, the system 7100 can include acid and/or chlorine feed tanks 7144 that include level sensing capabilities that provide additional operational data to the monitoring and control system 7100, thereby further enhancing automation capabilities. According to still further aspects of the present disclosure, the sensor hub 7122 can include a memory, the memory being used for local storage of acid feeding, chemical dosing, and filtering schedules. The schedules can be manually updated locally, or automatically updated based on algorithms processed by the analytics system 7114.

Figure 51:
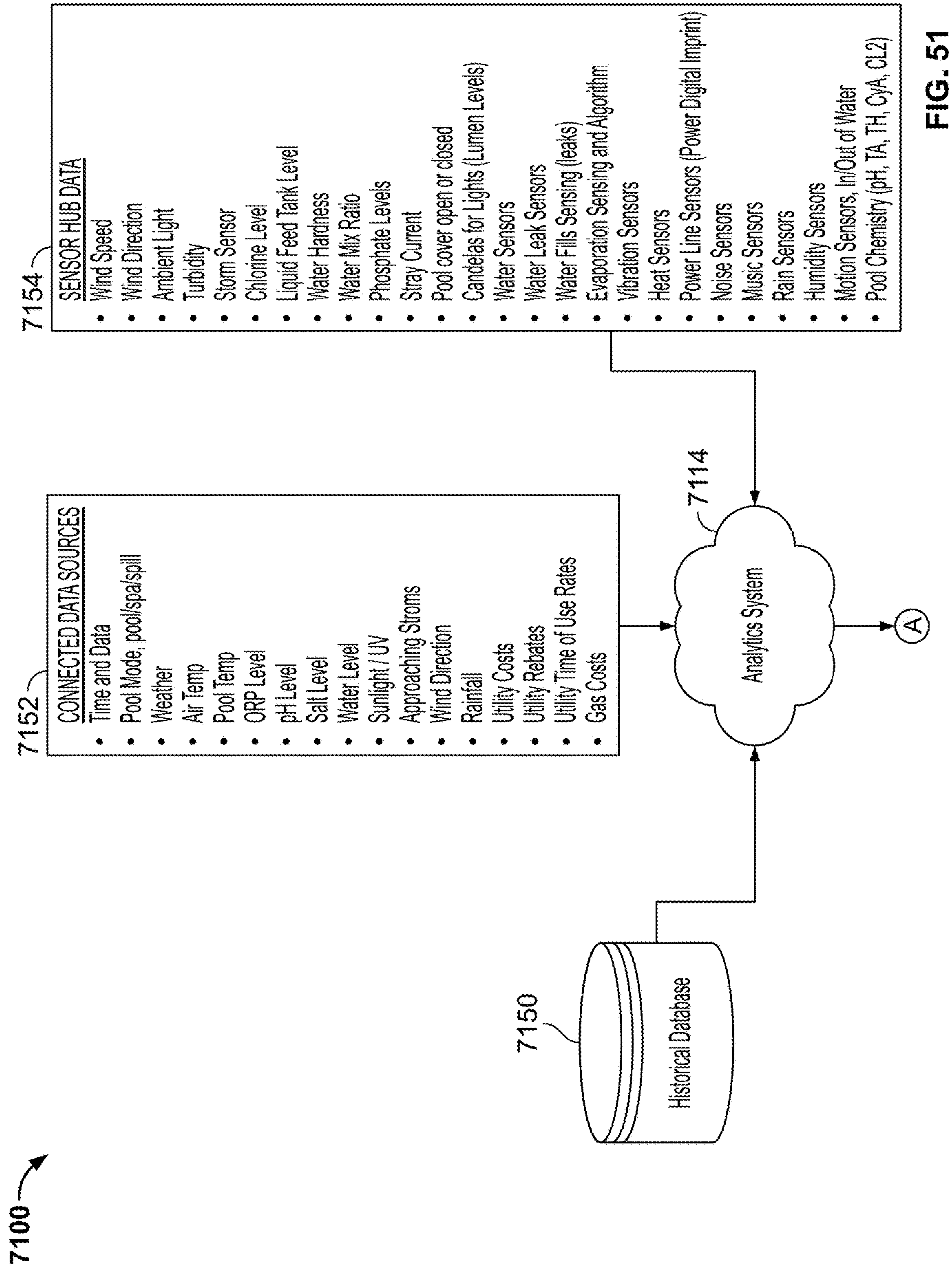
FIG. 51 is a block diagram illustrating control logic of the system of FIG. 49.

As discussed above, the system 7100 is able to aggregate information from a variety of sources, process that information, and using the processed information, control the pool/spa equipment, preemptively address problems before they occur, and/or provide alerts if a problem does occur. For example, as shown in FIG. 51, the analytics system 7114 of the system 7100 can be in communication with and/or receive information from a historical database 7150, connected data sources 7152, and sensor hub data 7154. The historical database includes a comprehensive data set of historical information (e.g., power, noise, environmental data, water levels, size of plumbing, jets, measured head, failures, normal power draw for a pump, power consumption changes in the months preceding a failure, normal power draw for a chlorination cell, chlorination cell power draw preceding a failure, chlorination cell power draw preceding a cleaning, normal gas consumption of a heater, gas consumption of a heater preceding a failure, gas consumption of a heater preceding a service, etc.), including failures and the conditions preceding failures, which is analyzed (e.g., using machine learning) by the system 7100 to predict failures before they occur and suggest solutions. As the information contained historical database grows, the predictions become increasingly accurate. The historical database 7150 can include historical data gathered from connected pool/spa devices 7102, data recorded by sensors 7140, as well as additional historical information gathered and recorded by the system 7100. In addition to the information collected from a single pool/spa environment (e.g., a pool/spa located at single residence), the historical database 7150 can also contain information related to a plurality of pool/spa environments (e.g., pool/spas located at a plurality of residences or commercial locations distributed across a wide geographic area).

The connected data sources 7152 can include up-to-date information retrieved from the Internet, current operational data from one or more connected pool/spa devices 7102, as well as any other currently available information. For example, the connected data sources 7152 can include, but are not limited to, information related to the time and date, pool mode, pool/spa/spill, weather, air temperature, pool temperature, ORP level, pH level, salt level, water level, sunlight/UV index, approaching storms, wind direction, rainfall, utility costs, utility rebates, utility time of use rates, gas costs, and the like. In addition to being provided to the analytics system 7114, information from the connected data sources 7152 can also be saved to the historical database 7150 for later retrieval and use by the system 7100.

The sensor hub data 7154 can include current information that is received from the sensors 7140 in communication with the sensor hub 7122. For example, the sensor hub data 7154 can include, but is not limited to, information related to wind speed, wind direction, ambient light, water turbidity, chlorine level, liquid feed tank level, water hardness, water mix ratio, phosphate level, stray current, pool cover position (e.g., open or closed), candela and/or lumen levels (e.g., for lighting), pool chemistry (e.g., pH, TA, TH, CyA, CL2), and the like, as well as other information received from storm sensors, water sensors, water leak sensors, water fills sensing (e.g., leaks), evaporation sensing and algorithm, vibration sensors, heat sensors, power line sensors (e.g., power digital imprint), noise sensors, music sensors, rain sensors, humidity sensors, and motion sensors (both in and out of water). In addition to being provided to the analytics system 7114, the sensor hub data 7154 can also be saved to the historical database 7150 for later retrieval and use by the system 7100.

The analytics system 7114 processes the information from the historical database 7150, connected data sources 7152, and sensor hub data 7154 to determine information related to the system 7100 that may not be detectable, may be inconvenient, or may be cost-prohibitive utilizing traditional sensing means. For example, a sensor may not be commercially available to determine a shaft seal failure. Further, it could be beneficial to a pool owner or servicer to predict a shaft seal failure before it occurs.

Accordingly, the system 7100 of the present disclosure can generate determined information for the pool/spa equipment 7102. For example, the system 7100 can determine information related to the pump 7134 such as, but not limited to, shaft seals, drive failures, communication failures, seal failures, motor failures, bearing failure/noise, basket level (e.g., low, med, high, etc.), skimmer level (e.g., low, med, high, etc.), filter status (e.g., pressure increasing, time to backwash, etc.), blocked air inlet, fan blade broken, impeller broken or damaged, pump running dry, pool turnover rate, pump run time and energy calculations, pump run time and turnover calculations and energy suggestions, inefficiencies in energy usage because of a problem, and the like.

The system 7100 can determine information related to the heater 7132 such as, but not limited to, a board failure, communication failure, ignition failure, igniter cycling, heater power loss, whether the heater is calling for heat but not heating, blower fan failed, a gas leak, kinked line, combustion failure, low gas pressure, no gas available, a water leak, heater run time and energy calculation, heating expense that exceed the pool owner's historical heating trends, and the like. One example of the above is that a flood sensor can be used to identify that a heat exchanger is leaking.

The system 7100 can determine information related to a lighting system (discussed herein) such as, but not limited to, a bulb that is about to burn out, a bulb that is burnt out, LEDs that have failed, that the LED lights are leaking, a low voltage (voltage drop) condition, that the LEDs are dimming from hours of operation, that the lights have been on too long, or the like.

The system 7100 can determine information related to a filter system 7136 such as, but not limited to, that it is time to backwash or clean elements, the DE or sand is low, there is leak in the filter, a plug is not plugged in, a gasket seal is not correct, a belly band is not tight enough, there is a leak in an air valve, there is a crack in shell, and the like.

The system 7100 can determine information related to the chemistry system 7136 such as, but not limited to, the salt level (e.g., salt needed or excess), board damage, the chlorinator cell is dirty, the chlorinator cell has calcification, the probe is dirty or broken, the probe is out of calibration, that it is time to replace the chlorinator cell, it is time to replace flow switch, the pool needs chlorine, the pool needs acid, the UV lamp brightness has decreased from its initial level, the UV lamp is damaged, the UV lamp needs to be replaced, the feed tank levels for acid or liquid chlorine, that too much acid or chlorine is being used based on historical trends; identification of phosphates, that the pool water is out of chemical balance, what chemicals are needed and how much of them is needed to restore balance, and the like.

The system 7100 can determine information related to a pool/spa cleaner system such as, but not limited to, that it is time to empty debris, identification of debris (in or around) the pool/spa, that a drive is failing, that bearings need to be repaired, or the like.

Figure 52:
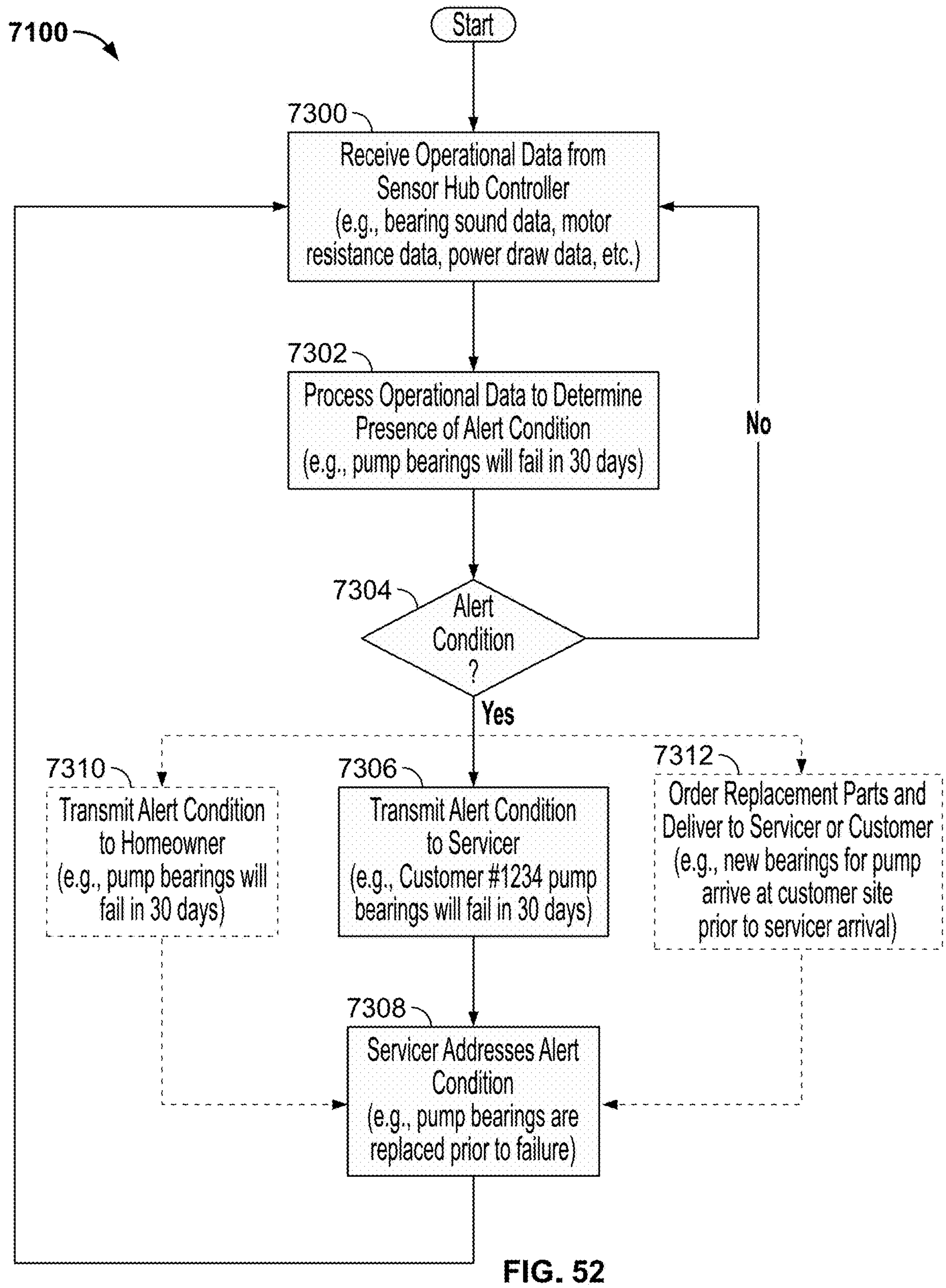
FIG. 52 is a flowchart illustrating processing steps carried out by the system of FIG. 49.

FIG. 52 is a flowchart illustrating processing steps carried out by the system 7100 of the present disclosure to preemptively address an equipment failure before it occurs. As discussed above the system 7100 could monitor a plurality of pumps 7134 (e.g., 100 pumps at various sites dispersed in a geographical region). The system can 7100 detect a deviation or change in bearing sound (e.g., increased decibels or altered sound profile) and/or a change in resistance of the pump motor (e.g., increased power draw) from historical trends. The altered sound and resistance data can be compared with information contained in the historical database 7150 to determine the cause of the deviation (e.g., a failing bearing) and a predicted timeline (e.g., the bearing will fail in 30 days). For example, in step 7300 the system 7100 receives operational data from the sensor hub controller (e.g., bearing sound data, motor resistance data, power draw data, etc.) and then proceeds to step 7302, where the system 7100 processes the operational data to determine the presence of an alert condition (e.g., the pump bearings will fail in 30 days). The system 7100 then proceeds to step 7304, where a determination is made as to the presence of an alert condition. If a negative determination is made in step 7304, the system 7100 returns to step 7300. If the system 7100 determines that there is an alert condition, the owner/customer can be alerted (e.g., via email, SMS/text/iMessage, pop-up notification, etc.) to the condition (e.g., pump failure), a servicer can be alerted that his or her customer's pump is going to fail, and replacement parts can be automatically ordered and delivered to the servicer or directly to the customer location, all before any adverse condition occurs (e.g., pump failure). The system 7100 could further include an application installed on a home owner's smart device (e.g., smartphone) 7118 and on a servicer's smart device 7104 (see FIG. 49) and notifications/alerts can be transmitted via the application, discussed in greater detail below. For example, if a positive determination is made in step 7304, the system 7100 proceeds to step 7306 where a alert condition is transmitted to a servicer (e.g., Customer #1234 pump bearings will fail in 30 days). In step 7308 the servicer addresses the alert condition (e.g., the bearings are replaced prior to failure/predicted failure) and the system 7100 returns to step 7300. Optionally, in step 7310, the system 7100 could transmit an alert condition to the homeowner (e.g., pump bearings will fail in 30 days) before proceeding to step 7308. In further optional step 7312, the system 7100 could automatically order replacement parts (e.g., new bearings for pump arrive at customer's location prior to servicer arrival) before proceeding to step 7308.

Figure 53:
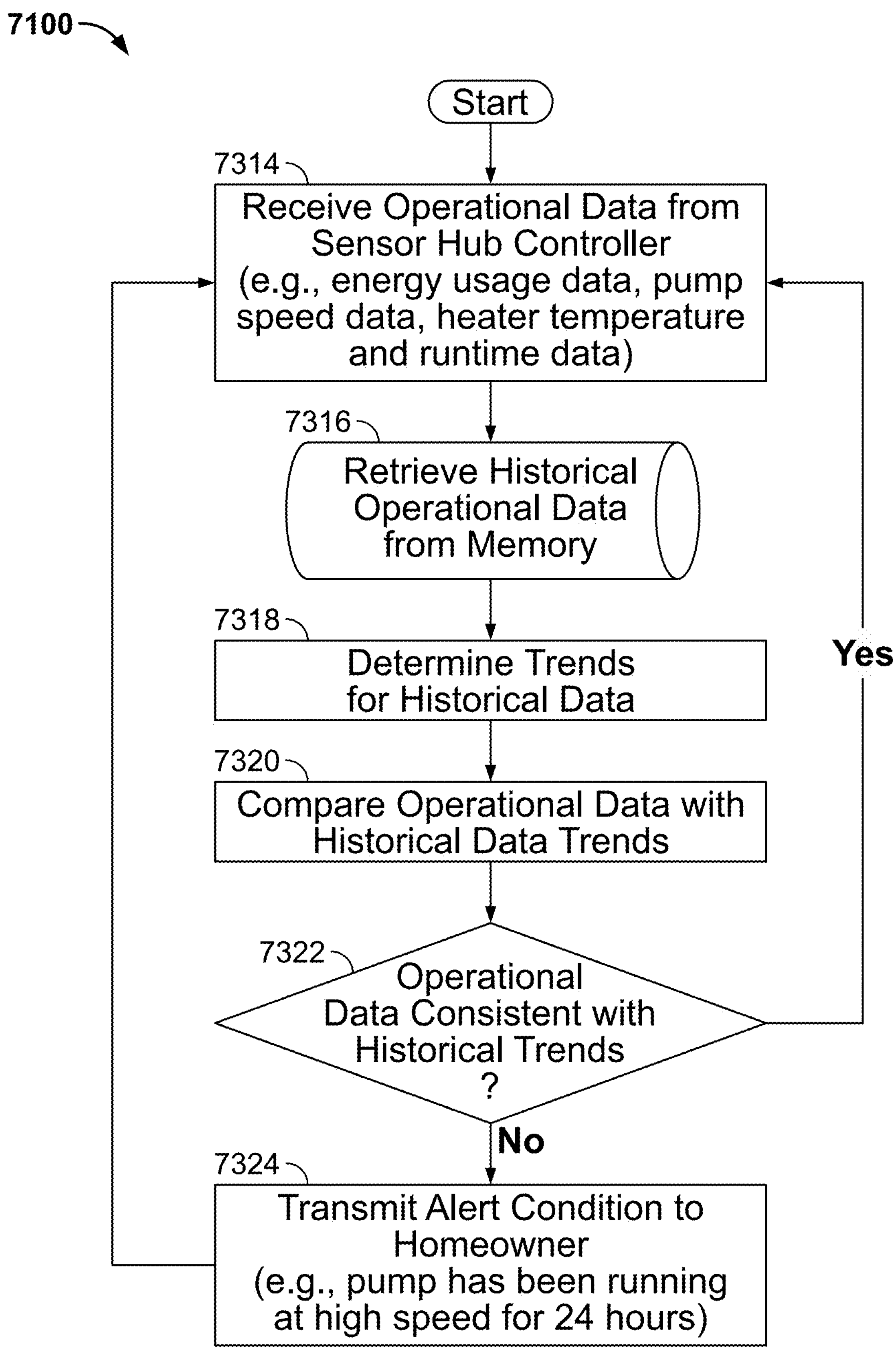
FIG. 53 is a flowchart illustrating processing steps carried out by the system of FIG. 49.

FIG. 53 is a flowchart illustrating processing steps carried out by the system 7100 of the present disclosure to alert a homeowner when current energy usage exceeds historical trends (e.g., the variable speed pump "VSP" has been running on high for 24 hours, the heater has been running for three days at 104 degrees Fahrenheit, etc.). The system 7100 can transmit an alert to a homeowner (or servicer) when a parameter is not running within specification or a parameter is not consistent with historical trends (e.g., too much heating turnover, power consumption, chemical dispensing, water refilling, dropped packets, etc.). For example, in step 7314, the system 7100 receives operational data from the sensor hub (e.g., energy usage data, pump speed data, heater temperature and runtime data, etc.) and then proceeds to step 7316, where the system 7100 retrieves historical operational data from the memory (e.g., historical database 7150). In step 7318, the system 7100 determines trends for the historical data and then in step 73120, the system 7100 compares the current operational data with the historical data trends. In step 7322, the system 7100 determined whether the current operational data is consistent with the historical trends. If a positive determination is made in step 7322, the system returns to step 7314. If a negative determination is made in step 7322, the system proceeds to step 7324 where an alert condition (e.g., pump has been running at high speed for 24 hours) is transmitted to the homeowner (e.g., via an application running on smart device 7118). The system 7100 then returns to step 7314.

Figure 54A:
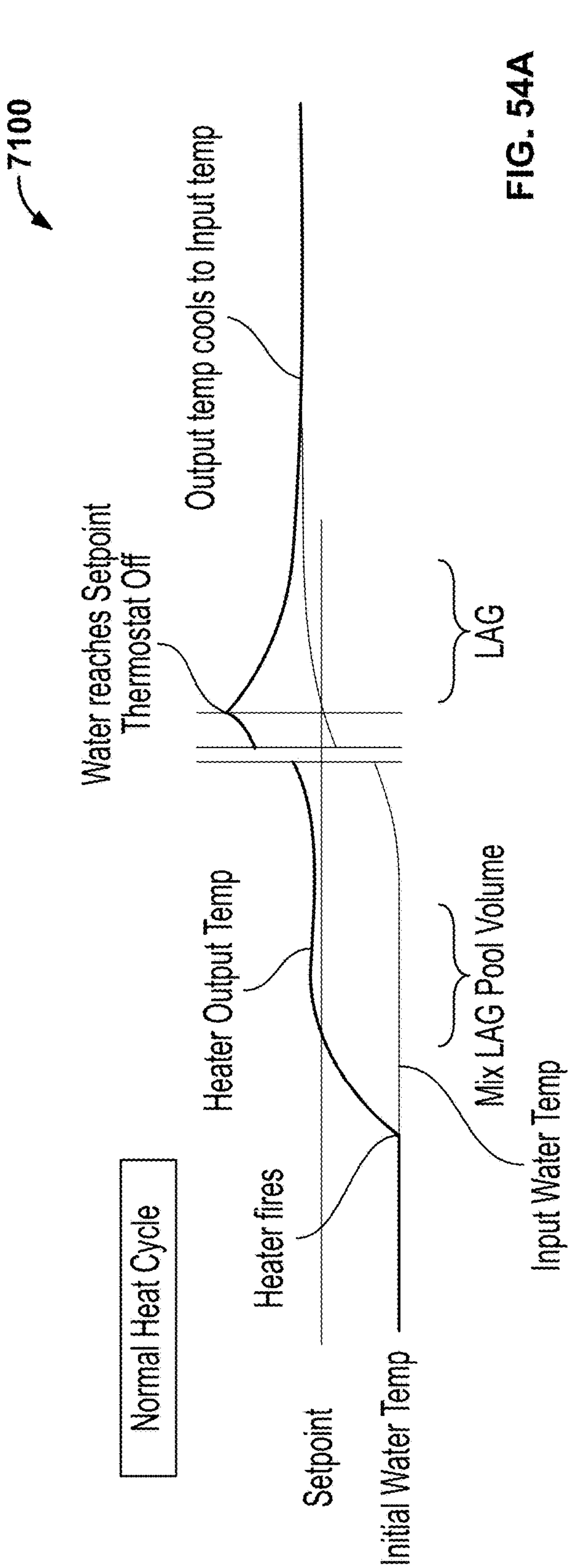
FIGS. 54A and 54B are graphical illustrations of heater cycles of the system of FIG. 49.
Figure 54B:
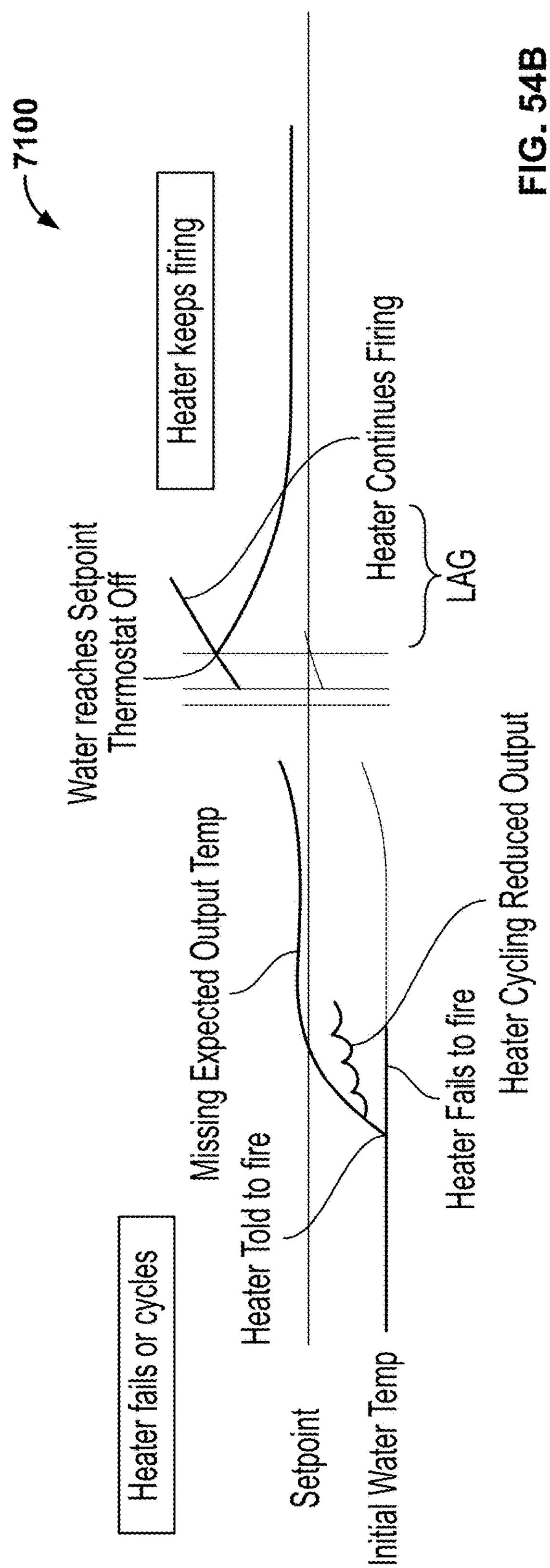
Figure 55:
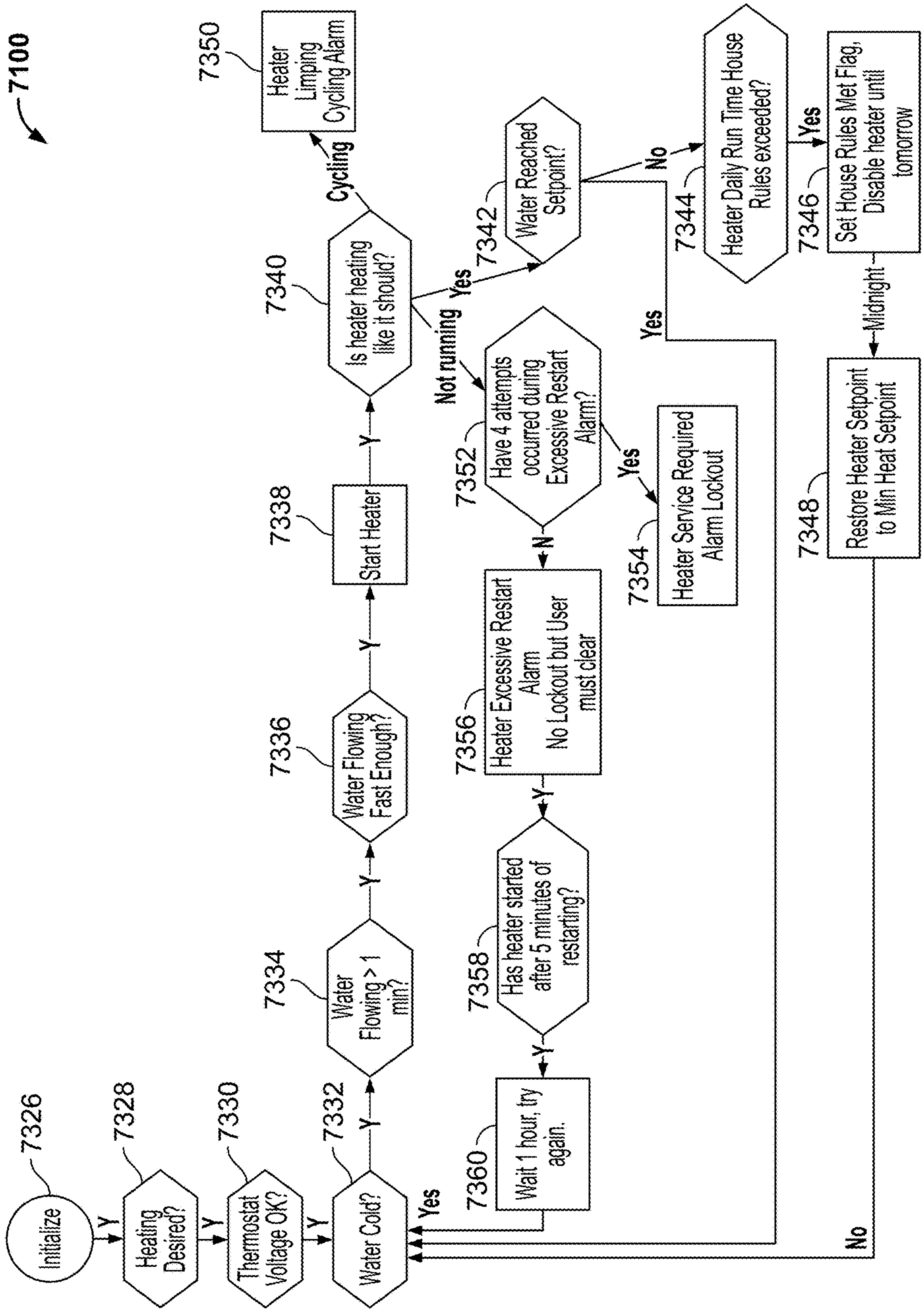
FIG. 55 is a flowchart illustrating processing steps carried out by the system of FIG. 49.

FIG. 54A is a graphical representation of a historical trend for a normal heat cycle for heater 7132, FIG. 54B is a graphical representation of a heat cycle that deviates for the historical trend shown in FIG. 54A, and FIG. 55 is a flowchart illustrating processing steps carried out by the system 7100 to restore the heat cycle to normal operation. As shown in FIG. 54A, when the heater initially fires, the output water temperature of the heater quickly rises while the input water temperature only gradually increases (e.g., lags behind) due to the large volume of the pool/spa. Both the output and input water temperatures of the heater continue to increase until the output temperature reaches a predetermined setpoint. At this point, the heater stops firing and the output temperature eventually reaches equilibrium with the input temperature.

As shown in FIG. 54B. if the heater fails to fire, or the heater is continuously cycling (resulting in a reduced output), the system 7100 is able to determine that the heater is failing to fire or that it is cycling by comparing the current output water temperature to the historical trend discussed in connection with FIG. 54A and determining that the output water temperature is below the historical trend. Similarly, the system 7100 can determine if the heater has erroneously continued to fire by comparing the current output water temperature to the historical trend discussed in connection with FIG. 54A and determining that the output water temperature is above the historical trend.

FIG. 55 is a flowchart illustrating processing steps carried out by the system 7100 in connection with FIGS. 55A and 55B. In step 7326 the system 7100 is initialized, in step 7328 the system 7100 determines whether heating is desired, in step 7330 the system 7100 determines whether the thermostat voltage is acceptable, and in step 7332 the system determines if the water is cold. If a positive determination is made in step 7332, the system 7100 proceeds to step 7334 where the system 7100 determines if the water has been flowing for over a minute. If a positive determination is made in step 7334, the system proceeds to step 7336, where the system 7100 determines whether the water is flowing fast enough (e.g., operational data from a flow sensor is above a predetermined setpoint). If a positive determination is made in step 7336, the system 7100 transmits an instruction to start the heater in step 7338. In step 7340, the system 7100 determines whether the heater is operating like it should (e.g., by comparing the current output water temperature to the historical trend discussed in connection with FIG. 55A). If a positive determination is made in step 7340, the system 7100 proceeds to step 7342 where the a determination is made as to whether the water has reached a predetermined setpoint. If a positive determination is made in step 7342, the system 7100 returns to step 7332. If a negative determination is made in step 7342, the system 7100 proceeds to step 7344, where a determination is made as to whether the heater daily run time house rules have been exceeded. If a positive determination is made in step 7344, the system 7100 proceeds to step 7346, where the heater is disabled until the next day and a flag is saved to memory (e.g., historical database 7150). Once the next day begins (e.g., after midnight) the system 7100 proceeds to step 7348 where an instruction is transmitted to the heater to restore the heater setpoint to a minimum heater setpoint value and then the system 7100 returns to step 7332. If the system 7100 determines in step 7340 that the heater is cycling, the system 7100 proceeds to step 7350 where a heater limping cycling alarm is transmitted (e.g., to the homeowner or servicer). If the system 7100 determines in step 7340 that the heater is not running, the system 7100 proceeds to step 7352, where the system 7100 determines whether four attempts have occurred during an excessive restart alarm. If a positive determination is made in step 7352, the system proceeds to step 7354 where an alarm lockout is put in place (e.g., heater service required). If a negative determination is made in step 7352, the system 7100 proceeds to step 7356 where a heater excessive restart alarm is transmitted (e.g., no lockout is put in place, but the alarm must be cleared). The system 7100 then proceeds to step 7358, where the system 7100 determines if the heater has restarted after five minutes of restarting. If a positive determination is made in step 7358, the system 7100 proceeds to step 7360, where the system initiates a timer (e.g., one hour) and after expiration of the timer, attempts to restart the heater. The system 7100 then returns to step 7332. It is contemplated by the present disclosure that the system 7100 can be configured to only transmit an alert condition when a significant change from historical trends is detected. This can be accomplished using alert thresholds that are established using hysteresis modeling, thereby preventing erroneous alerts due to signal jitter or the like.

Figure 56:
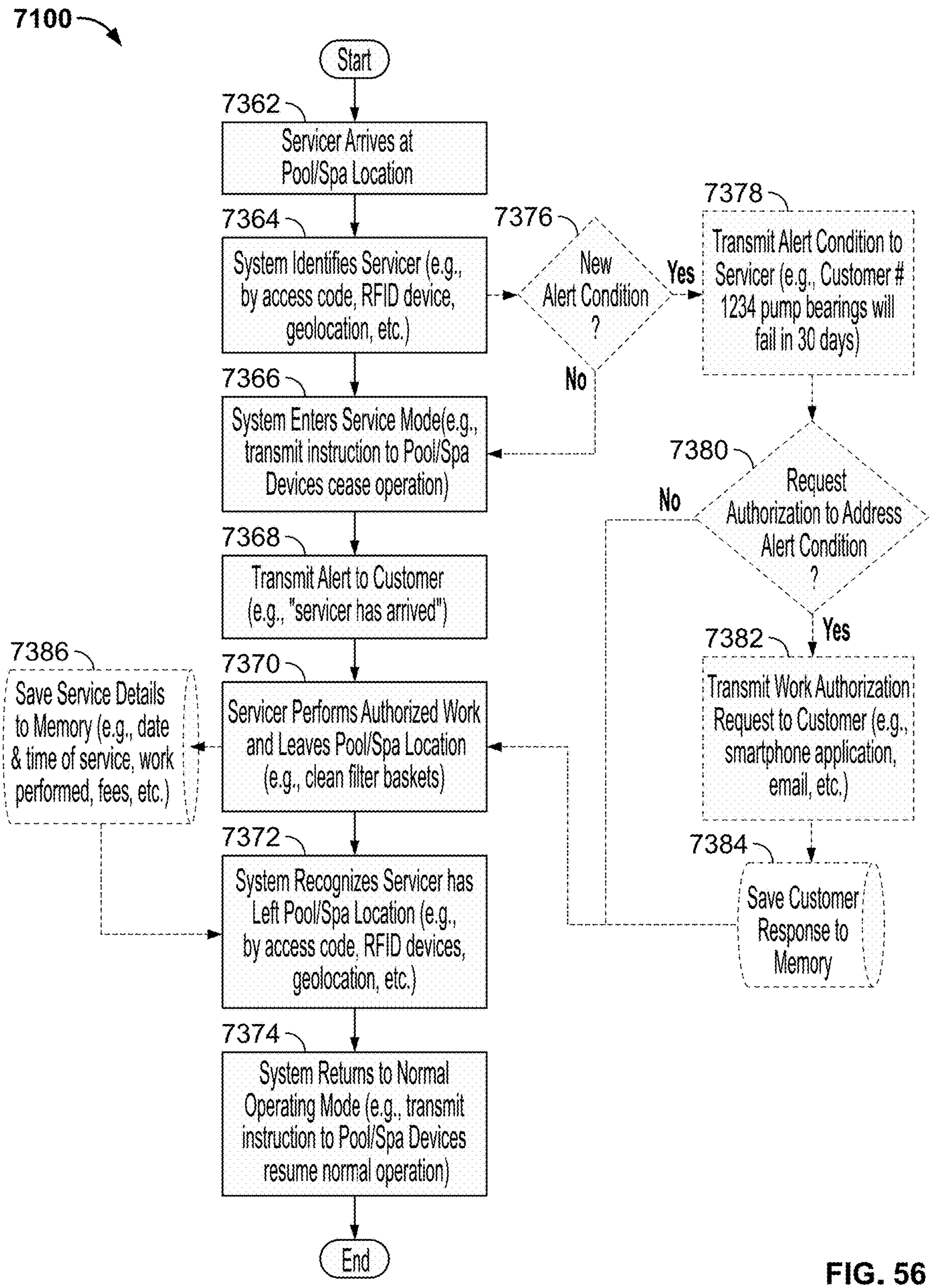
FIG. 56 is a flowchart illustrating processing steps carried out by the system of FIG. 49.

FIG. 56 is a flowchart illustrating processing steps carried out by the system 7100 to automatically grant a servicer access to the system to perform authorized work. The system 7100 can determine that a servicer is authorized to service a particular account. The system 7100 could identify the servicer by way of the servicer's smart device 7104 that is registered to the account, by an individually coded key fob, a location pod, or other identification/authorization systems. In one example, the servicer can enter a pool/spa environment, the system 7100 can identify the servicer and that he or she is authorized to perform work and then the system 7100 initiates a servicer mode and alerts the homeowner that the servicer has arrived at the site. Once the servicer has completed the work, the servicer leaves the site and the system 7100 resumes normal operation. For example, as shown in FIG. 56, in step 7362 the servicer arrives at the pool/spa location and in step 7364, the system 7100 identifies the servicer (e.g., by access code, RFID device, geolocation, etc.). In step 7366, the system 7100 enters a service mode (e.g., transmits an instruction to the pool/spa devices to cease operation). In steep 7368, the system 7100 transmits an alert to the customer (e.g., "the servicer has arrived"). In step 7370, the servicer performs authorized work (e.g., cleans the filter baskets) and leaves the pool/spa location. In step 7372, the system 7100 recognizes that the servicer has left the pool/spa location (e.g., by access code, RFID device, geolocation, etc.). Finally, in step 7374, the system 7100 returns to normal operation mode (e.g., transmits an instruction to the pool/spa devices to resume normal operation). Optionally, in step 7386, the system 7100 can save the details of the service call (e.g., date and time of service, work performed, fees, etc.) to memory (e.g., servicer database 7128 or servicer system 7124).

As discussed herein, geolocation services running on the servicer's smart device 7104 can be utilized by the system 7100 to determine if the servicer is at the site and register his or her presence in an account history. The location services can also be utilized by the system 7100 to automatically update the application on the homeowner's smart device 7118 and notify the homeowner that the servicer is present, has left, performed the expected work, etc. Additionally, as discussed in greater detail below, the application can also display information such as water readings (if they were taken by the servicer) and those readings can also be stored to memory (e.g., servicer database 7128, historical database 7150, or servicer system 7124). Further, the application can also provide real-time updates as the work is performed by the servicer, the reason for the work, and the costs. All of this information can be stored by the system 7100 as data points for future reference and analysis (e.g., machine learning) by the system 7100.

According to some aspects of the present disclosure, the system 7100 can alert the servicer to alert conditions (that the servicer may not have been aware of before arrival) so that he or she can address the alert conditions while on-site. If there is a predicted failure with a piece of pool/spa equipment, the servicer can receive an alert via an application on the servicer's smart device 7104. The servicer can then choose to transmit that alert to the homeowner via a similar application on the homeowner's smart device 7118. The servicer can also request approval (e.g. with a countdown timer for the current service call or the next) to address the alert within the same application. The system 7100 can also document that the servicer was on site, that an alert was present, that the homeowner was notified of the alert, and the homeowner's response to the request to address the alert (if one was given). For example, as shown in FIG. 56, in optional step 7376, the system 7100 determines if a new alert condition is present. If a negative determination is made in step 7376, the system 7100 proceeds to step 7366. If a positive determination is made in step 7376, the system 7100 proceeds to step 7378, where an alert condition is transmitted to the servicer (e.g., Customer #1234 pump bearings will fail in 30 days). In step 7380, the servicer can choose to request authorization to address the alert condition. If the servicer chooses to request authorization to address the alert condition, in step 7382, the system 7100 transmits a work authorization request to the homeowner (e.g., via smartphone application, email, etc.) and in step 7384, the system 7100 saves the homeowner's response (or lack thereof) to memory (e.g., servicer database 7128 or servicer system 7124). The system 7100 then proceeds to step 7370. According to some embodiments, the system 7100 can also automatically generate a returned material authorization ("RMA") and warranty claim submission based on the work performed by the servicer (e.g., pump replacement), information recorded by the servicer via application 7160 (e.g., detailed explanation of reason for RMA or failure mode of part) discussed herein, and/or information saved to servicer database 7128 or servicer system 7124 (e.g., customer information, time and date, etc.).

Figure 57:
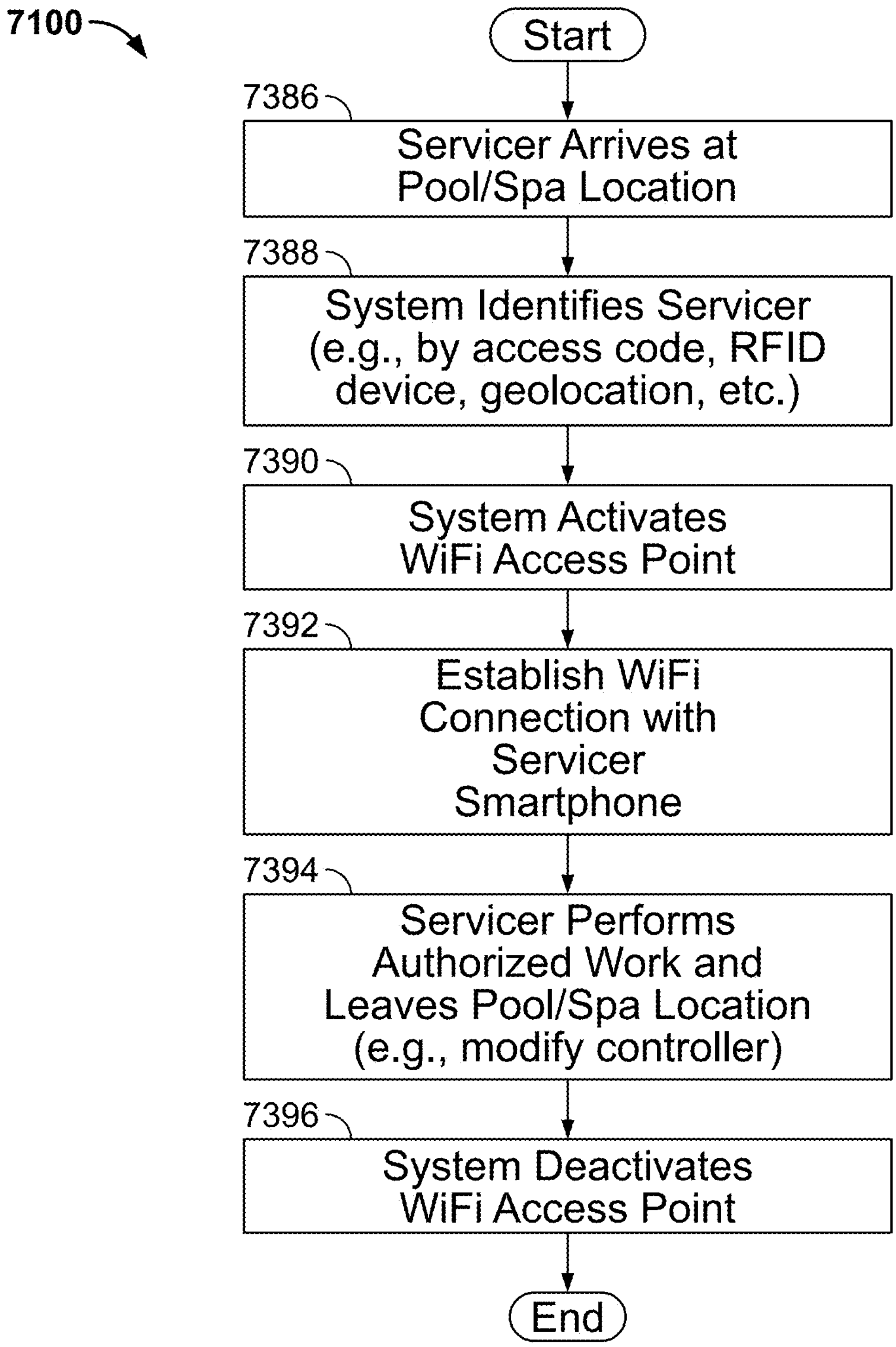
FIG. 57 is a flowchart illustrating processing steps carried out by the system of FIG. 49.

FIG. 57 is a flowchart illustrating processing steps carried out by the system 7100 to automatically grant a servicer WiFi access to the system to perform authorized work.

When a servicer arrives on-site, the system 7100 can enable a WiFi access point that grants the servicer direct access to the system 7100 without having to log in to the account, homeowner's WiFi, or the cloud. For example, in step 7386, the servicer arrives at the pool/spa location. In step 7388, the system 7100 identifies the servicer (e.g., by access code, RFID device, geolocation, etc.). In step 7390 the system 7100 activates a WiFi access point and in step 7392, the system 7100 establishes a WiFi connection with the servicer's smart device. in step 7394 the servicer performs the authorized work (e.g., modifying the controller) and then leaves the pool/spa location. Finally, in step 7396, the system 7100 deactivates the WiFi access point.

Figure 58:
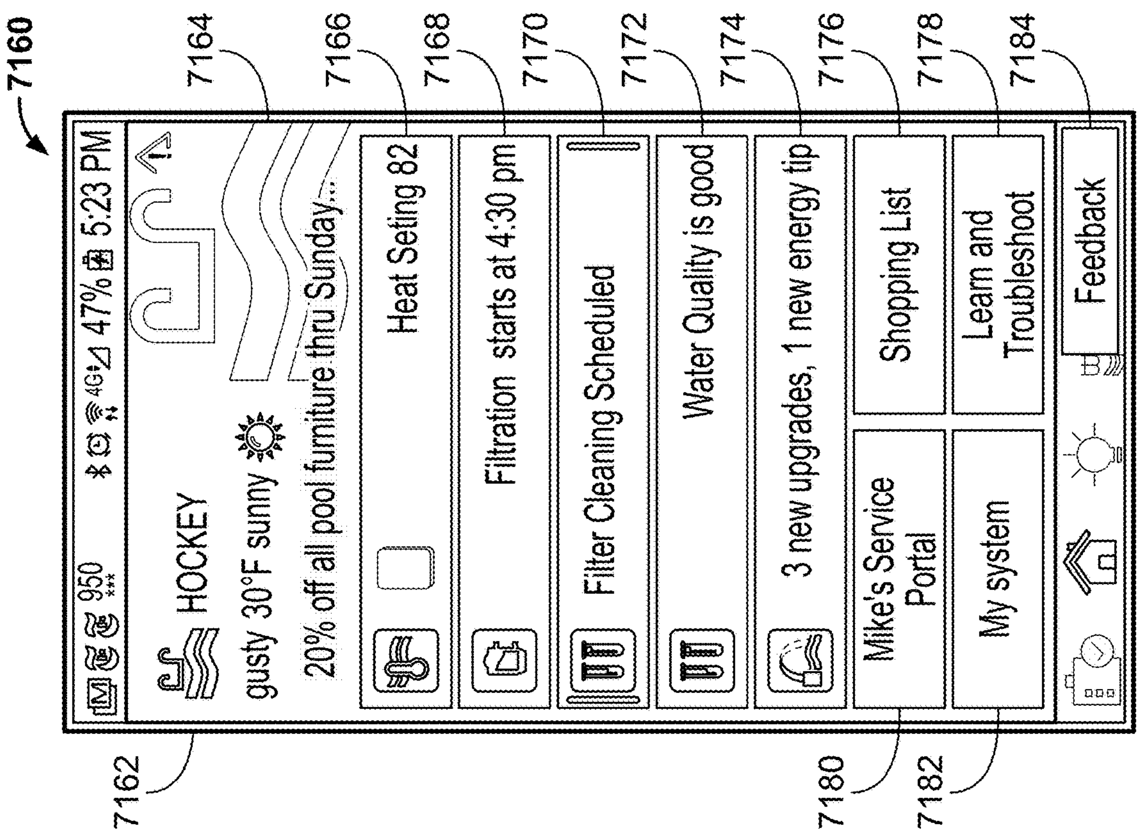
FIGS. 58-68 are user interface screens generated by the system of FIG. 49.
Figure 59:
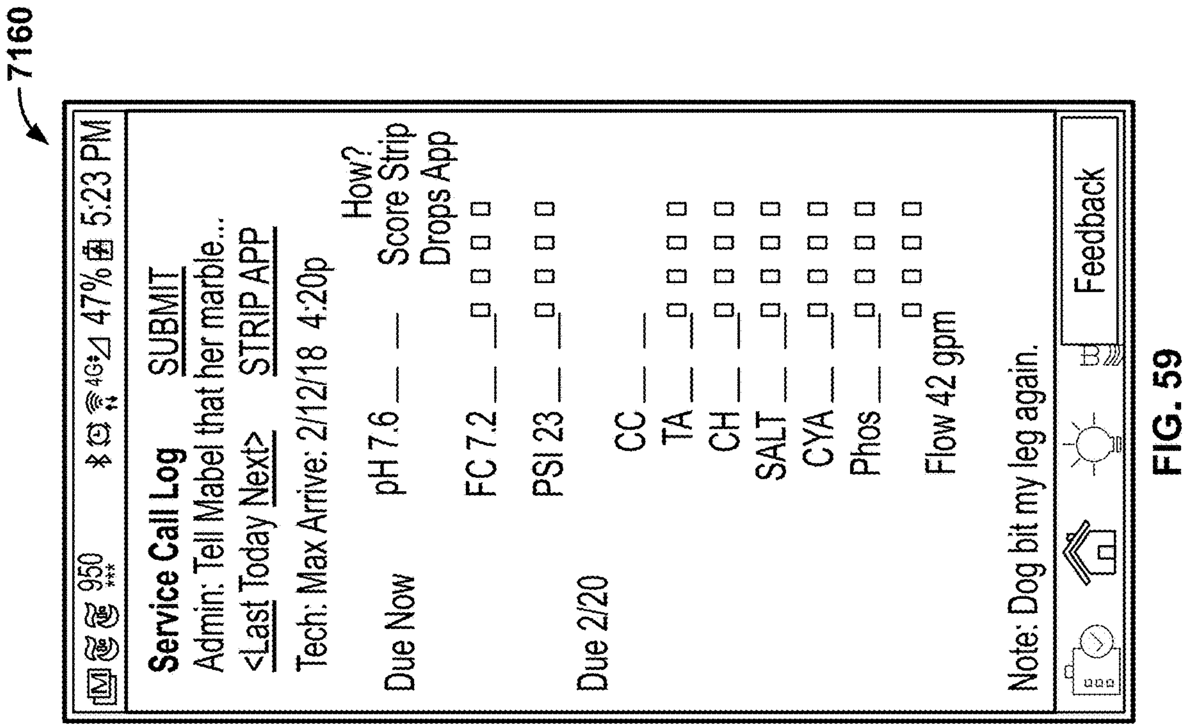
Figure 61:
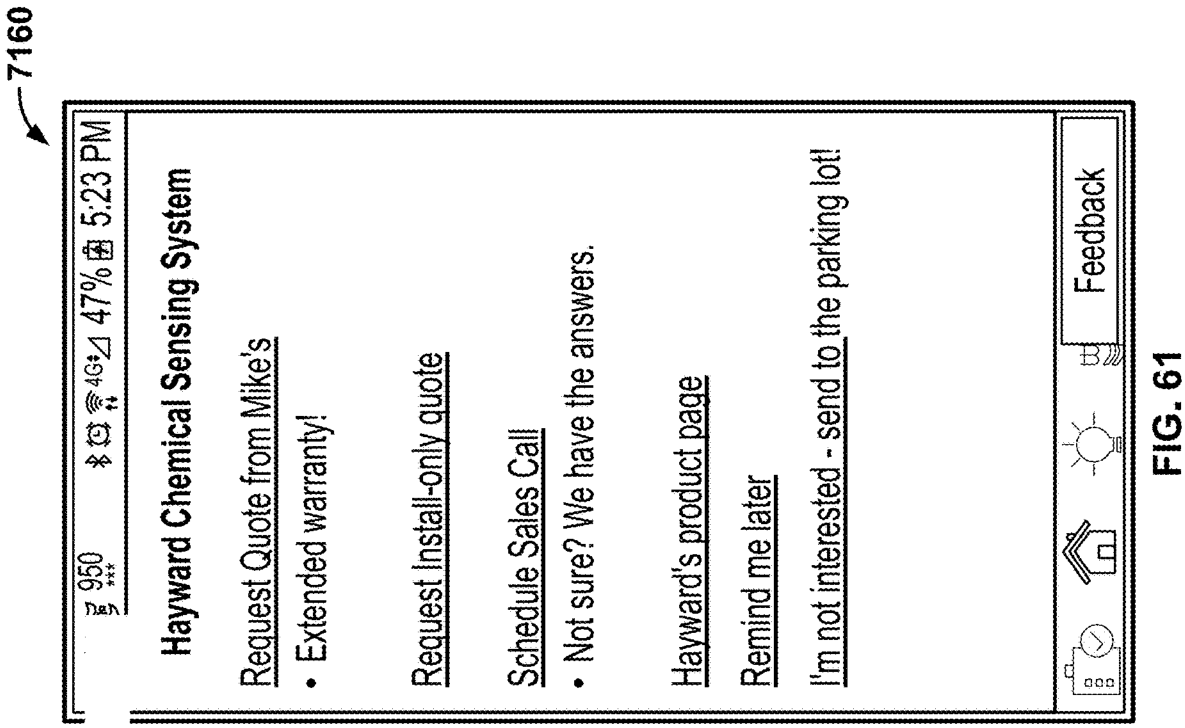

FIGS. 58-67 illustrate user interface screens of application 7160 that are generated by the system 7100. The application can be run on the homeowner's smart device 7118, the servicer's smart device 7104, the servicer system 7124, or any other device capable of displaying the application and accepting user input. FIG. 58 illustrates an initial user interface screen generated by the system 7100. As shown, the initial user interface screen can include a portion 7162 for displaying current weather conditions. Additionally, a user can click on portion 7162 to display an extended weather forecast. A portion 7164 of the user interface can also be used to display current promotional offers to a user. Additional portions of the user interface can also be provided for information related to, and interaction with, one or more of the pool/spa devices discussed herein. For example, portion 7166 can display current heating settings. If portion 7166 is clicked, the user can modify the heater settings (e.g., on/off or variably via a GUI slider or wheel to increase or decrease the temperature). If maximum and minimum temperature setpoint values have been established by an administrator of the system 7100, a particular user can be prevented from exceeding these values via the application 7160. According to some aspects of the present disclosure, portion 7166 can also provide additional functionality passed on the number of times it is clicked. For example, a first click could provide access to heater on/off control and manual heat settings, a second click could access heating rules and alarm setup, a third click could access basic heat settings, smart heat settings (e.g., least costly heating option for a desired goal) and heating history, a fourth click could provide access to the head schedule settings, and a fifth click could cause the system 7100 to display a diagnostic screen.

Portion 7168 can be used to display information related to a filtration schedule (e.g., showing a countdown to a next filtration event). According to some aspects of the present disclosure, as discussed herein, the system 7100 could store setpoints for a water turnover target, and periods when filtration is not desired (e.g., do not filter start and end times). Portion 7168 could display the status of the pump (e.g., on/off), the measured water turnovers from the previous 24-hour period, the next filter start or stop time, and provide a boost button.

The application 7160 can also be used by the system 7100 to display alerts to a user. For example portion 7170 can display the health status of a pool filter (e.g., that a filter is clean or that a backwash is necessary). If an alert is present, service is needed, a response is required, or the like, the application 7160 can display any of the portions in a color which will draw the user's attention. For example, if the filter is clean and no action is necessary, portion 7170 can be displayed in a blue, or another color, whereas if the filter needs to be cleaned, portion 7170 can be displayed in yellow or another color that will draw the user's attention.

Similarly, portion 7172 can be used to display information related to water quality and can be displayed in a first color (e.g., blue) if the water quality is good and displayed in a second color (e.g., yellow) if the water is unsafe, needs testing, or otherwise requires attention. If water quality is not being directly monitored by the system 7100 (e.g., via pH and ORP sensors) the system 7100 can determine when the water needs to be tested and can alert the user to provide photographs of smart test strips which can then be analyzed by a vision system (discussed herein) in communication with the system 7100 to determine the water quality and display the results. Alternatively, portion 7172 can provide access to a manual test entry screen.

According to some aspects of the present disclosure, certain user interface screens of the application 7160 are only displayed based on who is using the application (e.g., homeowner versus servicer). For example, if a user is logged into the application 7160 as a servicer, clicking on portion 7172, will display a service call log user interface screen, shown in FIG. 59. As shown, the service call log user interface screen can display scheduled maintenance intervals and fields for the servicer to record information such as water testing results and general notes related to the customer account. According to some aspects of the present disclosure, the application 7160 can respond to voice commands via voice assistance products (e.g., Amazon Alexa, Google Assistant, Microsoft Cortana, Apple's Siri, etc.), allowing servicers to access and perform work at customer sites without needing to physically manipulate a graphical user interface.

Figure 60:
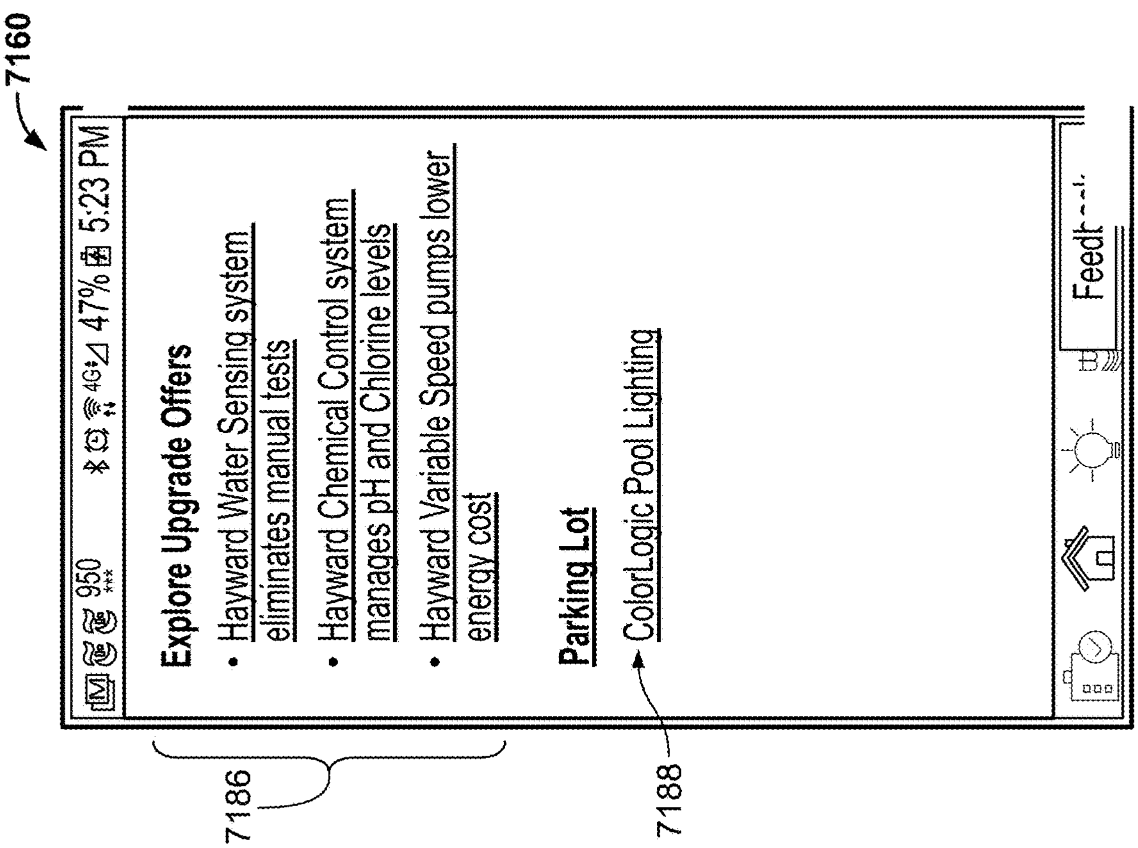
Figure 62:
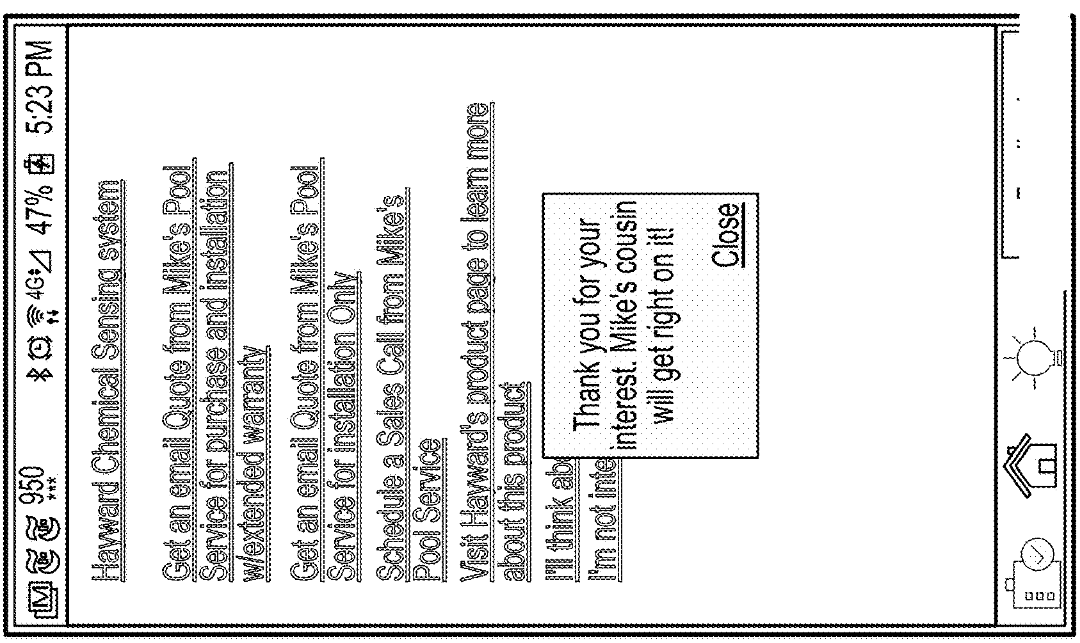
Figure 63:
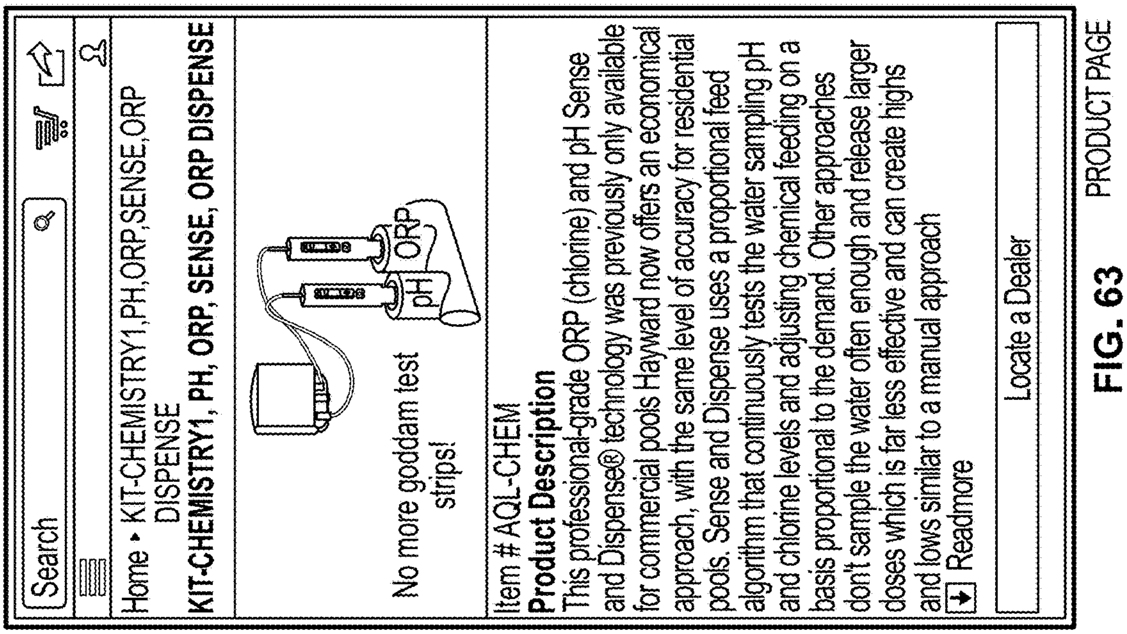

Returning to FIG. 58, portion 7174 can display available upgrades and energy saving advice, discussed hereinabove with respect to FIGS. 43-48. If a user clicks on portion 7174 the system 7100 generates a user interface screen displaying further information on the upgrades and/or energy savings advice, as shown in FIG. 60. The user interface screen shown in FIG. 60 can include a first portion 7186 that contains available upgrades and a second portion 7188 that displays upgrades that the user has declined or is not interested in. Clicking on an item or upgrade displayed on the user interface screen of FIG. 60 will cause the system 7100 to generates another user interface screen, shown in FIG. 61, displaying additional information and resources related to the upgrade. For example, through the user interface screen of FIG. 61, a user can purchase the upgrade from a distributor or servicer (see FIG. 62), move the upgrade to the user's shopping list (see FIG. 64), request a quotation, request an in-person sales call, click on a link to visit a manufacturer's website (see FIG. 63), set a reminder related to the upgrade, or indicate that he or she is not interested in the offer.

Figure 71:
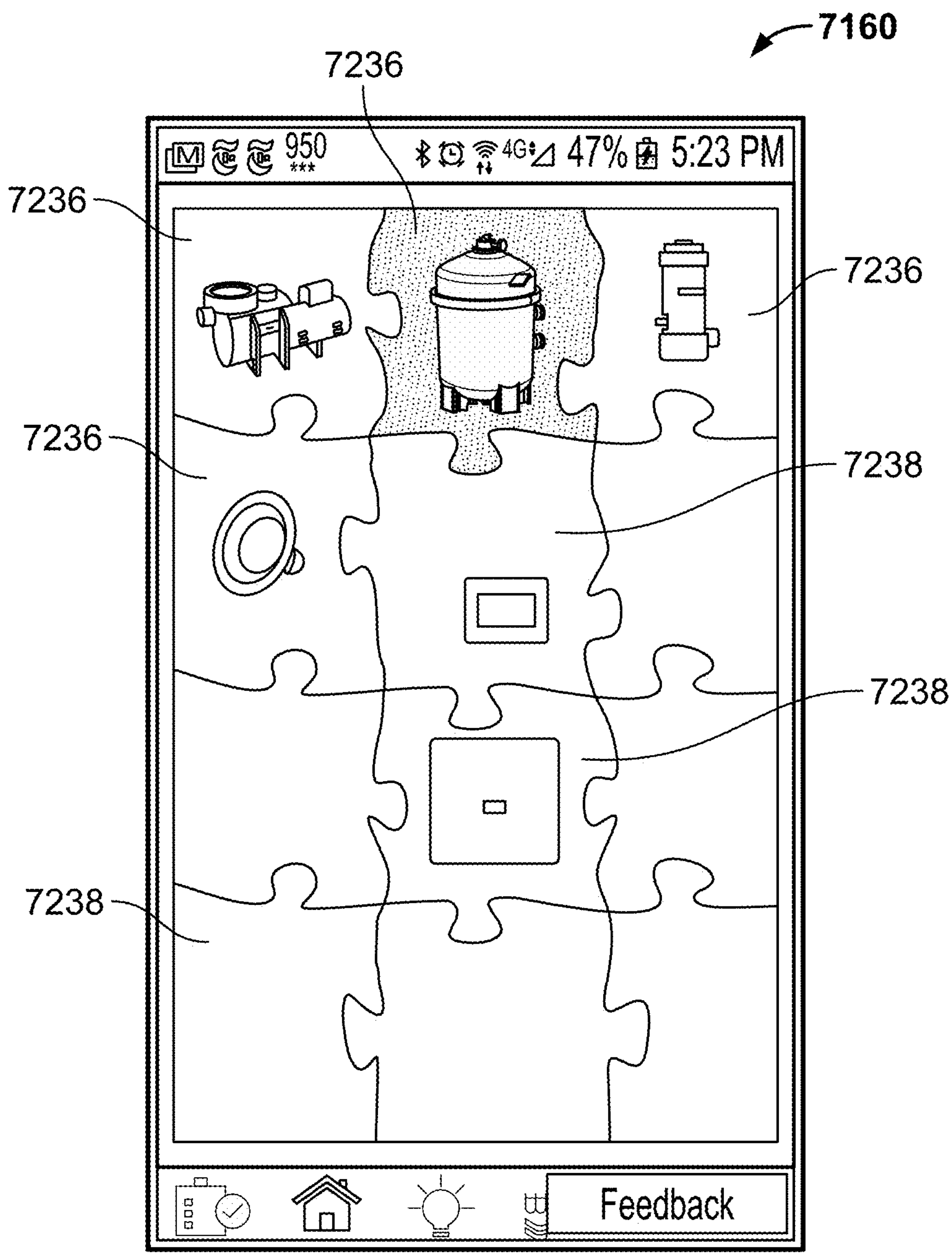
FIGS. 71-72 are user interface screens generated by the system of FIG. 49.

Alternatively, as shown in FIG. 71, if a user clicks on portion 7174 of FIG. 58, the system 7100 can generate another user interface screen displaying visual representations of pool/spa equipment that have already been upgraded as well as pool/spa equipment upgrades that are available for installation (e.g., as determined by the system 7100, discussed above). For example, the user interface screen shown in FIG. 71 can include portions 7236 that include visual representations (e.g., an image or rendering of a variable speed pump, filter, smart valve, lighting system, etc.) of pool/spa equipment that have already been upgraded and portions 7238 that include visual representations (e.g., image or rendering of a control system, chlorination system, etc.) of available pool/spa equipment upgrades. Clicking on one of the portions 7236 or 7238 can cause the application 7160 to display additional information related to the piece of pool/spa equipment associated with the visual representation. For example, clicking on a portion 7236 showing an image of an installed variable speed pump can cause the application 7160 to display the status of the variable speed pump or provide the option to alter parameters, whereas clicking on a portion 7238 can cause the application 7160 to display information such as component availability, component cost, and installation options (e.g., request a quotation from an installer). According to further aspects of the present disclosure, the portions 7236 and 7238 of the user interface screen shown in FIG. 71 can be displayed in the form of a puzzle. Further, the portions 7236 and 7238 of the user interface screen shown in FIG. 71 can together form a complete puzzle based on the number of available upgrades determined by the system 7100. For example, if the system 7100 determines that two upgrades are available and two upgrades were already installed, the application 7160 will display the puzzle as having four pieces. Similarly, if the system 7100 determines that two upgrades are available and three upgrades were already installed, the application 7160 will display the puzzle as having five pieces. Further still, the application 7160 can display portions 7238 as faded images, visually signaling to the user that additional equipment upgrades are necessary to "complete" the puzzle.

Figure 64:
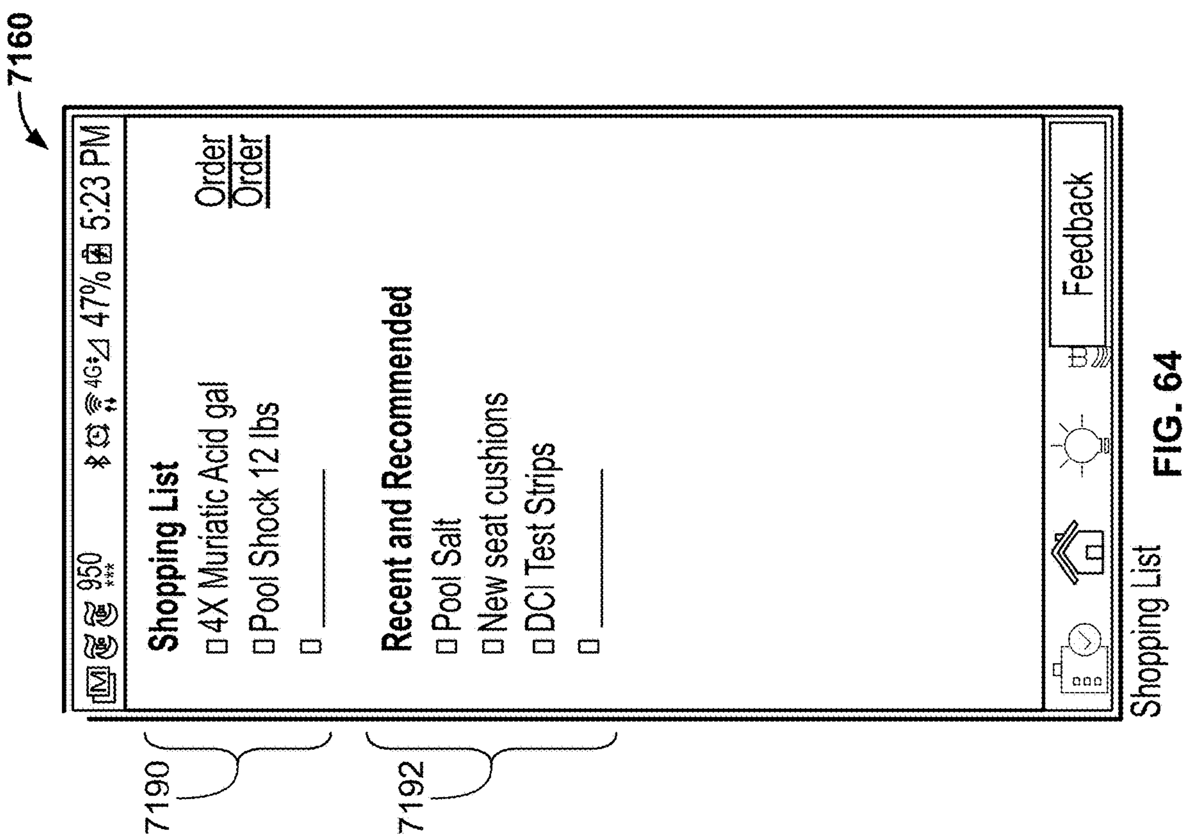
Figure 65A:
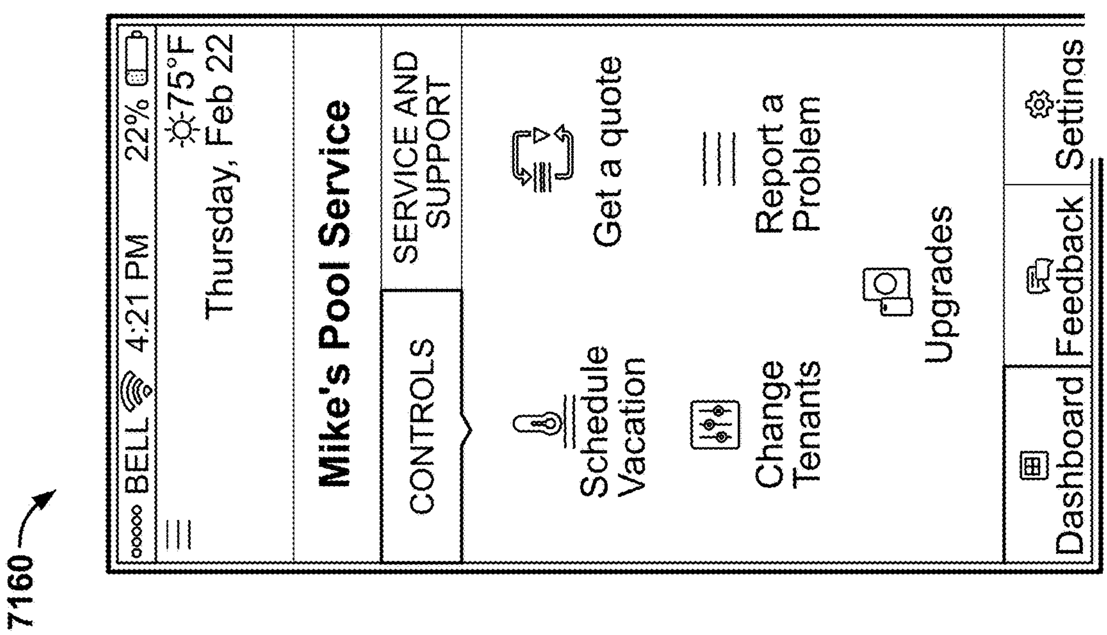
Figure 65B:
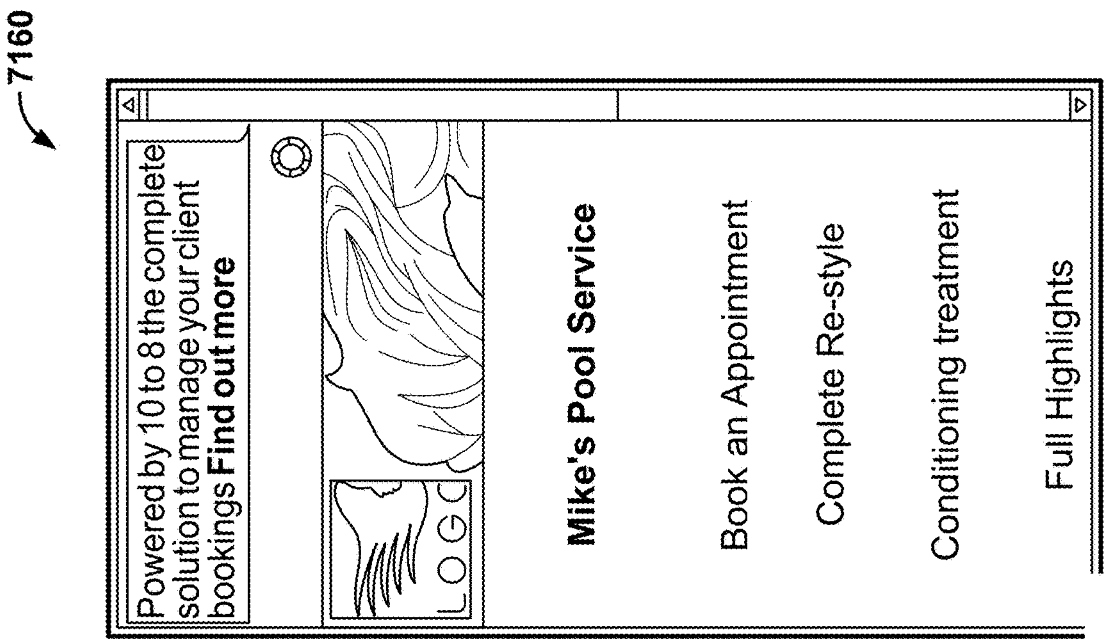

Returning to FIG. 58, portion 7176 can display a link to a user's shopping list. Clicking on portion 7176 causes the system 7100 to generate a user interface screen, as shown in FIG. 64. The user interface screen shown in FIG. 64 can include a first portion 7190 that contains a list of items already selected by the user for purchase, and a second portion 7192 that includes a list of recently viewed or recommended items that the user may want to add to the list of items selected for purchase, displayed in the first portion 7190. According to some aspects of the present disclosure, the list of items in the first portion 7190 could include checkboxes that are filled and the list in the second portion 7192 could include check boxes that are not filled. Unchecking a checkbox in the first portion 7190 can move an item to the second portion 7192. Similarly, checking a checkbox of an item in the second portion 7192 can move the item to the first portion 7190.

Figure 66:
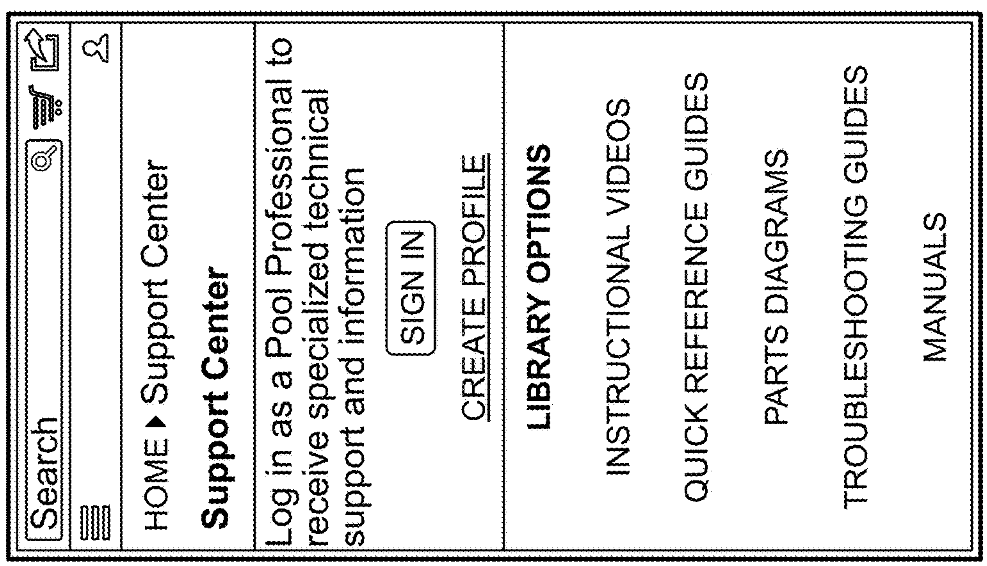
Figure 67:
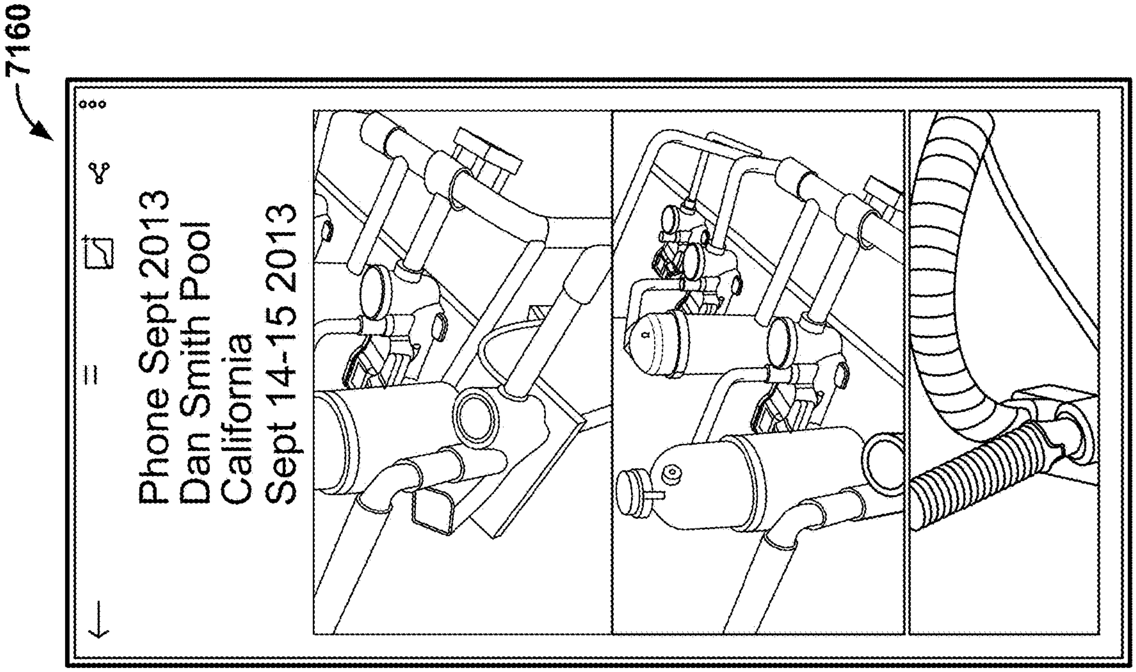

Returning to FIG. 58, portion 7178 can display a link to a learning and troubleshooting area, such as for example, a manufacturer's web-based support center (see FIG. 66). Similarly, portion 7180 can display a link to a service and support area, such as for example, a designated pool servicer's portal (see FIG. 65A) where the user can schedule an appointment for service (see FIG. 65B) or initiate direct communication (e.g., instant messaging, email, voice, etc.) with the servicer. Portion 7182 of the application 7160 can display a link to a user interface screen that provides information related to a user's pool or spa installation, shown in FIG. 67. For example, the user interface screen of FIG. 67 can include photographs of the homeowner's pool/spa equipment (e.g., picture of a pump, heater nameplate, filter, booster pump, blower, lights, GVA, etc.). These photographs could be stored by the system 7100 or could be stored at another location (e.g., a photograph storage website such as Google Drive, iCloud, etc.) in communication with the system 7100. The photographs could be uploaded by the homeowner or the servicer and according to some aspects of the present disclosure, the servicer can be required to populate photographs to the system 7100 when performing maintenance or the like. According to some aspects of the present disclosure, a servicer can access the photos remotely, enabling the servicer to confirm that he or she has all required tools and equipment for a particular job prior to arrival on-site. A portion 7184 could display a feedback link to a survey (e.g., survey monkey) where the user can review the servicer and the work performed.

The application 7160 can provide linking and/or communication between homeowners and servicers. For example, the application 7160 can link a servicer to a particular homeowner as a servicer of record and rules of engagement and support (e.g., automatic approval up to a certain monetary value, or automatic approval for preventative maintenance) can be established and saved to a homeowner profile. The system 7100 can generate a user interface screen including a list of available servicers (e.g., servicer systems 7124) from which the homeowner can select a servicer of record. The servicer of record could have access to all of the information from a particular site that is collected by system 7100, whereas a servicer that is not of record could only have access to a subset of that information.

The homeowner can schedule a service call through the application 7160 or request a service call the next time a servicer is in the neighborhood (e.g., using geofencing surrounding the homeowner's location and geolocation services on the a servicer smart device or vehicle). For example, when a homeowner needs to refill pool/spa chemicals, the homeowner can request a refill the next time that the servicer of record is in the neighborhood, or the homeowner can request an immediate refill to all servicers in the area. The homeowner request can be transmitted to broadcast system 7126 in communication with the system 7100 (see FIG. 49). The broadcast system 7126 can further be in communication with one or more servicer smart devices 7104 or servicer systems 7124. Servicer can monitor the broadcast system 7126 and can accept a service request using the application 7160. Once a servicer has accepted the homeowner's request, the request can be cleared from the broadcast system 7126.

Alternatively, the system 7100 can automatically request refills for the homeowner based on the current level of the chemicals (e.g., if sensors in communication with the are system 7100 are utilized to monitor the levels) and/or based on historical trends (e.g., on average the homeowner requests a refill every X days, or X % of the chemicals are consumed per day). The application 7160 can also generate a user interface screen that provides the homeowner with a map of a geographical area that includes the homeowner's position, one or more servicers' positions relative to the homeowner, and estimated time of arrival and route tracking if a service appointment has been requested by the homeowner and accepted by a servicer.

The application 7160 can also provide a servicer with the ability to provide a quotation to a homeowner, request approval to complete the quoted work, view and record the response, and provide an invoice without leaving the confines of the application 7160. Further, the system 7100 can generate quotations for the servicer (that he or she can then directly submit to the homeowner for approval) for predicted or preventative maintenance of equipment (based on the installed pool/spa equipment and historical maintenance data) or for service in the event of a problem with a piece of equipment. For example, the application 7160 can include a user interface screen that presents a quotation or contract for the homeowner's approval, such as a contract to do simple or specific work without requiring a quote or prior approval.

The application 7160 can also include dashboard, or summary screen. The summary screen can be manually generated by the servicer, automatically generated by the system 7100 on a periodic bases (e.g., monthly), or continuously updated by the system 7100 in real-time. For example, the summary screen can include energy usage, energy savings, energy savings suggestions, services to be reviewed or provided, periodic service summaries (e.g., weekly, monthly, seasonal, yearly, etc.), periodic alert summaries (e.g., weekly, monthly, seasonal, yearly, etc.), and services or energy costs.

Figure 72:
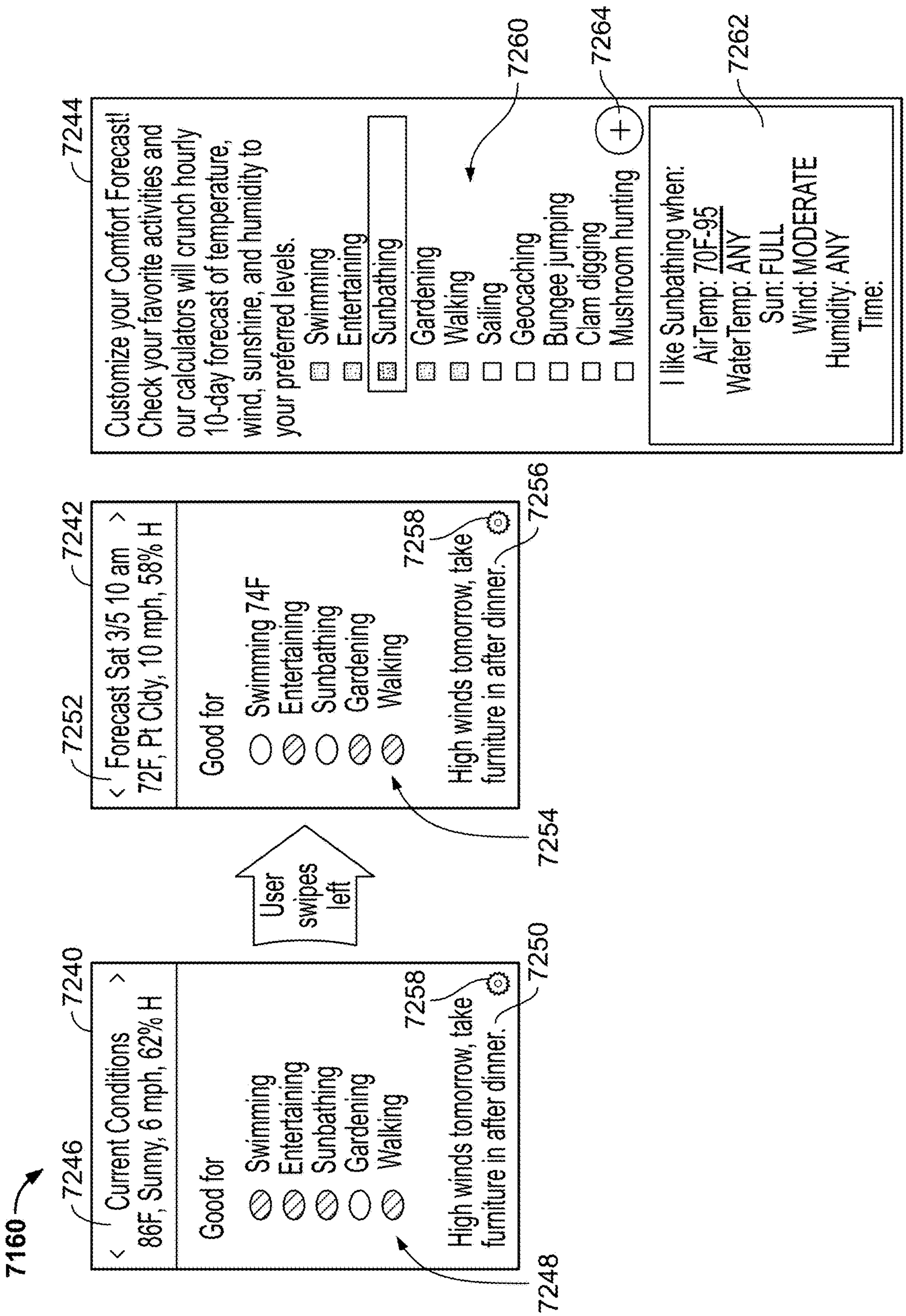

As shown in FIG. 72, the application 7160 can also generate a series of user interface screens for providing customized alerts to a user based on activities specified by the user, current weather data, and forecasted weather data. For example, a first user interface screen 7240 can include a portion 7246 for displaying current weather conditions (e.g., temperature, cloud cover, wind speed, humidity, etc.), a portion 7248 for displaying a list of specified preferred activities (e.g., swimming, entertaining, sunbathing, gardening, walking, etc.), and a portion 7250 for displaying customized recommendations (e.g., "High winds tomorrow, take furniture in after dinner"). The list of specified preferred activities can include indicia for indicating whether the current weather conditions are appropriate for a specific activity. For example, if a the user specifies that swimming is appropriate between temperatures of 75 and 95 degrees and the current temperature is 86 degrees, the application 7160 will indicate that swimming is appropriate at present.

The application 7160 can also display additional user interface screens based on forecasted weather conditions. For example, if a user swipes left on user interface screen 7240, the application will advance to user interface screen 7242, which displays the forecasted weather conditions for the next day. It is contemplated by the present disclosure that the application 7160 can display any number of user interface screens for future dates, the only limiting factor being the availability of forecasted weather conditions (e.g., weather forecasts, almanacs, etc.). For example, if the current date is Friday, March 4, swiping left on user interface screen 7240, will cause the application 7160 to display user interface screen 7242 including information for Saturday, March 5. Similar to user interface screen 7240, user interface screen 7242 can include a portion 7252 for displaying the date and forecasted weather conditions (e.g., temperature, cloud cover, wind speed, humidity, etc.), a portion 7254 for displaying a list of specified preferred activities (e.g., swimming, entertaining, sunbathing, gardening, walking, etc.), and a portion 7256 for displaying customized recommendations (e.g., "High winds tomorrow, take furniture in after dinner"). The list of specified preferred activities can include indicia for indicating whether the forecasted weather conditions will be appropriate for a specific activity. For example, if a the user specifies that swimming is appropriate between temperatures of 75 and 95 degrees and the forecasted temperature is 72 degrees, the application 7160 will indicate that swimming is not appropriate at present.

The user interface screens 7240 and 7242 shown in FIG. 72 can also include a portion 7258 for providing the user access to a user interface configuration screen 7244, for example by clicking thereon. As shown, the configuration screen 7244 can include a portion 7260 for displaying a list of common activities (e.g., swimming, entertaining, sunbathing, gardening, walking, sailing, geocaching, bungee jumping, clam digging, mushroom hunting, etc.) from which the user can select his or her preferred activities (e.g., swimming, entertaining, sunbathing, gardening, walking, etc.). Selecting a preferred activity can cause the application 7160 to display a portion 7262 for specifying appropriate conditions for the preferred activity. For example, if the user selects sunbathing as a preferred activity, portion 7262 can be used by the user to specify the air temperature (e.g., 70-95 degrees), water temperature (e.g., any/all), sun (e.g., full/no cloud cover), wind speed (e.g., moderate), and humidity (e.g., any/all) for which sunbathing is appropriate. The system 7100 can compare the user specified conditions for each activity against the current or forecasted weather conditions to determine whether the preferred activities displayed in portions 7248 and 7254 suitable. The user interface configuration screen 7244 can also include a portion 7264 for allowing the user to add an activity to the list of common activities displayed in portion 7260. For example, by clicking on portion 7264, the user could add "running" to the list of common activities and then access portion 7264 to specify the desired conditions therefor.

Figure 68:
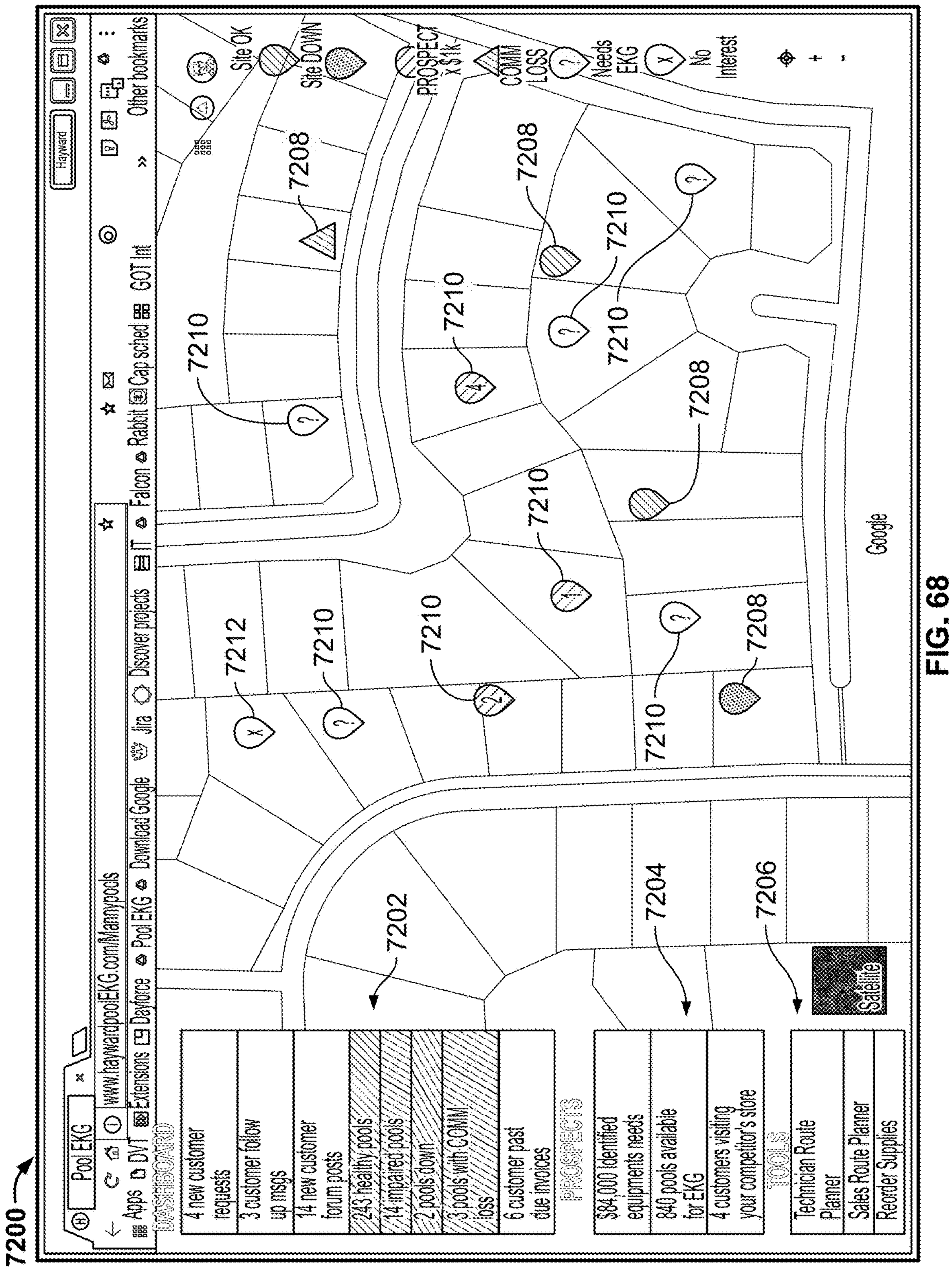

As shown in FIG. 68, the system 7100 can also include a servicer dashboard 7200. The servicer dashboard 7200 is an application including a graphical user interface generated by the system 7100 and can be installed on, for example, the servicer system 7124 or the servicer's smart device 7104. As shown in FIG. 68, the dashboard 7200 can identify the servicer's accounts (e.g., where the servicer has previously performed work or is the servicer of record) 7208 within a specified geographical area, prospective accounts 7210, and locations 7212 where homeowners have expressed no interest in pool/spa services. The dashboard 7200 can include a graphical user interface portion 7202 for providing an overview of the status of each of the servicer's accounts (e.g., healthy pools, impaired pools (low chemicals, system check needed, replace component, etc.), pools that are down, pools experiencing problems with communications, past due invoices, etc.). For example, the dashboard 7200 can show that a particular system at a customer site is communicating with the dashboard 7200, that the system is up to date (firmware), the last time a servicer visited a site, and the health of a system by category (e.g., controls, chemistry, pump, heater, filter, lights, cleaner, etc.).

User interface 7202 can also show requests from customers, messages from customers, forum posts made by customers, as well as additional information related to the servicer's accounts. The dashboard 7200 can also include a graphical user interface portion 7204 showing prospective opportunities for a servicer. For example, portion 7204 can identify equipment needs at the servicer's accounts, or identify locations where the system 7100 has not been installed. The dashboard 7200, as well as the application 7160, can also receive notifications (e.g., push, pop-up, etc.) when the system 7100 determines that a servicer is in close proximity to a prospective opportunity (e.g., a location where the system 7100 has not been installed, a location where equipment needs to be replaced, etc.) or a location where the system 7100 has determined that the homeowner can benefit from replacement of aging or inefficient equipment (e.g., as described herein in connection with FIGS. 43-48).

Additionally, the dashboard 7200 can also include a graphical user interface portion 7206 including tools for the servicer, such as a route planner (e.g., service or sales) or a means for reordering supplies. For example, the dashboard 7200 can generate a daily route based on a determination of which particular sites require service on a given day and then direct the servicer to his or her appointments in the most efficient manner (e.g., shortest distance), based on the level of complexity (e.g., estimated time for completion), and/or based on revenue/profit maximization (e.g., estimated time for completion versus net profit margin). The daily route generated by the dashboard 7200 can include directions, route overview, materials needed for the service appointments, an estimated time for each service, and the like. For example, the dashboard can generate a list of all the materials (e.g., chemicals, motors, cables, logic boards, sensors, etc.) that a servicer needs for a particular day (or week), so that the servicer can verify that he or she has all of the materials needed to complete the service calls before beginning the daily route, thereby increasing efficiency by minimizing the number of trips a servicer must make to procure materials.

The system 7100 can also include a secure service technician portal ("SSTP"). The SSTP can be displayed as a graphical user interface screen on the servicer system 7124 and can provide a servicer access to site parameters, name, address, turnovers, etc., the ability to specify recipients for alerts, etc. The system 7100 can also include a secure administrative portal ("SAP") that can be displayed as a graphical user interface screen on a manufacturer's system and can provide the ability to set global parameters, PID coefficients, enter promotional offers, etc. Both the SSTP and the SAP can communicate with and access a configuration database. The configuration database can store configuration parameters and the current status of various pieces of equipment, an alarm dispatch history, a dashboard browsing history, etc.

Figure 69:
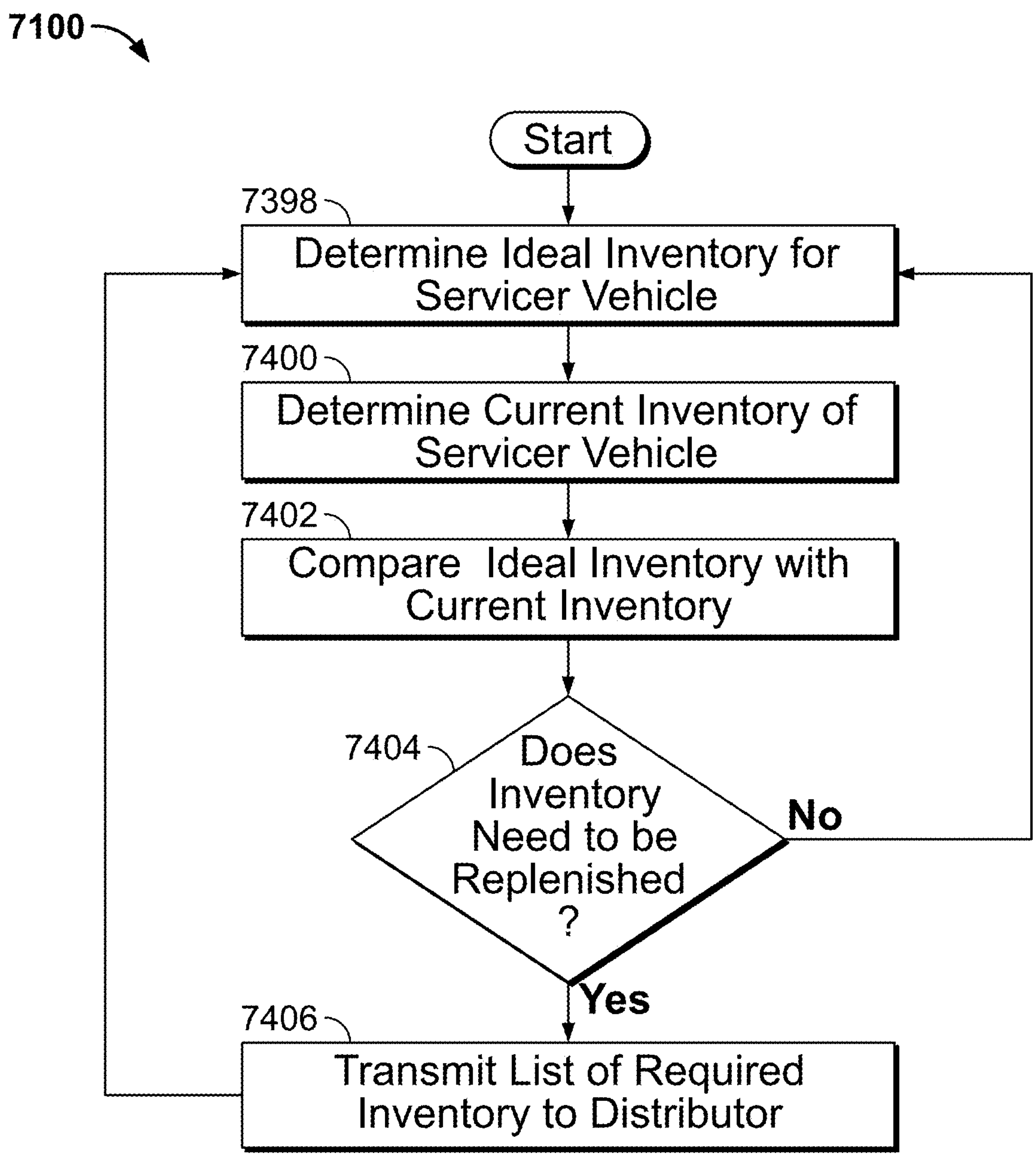
FIG. 69 is a flowchart illustrating processing steps carried out by the system of FIG. 49.

FIG. 69 is a flowchart illustrating processing steps carried out by the system 7100 to determine that a servicer's vehicle is stocked with all the materials, discussed above, that a servicer needs for a particular day (or week). In step 7398, the system 7100 determines the ideal inventory for a servicer's vehicle. In step 7400, the system 7100 determines the current inventory of the servicer's vehicle. In step 7402, the system 7100 compares the ideal inventory with the current inventory of the servicer's vehicle. In step 7404 the system determines whether the inventory of the servicer's vehicle needs to be replenished. If a negative determination is made in step 7404, the system 7100 returns to step 7398. If a positive determination is made in step 7404, the system 7100 proceeds to step 7406 where a list of the required inventory items are transmitted to a distributor (for pick-up or delivery to the servicer). The system 7100 then returns to step 7398. For example, a servicer's vehicle can be outfitted with a barcode system, RFID system, or vision system (such as that described above) in communication with the system 7100 for determining the exact inventory of the servicer's vehicle in real-time. As inventory items are removed from the vehicle, the system 7100 can add those items to a list to be transmitted to a distributor so that they can be restocked. The inventory of the vehicle can then be compared with the list of materials needed for the day (or week). According to some aspects of the present disclosure, the system 7100 can utilize machine learning to analyze data received by the system 7100 (e.g., number of pool/spa locations, age of equipment, historical service requests, etc.) and determine the required inventory list for the servicer's vehicle. For example, the system 7100 could determine that three sensors, two power cables, two seals, one logic board, twenty bags of salt, and twenty gallons of liquid chlorine should be on the servicer's vehicle at the beginning of the week.

Figure 70:
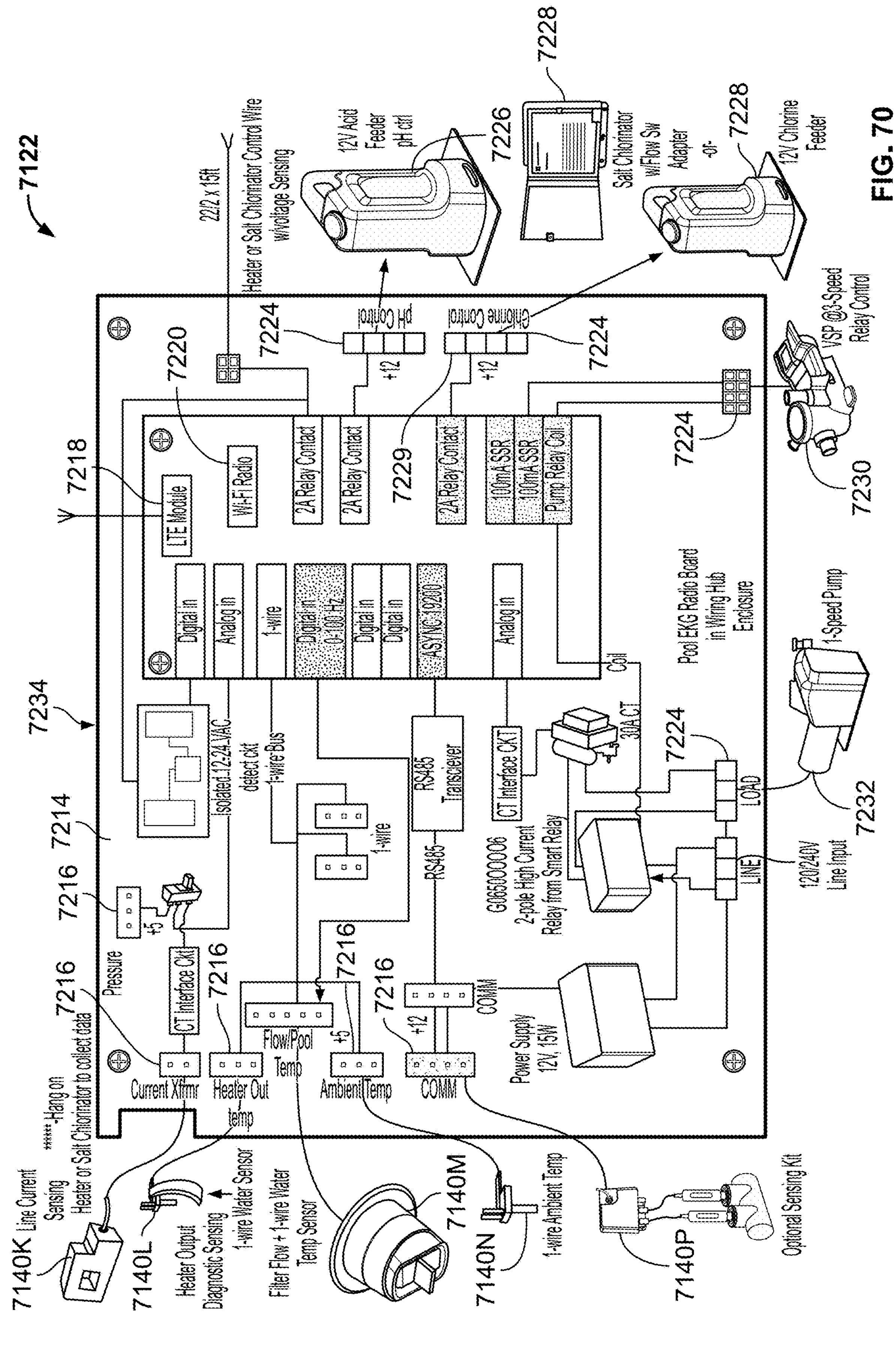
FIG. 70 is a diagram illustrating a sensor hub of the system of FIG. 49.

FIG. 70 is a block diagram of the sensor hub 7122. As described above, the system 7100 can include sensor hub 7122 in for monitoring operational parameters of legacy pool/spa devices (e.g., devices which are not are capable of direct communication with the system 7100 via a data connection). The sensor hub monitors the operational parameters of the legacy devices by way of a plurality of sensors 7140 that are disposed on, or around, the pool/spa devices and that are in communication with the sensor hub 7122. Each sensor 7140 can monitor one or more operational parameters of a legacy pool/spa device or provide the system 7100 with additional monitoring capabilities for connected pool/spa devices. For example, as shown in FIG. 70, the sensor hub 7122 can include a printed circuit board ("PCB") 7214 having sensor inputs 7216 for a receiving operational data from one or more sensors, such as a line current sensor 7140*k*, a water temperature sensor 7140*l*, a combination water flow and temperature sensor 7140*m*, an ambient temperature sensor 7140*n*, and a pH and ORP sensing kit 7140*p*. As shown, the PCB 7214 can include both digital and analog inputs. As described above, the sensor hub 7122 monitors the operational parameters of the legacy pool/spa devices and transmits operational data from the sensors 7140 to the system 7100 via a network 7110. The sensor hub 7122 can communicate with the system 7100 via any wired or wireless communications protocol (e.g., RS485, WiFi, Bluetooth, ZWave, Zigbee, cellular, etc.). Accordingly, sensor hub 7122 can include an LTE module 7218, a WiFi transceiver 7220, or any other network communication bus suitable for providing communication with the system 7100.

The sensor hub 7122 can also include a line power input 7222 for receiving power from a power source. According to some aspects of the present disclosure, the sensor hub 7122 can also include relays 7224 (both high-voltage and low-voltage) for controlling one or more pool/spa devices. For example, the sensor hub could include relays 7224 for controlling an acid feeder 7226, a chlorine feeder or salt chlorinator 7228, a variable-speed pump 7230, and a single-speed pump 7232. The sensor hub 7122 can also include a housing 7234 enclosing the PCB 7214, LTE module 7218, and WiFi module 7220, and providing access to sensor inputs 7216, line power input 7222, and relays 7224. According to some aspects of the present disclosure, the sensor hub 7122 can be modular, allowing for expansion to monitor additional pool/spa devices or to provide additional diagnostic capabilities. For example, an expansion module could be added to the sensor hub 7122 to provide more advanced machine learning. Expansion modules can also be added to provide enhanced monitoring and control capabilities for acid feeders, chlorine feeders, salt chlorinators, variable speed pumps, single speed pumps, and the like. The expansion module can be provided in the form of an input card on the PCB 7214 or as a separate unit that communicates with the sensor hub 7122 through a communication bus such as RS485 or WiFi.

The pool "hub" disclosed herein, as well as the various embodiments disclosed herein, allows for wired and wireless communication (e.g., wireless methods 802.11 protocols, Zigbee, ZWave), with pool pad components. Communication could include product status, product health, energy use (e.g., individual and/or system), errors, preventative maintenance, etc. The hub could incorporate all of the types of communication to the hub and from the hub to the home router. The pool hub could be upgraded through the web, push updates to connected equipment at the pad, etc. The hub could be fully configured (e.g., through an app), which includes schedules, names, temperatures, possible chemical dosage, percentage output, etc. The hub could have web based cloud connectivity to other cloud based devices or systems to allow for enhanced communication and/or enhanced external inputs. The hub could have a communication antenna for RF mesh (e.g., ZWave, Zigbee, Thread, Weave), BlueTooth, etc to connect to pool and non-pool equipment. The connectivity could be done at the pool pad, the processing could be done on the cloud (e.g., with one app built based on activated features). The hub could connect thermal imaging to relay pool, pad, spa, and/or weather information to the hub. The hub could enable virtual interlocks between devices based on predetermined rules and relationships.

The system of the present disclosure is modular and can grow with the addition and/or replacement of equipment. More specifically, the system consolidates all products as they are added (e.g., pump, heater, chemistry automation systems), and could only show the ones currently installed. App updates (e.g., for accessing the system from a local device) could come from new compiled code and/or a profile held in the device and transferred to the app. The system could store the operating profile and/or environment of the devices captured by the hub or in the devices and relayed to the hub (which could support the predictive failure ability as well as supports warranty analysis claims). The system could store standard profiles for heater/pump (e.g., Northeast region by zipcode) and/or heater/pump/lights (e.g., Southwest region by zipcode) for easy configuration (e.g., start with standard configurations based on the geography).

The system could monitor a variety of types of plug in and/or wireless sensors (e.g., air, pool, spa, solar, temperature, etc.) for a variety of types of measurements (e.g., presence of flow, measurement of flow, line pressure, water levels, UV levels, wind speeds, light presence, etc.). Other types of sensors that could be used include turbidity sensors, bacteria sensors, alkalinity sensors, hardness sensors, RF sensors, sound wave sensors, different light spectrum sensors, reflectors, magnetic sensors, radar, infrared, humidity, evaporation, moisture, motion, galvanic corrosion, chemical corrosion, electrolysis, electrical storm sensors, etc. The sensors could analyze and/or process raw data (e.g., locally sensed parameters, from a third party source, etc.) with an integrated processor or communicate the raw data (e.g., locally sensed parameters, from a third party source, etc.) for processing in a co-located or remote processor. The sensor analysis could incorporate trigger points, trend monitoring, manual correlation analysis, automatic correlation analysis, etc. The sensors could be individual or grouped (e.g., for more efficient connection and/or pairing).

The hub could function as a router for data, relay for data, or analyze the data. The hub could have one or many different electrical and protocol data communication interfaces to support connection to legacy and future protocols and devices. The hub could have built in Ethernet (e.g., wired, WiFi, cellular, and/or other), as well as communication with home router and/or direct to cloud (e.g., cellular). The hub could connect through wired (e.g., RS485) and/or wireless communication (e.g., WiFi, Bluetooth, ZWave, Zigbee, etc.) with a pump (e.g., for full variable speed pump ("VSP") capabilities), heater or heat pump (e.g., for heat control), etc. (i.e., low voltage and/or high voltage applications). The hub could have one or more modular relays or relay banks (e.g., four relays or relay banks). The hub could connect to the relay bank for relay control through wired (e.g., RS485) and/or wireless communication. The relays could be used to control any electrical devices (e.g., high or low voltage), such as pumps, lights, etc. The hub could control wired or wireless valves with transformation at plug or 120V (e.g., to provide power to valve based on hub architecture). The hub could connect to a light controller through wired and/or wireless (e.g., Bluetooth and/or RF mesh such as ZWave, Zigbee, Thread, Weave, etc.) communication, such as to give relay control to a pool, spa, backyard lighting, etc.

The system can perform a variety of types of analytics. For example, the system could analyze electrical, gas, and/or propane usage for one or more pool devices, sites, and/or geographies (e.g., based on data from the hub or device). The system could analyze consolidated site information to facilitate creation of algorithms (e.g., to increase efficiency for all users). The system could use historical data trends to predict future trends, future costs, utility budgets, warnings, efficiency change, as well as to offer preventative maintenance, predictive failure, and/or potential downtime risks. The system could communicate with utilities via a web-based API or some other suitable mechanism. The system could use data trends and/or external data to minimize energy usage and/or facilitate energy consumption decisions. The system could analyze data to predict a budget for requested outcomes to give consumers better visibility in their choices. The system could use external web based data to automate decisions based on learned or imputed data or trends. The system could use historical and/or external data to predict outcomes heating or filtering events to increase autonomy and reduce energy usage for these outcomes. The system could use failures, predictive failures or preventative maintenance alerts to automatically assign or request service from a customer or partner. The system could use external data from partners to increase the efficiency, potential decisions, functionality of the hub in the IoT world. The system could use data to adjust automated decisions based on sensors, decision information, inputs from other devices, etc. The system could use flow, pool temperature, air temperature, wind data, etc. to automatically adjust the pool turnover and optimize (e.g., fastest, most efficient) the pool pump for amount of turnover, speed, etc., and/or to automatically adjust the chemical dispensing and/or production to maximize life of cells. The system could use data communicated to the hub from a water leveling sensor to predict leaks and/or water bills, and/or to automatically alert leak repair company that customer has an issue with his or her pool. The system could use web based data (e.g., time of year, sunrise and sunset, time, etc.) to predict light availability and automate changes in device schedules. The system could use consolidated site information to help notify the user of a devices operation through the actions of an alternate device. The system could provide an installer with a step by step interface for product installation when a product is selected.

While various forms of web data have been described above in connection with FIGS. 1-33AH, web data can also include, but is not limited to: environmental conditions such as ambient temperature, humidity, wind speed and direction, rain, lightning, snow, cloud coverage, forecasts (e.g., 5 day, 10 day, etc.), pollen, visibility, fog, pollution, smog, road conditions, travel delays, UV index, location, zip code, GPS coordinates, IP address, sunrise, sunset, sun location, wind chill, public water costs, public water availability, public water quality, drought or flood alerts, average chemical costs (e.g., internet costs of chlorine, etc.), tornado/hurricane alerts, etc.; local energy data such as electricity costs, fuel costs, peak hours and cost fluctuation, sun location, available energy rebates, etc.; personal data produced in conjunction with web or web enabled device (e.g., nest, phone, hub, etc.) such as location (e.g., home, away, on the way home, etc.), data usage, amount of web enabled devices used or connected (e.g., five downloaded apps could represent a family of five), energy used (e.g., fuel, electricity, etc.), data speed (e.g., upload/download rate (mbps), ping), etc.; and product data (e.g., in conjunction with registration) such as warranty, age, recalls, tech bulletins, replacement parts, specs, tech support, tutorials (e.g., instructional videos), specials (e.g., coupons, promotions, etc.), local support (e.g., authorized service center), firmware updates, new product releases, pool industry news, safety alerts, safety suggestions, etc.

It is contemplated that all of the systems disclosed herein could interface with one or more dedicated/proprietary or 3rd party voice interaction devices (e.g., Apple's Siri, Amazon Echo, etc.). Pool control logic 70 could interface with the voice interaction devices directly (e.g., Bluetooth), locally (e.g., through network router or mesh network), or via the cloud. The user commands, inputs, actions, etc., described herein, could be provided to pool control logic 70 via the voice interaction device and notifications, messages, alerts, etc., described herein, could be transmitted to the user via the voice interaction device (e.g., verbal notification, messages, alerts, etc.). For example, to activate the lighting system 14*h*, a user could simply say, "Alexa, turn on the pool lights."

It is contemplated that that the various devices in the embodiments described herein could also communicate by way of power line carrier (e.g., power-line digital subscriber line (PDSL), mains communication, power-line telecommunications, or power-line networking (PLN)) to allow the various interconnected components to communicate with one another via electrical wiring.

It is also contemplated that site data could be replaced with cloud data, or data at the site could be combined with data in the cloud, and the system could intelligently combine disparate data from different cloud servers.

Also contemplated is capturing specific equipment data (e.g., bar codes) by a smartphone camera at the site at the time of installation and connecting to an application. This can, at the same time, capture GPS coordinates for the address and date of installation for warranty registration, and automatically load the location of the pool into the pool control logic with cloud support for sunrise/sunset, real time and forecasted weather data. Similarly, by standing by the pool and taking photo of the pool, one can record North-South-East-West (e.g., phone compass) and load similar data into the pool control logic with cloud support for using wind direction as well. If photos are taken multiple times in the day, compass and date information could be used to extrapolate the pool's sun exposure for pool heating and other calculations.

Figure 36:
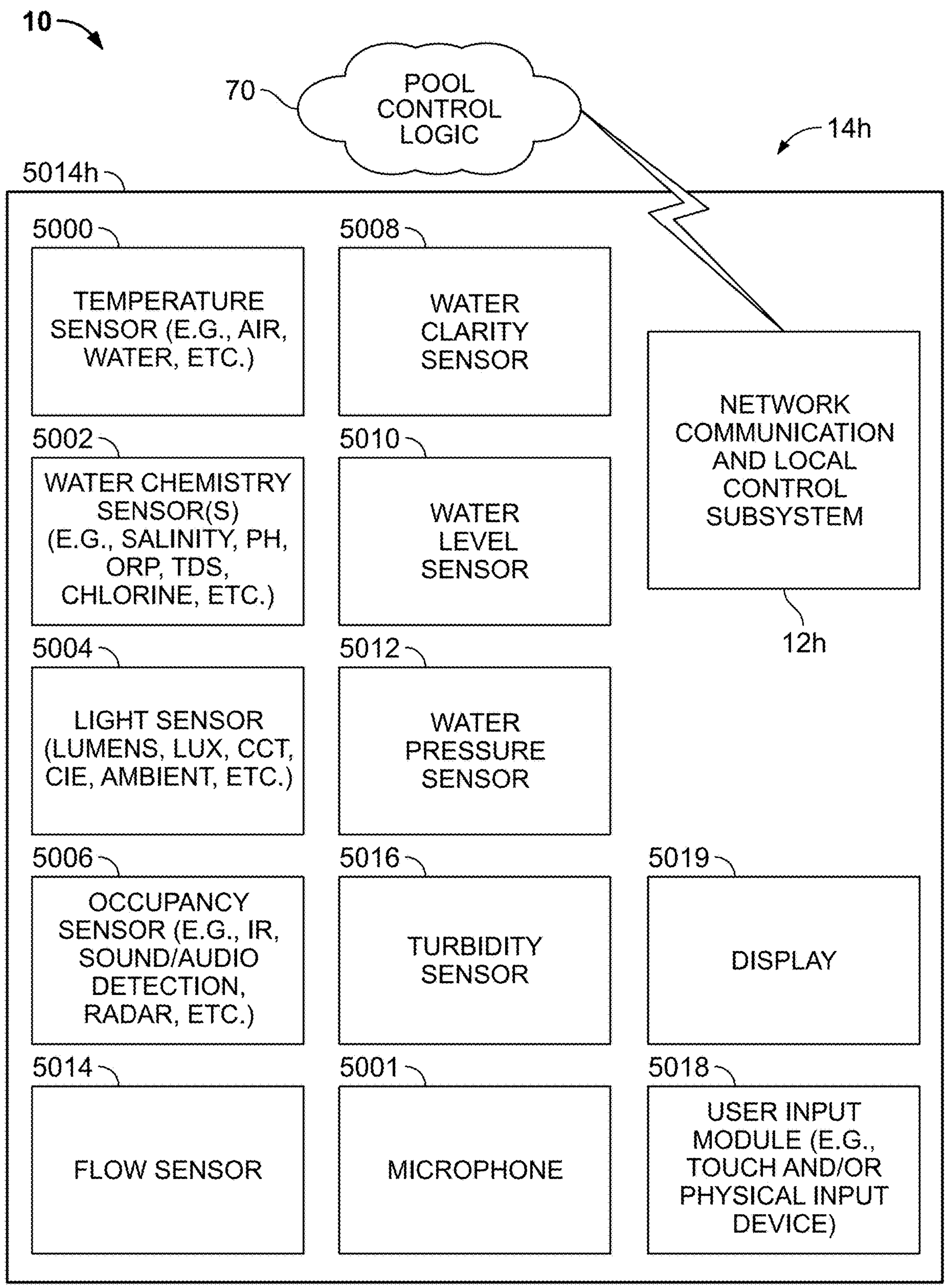
FIGS. 36-40 are diagrams illustrating further embodiments of the system of the present disclosure.

In addition to receiving operational data from locally installed pool/spa equipment, remote data (e.g., an off-site or cloud server) and web data, described hereinabove, it is also contemplated that pool control logic 70 could receive operational data from one or more pieces of pool equipment having enhanced sensing capabilities. For example, the system 10 could include lighting system 14*h* (see, e.g., FIG. 1) having a smart light 5014*h*. More specifically, as shown in FIG. 36, smart light 5014*h* could include temperature sensor 5000 (e.g., for temperature sensing of air, water, etc.), microphone 5001, chemistry sensor 5002 (e.g., for sensing salinity, pH, ORP, TDS, chlorine, etc.), light output sensor 5004 (e.g. for sensing lumen, lux, CCT, CIE, etc.), occupancy sensor 5006 (e.g., IR, sound/audio detection, radar, etc.), water clarity sensor 5008, water level sensor, 5010, water pressure sensor 5012, flow sensor 5014, turbidity sensor 5016, user input module 5018 (e.g., touch panel, physical buttons, etc.) and network communication and local control subsystem 12*h* (see, e.g., FIGS. 1-2). The smart light 5014*h* could further include the ability to measure for stray current. The user input module could include touch-based inputs (e.g., capacitive, inductive, fear field RF, etc.). The smart light 5014*h* could further include a display 5019 provided as a separate component or integrally provided with user input module 5018. The smart light 5014*h* could accordingly be used to display an error message for a fault condition or warning message regarding pool chemistry, or could be used to display any other kind of visual media. Although previously discussed, it is noted that the network communication and local control subsystem 12*h* could communicate with pool control logic 70, located in one or more of the pool/spa components discussed herein, using any of the communication protocols discussed herein, including but not limited to, power line carrier, ethernet, RF, Bluetooth, WiFi, and Zigbee. Smart light 5014*h* could also record hours of operation, light output, voltage, and current as well as corresponding operating and environmental conditions during use. It is further noted that temperature sensor 5000, microphone 5001, chemistry sensor 5002, light output sensor 5004, occupancy sensor 5006, water clarity sensor 5008, water level sensor, 5010, water pressure sensor 5012, flow sensor 5014, turbidity sensor 5016, user input module 5018, and network communication and local control subsystem 12*h* could be incorporated into the a lighting device, or could be provided as an additional attachment to the lighting device body. Further, as discussed above, pool control logic 70 could reside or be run within the smart light 5014*h*, in another piece of pool/spa equipment, remotely, or distributed amongst one or more of these locations.

Figure 37:
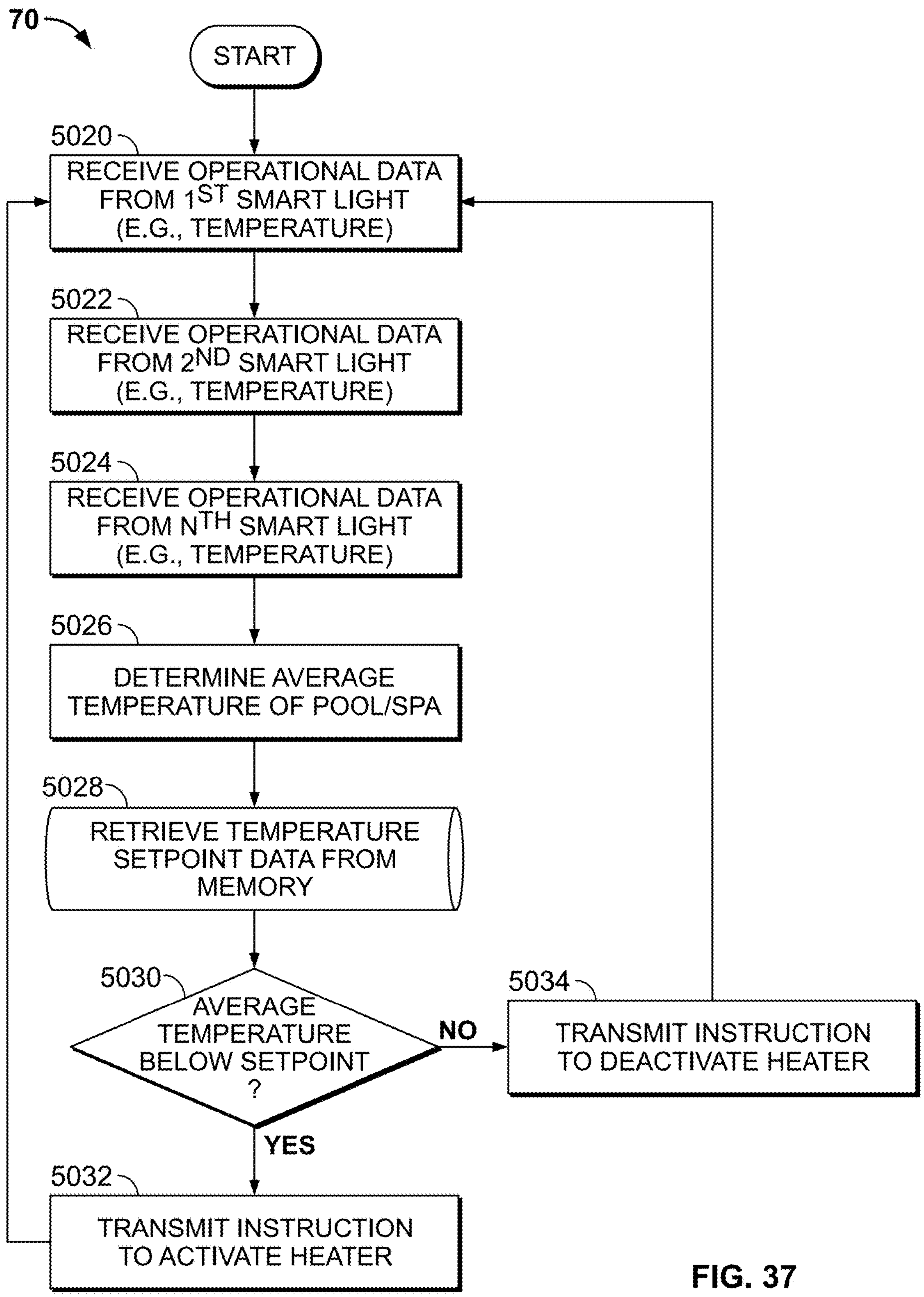

FIG. 37 is a flowchart illustrating processing steps of the pool control logic 70 for controlling a heater based on operational data received from the smart lights 5014*h* described above. More specifically, multiple smart lights provided in and around the pool/spa could act as a mesh array of temperature sensor inputs for determining the average temperature of the pool/spa and controlling the heater accordingly. In step 5020, the pool control logic 70 receives operational data, e.g., temperature, from a first smart light. In step 5022, the pool control logic 70 receives operational data, e.g., temperature, from a second smart light. In step 5024, the pool control logic 70 receives operational data, e.g., temperature, from the nth smart light. That is, the pool control logic 70 receives operational data for all smart lights in addition to the first and second smart lights discussed in connection with steps 5022 and 5024. In step 5026, the pool control logic 70 determines the average temperature off the pool/spa based on the operational data received from the smart lights. In step 5028, the pool control logic 70 retrieves temperature setpoint data from memory. In step 5030, the pool control logic 70 determines if the average temperature (determined in step 5026) is below the temperature setpoint. If a positive determination is made, e.g., the average temperature is below the temperature setpoint, then the process proceeds to step 5032, where the pool control logic 70 transmits an instruction to activate a heater and the process reverts to step 5020. If a negative determination is made, e.g., the average temperature is greater than the temperature setpoint, then the process proceeds to step 5034, where the pool control logic 70 transmits an instruction to deactivate a heater and the process reverts to step 5020. It is also contemplated that instead of determining the average temperature of the pool/spa, pool control logic 70 could determine the warmest or coolest area of the pool/spa and control the heater accordingly (e.g., warming the coolest area of the pool to a temperature setpoint, or cease warming of the pool when the warmest area of the pool reaches a temperature setpoint).

Figure 38:
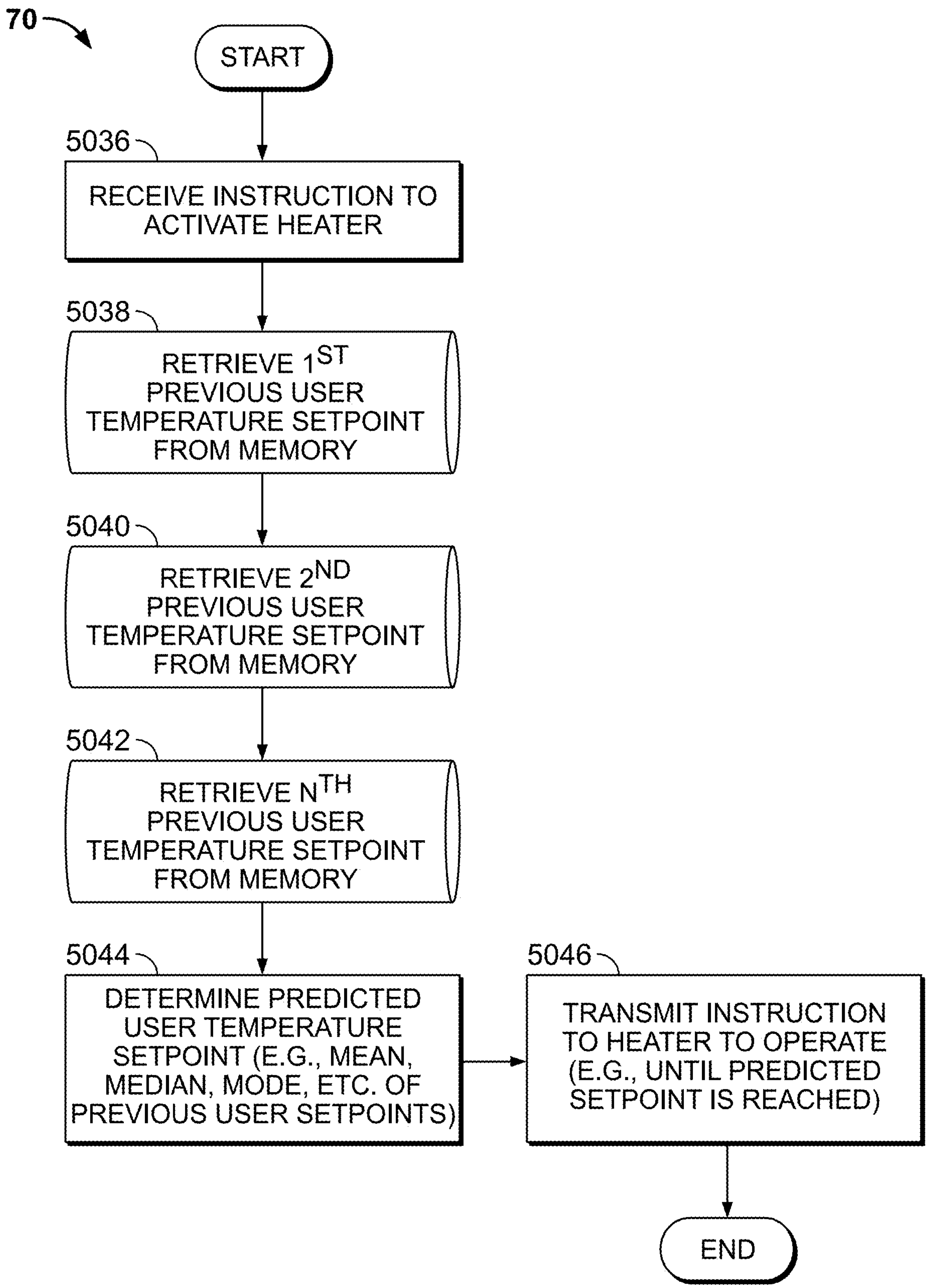

FIG. 38 is a flowchart illustrating processing steps of the pool control logic 70 for controlling a heater by determining a predicted temperature setpoint based on previous user specified temperature setpoints. In step 5036, the pool control logic 70 receives an instruction to activate a heater. In step 5038, the pool control logic 70 retrieves a first previous user temperature setpoint from memory. In step 5040, the pool control logic 70 retrieves a second previous user temperature setpoint from memory. In step 5042, the pool control logic 70 retrieves the nth previous user temperature setpoint from memory. That is, in step 5042 the pool control logic 70 retrieves all other previous user temperature setpoints from memory that are desired. For example, the system can be set-up so that the three (3), four (4), five (5), ten (10), or twenty (20), etc., most recent previous user temperature setpoints are utilized in this process. In step 5044, the pool control logic 70 determines a predicted user temperature setpoint based on the previous user temperature setpoints retrieved from memory in steps 5038, 5040, and 5042. This determination can be based on, for example, the mean, median, mode, etc., of the previous user temperature setpoints retrieved from memory. In step 5046, the pool control logic 70 transmits an instruction to a heater to operate, e.g., until the predicted setpoint determined in step 5044 is reached.

Figure 39:
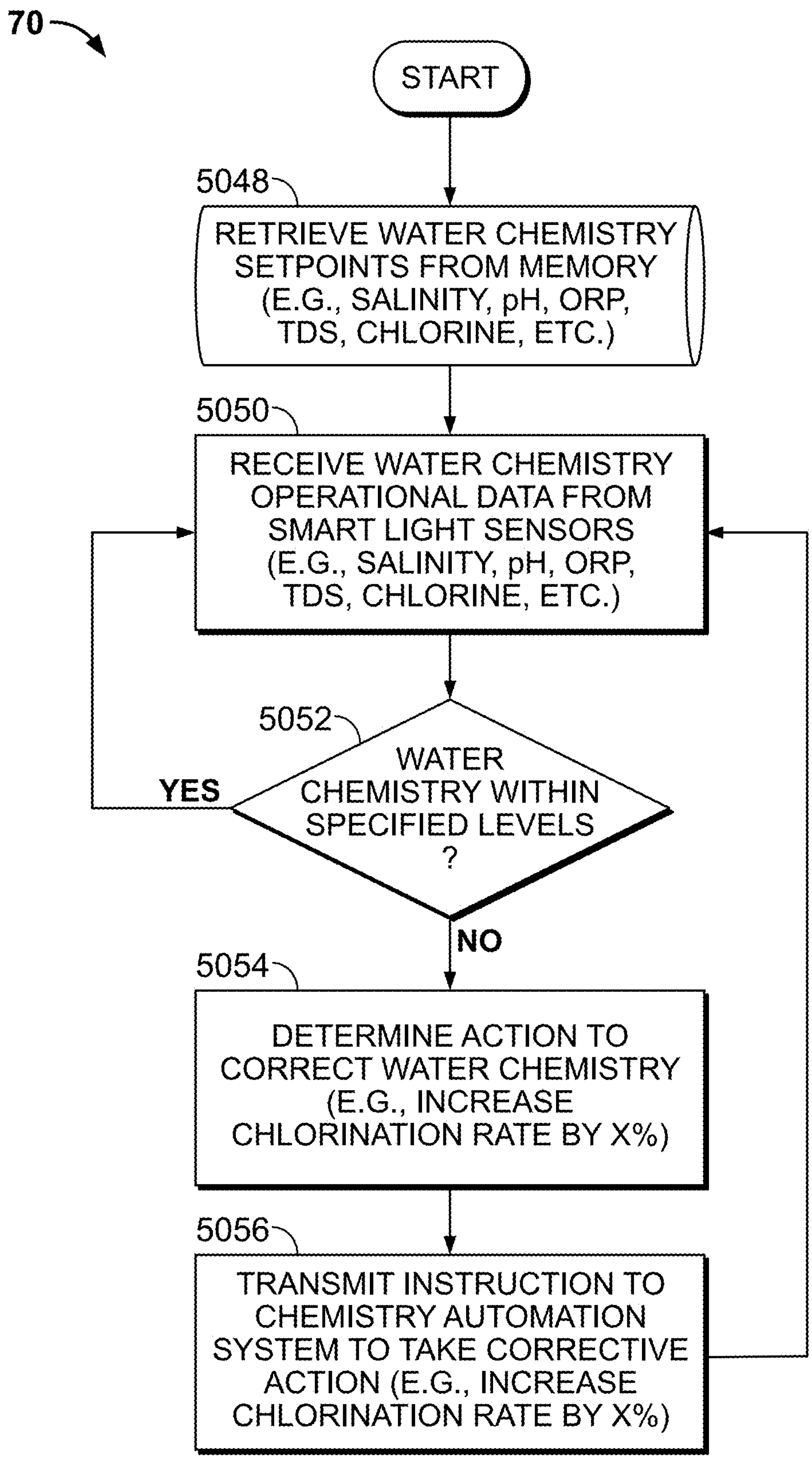

FIG. 39 is a flowchart illustrating processing steps of the pool control logic 70 for controlling the pool/spa water chemistry by operating sanitization equipment based on operational data received from water chemistry sensors in one or more smart lights 5014*h*. In step 5048, the pool control logic 70 receives water chemistry setpoints, e.g., relating to salinity, pH, ORP, TDS, chlorine levels, etc., from memory. In step 5050, the pool control logic 70 receives water chemistry operational data, e.g., salinity, pH, ORP, TDS, chlorine levels, etc., from smart light sensors. In step 5052, the pool control logic 70 determines if the water chemistry operational data (determined in step 5050) is within specific levels, e.g., which are based on the setpoints retrieved in step 5048. If a positive determination is made, then the process returns to step 5050, where the pool control logic 70 continues to receive water chemistry operational data from the smart light sensors. If a negative determination is made, then the process proceeds to step 5054, where the pool control logic 70 determines an action to correct the water chemistry, e.g., increase chlorination rate by X %. In step 5056, the pool control logic transmits an instruction to the chemistry automation system to take corrective action in accordance with the action determined in step 5054, e.g., increase the chlorination rate by X %, and the process reverts to step 5050.

In accordance with additional embodiments of the present disclosure, using similar processing steps as described in connection with FIG. 39, pool control logic 70 could also use operational data received from the smart light 5014*h* sensors to control a robotic cleaner based on operational data received from water clarity sensor 5008 or occupancy sensor 5006, activate the pump and/or filter based on operational data received from water clarity sensor 5009, activate water features, actuate valves, or activate the pump based on operational data received from flow sensor 5014, trigger a house alarm (if armed) based on operational data received from occupancy sensor 5006, activate the lighting system based on operational data received from occupancy sensor 5006 (e.g., turn on the lights, increase the intensity of the lights, switch light color based on an unplanned occupancy or turn lights on based on time of day, automatically turn off after a period of time if no occupant detected, "follow the swimmer" by only activating the light when an occupant is detected proximate thereto), adjust the water temperature based on operational data received from occupancy sensor 5006, adjust light output based on operational data received from ambient light sensor 5004, and adjust CCT based on operational data received from ambient air temperature sensor 5000.

Figure 40:
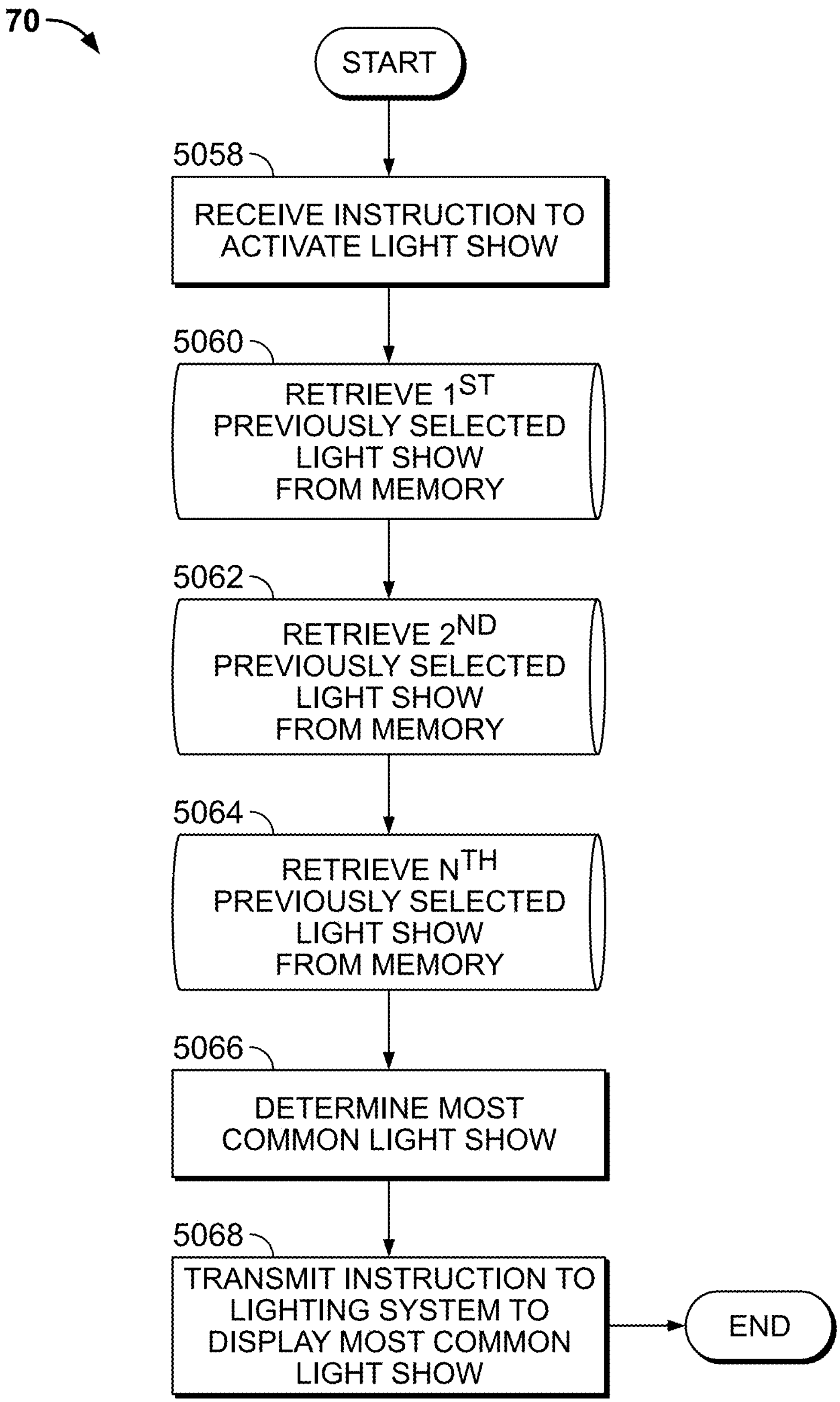

FIG. 40 is a flowchart illustrating processing steps of the pool control logic 70 for predictively displaying the most popular light show based on previously selected light shows. In step 5058, the pool control logic 70 receives an instruction to activate a light show. In step 5060, the pool control logic 70 retrieves a first previously selected light show from memory. In step 5062, the pool control logic 70 retrieves a second previously selected light show from memory. In step 5064, the pool control logic 70 retrieves the nth previously selected light show from memory. That is, in step 5064 the pool control logic 70 retrieves all other previously selected light shows from memory. For example, the system can be set-up so that the three (3), four (4), five (5), ten (10), or twenty (20), etc., most recent previously selected light shows are utilized in this process. In step 5066, the pool control logic 70 determines the most common light show based on the previously selected light shows retrieved from memory in steps 5060, 5062, and 5064. In step 5068, the pool control logic 70 transmits an instruction to a lighting system to display the most common light show as determined in step 5066. It is further contemplated that rather than receiving all of the previously selected light shows from the memory, pool control logic 70 could instead retrieve a set number of most recent light shows (e.g., most recent 10 light shows), or pool control logic 70 could retrieve light shows that were selected within a specified period of time (e.g., light shows selected within the last year). In addition to displaying light shows, it is also contemplated that the smart light 5014*h* could communicate with music and speaker systems to provide a coordinated music and lighting show (e.g., lights change color and intensity, pulse, move, etc. based on a particular musical selection).

It is further contemplated smart light 5014*h* could provide for user interaction with the pool/spa control system 10 and pool control logic 70. As discussed above, the smart light could include a user input module 5018 having touch-based inputs and a display 5019. For example, the user could use the touch-based controls to adjust the water temperature at the smart light 5014*h*, or to modify or change a light show or light color. Similarly, the touch-based controls and display 5019 could be used to virtually configure custom light shows. Additionally, the user could interact with the pool/spa control system 10 using the microphone 5001 (e.g., using voice commands either above or below water).

In accordance with embodiments of the disclosure, the pool control logic 70 could receive operational data from a plurality of smart lights 5014*h* disposed about a pool/spa. More specifically, pool control logic 70 could receive operational data from occupancy sensors 5006 in the plurality of smart lights 5014*h*. Using the plurality of lights 5014*h* and sensors 5006 as nodes in a mesh array, pool control logic 70 could determine the location of the occupant in the pool/spa.

In accordance with embodiments of the present disclosure, the smart light 5014*h* could further perform an optical comparison with a camera to identify when the pool is dirty or contains debris or other particulate.

In accordance with embodiments of the present disclosure, a plurality of smart lights 5014*h* could be used as an array to provide directional input for a robotic cleaner. For example, as discussed above, pool control logic 70 could determine areas of the pool having high concentrations of dirt or debris. Further, a plurality of smart lights 5014*h* could be disposed about a pool/spa. Pool control logic 70 could then determine the smart light 5014*h* in closest proximity to the debris and send an instruction to activate the smart light 5014*h*. The pool cleaner would then detect the light from the smart light 5014, proceed towards the same, and accordingly proceed towards the area having a high concentration of debris. Alternatively, smart lights 5014*h* could independently illuminate if they determine they are proximate to an area of high debris. The pool cleaner could then proceed to each area of high debris, in turn.

In accordance with embodiments of the present disclosure, smart lights 5014*h* could be used to provide light catalyzed chemistry for sanitization by adjusting their light output wavelength. For example, pool control logic 70 could receive an instruction to sanitize the pool/spa. Pool control logic 70 could then retrieve light wavelength sanitization setpoint data from the memory (e.g., sanitization wavelength is 254 nm). Pool control logic 70 could then transmit an instruction to the lighting system 14*h* and/or smart light 5014*h* to operate at the sanitization setpoint (e.g., 254 nm).

FIGS. 73-85 illustrate components of embodiments of the heating/cooling system 14*b* of FIG. 1 and processing steps carried out by the embodiments of the heating/cooling system 14*b*.

Figure 73:
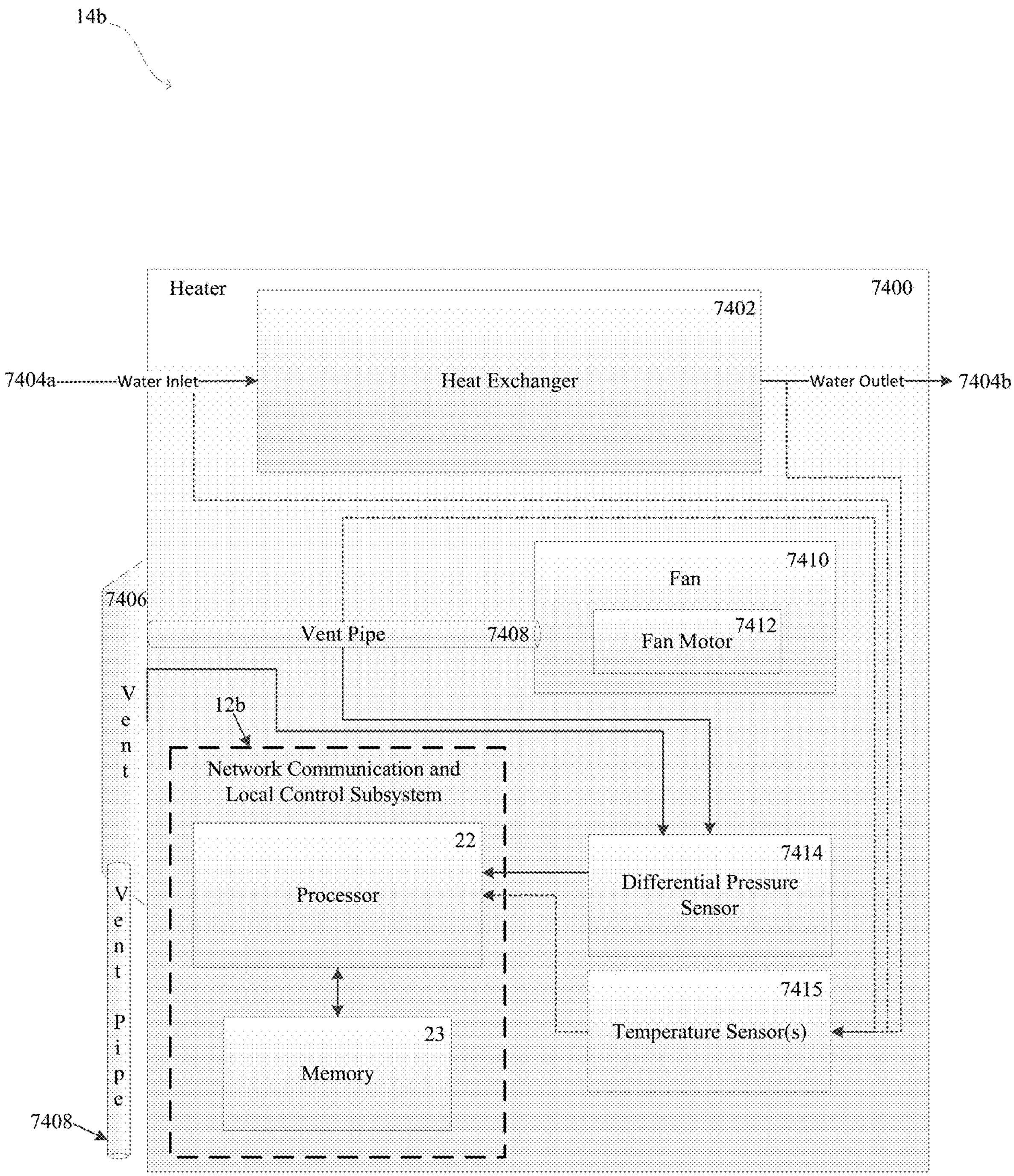
FIG. 73 is a block diagram illustrating components of an embodiment of the heating/cooling system of FIG. 1.

FIG. 73 is a block diagram illustrating components of an embodiment of the heating/cooling system 14*b* of FIG. 1 for measuring venting system exhaust pressure, venting system temperature, and detecting changes and/or problems in the performance of the venting of the heating/cooling system 14*b*.

A pool heater of a heating/cooling system that is installed in a building or indoor space utilizes a venting system comprising a vent and vent pipes to safely exhaust the products of combustion outdoors. A blockage in the vent and/or vent pipes can result in poisonous exhaust gases (e.g., carbon monoxide) being released into the building or indoor space. Further, a blockage in the vent and/or vent pipes can reduce air flow and increase exhaust gas recirculation, both of which can cause carbon monoxide production to increase. As discussed above in relation to FIGS. 23C and 23J, design safety standards for pool heaters (e.g., ANSI Z21.56), require tests that demonstrate that a heater of the heating/cooling system will detect a vent and/or vent pipe blockage and deactivate before the carbon monoxide concentration in the exhaust gas reaches a predetermined level.

Pool heater manufacturers can detect a vent and/or vent pipe blockage via at least one pressure switch that detects the venting system exhaust pressure generated by the blockage. However, a pressure switch is susceptible to failure. For example, the tubing between the pressure switch and the vent and/or vent pipes can be disconnected or broken or the pressure switch can be improperly wired (i.e., "jumpered") thereby rendering the pressure switch ineffective.

As shown in FIG. 73, the heating/cooling system 14*b* could include a heater 7400 having a water inlet pipe 7404*a*, a water outlet pipe 7404*b*, a heat exchanger 7402, a vent 7406, vent pipes 7408, a fan 7410 having a fan motor 7412, a differential pressure sensor 7414 and a network communication and local control subsystem 12*b* ("control subsystem 12*b*") including, but not limited to, a processor 22 and a memory 23. Alternatively, the control subsystem 12*b* could be a hardware processor including a controller in communication with the memory 23 and the differential pressure sensor 7414. According to some embodiments of the present disclosure, the heating/cooling system 14*b* can include one or more temperature sensors 7415 that can monitor the temperature of one or more of the vent pipes 7408, water inlet 7404*a*, and water outlet 7404*b*, which can be monitored by the processor 22 and used to generate a temperature profile for the heating/cooling system 14*b*.

The water inlet pipe 7404*a* transports water from the pool/spa into the heating/cooling system 14*b* via, for example, a pump or via other means. The water passes through the heater 7400 and into the heat exchanger 7402. The water outlet pipe 7404*b* transports water out from the heating/cooling system 14*b* to, for example, the pool or spa. The differential pressure sensor 7414 measures the exhaust pressure in the vent 7406 and/or vent pipes 7408 and cannot be "jumpered" like a pressure switch which makes it more effective. As shown, the differential pressure sensor 7414 can measure the pressure differential between the vent 7406 and one or more of the vent pipes 7408 in order to determine the presence of a blockage therein. The heating/cooling system 14*b* provides for detecting changes and/or problems in the performance of the venting of the heating/cooling system 14*b* by defining a plurality of predetermined venting system exhaust pressure thresholds as described in further detail below.

Referring to FIGS. 1 and 2, the control subsystem 12*b* could include a processor 22 in communication with a memory 23 including at least one of a random-access memory 24 and a non-volatile memory 30. The processor 22 provides local processing capability for the control subsystem 12*b*. The non-volatile memory 30 can store one or more local control programs 30 for providing local control of the pool and spa equipment in which the control subsystem 12*b* is installed. The processor 22 is in communication with the differential pressure sensor 7414 of the heater 7400. It is noted that a pressure sensor may also be referred to as a pressure transducer, a pressure transmitter, a pressure indicator, a piezometer and a manometer and could be one of an absolute pressure sensor, a gauge pressure sensor, a vacuum pressure sensor, a differential pressure sensor, a sealed pressure sensor or any other type of pressure sensing device. The differential pressure sensor 7414 can be connected to and in communication with the heating/cooling system 14*b* and the control subsystem 12*b* via a wired or a wireless connection.

The processor 22 may detect changes and/or problems in the performance of the venting of the heating/cooling system 14*b* and control the operation of the heating/cooling system 14*b* based on (1) a measurement of the venting system exhaust pressure relative to a plurality of predetermined pressure thresholds and (2) a calculated difference between the measurement of the venting system exhaust pressure and a last recorded measurement of the venting system exhaust pressure relative to a plurality of predetermined pressure thresholds. It is noted that the control subsystem 12*b* may be affixed to, installed within or installed remotely from the heating/cooling system 14*b*. The components of the control subsystem 12*b* are discussed in more detail above in regards to FIG. 2.

Figure 74A:
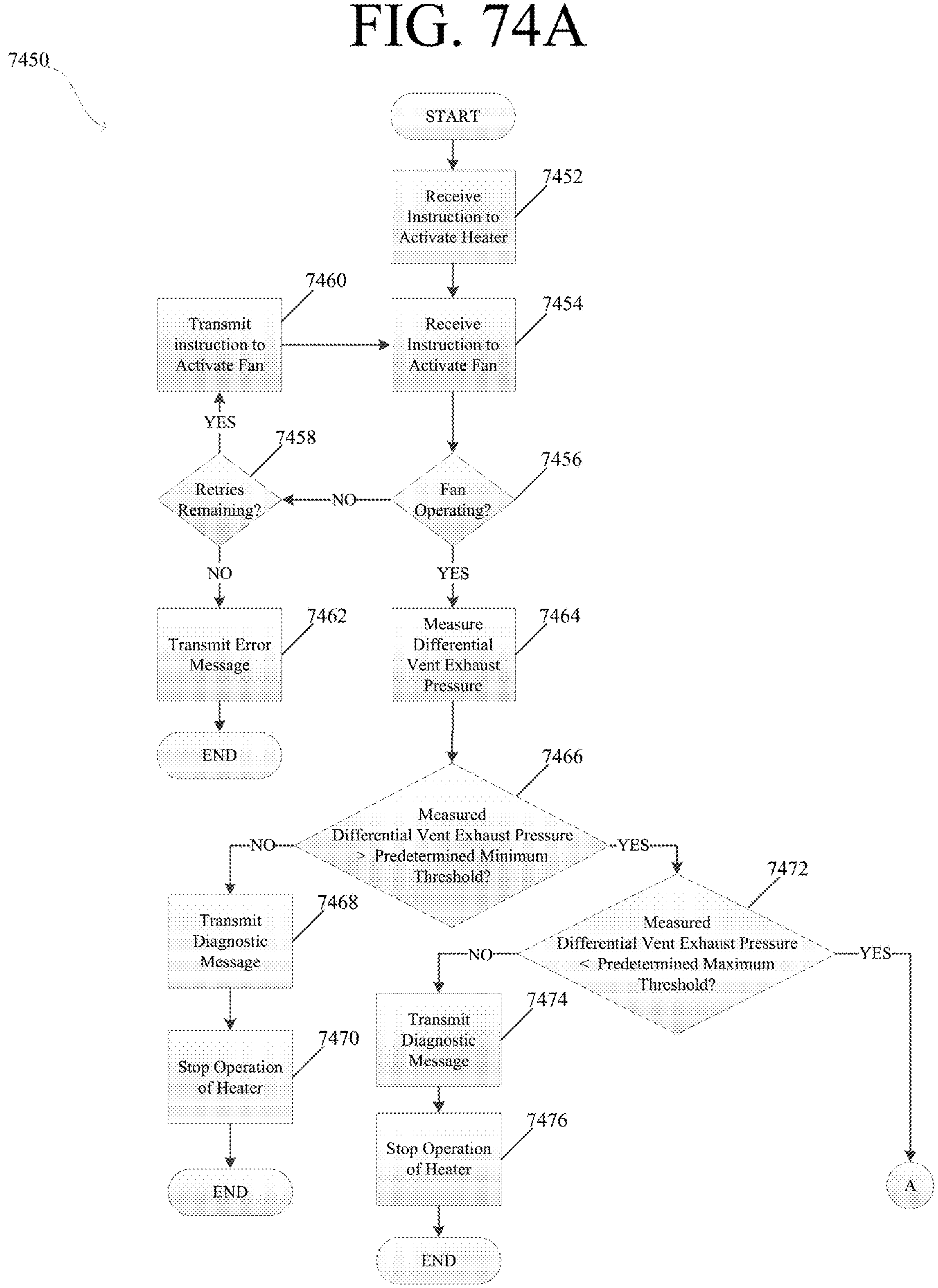
FIGS. 74A-D are flowcharts illustrating processing steps carried out by the heating/cooling system of FIG. 73.
Figure 74B:
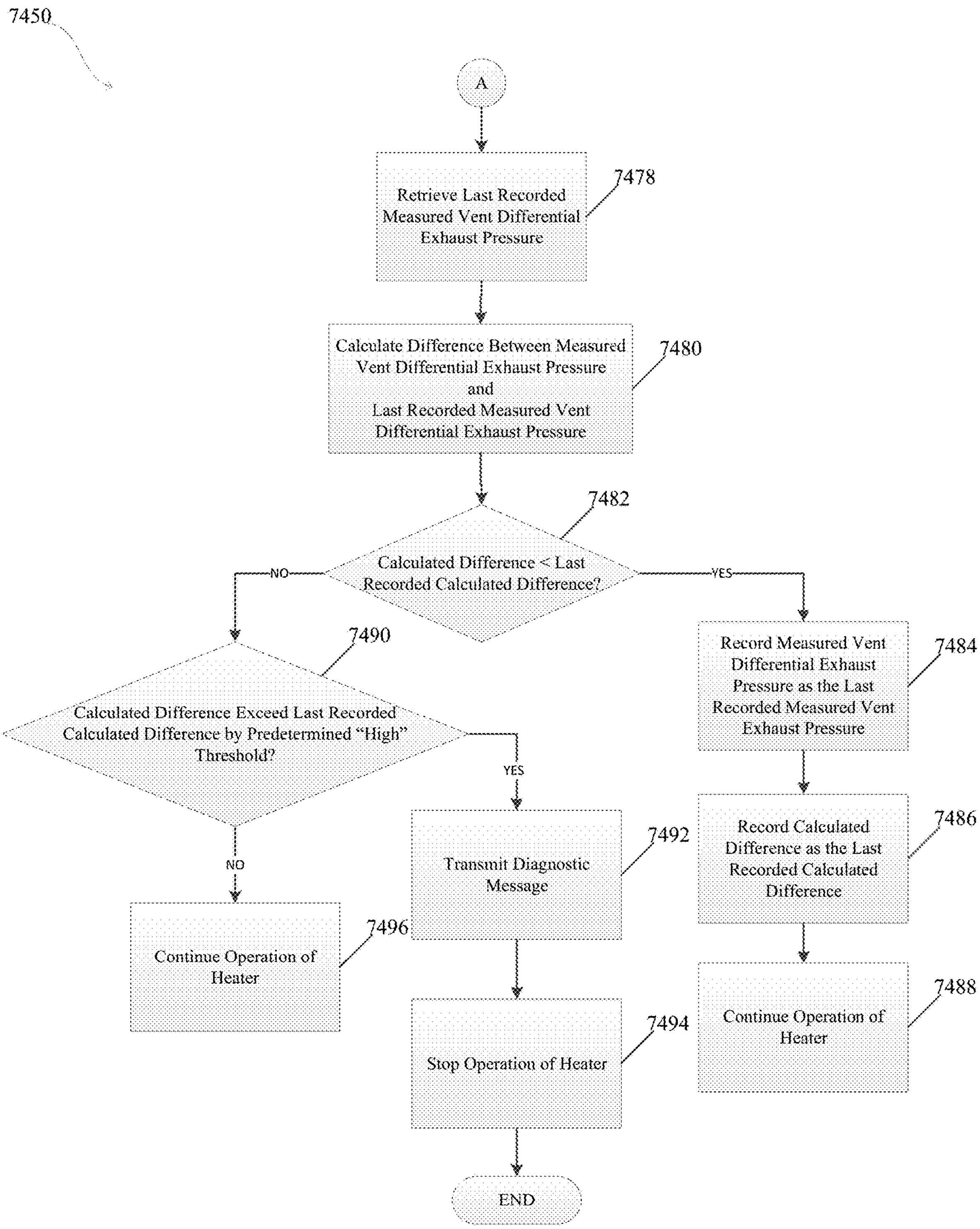

FIGS. 74A-B are flowcharts illustrating processing steps carried out by the heating/cooling system 14*b* of FIG. 73 for detecting changes and/or problems in the performance of the venting of the heating/cooling system 14*b*, indicated generally at method 7450.

In step 7452, the system 14*b* receives a command to heat the water in the pool or spa and ignites and fires the heater 7400. A user may transmit the command via a remote device or terminal (e.g., smart phone/computer system 20 of FIG. 1) or via a display of the heating/cooling system 14*b* to instruct the heating system 14*b* to heat the water in the pool or spa. Alternatively, the system 14*b* may transmit the command due to a predetermined condition. For example, a user can set a condition for commanding the heating/cooling system 14*b* to activate the heater 7400 (e.g., engage heating functions) at a predetermined time and/or at a predetermined temperature. Those skilled in the art would understand that, in a heating/cooling system or a cooling system, the activation command can also be a command to cool the water in a pool or spa.

In step 7454, the system 14*b* receives a command to activate the fan 7410. Then, in step 7456, the system 14*b* determines whether the fan is operational. If the fan 7410 is not operational (i.e., the fan motor 7412 is inoperative), then in step 7458, the system 14*b* determines whether any retries remain for transmitting an activation command to the fan 7410. If no retries remain, then in step 7462, the system 14*b* transmits an error message and the process ends. If at least one retry remains, then the system 14*b* transmits a command to activate the fan 7410 in step 7460. If the fan 7410 is operational (i.e., the fan motor 7412 is operative), then the system 14*b* measures the venting system exhaust pressure via the differential pressure sensor 7414 in step 7464.

In step 7466, the system 14*b* determines whether the measured venting system differential exhaust pressure is greater than a predetermined minimum pressure threshold. A minimum venting system differential exhaust pressure should be present when the fan 7410 is operational. For example, if the fan 7410 is operational but the measured venting system differential exhaust pressure is less than a predetermined minimum pressure threshold, then the vent 7406 or the vent pipes 7408 may be damaged and/or disconnected.

In step 7468, the system 14*b* transmits a diagnostic message indicative of a problem with the venting of the system 14*b* when the measured venting system differential exhaust pressure is not greater than the predetermined minimum pressure threshold. The diagnostic message can be a report, an alert, etc. The diagnostic message can be transmitted to and displayed by the heating/cooling system 14*b* display or a remote device such as the smart phone/computer system 20. The diagnostic message can include, but is not limited to, a summary of the problem (e.g., vent 7406 and/or vent pipes 7408 disconnected), instructions detailing how to troubleshoot the problem, an option to schedule a repair specialist to fix the problem and an override command. Then in step 7470, the system 14*b* stops the operation of the heater 7400 to prevent potential damage to the heater 7400 and/or the increase of exhaust gas within the heater 7400 and the process ends. Alternatively, if the system 14*b* determines that the measured venting system differential exhaust pressure is greater than the predetermined minimum pressure threshold, the process proceeds to step 7472.

In step 7472, the system 14*b* determines whether the measured venting system differential exhaust pressure is less than a predetermined maximum pressure threshold. A venting system differential exhaust pressure maximum threshold can be used to detect a blockage of the vent 7406 and/or the vent pipes 7408.

In step 7474, the system 14*b* transmits a diagnostic message indicative of a problem with the venting of the system 14*b* when the system 14*b* determines that the measured venting system differential exhaust pressure is not less than the predetermined maximum pressure threshold. The diagnostic message can be a report, an alert, etc. The diagnostic message can be transmitted to and displayed by the heating/cooling system 14*b* display or a remote device such as the smart phone/computer system 20. The diagnostic message can include, but is not limited to, a summary of the problem (e.g., vent 7406 and/or vent pipes 7408 blocked), instructions detailing how to troubleshoot the problem, an option to schedule a repair specialist to fix the problem and an override command. Then in step 7476, the system 14*b* stops the operation of the heater 7400 to prevent potential damage to the heater 7400 and/or the increase of exhaust gas within the heater 7400 and the process ends. Alternatively, if the system 14*b* determines that the measured venting system differential exhaust pressure is less than the predetermined minimum pressure threshold, the process proceeds to step 7478.

In step 7478, the system 14*b* retrieves the last recorded measured venting system differential exhaust pressure and in step 7480, the system 14*b* calculates a difference between the measured venting system differential exhaust pressure and the last recorded measured venting system differential exhaust pressure. The last recorded measured venting system differential exhaust pressure can be stored in the memory 23 or the cloud. An increase in the venting system differential exhaust pressure over time can be indicative of a blockage forming (e.g., an animal nest) within the vent 7406 and/or the vent pipes 7408.

Therefore, in step 7482, the system 14*b* determines whether the calculated difference between the measured venting system differential exhaust pressure and the last recorded measured venting system differential exhaust pressure is less than the last recorded calculated difference. If the calculated difference between the measured venting system differential exhaust pressure and the last recorded measured venting system differential exhaust pressure is less than the last recorded calculated difference, then in step 7484, the system 14*b* records the measured venting system differential exhaust pressure as the last recorded measured venting system differential exhaust pressure. Additionally, in step 7486, the system 14*b* records the calculated difference as the last recorded calculated difference. Then, in step 7488, the system 14*b* continues the operation of the heater 7400.

Alternatively, if the system 14*b* determines that the calculated difference between the measured venting system differential exhaust pressure and the last recorded measured venting system differential exhaust pressure is not less than the last recorded calculated difference, then the process proceeds to step 7490. In step 7490, the system 14*b* determines whether the calculated difference exceeds the last recorded calculated difference by a predetermined threshold. In particular, the system 14*b* determines whether the calculated difference between the measured venting system differential exhaust pressure and the last recorded measured venting system differential exhaust pressure exceeds the last recorded calculated difference by a predetermined "high" pressure threshold.

In step 7492, the system 14*b* transmits a diagnostic message indicative of a problem with the venting of the system 14*b* when the calculated difference exceeds the last recorded calculated difference by the predetermined "high" pressure threshold. The diagnostic message can be a report, an alert, etc. The diagnostic message can be transmitted to and displayed by the heating/cooling system 14*b* display or a remote device such as the smart phone/computer system 20. The diagnostic message can include, but is not limited to, a summary of the problem (e.g., unsafe pressure level), instructions detailing how to troubleshoot the problem, an option to schedule a repair specialist to fix the problem and an override command. Then in step 7496, the system 14*b* stops the operation of the heater 7400 to prevent potential damage to the heater 7400 and/or the increase of exhaust gas within the heater 7400 and the process ends. Alternatively, the system 14*b* continues the operation of the heater 7400 in step 7496 when the calculated difference does not exceed the last recorded calculated difference by the predetermined "high" pressure threshold.

Figure 74C:
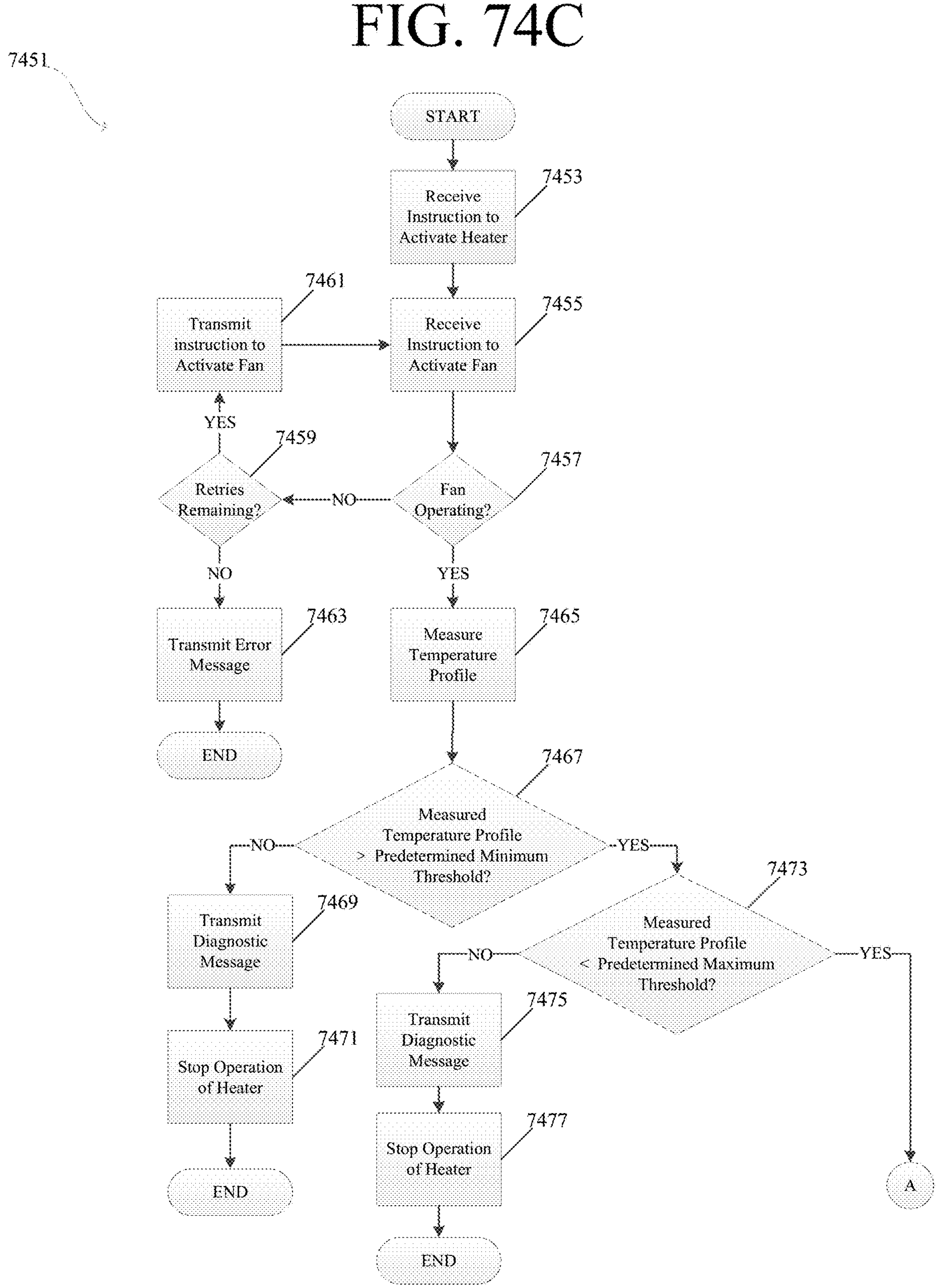
Figure 74D:
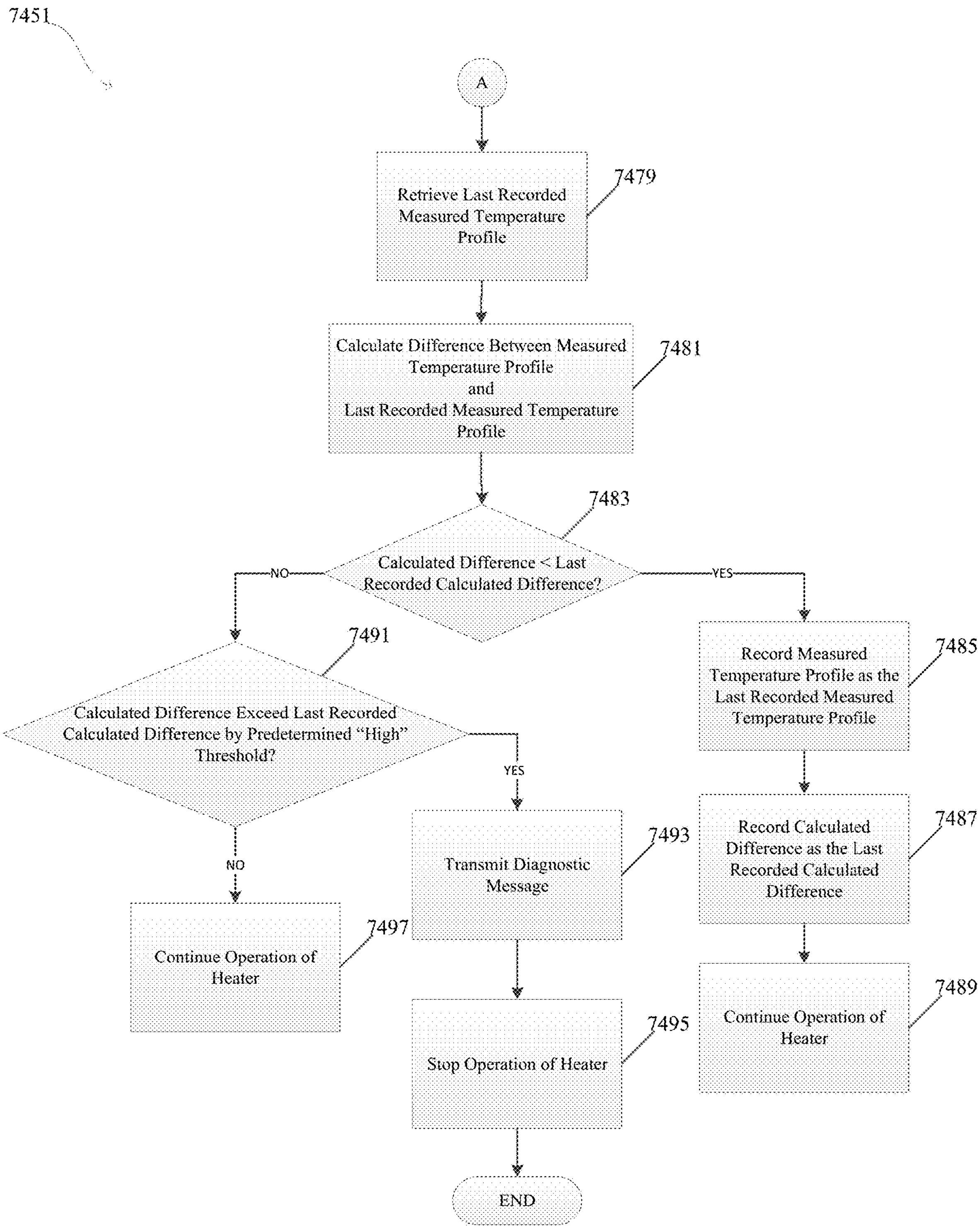

FIGS. 74C-74D are flowcharts illustrating processing steps carried out by the heating/cooling system 14*b* of FIG. 73 for detecting changes and/or problems in the performance of the venting of the heating/cooling system 14*b*, indicated generally at method 7451. More specifically, the heating/cooling system 14*b* can detect changes and/or problems in the performance of the venting of the heating/cooling system 14*b* by using the one or more temperature sensors 7415 shown in FIG. 73 to monitor the temperature profile of the water inlet 7404*a*, water outlet 7404*b*, and vent pipe 7408. The system can detect changes and/or problems in the performance of the venting of the heating/cooling system 14*b* using steps similar to those discussed in connection with method 7450, except for the distinctions noted herein. According to some embodiments of the present disclosure, the foregoing processing steps can also be executed by the heating/cooling system 14*b* in connection with the "economy" and/or "adaptive" modes of the system described herein.

In step 7453, the system 14*b* receives a command to heat the water in the pool or spa and ignites and fires the heater 7400. A user may transmit the command via a remote device or terminal (e.g., smart phone/computer system 20 of FIG. 1) or via a display of the heating/cooling system 14*b* to instruct the heating system 14*b* to heat the water in the pool or spa. Alternatively, the system 14*b* may transmit the command due to a predetermined condition. For example, a user can set a condition for commanding the heating/cooling system 14*b* to activate the heater 7400 (e.g., engage heating functions) at a predetermined time and/or at a predetermined temperature. Those skilled in the art would understand that, in a heating/cooling system or a cooling system, the activation command can also be a command to cool the water in a pool or spa.

In step 7455, the system 14*b* receives a command to activate the fan 7410. Then, in step 7457, the system 14*b* determines whether the fan is operational. If the fan 7410 is not operational (i.e., the fan motor 7412 is inoperative), then in step 7459, the system 14*b* determines whether any retries remain for transmitting an activation command to the fan 7410. If no retries remain, then in step 7463, the system 14*b* transmits an error message and the process ends. If at least one retry remains, then the system 14*b* transmits a command to activate the fan 7410 in step 7461. If the fan 7410 is operational (i.e., the fan motor 7412 is operative), then the system 14*b* measures the temperature profile of the heating/cooling system 14*b* via the one or more temperature sensors 7415 in step 7465.

In step 7467, the system 14*b* determines whether the measured temperature profile is greater than a predetermined minimum temperature profile threshold. A minimum temperature profile should be present when the fan 7410 is operational. For example, if the fan 7410 is operational but the measured temperature profile is less than a predetermined minimum temperature profile, then the vent 7406 or the vent pipes 7408 may be damaged and/or disconnected.

In step 7469, the system 14*b* transmits a diagnostic message indicative of a problem with the system 14*b* when the measured temperature profile is not greater than the predetermined minimum temperature profile threshold. The diagnostic message can be a report, an alert, etc. The diagnostic message can be transmitted to and displayed by the heating/cooling system 14*b* display or a remote device such as the smart phone/computer system 20. The diagnostic message can include, but is not limited to, a summary of the problem (e.g., vent 7406 and/or vent pipes 7408 disconnected), instructions detailing how to troubleshoot the problem, an option to schedule a repair specialist to fix the problem and an override command. Then in step 7471, the system 14*b* stops the operation of the heater 7400 to prevent potential damage to the heater 7400 and/or the increase of temperature within the heater 7400 and the process ends. Alternatively, if the system 14*b* determines that the measured temperature profile is greater than the predetermined minimum temperature profile threshold, the process proceeds to step 7473.

In step 7473, the system 14*b* determines whether the measured temperature profile is less than a predetermined maximum temperature profile threshold. A temperature profile maximum threshold can be used to detect a blockage of the vent 7406 and/or the vent pipes 7408.

In step 7475, the system 14*b* transmits a diagnostic message indicative of a problem with the venting of the system 14*b* when the system 14*b* determines that the measured temperature profile is not less than the predetermined maximum temperature profile threshold. The diagnostic message can be a report, an alert, etc. The diagnostic message can be transmitted to and displayed by the heating/cooling system 14*b* display or a remote device such as the smart phone/computer system 20. The diagnostic message can include, but is not limited to, a summary of the problem (e.g., vent 7406 and/or vent pipes 7408 blocked), instructions detailing how to troubleshoot the problem, an option to schedule a repair specialist to fix the problem and an override command. Then in step 7477, the system 14*b* stops the operation of the heater 7400 to prevent potential damage to the heater 7400 and/or the increase of temperature within the heater 7400 and the process ends. Alternatively, if the system 14*b* determines that the measured temperature profile is less than the predetermined minimum temperature profile threshold, the process proceeds to step 7479.

In step 7479, the system 14*b* retrieves the last recorded measured temperature profile and in step 7481, the system 14*b* calculates a difference between the measured temperature profile and the last recorded measured temperature profile. The last recorded measured temperature profile can be stored in the memory 23 or the cloud. An increase in the temperature profile over time can be indicative of a blockage forming (e.g., an animal nest) within the vent 7406 and/or the vent pipes 7408.

Therefore, in step 7483, the system 14*b* determines whether the calculated difference between the measured temperature profile and the last recorded measured temperature profile is less than the last recorded calculated difference. If the calculated difference between the measured temperature profile and the last recorded measured temperature profile is less than the last recorded calculated difference, then in step 7485, the system 14*b* records the measured temperature profile as the last recorded measured temperature profile. Additionally, in step 7487, the system 14*b* records the calculated difference as the last recorded calculated difference. Then, in step 7489, the system 14*b* continues the operation of the heater 7400.

Alternatively, if the system 14*b* determines that the calculated difference between the measured temperature profile and the last recorded measured temperature profile is not less than the last recorded calculated difference, then the process proceeds to step 7491. In step 7491, the system 14*b* determines whether the calculated difference exceeds the last recorded calculated difference by a predetermined threshold. In particular, the system 14*b* determines whether the calculated difference between the measured temperature profile and the last recorded measured temperature profile exceeds the last recorded calculated difference by a predetermined "high" temperature profile threshold.

In step 7493, the system 14*b* transmits a diagnostic message indicative of a problem with the venting of the system 14*b* when the calculated difference exceeds the last recorded calculated difference by the predetermined "high" temperature profile threshold. The diagnostic message can be a report, an alert, etc. The diagnostic message can be transmitted to and displayed by the heating/cooling system 14*b* display or a remote device such as the smart phone/computer system 20. The diagnostic message can include, but is not limited to, a summary of the problem (e.g., unsafe temperature level), instructions detailing how to troubleshoot the problem, an option to schedule a repair specialist to fix the problem and an override command. Then in step 7495, the system 14*b* stops the operation of the heater 7400 to prevent potential damage to the heater 7400 and/or the increase of temperature within the heater 7400 and the process ends. Alternatively, the system 14*b* continues the operation of the heater 7400 in step 7497 when the calculated difference does not exceed the last recorded calculated difference by the predetermined "high" temperature profile threshold.

Figure 75:
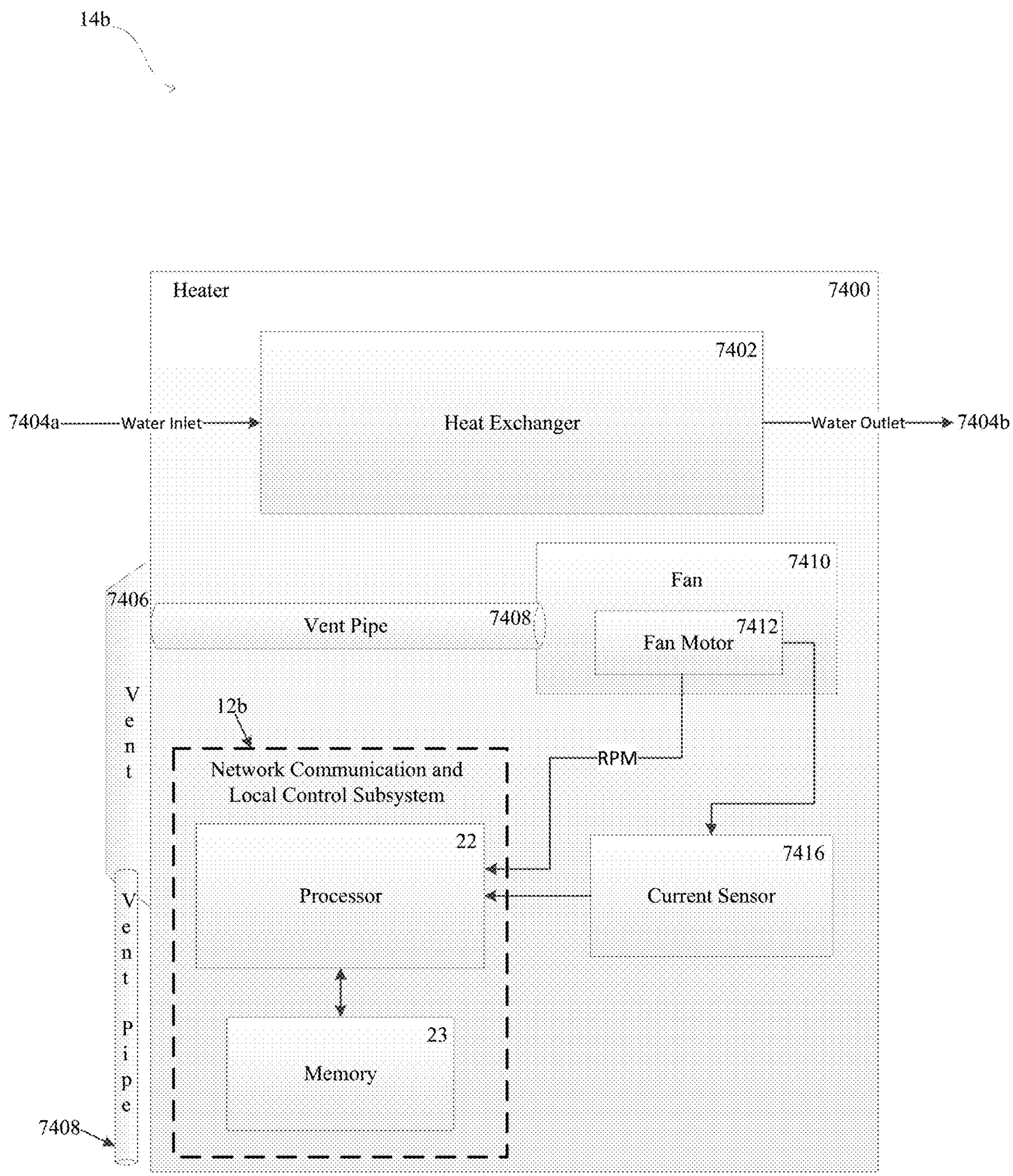
FIG. 75 is a block diagram illustrating components of an embodiment of the heating/cooling system of FIG. 1.

FIG. 75 is a block diagram illustrating components of an embodiment of the heating/cooling system 14*b* of FIG. 1 for detecting the proper function of a fan motor of the heating/cooling system 14*b* based on a measurement of the electric current of the fan motor.

A pool heater of a heating/cooling system comprises a fan driven by an electric motor to move air through the heating/cooling system. For example, in a gas-fired pool heater, air is moved through the burner and combustion system by a centrifugal fan (i.e., a blower) whereas in a heat pump pool heater, air is moved through the heat exchanger by an axial fan. The electric current flowing to the motors of these fans can be used to detect and diagnose a problem with the pool heater. Typically, in a gas-fired pool heater, a pressure switch can confirm whether the blower is functioning before the gas valve is opened and ignition is started by measuring the small vacuum generated by the blower.

The heating/cooling system 14*b* provides for detecting the proper function of a fan motor of the heating/cooling system 14*b* based on a measurement of the electric current of the fan motor at a given speed (e.g., RPM) via a current sensor and thereby obviating a need for a pressure switch. As shown in FIG. 75, the heating/cooling system 14*b* could include a heater 7400 having a water inlet pipe 7404*a*, a water outlet pipe 7404*b*, a heat exchanger 7402, a vent 7406, vent pipes 7408, a fan 7410 having a fan motor 7412, a current sensor 7416 and a network communication and local control subsystem 12*b* ("control subsystem 12*b*") including, but not limited to, a processor 22 and a memory 23. Alternatively, the control subsystem 12*b* could be a hardware processor including a controller in communication with the memory 23 and the current sensor 7416.

The water inlet pipe 7404*a* transports water from the pool/spa into the heating/cooling system 14*b* via, for example, a pump or via other means. The water passes through the heater 7400 and into the heat exchanger 7402. The water outlet pipe 7404*b* transports water out from the heating/cooling system 14*b* to, for example, the pool or spa. The current sensor 7416 measures the electric current of the fan motor 7412. The speed (e.g., RPM) of the fan motor can be provided to the processor 22, either directly (e.g., by way of a communication channel, or the like, therebetween), or via an intermediate rotational speed sensor (not shown), for example, coupled to the output shaft of the motor 7412. The heating/cooling system 14*b* provides for detecting the proper function of the fan motor 7412 of the heating/cooling system 14*b* based on a measurement of the electric current of the fan motor 7412 at a given speed (e.g., RPM), via the current sensor 7416, and by defining a plurality of predetermined current thresholds.

Referring to FIGS. 1 and 2, the control subsystem 12*b* could include a processor 22 in communication with a memory 23 including at least one of a random-access memory 24 and a non-volatile memory 30. The processor 22 provides local processing capability for the control subsystem 12*b*. The non-volatile memory 30 can store one or more local control programs 30 for providing local control of the pool and spa equipment in which the control subsystem 12*b* is installed. The processor 22 is in communication with the current sensor 7416 of the heater 7400. It is noted that the current sensor 7416 could sense an alternating current input or a direct current input. The current sensor 7416 can be connected to and in communication with the heating/cooling system 14*b* and the control subsystem 12*b* via a wired or a wireless connection.

The processor 22 may detect changes and/or problems in the performance of the fan motor 7412 and control the operation of the heating/cooling system 14*b* based on a measurement of the current of the motor 7412 relative to a plurality of predetermined current thresholds. It is noted that the control subsystem 12*b* may be affixed to, installed within or installed remotely from the heating/cooling system 14*b*. The components of the control subsystem 12*b* are discussed in more detail above in regards to FIG. 2.

Figure 76:
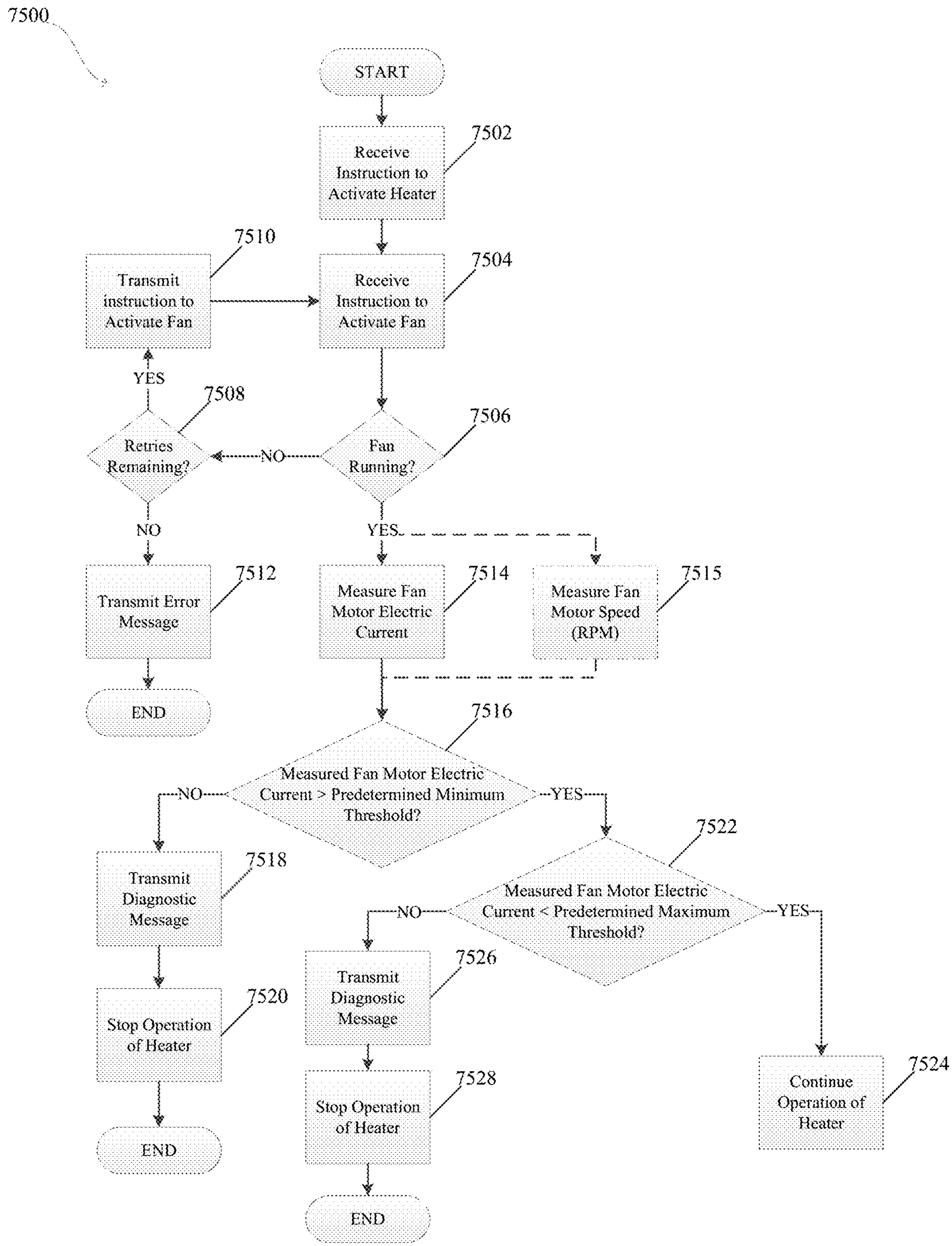
FIG. 76 is a flowchart illustrating processing steps carried out by the heating/cooling system of FIG. 75.

FIG. 76 is a flowchart illustrating processing steps carried out by the heating/cooling system 14*b* of FIG. 75 for detecting the proper function of the fan motor 7412 of the heating/cooling system 14*b* based on the measurement of the electric current of the fan motor 7412 via the current sensor 7416, indicated generally at method 7500.

In step 7502, the system 14*b* receives a command to heat the water in the pool or spa and ignites and fires the heater 7400. A user may transmit the command via a remote device or terminal (e.g., smart phone/computer system 20 of FIG. 1) or via a display of the heating/cooling system 14*b* to instruct the heating system 14*b* to heat the water in the pool or spa. Alternatively, the system 14*b* may transmit the command due to a predetermined condition. For example, a user can set a condition for commanding the heating/cooling system 14*b* to activate the heater 7400 (e.g., engage heating functions) at a predetermined time and/or at a predetermined temperature. Those skilled in the art would understand that, in a heating/cooling system or a cooling system, the activation command can also be a command to cool the water in a pool or spa.

In step 7504, the system 14*b* receives a command to activate the fan 7410. Then, in step 7506, the system 14*b* determines whether the fan is operational. If the fan 7410 is not operational (i.e., the fan motor 7412 is inoperative), then in step 7508, the system 14*b* determines whether any retries remain for transmitting an activation command to the fan 7410. If no retries remain, then in step 7510, the system 14*b* transmits an error message and the process ends. If at least one retry remains, then the system 14*b* transmits a command to activate the fan 7410 in step 7510. If the fan 7410 is operational (i.e., the fan motor 7412 is operative), then in step 7514, the system 14*b* measures the current of the fan motor 7412 via the current sensor 7416. Optionally, in step

7515, the system 14*b* can measure the speed (e.g., RPM) of the fan motor 7412. In step 7516, the system 14*b* determines whether the measured fan motor current is greater than a predetermined minimum current threshold. According to some embodiments of the present disclosure, the system 14*b* can determine whether the measured fan motor current is greater than a predetermined minimum current threshold at a given speed of the fan motor. For example, the current of the fan motor can vary, depending on the speed at which the fan motor is operating. As such, the system 14*b* can account for variations in operating speed when determining if the fan motor current is operating within current thresholds. A minimum fan motor current should be present when the fan 7410 and fan motor 7412 are operative. For example, if the system 14*b* receives a command to activate the fan 7410 but the measured fan motor current is not greater than the predetermined minimum current threshold, then the fan motor 7412 may be improperly wired. In step 7518, the system 14*b* transmits a diagnostic message indicative of a problem with the fan motor 7412 when the measured fan motor current is not greater than the predetermined minimum current threshold. The diagnostic message can be a report, an alert, etc. The diagnostic message can be transmitted to and displayed by the heating/cooling system 14*b* display or a remote device such as the smart phone/computer system 20. The diagnostic message can include, but is not limited to, a summary of the problem (e.g., fan motor open circuit), instructions detailing how to troubleshoot the problem, an option to schedule a repair specialist to fix the problem and an override command. Then in step 7520, the system 14*b* stops the operation of the heater 7400 to prevent potential damage to the heater 7400 and the process ends. Alternatively, if the system 14*b* determines that the measured fan motor current is greater than the predetermined minimum current threshold, the process proceeds to step 7522.

In step 7522, the system 14*b* determines whether the measured fan motor current is less than a predetermined maximum current threshold. A fan motor maximum current threshold can detect whether the fan motor 7412 is damaged.

In step 7526, the system 14*b* transmits a diagnostic message indicative of a problem with the fan motor 7412 of the system 14*b* when the system 14*b* determines that the measured fan motor current is not less than the predetermined maximum current threshold. The diagnostic message can be a report, an alert, etc. The diagnostic message can be transmitted to and displayed by the heating/cooling system 14*b* display or a remote device such as the smart phone/computer system 20. The diagnostic message can include, but is not limited to, a summary of the problem (e.g., fan motor 7412 damaged), instructions detailing how to troubleshoot the problem, an option to schedule a repair specialist to fix the problem and an override command. Then in step 7528, the system 14*b* stops the operation of the heater 7400 to prevent potential damage to the heater 7400 and/or further damage to the fan motor 7412 and the process ends. Alternatively, if the system 14*b* determines that the measured fan motor current is less than the predetermined maximum current threshold, the system 14*b* continues the operation of the heater 7400 in step 7524.

Figure 77:
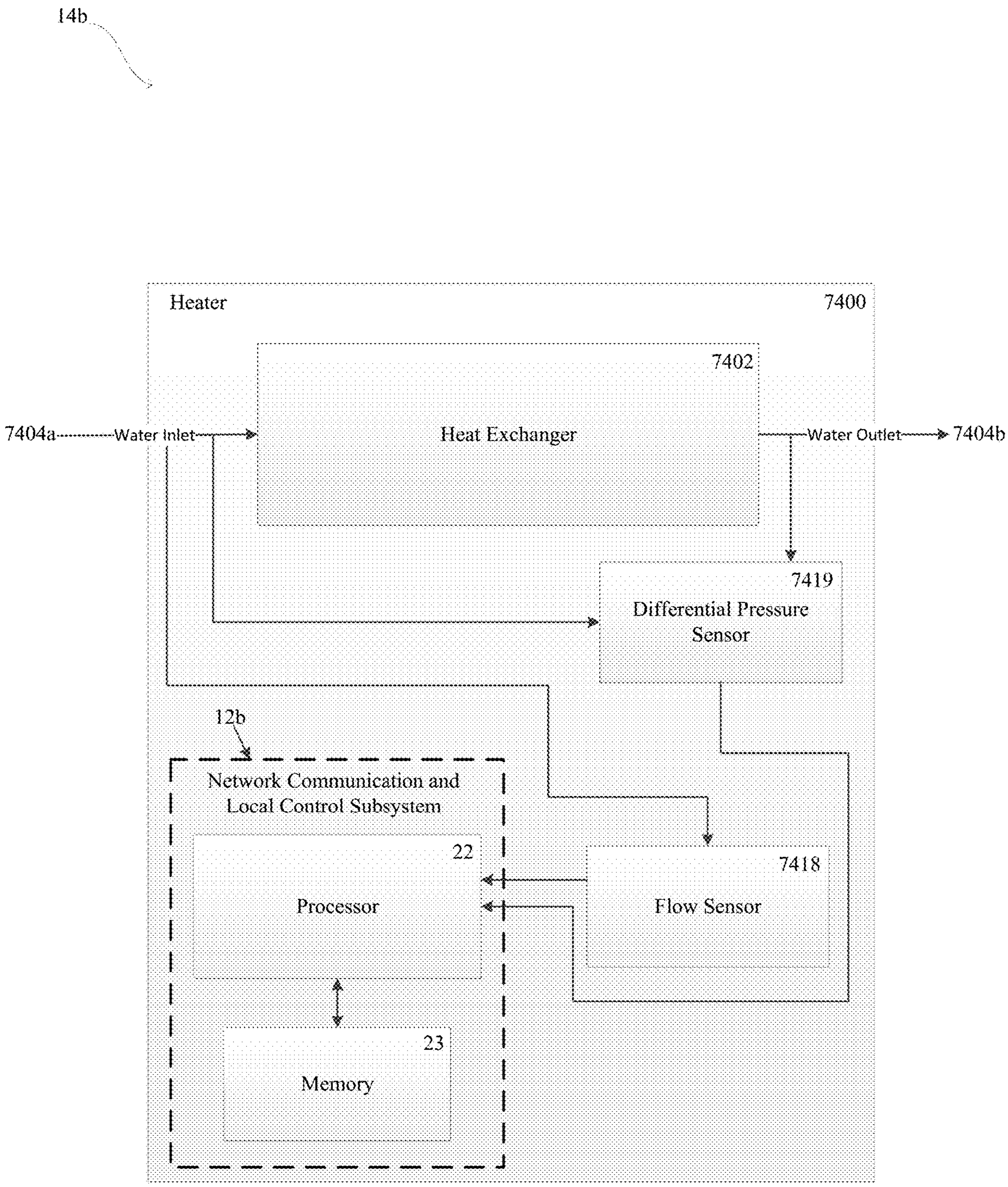
FIG. 77 is a block diagram illustrating components of an embodiment of the heating/cooling system of FIG. 1.

FIG. 77 is a block diagram illustrating components of an embodiment of the heating/cooling system 14*b* of FIG. 1 for ensuring sufficient water flow for proper function of a pool heater by measuring water flow rate via a flow sensor embedded within the pool heater.

A pool heater of a heating/cooling system commonly utilizes a pressure switch to measure the water flow rate and detect if a filter pump is operative. As such, the pool heater can be protected from damage incurred by heating water when the water flow rate is too low. However, pressure switches do not measure water flow rate directly and as such, can incorrectly indicate the water flow rate resulting in damage to the pool heater. The ability to accurately measure the water flow rate via a flow sensor allows for the advanced functionality of and enhanced diagnostics regarding the operation of pool heater and/or a heating/cooling system. As such, the heating/cooling system 14*b* provides for ensuring sufficient water flow for proper function of a pool heater by measuring water flow rate via a flow sensor embedded within the pool heater. Specifically, the heating/cooling system 14 can define at least one predetermined water flow rate threshold which allows for protecting a pool heater from the damage incurred by heating water when the water flow rate is too low. Additionally, the heating/cooling system 14*b* provides a user with enhanced diagnostics regarding the operation of a pool heater and/or a heating/cooling system.

As shown in FIG. 77, the heating/cooling system 14*b* could include a heater 7400 having a water inlet pipe 7404*a*, a water outlet pipe 7404*b*, a heat exchanger 7402, a flow sensor 7418, a pressure sensor 7419, and a network communication and local control subsystem 12*b* ("control subsystem 12*b*") including, but not limited to, a processor 22 and a memory 23. Alternatively, the control subsystem 12*b* could be a hardware processor including a controller in communication with the memory 23, the flow sensor 7418, and/or the pressure sensor 7419.

The water inlet pipe 7404*a* transports water from the pool/spa into the heating/cooling system 14*b* via, for example, a pump or via other means. The water passes through the heater 7400 and into the heat exchanger 7402. The water outlet pipe 7404*b* transports water out from the heating/cooling system 14*b* to, for example, the pool or spa. The flow sensor 7418 measures the water flow rate of the water within the inlet pipe 7404*a*. Alternatively, or in addition to the flow sensor 7418, a pressure sensor 7419 can measure a pressure differential between the water inlet pipe 7404*a* and the water outlet pipe 7404*b*. The heating/cooling system 14*b* provides for defining at least one predetermined minimum water flow rate, or pressure differential, threshold which allows for protecting the heater 7400 from the damage incurred by heating water when the water flow rate, or pressure, is too low.

Referring to FIGS. 1 and 2, the control subsystem 12*b* could include a processor 22 in communication with a memory 23 including at least one of a random-access memory 24 and a non-volatile memory 30. The processor 22 provides local processing capability for the control subsystem 12*b*. The non-volatile memory 30 can store one or more local control programs 30 for providing local control of the pool and spa equipment in which the control subsystem 12*b* is installed. The processor 22 is in communication with the flow sensor 7418 and/or pressure sensor 7419 of the heater 7400. It is noted that the flow sensor 7418 can be a paddle-wheel flow sensor wherein water flow causes the rotation of a paddle wheel which generates an electrical pulse signal whose frequency is proportional to the water flow rate. The flow sensor 7418 can also be of a type other than a paddle-wheel and can be a combination device comprising a flow sensor and a water temperature sensor. The flow sensor 7418 can be connected to and in communication with the heating/cooling system 14*b* and the control subsystem 12*b* via a wired or a wireless connection.

The processor 22 may detect changes and/or problems in the performance of the heater 7400 and control the operation of the heating/cooling system 14*b* based on a measured water flow rate via the flow sensor 7418 relative to at least one predetermined minimum flow rate threshold. The processor 22 can also detect changes and/or problems in the performance of the heater 7400 and control the operation of the heating/cooling system 14*b* based on a measured pressure differential between the water inlet 7404*a* and the water outlet 7404*b* via the pressure sensor 7419 relative to at least one predetermined maximum pressure differential threshold. It is noted that the control subsystem 12*b* may be affixed to, installed within or installed remotely from the heating/cooling system 14*b*. The components of the control subsystem 12*b* are discussed in more detail above in regards to FIG. 2.

Figure 78:
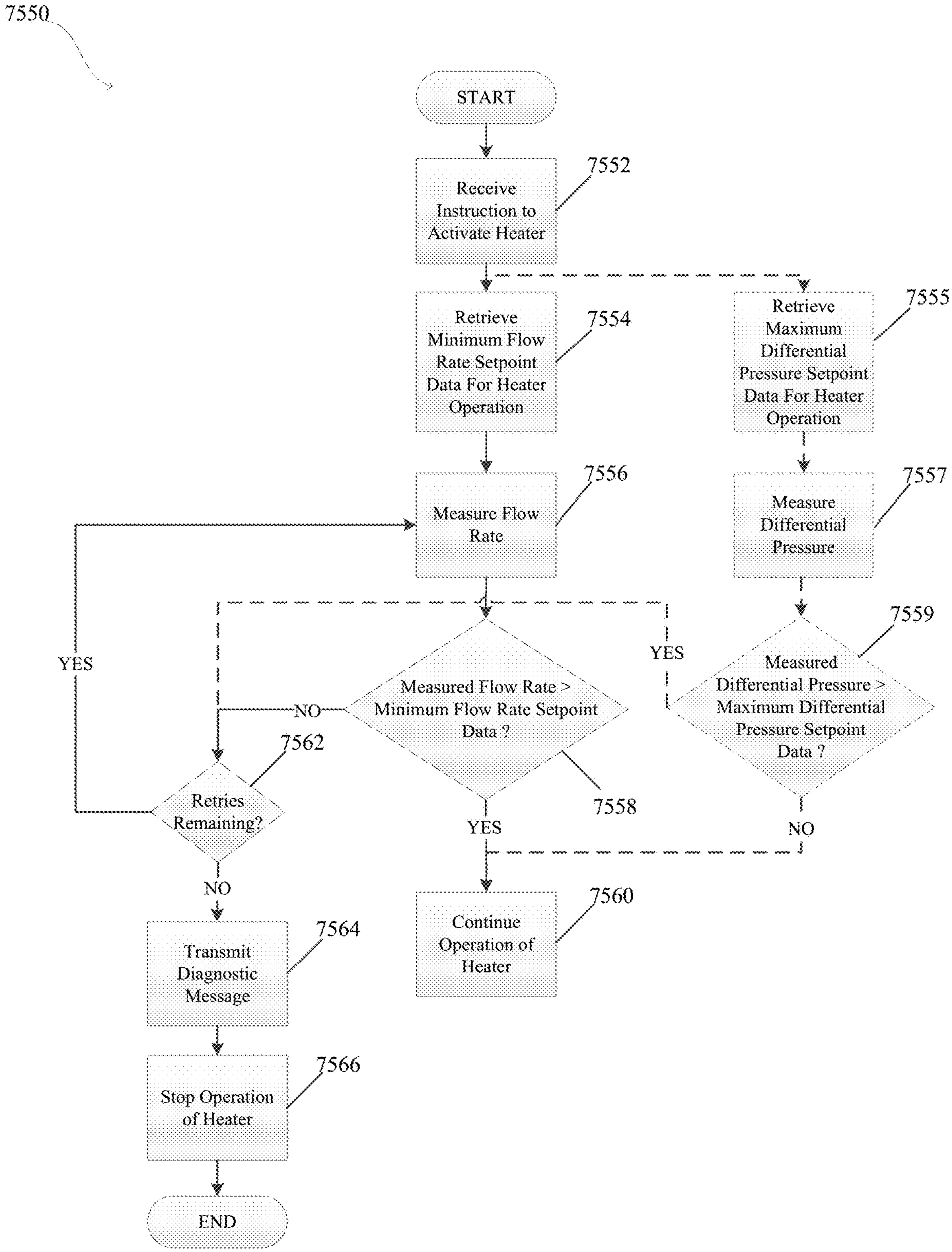
FIG. 78 is a flowchart illustrating processing steps carried out by the heating/cooling system of FIG. 77.

FIG. 78 is a flowchart illustrating the processing steps carried out by the heating/cooling system 14*b* of FIG. 77 for ensuring sufficient water flow for proper function of the heater 7400 by measuring the water flow rate via the flow sensor 7418 embedded within the heater 7400, indicated generally at method 7550. In step 7552, the system 14*b* receives a command to heat the water in the pool or spa and ignites and fires the heater 7400. A user may transmit the command via a remote device or terminal (e.g., smart phone/computer system 20 of FIG. 1) or via a display of the heating/cooling system 14*b* to instruct the heating system 14*b* to heat the water in the pool or spa. Alternatively, the system 14*b* may transmit the command due to a predetermined condition. For example, a user can set a condition for commanding the heating/cooling system 14*b* to activate the heater 7400 (e.g., engage heating functions) at a predetermined time and/or at a predetermined temperature. Those skilled in the art would understand that, in a heating/cooling system or a cooling system, the activation command can also be a command to cool the water in a pool or spa.

In step 7554, the system 14*b* retrieves the minimum flow rate setpoint data for operation of the heater 7400. The setpoint data can be stored in the memory 23 of the heating/cooling system 14*b* or in the cloud. In step 7556, the system 14*b* measures the flow rate of the water within the water inlet pipe 7404*a* via the flow sensor 7418. Then, in step 7558, the system 14*b* determines whether the measured flow rate is greater than the minimum flow rate setpoint data threshold. If the system determines that the measured flow rate is greater than the minimum flow rate setpoint data threshold, then the system 14*b* continues operation of the heater 7400 in step 7560. This allows smaller BTU heaters to function at lower water flow rates while still requiring larger BTU heaters to have higher water flow rates.

Alternatively, if the system determines that the measured flow rate is not greater than the minimum flow rate setpoint data threshold, the process proceeds to step 7562. In step 7562, the system 14*b* determines whether any retries remain for transmitting a command to measure the flow rate via the flow sensor 7418. If at least one retry remains, the system 14*b* transmits a command to measure the flow rate of the water within the water inlet pipe 7404*a* via the flow sensor 7418. However, if no retries remain, then in step 7564, the system 14*b* transmits a diagnostic message indicating insufficient water flow for proper function of the heater 7400.

The heating/cooling system 14*b* provides a user with enhanced diagnostic messages regarding the operation of the heater 7400 and/or the heating/cooling system 14*b* based on the measured flow rate via the flow sensor 7418. For example, the flow sensor 7418 provides the ability to distinguish the difference between a water flow rate that is zero (e.g., a water flow rate indicating that the filter pump is OFF) and a water flow rate that is low (e.g., a water flow rate indicating that the filter pump in ON but that the water flow is too low). As such, the heating/cooling system 14*b* can transmit messages to other network connected pool or spa equipment such as "more flow needed" or "turn pump on so water temperature can be checked" to ensure sufficient water flow for proper function the heater 7400. Additionally, the system 14*b* can transmit the measured water flow rate to other network connected equipment such as a pool or spa automation system.

The diagnostic message can be a report, an alert, etc. The diagnostic message can be transmitted to and displayed by the heating/cooling system 14*b* display or a remote device such as the smart phone/computer system 20. The diagnostic message can include, but is not limited to, a summary of the problem (e.g., insufficient water flow rate), instructions detailing how to troubleshoot the problem, an option to schedule a repair specialist to fix the problem and an override command. Then in step 7566, the system 14*b* stops the operation of the heater 7400 to prevent potential damage to the heater 7400 and the process ends.

According to some embodiments of the present disclosure, the heating/cooling system 14*b* can ensure sufficient water flow for proper function of the heater 7400 by measuring the water flow rate via the differential pressure sensor 7419 embedded within the heater 7400. For example, in step 7555, the system can retrieve a maximum differential pressure setpoint for heater operation. In step 7557, the system measures the differential pressure between the water inlet and outlet pipes. In step 7559, the system determines if the measured differential pressure is greater than the maximum differential pressure setpoint. If a positive determination is made in step 7559, the system proceeds to step 7562, as described herein. If a negative determination is made in step 7559, the system proceeds to step 7560 and continues operation of the heater.

Figure 79:
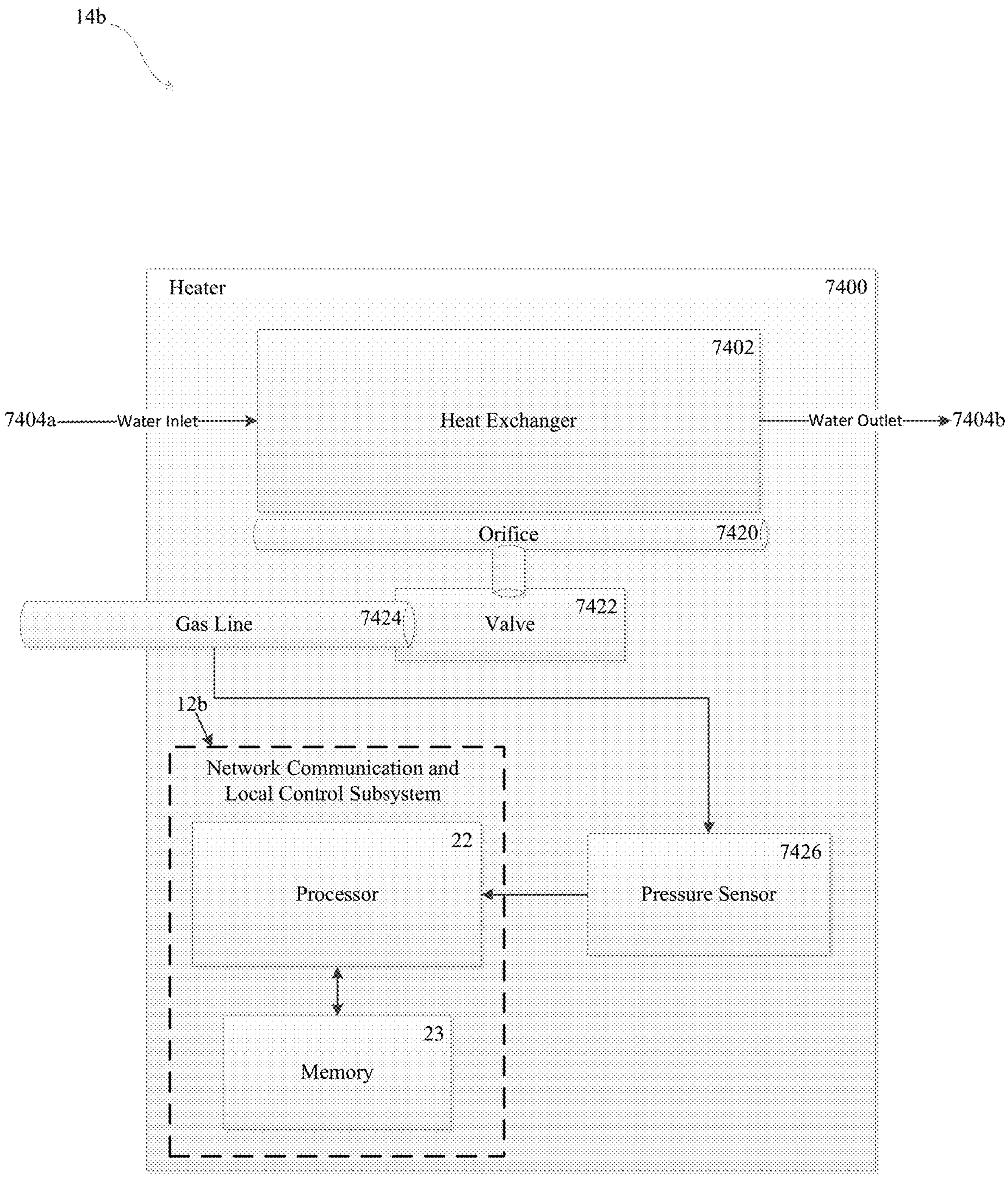
FIG. 79 is a block diagram illustrating components of an embodiment of the heating/cooling system of FIG. 1.

FIG. 79 is a block diagram illustrating components of an embodiment of the heating/cooling system 14*b* of FIG. 1 for ensuring sufficient gas pressure for proper function of a heater by measuring gas pressure via a pressure sensor embedded within the heater.

A gas-fired pool heater requires a minimum gas pressure supplied by a gas utility to function properly. If the pool heater has insufficient gas pressure, then the pool heater can fail to ignite, ignite harshly or exhibit a buildup of soot in the pool heater due to improper fuel/air mixture. Therefore, a pool heater of a heating/cooling system is commonly equipped with a test port that a technician can use to connect a pressure gauge and test for gas pressure. However, gas pressure can vary over time and as such, a point measurement made by a technician may not be representative of the gas pressure at the time of an ignition failure. Therefore, diagnosing a problem with the pool heater pertaining to insufficient gas pressure can be difficult.

The ability to accurately measure gas pressure via a pressure sensor allows for advanced functionality of and enhanced diagnostics regarding the operation of a pool heater and/or a heating/cooling system. For example, the heating/cooling system 14*b* can accurately diagnose a failed ignition due to low gas pressure and can also prevent harsh ignitions and the buildup of soot by monitoring gas pressure. In addition, the heating/cooling system 14*b* can provide a user with enhanced diagnostic messages regarding the operation of a pool heater and/or the heating/cooling system 14*b*.

As shown in FIG. 79, the heating/cooling system 14*b* could include a heater 7400 having a water inlet pipe 7404*a*, a water outlet pipe 7404*b*, a heat exchanger 7402, an orifice 7420, a valve 7422, a gas line 7424, a pressure sensor 7426 and a network communication and local control subsystem 12*b* ("control subsystem 12*b*") including, but not limited to, a processor 22 and a memory 23. Alternatively, the control subsystem 12*b* could be a hardware processor including a controller in communication with the memory 23 and the pressure sensor 7426.

The water inlet pipe 7404*a* transports water from the pool/spa into the heating/cooling system 14*b* via, for example, a pump or via other means. The water passes through the heater 7400 and into the heat exchanger 7402. The water outlet pipe 7404*b* transports water out from the heating/cooling system 14*b* to, for example, the pool or spa. The pressure sensor 7426 measures the gas pressure within the gas line 7424. Gas enters the heater 7400 via the gas line 7424 and valve 7422. The gas is ignited and provides heat through the orifice 7420. The heating/cooling system 14*b* provides for ensuring sufficient gas pressure for proper function of the heater 7400 by measuring gas pressure within the gas line 7424 via the pressure sensor 7424. Additionally, the heating cooling system 14*b* provides a user with enhanced diagnostic messages regarding the operation of the heater 7400 and/or the heating/cooling system 14*b*.

Referring to FIGS. 1 and 2, the control subsystem 12*b* could include a processor 22 in communication with a memory 23 including at least one of a random-access memory 24 and a non-volatile memory 30. The processor 22 provides local processing capability for the control subsystem 12*b*. The non-volatile memory 30 can store one or more local control programs 30 for providing local control of the pool and spa equipment in which the control subsystem 12*b* is installed. The processor 22 is in communication with the pressure sensor 7426 of the heater 7400. It is noted that the pressure sensor 7426 may also be referred to as a pressure transducer, a pressure transmitter, a pressure indicator, a piezometer and a manometer and could be one of an absolute pressure sensor, a gauge pressure sensor, a vacuum pressure sensor, a differential pressure sensor, a sealed pressure sensor or any other type of pressure sensing device. The pressure sensor 7426 can be connected to and in communication with the heating/cooling system 14*b* and the control subsystem 12*b* via a wired or a wireless connection.

The processor 22 may detect changes and/or problems in the performance of the heater 7400 and control the operation of the heating/cooling system 14*b* based on a measured gas pressure within the gas line 7424 via the pressure sensor 7426 relative to at least one predetermined minimum gas pressure threshold. It is noted that the control subsystem 12*b* may be affixed to, installed within or installed remotely from the heating/cooling system 14*b*. The components of the control subsystem 12*b* are discussed in more detail above in regards to FIG. 2.

Figure 80:
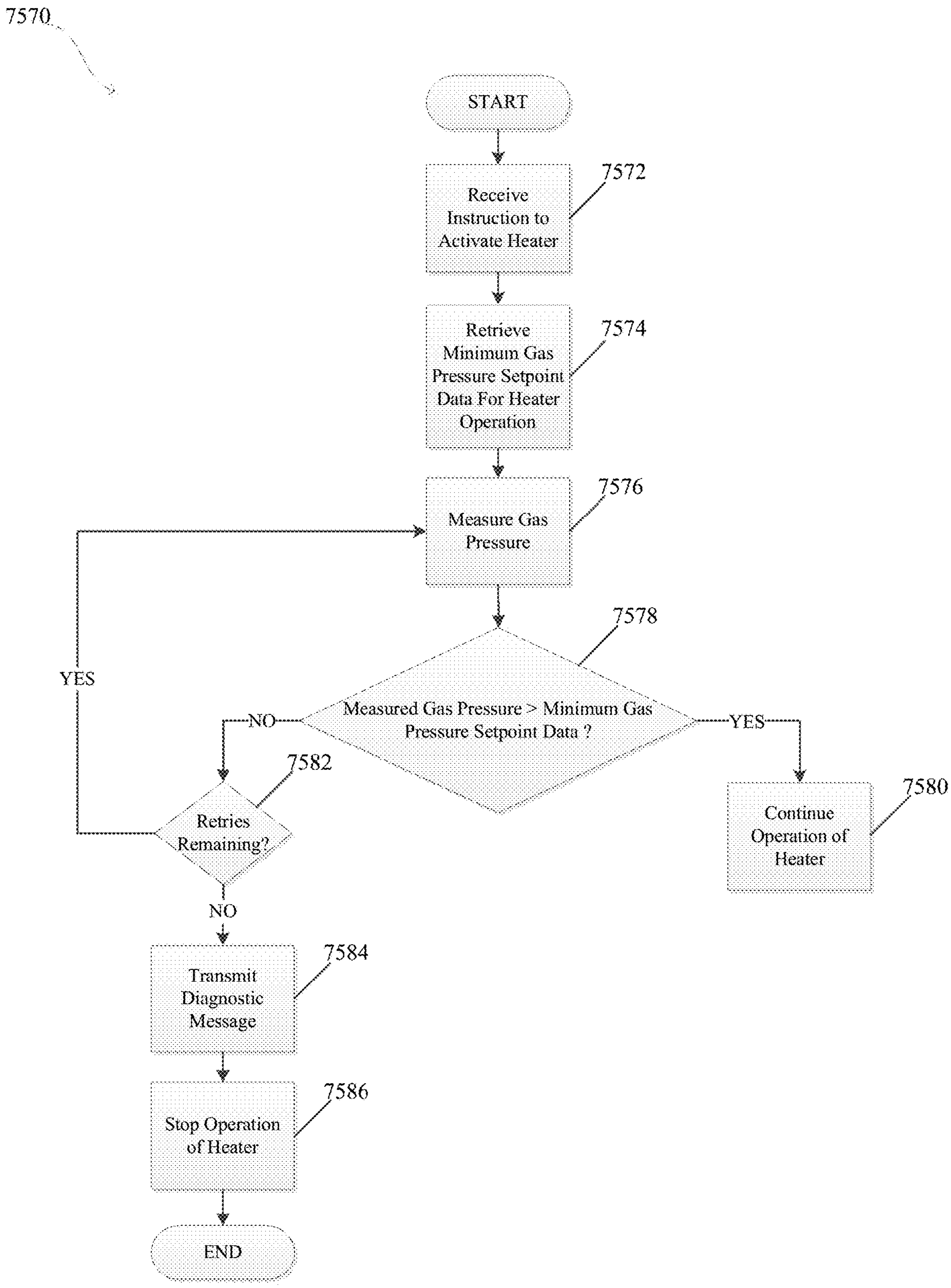
FIG. 80 is a flowchart illustrating processing steps carried out by the heating/cooling system of FIG. 79.

FIG. 80 is a flowchart illustrating the processing steps carried out by the heating/cooling system 14*b* of FIG. 79 for ensuring sufficient gas pressure for proper function of the heater 7400 by measuring gas pressure within the gas line 7424 via the pressure sensor 7424 embedded within the heater 7400, indicated generally at method 7570.

In step 7572, the system 14*b* receives a command to heat the water in the pool or spa and ignites and fires the heater 7400. A user may transmit the command via a remote device or terminal (e.g., smart phone/computer system 20 of FIG. 1) or via a display of the heating/cooling system 14*b* to instruct the heating system 14*b* to heat the water in the pool or spa. Alternatively, the system 14*b* may transmit the command due to a predetermined condition. For example, a user can set a condition for commanding the heating/cooling system 14*b* to activate the heater 7400 (e.g., engage heating functions) at a predetermined time and/or at a predetermined temperature. Those skilled in the art would understand that, in a heating/cooling system or a cooling system, the activation command can also be a command to cool the water in a pool or spa.

In step 7574, the system 14*b* retrieves the minimum gas pressure setpoint data for the operation of the heater 7400. The data can be stored in the memory 23 of the heating/cooling system 14*b* or in the cloud. In step 7576, the system 14*b* measures the gas pressure of the gas within the gas line 7424 via the pressure sensor 7426. Then, in step 7578, the system 14*b* determines whether the measured gas pressure is greater than the minimum gas pressure setpoint data threshold. If the system determines that the measured gas pressure is greater than the minimum gas pressure setpoint data threshold, then the system 14*b* continues operation of the heater 7400 in step 7580.

Alternatively, if the system determines that the measured gas pressure is not greater than the minimum gas pressure setpoint data threshold, then the process proceeds to step 7582.

In step 7582, the system 14*b* determines whether any retries remain for transmitting a command to measure the gas pressure within the gas line 7424 via the pressure sensor 7426. If at least one retry remains, then the system 14*b* transmits a command to measure the gas pressure within the gas line 7424 via the pressure sensor 7426. However, if no retries remain, then in step 7584, the system 14*b* transmits a diagnostic message indicating insufficient gas pressure for the proper function of the heater 7400.

Additionally, the heating/cooling system 14*b* provides a user with enhanced diagnostic messages regarding the operation of the heater 7400 and/or the heating/cooling system 14*b* based on the measured gas pressure within the gas line 7424 via the pressure sensor 7426. For example, the pressure sensor 7426 provides the ability to distinguish the difference between a gas pressure that is zero (e.g., a gas pressure indicating that the gas line is CLOSED) and a gas pressure that is low (e.g., a gas pressure indicating that the gas line is OPEN but that the gas pressure is too low).

The diagnostic message can be a report, an alert, etc. The diagnostic message can be transmitted to and displayed by the heating/cooling system 14*b* display or a remote device such as the smart phone/computer system 20. The diagnostic message can include, but is not limited to, a summary of the problem (e.g., insufficient gas pressure), instructions detailing how to troubleshoot the problem, an option to schedule a repair specialist to fix the problem and an override command. Then in step 7586, the system 14*b* stops the operation of the heater 7400 to prevent potential damage to the heater 7400 and the process ends.

Figure 81:
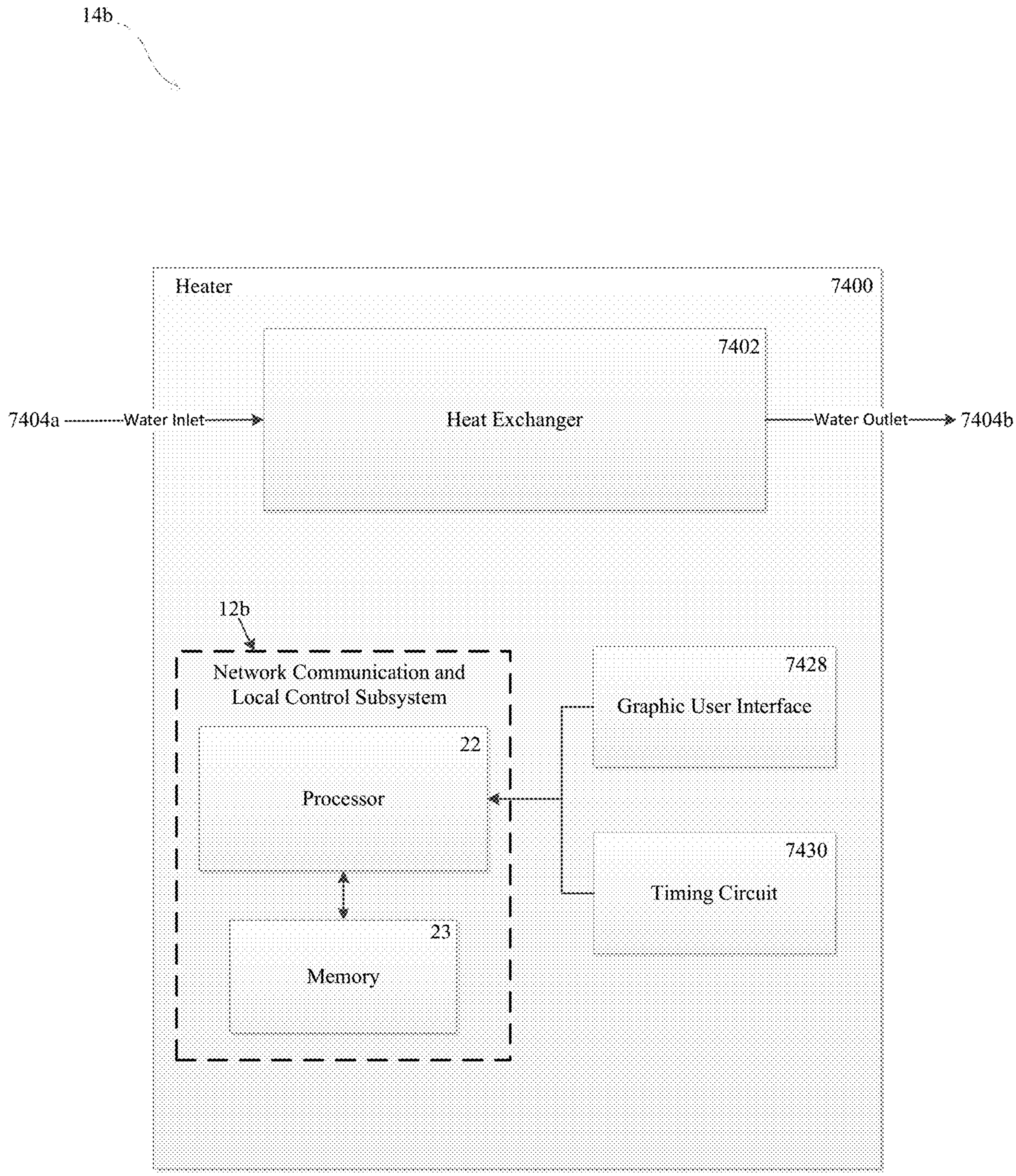
FIG. 81 is a block diagram illustrating components of an embodiment of the heating/cooling system of FIG. 1.

FIG. 81 is a block diagram illustrating components of an embodiment of the heating/cooling system 14*b* of FIG. 1 for setting various threshold limits with respect to energy consumption via a graphic user interface of the heating/cooling system 14*b* and receiving alerts when energy consumption exceeds the set various threshold limits.

A heater generally consumes a large amount of energy to heat a pool and/or spa. Therefore, a user of a pool and/or spa may only heat the pool and/or spa when necessary. However, a user may inadvertently forget to turn the heater off after using the pool and/or spa or a third party (e.g., a house guest) may heat the pool and/or spa when the user is away from the pool and/or spa resulting in unexpectedly high energy consumption and utility bills. The ability to configure a heater of a heating/cooling system to set various threshold limits with respect to energy consumption via a graphic user interface and to receive alerts when energy consumption exceeds the set various threshold limits allows for responsible use of the heater and minimizing the operation costs thereof.

As shown in FIG. 81, the heating/cooling system 14*b* could include a heater 7400 having a water inlet pipe 7404*a*, a water outlet pipe 7404*b*, a heat exchanger 7402, a graphic user interface 7428, a timing circuit 7430 and a network communication and local control subsystem 12*b* ("control subsystem 12*b*") including, but not limited to, a processor 22 and a memory 23. Alternatively, the control subsystem 12*b* could be a hardware processor including a controller in communication with the memory 23, the graphic user interface 7428 and the timing circuit 7430.

The water inlet pipe 7404*a* transports water from the pool/spa into the heating/cooling system 14*b* via, for example, a pump or via other means. The water passes through the heater 7400 and into the heat exchanger 7402. The water outlet pipe 7404*b* transports water out from the heating/cooling system 14*b* to, for example, the pool or spa. The graphic user interface 7428 allows a user to configure the heater 7400 of the heating/cooling system 14*b* by setting various threshold limits with respect to energy consumption. The heating/cooling system 14*b* controls an operation of the heater 7400 based on the inputs to the graphic user interface 7428 and the timing circuit 7430 logic. Additionally, the heating/cooling system 14*b* provides the user with alerts when energy consumption exceeds the set various threshold limits.

Referring to FIGS. 1 and 2, the control subsystem 12*b* could include a processor 22 in communication with a memory 23 including at least one of a random-access memory 24 and a non-volatile memory 30. The processor 22 provides local processing capability for the control subsystem 12*b*. The non-volatile memory 30 can store one or more local control programs 30 for providing local control of the pool and spa equipment in which the control subsystem 12*b* is installed. The processor 22 is in communication with the graphic user interface 7428 and the timing circuit 7430 of the heater 7400. It is noted that the control subsystem 12*b* may be affixed to, installed within or installed remotely from the heating/cooling system 14*b*. The components of the control subsystem 12*b* are discussed in more detail above in regards to FIG. 2.

Figure 82:
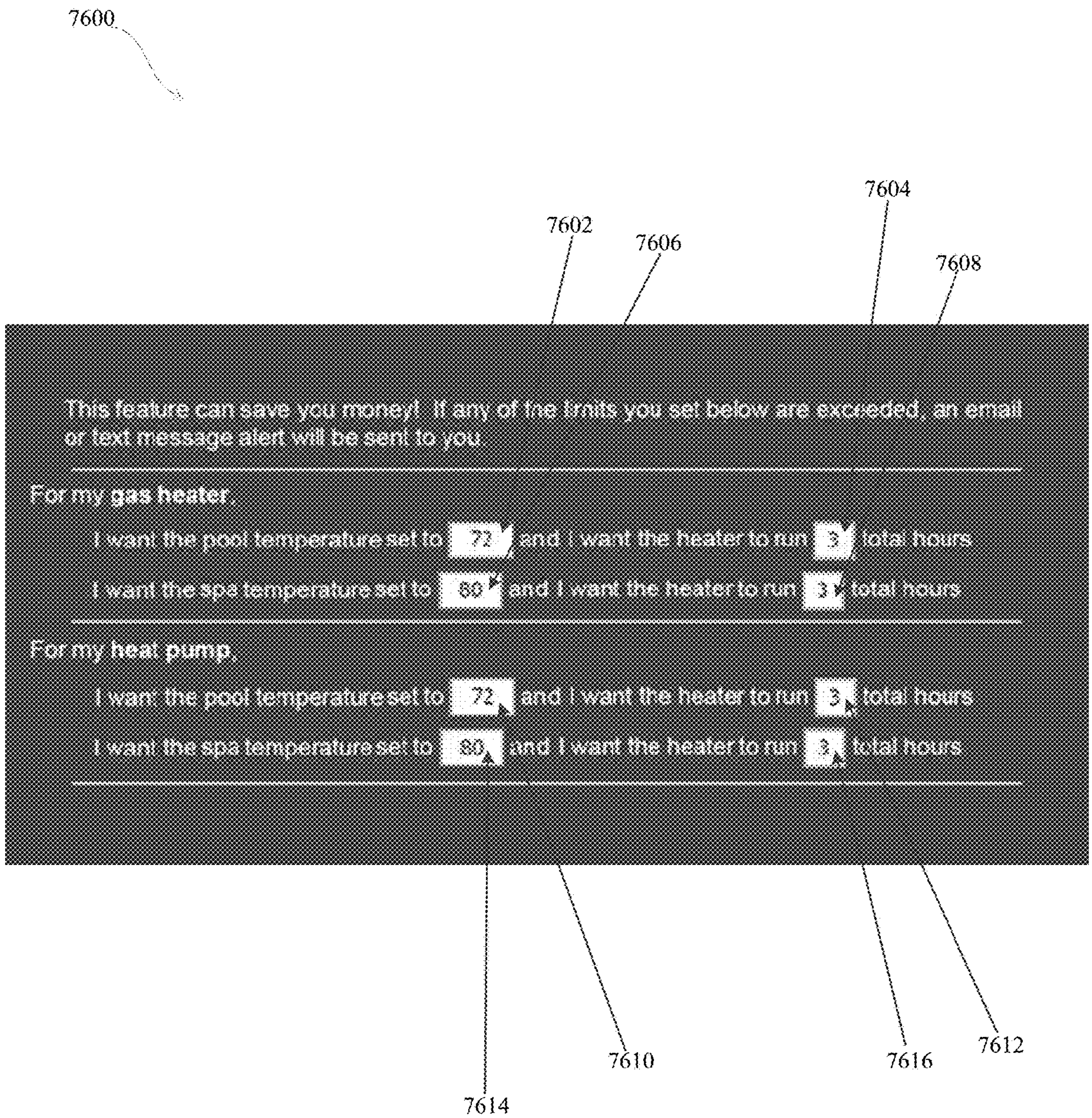
FIGS. 82-83 are user interface screens generated by the heating/cooling system of FIG. 81.
Figure 83:
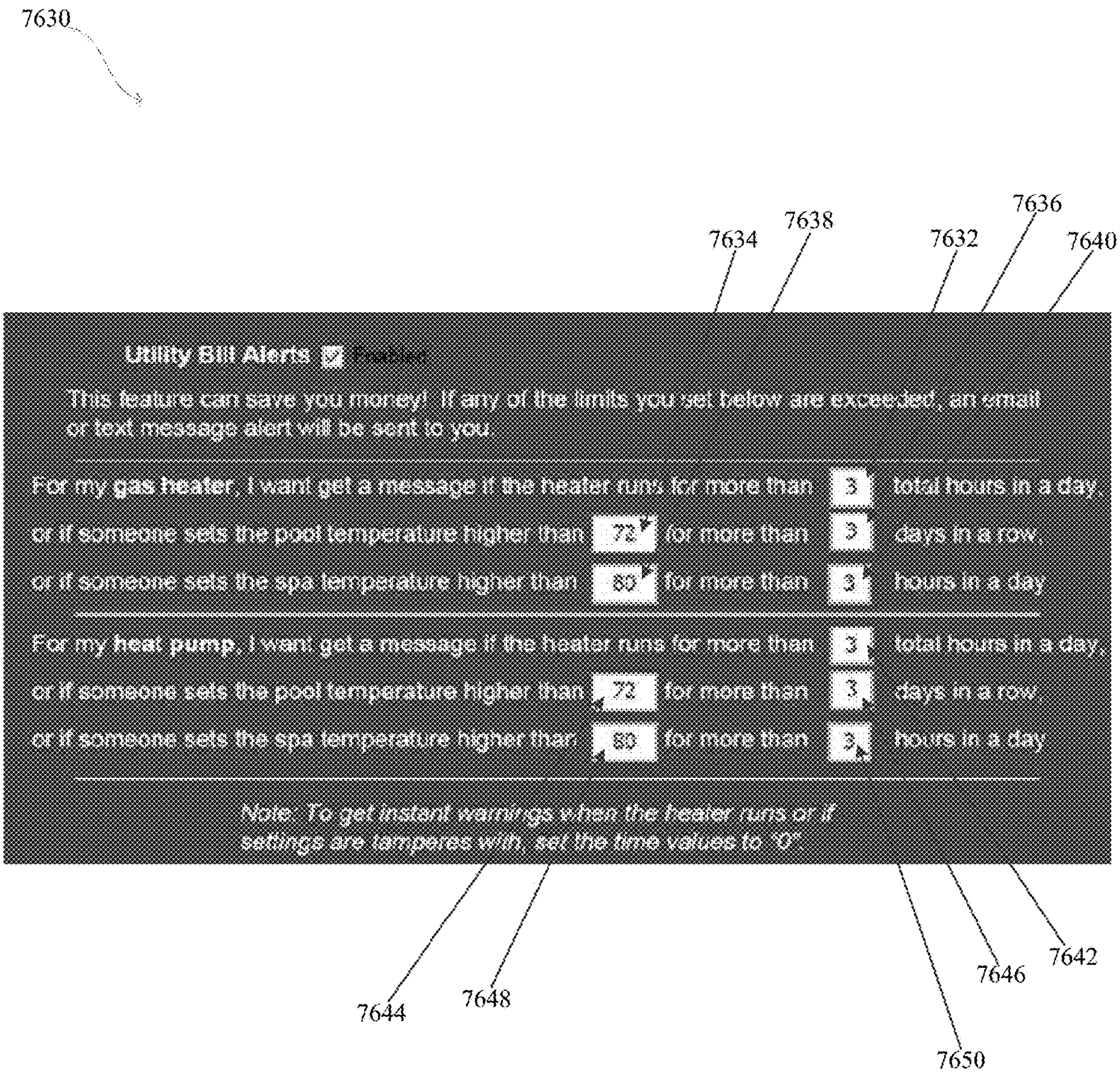

FIGS. 82-83 are user interface screens 7600 and 7630 generated by the heating/cooling system 14*b* of FIG. 81. Referring to FIG. 82, the interface screen 7600 allows a user to configure the settings of the heater 7400. For example, input fields 7602, 7606, 7610 and 7614 allow the user to set a temperature of the pool or spa for either a gas heater or a heat pump. In addition, input fields 7604, 7608, 7612 and 7616 allow the user to set a total run time of the gas heater or the heat pump. The heating/cooling system 14*b* can also allow the user to restrict the function of the heater 7400 under certain conditions. According to some embodiments of the present disclosure, the heating/cooling system 14*b* can include one or more "adaptive" or "economy" modes, which the user can select, configure, and/or enable using one or more interface screens (not shown) generated by the heating/cooling system 14*b* and displayed on the graphical user interface 7428. For example, the "adaptive" or "economy" modes can minimize energy consumption while maintaining user comfort by automatically lowering the temperature setpoint of the pool or spa (thereby reducing energy demand on the heater 14*b*) when the ambient outdoor temperature is warmer and by automatically raising the temperature setpoint of the pool or spa when the ambient outdoor temperature is colder. The temperature setpoint can be modified continuously based on a current temperature differential (e.g., the difference between the current ambient temperature and a user specified water temperature) or the temperature setpoint can be modified once the current ambient temperature crosses one or more predetermined thresholds. When enabled by the user, the "adaptive" or "economy" modes can increase the efficiency of the heater 14*b* by 2% or more. Referring to FIG. 83, the interface screen 7630 allows a user to configure the heater 7400 to receive an alert when energy consumption exceeds set threshold limits under certain conditions. For example, input field 7632 allows the user to receive an alert when a gas heater runs for more than a set number of total hours in a day. Additionally, input fields 7634, 7636 and 7638, 7640 respectively allow the user to receive an alert when the pool temperature is set higher than a temperature threshold for more than a particular number of days in a row for the gas heater and when the spa temperature is set higher than a temperature threshold for more than a particular number of hours in a day for the gas heater.

Similarly, input fields 7642, 7644, 7646, 7648 and 7650 allow the user to receive alerts when energy consumption exceeds set threshold limits under certain conditions for the heat pump. For example, input field 7642 allows the user to receive an alert when the heat pump runs for more than a set number of total hours in a day. Additionally, input fields 7644, 7646 and 7648, 7650 respectively allow the user to receive an alert when the pool temperature is set higher than a temperature threshold for more than a particular number of days in a row for the heat pump and when the spa temperature is set higher than a temperature threshold for more than a particular number of hours in a day for the heat pump.

The alert can be a notification and can be transmitted to and displayed by the heating/cooling system 14*b* display or a remote device such as the smart phone/computer system 20. The alert can include, but is not limited to, an energy consumption report, an estimated utility bill and/or an override command.

Figure 84:
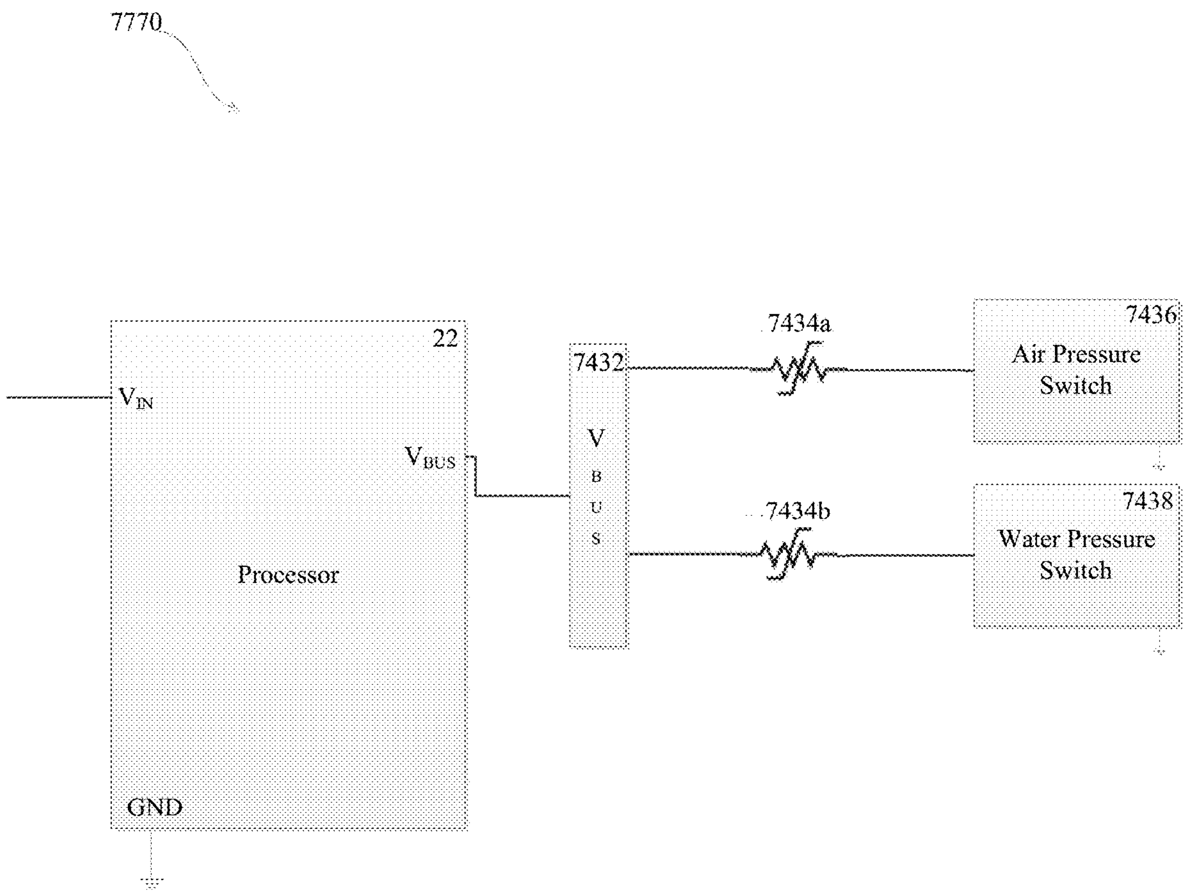
FIG. 84 is a block diagram illustrating a component schematic capable of being implemented in an embodiment of the heating/cooling system of FIG. 1.

FIG. 84 is a block diagram 7770 illustrating a component schematic capable of being implemented in an embodiment of the heating/cooling system 14*b* of FIG. 1 for detecting electrical short circuits and resetting circuit protection.

Generally, a pool heater utilizes various switching devices to detect the proper function thereof. For example, a pool heater can use a bimetal switch to protect against over-temperature conditions, an air pressure switch to ensure a fan is functioning properly, a water pressure switch to ensure a water pump is functioning properly, etc. Typically, a control system of the pool heater passes an amount of current through these switches to check their operational state (i.e., the control system polls a status of the switches). However, polling the status of these switches in this manner is problematic because a ground short on the wires thereof can damage the control system, a transformer and/or a fuse of the pool heater.

Therefore, an embodiment of the heating/cooling system 14*b* implements a method of polling the status of switching and/or sensing devices to detect electrical shorts and reset circuit protection by using at least one polymeric positive temperature coefficient (PPTC) embedding within a heater. A PPTC device is a resettable fuse and is positioned between a control module (e.g., a processor) and a switching or sensing device. For example, as shown in FIG. 84, the PPTC 7434*a* is positioned between the processor 22 and an air pressure switch 7436 and the PPTC device 7434*b* is positioned between the processor 22 and a water pressure switch

7438. The PPTC devices 7434a and 7434b may be directly coupled to the processor 22 or indirectly coupled to the processor 22 via a Vbus 7432. As such, the heating/cooling system 14b can accurately detect a problem causing high current while simultaneously protecting itself from damage. Once the detected electrical short is removed or the defective switching or sensing device is removed, normal operation of the heating/cooling system 14b can resume.

Figure 85:
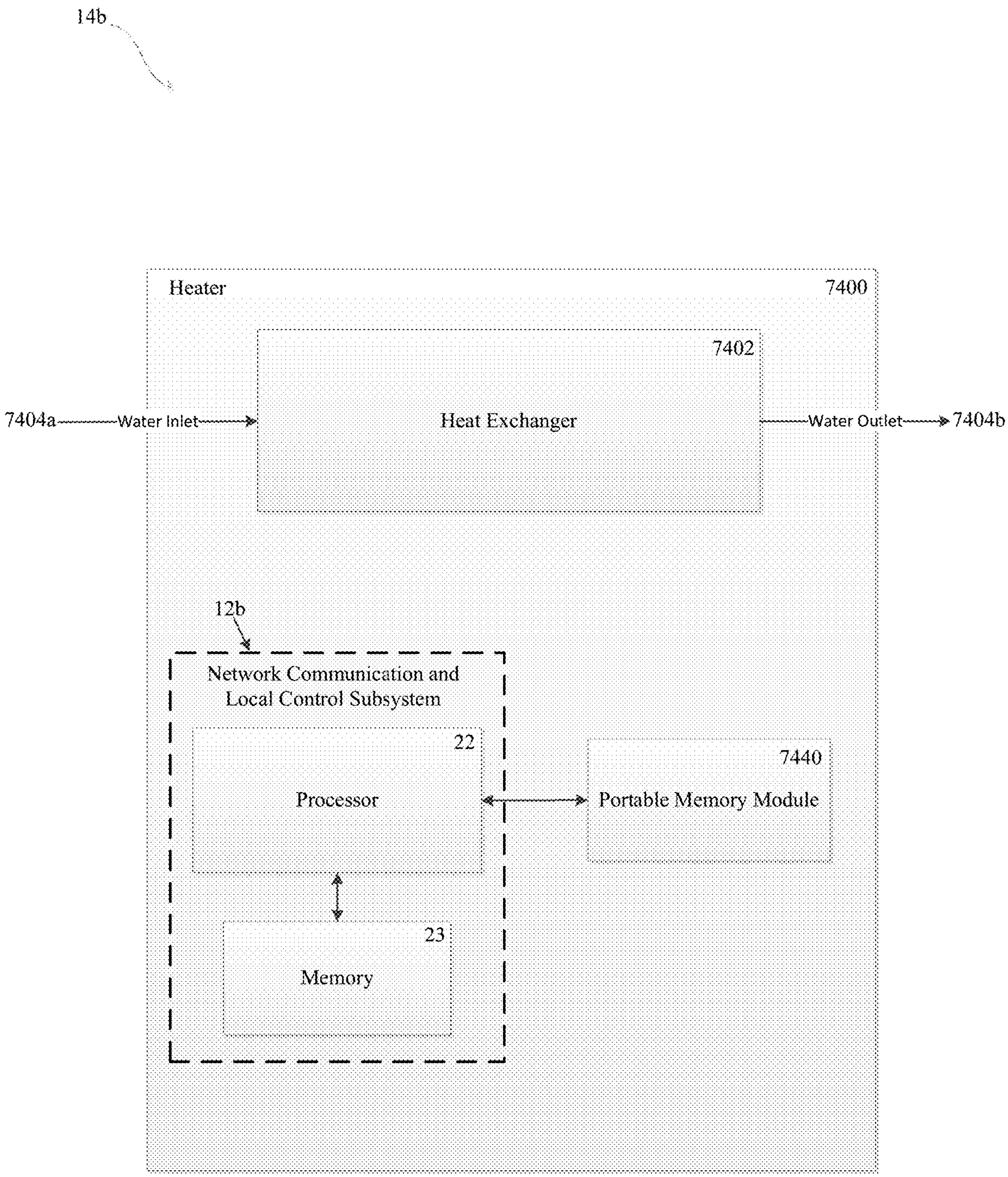
FIG. 85 is a block diagram illustrating components of an embodiment of the heating/cooling system of FIG. 1.

FIG. 85 is a block diagram illustrating components of an embodiment of the heating/cooling system 14b of FIG. 1 for enabling the simplified setup of replacement components via a removable memory module storing configuration data of a heater of the heating/cooling system 14b.

Pool heater control systems have advanced such that it is necessary to incorporate more setting and configuration data and values into the control system to ensure the proper function of the pool heater. Settings such as the pool heater model number, the serial number, the BTU output, the minimum ambient temperature, the minimum water flow rate, etc. are set by the manufacturer when the pool heater is manufactured. In contrast, other settings such as a user's favorite temperature settings, preset run durations, temperature unit, maximum allowed temperature settings, pool size, etc. are set in the field when the pool heater is installed. All of these settings must be manually re-entered if it becomes necessary to replace a faulty circuit board of the pool heater. For example, a memory module in a service replacement circuit board is specially coded to indicate that it has never been configured for a specific pool heater. Therefore, after being powered ON for the first time, a user is prompted to enter the setting and configuration data and values for the pool heater to ensure that the pool heater functions properly.

As such, the heating/cooling system 14b enables the simplified setup of a replacement circuit board via a removable memory module storing configuration data of a heater of the heating/cooling system 14b. As shown in FIG. 85, the heating/cooling system 14b could include a heater 7400 having a water inlet pipe 7404a, a water outlet pipe 7404b, a heat exchanger 7402, a portable memory module 7440 and a network communication and local control subsystem 12b ("control subsystem 12b") including, but not limited to, a processor 22 and a memory 23. Alternatively, the control subsystem 12b could be a hardware processor including a controller in communication with the memory 23 and the portable memory module 7440.

The water inlet pipe 7404a transports water from the pool/spa into the heating/cooling system 14b via, for example, a pump or via other means. The water passes through the heater 7400 and into the heat exchanger 7402. The water outlet pipe 7404b transports water out from the heating/cooling system 14b to, for example, the pool or spa. The portable memory module 7440 plugs into a circuit board of the heating/cooling system 14b (not shown) and stores the configuration data of the heater 7400 of the heating/cooling system 14b.

Referring to FIGS. 1 and 2, the control subsystem 12b could include a processor 22 in communication with a memory 23 including at least one of a random-access memory 24 and a non-volatile memory 30. The processor 22 provides local processing capability for the control subsystem 12b. The non-volatile memory 30 can store one or more local control programs 30 for providing local control of the pool and spa equipment in which the control subsystem 12b is installed. The processor 22 is in communication with the portable memory module 7440 of the heater 7400. The portable memory module 7440 can be connected to and in communication with the heating/cooling system 14b and the control subsystem 12b via a wired or a wireless connection. When a replacement circuit board is installed, the portable memory module 7440 can instantly configure the replacement circuit board by being removed from the circuit board and plugged into the replacement circuit board. Additionally, the portable memory module 7740 can be used to store diagnostic event history, enabling the history to stay with the heater 7400 when the replacement circuit board is installed.

It is noted that the control subsystem 12b may be affixed to, installed within or installed remotely from the heating/cooling system 14b. The components of the control subsystem 12b are discussed in more detail above in regards to FIG. 2.

As discussed above, FIGS. 73-85 illustrate components of embodiments of the heating/cooling system 14b of FIG. 1 and processing steps carried out by the embodiments of the heating/cooling system 14b. FIG. 1 illustrates the overall system of the present disclosure, indicated generally at 10. The system 10 includes, but is not limited to, a plurality of network communication and local control subsystems 12a-h which could be installed in or connected to a plurality of pool and spa equipment 14a-h, so as to provide network connectivity and remote monitoring and control of the pool and spa equipment 14a-h. The pool and spa equipment could include, but is not limited to, a pump 14a, the heating/cooling system 14b, a sanitization system 14c, a water feature/miscellaneous subsystem 14d, a valve actuator/valve position 14e, a pool/spa control system 14f, a cleaner 14g and a lighting system 14h.

The control subsystems 12a-12h could communicate with each other over a network 16, which could include, but is not limited to, the Internet. The control subsystems 12a-12h provide "Internet-of-Things" functionality for the plurality of pool and spa equipment 14a-14h. It is noted that control subsystems 12a-12h could further include a "big data" subsystem, subsystems for receiving input from manufacturers/factories, subsystems for receiving external data/input (e.g., data from the Internet), and subsystems for receiving input from customers. Additionally and as discussed above, the control subsystems 12a-12h could include control logic for allowing each of the pool and spa equipment 14a-14h to interact with each other (e.g., to exchange data and commands for controlling each other), as well as to be remotely controlled by another system such as a remote server, a "cloud" based control system, a remote computer system, a smart device (e.g., smart phone, smart speaker, smart chip embedded in the body), etc., and combinations thereof. It is noted that, as described herein, the heating/cooling system 14b may also describe, or be described as, a heater, a cooling system, cooler, or any combination thereof Each of the pool and spa equipment 14a-14h can further include a display, such as a touchscreen, a screen with a touchpad, etc.

Additionally, as can be seen in FIG. 1, the control subsystems 12a-12h could also communicate with one or more servers 18, and/or with one or more smart devices 20 (e.g., a phone, a tablet, a computer system, etc.), via the network 16. Still further, an on-site control processor 19 could be in communication with the various systems shown in FIG. 1. The on-site control processor 19 could be a pool/spa control system installed at the location of a pool or spa, a reduced-functionality pool/spa control system, or another type of control system.

As discussed below in connection with FIGS. 86-91, the systems and methods are discussed with reference to a swimming pool and/or a spa. However, it should be understood that systems and methods of the present disclosure can be used with any body of liquid, including but not limited to, bathtubs, water tanks, etc. It should further be noted that the system and methods will be discussed below with reference to a heating system. However, it should be understood that the systems and methods of the present disclosure can also be used with a cooling system or a heating/cooling system. As such, examples and embodiments for cooling systems will also be described below.

Figure 86:
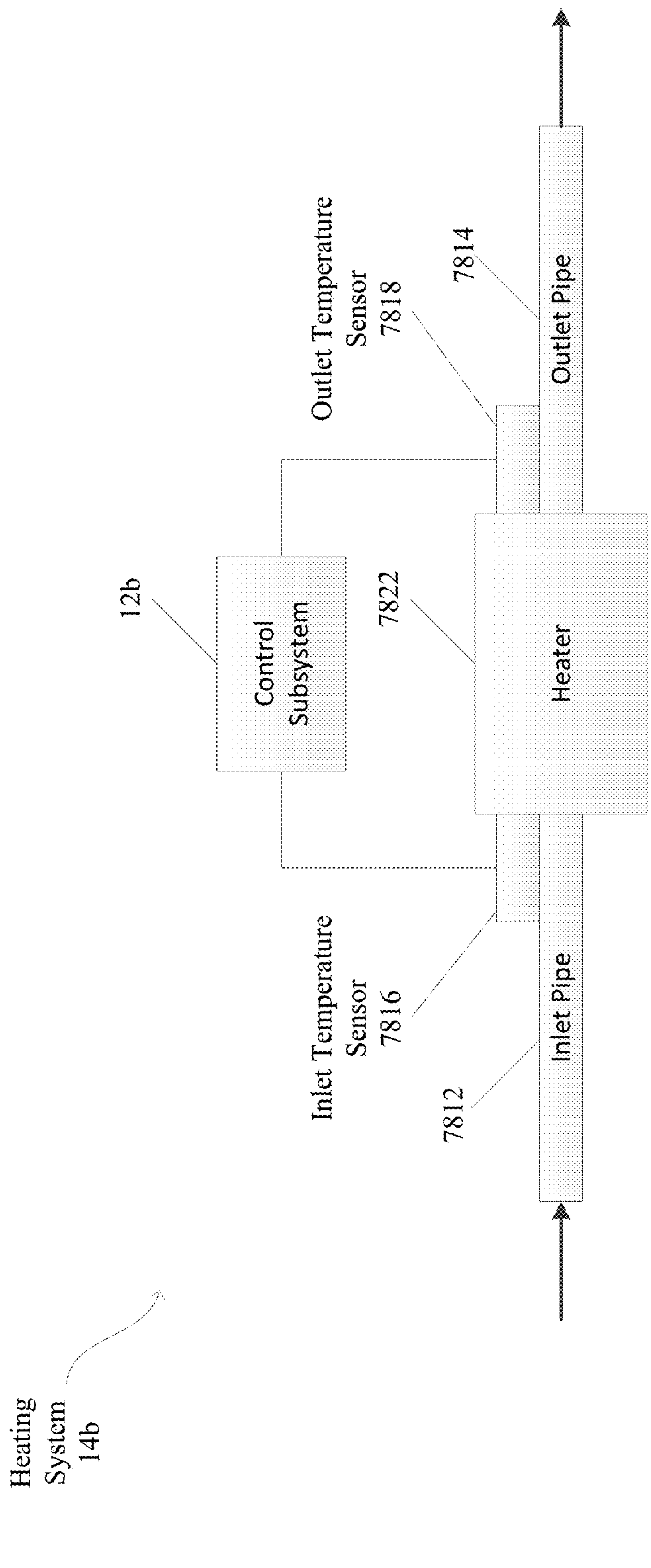
FIG. 86 is a diagram illustrating an embodiment of the heating/cooling system of FIG. 1.

FIG. 86 is a diagram illustrating components of the heating system 14*b* of FIG. 1 of the present disclosure. The heating system 14*b* includes an inlet pipe 7812, an outlet pipe 7814, an inlet temperature sensor 7816, an outlet temperature sensor 7818, a network communication and local control subsystem 12*b* ("control subsystem 12*b*"), described in connection with FIGS. 1 and 2, and a heater 7822. The inlet pipe 7812 transports water from the pool/spa into the heating system 14*b* via, for example, a water pump or other means. The inlet temperature sensor 7816 measures the temperature of the water before the water enters the heater 7822. The outlet pipe 7814 transports water out from the heater 7822 to, for example, the pool or spa. The outlet temperature sensor 7818 measures the temperature of the water after the water leaves the heater 7822. The inlet temperature sensor 7816 and the outlet temperature sensor 7818 can be one or more of a negative temperature coefficient thermistor, a resistance temperature detector, a thermocouple, a semiconductor-based sensor, a thermometer, or any other type of temperature sensing device. The inlet temperature sensor 7816 and the outlet temperature sensor 7818 can be connected to and in communication with the heater 7822 and the control subsystem 12*b* via a wired or a wireless connection. It should be understood that the inlet temperature sensor 7816 can be positioned anywhere along the inlet pipe 7812, the heater 7822, a pump, or along other inlet components. Further, it should be understood that the outlet temperature sensor 7818 can be positioned anywhere along the outlet pipe 7814, the heater 7822 or along other outlet components.

As described in connection with FIGS. 1 and 2, the control subsystem 12*b* could include a processor in communication with a memory including at least one of a random-access memory and a non-volatile memory. The processor provides local processing capability for the control subsystem 12*b*. The non-volatile memory can store one or more local control programs for providing local control of the pool and spa equipment in which the control subsystem 12*b* is installed. The processor is in communication with the inlet temperature sensor 7816, outlet temperature sensor 7818, and the heater 7822.

The processor can detect changes in the performance of the heating system 14*b* and control the operation of the heating system 14*b* based on a calculated difference between temperature measurements taken by the inlet temperature sensor 7816 and the outlet temperature sensor 7818. It is noted that the control subsystem 12*b* can be affixed to, installed within, or located remotely from the heater 7822. The components of the control subsystem 12*b* are discussed in more detail in regards to FIGS. 1 and 2.

The heating system 14*b* can further include a display, such as a touchscreen, a screen with a touchpad, etc. The display can be affixed to, installed within or installed remotely from the heater 7822. The display can receive user input via, for example, the touch screen, a keyboard, a remote or wireless signal, etc. The display can further show diagnostic issues, messages, instructions, etc.

Figure 87:
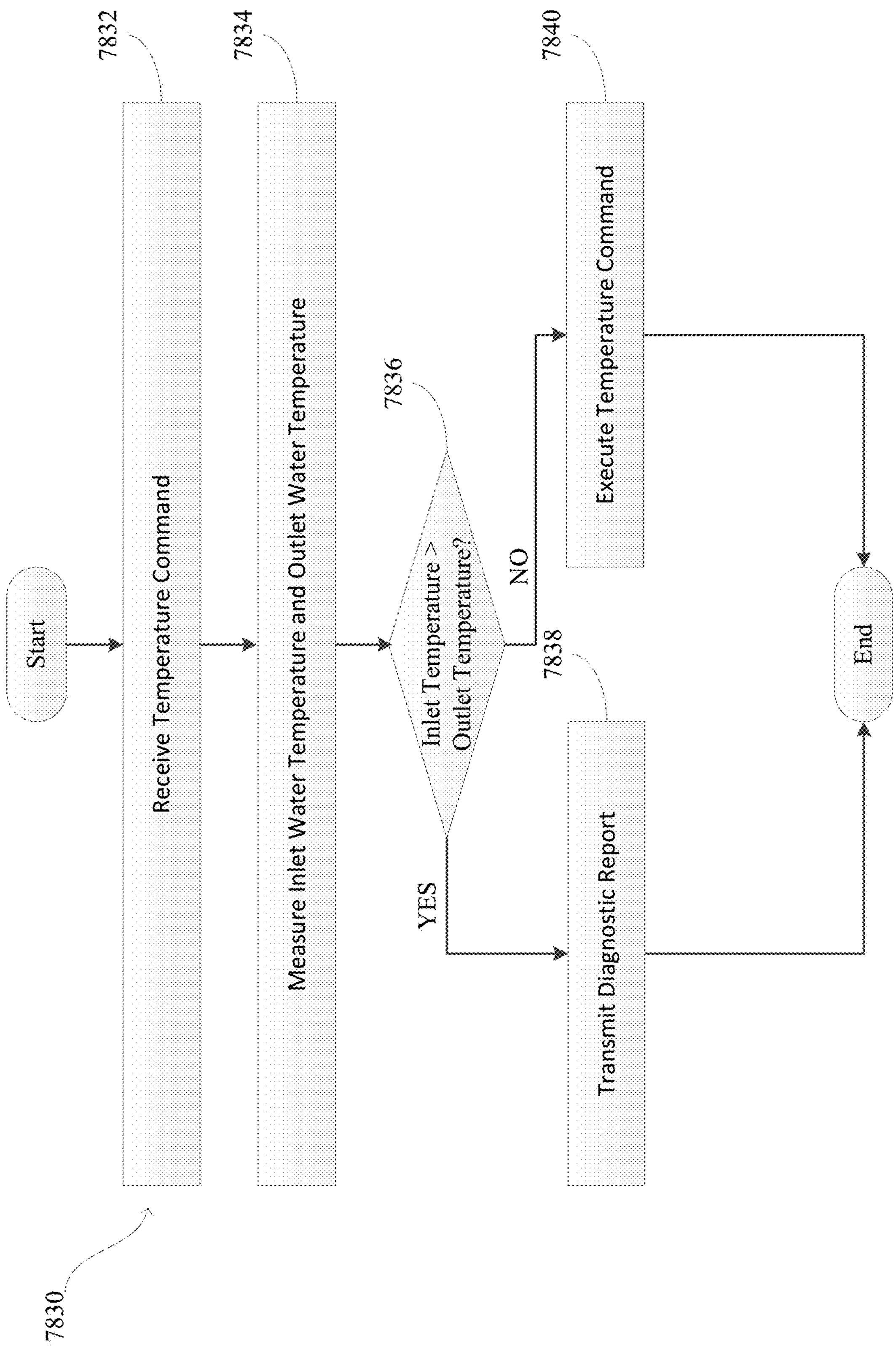
FIG. 87 is a flowchart illustrating process steps carried out by the embodiment of the system of FIG. 86 for detecting an improperly installed heating system based on measurements of inlet and outlet water temperature.

FIG. 87 is a flowchart illustrating process steps carried out by an embodiment of the system of the present disclosure for detecting an improperly installed heating system, indicated generally at method 7830. In step 7832, the system receives a temperature command. The temperature command can be an instruction to heat the water in the pool or spa. In a first example, a user sends the temperature command by using a smart device (e.g., smart phone), or using a display and/or control buttons on the heating system 14*b* to instruct the heater 7822 to heat the pool. In a second example, the system transmits the temperature command due to a predetermined condition. For example, the user can set a condition instructing the heater 7822 to activate (e.g., engage heating functions) at a predetermined time, at a predetermined temperature, etc. Those skilled in the art would understand that, in a heating/cooling system or a cooling system, the temperature command can also be an instruction to cool the water in the pool or spa.

In step 7834, the system measures the inlet water temperature and the outlet water temperature via the inlet temperature sensor 7816 and the outlet temperature sensor 7818, respectively. In a first example, the system measures the inlet water temperature and the outlet water temperature upon receiving the temperature command. In a second example, the system measures the inlet water temperature and the outlet water temperature upon a predetermined amount of time after receiving the temperature command. The predetermined amount of time can allow for the heating system 14*b* to enter a proper operational state, such as a heat exchanger of the heater 7822 heating to an optimal level.

In step 7836, the system determines whether the inlet water temperature is greater than the outlet water temperature. When the inlet temperature is greater than the outlet temperature, the system proceeds to step 7838 and generates and transmits a diagnostic report. The diagnostic report can be a report, a message, an alert, etc. In an example, the diagnostic report is transmitted to and displayed by the display of the heating system 14*b* or the smart device. The diagnostic report can include a report of the issue (e.g., incorrect piping installation), instructions detailing how to fix the issue, an option to schedule a repair specialist, an override command, etc. When the inlet temperature is not greater than the outlet temperature, the system proceeds to step 7840 and executes the temperature command (e.g., activates the heating system 14*b*).

Those skilled in the art would understand that in a heating/cooling system or a cooling-only system, when the temperature command is an instruction to cool the water, step 7836 can include the system determining whether the inlet water temperature is less than the outlet water temperature. When the inlet temperature is less than the outlet temperature in view of an instruction to cool the system, in step 7838, transmits a diagnostic report. Otherwise, when the inlet temperature is not less than the outlet temperature in view of an instruction to cool, the system executes the temperature command (e.g., activates the cooling system) in step 7840.

Figure 88:
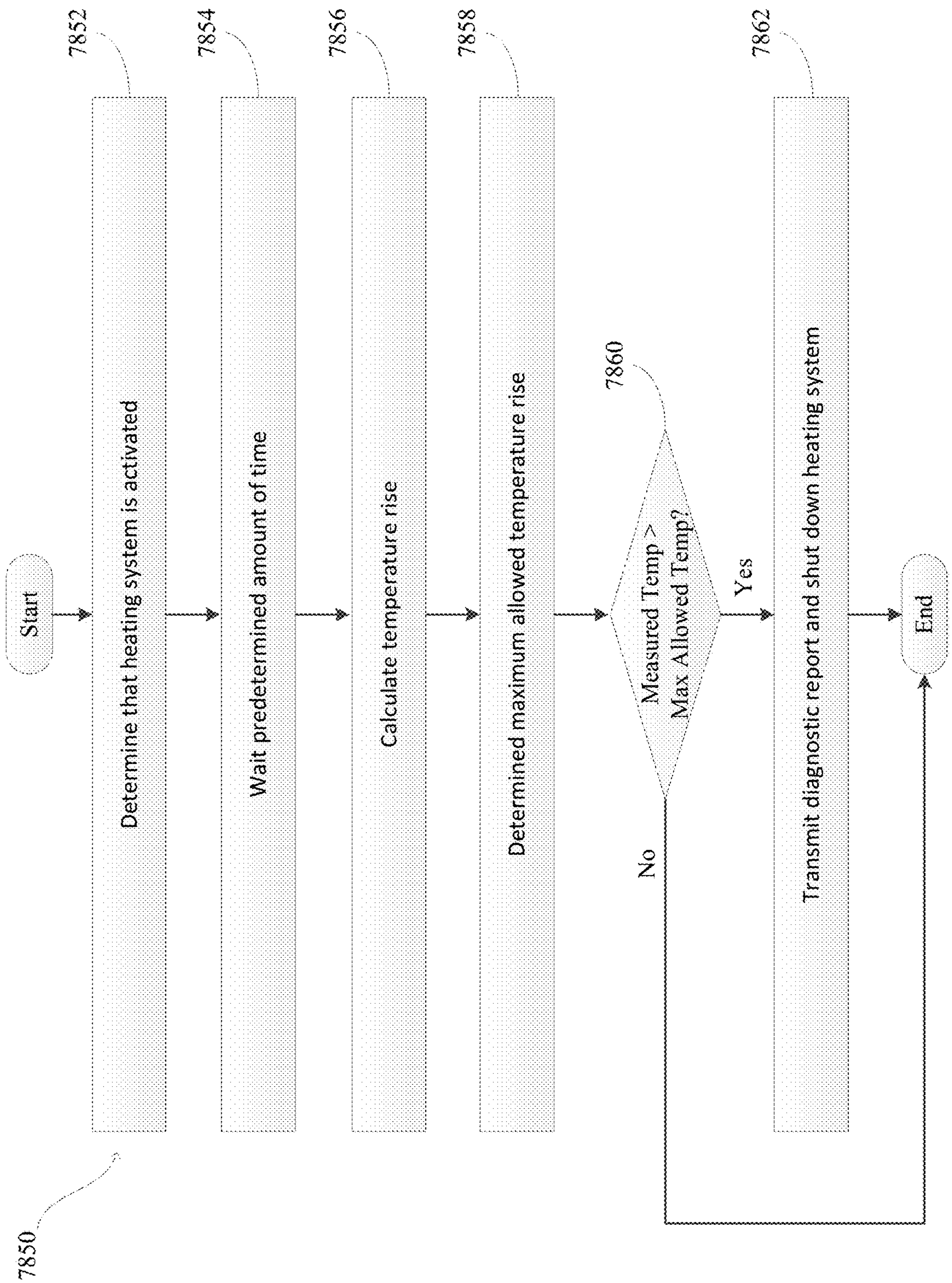
FIG. 88 is a flowchart illustrating process steps carried out by the embodiment of the system of FIG. 86 for detecting a low water flow rate through a heating system based on measurements of inlet and outlet water temperature.

FIG. 88 is a flowchart illustrating process steps carried out by an embodiment of the system of the present disclosure for detecting a low water flow rate through the heating system 14*b* based on measurements of inlet and outlet water temperatures, indicated generally at method 7850. In step 7852, the system determines that the heater 7822 is activated. In step 7854, the system waits a predetermined amount of time. For example, the system can wait 15 seconds. This waiting period allows the heater 7822 to achieve a suitable flow stabilization. Those skilled in the art would understand that other time periods can also be used and that different heating systems can require different durations to achieve the suitable flow stabilization. In step 7856, the system calculates a temperature rise. For example, the control system 12*b* performs a first temperature measurement at the inlet pipe 7812, a second temperature measurement at the outlet pipe 7814, and subtracts the inlet temperature from the outlet temperature to determine the temperature rise.

In step 7858, the system determines a maximum allowed temperature value for the heating system 14*b*. In an example, the system can use a lookup table. The lookup table can include heating system types, BTU/joule size, piping sizes, capacity, a maximum allowed temperature rise value for each type/size, etc. The lookup table can be stored in the system, on the Internet (in the cloud), on a remote server, etc. In step 7860, the system determines whether the value of the measured temperature rise is greater than the value of the maximum allowed temperature rise. When the value of the measured temperature rise is greater than the value of the maximum allowed temperature rise, the system proceeds to step 7862, and generates and transmits a diagnostic report, and shuts down the heater. Again, the diagnostic report can include a report of the issue (e.g., low flow rate), instructions detailing how to fix the issue, an option to schedule a repair specialist, an override command, etc. Those skilled in the art would understand that method 7860 can be similarly applied to a cooling system, where a temperature drop value is calculated and compared to a lookup table including a maximum allowed temperature drop.

Importantly, the processing steps discussed above in connection with FIGS. 87-88 could be carried out remote from the heater, e.g., in one or more of the devices shown in FIG. 1. As shown in FIG. 1, the system 10 includes, but is not limited to, a plurality of network communication and local control subsystems 12*a*-12*h* (including the control subsystem 12*b*) which could be installed in or connected to a plurality of pool and spa equipment 14*a*-14*h* (including the heating system 14*b*), so as to provide network connectivity and remote monitoring and control of the pool and spa equipment 14*a*-14*h*. The subsystems 12*a*-12*h* (including the control subsystem 12*b*) are described in greater detail in connection with FIG. 2. The subsystems 12*a*-12*h* could communicate with each other over the network 16, which could include, but is not limited to, the Internet. The subsystems 12*a*-12*h* provide "Internet-of-Things" functionality for the plurality of pool and spa equipment 14*a*-14*h*. It is noted that subsystems 12*a*-12*h* could further include a "big data" subsystem, subsystems for receiving input from manufacturers/factories, subsystems for receiving external data/input (e.g., data from the Internet), and subsystems for receiving input from customers. As discussed above, the subsystems 12*a*-12*h* could include control logic for allowing each of the devices 14*a*-14*h* to interact with each other (e.g., to exchange data and commands for controlling each other), as well as to be remotely controlled by another system such as a remote server, a "cloud" based control system, a remote computer system, a smart device (e.g., smart phone, smart speaker, smart chip embedded in the body), etc., and combinations thereof as will be discussed in greater detail below. For example, the subsystems 12*a*-12*h* could be programmed to carry out the processes discussed above in connection with FIGS. 87 and 88.

Also referring back to FIG. 3, which is a diagram illustrating various types of control logic in accordance with the present disclosure, for controlling various types of pool and spa equipment, it is noted that the control logic, indicated generally as pool control logic 70, could include the process steps discussed herein in connection with FIGS. 87 and 88. The control logic 70 could be embodied as programmed instructions (software code) stored on a non-transitory computer-readable medium, and could include pump control logic 84 and heater control logic 80, which could also include the process steps discussed herein in connection with FIGS. 87 and 88. Such logic could be installed locally (e.g., in one or more of the subsystems 12*a*-12*h*), on a remote server or computer system (e.g., in the server 18 or the smart phone/computer system 20), in the "cloud," or in any combination of such systems shown in FIG. 1.

Figure 89:
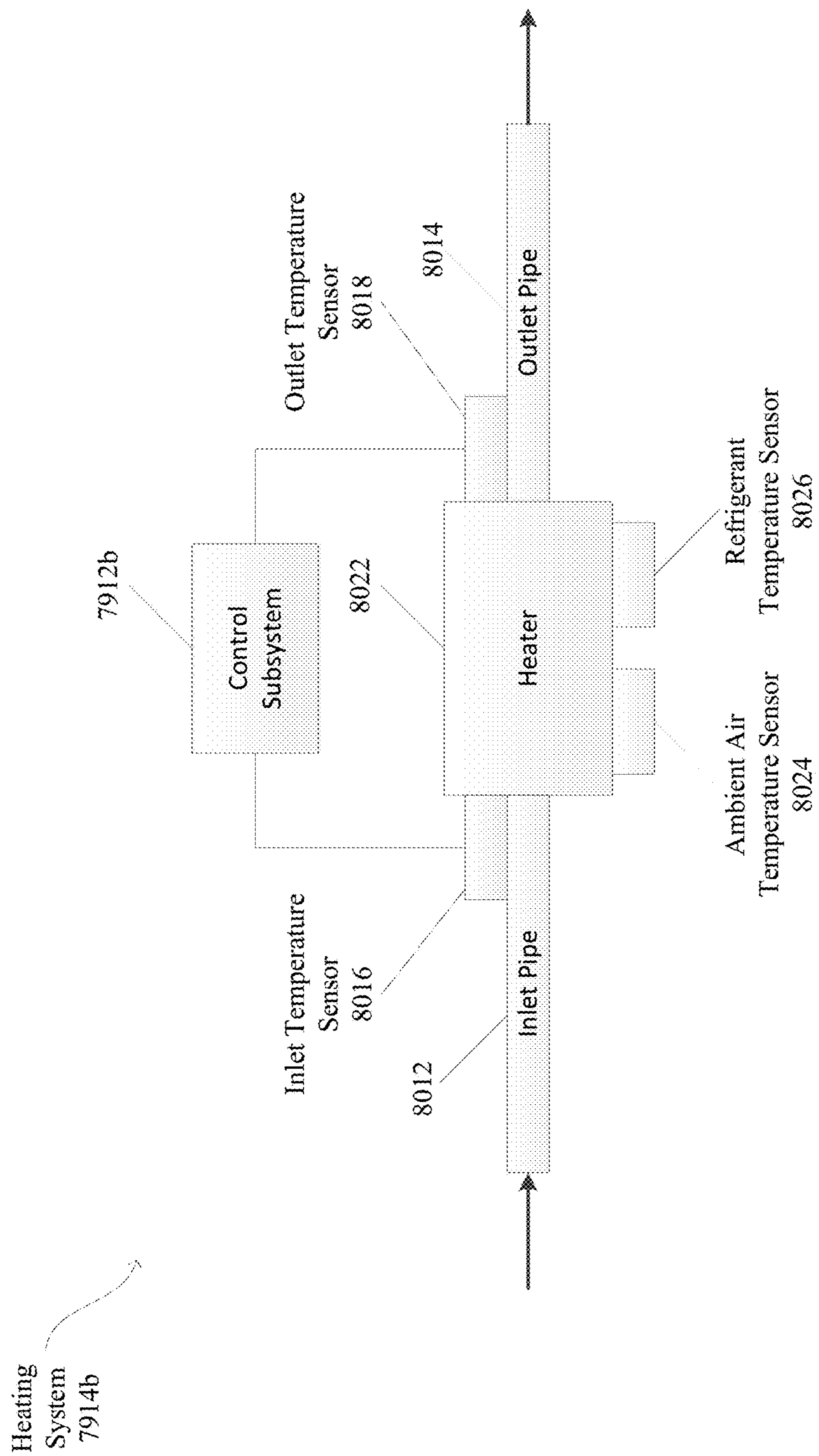
FIG. 89 is an illustration showing an embodiment of the heating/cooling system of FIG. 1.

FIG. 89 is a diagram illustrating components of another heater system 7914*b* of the present disclosure. The system 7914*b* includes an inlet pipe 8012, an outlet pipe 8014, an inlet temperature sensor 8016, an outlet temperature sensor 8018, a network communication and local control subsystem 7912*b* ("control subsystem 7912*b*"), a heater 8022, an ambient air temperature sensor 8024, and a refrigerant temperature sensor 8026. The inlet pipe 8012 transports water from the pool/spa into the heating system 7914*b* via, for example, a water pump or other means. The inlet temperature sensor 8016 measures the temperature of the water before the water enters the heater 8022. The outlet pipe 8014 transports water out from the heater 8022 to, for example, the pool or spa. The outlet temperature sensor 8018 measures the temperature of the water after the water leaves the heater 8022. The inlet temperature sensor 8016, the outlet temperature sensor 8018, the ambient air temperature sensor 8024, and the refrigerant temperature sensor 8026 can be one of a negative temperature coefficient thermistor, a resistance temperature detector, a thermocouple, a semiconductor-based sensor, a thermometer, or any other type of temperature sensing device. The temperature sensors 8016, 8018, 8024, and 8026 can be connected to and in communication with the heater 8022 and the control subsystem 7912*b* via a wired or a wireless connection. It should be understood that the temperature sensors 8016, 8018, 8024, and 8026 can be positioned anywhere along the inlet pipe 8012, the outlet pipe 8014, the heater 8022, a pump, or along other components.

The control subsystem 7912*b* can be similar to control subsystem 12*b* described herein and could include a processor in communication with a memory including at least one of a random-access memory and a non-volatile memory. The processor provides local processing capability for the control subsystem 7912*b*. The non-volatile memory can store one or more local control programs for providing local control of the pool and spa equipment in which the control subsystem 7912*b* is installed. The processor is in communication with the temperature sensors 8016, 8018, 8024, and 8026, and the heater 8022.

The processor can detect changes in the performance of the heating system 7914*b* and control the operation of the heating system 7914*b* based on a calculated difference between a temperature measurement of the inlet temperature sensor 8016 and the outlet temperature sensor 8018, a comparison of a temperature measurement of the ambient air temperature sensor 8024 and a threshold value, and a comparison of a temperature measurement of the refrigerant temperature sensor 8026 and a threshold value. It is noted that the control subsystem 7912*b* can be affixed to, installed within or installed remotely from the heater 8022. The components of the control subsystem 7912*b*, as part of the subsystems 12*a*-12*h*, are discussed in more detail above in regards to FIG. 2.

The heating system 7914*b* can further include a display, such as a touchscreen, a screen with a touchpad, etc. The display can be affixed to, installed within or installed remotely from the heater 8022. The display can receive user input via, for example, the touch screen, a keyboard, a remote or wireless signal, etc. The display can further show diagnostic issues, messages, instructions, etc.

Figure 90:
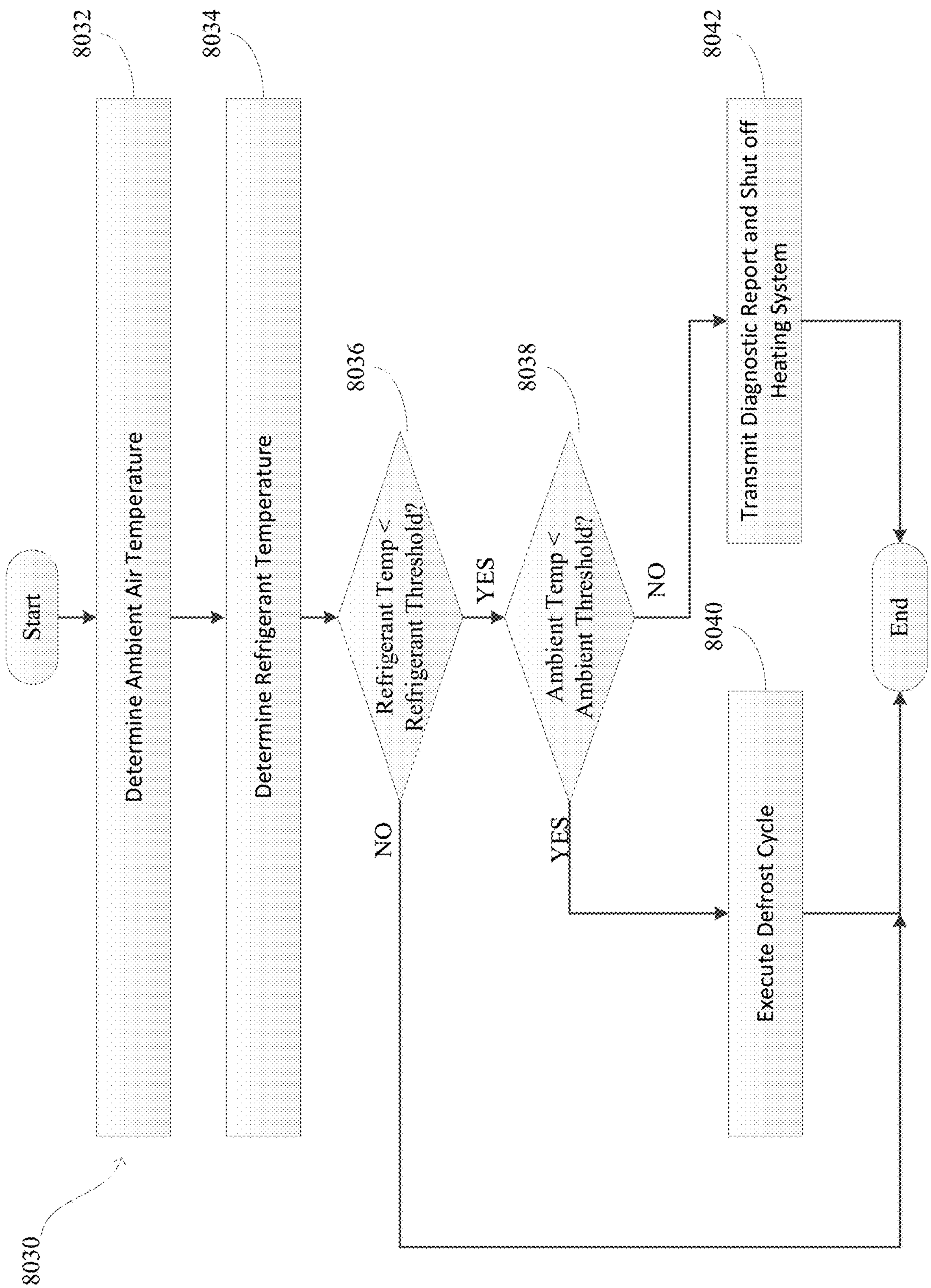
FIG. 90 is a flowchart illustrating process steps carried out by the embodiment of the system of FIG. 89 for identifying frost conditions in a heating system.

FIG. 90 is a flowchart illustrating process steps carried out by an embodiment of the system of the present disclosure for detecting frosting conditions in the heater 8022, indicated generally at method 8030. In step 8032, the system determines an ambient air temperature. For example, the system uses the ambient air temperature sensor 224 to measure the ambient air temperature. In step 8034, the system 7914*b* determines a refrigerant temperature. For example, the system uses the refrigerant temperature sensor 8026 to measure the refrigerant temperature.

In step 8036, the system determines whether the refrigerant temperature is less than a refrigerant temperature threshold. The refrigerant temperature threshold can be preset by a manufacture, a supplier, a user, or any other party. The refrigerant temperature threshold can be modified, either remotely or locally. For example, the refrigerant temperature threshold can be modified via wireless software update (e.g., remotely) or the user can modify the refrigerant temperature threshold using the display of the heating system 7914*b* (e.g., locally). Those skilled in the art would understand that the refrigerant temperature threshold can be modified in response to, refrigerant pressure, refrigerant type, or any other factors affecting the refrigerant. When the refrigerant temperature is not less than the refrigerant temperature threshold, the method 8030 ends.

When the refrigerant temperature is less than the refrigerant temperature threshold, the system proceeds to step 8038 and determines whether the ambient temperature is less than an ambient temperature threshold. The ambient temperature threshold can also be preset by the manufacture, the supplier, the user, or any other party, and can also be modified, either remotely or locally. Those skilled in the art would understand that the ambient temperature threshold can be modified in response to, atmospheric pressure, sea level, humidity, or any other factors.

When the ambient temperature is less than the refrigerant temperature threshold, in step 8040, the system executes a defrost cycle. In an example, the defrost cycle can include either deactivating the heating system 200 and allowing a heat exchanger of the heater 8022 to thaw out due to ambient air temperatures, secondary heaters, etc., or engaging a refrigerant reversing valve to heat a heat exchanger surface to thaw out the heat exchanger. The system can further send an alert or notification indicating that the heating system 7914*b* has been deactivated and the defrost cycle has been activated. The alert or notification can be set to a user's smart device, to the display of the heating system 7914*b*, etc.

When the ambient temperature is not less than the refrigerant temperature threshold, the system proceeds to step 8042, deactivates the heating system, and transmits a diagnostic report. The diagnostic report can be a report, a message, an alert, etc. The diagnostic report can include a report of the issue, instructions detailing how to fix the issue, an option to schedule a repair specialist, an override command, etc.

Figure 91:
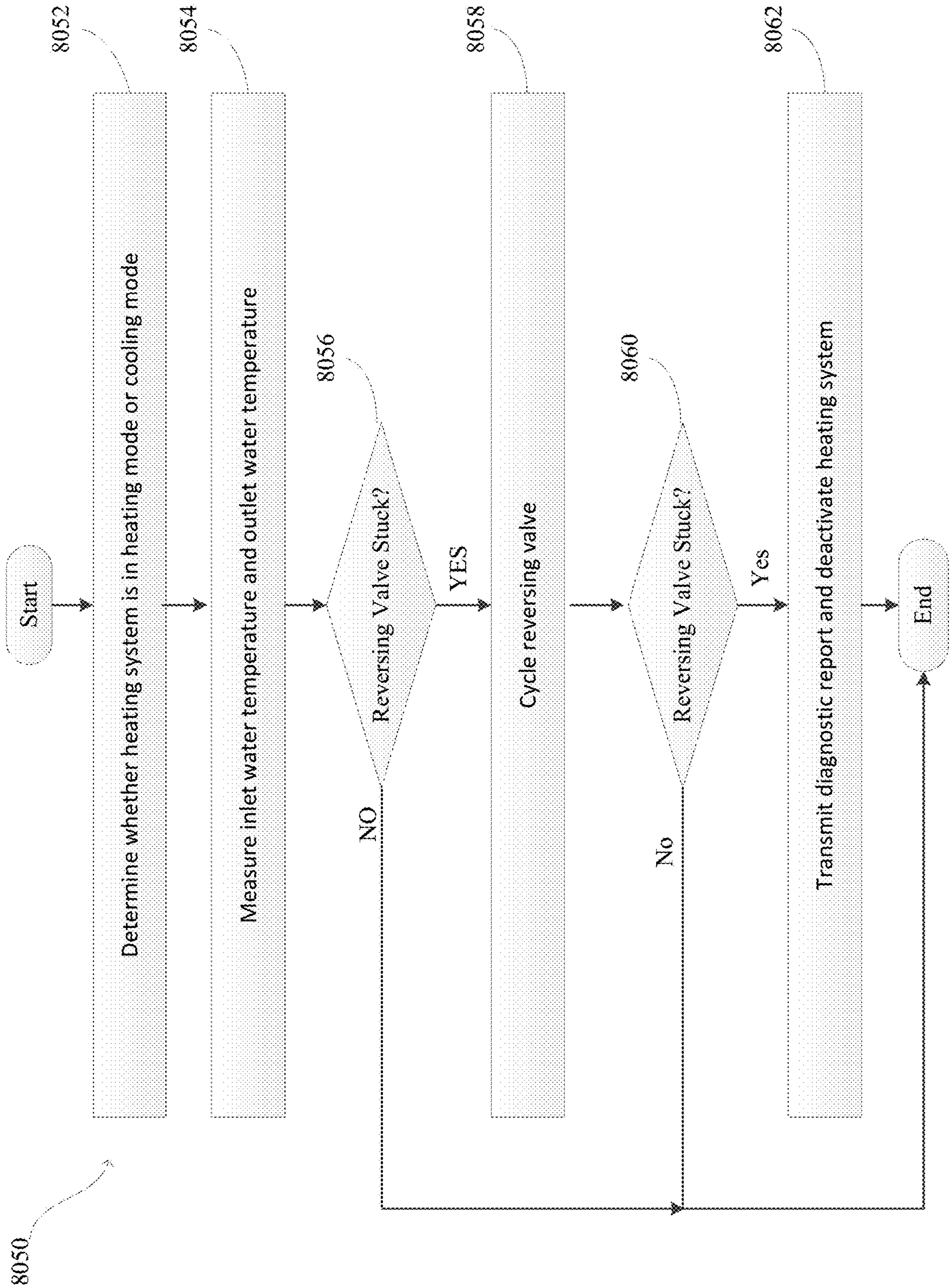
FIG. 91 is a flowchart illustrating process steps carried out by the embodiment of the system of FIG. 89 for detecting and correcting a stuck reversing valve in a refrigeration system of a heating system.

FIG. 91 is a flowchart illustrating process steps carried out by an embodiment of the system of the present disclosure for detecting and correcting a stuck reversing valve in a refrigeration system of the heating system 7914*b*, indicated generally at method 8050. In step 8052, the system determines whether the heating system 7914*b* is in a heating mode or in a cooling mode. In step 8054, the system measures the inlet water temperature and the outlet water temperature via the inlet temperature sensor 8016 and the outlet temperature sensor 8018, respectively. In step 8056, the system determines whether the reversing valve is stuck. In a first embodiment, where the heating system 7914*b* is in the heating mode, the system determines whether the reversing valve is stuck when the outlet water temperature is lower than the inlet water temperature. In a second embodiment, where the heating system 7914*b* is in the cooling mode, the system determines whether the reversing valve is stuck when the outlet water temperature is greater than the inlet water temperature. If the system determines that the reversing valve is not stuck, the method 8050 ends.

When the system determines that the reversing valve is stuck, the system proceeds to step 8058 and cycles the reversing valve for a predetermined period of time. The predetermined period of time can be set by a manufacture, a supplier, the user, or any other party, and can also be modified, either remotely or locally. In an embodiment, the system can disable the heating system 7914*b* prior to cycling the reversing valve for the predetermined amount of time. This is because, as understood by those skilled in the art, cycling the reversing valve can be more effective when the compressor of the heating system 7914*b* is not running. In another embodiment, the system can cycle the reversing valve for a first predetermined amount of time, determine whether the reversing valve is still stuck (using, for example, the method described in step 8056), and when it is determined that the reversing value is still stuck, deactivate the heating system 7914*b* and cycle the reversing valve for a second predetermined period of time. The first predetermined period of time and the second predetermined period of time can be the same or different values.

In step 8060, the system again determines whether the reversing valve is stuck, using, for example, the method described in step 8056. It should be understood that, if the heating system 7914*b* was deactivated to cycle the reversing valve, as described in step 8058, the heating system 7914*b* can have to be reactivated to determine whether the reversing valve is stuck. If the system determines that the reversing valve is unstuck, the method 8050 ends. If the system determines that the reversing valve is still stuck, the system proceeds to step 8062, transmits a diagnostic report, and deactivates the heating system 7914*b*. Again, the diagnostic report can include a report of the issue (e.g., stuck reversing valve), instructions detailing how to fix the issue, an option to schedule a repair specialist, an override command, etc.

It is noted that the system 7914*b* could be implemented in the networked pool/spa system, indicated generally at 10, of FIG. 1. Importantly, the processing steps discussed above in connection with FIGS. 90 and 91 could be carried out remote from the heater, e.g., in one or more of the devices shown in FIG. 1. The system 10 could include the plurality of network communication and local control subsystems 12*a*-12*h* (including the control subsystem 7912*b*) which could be installed in or connected to a plurality of pool and spa equipment 14*a*-14*h* (including the heating system 7914*b*), so as to provide network connectivity and remote monitoring and control of the pool and spa equipment 14*a*-14*h*. Additionally, the subsystems 12*a*-12*h* could communicate with each other over a network 16, which could include, but is not limited to, the Internet.

It is also noted that the control logic, indicated generally as pool control logic 70 of FIG. 3 could include the process steps discussed herein in connection with FIGS. 90 and 91, and could be embodied as programmed instructions (software code) stored on a non-transitory computer-readable medium, and could include pump control logic 84 and heater control logic 80. Such logic could be installed locally (e.g., in one or more of the subsystems 12*a*-12*h*), on a remote server or computer system (e.g., in the server 18 or the smart phone/computer system 20), in the "cloud," or in any combination of such systems.

Having thus described the disclosure in detail, it is to be understood that the foregoing description is not intended to limit the spirit or scope thereof. What is desired to be protected by Letters Patent is set forth in the appended claims.

The invention claimed is:

1. A system for monitoring and controlling operation of a heating system comprising:

a first pressure sensor configured to measure exhaust pressure of a venting system of the heating system;

a second pressure sensor configured to measure a pressure of natural gas into the heating system;

a current sensor configured to measure current of an electric motor of the heating system;

a flow sensor configured to measure a flow rate of water into the heating system; and a control subsystem configured to:

compare each of the measurements of the first pressure sensor, the second pressure sensor, the current sensor, and the flow sensor with at least one of a plurality of measurement thresholds, compare a determined difference between the measured exhaust pressure of the venting system and a stored last recorded measurement of the exhaust pressure of the venting system and a last recorded determined difference, and control operation of the heating system based on at least one of the comparisons.

2. The system of claim 1, wherein the control subsystem compares the measured exhaust pressure of the venting system and a minimum pressure threshold, determines whether the measured exhaust pressure of the venting system is greater than the minimum pressure threshold, and transmits a diagnostic message to at least one of a display of the heating system and a remote device and terminates operation of the heating system when the measured exhaust pressure of the venting system is less than the minimum pressure threshold.

3. The system of claim 1, wherein the control subsystem compares the measured exhaust pressure of the venting system and a minimum pressure threshold, determines whether the measured exhaust pressure of the venting system is greater than the minimum pressure threshold, compares the measured exhaust pressure of the venting system and a maximum pressure threshold when the measured exhaust pressure of the venting system is greater than the minimum pressure threshold, and transmits a diagnostic message to at least one of a display of the heating system and a remote device and terminates operation of the heating system when the measured exhaust pressure of the venting system is greater than the maximum pressure threshold.

4. The system of claim 1, wherein the control subsystem compares the measured exhaust pressure of the venting system and a minimum pressure threshold, determines whether the measured exhaust pressure of the venting system is greater than the minimum pressure threshold, compares the measured exhaust pressure of the venting system and a maximum pressure threshold when the measured exhaust pressure of the venting system is greater than the minimum pressure threshold, determines the difference between the measured exhaust pressure of the venting system and the stored last recorded measurement of the exhaust pressure of the venting system when the measured exhaust pressure of the venting system is less than the maximum pressure threshold, and controls operation of the heating system based on at least one of the comparison between the determined difference and the last recorded determined difference and the determined difference relative to at least one of a plurality of predetermined pressure thresholds.

5. The system of claim 4, wherein the control subsystem transmits a diagnostic message to at least one of a display of the heating system and a remote device and terminates operation of the heating system when the determined difference between the measured exhaust pressure of the venting system and the stored last recorded measurement of the exhaust pressure of the venting system is greater than the last recorded difference and the determined difference between the measured exhaust pressure of the venting system and the stored last recorded measurement of the exhaust pressure of the venting system exceeds a predetermined high pressure threshold.

6. The system of claim 1, wherein the control subsystem compares the measured current of the electric motor of the heating system and a minimum current threshold, determines whether the measured current of the electric motor of the heating system is greater than the minimum current threshold, and transmits a diagnostic message to at least one of a display of the heating system and a remote device and terminates operation of the heating system when the measured current of the electric motor of the heating system is less than the minimum current threshold.

7. The system of claim 1, wherein the control subsystem compares the measured current of the electric motor of the heating system and a minimum current threshold, determines whether the measured current of the electric motor of the heating system is greater than the minimum current threshold, compares the measured current of the electric motor of the heating system and a maximum current threshold when the measured current of the electric motor of the heating system is greater than the minimum current threshold, and transmits a diagnostic message to at least one of a display of the heating system and a remote device and terminates operation of the heating system when the measured current of the electric motor of the heating system is greater than the maximum current threshold.

8. The system of claim 1, wherein the control subsystem compares the measured flow rate of water into the heating system and a minimum flow rate threshold, determines whether the measured flow rate of water into the heating system is greater than the minimum flow rate threshold, and transmits a diagnostic message to at least one of a display of the heating system and a remote device and terminates operation of the heating system when the measured flow rate of water into the heating system is less than the minimum flow rate threshold.

9. The system of claim 1, wherein the control subsystem compares the measured pressure of natural gas into the heating system and a minimum pressure threshold, determines whether the measured pressure of the natural gas into the heating system is greater than the minimum pressure threshold, and transmits a diagnostic message to at least one of a display of the heating system and a remote device and terminates operation of the heating system when the measured pressure of the natural gas into the heating system is less than the minimum pressure threshold.

10. The system of claim 1, further comprising at least one polymeric positive temperature coefficient (PPTC) device positioned between the control subsystem and at least one of the first pressure sensor, the second pressure sensor, the current sensor and the flow sensor.

11. The system of claim 1, wherein the control subsystem generates a graphic user interface, the graphic user interface being displayed on at least one of a display of the heating system and a remote device and comprising a plurality of input fields for configuring at least one of a temperature threshold of a pool or spa, an energy consumption threshold of the pool or spa, and the temperature threshold of the pool or spa relative to the energy consumption threshold of the pool or spa, and transmits an alert when at least one of the temperature threshold of the pool or spa is exceeded, the energy consumption threshold of the pool or spa is exceeded, and the temperature threshold of the pool or spa relative to the energy consumption threshold of the pool or spa is exceeded, the alert being transmitted to and displayed by at least one of the display of the heating system and the remote device.

12. The system of claim 11, wherein the alert can be at least one of an energy consumption report, an estimated utility bill and an override command.

13. The system of claim 1, further comprising a removable memory module, the removable memory module being configured to store the measurements of the first pressure sensor, the second pressure sensor, the current sensor, the flow sensor and the plurality of measurement thresholds, and store a diagnostic history of the heating system based on a least one of the comparisons of the measurements of the first pressure sensor, the second pressure sensor, the current sensor, and the flow sensor with the plurality of measurement thresholds.

14. A system for monitoring and controlling a heating system comprising:

a first pressure sensor configured to measure exhaust pressure of a venting system of the heating system;

a second pressure sensor configured to measure a pressure of natural gas into the heating system;

a current sensor configured to measure current of an electric motor of the heating system;

a flow sensor configured to measure a flow rate of water into the heating system; and a control subsystem configured to:

compare each of the measurements of the first pressure sensor, the second pressure sensor, the current sensor, and the flow sensor with at least one of a plurality of measurement thresholds, compare a determined difference between the measured exhaust pressure of the venting system and a stored last recorded measurement of the exhaust pressure of the venting system and a last recorded determined difference, and control operation of the heating system based on at least one of the comparisons by transmitting a diagnostic message to at least one of a display of the heating system and a remote device and terminating operation of the heating system.

15. A system for detecting a change in performance of a venting system of a heating system comprising:

a pressure sensor configured to measure an exhaust pressure of the venting system, and a control subsystem configured to determine a difference between the measured exhaust pressure of the venting system and a stored last recorded measurement of the exhaust pressure of the venting system, compare the determined difference between the measured exhaust pressure of the venting system and the stored last recorded measurement of the exhaust pressure of the venting system and a last recorded determined difference, and control operation of the heating system based on at least one of the comparison and the determined difference relative to at least one of a plurality of predetermined pressure thresholds.

16. The system of claim 15, wherein the control subsystem compares the measured exhaust pressure of the venting system and a minimum pressure threshold, determines whether the measured exhaust pressure of the venting system is greater than the minimum pressure threshold, and transmits a diagnostic message to at least one of a display of the heating system and a remote device and terminates operation of the heating system when the measured exhaust pressure of the venting system is less than the minimum pressure threshold.

17. The system of claim 15, wherein the control subsystem compares the measured exhaust pressure of the venting system and a minimum pressure threshold, determines whether the measured exhaust pressure of the venting system is greater than the minimum pressure threshold, compares the measured exhaust pressure of the venting system and a maximum pressure threshold when the measured exhaust pressure of the venting system is greater than the minimum pressure threshold, and transmits a diagnostic message to at least one of a display of the heating system and a remote device and terminates operation of the heating system when the measured exhaust pressure of the venting system is greater than the maximum pressure threshold.

18. The system of claim 15, wherein the control subsystem compares the measured exhaust pressure of the venting system and a minimum pressure threshold, determines whether the measured exhaust pressure of the venting system is greater than the minimum pressure threshold, compares the measured exhaust pressure of the venting system and a maximum pressure threshold when the measured exhaust pressure of the venting system is greater than the minimum pressure threshold, and determines the difference between the measured exhaust pressure of the venting system and the stored last recorded measurement of the exhaust pressure of the venting system when the measured exhaust pressure of the venting system is less than the maximum pressure threshold.

19. The system of claim 15, wherein the control subsystem transmits a diagnostic message to at least one of a display of the heating system and a remote device and terminates operation of the heating system when the determined difference between the measured exhaust pressure of the venting system and the stored last recorded measurement of the exhaust pressure of the venting system is greater than the last recorded difference and the determined difference between the measured exhaust pressure of the venting system and the stored last recorded measurement of the exhaust pressure of the venting system exceeds a predetermined high pressure threshold.

20. The system of claim 15, further comprising at least one polymeric positive temperature coefficient (PPTC) device positioned between the control subsystem and the first pressure sensor.

21. The system of claim 1, wherein the first pressure sensor is configured to measure an exhaust pressure differential between a vent pipe and an exhaust vent of the venting system of the heating system.

22. The system of claim 1, wherein the system determines a speed of the electric motor of the heating system.

23. The system of claim 22, wherein the current sensor is configured to measure the current of the electric motor of the heating system relative to the speed of the electric motor determined by the system.

24. The system of claim 1, comprising a third pressure sensor configured to measure a pressure differential between pressure of water at an inlet of the heating system and pressure of water at an outlet of the heating system.

25. The system of claim 1, comprising a temperature sensor configured to measure a temperature of one or more of a water inlet, a water outlet, and the venting system of the heating system.

26. The system of claim 25, wherein the system determines a temperature profile of the heating system based on one or more of the water inlet temperature, the water outlet temperature, and the venting system temperature measured by the temperature sensor.

27. The system of claim 1, wherein the heating system automatically decreases an initial temperature setpoint of the heating system when a current outdoor temperature is above a maximum outdoor temperature setpoint.

28. The system of claim 27, wherein the heating system automatically increases the initial temperature setpoint of the heating system when the current outdoor temperature is below a minimum outdoor temperature setpoint.

29. The system of claim 28, wherein the initial temperature setpoint of the heating system, the maximum outdoor temperature setpoint, and the minimum outdoor temperature setpoint are configurable by a user by way of one or more interface screens generated by the heating system.

* * * * *